US012780857B2

(12) United States Patent
Zhang et al.

(10) Patent No.: US 12,780,857 B2
(45) Date of Patent: Nov. 3, 2026

(54) LIGHT-EMITTING MATERIAL WITH A POLYCYCLIC LIGAND

(71) Applicant: BEIJING SUMMER SPROUT TECHNOLOGY CO., LTD., Beijing (CN)

(72) Inventors: Cuifang Zhang, Beijing (CN); Dongdong Zhang, Beijing (CN); Xueyu Lu, Beijing (CN); Chuanjun Xia, Beijing (CN); Chi Yuen Raymond Kwong, Beijing (CN)

(73) Assignee: BEIJING SUMMER SPROUT TECHNOLOGY CO., LTD., Beijing (CN)

( * ) Notice: Subject to any disclaimer, the term of this patent is extended or adjusted under 35 U.S.C. 154(b) by 1097 days.

(21) Appl. No.: 17/729,422

(22) Filed: Apr. 26, 2022

(65) Prior Publication Data

US 2022/0389041 A1 Dec. 8, 2022

(30) Foreign Application Priority Data

Apr. 30, 2021 (CN) ........................ 202110470712.X

(51) Int. Cl.

*H10K 50/12* (2023.01)
*C07F 15/00* (2006.01)
*H10K 85/30* (2023.01)

(52) U.S. Cl.

CPC ....... *C07F 15/0033* (2013.01); *H10K 85/342* (2023.02); *H10K 50/12* (2023.02)

(58) Field of Classification Search

None
See application file for complete search history.

(56) References Cited

U.S. PATENT DOCUMENTS

| | | | | |
|---|---|---|---|---|
| 5,703,436 | A | 12/1997 | Forrest et al. | |
| 5,707,745 | A | 1/1998 | Forrest et al. | |
| 5,844,363 | A | 12/1998 | Gu et al. | |
| 6,097,147 | A | 8/2000 | Baldo et al. | |
| 6,303,238 | B1 | 10/2001 | Thompson et al. | |
| 7,279,704 | B2 | 10/2007 | Walters et al. | |
| 7,968,146 | B2 | 6/2011 | Wagner et al. | |
| 2003/0230980 | A1 | 12/2003 | Forrest et al. | |
| 2004/0174116 | A1 | 9/2004 | Lu et al. | |
| 2007/0034863 | A1 | 2/2007 | Fortte et al. | |
| 2008/0214818 | A1 | 9/2008 | Chin et al. | |
| 2010/0331506 | A1* | 12/2010 | Fortte | C07F 15/0033 546/10 |
| 2015/0349273 | A1 | 12/2015 | Hung et al. | |
| 2016/0359122 | A1 | 12/2016 | Boudreault et al. | |
| 2017/0012223 | A1* | 1/2017 | Boudreault | H10K 85/654 |
| 2020/0098999 | A1 | 3/2020 | Boudreault et al. | |
| 2022/0127288 | A1* | 4/2022 | Moon | C09K 11/06 |
| 2022/0393116 | A1 | 12/2022 | Dai et al. | |
| 2023/0151026 | A1* | 5/2023 | Parham | H10K 85/6572 257/40 |

FOREIGN PATENT DOCUMENTS

| | | | |
|---|---|---|---|
| CN | 108148577 | A | 6/2018 |
| CN | 110698518 | A | 1/2020 |
| CN | 110790797 | A | 2/2020 |
| CN | 114478643 | A | 5/2022 |
| JP | 2007-254540 | A | 10/2007 |

OTHER PUBLICATIONS

Tang, Huaijun, et al. "A novel heteroleptic iridium complex with multifunctional ligands used for polymeric light-emitting diodes." Optical Materials 33.8 (2011): 1291-1296. (Year: 2011).*
CN Office Action, including Search Report Mailed on Jan. 9, 2025 for CN Application No. 202110470712, 14 page(s).
CN Office Action, including Search Report Mailed on Mar. 30, 2024 for CN Application No. 202110470712, 13 page(s).
Ding et al., "Highly efficient phosphorescent bis-cyclometalated iridium complexes based on quinoline ligands", Synthetic Metals, vol. 155, Nov. 10, 2005, pp. 539-548.
Tang et al., "Organic electroluminescent diodes", Appl. Phys. Lett. Vol. 51, No. 12, Sep. 21, 1987, pp. 913-915.
Thomas et al., "Efficient Red-Emitting Cyclometalated Iridium(III) Complexes Containing Lepidine-Based Ligands", Inorganic Chemistry vol. 44, No. 16, 2005, pp. 5677-5685.
Uoyama et al., "Highly efficient organic light-emitting diodes from delayed fluorescence", Nature, vol. 492, Dec. 13, 2012, 7 Pages.

* cited by examiner

*Primary Examiner* — Robert S Loewe
(74) *Attorney, Agent, or Firm* — Workman Nydegger

(57) ABSTRACT

Provided is a light-emitting material having a polycyclic ligand. The light-emitting material is a novel metal complex comprising a polycyclic ligand having a structure of Formula 1 and may be used as light-emitting material in an electroluminescent device. These novel metal complexes can greatly red-shift the maximum emission wavelengths of electroluminescent devices and significantly adjust emitting colors of the devices and have very narrow emission spectra and can greatly improve the luminescence saturation of the devices and provide better device performance. Further provided are an electroluminescent device and a compound combination.

26 Claims, 2 Drawing Sheets

LIGHT-EMITTING MATERIAL WITH A POLYCYCLIC LIGAND

CROSS-REFERENCE TO RELATED APPLICATION

This present disclosure claims priority to Chinese Patent Application No. CN 202110470712.X filed on Apr. 30, 2021, the disclosure of which is incorporated herein by reference in its entirety.

TECHNICAL FIELD

The present disclosure relates to compounds for organic electronic devices such as organic light-emitting devices. More particularly, the present disclosure relates to a metal complex having a polycyclic ligand and an organic electroluminescent device and compound combination including the metal complex.

BACKGROUND

Organic electronic devices include, but are not limited to, the following types: organic light-emitting diodes (OLEDs), organic field-effect transistors (O-FETs), organic light-emitting transistors (OLETs), organic photovoltaic devices (OPVs), dye-sensitized solar cells (DSSCs), organic optical detectors, organic photoreceptors, organic field-quench devices (OFQDs), light-emitting electrochemical cells (LECs), organic laser diodes and organic plasmon emitting devices.

In 1987, Tang and Van Slyke of Eastman Kodak reported a bilayer organic electroluminescent device, which comprises an arylamine hole transporting layer and a tris-8-hydroxyquinolato-aluminum layer as the electron and emitting layer (Applied Physics Letters, 1987, 51 (12):913-915). Once a bias is applied to the device, green light was emitted from the device. This device laid the foundation for the development of modern organic light-emitting diodes (OLEDs). State-of-the-art OLEDs may comprise multiple layers such as charge injection and transporting layers, charge and exciton blocking layers, and one or multiple emissive layers between the cathode and anode. Since the OLED is a self-emitting solid state device, it offers tremendous potential for display and lighting applications. In addition, the inherent properties of organic materials, such as their flexibility, may make them well suited for particular applications such as fabrication on flexible substrates.

The OLED can be categorized as three different types according to its emitting mechanism. The OLED invented by Tang and van Slyke is a fluorescent OLED. It only utilizes singlet emission. The triplets generated in the device are wasted through nonradiative decay channels. Therefore, the internal quantum efficiency (IQE) of the fluorescent OLED is only 25%. This limitation hindered the commercialization of OLED. In 1997, Forrest and Thompson reported phosphorescent OLED, which uses triplet emission from heavy metal containing complexes as the emitter. As a result, both singlet and triplets can be harvested, achieving 100% IQE. The discovery and development of phosphorescent OLED contributed directly to the commercialization of active-matrix OLED (AMOLED) due to its high efficiency. Recently, Adachi achieved high efficiency through thermally activated delayed fluorescence (TADF) of organic compounds. These emitters have small singlet-triplet gap that makes the transition from triplet back to singlet possible. In the TADF device, the triplet excitons can go through reverse intersystem crossing to generate singlet excitons, resulting in high IQE.

OLEDs can also be classified as small molecule and polymer OLEDs according to the forms of the materials used. A small molecule refers to any organic or organometallic material that is not a polymer. The molecular weight of the small molecule can be large as long as it has well defined structure. Dendrimers with well-defined structures are considered as small molecules. Polymer OLEDs include conjugated polymers and non-conjugated polymers with pendant emitting groups. Small molecule OLED can become the polymer OLED if post polymerization occurred during the fabrication process.

There are various methods for OLED fabrication. Small molecule OLEDs are generally fabricated by vacuum thermal evaporation. Polymer OLEDs are fabricated by solution process such as spin-coating, inkjet printing, and slit printing. If the material can be dissolved or dispersed in a solvent, the small molecule OLED can also be produced by solution process.

The emitting color of the OLED can be achieved by emitter structural design. An OLED may comprise one emitting layer or a plurality of emitting layers to achieve desired spectrum. In the case of green, yellow, and red OLEDs, phosphorescent emitters have successfully reached commercialization. Blue phosphorescent device still suffers from non-saturated blue color, short device lifetime, and high operating voltage. Commercial full-color OLED displays normally adopt a hybrid strategy, using fluorescent blue and phosphorescent yellow, or red and green. At present, efficiency roll-off of phosphorescent OLEDs at high brightness remains a problem. In addition, it is desirable to have more saturated emitting color, higher efficiency, and longer device lifetime.

Metal complexes having the structures of

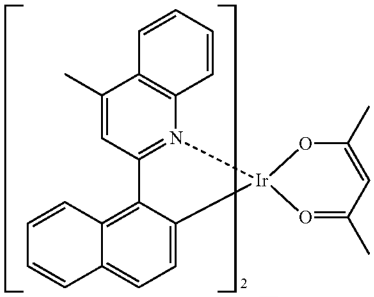

and

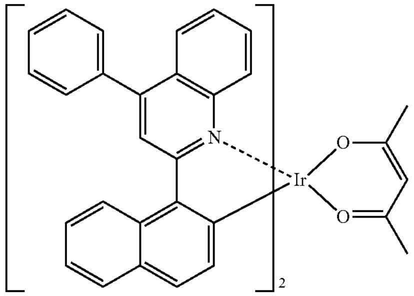

are respectively disclosed in two articles, *Inorg. Chem.* 2005, 44, 5677 (DOI: 10.1021/ic050385s) and *Synthetic Metals.* 2005, 155, 539 (DOI: 10.1016/j.synthmet.2005.08.034). These two articles pay attention to studies on the performance of the metal complexes having quinoline-containing ligands. Neither of the two articles discloses or teaches a change in performance due to the introduction of a fused ring structure between aryl and aza-aryl in a particular aryl-aza-aryl ligand structure.

CN108148577A discloses a metal complex having the following structure:

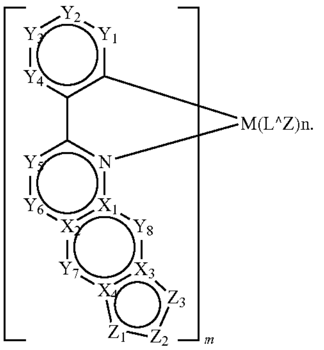

One of many structures disclosed therein is

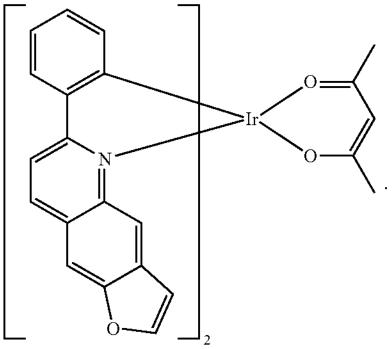

The inventors focus on a change in performance due to the introduction of a particular five-membered fused ring at a particular position of an aza-naphthalene ring in a ligand of the metal complex. However, this application has neither disclosed nor taught a change in performance due to the introduction of a fused ring structure between aryl and aza-aryl in a particular aryl-aza-aryl ligand structure.

US20080214818A1 discloses a metal complex having the following structure:

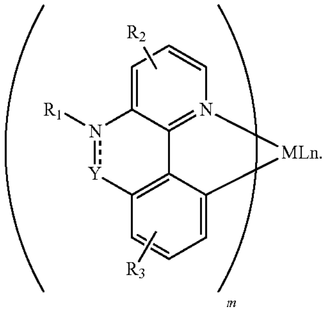

One of many structures disclosed therein is

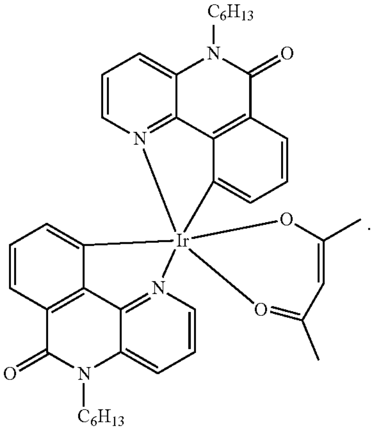

The inventors focus on an application of a ligand having an azaphenanthrene or azaphenanthrenone structure to a metal complex used as a light-emitting material. However, this application has neither disclosed nor taught a change in performance due to the introduction of a fused ring structure between aryl and aza-aryl in a particular aryl-aza-aryl ligand structure.

A variety of phosphorescent metal complexes have been reported in the related art, which still cannot satisfy an increasing demand of the industry for device performance, such as more saturated luminescence, higher luminescence efficiency, a lower operating voltage and a longer device lifetime. Therefore, further development is still needed in the field of phosphorescent metal complexes.

SUMMARY

The present disclosure aims to provide a series of metal complexes each having a polycyclic ligand to solve at least part of the above-mentioned problems. The metal complexes may be used as light-emitting materials in organic electroluminescent devices. These novel metal complexes can greatly red-shift the maximum emission wavelengths of electroluminescent devices and significantly adjust emitting colors of the devices and have very narrow emission spectra and can greatly improve the luminescence saturation of the devices and provide better device performance.

According to an embodiment of the present disclosure, disclosed is a metal complex comprising a ligand $L_a$ and a metal M, wherein the metal M is selected from a metal with a relative atomic mass greater than 40, and the ligand $L_a$ has a structure represented by Formula 1:

Formula 1

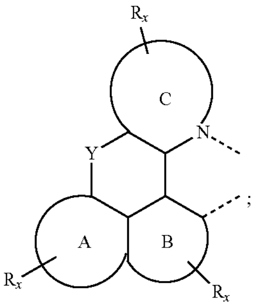

wherein the ring A and the ring B are each independently selected from a five-membered unsaturated carbocyclic ring, an aromatic ring having 6 to 30 carbon atoms or a heteroaromatic ring having 3 to 30 carbon atoms; and the ring C is selected from a heteroaromatic ring having 3 to 30 carbon atoms;

$R_x$ represents, at each occurrence identically or differently, mono-substitution, multiple substitutions or non-substitution;

Y is selected from $CR_yR_y$, $SiR_yR_y$, $GeR_yR_y$, $NR_y$, $PR_y$, O, S or Se;

$R_x$ and $R_y$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof; and adjacent substituents $R_x$ and $R_y$ can be optionally joined to form a ring.

According to another embodiment of the present disclosure, further disclosed is an electroluminescent device comprising an anode, a cathode and an organic layer disposed between the anode and the cathode, wherein the organic layer comprises the metal complex in the preceding embodiment.

According to another embodiment of the present disclosure, further disclosed is a compound combination comprising the metal complex in the preceding embodiment.

The novel metal complexes each having a polycyclic ligand, which are disclosed by the present disclosure, may be used as light-emitting materials in electroluminescent devices. These novel metal complexes can greatly red-shift the maximum emission wavelengths of the electroluminescent devices, significantly adjust the emitting colors of the devices, achieve very narrow emission spectra, greatly improve the luminescence saturation of the devices, and provide better device performance.

DETAILED DESCRIPTION

Figure 1:
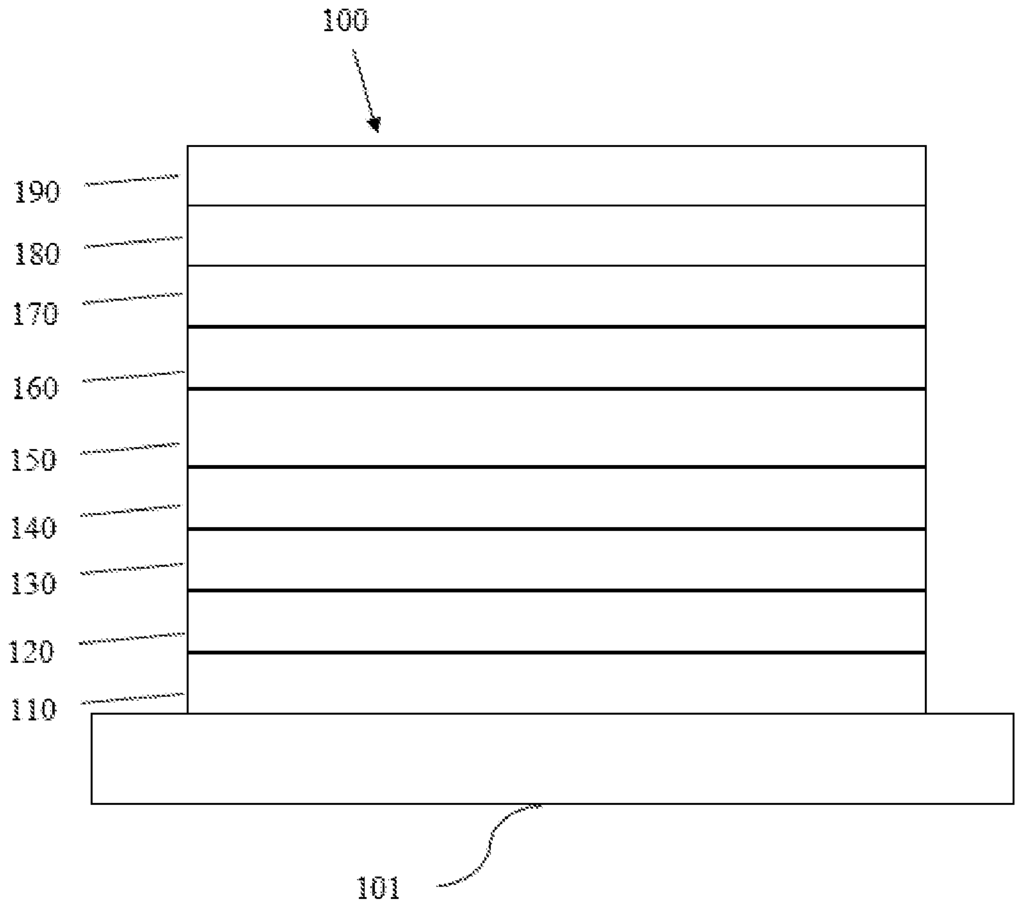
FIG. 1 is a schematic diagram of an organic light-emitting device that may include a metal complex and a compound combination disclosed herein.

OLEDs can be fabricated on various types of substrates such as glass, plastic, and metal foil. FIG. 1 schematically shows an organic light-emitting device 100 without limitation. The figures are not necessarily drawn to scale. Some of the layers in the figures can also be omitted as needed. Device 100 may include a substrate 101, an anode 110, a hole injection layer 120, a hole transport layer 130, an electron blocking layer 140, an emissive layer 150, a hole blocking layer 160, an electron transport layer 170, an electron injection layer 180 and a cathode 190. Device 100 may be fabricated by depositing the layers described in order. The properties and functions of these various layers, as well as example materials, are described in more detail in U.S. Pat. No. 7,279,704 at cols. 6-10, the contents of which are incorporated by reference herein in its entirety.

More examples for each of these layers are available. For example, a flexible and transparent substrate-anode combination is disclosed in U.S. Pat. No. 5,844,363, which is incorporated by reference herein in its entirety. An example of a p-doped hole transport layer is m-MTDATA doped with F4-TCNQ at a molar ratio of 50:1, as disclosed in U.S. Patent Application Publication No. 2003/0230980, which is incorporated by reference herein in its entirety. Examples of host materials are disclosed in U.S. Pat. No. 6,303,238 to Thompson et al., which is incorporated by reference herein in its entirety. An example of an n-doped electron transport layer is BPhen doped with Li at a molar ratio of 1:1, as disclosed in U.S. Patent Application Publication No. 2003/0230980, which is incorporated by reference herein in its entirety. U.S. Pat. Nos. 5,703,436 and 5,707,745, which are incorporated by reference herein in their entireties, disclose examples of cathodes including composite cathodes having a thin layer of metal such as Mg:Ag with an overlying transparent, electrically-conductive, sputter-deposited ITO layer. The theory and use of blocking layers are described in more detail in U.S. Pat. No. 6,097,147 and U.S. Patent Application Publication No. 2003/0230980, which are incorporated by reference herein in their entireties. Examples of injection layers are provided in U.S. Patent Application Publication No. 2004/0174116, which is incorporated by reference herein in its entirety. A description of protective layers may be found in U.S. Patent Application Publication No. 2004/0174116, which is incorporated by reference herein in its entirety.

The layered structure described above is provided by way of non-limiting examples. Functional OLEDs may be achieved by combining the various layers described in different ways, or layers may be omitted entirely. It may also include other layers not specifically described.

Within each layer, a single material or a mixture of multiple materials can be used to achieve optimum performance. Any functional layer may include several sublayers. For example, the emissive layer may have two layers of different emitting materials to achieve desired emission spectrum.

In one embodiment, an OLED may be described as having an "organic layer" disposed between a cathode and an anode. This organic layer may include a single layer or multiple layers.

Figure 2:
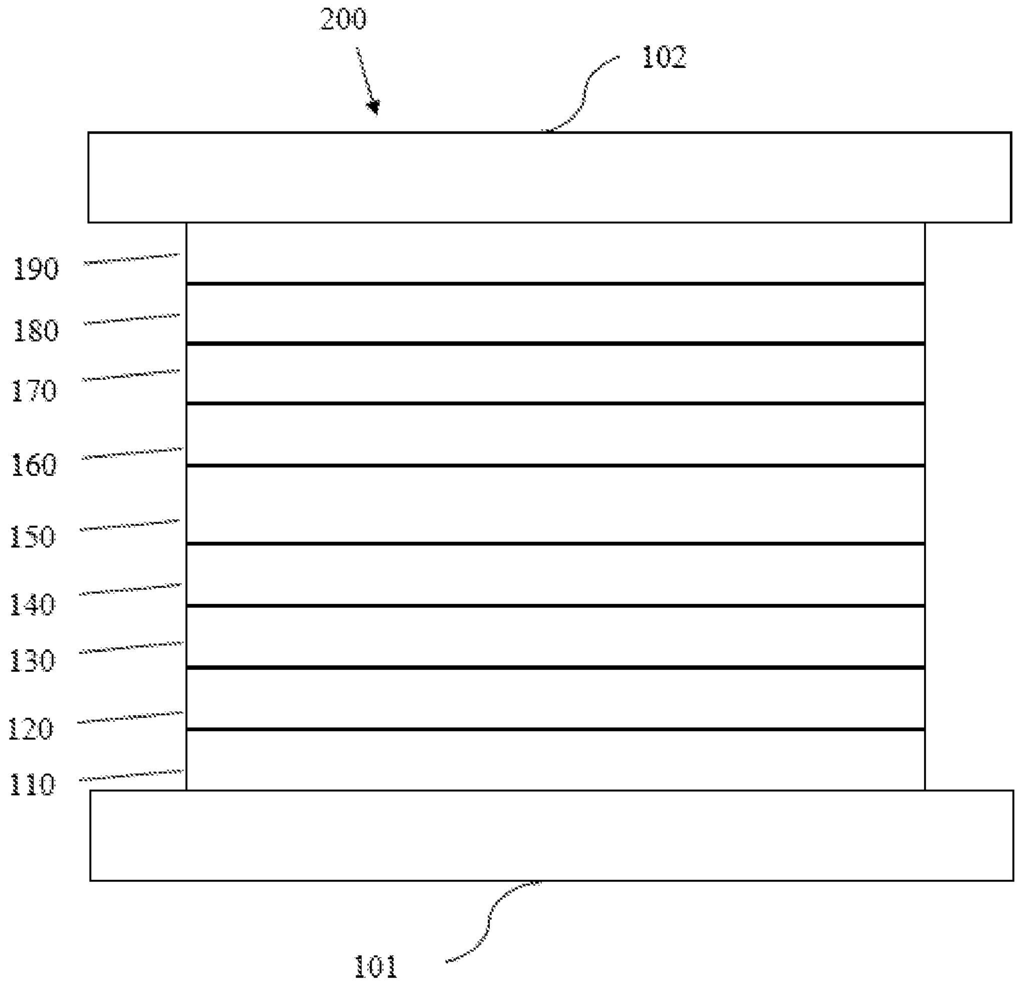
FIG. 2 is a schematic diagram of another organic light-emitting device that may include a metal complex and a compound combination disclosed herein.

An OLED can be encapsulated by a barrier layer. FIG. 2 schematically shows an organic light emitting device 200 without limitation. FIG. 2 differs from FIG. 1 in that the organic light emitting device include a barrier layer 102, which is above the cathode 190, to protect it from harmful species from the environment such as moisture and oxygen. Any material that can provide the barrier function can be used as the barrier layer such as glass or organic-inorganic hybrid layers. The barrier layer should be placed directly or indirectly outside of the OLED device. Multilayer thin film encapsulation was described in U.S. Pat. No. 7,968,146, which is incorporated by reference herein in its entirety.

Devices fabricated in accordance with embodiments of the present disclosure can be incorporated into a wide variety of consumer products that have one or more of the electronic component modules (or units) incorporated therein. Some examples of such consumer products include flat panel displays, monitors, medical monitors, televisions, billboards, lights for interior or exterior illumination and/or signaling, heads-up displays, fully or partially transparent displays, flexible displays, smart phones, tablets, phablets, wearable devices, smart watches, laptop computers, digital cameras, camcorders, viewfinders, micro-displays, 3-D displays, vehicles displays, and vehicle tail lights.

The materials and structures described herein may be used in other organic electronic devices listed above.

As used herein, "top" means furthest away from the substrate, while "bottom" means closest to the substrate. Where a first layer is described as "disposed over" a second layer, the first layer is disposed further away from the substrate. There may be other layers between the first and second layers, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

It is believed that the internal quantum efficiency (IQE) of fluorescent OLEDs can exceed the 25% spin statistics limit through delayed fluorescence. As used herein, there are two types of delayed fluorescence, i.e. P-type delayed fluorescence and E-type delayed fluorescence.

P-type delayed fluorescence is generated from triplet-triplet annihilation (TTA).

On the other hand, E-type delayed fluorescence does not rely on the collision of two triplets, but rather on the transition between the triplet states and the singlet excited states. Compounds that are capable of generating E-type delayed fluorescence are required to have very small singlet-triplet gaps to convert between energy states. Thermal energy can activate the transition from the triplet state back to the singlet state. This type of delayed fluorescence is also known as thermally activated delayed fluorescence (TADF). A distinctive feature of TADF is that the delayed component increases as temperature rises. If the reverse intersystem crossing (RISC) rate is fast enough to minimize the non-radiative decay from the triplet state, the fraction of back populated singlet excited states can potentially reach 75%. The total singlet fraction can be 100%, far exceeding 25% of the spin statistics limit for electrically generated excitons.

E-type delayed fluorescence characteristics can be found in an exciplex system or in a single compound. Without being bound by theory, it is believed that E-type delayed fluorescence requires the luminescent material to have a small singlet-triplet energy gap (AES-r). Organic, non-metal containing, donor-acceptor luminescent materials may be able to achieve this. The emission in these materials is generally characterized as a donor-acceptor charge-transfer (CT) type emission. The spatial separation of the HOMO and LUMO in these donor-acceptor type compounds generally results in small AEs-T. These states may involve CT states. Generally, donor-acceptor luminescent materials are constructed by connecting an electron donor moiety such as amino- or carbazole-derivatives and an electron acceptor moiety such as N-containing six-membered aromatic rings.

Definition of Terms of Substituents

Halogen or halide—as used herein includes fluorine, chlorine, bromine, and iodine.

Alkyl—as used herein includes both straight and branched chain alkyl groups. Alkyl may be alkyl having 1 to 20 carbon atoms, preferably alkyl having 1 to 12 carbon atoms, and more preferably alkyl having 1 to 6 carbon atoms. Examples of alkyl groups include a methyl group, an ethyl group, a propyl group, an isopropyl group, a n-butyl group, an s-butyl group, an isobutyl group, a t-butyl group, an n-pentyl group, an n-hexyl group, an n-heptyl group, an n-octyl group, an n-nonyl group, an n-decyl group, an n-undecyl group, an n-dodecyl group, an n-tridecyl group, an n-tetradecyl group, an n-pentadecyl group, an n-hexadecyl group, an n-heptadecyl group, an n-octadecyl group, a neopentyl group, a 1-methylpentyl group, a 2-methylpentyl group, a 1-pentylhexyl group, a 1-butylpentyl group, a 1-heptyloctyl group, and a 3-methylpentyl group. Of the above, preferred are a methyl group, an ethyl group, a propyl group, an isopropyl group, a n-butyl group, an s-butyl group, an isobutyl group, a t-butyl group, an n-pentyl group, a neopentyl group, and an n-hexyl group. Additionally, the alkyl group may be optionally substituted.

Cycloalkyl—as used herein includes cyclic alkyl groups. The cycloalkyl groups may be those having 3 to 20 ring carbon atoms, preferably those having 4 to 10 carbon atoms. Examples of cycloalkyl include cyclobutyl, cyclopentyl, cyclohexyl, 4-methylcyclohexyl, 4,4-dimethylcylcohexyl, 1-adamantyl, 2-adamantyl, 1-norbornyl, 2-norbornyl, and the like. Of the above, preferred are cyclopentyl, cyclohexyl, 4-methylcyclohexyl, and 4,4-dimethylcylcohexyl. Additionally, the cycloalkyl group may be optionally substituted.

Heteroalkyl—as used herein, includes a group formed by replacing one or more carbons in an alkyl chain with a hetero-atom(s) selected from the group consisting of a nitrogen atom, an oxygen atom, a sulfur atom, a selenium atom, a phosphorus atom, a silicon atom, a germanium atom, and a boron atom. Heteroalkyl may be those having 1 to 20 carbon atoms, preferably those having 1 to 10 carbon atoms, and more preferably those having 1 to 6 carbon atoms. Examples of heteroalkyl include methoxymethyl, ethoxymethyl, ethoxyethyl, methylthiomethyl, ethylthiomethyl, ethylthioethyl, methoxymethoxymethyl, ethoxymethoxymethyl, ethoxyethoxyethyl, hydroxymethyl, hydroxyethyl, hydroxypropyl, mercaptomethyl, mercaptoethyl, mercaptopropyl, aminomethyl, aminoethyl, aminopropyl, dimethylaminomethyl, trimethylgermanylmethyl, trimethylgermanylethyl, trimethylgermanylisopropyl, dimethylethylgermanylmethyl, dimethylisopropylgermanylmethyl, tert-butyldimethylgermanylmethyl, triethylgermanylmethyl, triethylgermanylethyl, triisopropylgermanylmethyl, triisopropylgermanylethyl, trimethylsilylmethyl, trimethylsilylethyl, trimethylsilylisopropyl, triisopropylsilylmethyl, and triisopropylsilylethyl. Additionally, the heteroalkyl group may be optionally substituted.

Alkenyl—as used herein includes straight chain, branched chain, and cyclic alkene groups. Alkenyl may be those having 2 to 20 carbon atoms, preferably those having 2 to 10 carbon atoms. Examples of alkenyl include vinyl, 1-propenyl group, 1-butenyl, 2-butenyl, 3-butenyl, 1,3-butandienyl, 1-methylvinyl, styryl, 2,2-diphenylvinyl, 1,2-diphenylvinyl, 1-methylallyl, 1,1-dimethylallyl, 2-methylallyl, 1-phenylallyl, 2-phenylallyl, 3-phenylallyl, 3,3-diphenylallyl, 1,2-dimethylallyl, 1-phenyl-1-butenyl, 3-phenyl-1-butenyl, cyclopentenyl, cyclopentadienyl, and cyclohexenyl, cycloheptenyl, cycloheptatrienyl, cyclooctenyl, cyclooctatetraenyl, norbornenyl. Additionally, the alkenyl group may be optionally substituted.

Alkynyl—as used herein includes straight chain alkynyl groups. Alkynyl may be those having 2 to 20 carbon atoms, preferably those having 2 to 10 carbon atoms. Examples of alkynyl groups include ethynyl, propynyl, propargyl, 1-butynyl, 2-butynyl, 3-butynyl, 1-pentynyl, 2-pentynyl, 3,3-dimethyl-1-butynyl, 3-ethyl-3-methyl-1-pentynyl, 3,3-diisopropyl-1-pentynyl, phenylethynyl, phenylpropynyl, etc. Of the above, preferred are ethynyl, propynyl, propargyl, 1-butynyl, 2-butynyl, 3-butynyl, 1-pentynyl, and phenylethynyl. Additionally, the alkynyl group may be optionally substituted.

Aryl or an aromatic group—as used herein includes non-condensed and condensed systems. Aryl may be those having 6 to 30 carbon atoms, preferably those having 6 to 20 carbon atoms, and more preferably those having 6 to 12 carbon atoms. Examples of aryl groups include phenyl, biphenyl, terphenyl, triphenylene, tetraphenylene, naphthalene, anthracene, phenalene, phenanthrene, fluorene, pyrene, chrysene, perylene, and azulene, preferably phenyl, biphenyl, terphenyl, triphenylene, fluorene, and naphthalene. Examples of non-condensed aryl groups include phenyl, biphenyl-2-yl, biphenyl-3-yl, biphenyl-4-yl, p-terphenyl-4-yl, p-terphenyl-3-yl, p-terphenyl-2-yl, m-terphenyl-4-yl, m-terphenyl-3-yl, m-terphenyl-2-yl, o-tolyl, m-tolyl, p-tolyl, p-(2-phenylpropyl)phenyl, 4'-methylbiphenylyl, 4"-t-butyl-p-terphenyl-4-yl, o-cumenyl, m-cumenyl, p-cumenyl, 2,3-xylyl, 3,4-xylyl, 2,5-xylyl, mesityl, and m-quarterphenyl. Additionally, the aryl group may be optionally substituted.

Heterocyclic groups or heterocycle—as used herein include non-aromatic cyclic groups. Non-aromatic heterocyclic groups include saturated heterocyclic groups having 3 to 20 ring atoms and unsaturated non-aromatic heterocyclic groups having 3 to 20 ring atoms, where at least one ring atom is selected from the group consisting of a nitrogen atom, an oxygen atom, a sulfur atom, a selenium atom, a silicon atom, a phosphorus atom, a germanium atom, and a boron atom. Preferred non-aromatic heterocyclic groups are those having 3 to 7 ring atoms, each of which includes at least one hetero-atom such as nitrogen, oxygen, silicon, or sulfur. Examples of non-aromatic heterocyclic groups include oxiranyl, oxetanyl, tetrahydrofuranyl, tetrahydropyranyl, dioxolanyl, dioxanyl, aziridinyl, dihydropyrrolyl, tetrahydropyrrolyl, piperidinyl, oxazolidinyl, morpholinyl, piperazinyl, oxepinyl, thiepinyl, azepinyl, and tetrahydrosilolyl. Additionally, the heterocyclic group may be optionally substituted.

Heteroaryl—as used herein, includes non-condensed and condensed hetero-aromatic groups having 1 to 5 hetero-atoms, where at least one hetero-atom is selected from the group consisting of a nitrogen atom, an oxygen atom, a sulfur atom, a selenium atom, a silicon atom, a phosphorus atom, a germanium atom, and a boron atom. A hetero-aromatic group is also referred to as heteroaryl. Heteroaryl may be those having 3 to 30 carbon atoms, preferably those having 3 to 20 carbon atoms, and more preferably those having 3 to 12 carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridoindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group may be optionally substituted.

Alkoxy—as used herein, is represented by —O-alkyl, —O-cycloalkyl, —O-heteroalkyl, or —O-heterocyclic group. Examples and preferred examples of alkyl, cycloalkyl, heteroalkyl, and heterocyclic groups are the same as those described above. Alkoxy groups may be those having 1 to 20 carbon atoms, preferably those having 1 to 6 carbon atoms. Examples of alkoxy groups include methoxy, ethoxy, propoxy, butoxy, pentyloxy, hexyloxy, cyclopropyloxy, cyclobutyloxy, cyclopentyloxy, cyclohexyloxy, tetrahydrofuranyloxy, tetrahydropyranyloxy, methoxypropyloxy, ethoxyethyloxy, methoxymethyloxy, and ethoxymethyloxy. Additionally, the alkoxy group may be optionally substituted.

Aryloxy—as used herein, is represented by —O-aryl or —O-heteroaryl. Examples and preferred examples of aryl and heteroaryl are the same as those described above. Aryloxy groups may be those having 6 to 30 carbon atoms, preferably those having 6 to 20 carbon atoms. Examples of aryloxy groups include phenoxy and biphenyloxy. Additionally, the aryloxy group may be optionally substituted.

Arylalkyl—as used herein, contemplates alkyl substituted with an aryl group. Arylalkyl may be those having 7 to 30 carbon atoms, preferably those having 7 to 20 carbon atoms, and more preferably those having 7 to 13 carbon atoms. Examples of arylalkyl groups include benzyl, 1-phenylethyl, 2-phenylethyl, 1-phenylisopropyl, 2-phenylisopropyl, phenyl-t-butyl, alpha-naphthylmethyl, 1-alpha-naphthylethyl, 2-alpha-naphthylethyl, 1-alpha-naphthylisopropyl, 2-alpha-naphthylisopropyl, beta-naphthylmethyl, 1-beta-naphthylethyl, 2-beta-naphthylethyl, 1-beta-naphthylisopropyl, 2-beta-naphthylisopropyl, p-methylbenzyl, m-methylbenzyl, O-methylbenzyl, p-chlorobenzyl, m-chlorobenzyl, o-chlorobenzyl, p-bromobenzyl, m-bromobenzyl, o-bromobenzyl, p-iodobenzyl, m-iodobenzyl, o-iodobenzyl, p-hydroxybenzyl, m-hydroxybenzyl, o-hydroxybenzyl, p-aminobenzyl, m-aminobenzyl, o-aminobenzyl, p-nitrobenzyl, m-nitrobenzyl, o-nitrobenzyl, p-cyanobenzyl, m-cyanobenzyl, o-cyanobenzyl, 1-hydroxy-2-phenylisopropyl, and 1-chloro-2-phenylisopropyl. Of the above, preferred are benzyl, p-cyanobenzyl, m-cyanobenzyl, o-cyanobenzyl, 1-phenylethyl, 2-phenylethyl, 1-phenylisopropyl, and 2-phenylisopropyl. Additionally, the arylalkyl group may be optionally substituted.

Alkylsilyl—as used herein, contemplates a silyl group substituted with an alkyl group. Alkylsilyl groups may be those having 3 to 20 carbon atoms, preferably those having 3 to 10 carbon atoms. Examples of alkylsilyl groups include trimethylsilyl, triethylsilyl, methyldiethylsilyl, ethyldimethylsilyl, tripropylsilyl, tributylsilyl, triisopropylsilyl, methyldiisopropylsilyl, dimethylisopropylsilyl, tri-t-butylsilyl, triisobutylsilyl, dimethyl t-butylsilyl, and methyldi-t-butylsilyl. Additionally, the alkylsilyl group may be optionally substituted.

Arylsilyl—as used herein, contemplates a silyl group substituted with an aryl group. Arylsilyl groups may be those having 6 to 30 carbon atoms, preferably those having 8 to 20 carbon atoms. Examples of arylsilyl groups include triphenylsilyl, phenyldibiphenylylsilyl, diphenylbiphenylsilyl, phenyldiethylsilyl, diphenylethylsilyl, phenyldimethylsilyl, diphenylmethylsilyl, phenyldiisopropylsilyl, diphenylisopropylsilyl, diphenylbutylsilyl, diphenylisobutylsilyl, diphenyl t-butylsilyl. Additionally, the arylsilyl group may be optionally substituted.

Alkylgermanyl—as used herein contemplates a germanyl substituted with an alkyl group. The alkylgermanyl may be those having 3 to 20 carbon atoms, preferably those having 3 to 10 carbon atoms. Examples of alkylgermanyl include trimethylgermanyl, triethylgermanyl, methyldiethylgermanyl, ethyldimethylgermanyl, tripropylgermanyl, tributylgermanyl, triisopropylgermanyl, methyldiisopropylgermanyl, dimethylisopropylgermanyl, tri-t-butylgermanyl, tri-isobutylgermanyl, dimethyl-t-butylgermanyl, and methyldi-t-butylgermanyl. Additionally, the alkylgermanyl may be optionally substituted.

Arylgermanyl—as used herein contemplates a germanyl substituted with at least one aryl group or heteroaryl group. Arylgermanyl may be those having 6 to 30 carbon atoms, preferably those having 8 to 20 carbon atoms. Examples of arylgermanyl include triphenylgermanyl, phenyldibiphenylylgermanyl, diphenylbiphenylgermanyl, phenyldiethylgermanyl, diphenylethylgermanyl, phenyldimethylgermanyl, diphenylmethylgermanyl, phenyldiisopropylgermanyl, diphenylisopropylgermanyl, diphenylbutylgermanyl, diphenylisobutylgermanyl, and diphenyl-t-butylgermanyl. Additionally, the arylgermanyl may be optionally substituted.

The term "aza" in azadibenzofuran, azadibenzothiophene, etc. means that one or more of C—H groups in the respective aromatic fragment are replaced by a nitrogen atom. For example, azatriphenylene encompasses dibenzo[f,h] quinoxaline, dibenzo[f,h] quinoline and other analogs with two or more nitrogens in the ring system. One of ordinary skill in the art can readily envision other nitrogen analogs of the aza-derivatives described above, and all such analogs are intended to be encompassed by the terms as set forth herein.

In the present disclosure, unless otherwise defined, when any term of the group consisting of substituted alkyl, substituted cycloalkyl, substituted heteroalkyl, substituted heterocyclic group, substituted arylalkyl, substituted alkoxy, substituted aryloxy, substituted alkenyl, substituted alkynyl, substituted aryl, substituted heteroaryl, substituted alkylsilyl, substituted arylsilyl, substituted alkylgermanyl, substituted arylgermanyl, substituted amino, substituted acyl, substituted carbonyl, a substituted carboxylic acid group, a substituted ester group, substituted sulfinyl, substituted sulfonyl, and substituted phosphino is used, it means that any group of alkyl, cycloalkyl, heteroalkyl, heterocyclic group, arylalkyl, alkoxy, aryloxy, alkenyl, alkynyl, aryl, heteroaryl, alkylsilyl, arylsilyl, alkylgermanyl, arylgermanyl, amino, acyl, carbonyl, a carboxylic acid group, an ester group, sulfinyl, sulfonyl, and phosphino may be substituted with one or more groups selected from the group consisting of deuterium, halogen, unsubstituted alkyl having 1 to 20 carbon atoms, unsubstituted cycloalkyl having 3 to 20 ring carbon atoms, unsubstituted heteroalkyl having 1 to 20 carbon atoms, an unsubstituted heterocyclic group having 3 to 20 ring atoms, unsubstituted arylalkyl having 7 to 30 carbon atoms, unsubstituted alkoxy having 1 to 20 carbon atoms, unsubstituted aryloxy having 6 to 30 carbon atoms, unsubstituted alkenyl having 2 to 20 carbon atoms, unsubstituted alkynyl having 2 to 20 carbon atoms, unsubstituted aryl having 6 to 30 carbon atoms, unsubstituted heteroaryl having 3 to 30 carbon atoms, unsubstituted alkylsilyl having 3 to 20 carbon atoms, unsubstituted arylsilyl group having 6 to 20 carbon atoms, unsubstituted alkylgermanyl group having 3 to 20 carbon atoms, unsubstituted arylgermanyl group having 6 to 20 carbon atoms, unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or an attached fragment are considered to be equivalent.

In the compounds mentioned in the present disclosure, hydrogen atoms may be partially or fully replaced by deuterium. Other atoms such as carbon and nitrogen may also be replaced by their other stable isotopes. The replacement by other stable isotopes in the compounds may be preferred due to its enhancements of device efficiency and stability.

In the compounds mentioned in the present disclosure, multiple substitutions refer to a range that includes di-substitutions, up to the maximum available substitutions. When substitution in the compounds mentioned in the present disclosure represents multiple substitutions (including di-, tri-, and tetra-substitutions etc.), that means the substituent may exist at a plurality of available substitution positions on its linking structure, the substituents present at a plurality of available substitution positions may have the same structure or different structures.

In the compounds mentioned in the present disclosure, adjacent substituents in the compounds cannot be joined to form a ring unless otherwise explicitly defined, for example, adjacent substituents can be optionally joined to form a ring. In the compounds mentioned in the present disclosure, the expression that adjacent substituents can be optionally joined to form a ring includes a case where adjacent substituents may be joined to form a ring and a case where adjacent substituents are not joined to form a ring. When adjacent substituents can be optionally joined to form a ring, the ring formed may be monocyclic or polycyclic (including spirocyclic, endocyclic, fusedcyclic, and etc.), as well as alicyclic, heteroalicyclic, aromatic, or heteroaromatic. In such expression, adjacent substituents may refer to substituents bonded to the same atom, substituents bonded to carbon atoms which are directly bonded to each other, or substituents bonded to carbon atoms which are more distant from each other. Preferably, adjacent substituents refer to substituents bonded to the same carbon atom and substituents bonded to carbon atoms which are directly bonded to each other.

The expression that adjacent substituents can be optionally joined to form a ring is also intended to mean that two substituents bonded to the same carbon atom are joined to each other via a chemical bond to form a ring, which can be exemplified by the following formula:

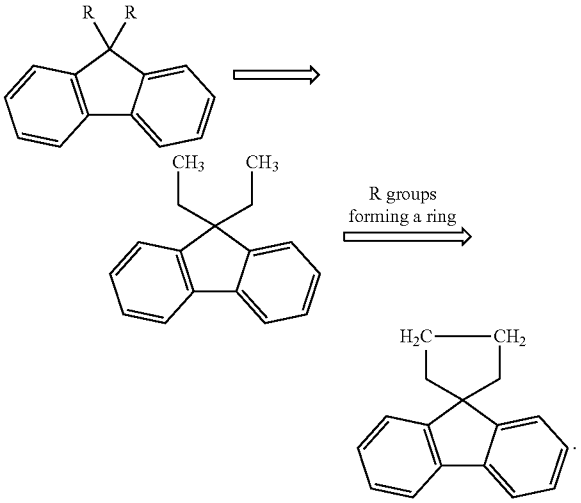

The expression that adjacent substituents can be optionally joined to form a ring is also intended to mean that two substituents bonded to carbon atoms which are directly bonded to each other are joined to each other via a chemical bond to form a ring, which can be exemplified by the following formula:

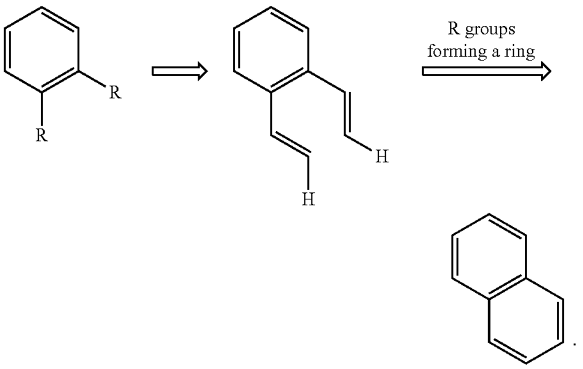

The expression that adjacent substituents can be optionally joined to form a ring is also intended to mean that two substituents bonded to further distant carbon atoms are joined to each other via a chemical bond to form a ring, which can be exemplified by the following formula:

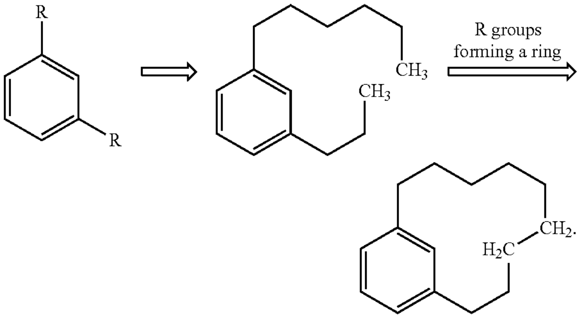

Furthermore, the expression that adjacent substituents can be optionally joined to form a ring is also intended to mean that, in the case where one of the two substituents bonded to carbon atoms which are directly bonded to each other represents hydrogen, the second substituent is bonded at a position at which the hydrogen atom is bonded, thereby forming a ring. This is exemplified by the following formula:

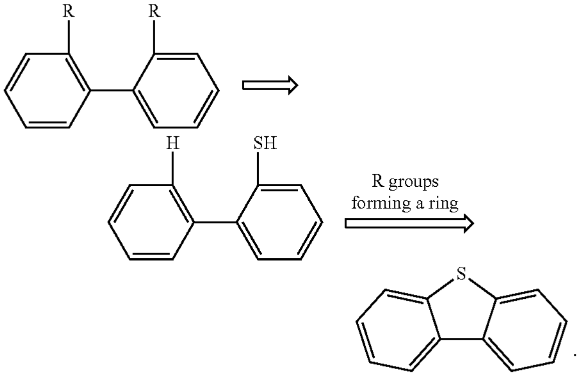

According to an embodiment of the present disclosure, disclosed is a metal complex comprising a ligand $L_a$ and a metal M, wherein the metal M is selected from a metal with a relative atomic mass greater than 40, and the ligand $L_a$ has a structure represented by Formula 1:

Formula 1

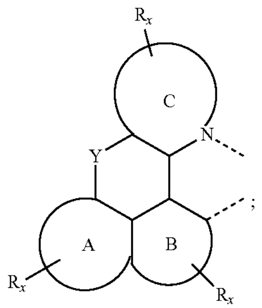

wherein the ring A and the ring B are each independently selected from a five-membered unsaturated carbocyclic ring, an aromatic ring having 6 to 30 carbon atoms or a heteroaromatic ring having 3 to 30 carbon atoms; and the ring C is selected from a heteroaromatic ring having 3 to 30 carbon atoms;

$R_x$ represents, at each occurrence identically or differently, mono-substitution, multiple substitutions or non-substitution;

Y is selected from $CR_yR_y$, $SiR_yR_y$, $GeR_yR_y$, $NR_y$, $PR_y$, O, S or Se; when two $R_y$ are present at the same time, the two $R_y$ may be the same or different;

$R_x$ and $R_y$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof; and adjacent substituents $R_x$ and $R_y$ can be optionally joined to form a ring.

In this embodiment, the expression that "adjacent substituents $R_x$ and $R_y$ can be optionally joined to form a ring" is intended to mean that any one or more of groups of adjacent substituents, such as adjacent substituents $R_x$, adjacent substituents $R_y$ and adjacent substituents $R_x$ and $R_y$, can be joined to form a ring. Obviously, it is possible that none of these groups of adjacent substituents are joined to form a ring.

According to an embodiment of the present disclosure, wherein, the ring A and the ring B are each independently selected from a five-membered unsaturated carbocyclic ring, an aromatic ring having 6 to 18 carbon atoms or a heteroaromatic ring having 3 to 18 carbon atoms; and/or the ring C is selected from a heteroaromatic ring having 3 to 18 carbon atoms.

According to an embodiment of the present disclosure, wherein, the ring A and the ring B are each independently selected from a five-membered unsaturated carbocyclic ring, an aromatic ring having 6 to 10 carbon atoms or a heteroaromatic ring having 3 to 10 carbon atoms; and/or the ring C is selected from a heteroaromatic ring having 3 to 10 carbon atoms.

According to an embodiment of the present disclosure, wherein, the ring A and the ring B are each independently selected from a benzene ring, a naphthalene ring, an indene ring, a pyridine ring, a furan ring, a thiophene ring, a pyrrole ring, a cyclopentadiene ring, a quinoline ring, an isoquinoline ring, a quinazoline ring, a quinoxaline ring, a naphthyridine ring, a benzofuran ring, a benzothiophene ring or an indole ring; and/or the ring C is selected from an imidazole ring, a pyridine ring, a quinoline ring, an isoquinoline ring, a quinazoline ring, a quinoxaline ring, a naphthyridine ring, an azabenzofuran ring, an azabenzothiophene ring or an azaindole ring.

According to an embodiment of the present disclosure, wherein, the $L_a$ has a structure represented by any one of the group consisting of Formula 2 to Formula 15:

Formula 2

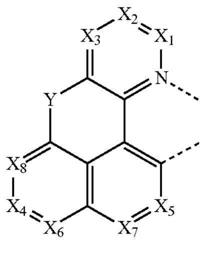
,

-continued

Formula 3

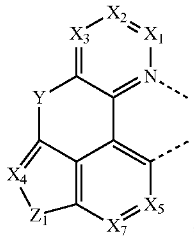
,

Formula 4

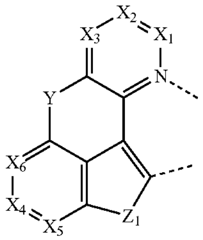
,

Formula 5

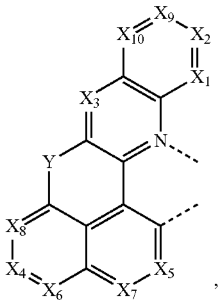
,

Formula 6

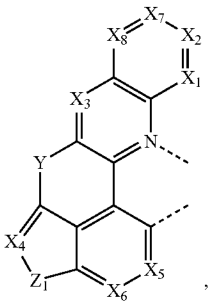
,

Formula 7

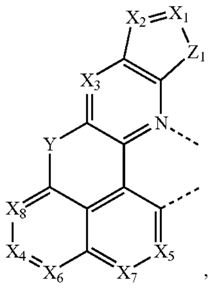
,

-continued

Formula 8

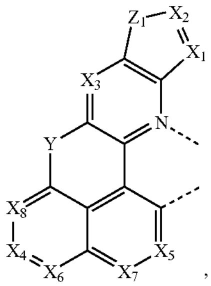

,

Formula 9

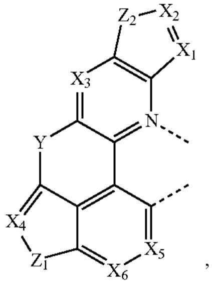

,

Formula 10

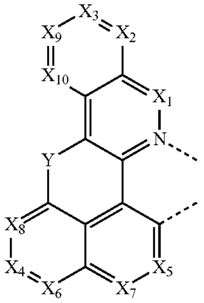

,

Formula 11

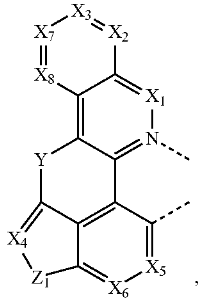

,

Formula 12

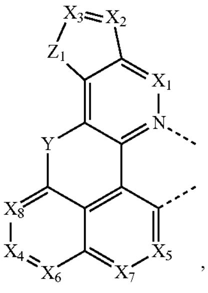

,

-continued

Formula 13

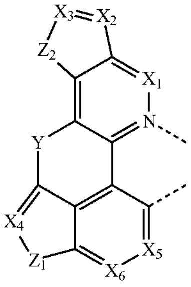

,

Formula 14

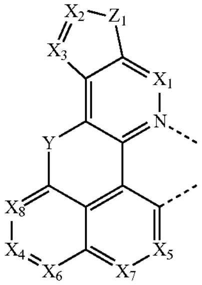

, and

Formula 15

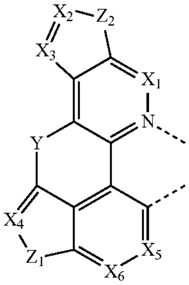

;

$X_1$ to $X_{10}$ are, at each occurrence identically or differently, selected from $CR_x$ or N;

$Z_1$ and $Z_2$ are, at each occurrence identically or differently, selected from O, S or $NR_z$;

Y is selected from $CR_yR_y$, $SiR_yR_y$, $GeR_yR_y$, $NR_y$, $PR_y$, O, S or Se; when two $R_y$ are present at the same time, the two $R_y$ are the same or different;

$R_x$, $R_z$ and $R_y$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof; and adjacent substituents $R_x$, $R_z$, $R_y$ can be optionally joined to form a ring.

In the present disclosure, the expression that "adjacent substituents $R_x$, $R_z$, $R_y$ can be optionally joined to form a ring" is intended to mean that any one or more of groups of adjacent substituents, such as adjacent substituents $R_x$, adjacent substituents $R_y$ and adjacent substituents $R_z$, can be joined to form a ring. Obviously, it is possible that none of these groups of adjacent substituents are joined to form a ring.

According to an embodiment of the present disclosure, wherein, the $L_a$ has a structure represented by Formula 2, Formula 3, Formula 5, Formula 7, Formula 10, Formula 12 or Formula 14.

According to an embodiment of the present disclosure, wherein, the $L_a$ has a structure represented by Formula 2, Formula 5 or Formula 10.

According to an embodiment of the present disclosure, wherein, in Formula 2 to Formula 15, at least two adjacent substituents of substituents $R_x$, $R_z$, $R_y$ are joined to form a ring. For example, in the structure represented by any one of Formula 2 to Formula 15, at least two adjacent substituents $R_x$ are joined to form a ring, and/or adjacent substituents $R_x$ and $R_z$ are joined to form a ring, and/or two adjacent substituents $R_y$ are joined to form a ring, and/or adjacent substituents $R_x$ and $R_y$ are joined to form a ring.

According to an embodiment of the present disclosure, wherein, in Formula 2 to Formula 15, at least two adjacent substituents $R_x$ are joined to form a ring.

According to an embodiment of the present disclosure, wherein, in Formula 2 to Formula 15, at least one of $X_1$ to $X_n$ is selected from N, and $X_n$ corresponds to one of $X_1$ to $X_{10}$ that has the largest number in any one of Formula 2 to Formula 15.

In this embodiment, in Formula 2 to Formula 15, at least one of $X_1$ to $X_n$ is selected from N, and $X_n$ corresponds to one of $X_1$ to $X_{10}$ that has the largest number in any one of Formula 2 to Formula 15. For example, in Formula 2, $X_n$ corresponds to $X_8$ of $X_1$ to $X_{10}$ that has the largest number in Formula 2, that is, in Formula 2, at least one of $X_1$ to $X_8$ is selected from N. In another example, in Formula 3, $X_n$ corresponds to $X_6$ of $X_1$ to $X_{10}$ that has the largest number in Formula 3, that is, in Formula 3, at least one of $X_1$ to $X_6$ is selected from N.

According to an embodiment of the present disclosure, wherein, in Formula 2 to Formula 15, $X_3$ is N.

According to an embodiment of the present disclosure, wherein, in Formula 2 to Formula 15, $X_1$ to $X_{10}$ are, at each occurrence identically or differently, selected from $CR_x$.

According to an embodiment of the present disclosure, wherein, in Formula 2 to Formula 15, $R_x$, $R_z$ and $R_y$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, a cyano group, an isocyano group, a hydroxyl group, a sulfanyl group and combinations thereof.

According to an embodiment of the present disclosure, wherein, in Formula 2 to Formula 15, $R_x$, $R_z$ and $R_y$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, cyano and combinations thereof.

According to an embodiment of the present disclosure, wherein, in Formula 2 to Formula 15, $R_x$, $R_z$ and $R_y$ are, at each occurrence identically or differently, selected from the group consisting of: hydrogen, deuterium, fluorine, methyl, ethyl, isopropyl, isobutyl, t-butyl, neopentyl, cyclopentyl, cyclopentylmethyl, cyclohexyl, norbornyl, trimethylsilyl, isopropyldimethylsilyl, phenyldimethylsilyl, trifluoromethyl, cyano, phenyl, trimethylpyrimidinyl, di-t-butyltriazinyl and combinations thereof.

According to an embodiment of the present disclosure, wherein, in Formula 2 to Formula 15, at least one, two or three of $X_1$ to $X_n$ are, at each occurrence identically or differently, selected from $CR_x$, and $X_n$ corresponds to one of $X_1$ to $X_{10}$ that has the largest number in any one of Formula 2 to Formula 15; and the $R_x$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, cyano and combinations thereof.

In this embodiment, in Formula 2 to Formula 15, at least one, two or three of $X_1$ to $X_n$ are, at each occurrence identically or differently, selected from $CR_x$, and $X_n$ corresponds to one of $X_1$ to $X_{10}$ that has the largest number in any one of Formula 2 to Formula 15. For example, in Formula 2, $X_n$ corresponds to $X_8$ of $X_1$ to $X_{10}$ that has the largest number in Formula 2, that is, in Formula 2, at least one, two or three of $X_1$ to $X_8$ are, at each occurrence identically or differently, selected from $CR_x$. In another example, in Formula 3, $X_n$ corresponds to $X_6$ of $X_1$ to $X_{10}$ that has the largest number in Formula 3, that is, in Formula 3, at least one, two or three of $X_1$ to $X_6$ are, at each occurrence identically or differently, selected from $CR_x$.

According to an embodiment of the present disclosure, wherein, in Formula 2 to Formula 15, $X_3$ to $X_5$ are, at each occurrence identically or differently, selected from $CR_x$, and the $R_x$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, cyano and combinations thereof.

According to an embodiment of the present disclosure, wherein, in Formula 2 to Formula 15, $X_3$ to $X_5$ are, at each occurrence identically or differently, selected from $CR_x$, and the $R_x$ is, at each occurrence identically or differently, selected from the group consisting of: hydrogen, deuterium, fluorine, methyl, ethyl, isopropyl, isobutyl, t-butyl, neopentyl, cyclopentyl, cyclopentylmethyl, cyclohexyl, norbornyl, trimethylsilyl, isopropyldimethylsilyl, phenyldimethylsilyl, trifluoromethyl, cyano, phenyl, trimethylpyrimidinyl, di-t-butyltriazinyl and combinations thereof.

According to an embodiment of the present disclosure, wherein, in Formula 2 to Formula 15, $X_1$ to $X_{10}$ are, at each occurrence identically or differently, selected from $CR_x$ or N; at least one of $X_1$ to $X_n$ is selected from $CR_x$, and $X_n$ corresponds to one of $X_1$ to $X_{10}$ that has the largest number in any one of Formula 2 to Formula 15; and the $R_x$ is, at each occurrence identically or differently, selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof.

In the present disclosure, in Formula 2 to Formula 15, at least one of $X_1$ to $X_n$ is selected from $CR_x$, and $X_n$ corresponds to one of $X_1$ to $X_{10}$ that has the largest number in any one of Formula 2 to Formula 15. For example, in Formula 2, $X_n$ corresponds to $X_8$ of $X_1$ to $X_{10}$ that has the largest number in Formula 2, that is, in Formula 2, at least one of $X_1$ to $X_8$ is selected from $CR_x$. In another example, in Formula 3, $X_n$ corresponds to $X_6$ of $X_1$ to $X_{10}$ that has the largest number in Formula 3, that is, in Formula 3, at least one of $X_1$ to $X_6$ is selected from $CR_x$.

According to an embodiment of the present disclosure, wherein, in Formula 2 to Formula 15, $X_1$ to $X_{10}$ are, at each occurrence identically or differently, selected from $CR_x$ or N; at least one of $X_1$ to $X_n$ is selected from $CR_x$, and $X_n$ corresponds to one of $X_1$ to $X_{10}$ that has the largest number in any one of Formula 2 to Formula 15; and the $R_x$ is, at each occurrence identically or differently, selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, cyano and combinations thereof.

According to an embodiment of the present disclosure, wherein, in Formula 2 to Formula 15, $X_1$ to $X_{10}$ are, at each occurrence identically or differently, selected from $CR_x$ or N; at least one of $X_1$ to $X_n$ is selected from $CR_x$, and $X_n$ corresponds to one of $X_1$ to $X_{10}$ that has the largest number in any one of Formula 2 to Formula 15; and the $R_x$ is, at each occurrence identically or differently, selected from the group consisting of: deuterium, fluorine, methyl, ethyl, isopropyl, isobutyl, t-butyl, neopentyl, cyclopentyl, cyclopentylmethyl, cyclohexyl, norbornyl, trimethylsilyl, isopropyldimethylsilyl, phenyldimethylsilyl, trifluoromethyl, cyano, phenyl, trimethylpyrimidinyl, di-t-butyltriazinyl and combinations thereof.

According to an embodiment of the present disclosure, wherein, in Formula 2 to Formula 4, Formula 7 to Formula 9 and Formula 12 to Formula 15, at least one of $X_1$ to $X_3$ is selected from $CR_x$; in Formula 5 and Formula 10, at least one of $X_1$ to $X_3$, $X_9$ and $X_{10}$ is selected from $CR_x$; in Formula 6 and Formula 11, at least one of $X_1$ to $X_3$, $X_7$ and $X_8$ is selected from $CR_x$; and the $R_x$ is, at each occurrence identically or differently, selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof.

According to an embodiment of the present disclosure, wherein, in Formula 2 to Formula 15, at least one of $X_1$ to $X_3$ is, at each occurrence identically or differently, selected from $CR_x$; and the $R_x$ is, at each occurrence identically or differently, selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof.

According to an embodiment of the present disclosure, wherein, in Formula 2 to Formula 15, $X_3$ is selected from $CR_x$; and the $R_x$ is, at each occurrence identically or differently, selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof.

According to an embodiment of the present disclosure, wherein, in Formula 2, Formula 5, Formula 7, Formula 8, Formula 10, Formula 12 and Formula 14, at least one or two of $X_4$ to $X_8$ are, at each occurrence identically or differently, selected from $CR_x$; in Formula 3, Formula 4, Formula 6, Formula 9, Formula 11, Formula 13 and Formula 15, at least one or two of $X_4$ to $X_6$ are, at each occurrence identically or differently, selected from $CR_x$; and the $R_x$ is, at each occurrence identically or differently, selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof.

According to an embodiment of the present disclosure, wherein, in Formula 2 to Formula 15, at least one or two of $X_4$ to $X_6$ are, at each occurrence identically or differently, selected from $CR_x$; and the $R_x$ is, at each occurrence identically or differently, selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof.

According to an embodiment of the present disclosure, wherein, in Formula 2 to Formula 15, $X_5$ is selected from $CR_x$; and the $R_x$ is, at each occurrence identically or differently, selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof.

According to an embodiment of the present disclosure, wherein, in Formula 2 to Formula 15, at least one, two or three of $X_1$ to $X_5$ are, at each occurrence identically or differently, selected from $CR_x$; and the $R_x$ is, at each occurrence identically or differently, selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, cyano and combinations thereof. According to an embodiment of the present disclosure, wherein, in Formula 2 to Formula 15, at least one, two or three of $X_1$ to $X_5$ are, at each occurrence identically or differently, selected from $CR_x$; and the $R_x$ is, at each occurrence identically or differently, selected from the group consisting of: deuterium, fluorine, methyl, ethyl, isopropyl, isobutyl, t-butyl, neopentyl, cyclopentyl, cyclopentylmethyl, cyclohexyl, norbornyl, trimethylsilyl, isopropyldimethylsilyl, phenyldimethylsilyl, trifluoromethyl, cyano, phenyl, trimethylpyrimidinyl, di-t-butyltriazinyl and combinations thereof.

According to an embodiment of the present disclosure, wherein, Y is selected from O, S or Se.

According to an embodiment of the present disclosure, wherein, Y is selected from O or S.

According to an embodiment of the present disclosure, wherein, $L_a$ is, at each occurrence identically or differently, selected from the group consisting of $L_{a1}$ to $L_{a1492}$, wherein the specific structures of $L_{a1}$ to $L_{a1492}$ are as follows:
$L_{a1}$
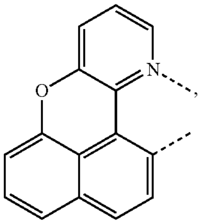
$L_{a2}$
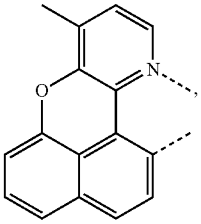
$L_{a3}$
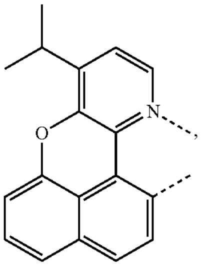
$L_{a4}$
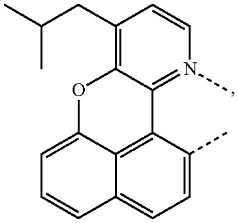
$L_{a5}$
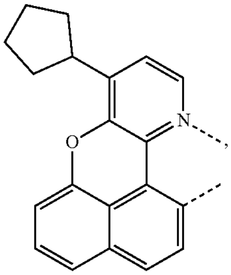
$L_{a6}$
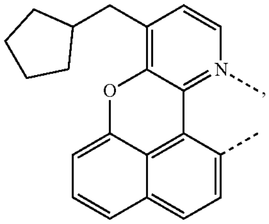
-continued
$L_{a7}$
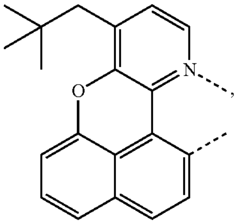
$L_{a8}$
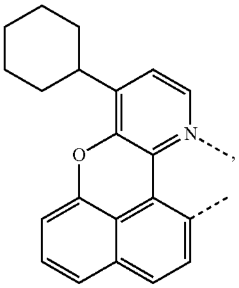
$L_{a9}$
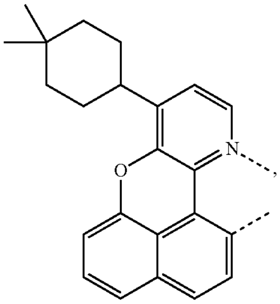
$L_{a10}$
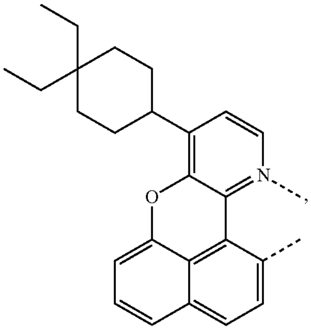
$L_{a11}$
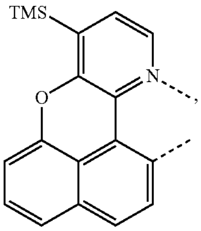

-continued
La12
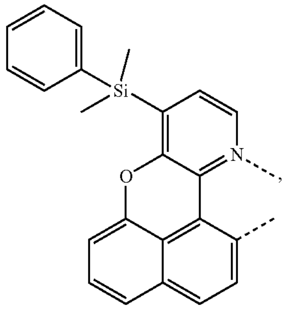
La13
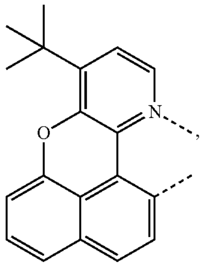
La14
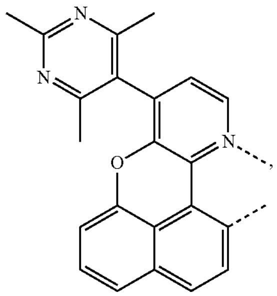
La15
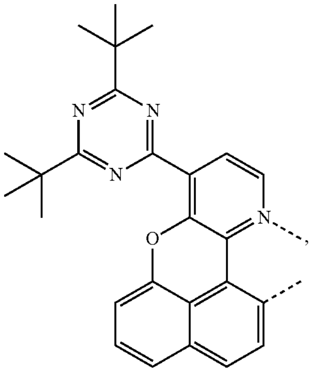
La16
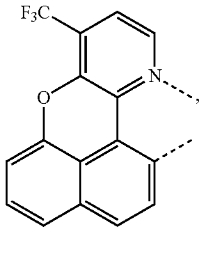
-continued
La17
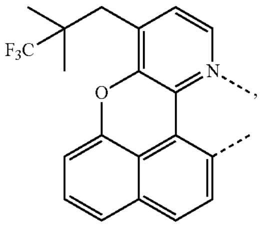
La18
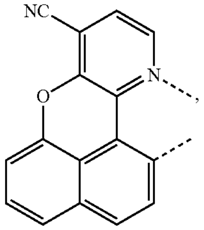
La19
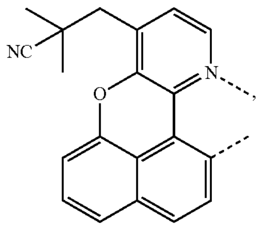
La20
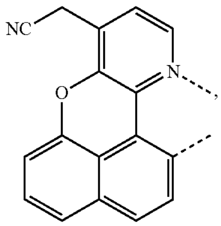
La21
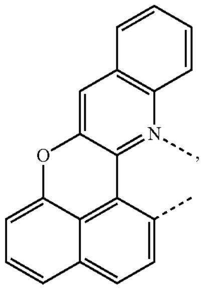
La22
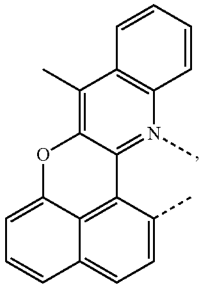

-continued
$L_{a23}$
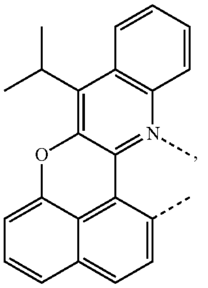
$L_{a24}$
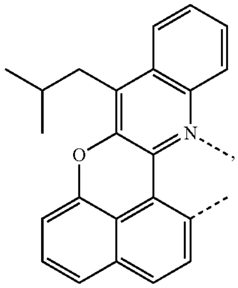
$L_{a25}$
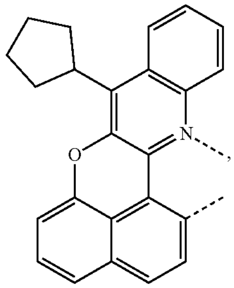
$L_{a26}$
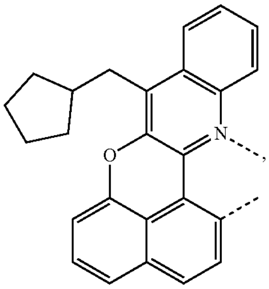
$L_{a27}$
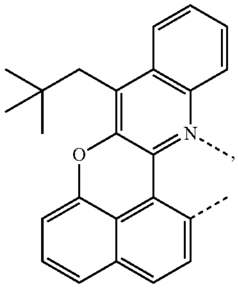
-continued
$L_{a28}$
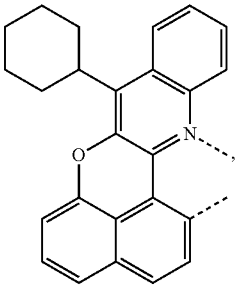
$L_{a29}$
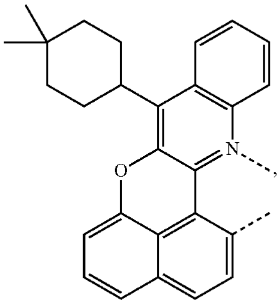
$L_{a30}$
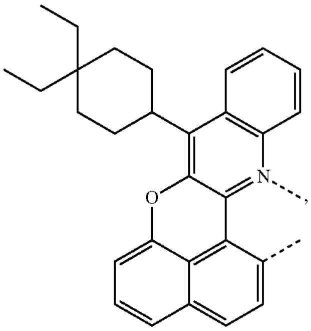
$L_{a31}$
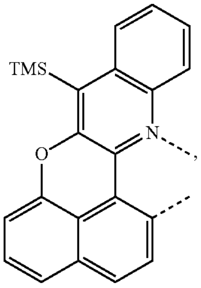
$L_{a32}$
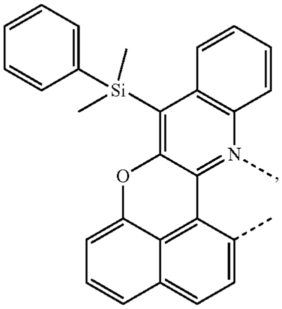

-continued
L$_{a33}$
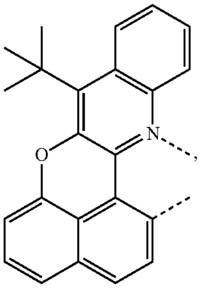
L$_{a34}$
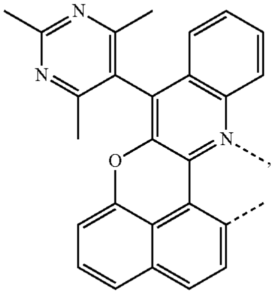
L$_{a35}$
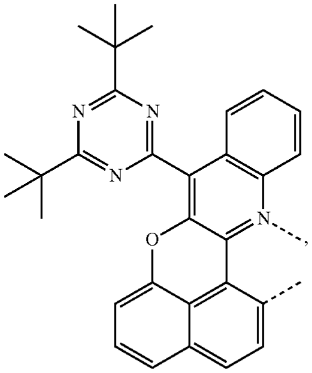
L$_{a36}$
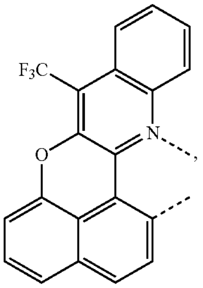
L$_{a37}$
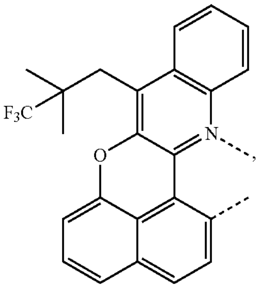
-continued
L$_{a38}$
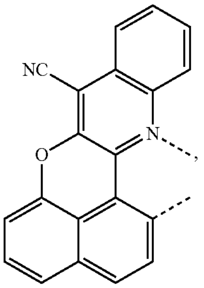
L$_{a39}$
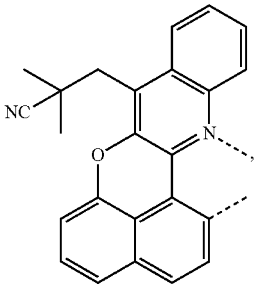
L$_{a40}$
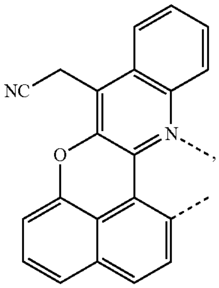
L$_{a41}$
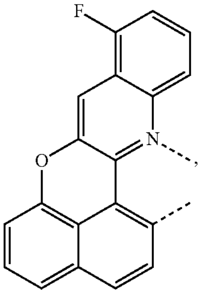
L$_{a42}$
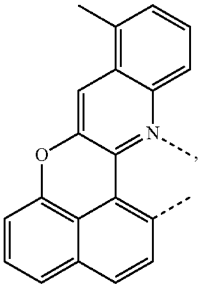

-continued
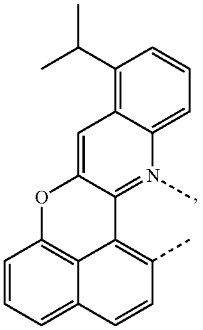
$L_{a43}$
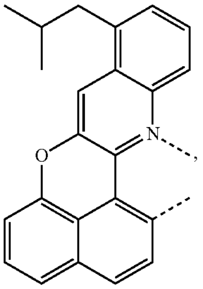
$L_{a44}$
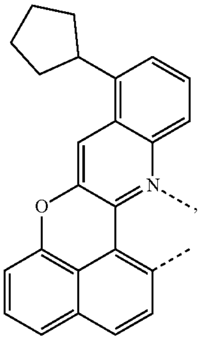
$L_{a45}$
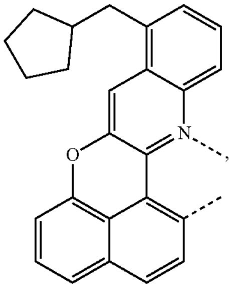
$L_{a46}$
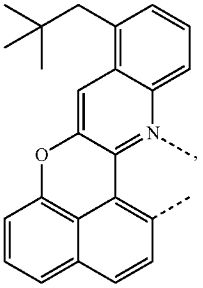
$L_{a47}$
-continued
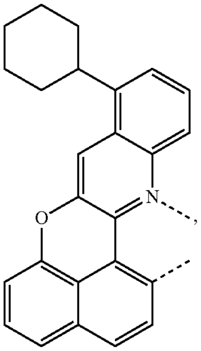
$L_{a48}$
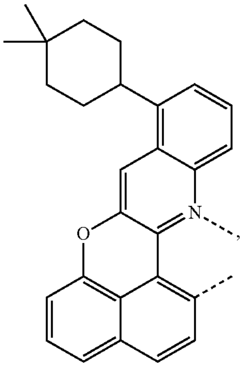
$L_{a49}$
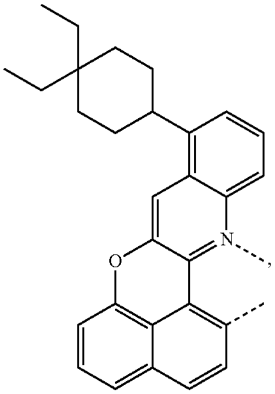
$L_{a50}$
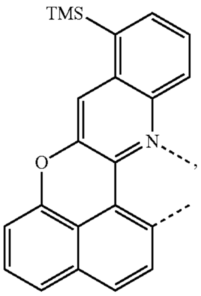
$L_{a51}$ -continued
$L_{a52}$
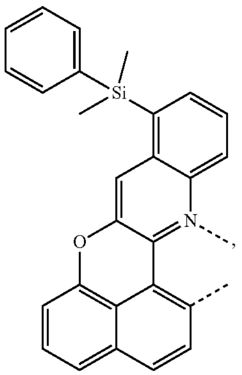
$L_{a53}$
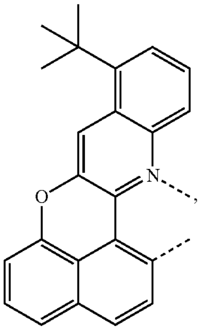
$L_{a54}$
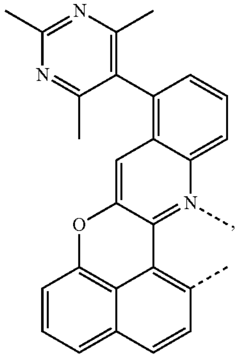
$L_{a55}$
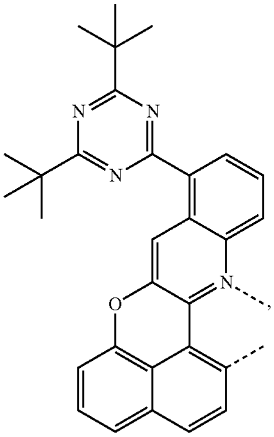
-continued
$L_{a56}$
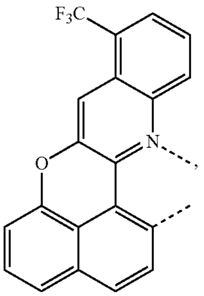
$L_{a57}$
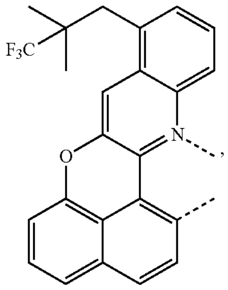
$L_{a58}$
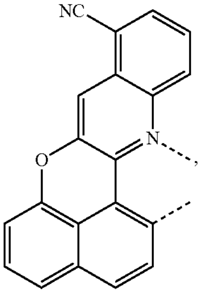
$L_{a59}$
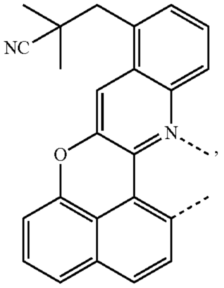
$L_{a60}$
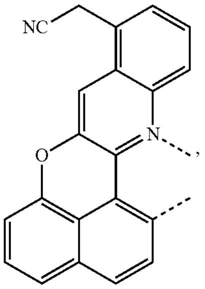

-continued
$L_{a61}$
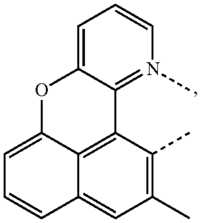
$L_{a62}$
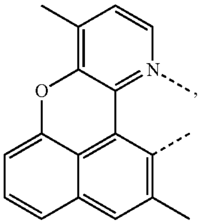
$L_{a63}$
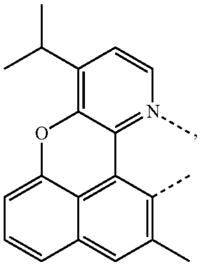
$L_{a64}$
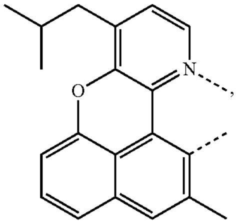
$L_{a65}$
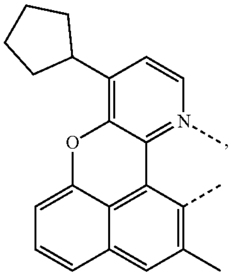
$L_{a66}$
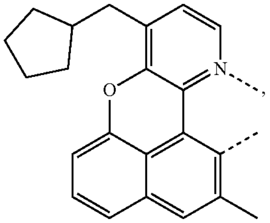
-continued
$L_{a67}$
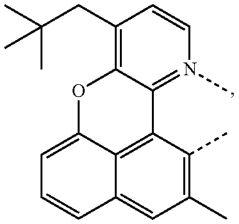
$L_{a68}$
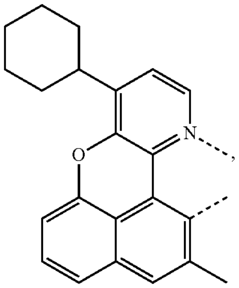
$L_{a69}$
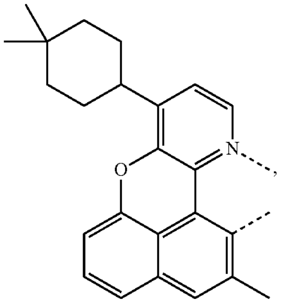
$L_{a70}$
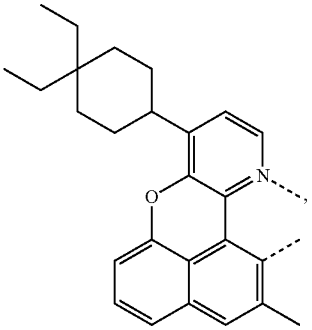
$L_{a71}$
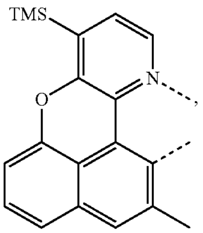

-continued
$L_{a72}$
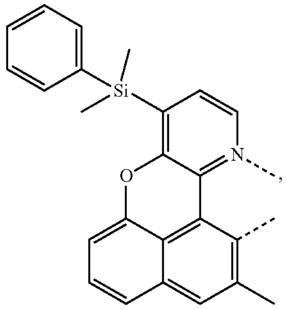
$L_{a73}$
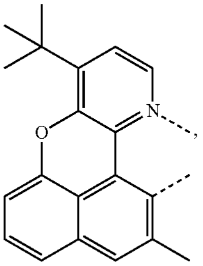
$L_{a74}$
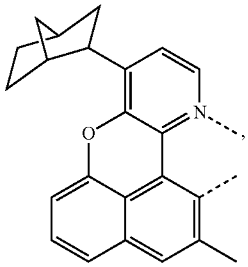
$L_{a75}$
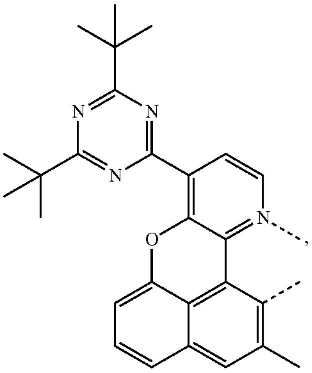
$L_{a76}$
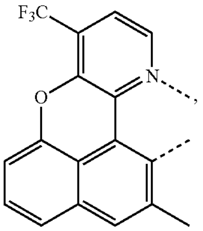
-continued
$L_{a77}$
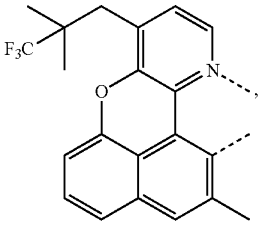
$L_{a78}$
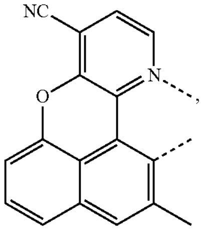
$L_{a79}$
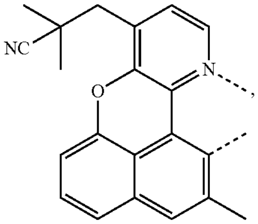
$L_{a80}$
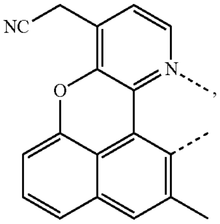
$L_{a81}$
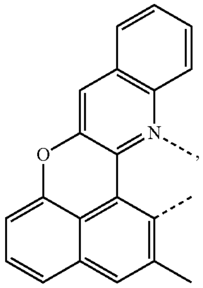
$L_{a82}$
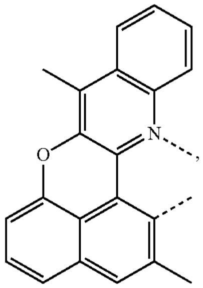

-continued
$L_{a83}$
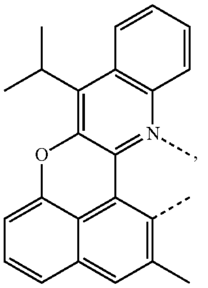
$L_{a84}$
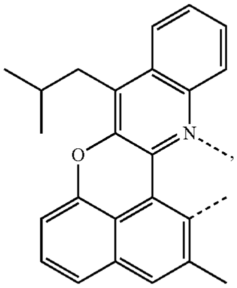
$L_{a85}$
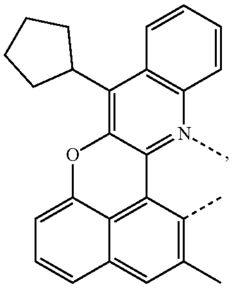
$L_{a86}$
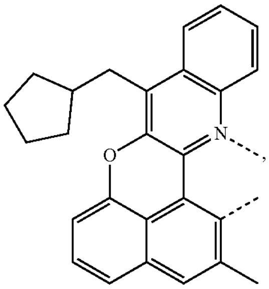
$L_{a87}$
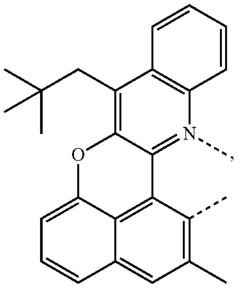
-continued
$L_{a88}$
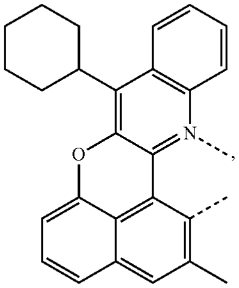
$L_{a89}$
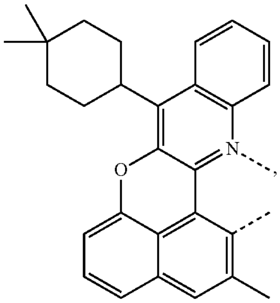
$L_{a90}$
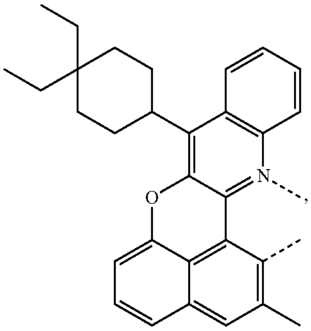
$L_{a91}$
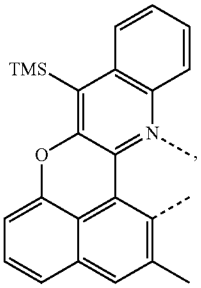
$L_{a92}$
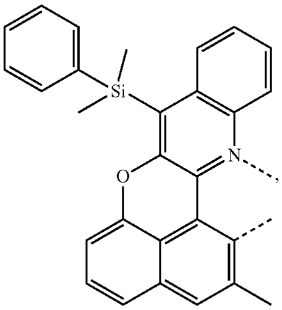

-continued
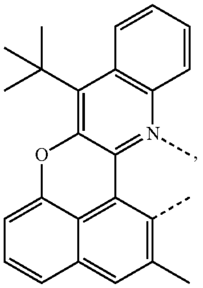
$L_{a93}$
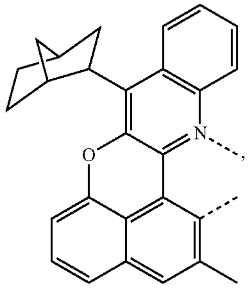
$L_{a94}$
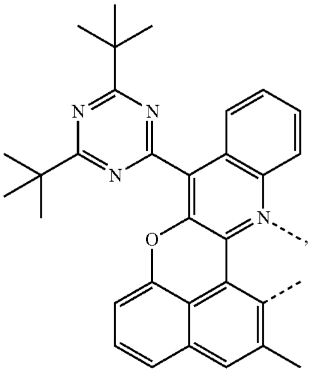
$L_{a95}$
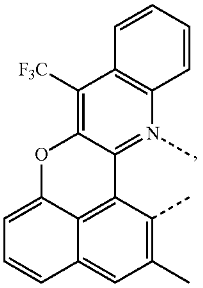
$L_{a96}$
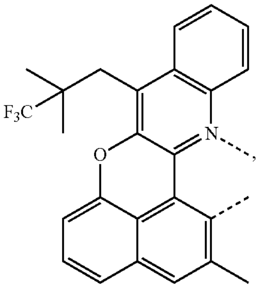
$L_{a97}$
-continued
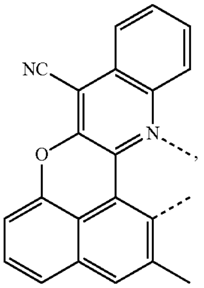
$L_{a98}$
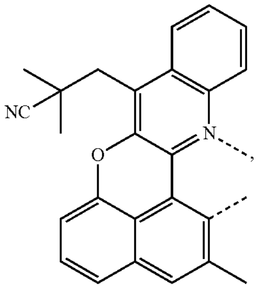
$L_{a99}$
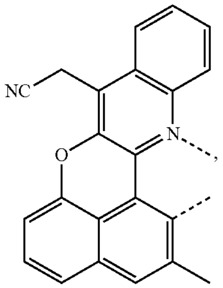
$L_{a100}$
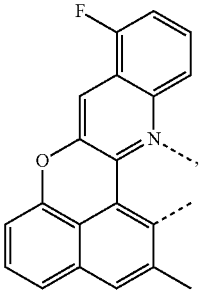
$L_{a101}$
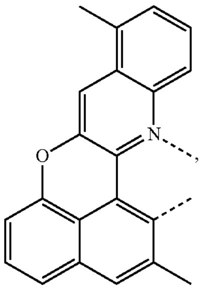
$L_{a102}$ -continued
$L_{a103}$
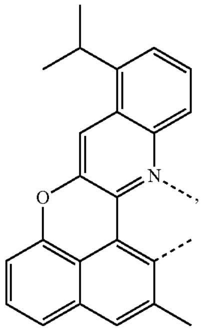
$L_{a104}$
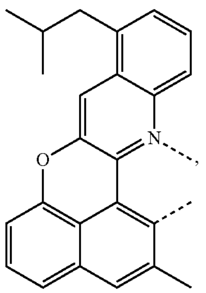
$L_{a105}$
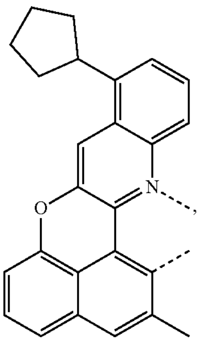
$L_{a106}$
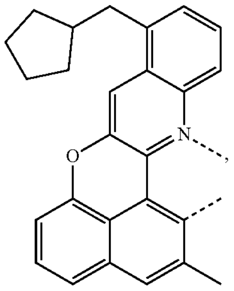
$L_{a107}$
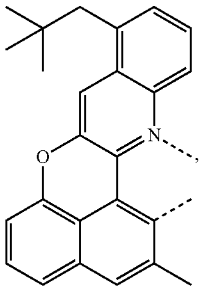
-continued
$L_{a108}$
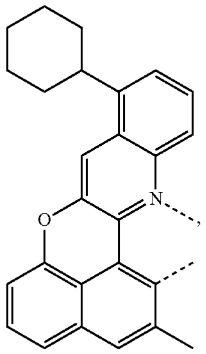
$L_{a109}$
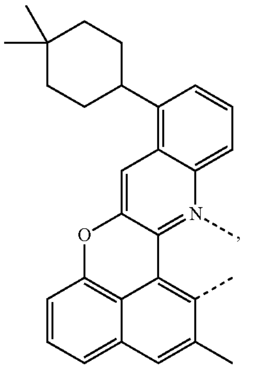
$L_{a110}$
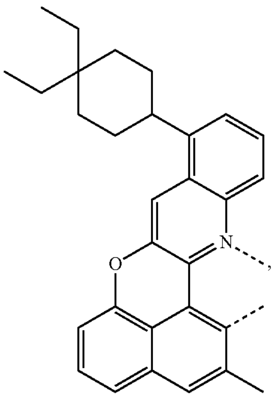
$L_{a111}$
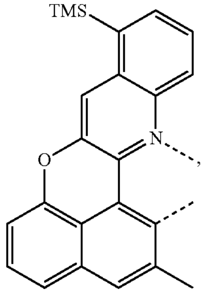

-continued
L$_{a112}$
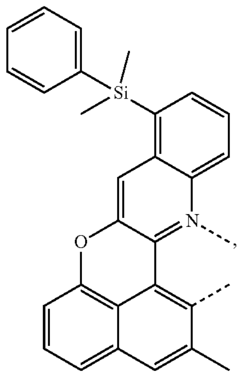
L$_{a113}$
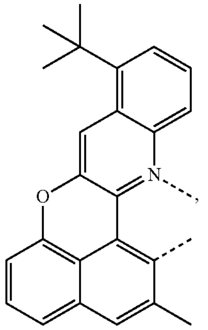
L$_{a114}$
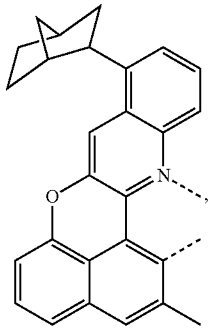
L$_{a115}$
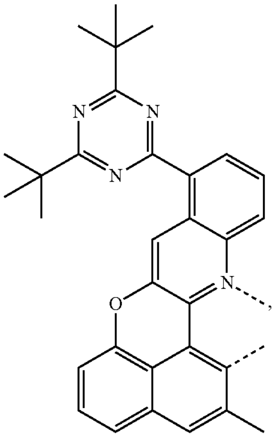
-continued
L$_{a116}$
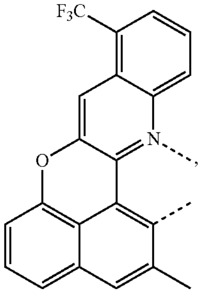
L$_{a117}$
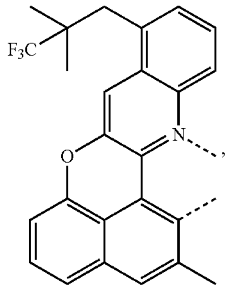
L$_{a118}$
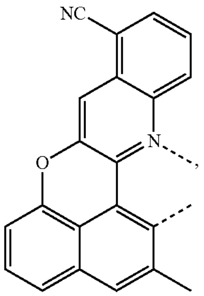
L$_{a119}$
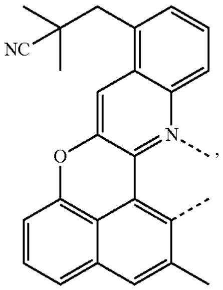
L$_{a120}$
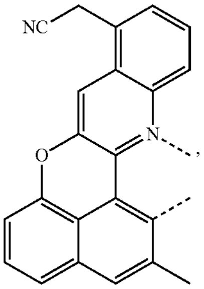

-continued
$L_{a121}$
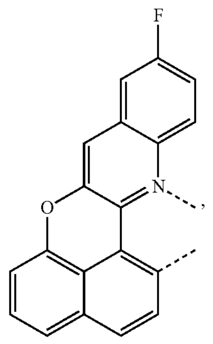
$L_{a122}$
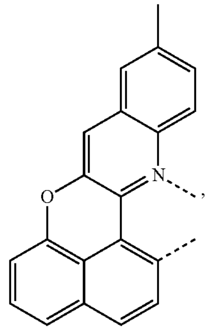
$L_{a123}$
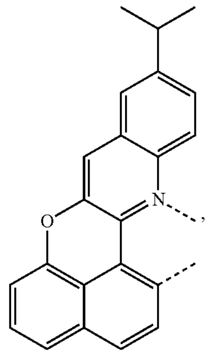
$L_{a124}$
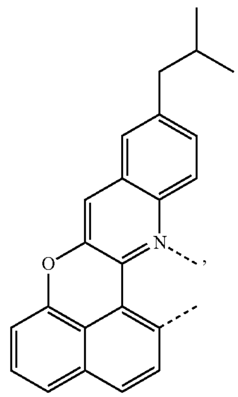
-continued
$L_{a125}$
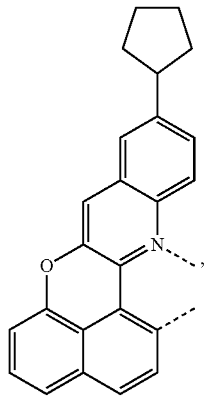
$L_{a126}$
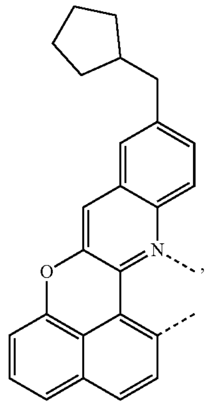
$L_{a127}$
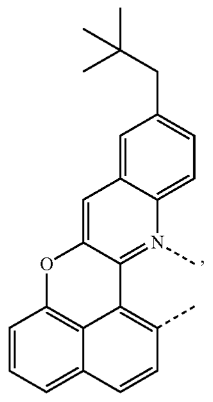
$L_{a128}$
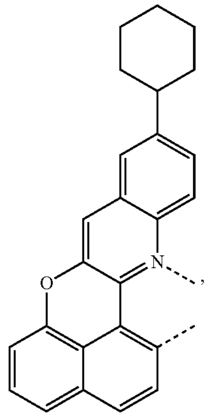

-continued
$L_{a129}$
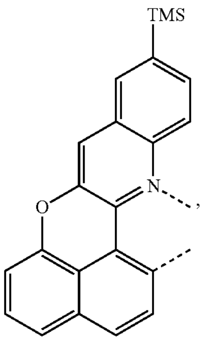
$L_{a130}$
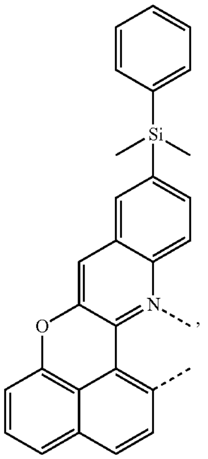
$L_{a131}$
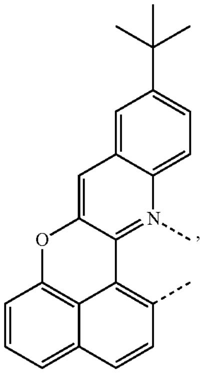
$L_{a132}$
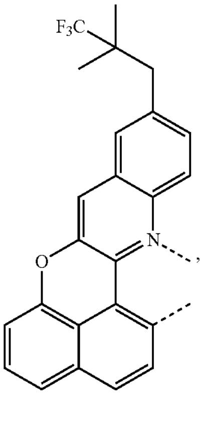
-continued
$L_{a133}$
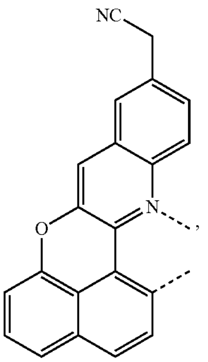
$L_{a134}$
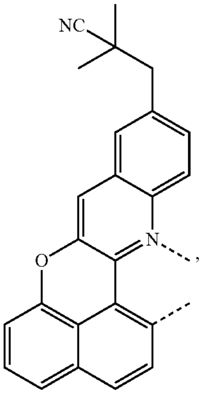
$L_{a135}$
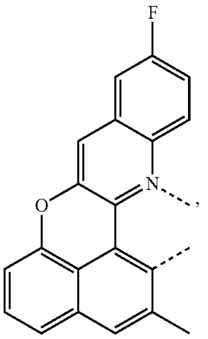
$L_{a136}$
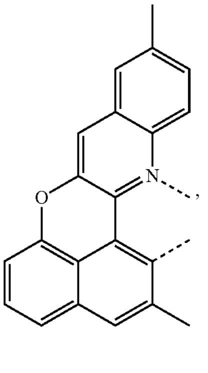

-continued
$L_{a137}$
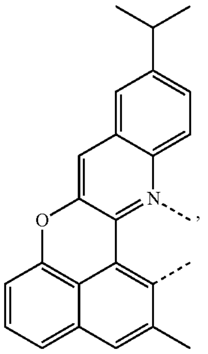
$L_{a138}$
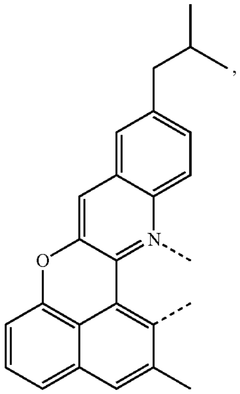
$L_{a139}$
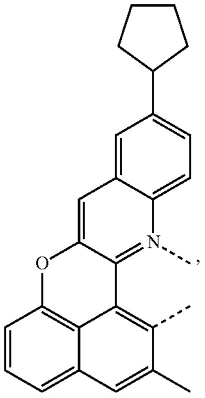
$L_{a140}$
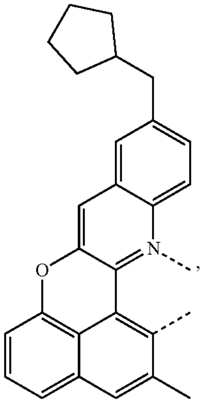
-continued
$L_{a141}$
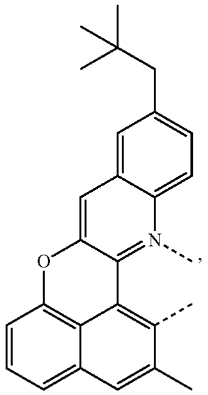
$L_{a142}$
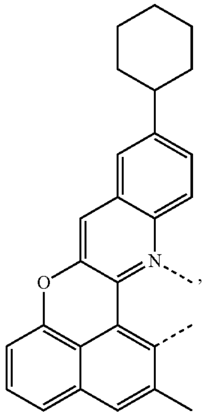
$L_{a143}$
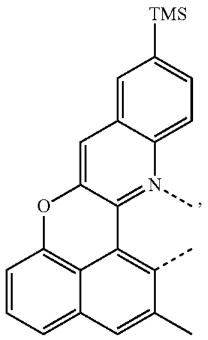
$L_{a144}$
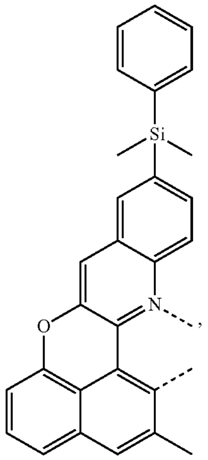

-continued
$L_{a145}$
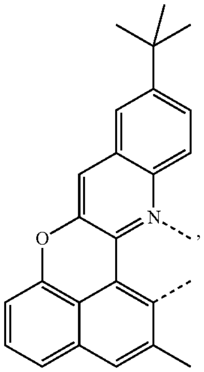
$L_{a146}$
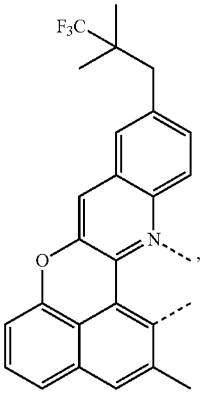
$L_{a147}$
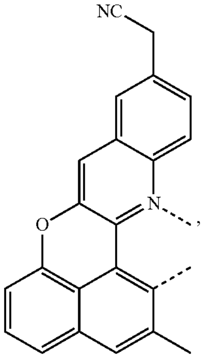
$L_{a148}$
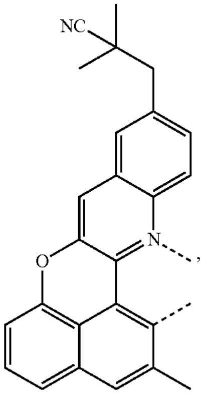
-continued
$L_{a149}$
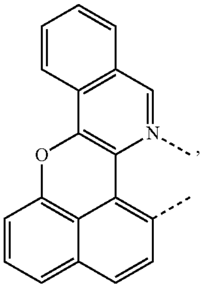
$L_{a150}$
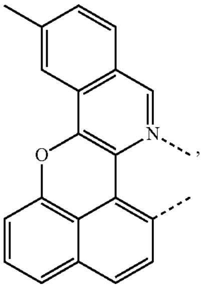
$L_{a151}$
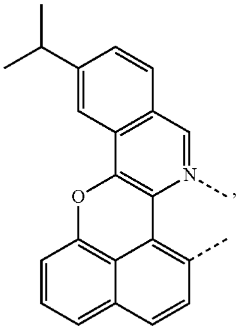
$L_{a152}$
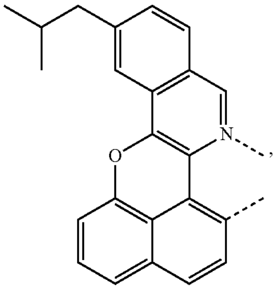
$L_{a153}$
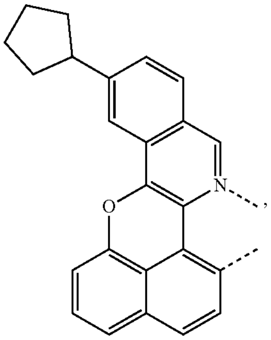

-continued
$L_{a154}$
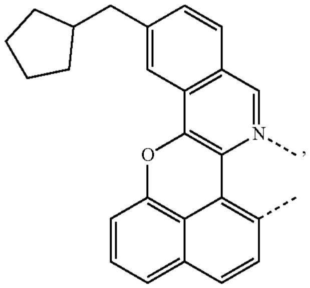
$L_{a155}$
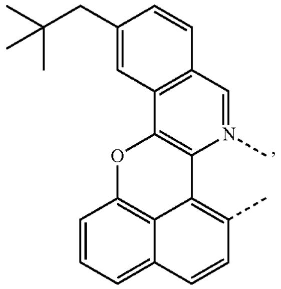
$L_{a156}$
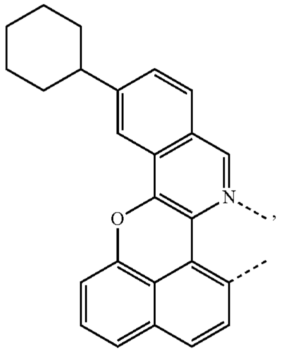
$L_{a157}$
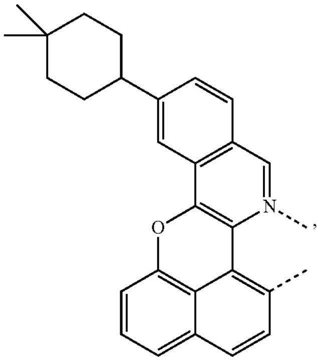
-continued
$L_{a158}$
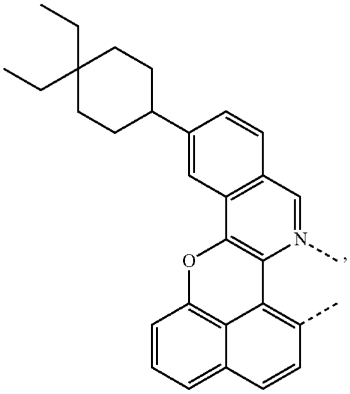
$L_{a159}$
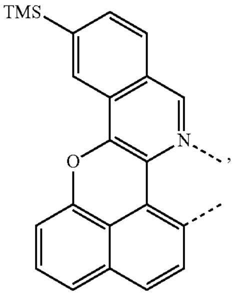
$L_{a160}$
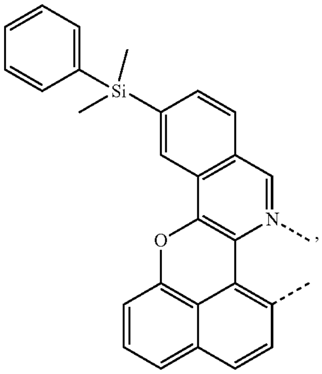
$L_{a161}$
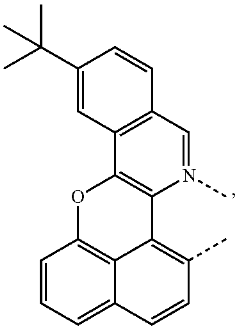

-continued
$L_{a162}$
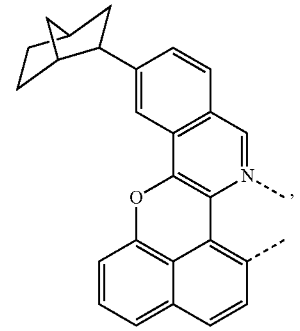
$L_{a163}$
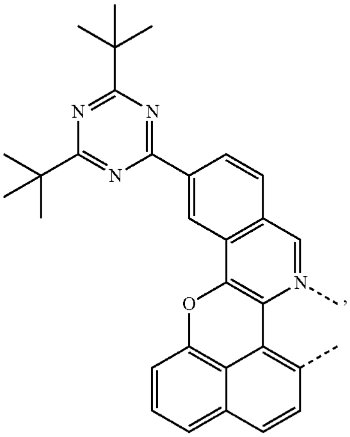
$L_{a164}$
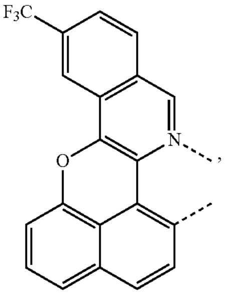
$L_{a165}$
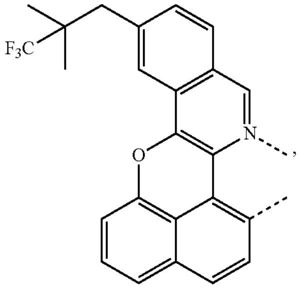
-continued
$L_{a166}$
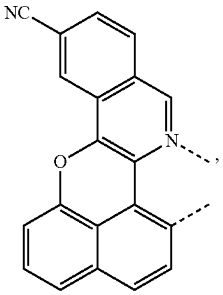
$L_{a167}$
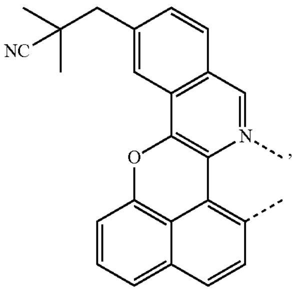
$L_{a168}$
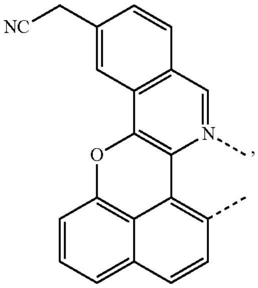
$L_{a169}$
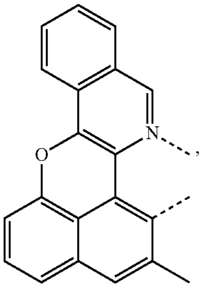
$L_{a170}$
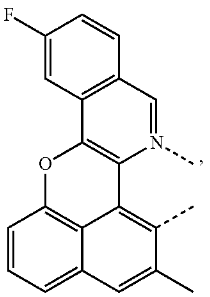

-continued
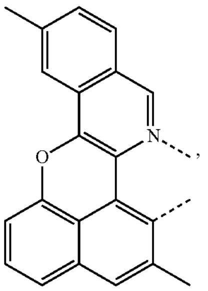
$L_{a171}$
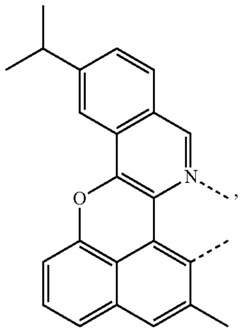
$L_{a172}$
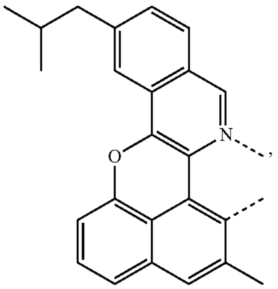
$L_{a173}$
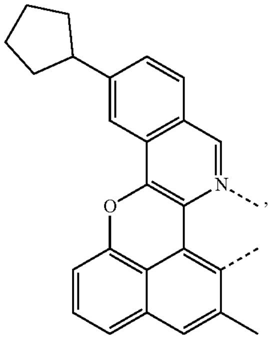
$L_{a174}$
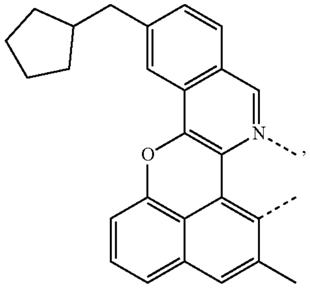
$L_{a175}$
-continued
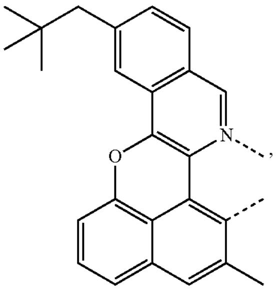
$L_{a176}$
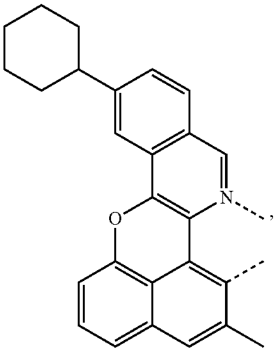
$L_{a177}$
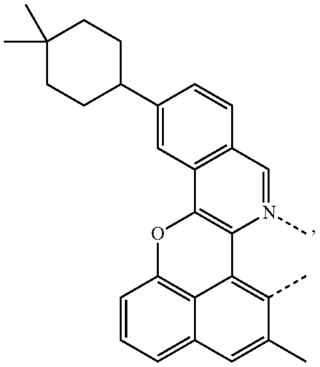
$L_{a178}$
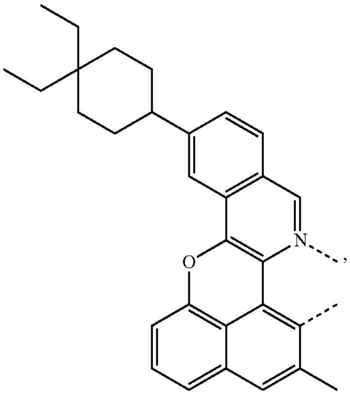
$L_{a179}$ -continued
$L_{a180}$
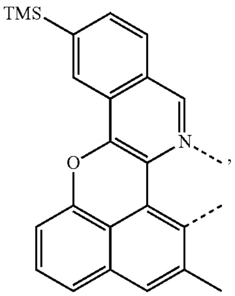
$L_{a181}$
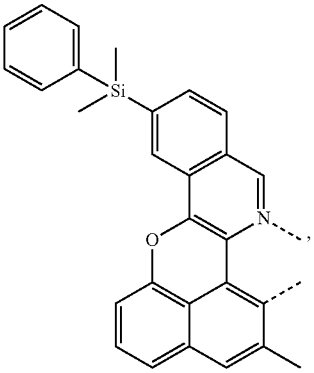
$L_{a182}$
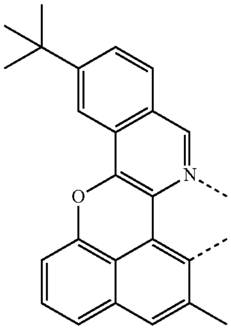
$L_{a183}$
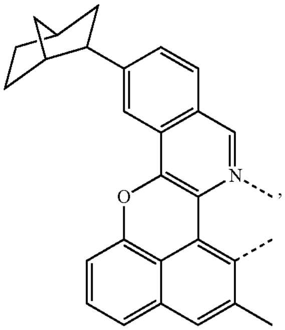
-continued
$L_{a184}$
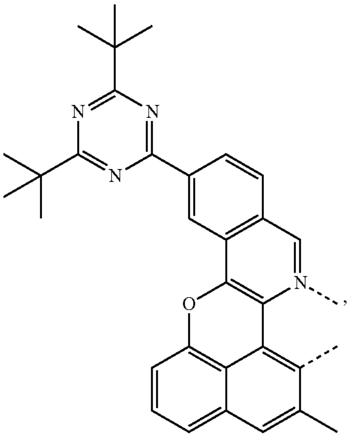
$L_{a185}$
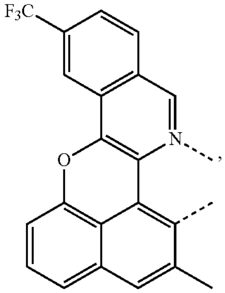
$L_{a186}$
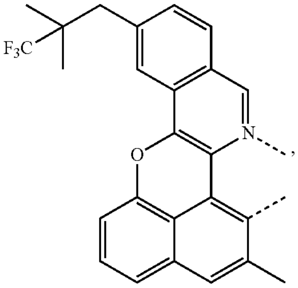
$L_{a187}$
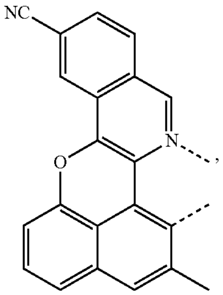
$L_{a188}$
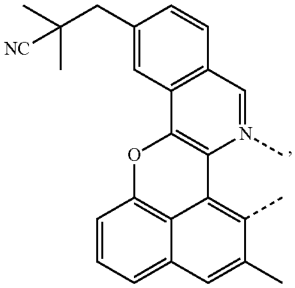

-continued
$L_{a189}$
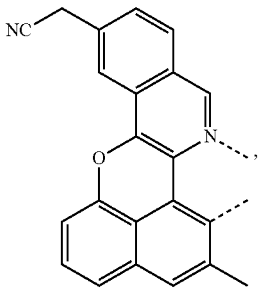
$L_{a190}$
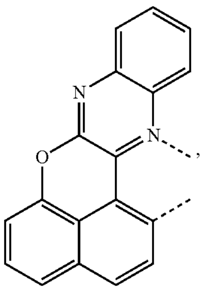
$L_{a191}$
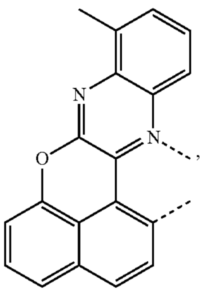
$L_{a192}$
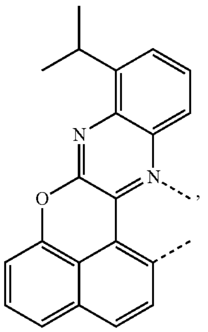
$L_{a193}$
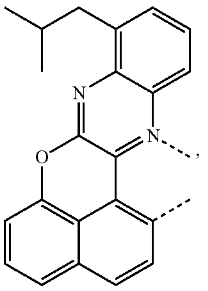
-continued
$L_{a194}$
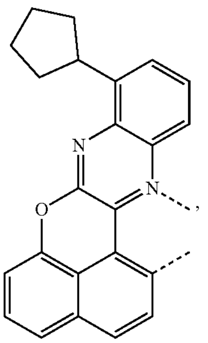
$L_{a195}$
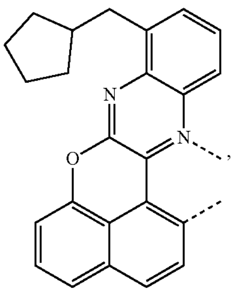
$L_{a196}$
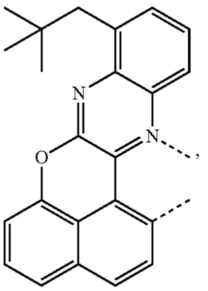
$L_{a197}$
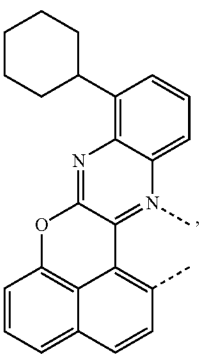

-continued
$L_{a198}$
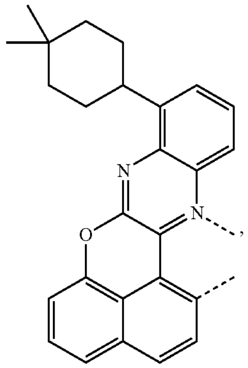
$L_{a199}$
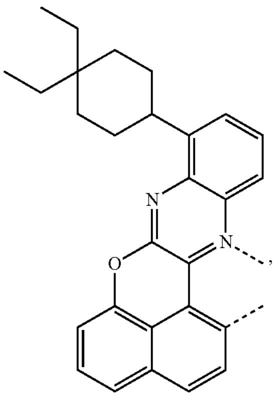
$L_{a200}$
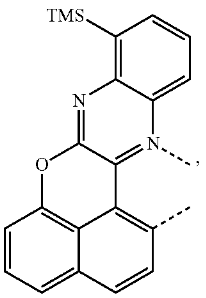
$L_{a201}$
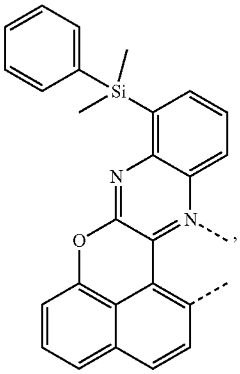
-continued
$L_{a202}$
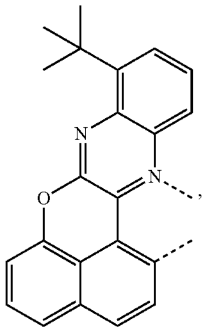
$L_{a203}$
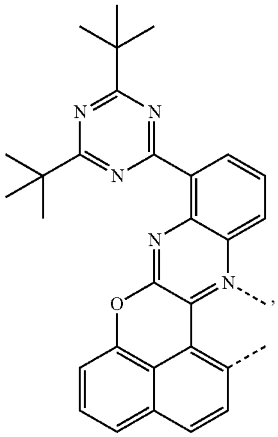
$L_{a204}$
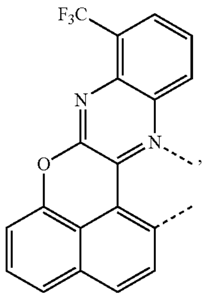
$L_{a205}$
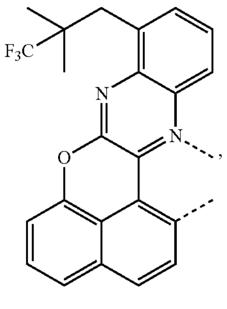

-continued
$L_{a206}$
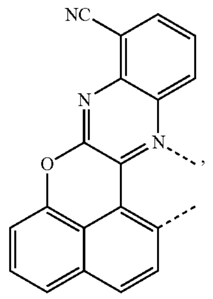
$L_{a207}$
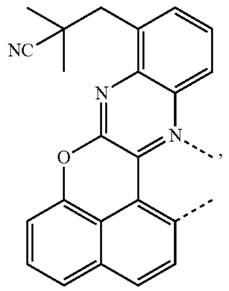
$L_{a208}$
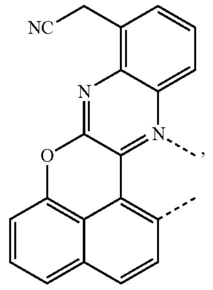
$L_{a209}$
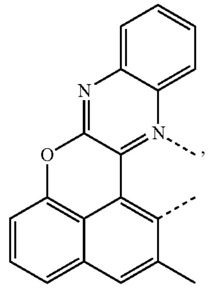
$L_{a210}$
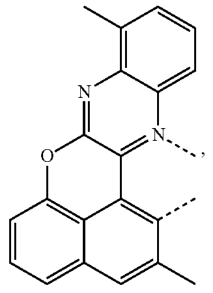
-continued
$L_{a211}$
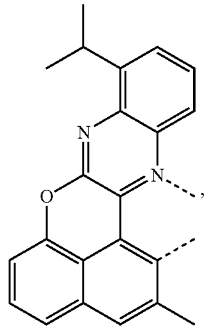
$L_{a212}$
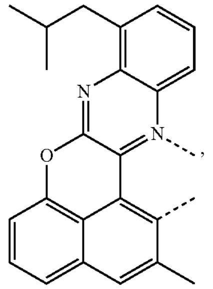
$L_{a213}$
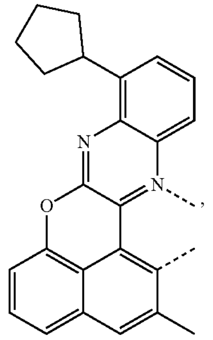
$L_{a214}$
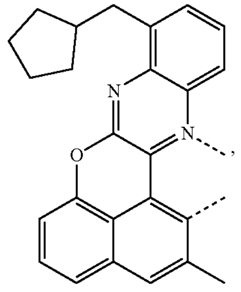
$L_{a215}$
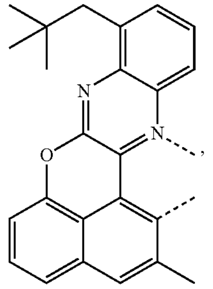

-continued
L$_{a216}$
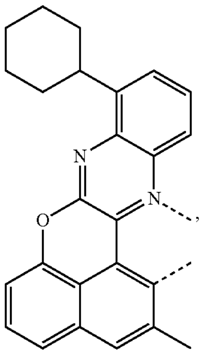
L$_{a217}$
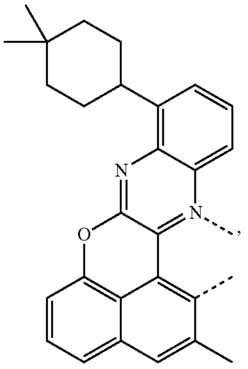
L$_{a218}$
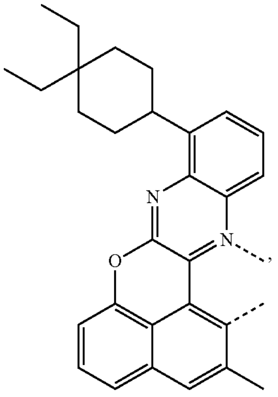
L$_{a219}$
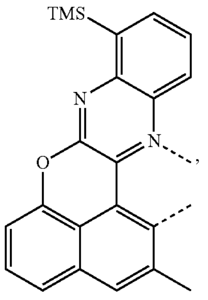
-continued
L$_{a220}$
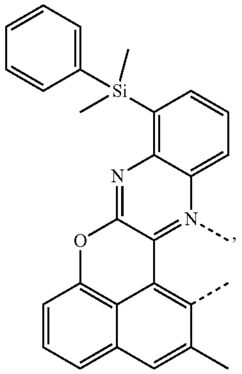
L$_{a221}$
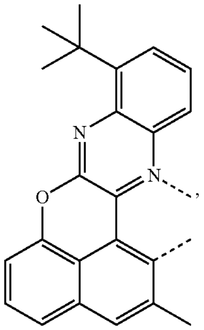
L$_{a222}$
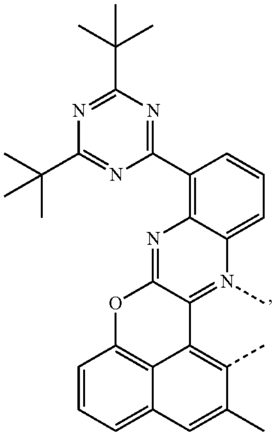
L$_{a223}$
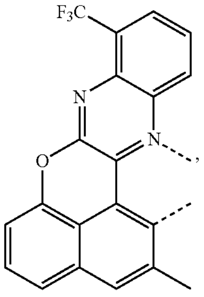

-continued
$L_{a224}$
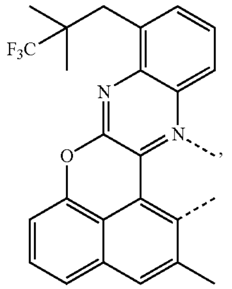
$L_{a225}$
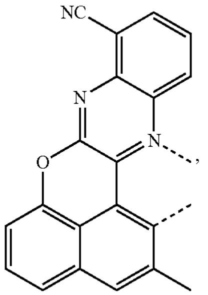
$L_{a226}$
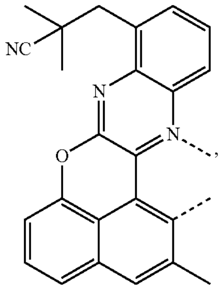
$L_{a227}$
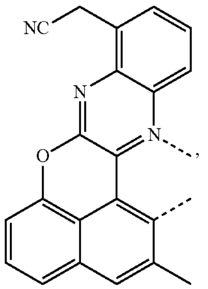
$L_{a228}$
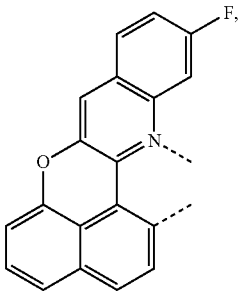
-continued
$L_{a229}$
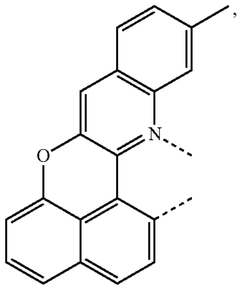
$L_{a230}$
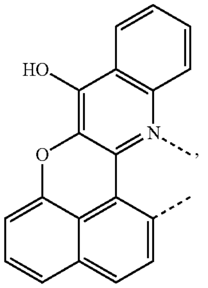
$L_{a231}$
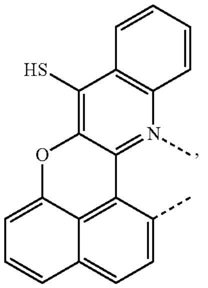
$L_{a232}$
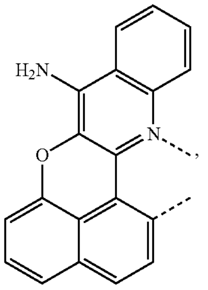
$L_{a233}$
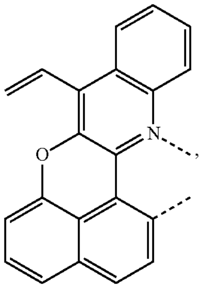

-continued
$L_{a234}$
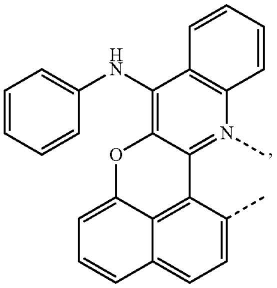
$L_{a235}$
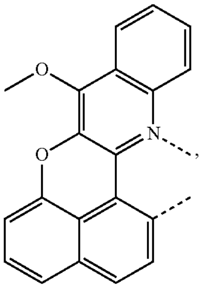
$L_{a236}$
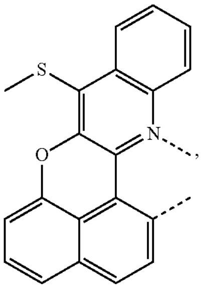
$L_{a237}$
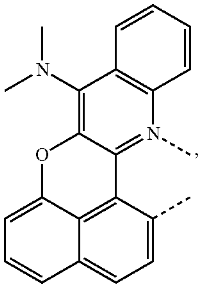
$L_{a238}$
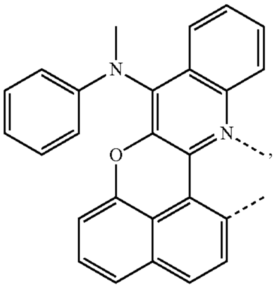
-continued
$L_{a239}$
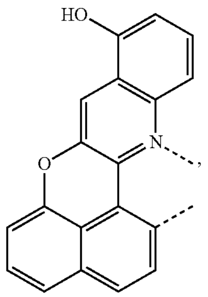
$L_{a240}$
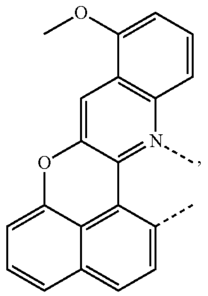
$L_{a241}$
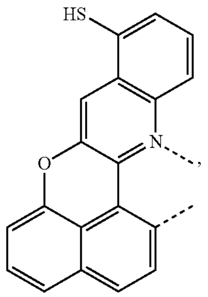
$L_{a242}$
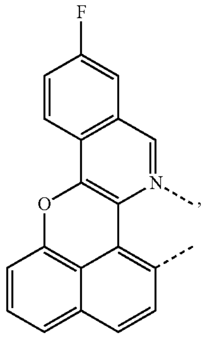
$L_{a243}$
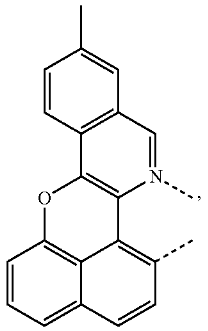

-continued
$L_{a244}$
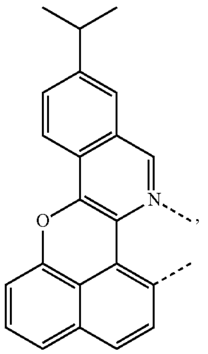
$L_{a245}$
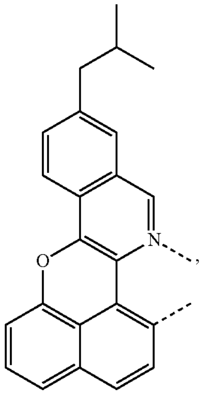
$L_{a246}$
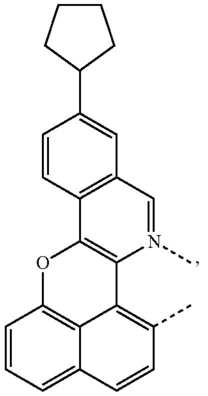
$L_{a247}$
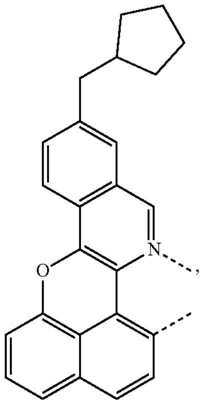
-continued
$L_{a248}$
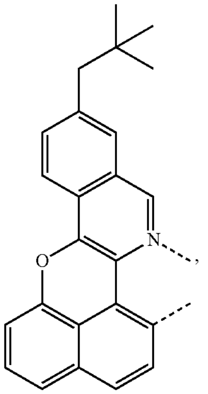
$L_{a249}$
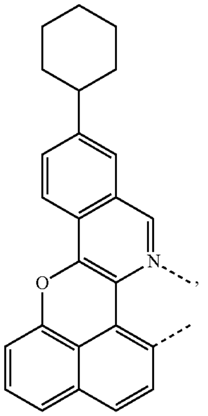
$L_{a250}$
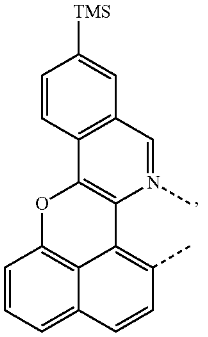
$L_{a251}$
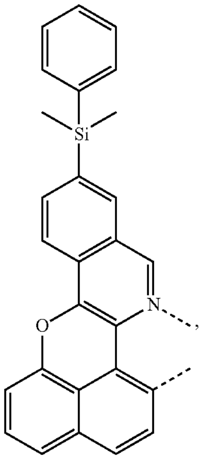

$L_{a252}$
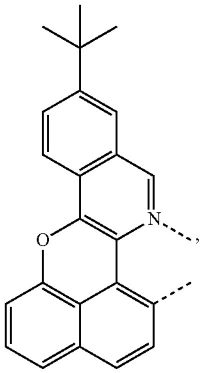
$L_{a253}$
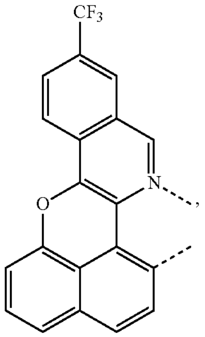
$L_{a254}$
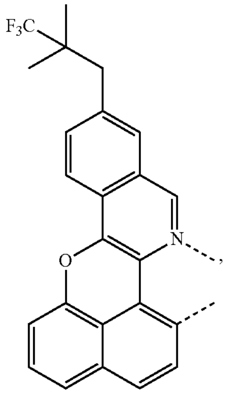
$L_{a255}$
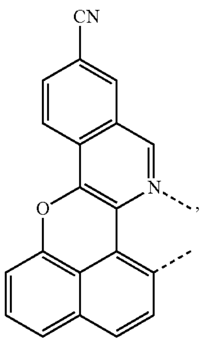
$L_{a256}$
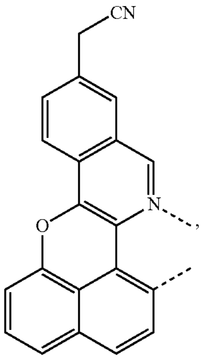
$L_{a257}$
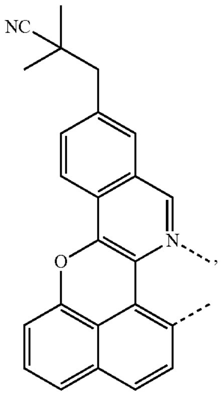
$L_{a258}$
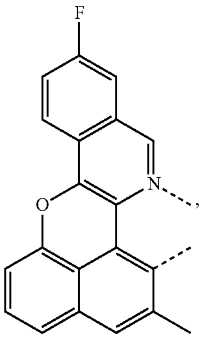
$L_{a259}$
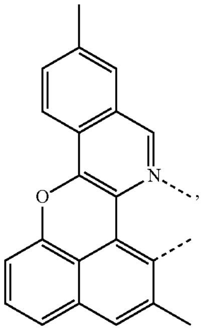

-continued
L$_{a260}$
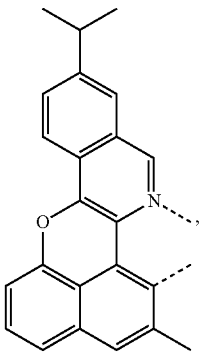
L$_{a261}$
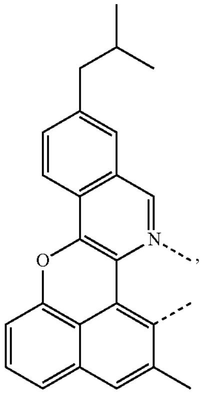
L$_{a262}$
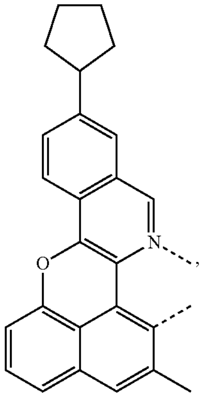
L$_{a263}$
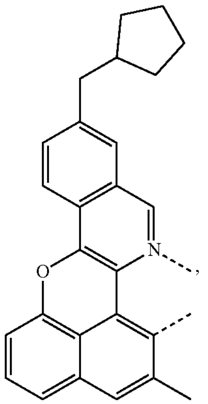
-continued
L$_{a264}$
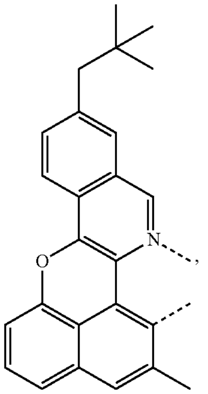
L$_{a265}$
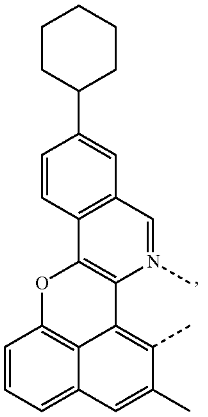
L$_{a266}$
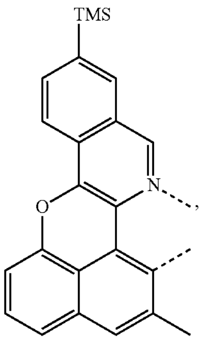
L$_{a267}$
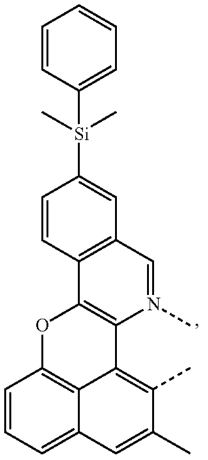

$L_{a268}$
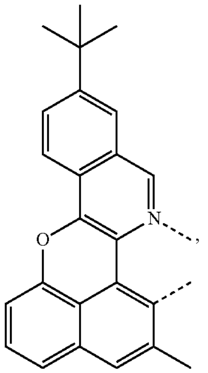
$L_{a269}$
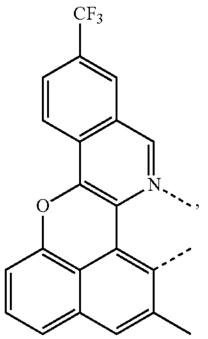
$L_{a270}$
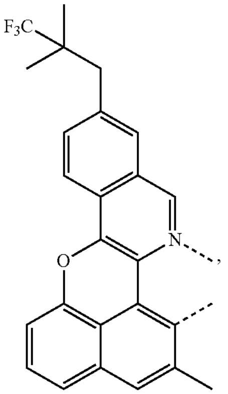
$L_{a271}$
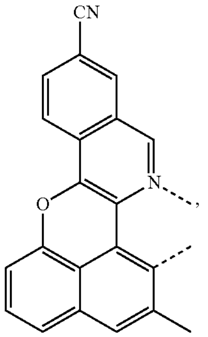
$L_{a272}$
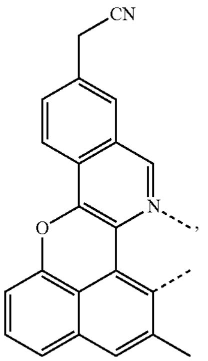
$L_{a273}$
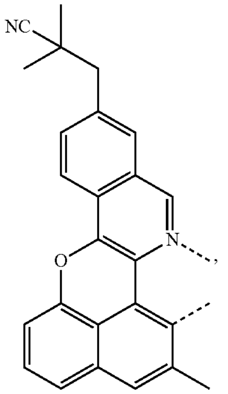
$L_{a274}$
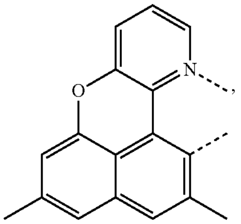
$L_{a275}$
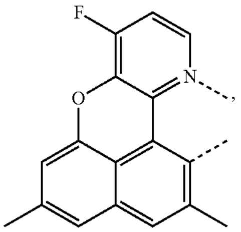
$L_{a276}$
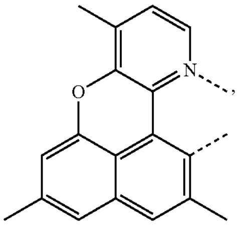

-continued
$L_{a277}$
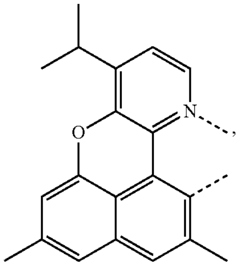
$L_{a278}$
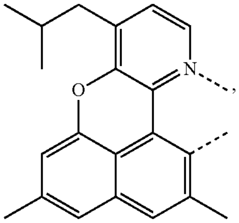
$L_{a279}$
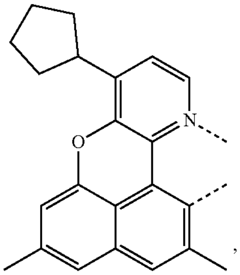
$L_{a280}$
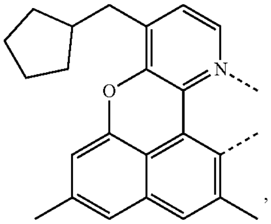
$L_{a281}$
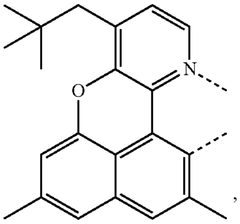
-continued
$L_{a282}$
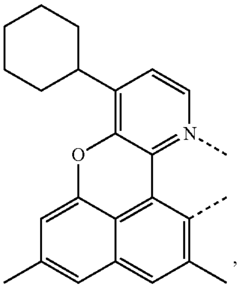
$L_{a283}$
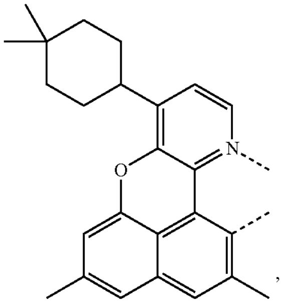
$L_{a284}$
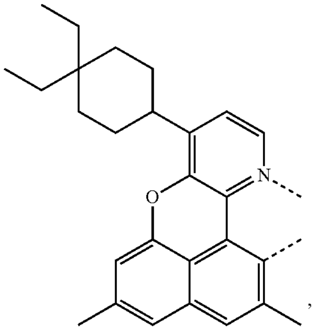
$L_{a285}$
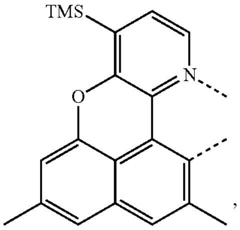
$L_{a286}$
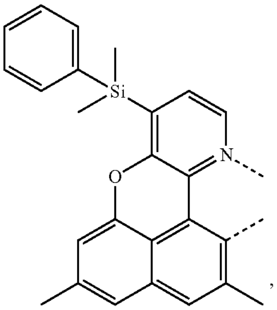

-continued
$L_{a287}$
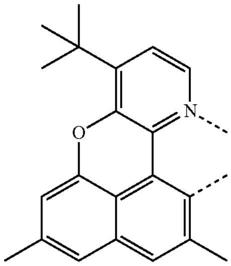
,
$L_{a288}$
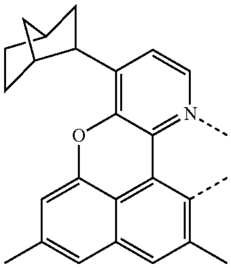
,
$L_{a289}$
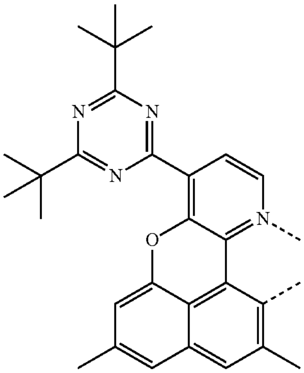
,
$L_{a290}$
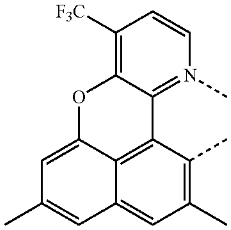
,
$L_{a291}$
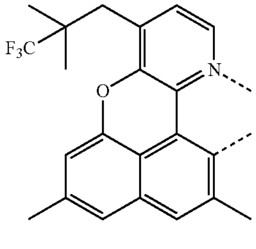
,
-continued
$L_{a292}$
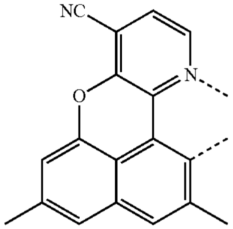
,
$L_{a293}$
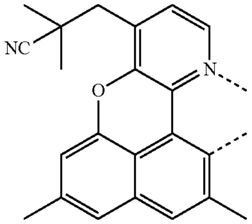
,
$L_{a294}$
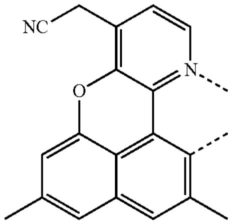
,
$L_{a295}$
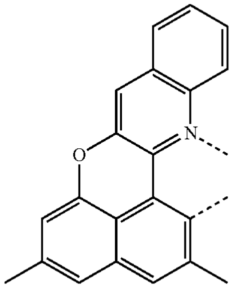
,
$L_{a296}$
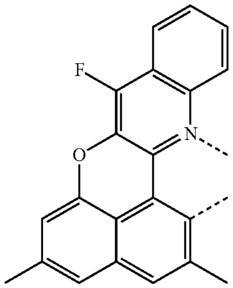
,
$L_{a297}$
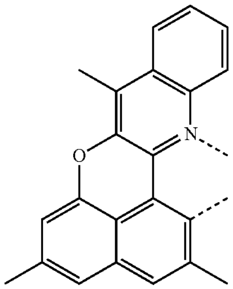
, -continued
$L_{a298}$
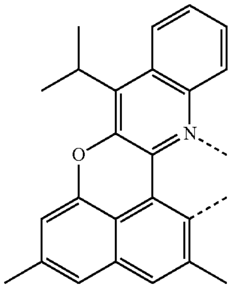
,
$L_{a299}$
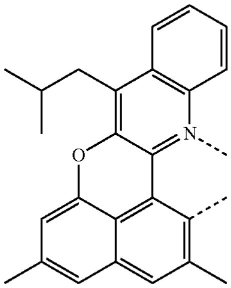
,
$L_{a300}$
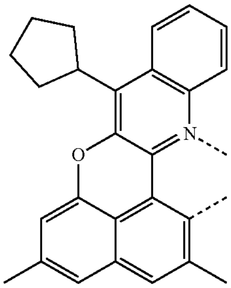
,
$L_{a301}$
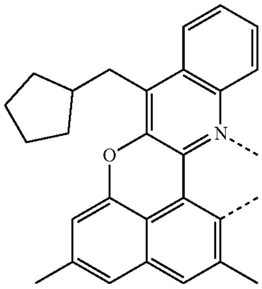
,
$L_{a302}$
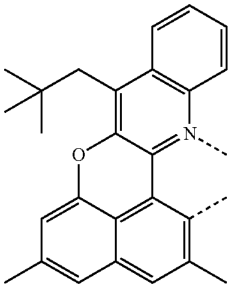
,
-continued
$L_{a303}$
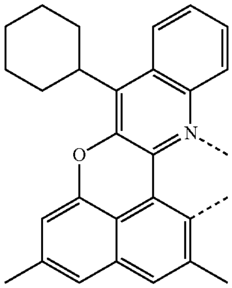
,
$L_{a304}$
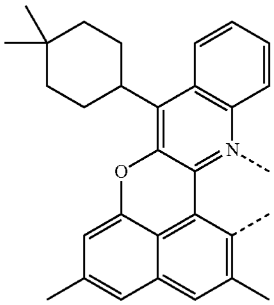
,
$L_{a305}$
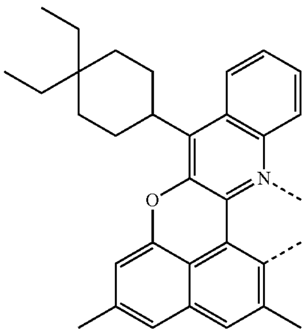
,
$L_{a306}$
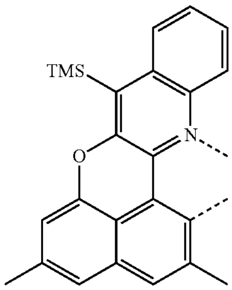
,
$L_{a307}$
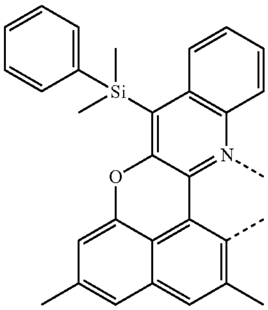
, -continued
$L_{a308}$
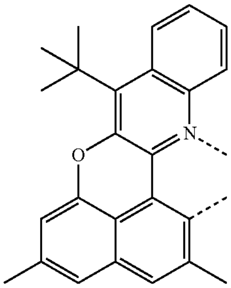
,
$L_{a309}$
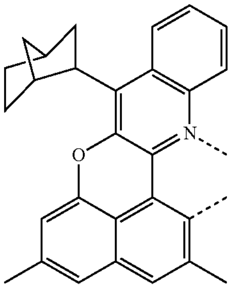
,
$L_{a310}$
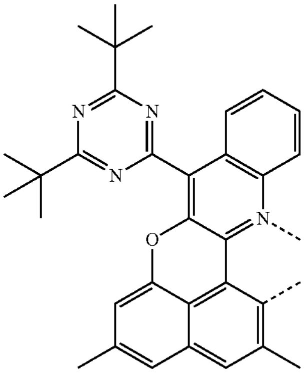
,
$L_{a311}$
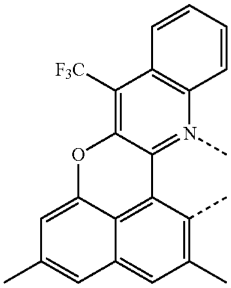
,
$L_{a312}$
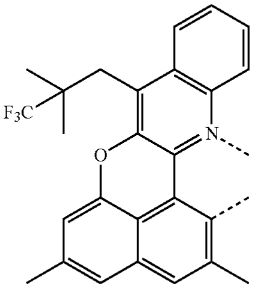
,
-continued
$L_{a313}$
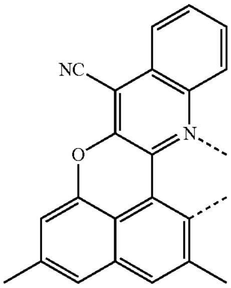
,
$L_{a314}$
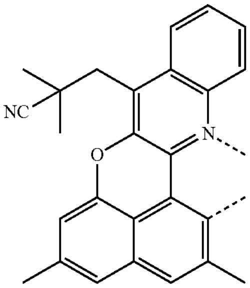
,
$L_{a315}$
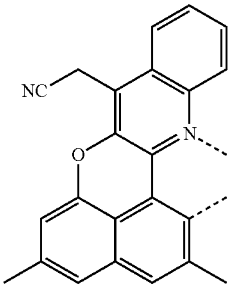
,
$L_{a316}$
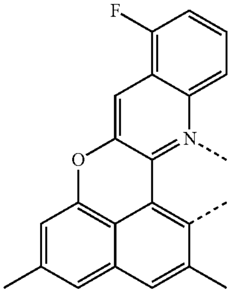
,
$L_{a317}$
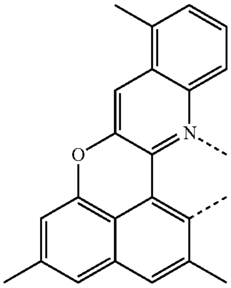
, -continued
$L_{a318}$
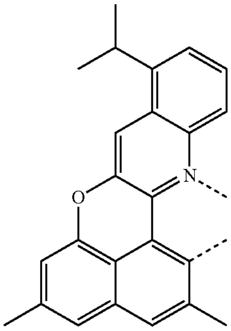
,
$L_{a319}$
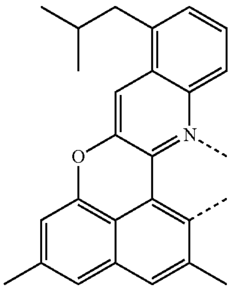
,
$L_{a320}$
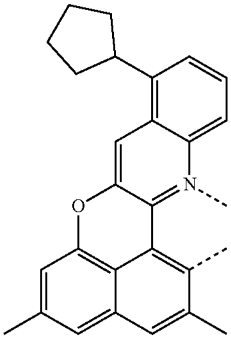
,
$L_{a321}$
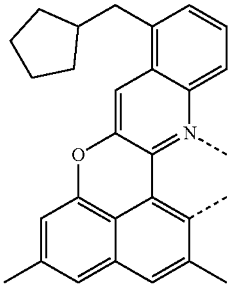
,
$L_{a322}$
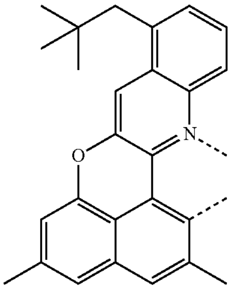
,
-continued
$L_{a323}$
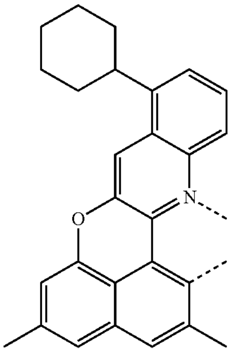
,
$L_{a324}$
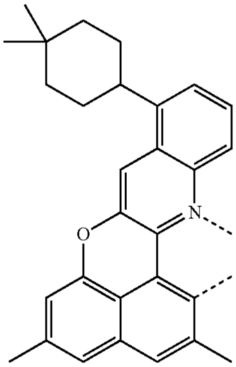
,
$L_{a325}$
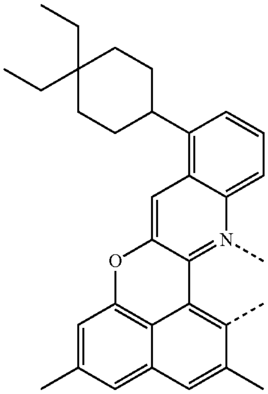
,
$L_{a326}$
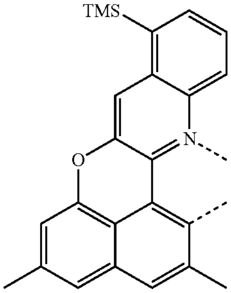
, -continued
$L_{a327}$
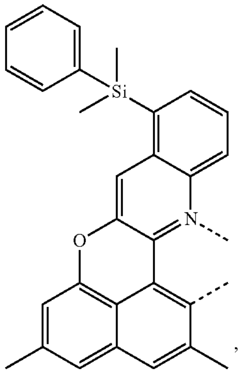
$L_{a328}$
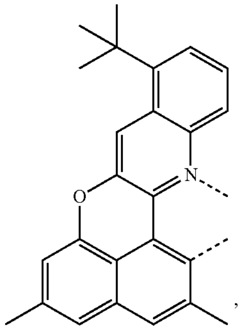
$L_{a329}$
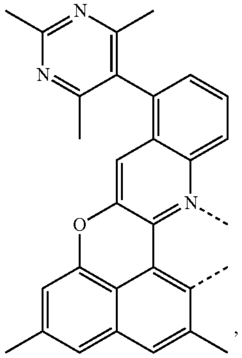
$L_{a330}$
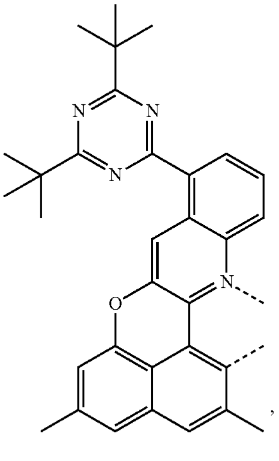
-continued
$L_{a331}$
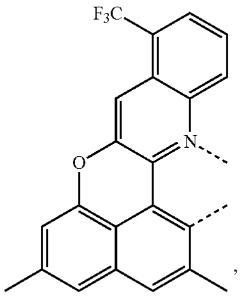
$L_{a332}$
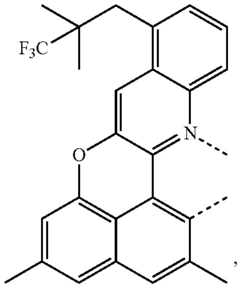
$L_{a333}$
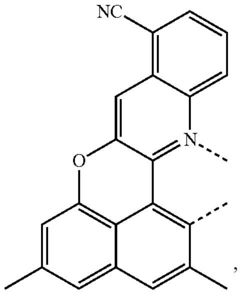
$L_{a334}$
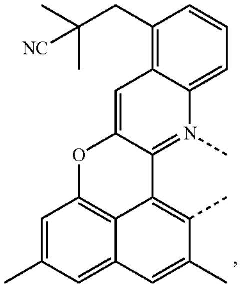
$L_{a335}$
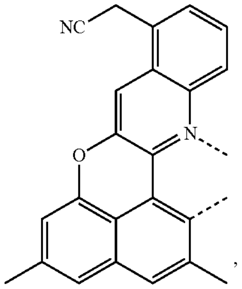

-continued
L<sub>a336</sub>
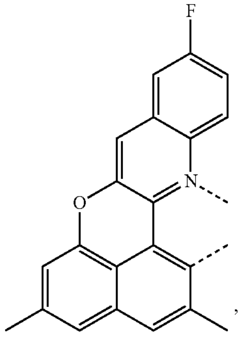
L$_{a337}$
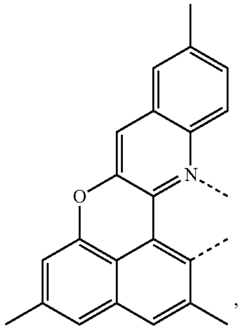
L$_{a338}$
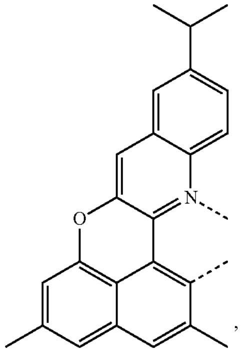
L$_{a339}$
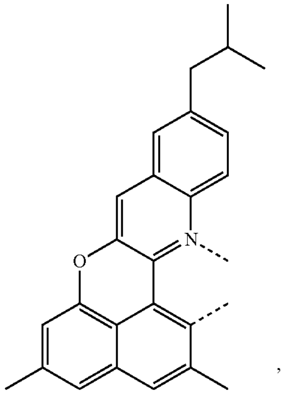
-continued
L$_{a340}$
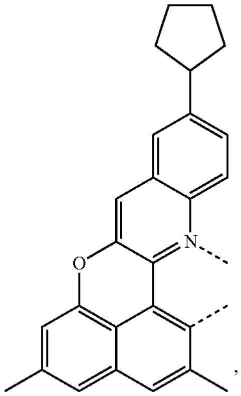
L$_{a341}$
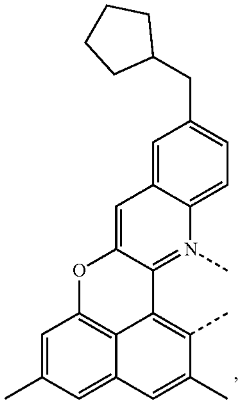
L$_{a342}$
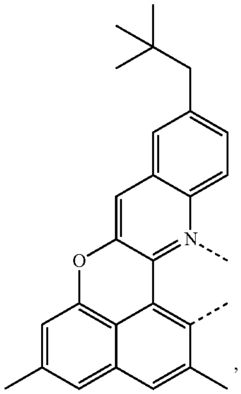
L$_{a343}$
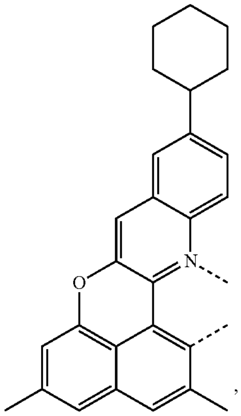

-continued
$L_{a344}$
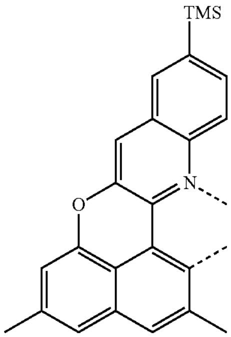
,
$L_{a345}$
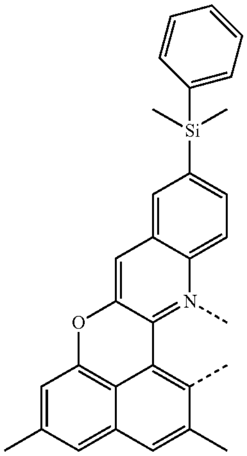
,
$L_{a346}$
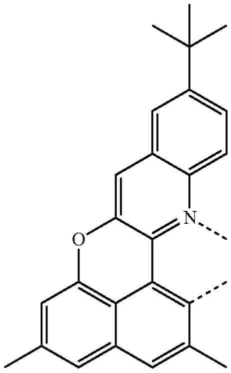
,
$L_{a347}$
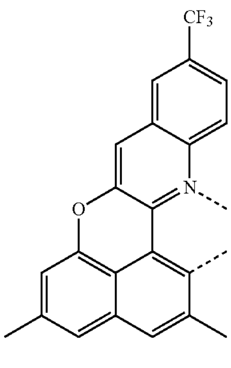
,
-continued
$L_{a348}$
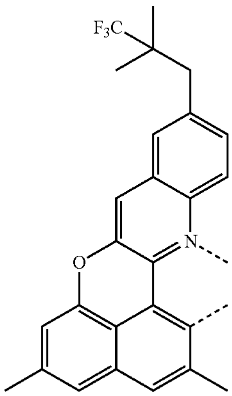
,
$L_{a349}$
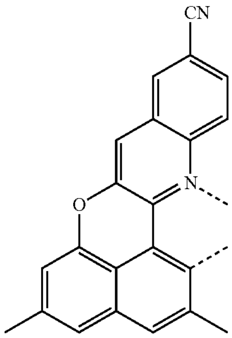
,
$L_{a350}$
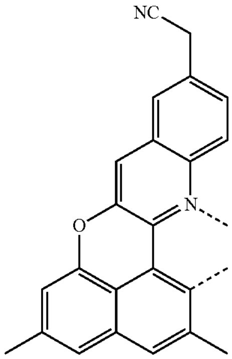
,
$L_{a351}$
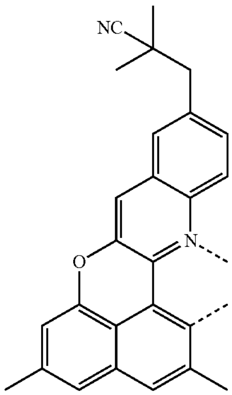
, -continued
$L_{a352}$
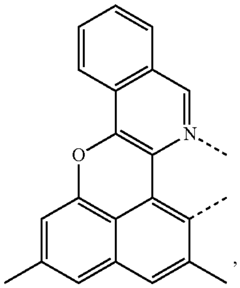
$L_{a353}$
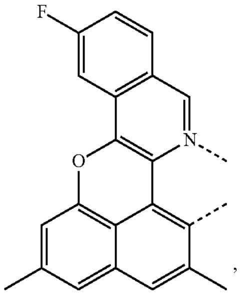
$L_{a354}$
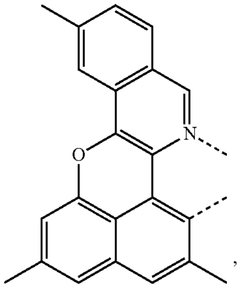
$L_{a355}$
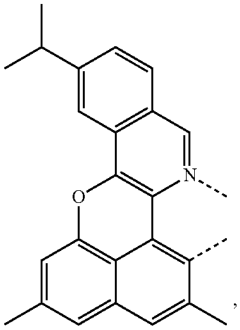
$L_{a356}$
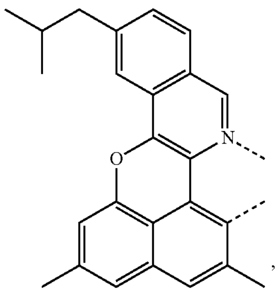
-continued
$L_{a357}$
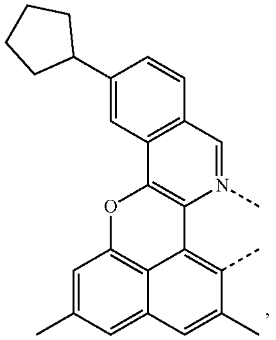
$L_{a358}$
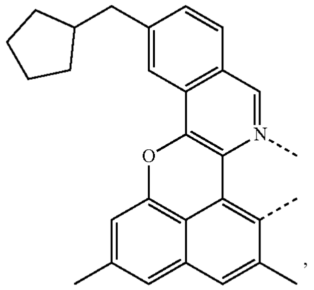
$L_{a359}$
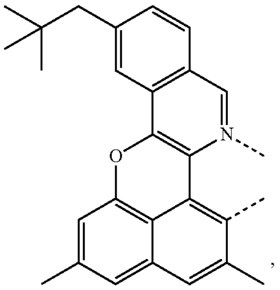
$L_{a360}$
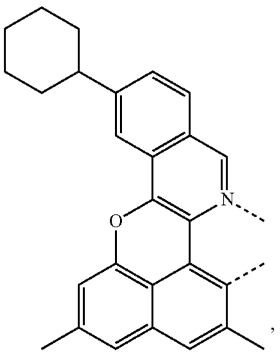

-continued
$L_{a361}$
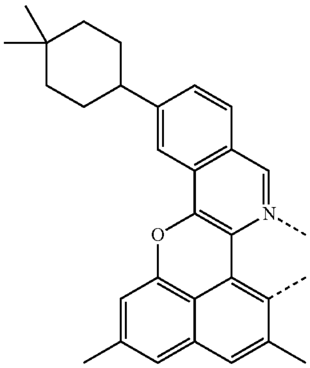
,
$L_{a362}$
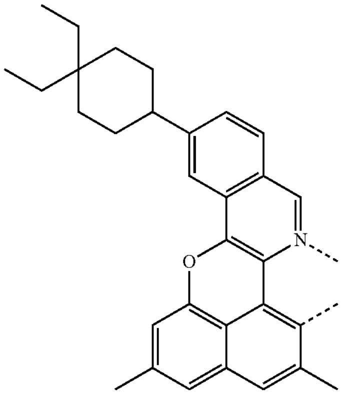
,
$L_{a363}$
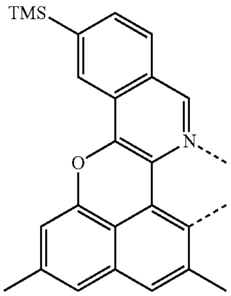
,
$L_{a364}$
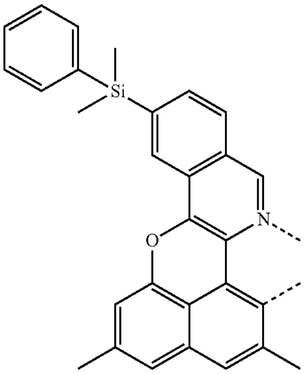
,
-continued
$L_{a365}$
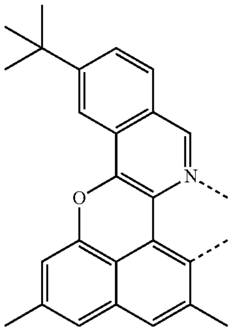
,
$L_{a366}$
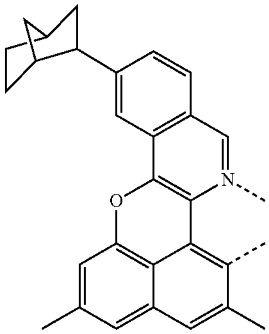
,
$L_{a367}$
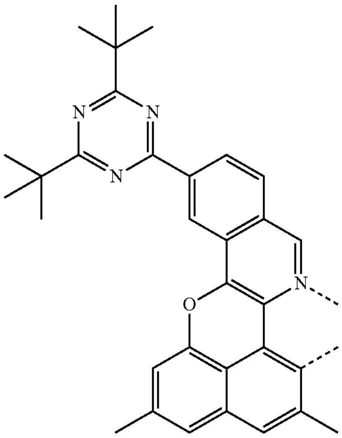
,
$L_{a368}$
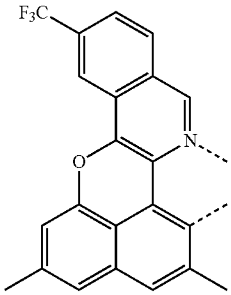
, -continued
$L_{a369}$
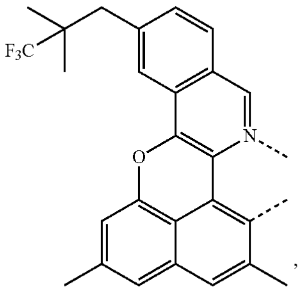
$L_{a370}$
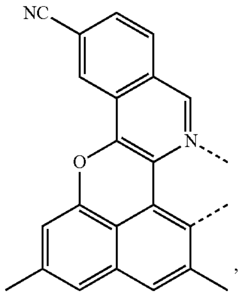
$L_{a371}$
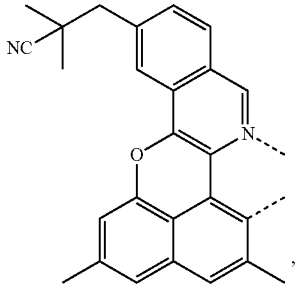
$L_{a372}$
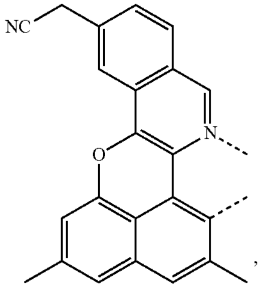
$L_{a373}$
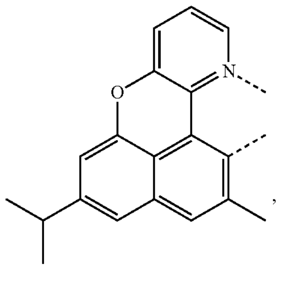
-continued
$L_{a374}$
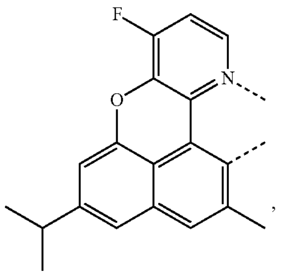
$L_{a375}$
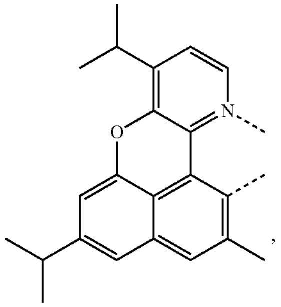
$L_{a376}$
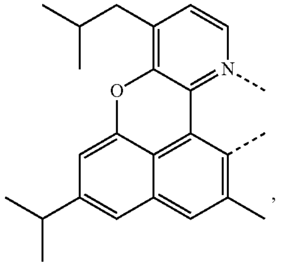
$L_{a377}$
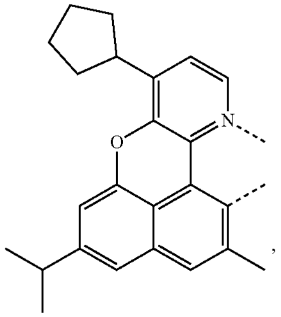
$L_{a378}$
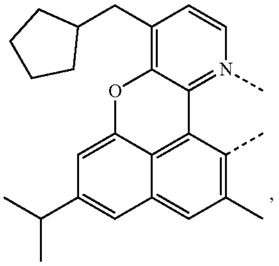

-continued
$L_{a379}$
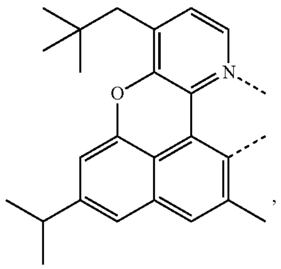
$L_{a380}$
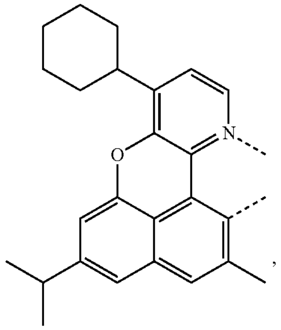
$L_{a381}$
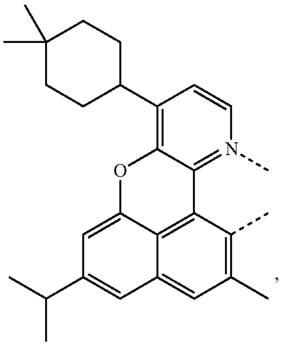
$L_{a382}$
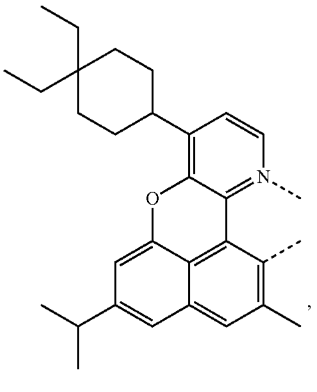
$L_{a383}$
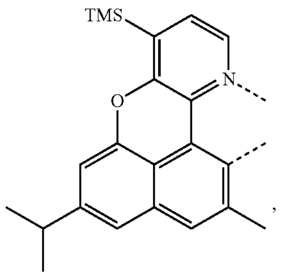
-continued
$L_{a384}$
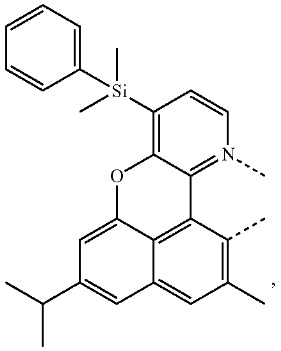
$L_{a385}$
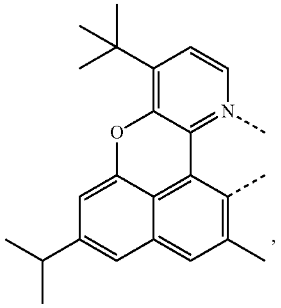
$L_{a386}$
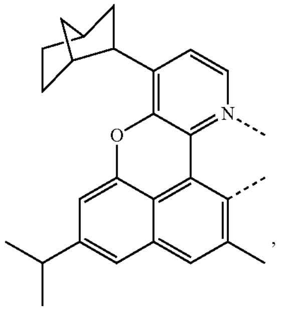
$L_{a387}$
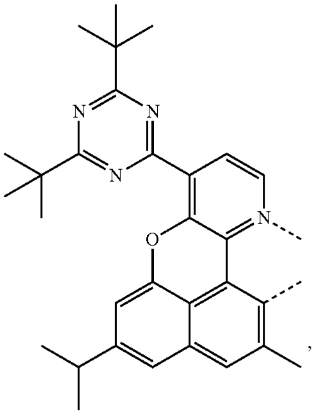

-continued
$L_{a388}$
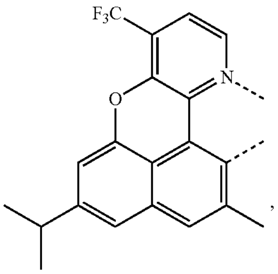
$L_{a389}$
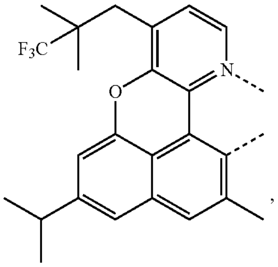
$L_{a390}$
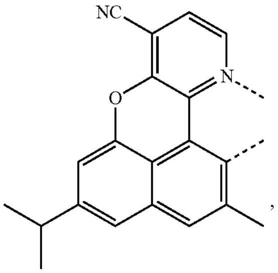
$L_{a391}$
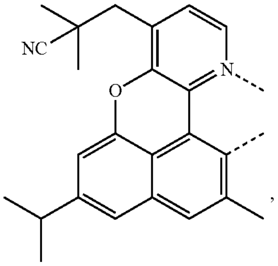
$L_{a392}$
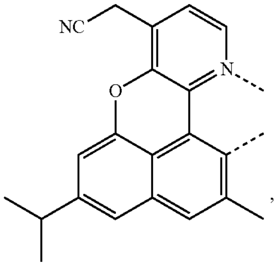
-continued
$L_{a393}$
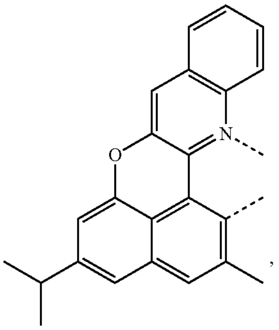
$L_{a394}$
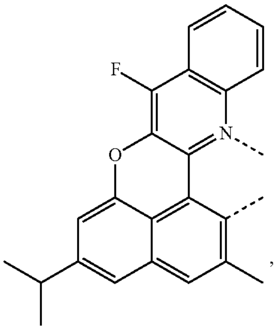
$L_{a395}$
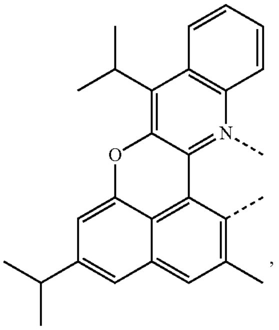
$L_{a396}$
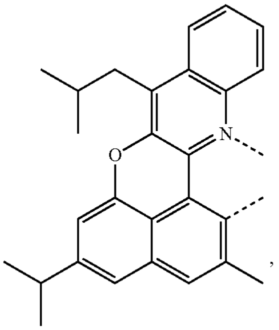

-continued
L$_{a397}$
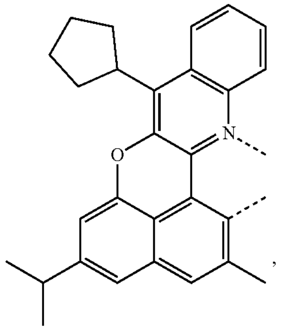
L$_{a398}$
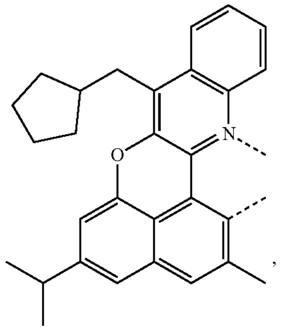
L$_{a399}$
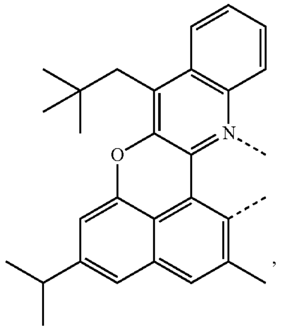
L$_{a400}$
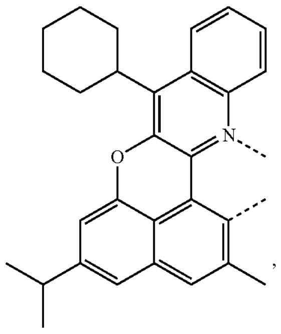
-continued
L$_{a401}$
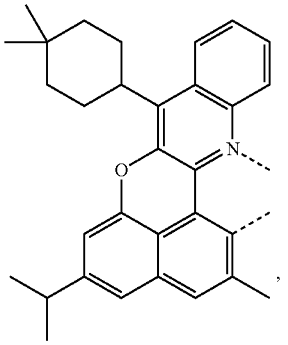
L$_{a402}$
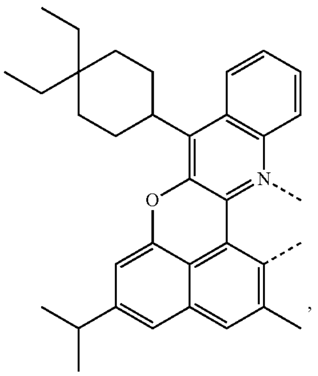
L$_{a403}$
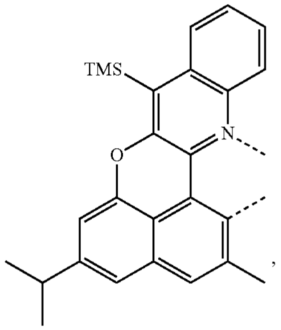
L$_{a404}$
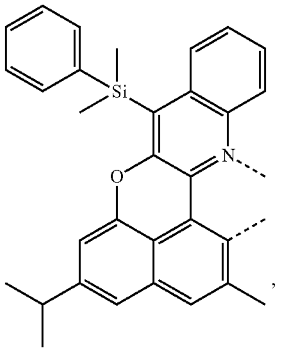

-continued
$L_{a405}$
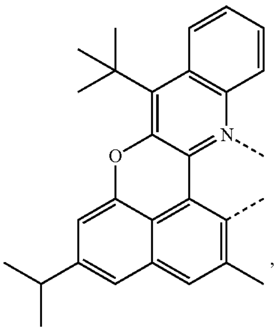
$L_{a406}$
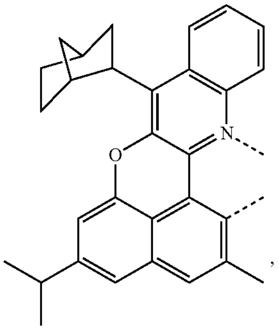
$L_{a407}$
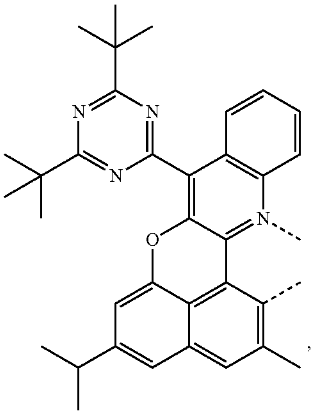
$L_{a408}$
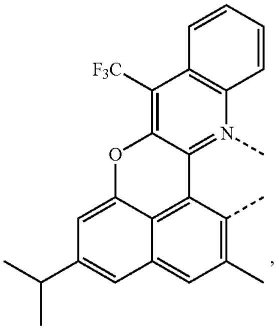
-continued
$L_{a409}$
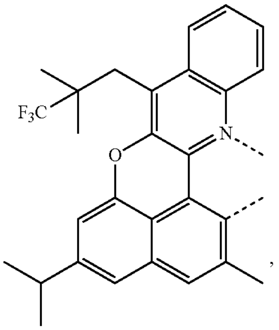
$L_{a410}$
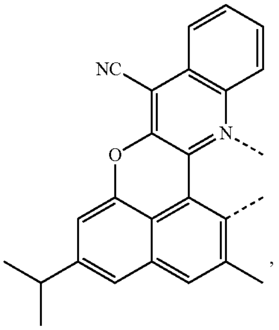
$L_{a411}$
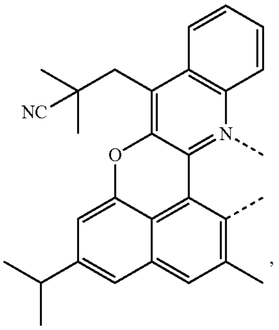
$L_{a412}$
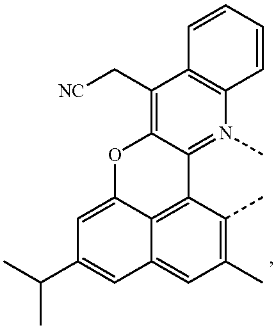

$L_{a413}$
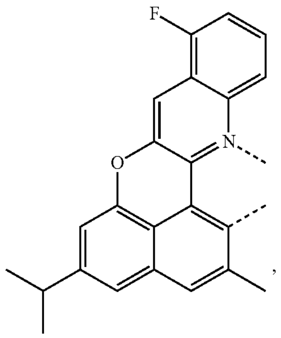
$L_{a414}$
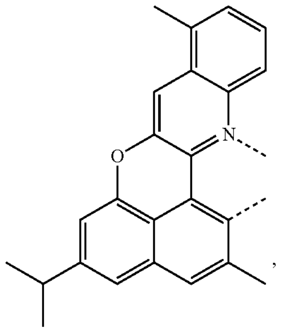
$L_{a415}$
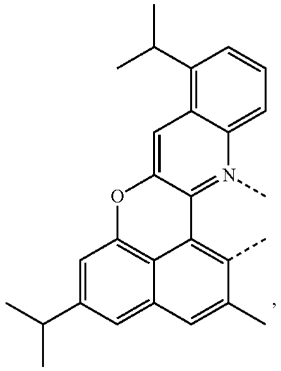
$L_{a416}$
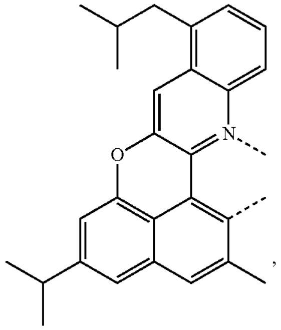
$L_{a417}$
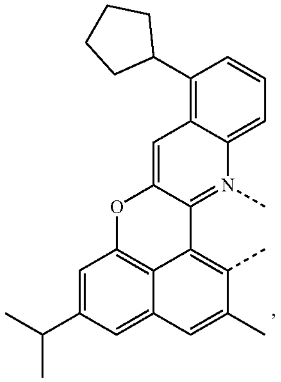
$L_{a418}$
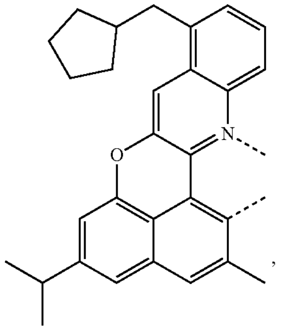
$L_{a419}$
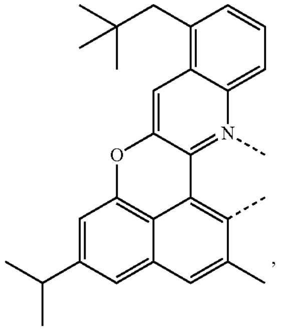
$L_{a420}$
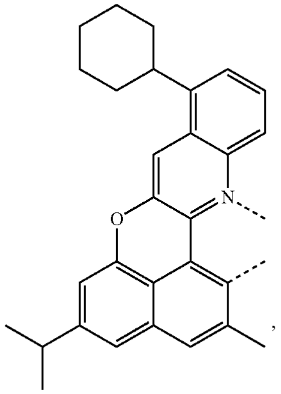

-continued
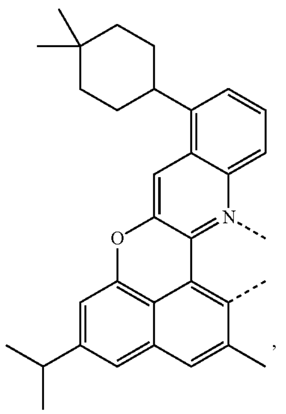
$L_{a421}$
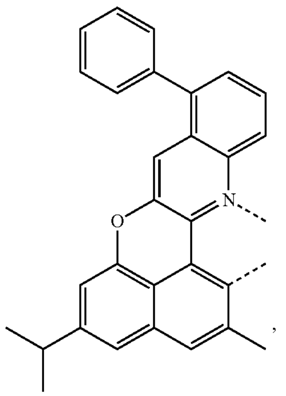
$L_{a422}$
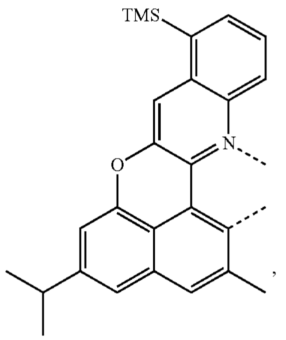
$L_{a423}$
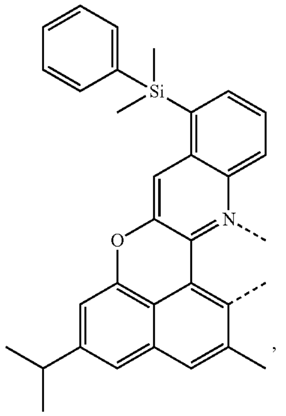
$L_{a424}$
-continued
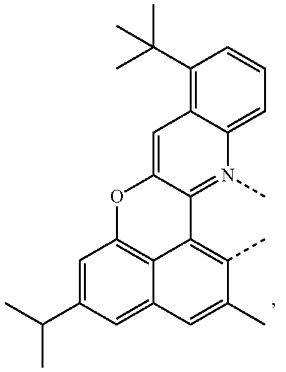
$L_{a425}$
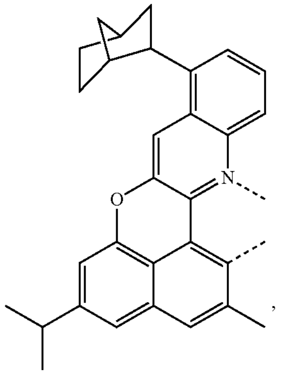
$L_{a426}$
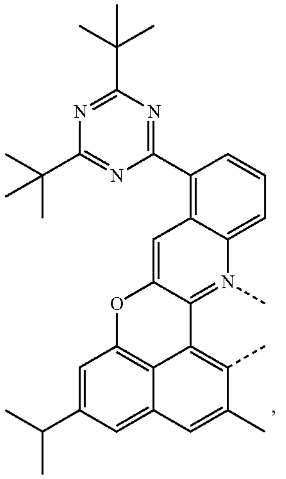
$L_{a427}$
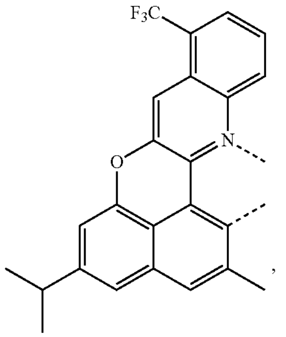
$L_{a428}$ -continued
$L_{a429}$
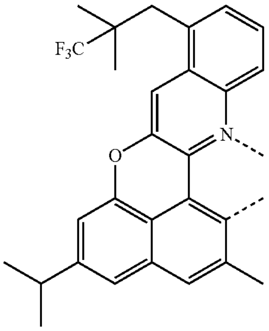
,
$L_{a430}$
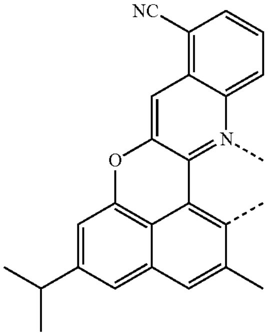
,
$L_{a431}$
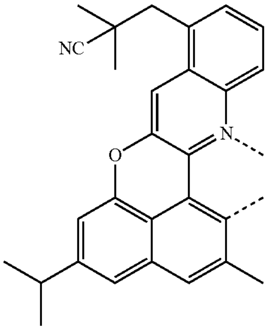
,
$L_{a432}$
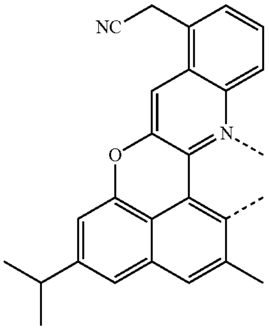
,
-continued
$L_{a433}$
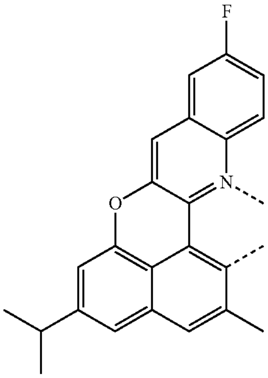
,
$L_{a434}$
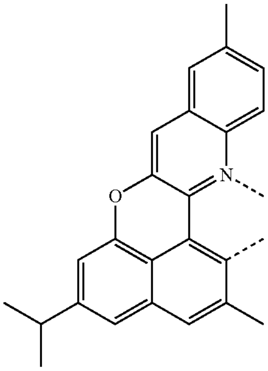
,
$L_{a435}$
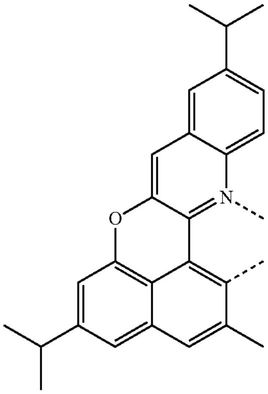
,
$L_{a436}$
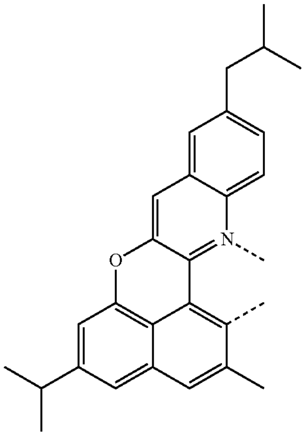
, -continued
$L_{a437}$
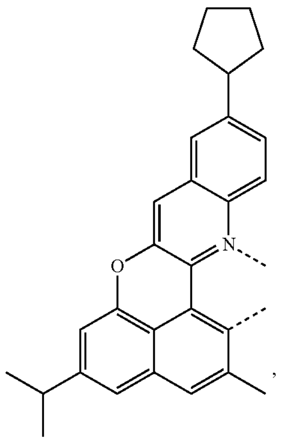
$L_{a438}$
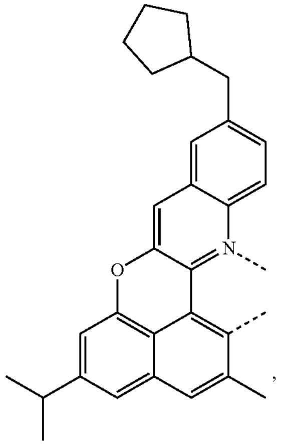
$L_{a439}$
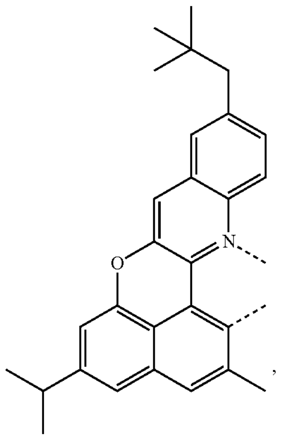
-continued
$L_{a440}$
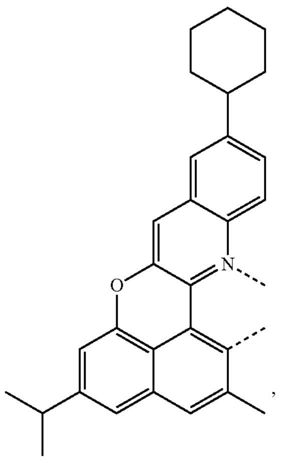
$L_{a441}$
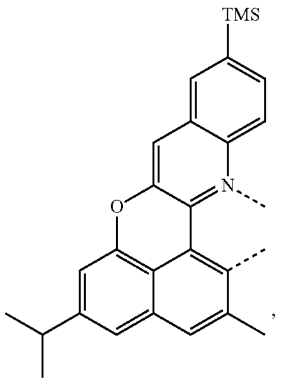
$L_{a442}$
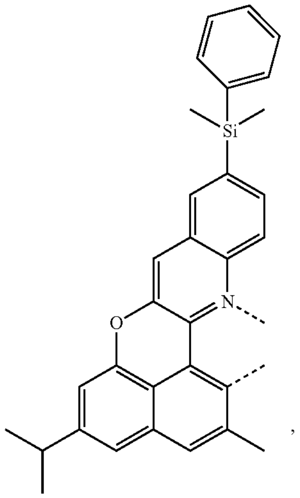

-continued
$L_{a443}$
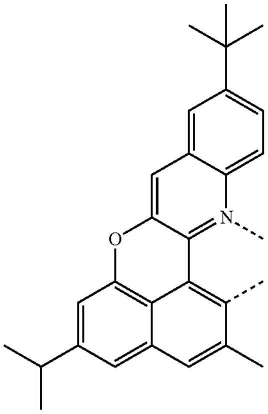
,
$L_{a444}$
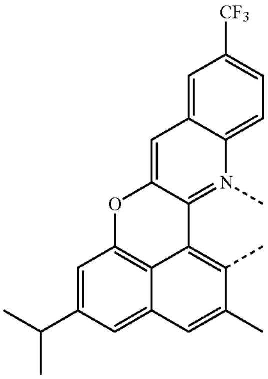
,
$L_{a445}$
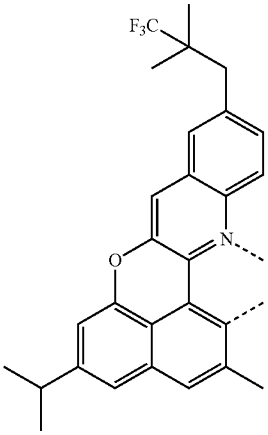
,
$L_{a446}$
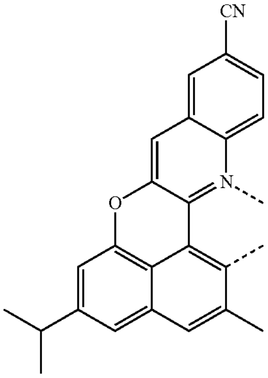
,
-continued
$L_{a447}$
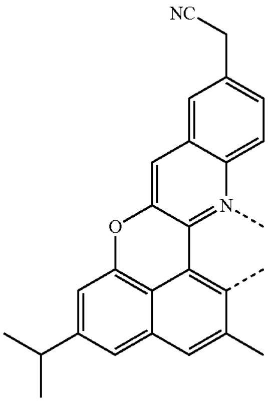
,
$L_{a448}$
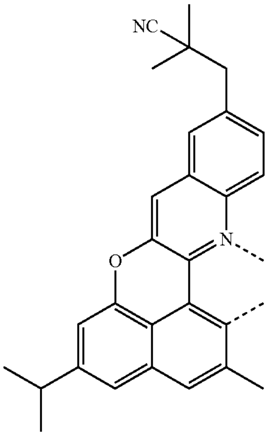
,
$L_{a449}$
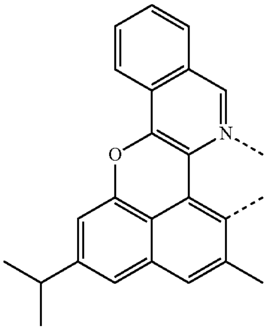
,
$L_{a450}$
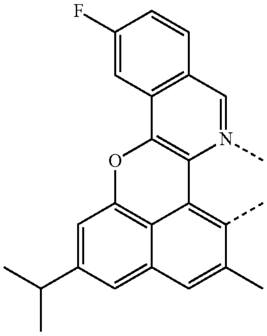
, $L_{a451}$
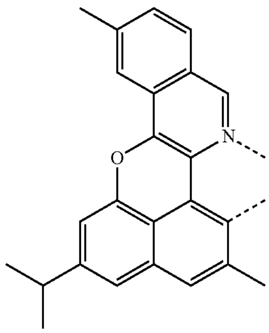
,
$L_{a452}$
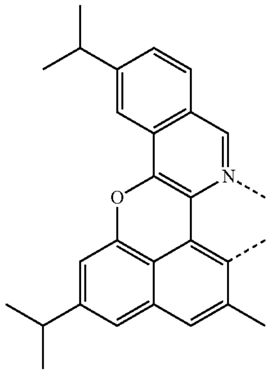
,
$L_{a453}$
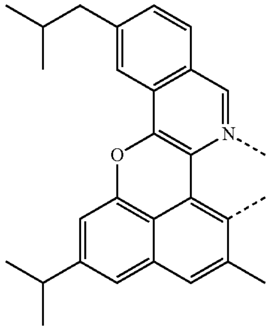
,
$L_{a454}$
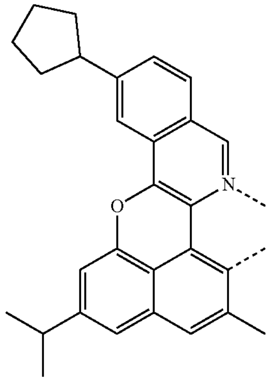
,
$L_{a455}$
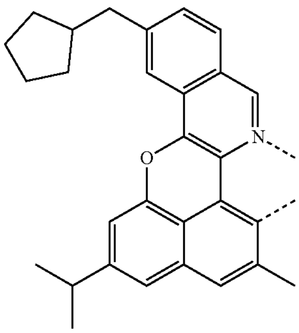
,
$L_{a456}$
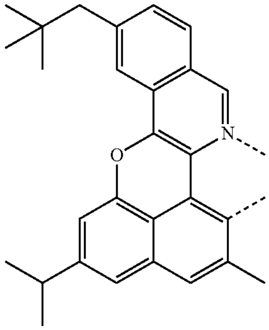
,
$L_{a457}$
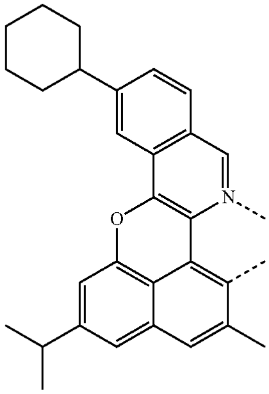
,
$L_{a458}$
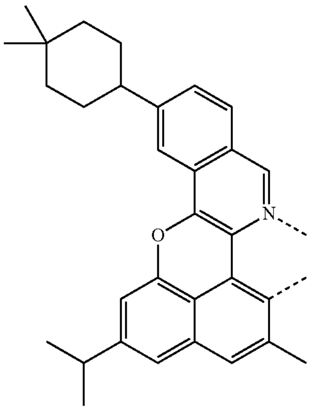
, -continued
$L_{a458}$
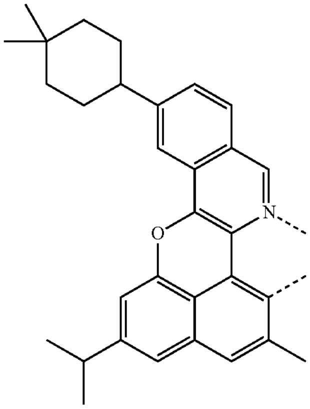
,
$L_{a459}$
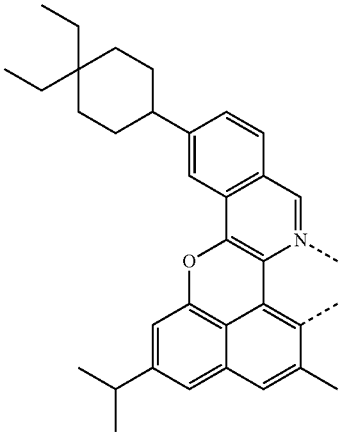
,
$L_{a460}$
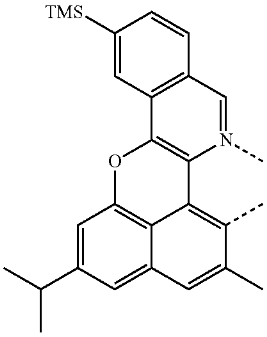
,
$L_{a461}$
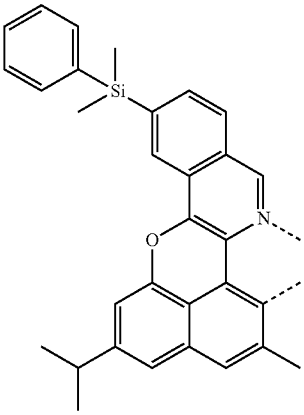
,
-continued
$L_{a462}$
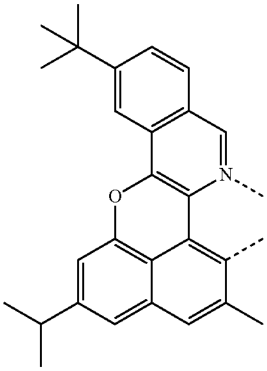
,
$L_{a463}$
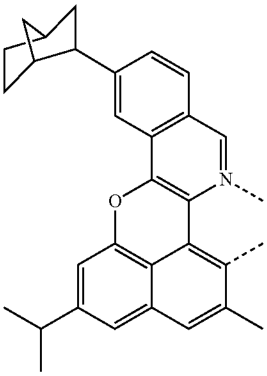
,
$L_{a464}$
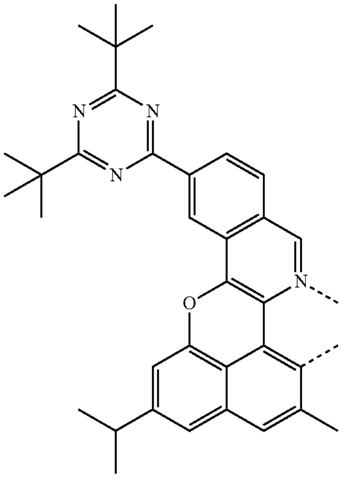
,
$L_{a465}$
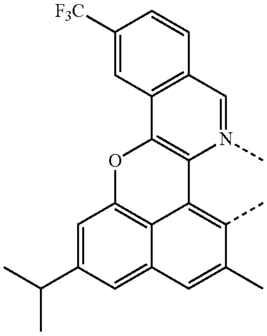
, -continued
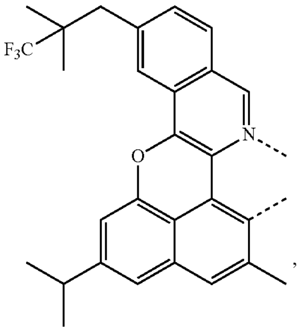
$L_{a466}$
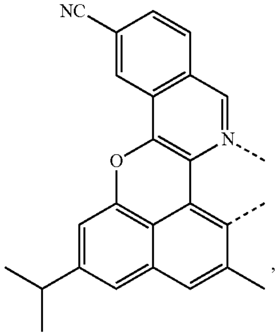
$L_{a467}$
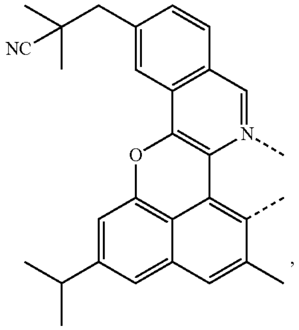
$L_{a468}$
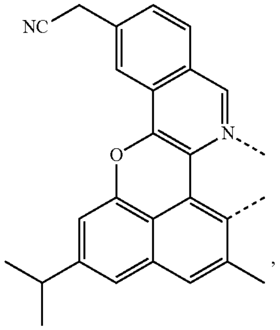
$L_{a469}$
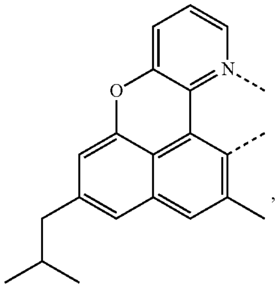
$L_{a470}$
-continued
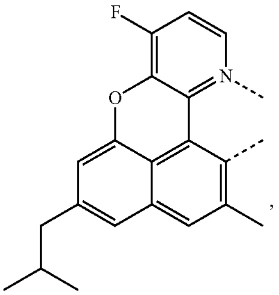
$L_{a471}$
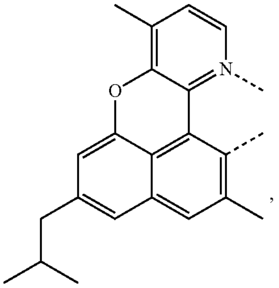
$L_{a472}$
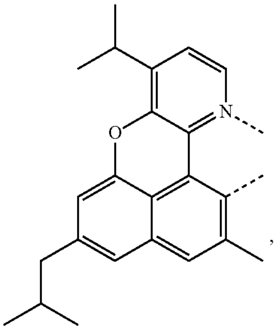
$L_{a473}$
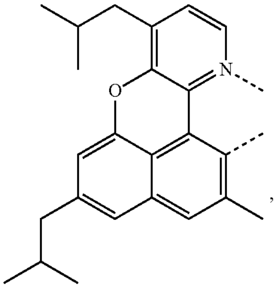
$L_{a474}$
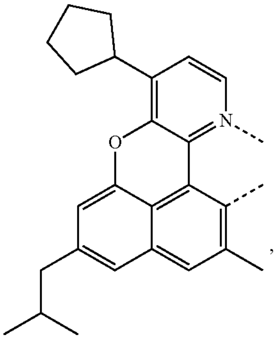
$L_{a475}$ -continued
$L_{a476}$
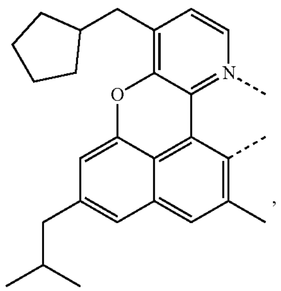
$L_{a477}$
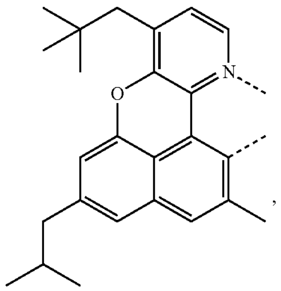
$L_{a478}$
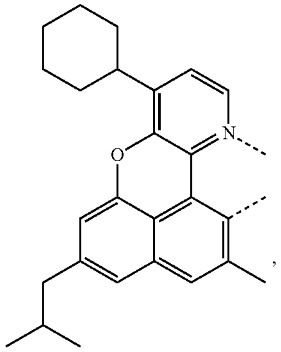
$L_{a479}$
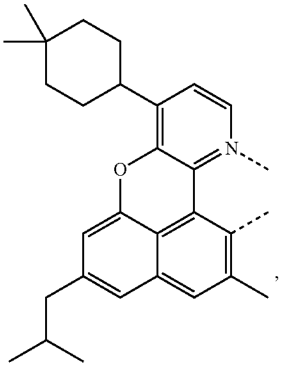
-continued
$L_{a480}$
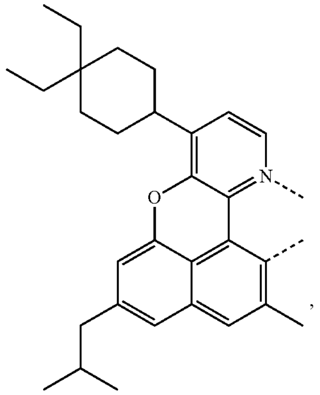
$L_{a481}$
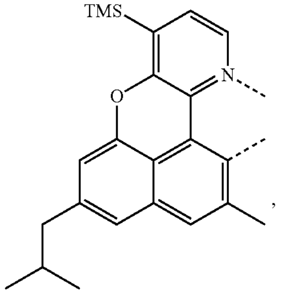
$L_{a482}$
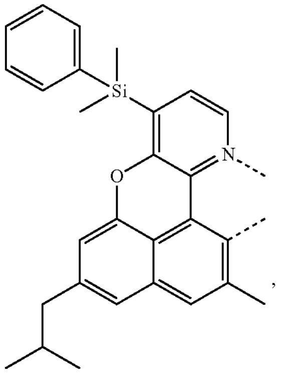
$L_{a483}$
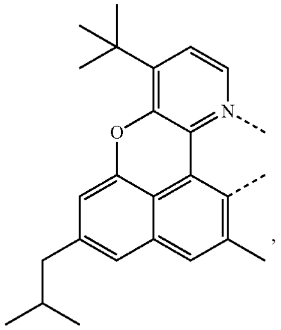

-continued
$L_{a484}$
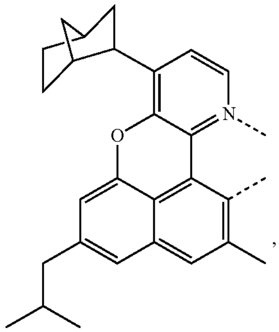
$L_{a485}$
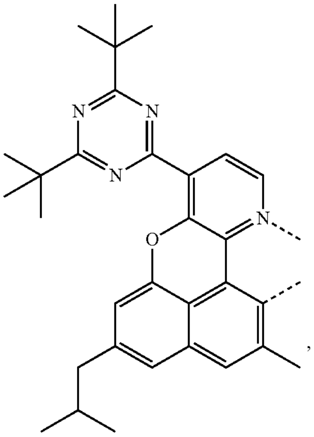
$L_{a486}$
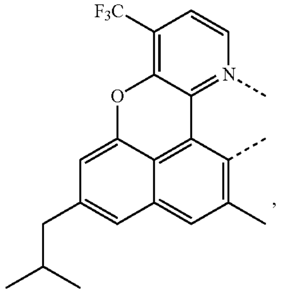
$L_{a487}$
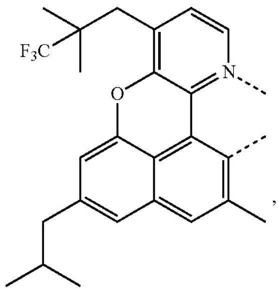
-continued
$L_{a488}$
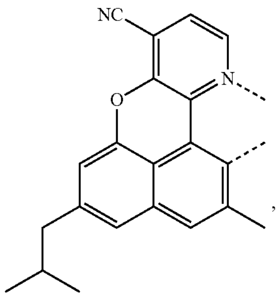
$L_{a489}$
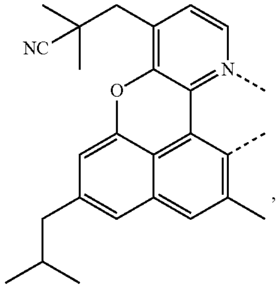
$L_{a490}$
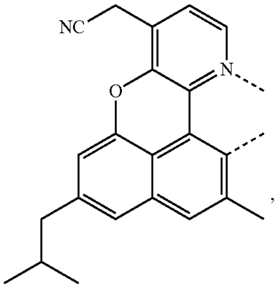
$L_{a491}$
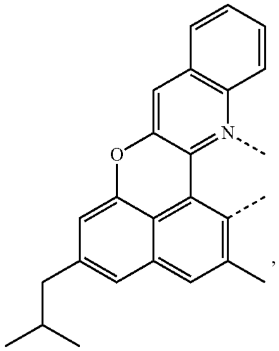
$L_{a492}$
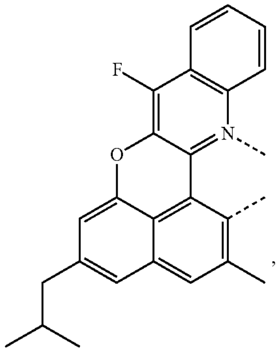

-continued
$L_{a493}$
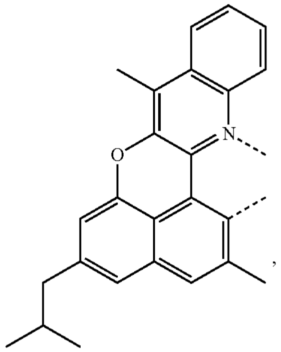
$L_{a494}$
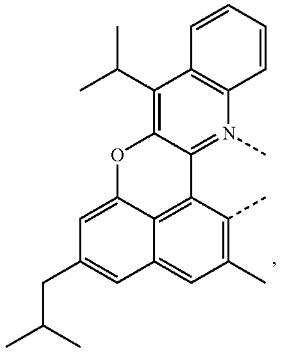
$L_{a495}$
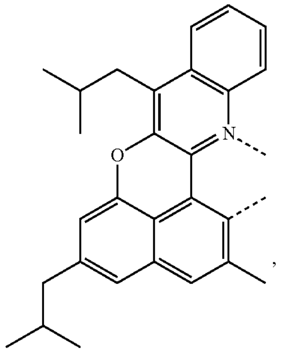
$L_{a496}$
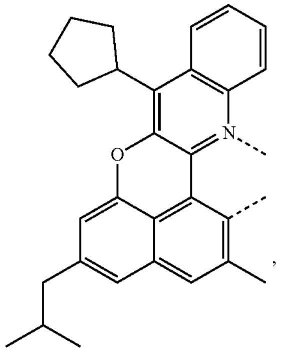
-continued
$L_{a497}$
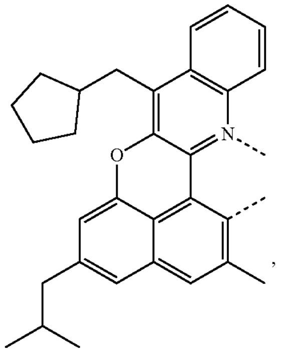
$L_{a498}$
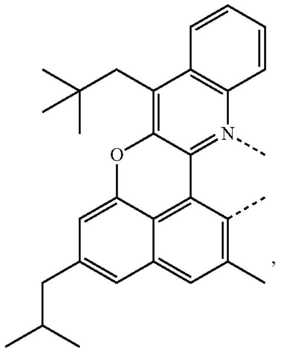
$L_{a499}$
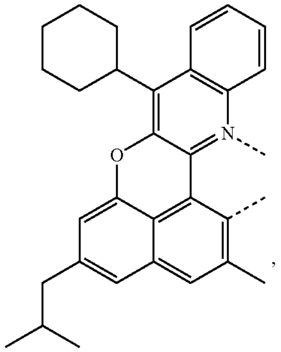
$L_{a500}$
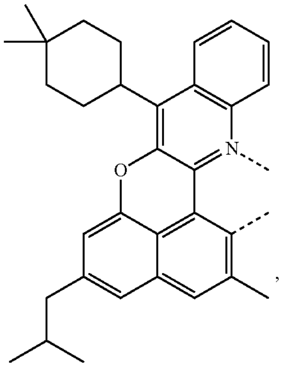

-continued
$L_{a501}$
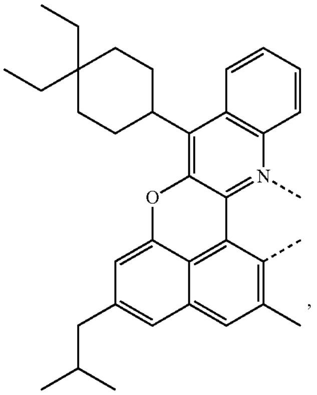
$L_{a502}$
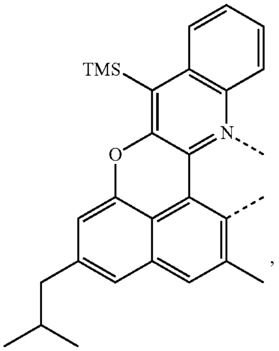
$L_{a503}$
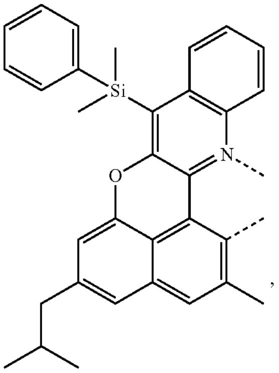
$L_{a504}$
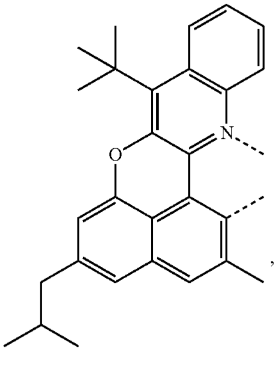
-continued
$L_{a505}$
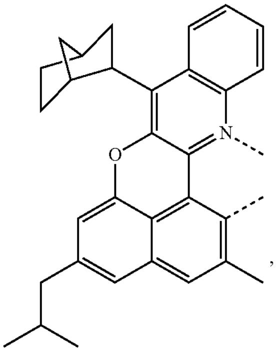
$L_{a506}$
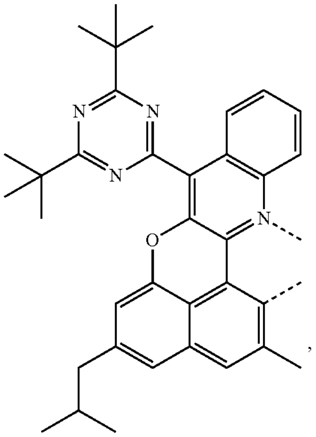
$L_{a507}$
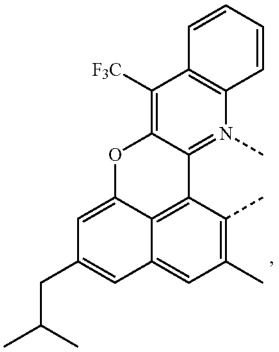
$L_{a508}$
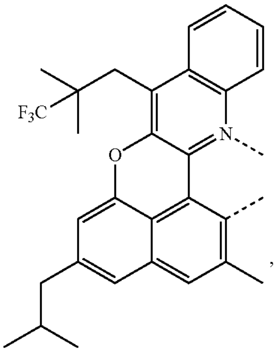

-continued
$L_{a509}$
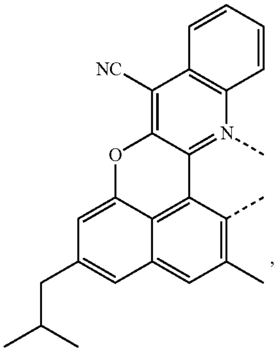
$L_{a510}$
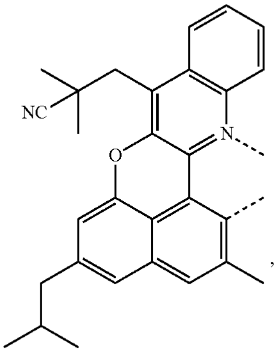
$L_{a511}$
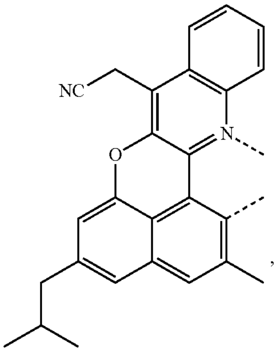
$L_{a512}$
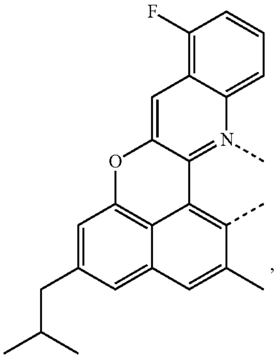
-continued
$L_{a513}$
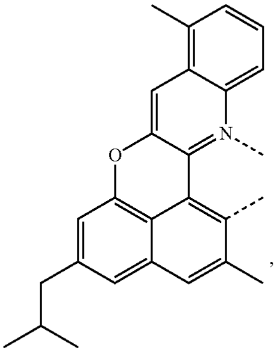
$L_{a514}$
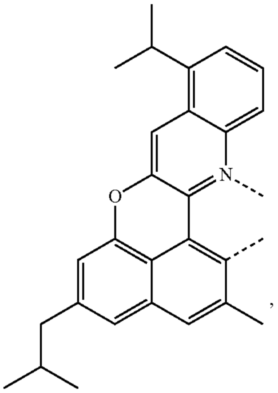
$L_{a515}$
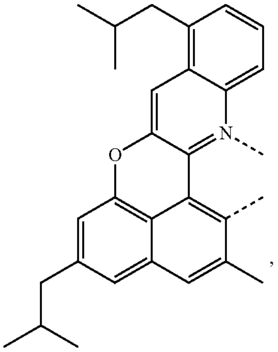
$L_{a516}$
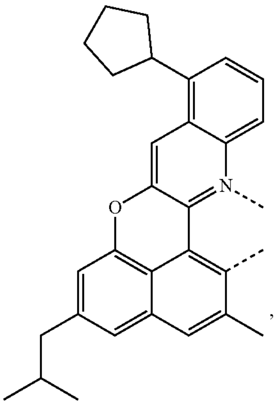

-continued
$L_{a517}$
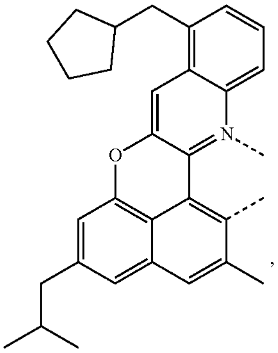
$L_{a518}$
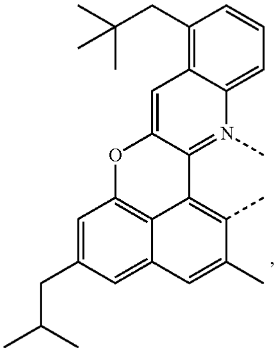
$L_{a519}$
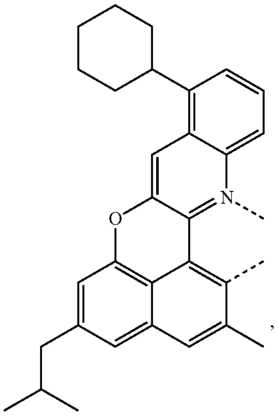
$L_{a520}$
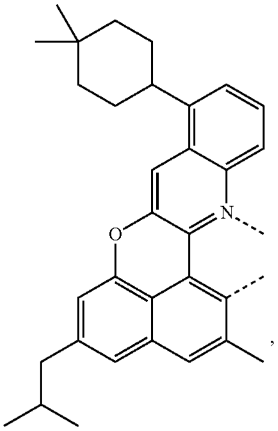
-continued
$L_{a521}$
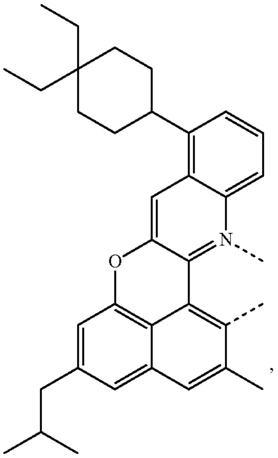
$L_{a522}$
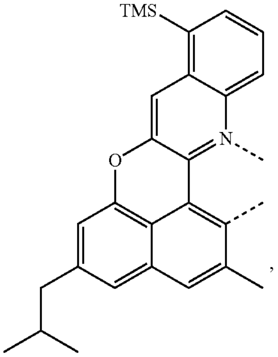
$L_{a523}$
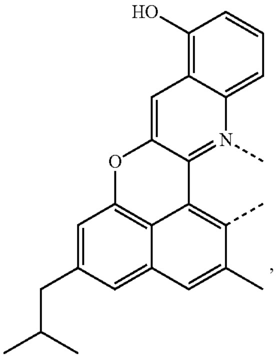
$L_{a524}$
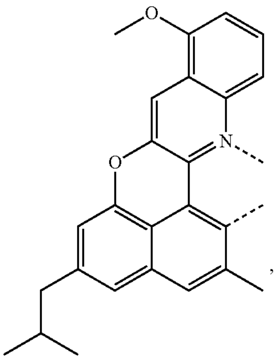

-continued
$L_{a525}$
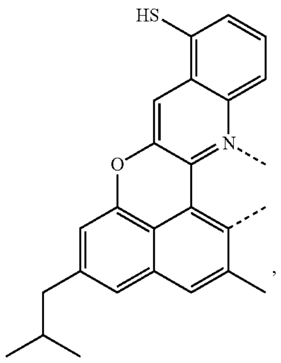
$L_{a526}$
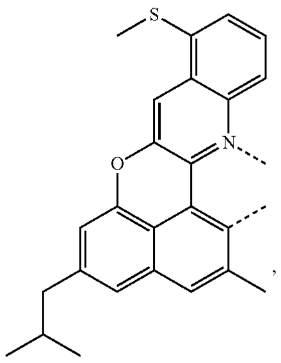
$L_{a527}$
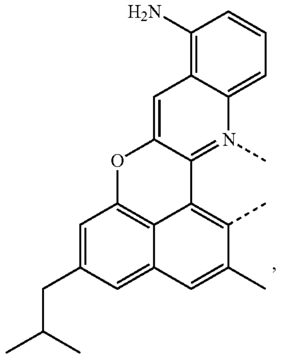
$L_{a528}$
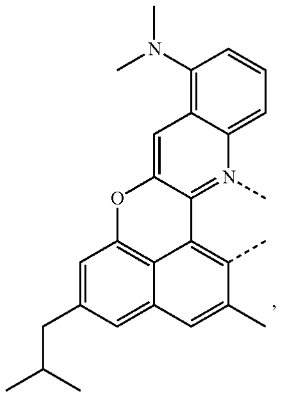
-continued
$L_{a529}$
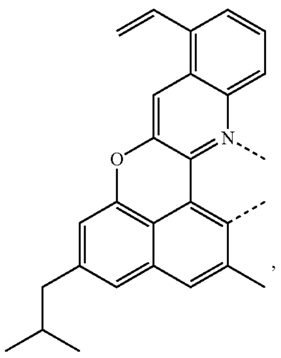
$L_{a530}$
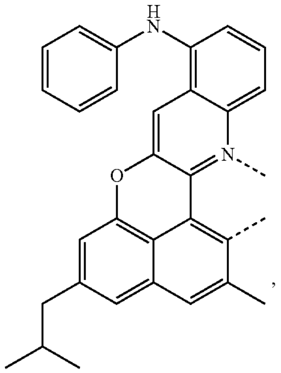
$L_{a531}$
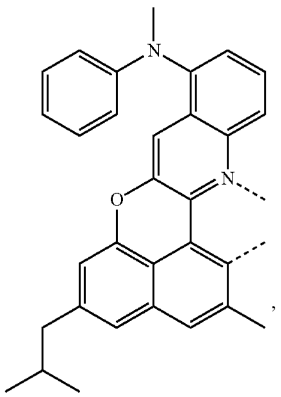
$L_{a532}$
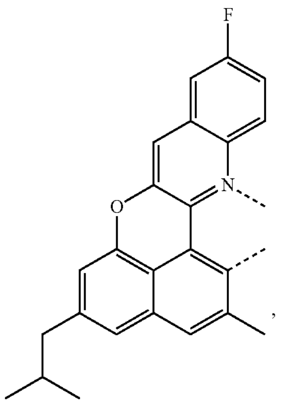

-continued
L$_{a533}$
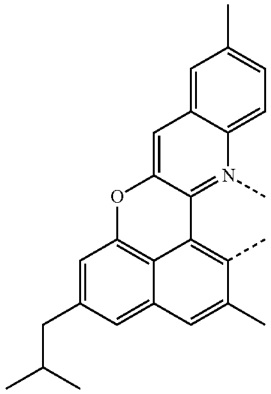
,
L$_{a534}$
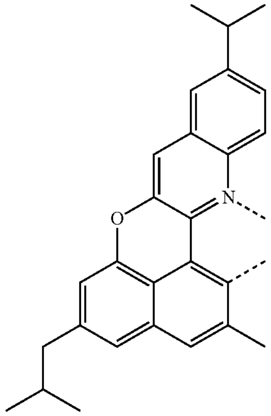
,
L$_{a535}$
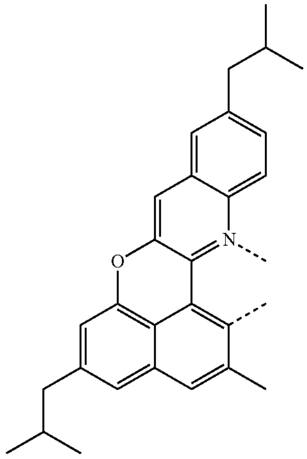
,
-continued
L$_{a536}$
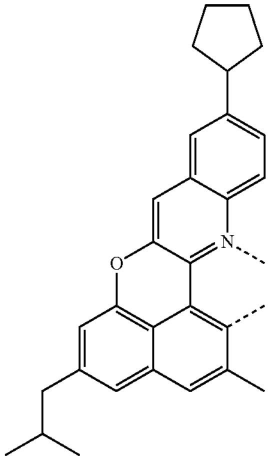
,
L$_{a537}$
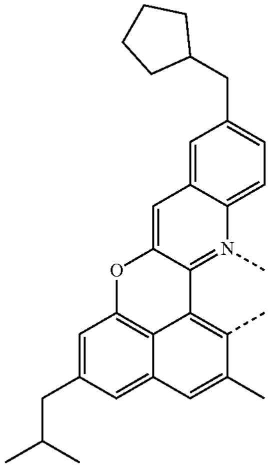
,
L$_{a538}$
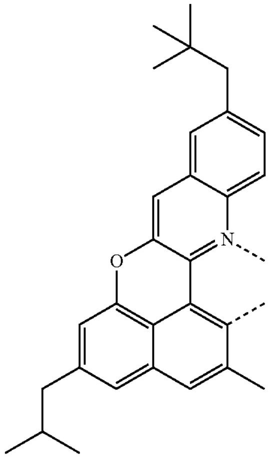
, -continued
$L_{a539}$
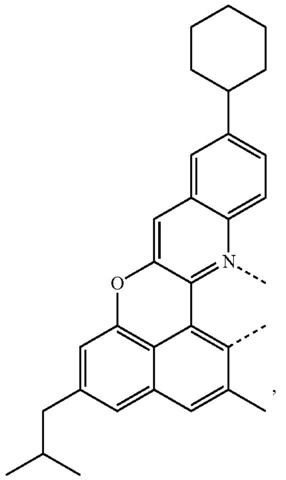
$L_{a540}$
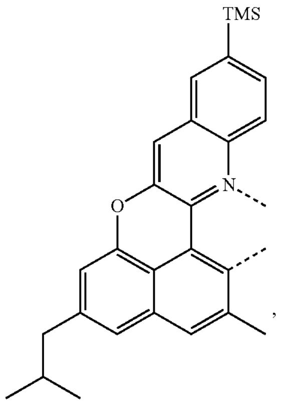
$L_{a541}$
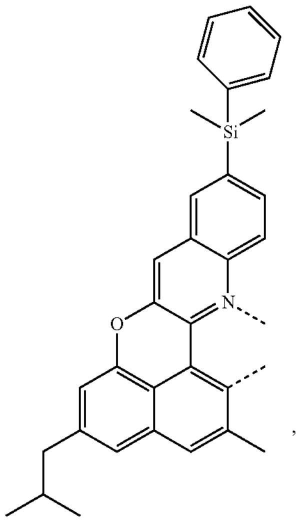
-continued
$L_{a542}$
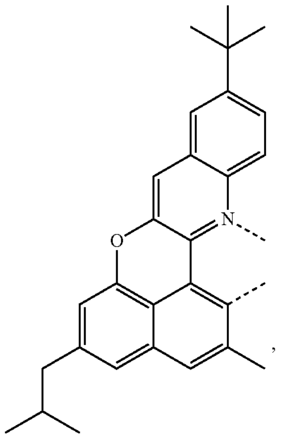
$L_{a543}$
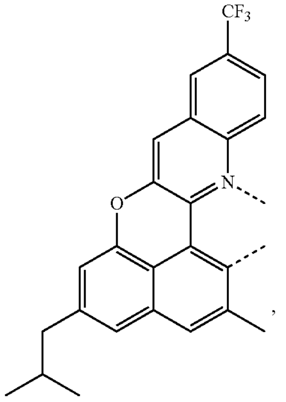
$L_{a544}$
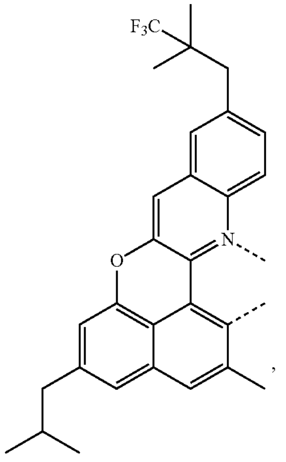

-continued
$L_{a545}$
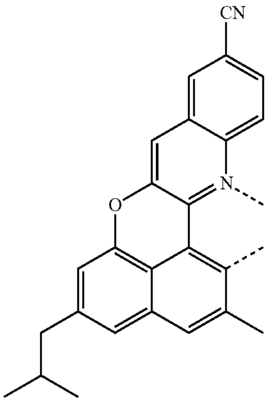
,
$L_{a546}$
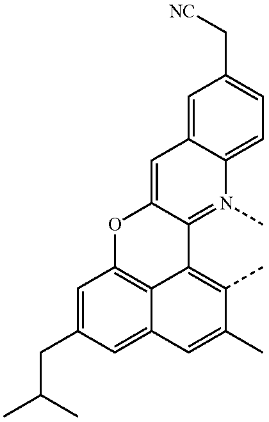
,
$L_{a547}$
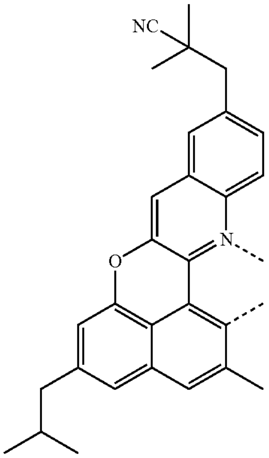
,
$L_{a548}$
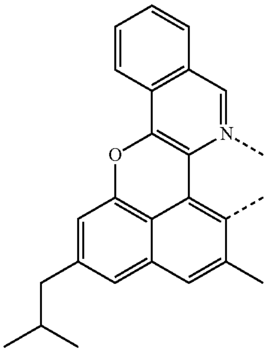
,
-continued
$L_{a549}$
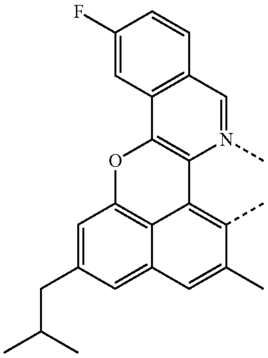
,
$L_{a550}$
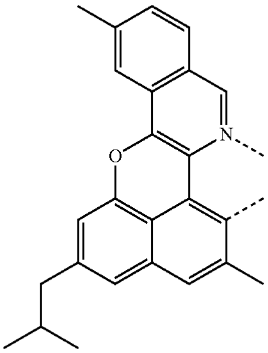
,
$L_{a551}$
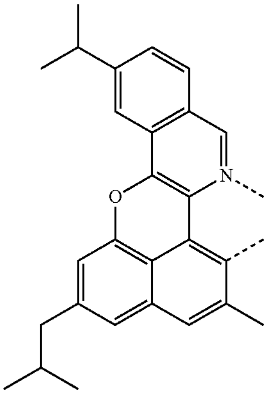
,
$L_{a552}$
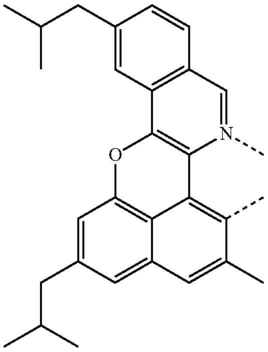
, -continued
$L_{a553}$
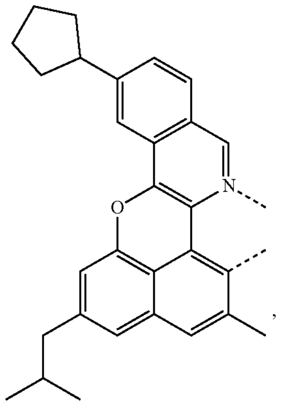
$L_{a554}$
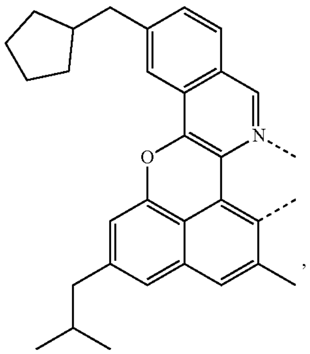
$L_{a555}$
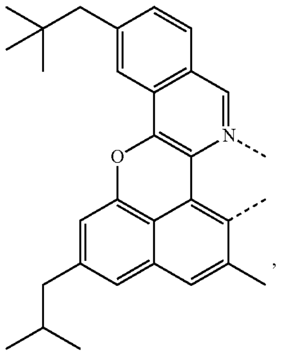
$L_{a556}$
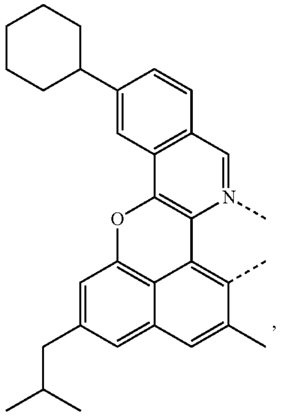
-continued
$L_{a557}$
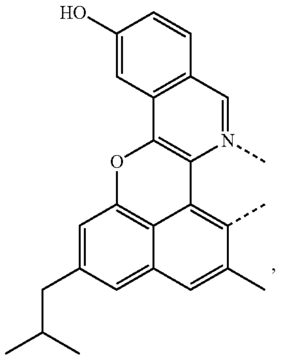
$L_{a558}$
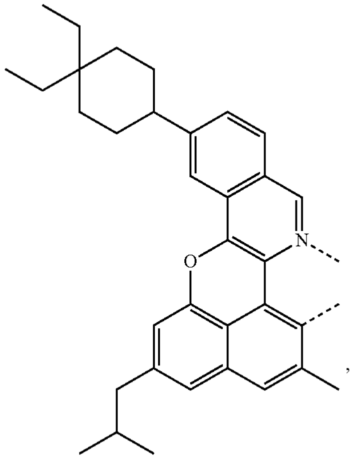
$L_{a559}$
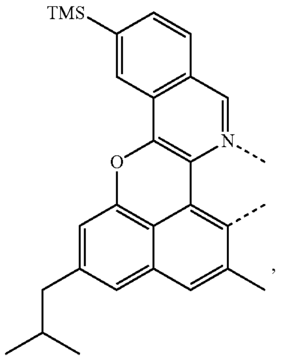
$L_{a560}$
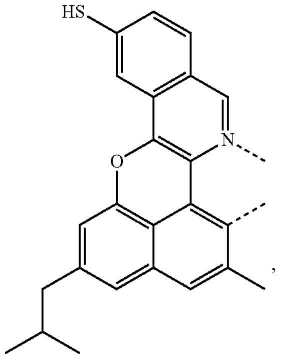

-continued
La561
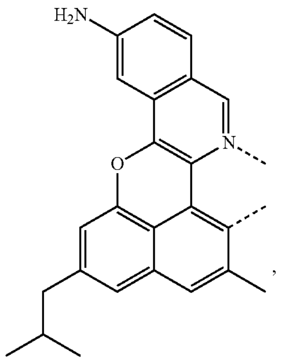
La562
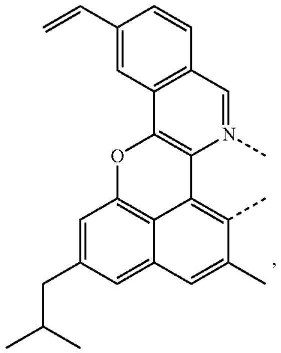
La563
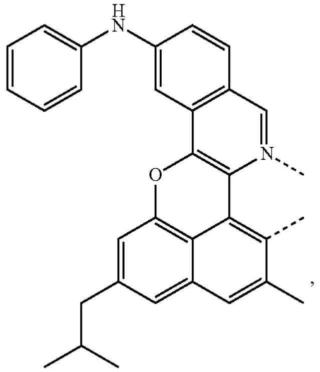
La564
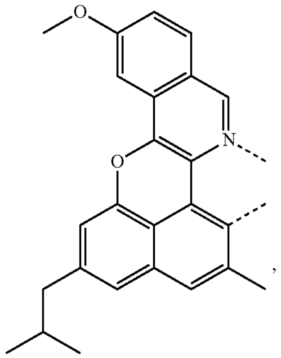
-continued
La565
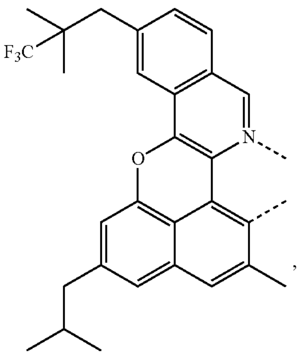
La566
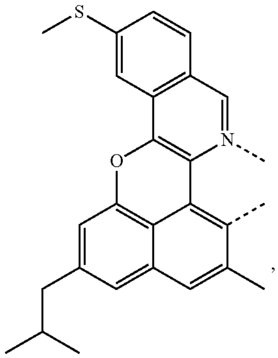
La567
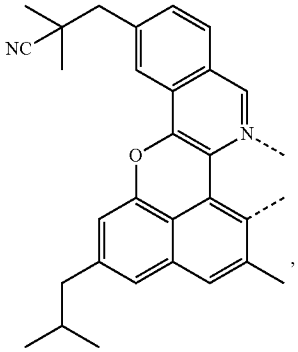
La568
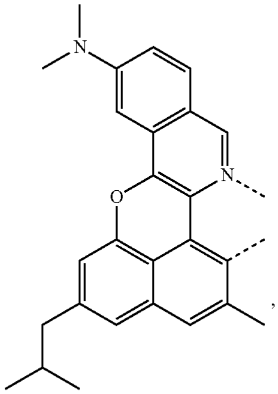

-continued
$L_{a569}$
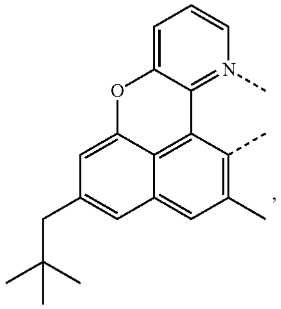
$L_{a570}$
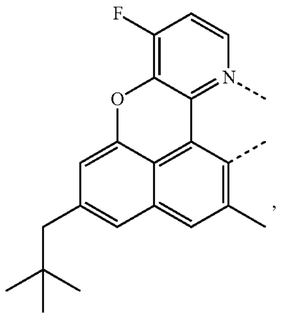
$L_{a571}$
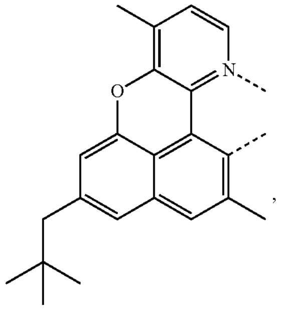
$L_{a572}$
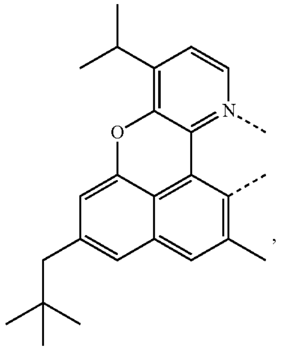
$L_{a573}$
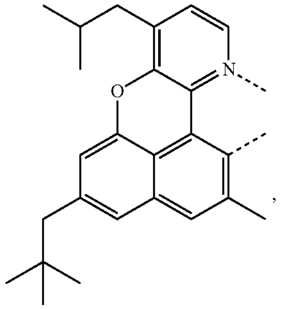
-continued
$L_{a574}$
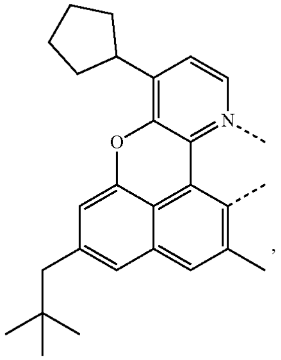
$L_{a575}$
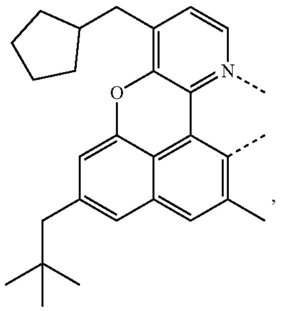
$L_{a576}$
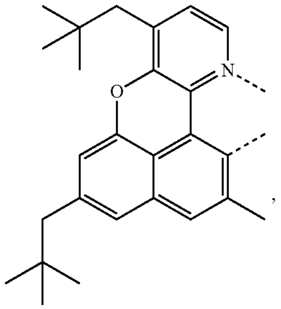
$L_{a577}$
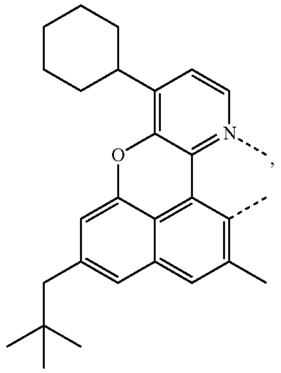

-continued
$L_{a578}$
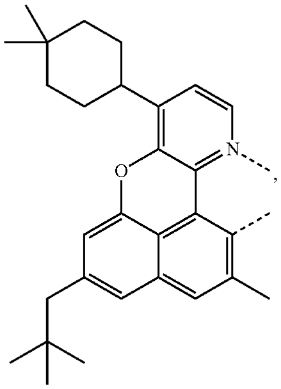
$L_{a579}$
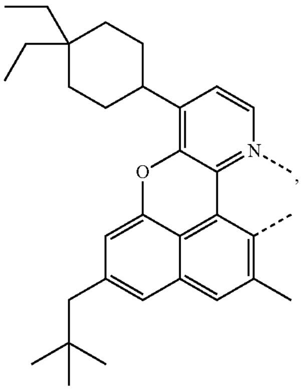
$L_{a580}$
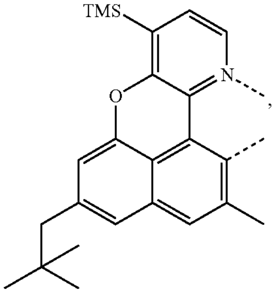
$L_{a581}$
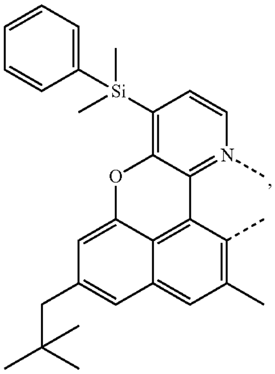
-continued
$L_{a582}$
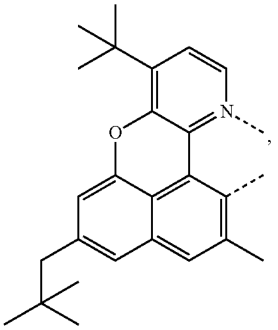
$L_{a583}$
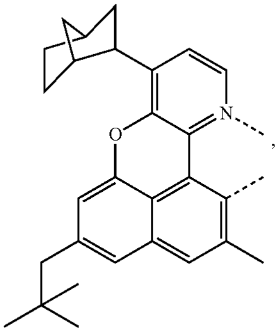
$L_{a584}$
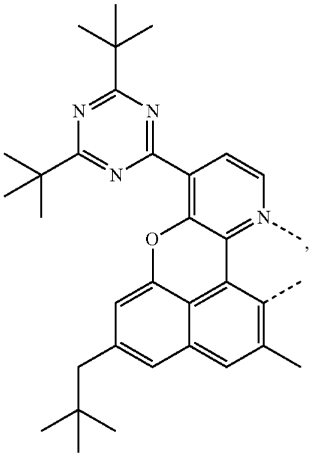
$L_{a585}$
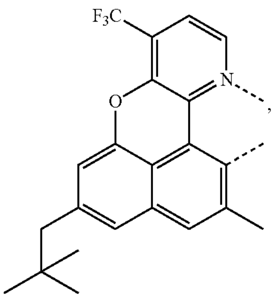

$L_{a586}$
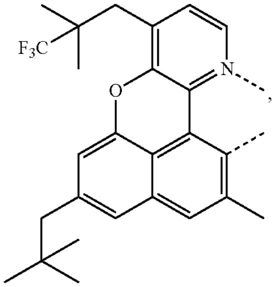
$L_{a587}$
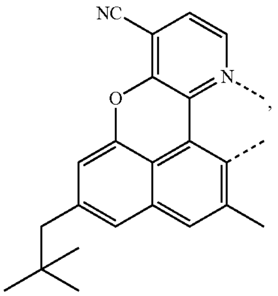
$L_{a588}$
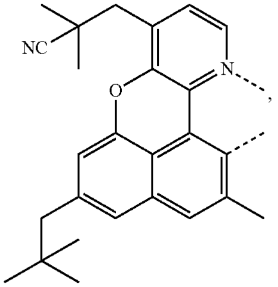
$L_{a589}$
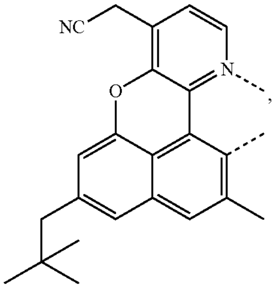
$L_{a590}$
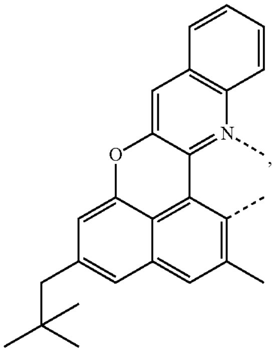
$L_{a591}$
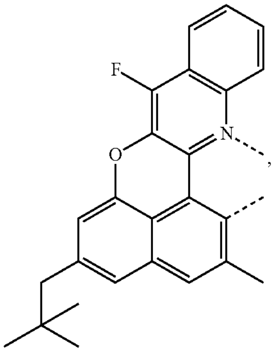
$L_{a592}$
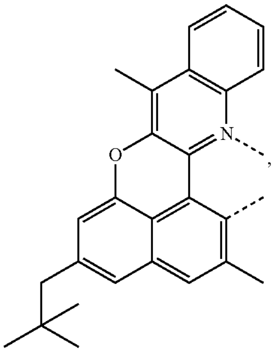
$L_{a593}$
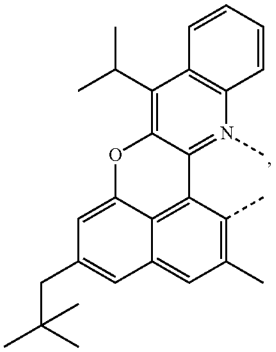
$L_{a594}$
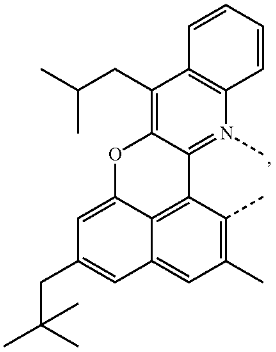

-continued
$L_{a595}$
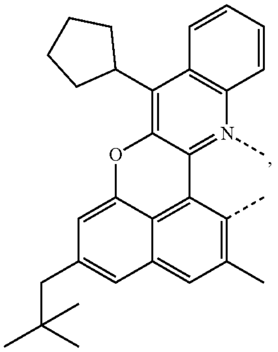
$L_{a596}$
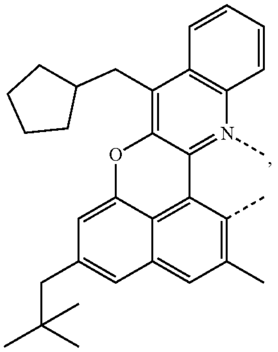
$L_{a597}$
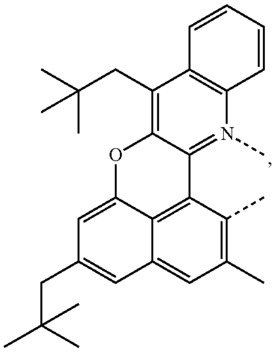
$L_{a598}$
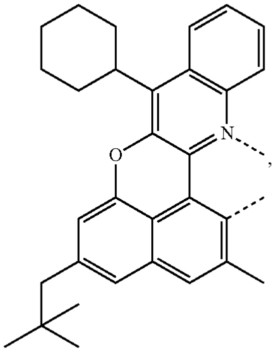
-continued
$L_{a599}$
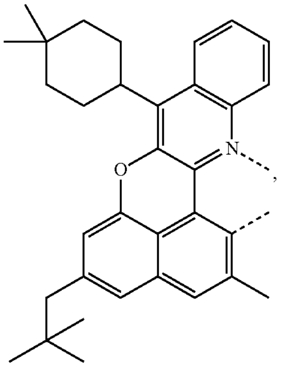
$L_{a600}$
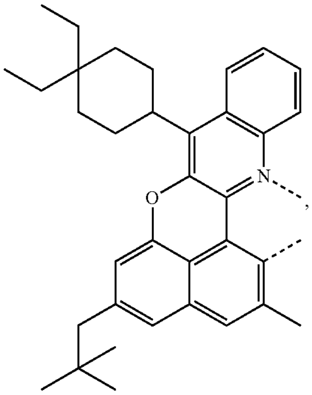
$L_{a601}$
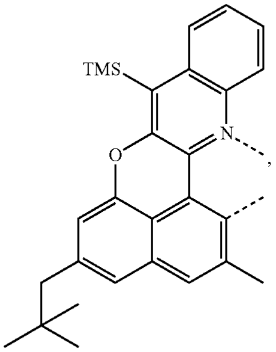
$L_{a602}$
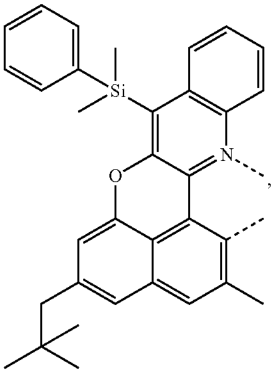

-continued
$L_{a603}$
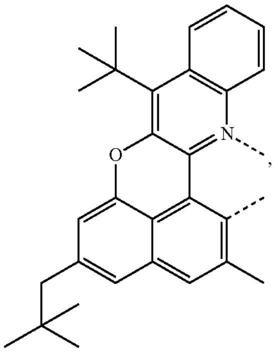
$L_{a604}$
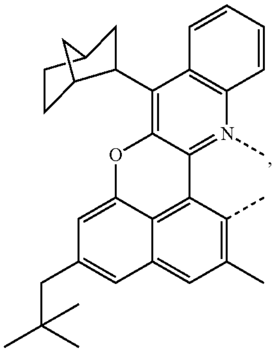
$L_{a605}$
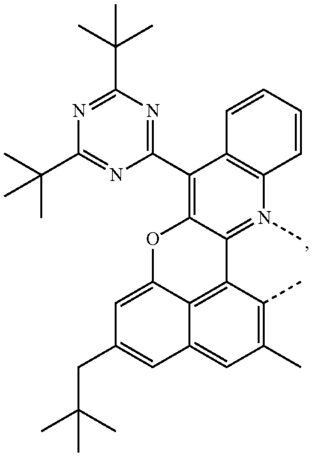
$L_{a606}$
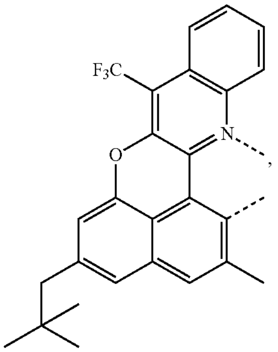
-continued
$L_{a607}$
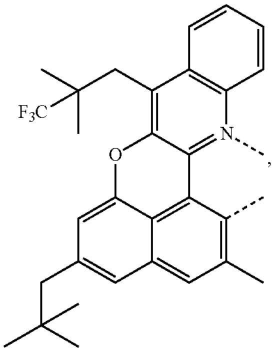
$L_{a608}$
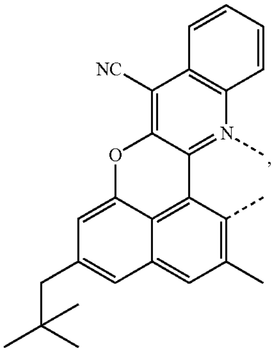
$L_{a609}$
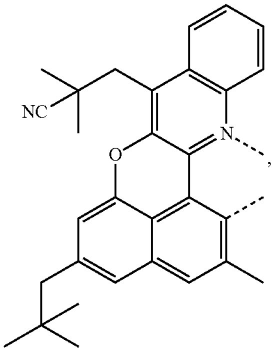
$L_{a610}$
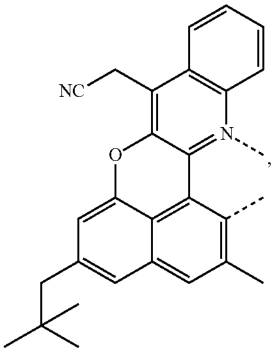

-continued
$L_{a611}$
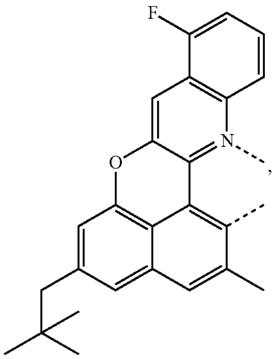
$L_{a612}$
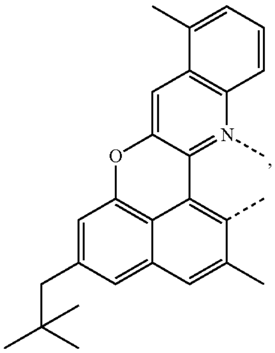
$L_{a613}$
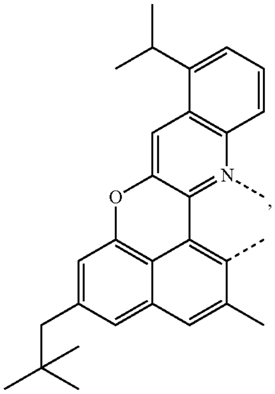
$L_{a614}$
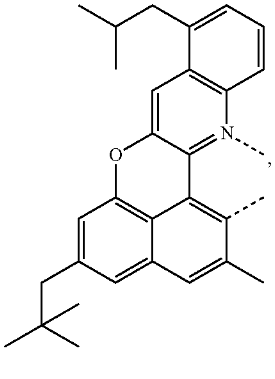
-continued
$L_{a615}$
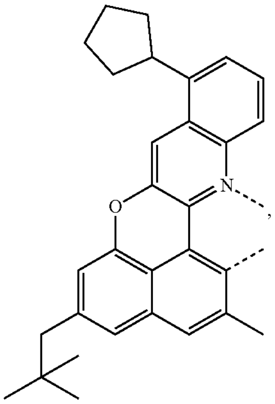
$L_{a616}$
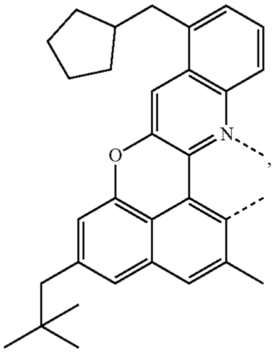
$L_{a617}$
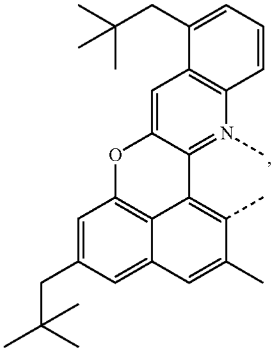
$L_{a618}$
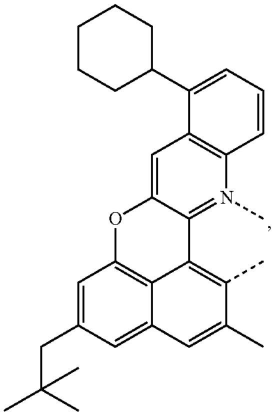

-continued
$L_{a619}$
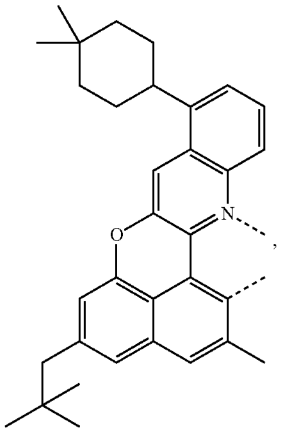
$L_{a620}$
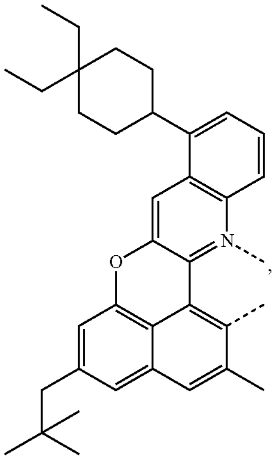
$L_{a621}$
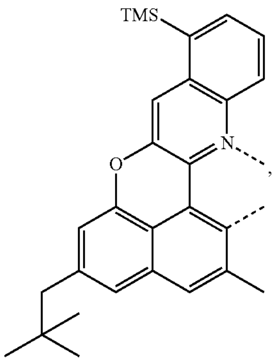
-continued
$L_{a622}$
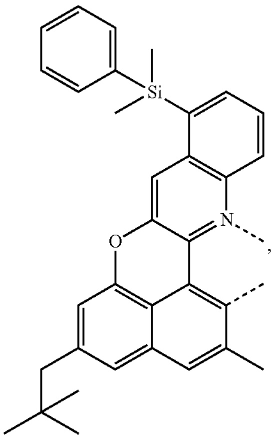
$L_{a623}$
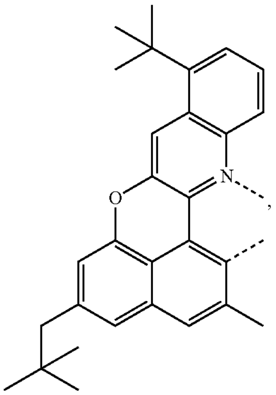
$L_{a624}$
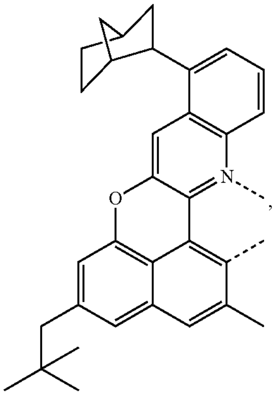

-continued
$L_{a625}$
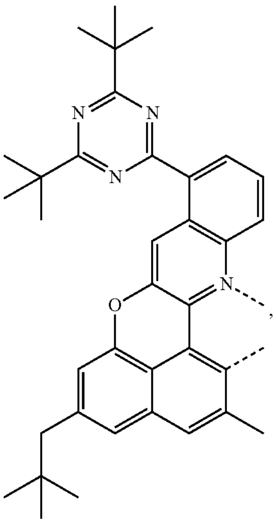
$L_{a626}$
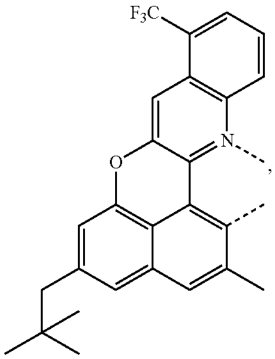
$L_{a627}$
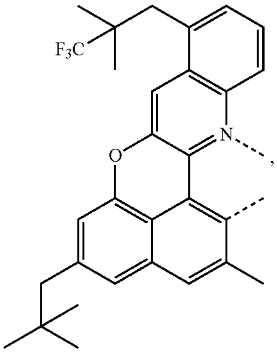
$L_{a628}$
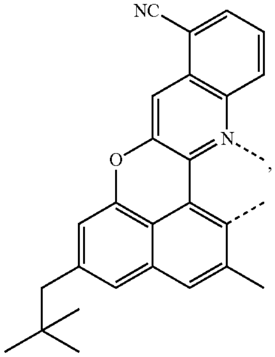
-continued
$L_{a629}$
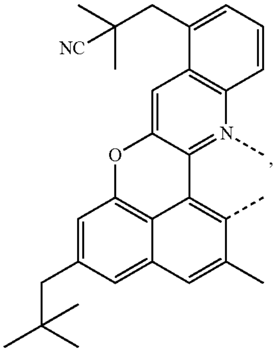
$L_{a630}$
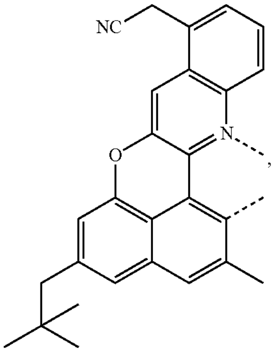
$L_{a631}$
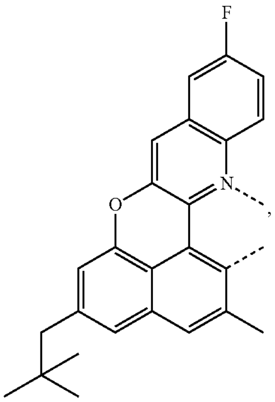
$L_{a632}$
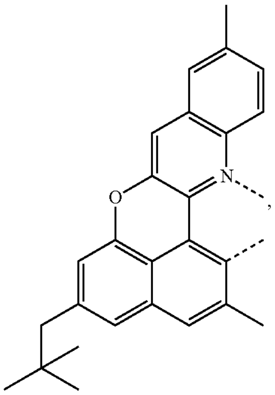

-continued
$L_{a633}$
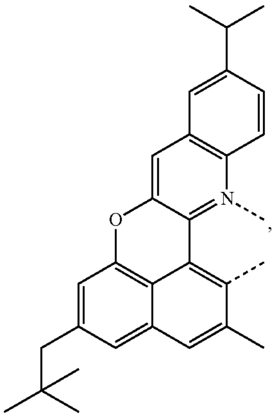
$L_{a634}$
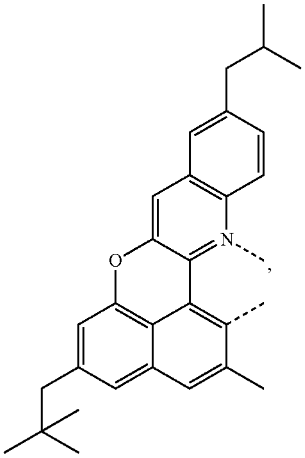
$L_{a635}$
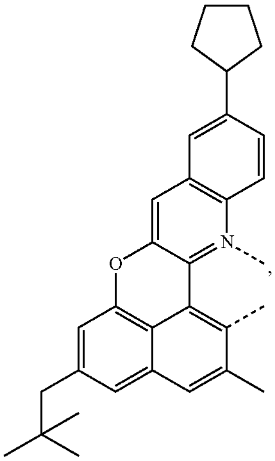
-continued
$L_{a636}$
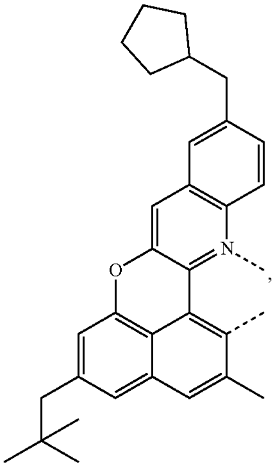
$L_{a637}$
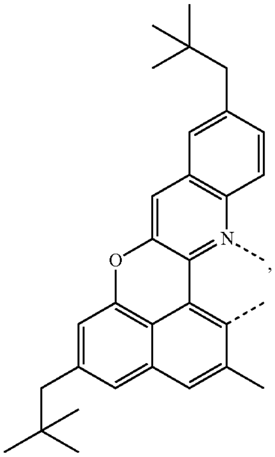
$L_{a638}$
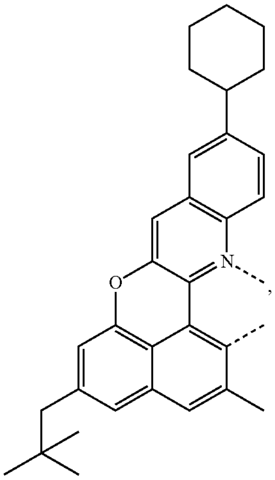

$L_{a639}$
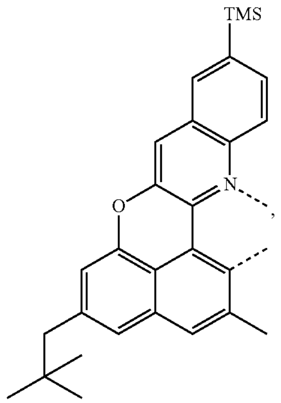
$L_{a640}$
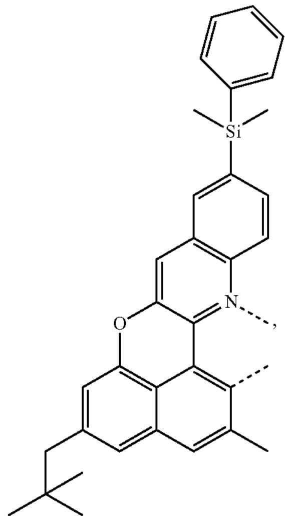
$L_{a641}$
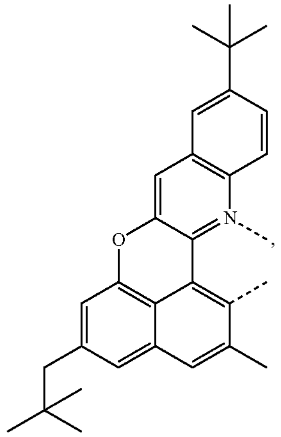
$L_{a642}$
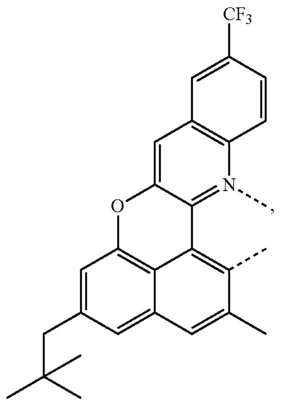
$L_{a643}$
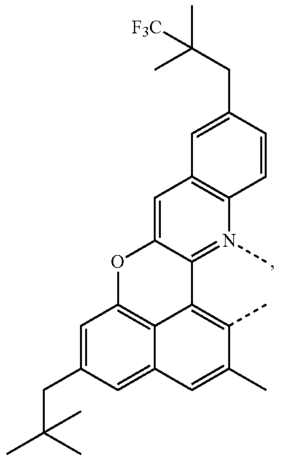
$L_{a644}$
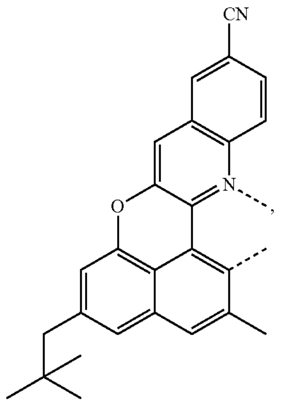

-continued
L$_{a645}$
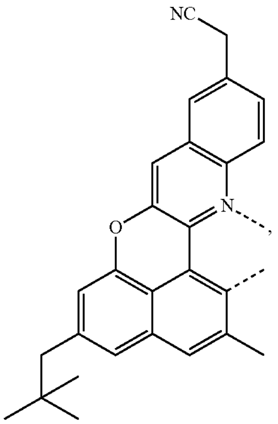
L$_{a646}$
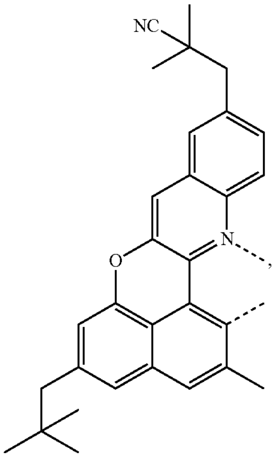
L$_{a647}$
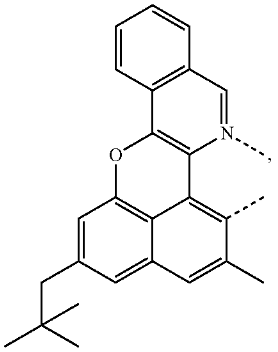
L$_{a648}$
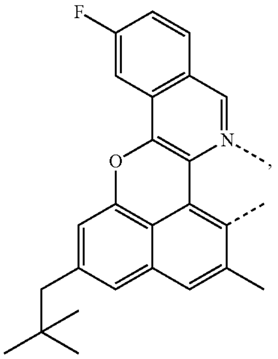
-continued
L$_{a649}$
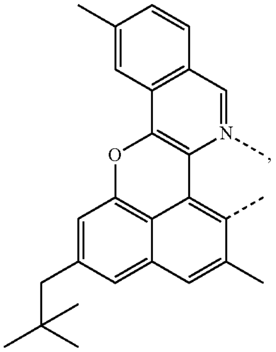
L$_{a650}$
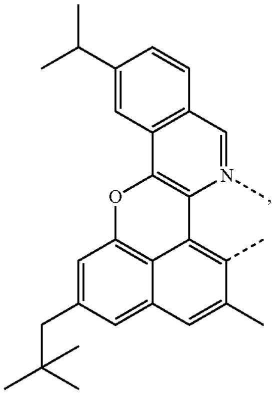
L$_{a651}$
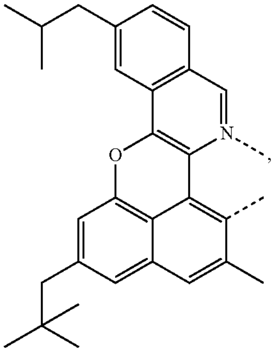
L$_{a652}$
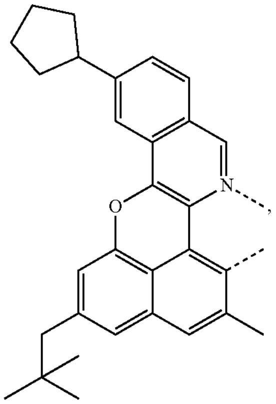

-continued
$L_{a653}$
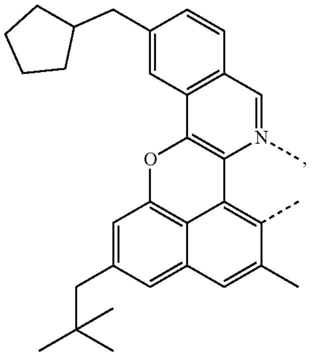
$L_{a654}$
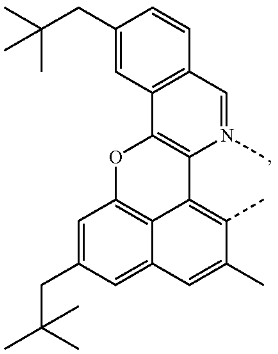
$L_{a655}$
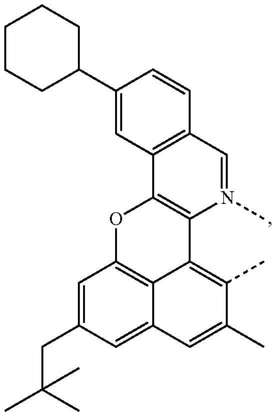
$L_{a656}$
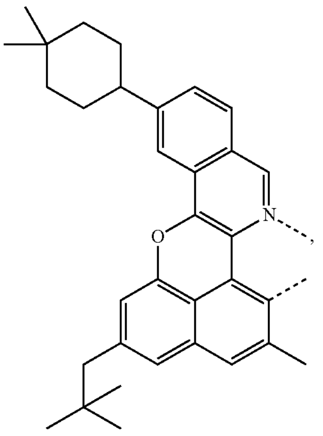
-continued
$L_{a657}$
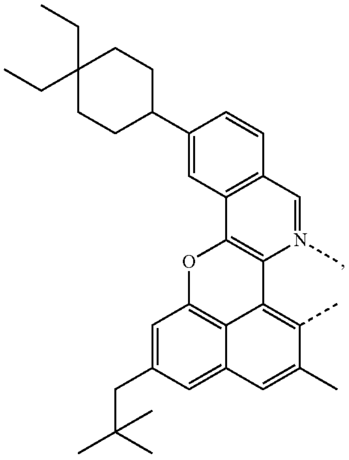
$L_{a658}$
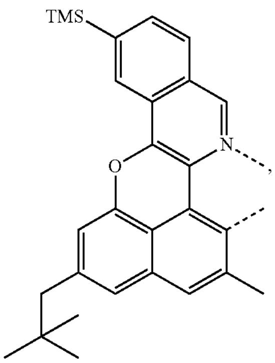
$L_{a659}$
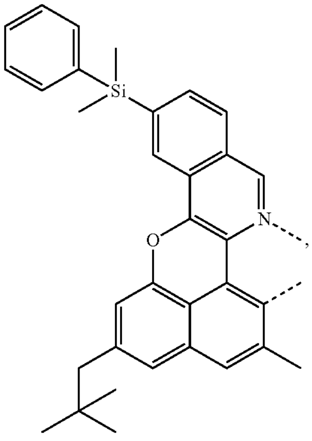

-continued
$L_{a660}$
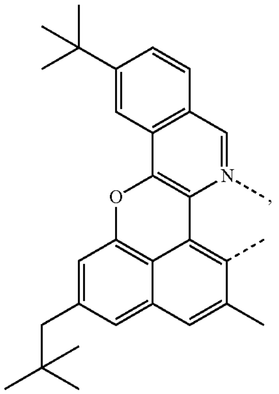
$L_{a661}$
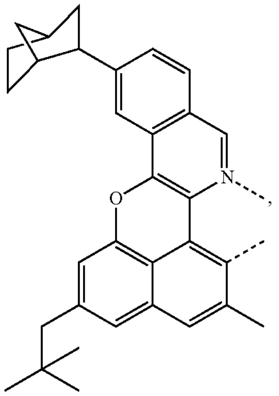
$L_{a662}$
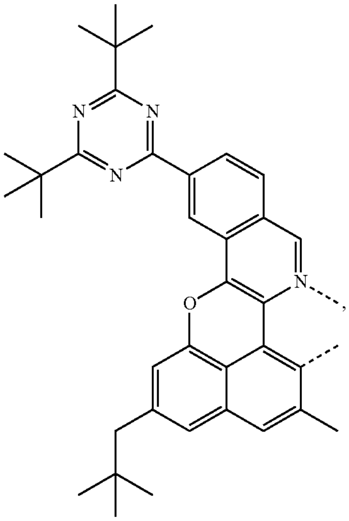
-continued
$L_{a663}$
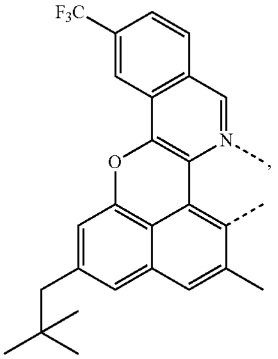
$L_{a664}$
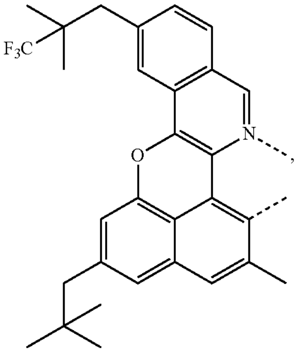
$L_{a665}$
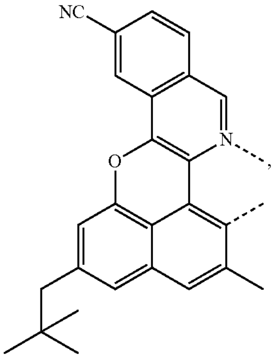
$L_{a666}$
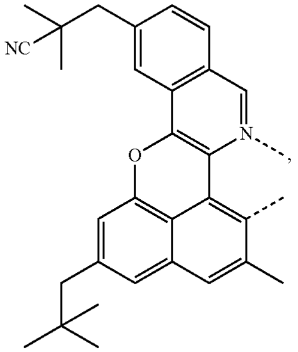

-continued
$L_{a667}$
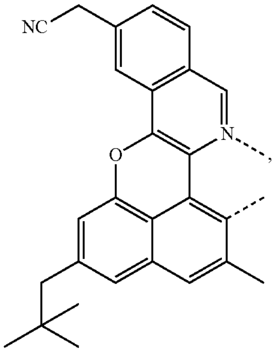
$L_{a668}$
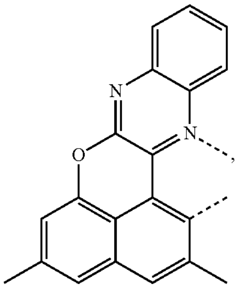
$L_{a669}$
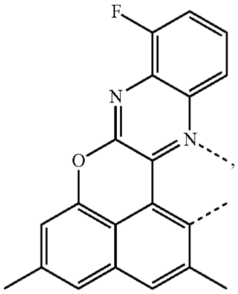
$L_{a670}$
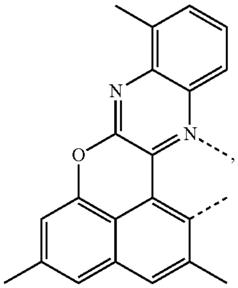
$L_{a671}$
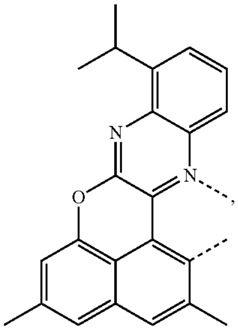
-continued
$L_{a672}$
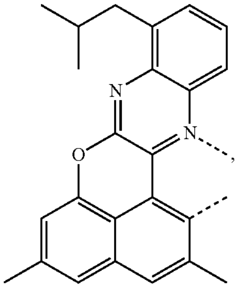
$L_{a673}$
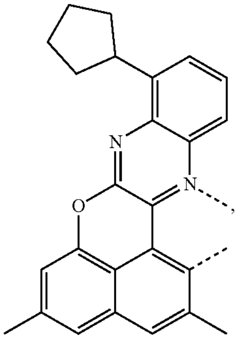
$L_{a674}$
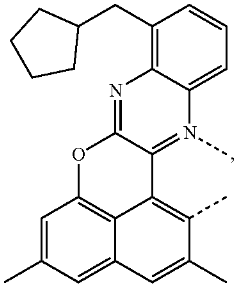
$L_{a675}$
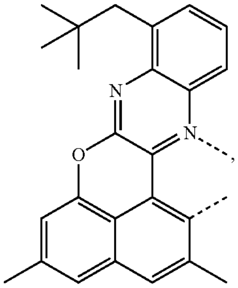
$L_{a676}$
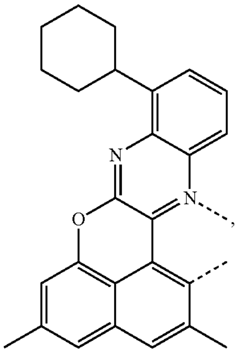

-continued
$L_{a677}$
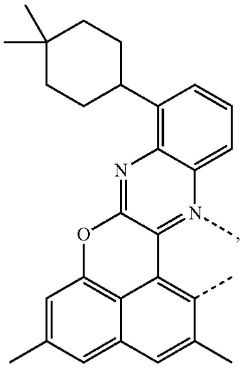
$L_{a678}$
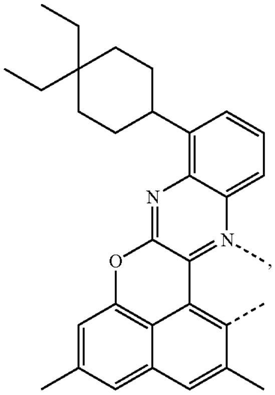
$L_{a679}$
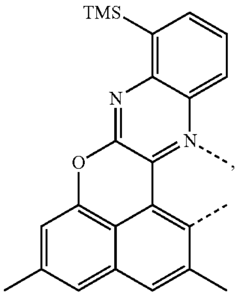
$L_{a680}$
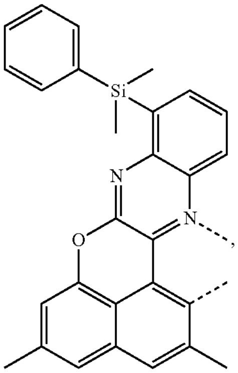
-continued
$L_{a681}$
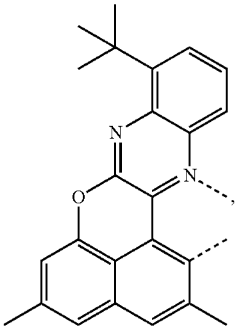
$L_{a682}$
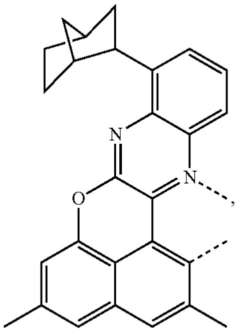
$L_{a683}$
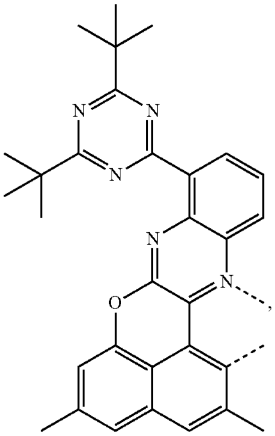
$L_{a684}$
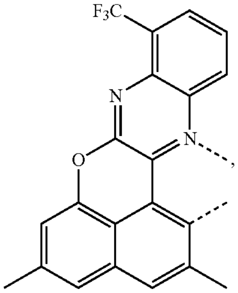

-continued
$L_{a685}$
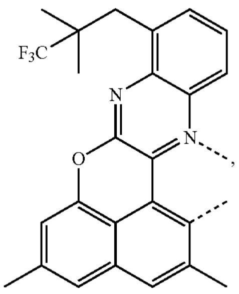
$L_{a686}$
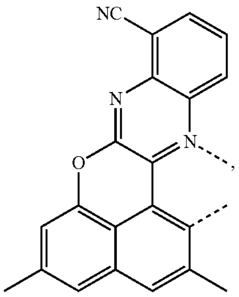
$L_{a687}$
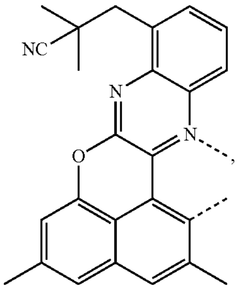
$L_{a688}$
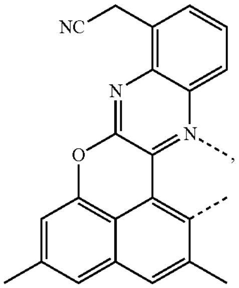
$L_{a689}$
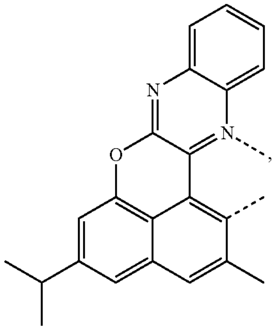
-continued
$L_{a690}$
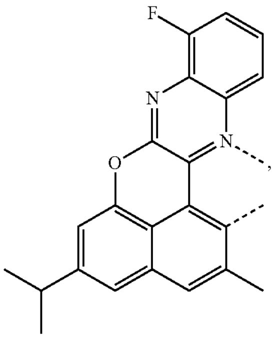
$L_{a691}$
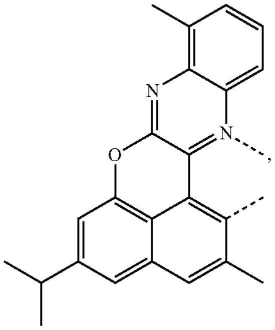
$L_{a692}$
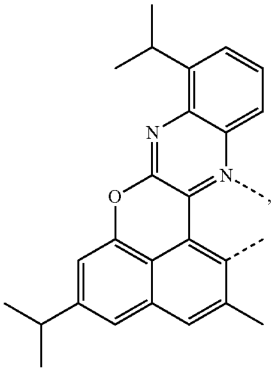
$L_{a693}$
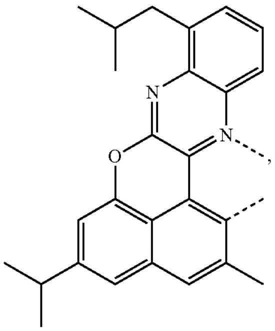

-continued
$L_{a694}$
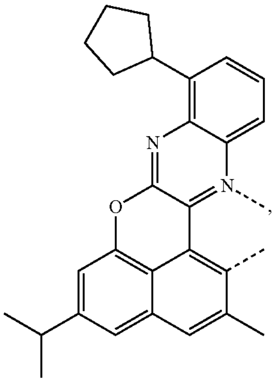
$L_{a695}$
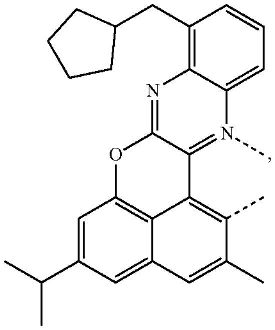
$L_{a696}$
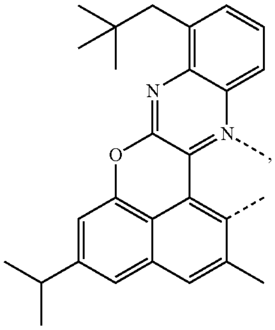
$L_{a697}$
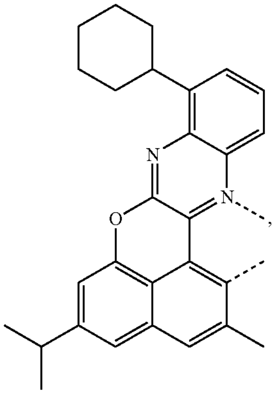
-continued
$L_{a698}$
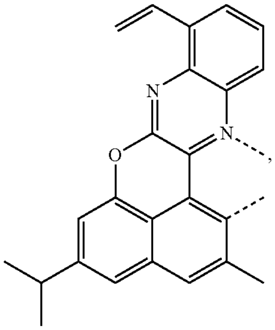
$L_{a699}$
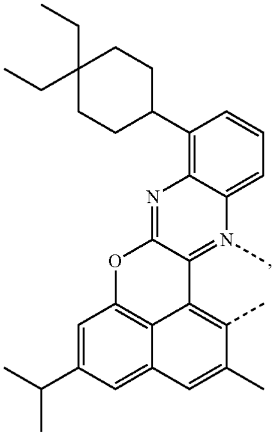
$L_{a700}$
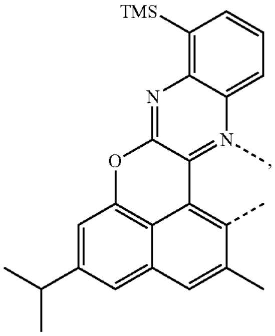
$L_{a701}$
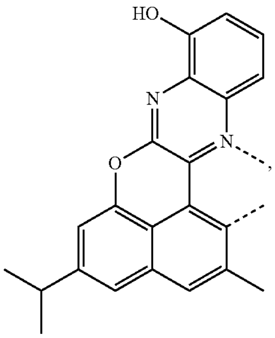

-continued
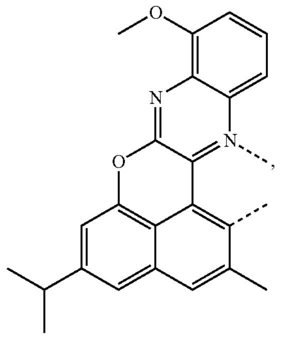
$L_{a702}$
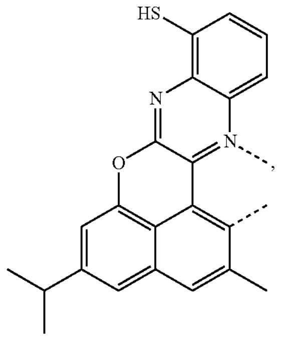
$L_{a703}$
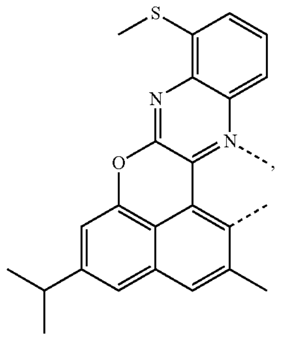
$L_{a704}$
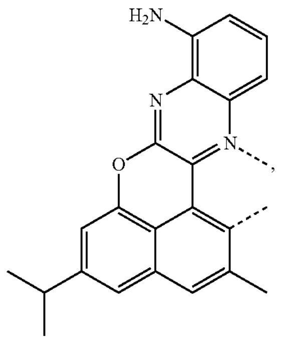
$L_{a705}$
-continued
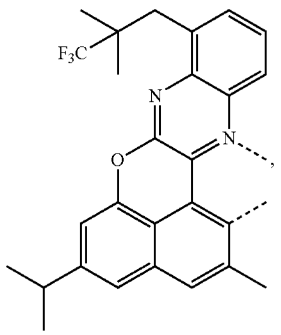
$L_{a706}$
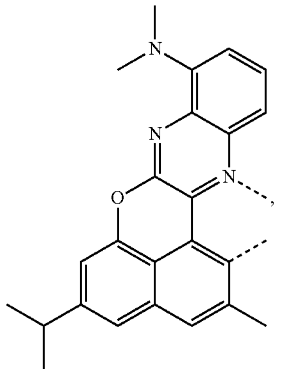
$L_{a707}$
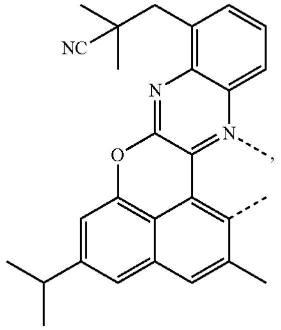
$L_{a708}$
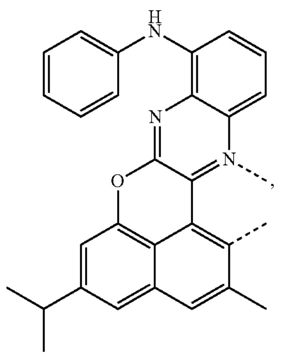
$L_{a709}$ -continued
L$_{a710}$
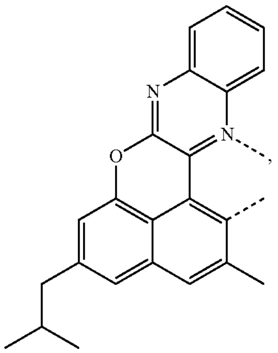
L$_{a711}$
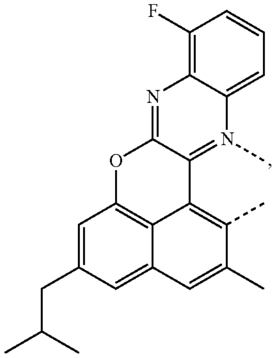
L$_{a712}$
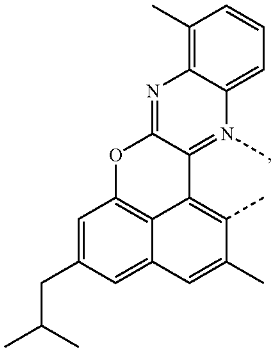
L$_{a713}$
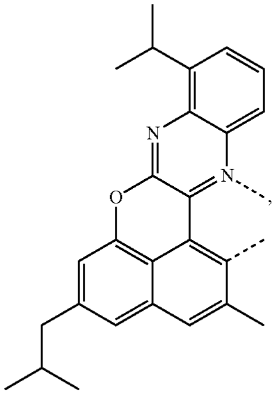
-continued
L$_{a714}$
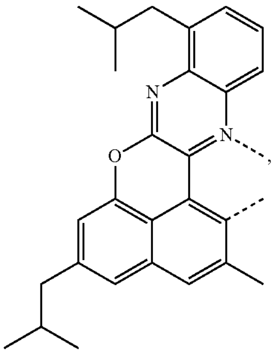
L$_{a715}$
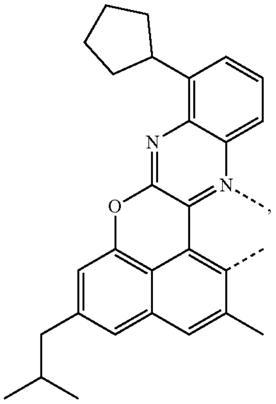
L$_{a716}$
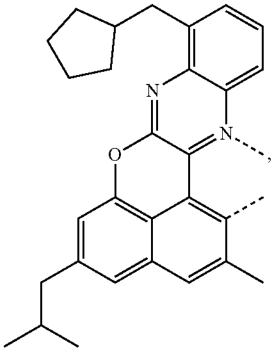
L$_{a717}$
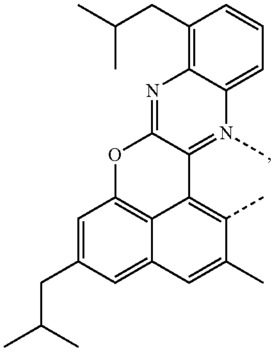

-continued
$L_{a718}$
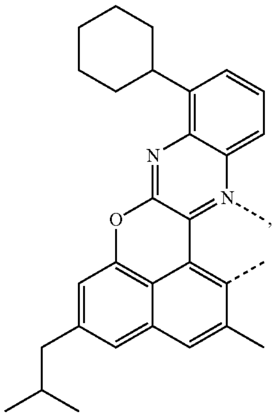
$L_{a719}$
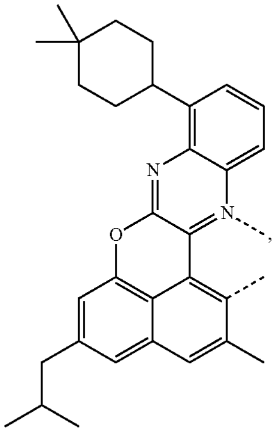
$L_{a720}$
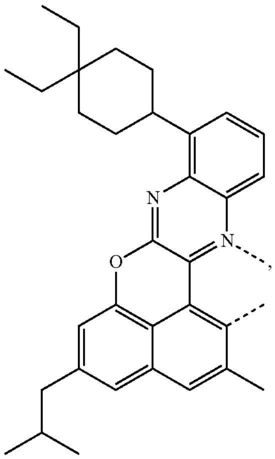
-continued
$L_{a721}$
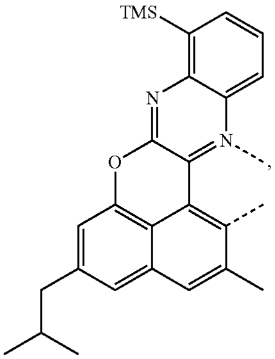
$L_{a722}$
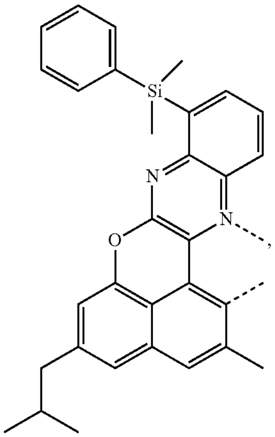
$L_{a723}$
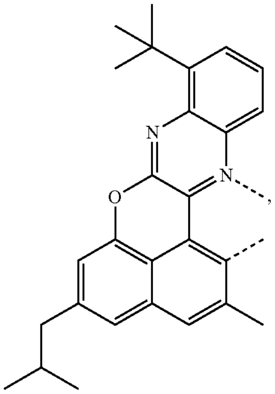
$L_{a724}$
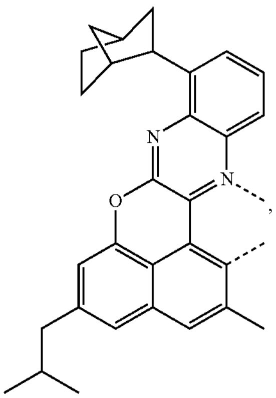

-continued
$L_{a725}$
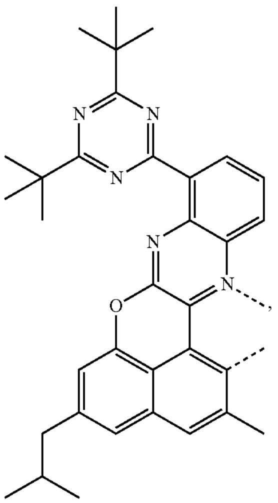
$L_{a726}$
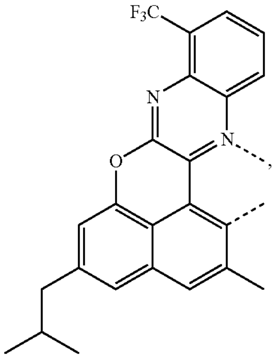
$L_{a727}$
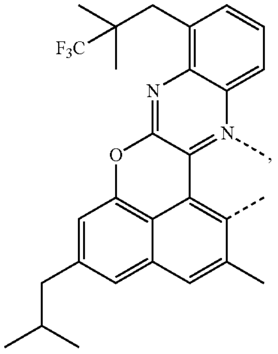
$L_{a728}$
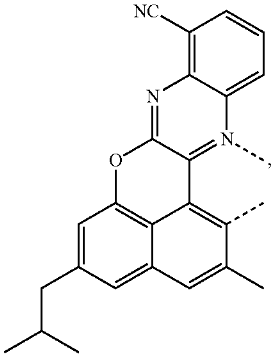
-continued
$L_{a729}$
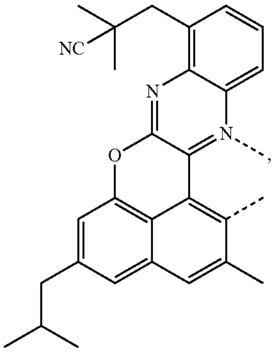
$L_{a730}$
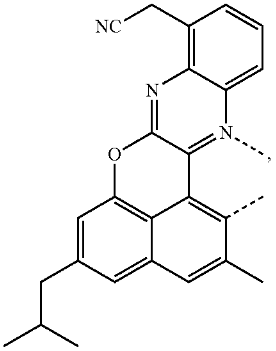
$L_{a731}$
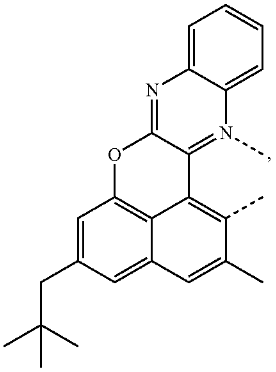
$L_{a732}$
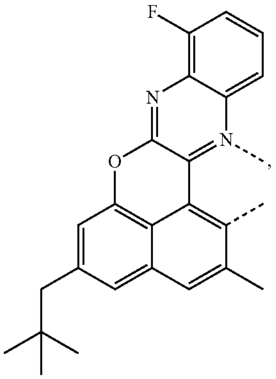

-continued
L$_{a733}$
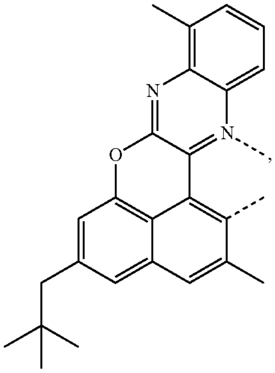
L$_{a734}$
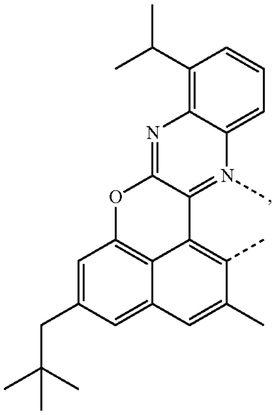
L$_{a735}$
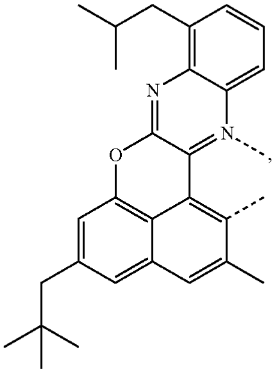
L$_{a736}$
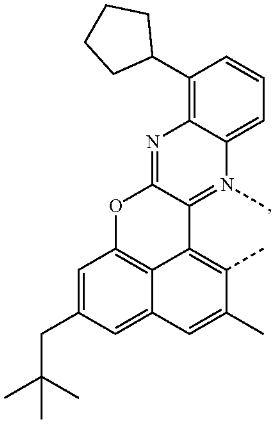
-continued
L$_{a737}$
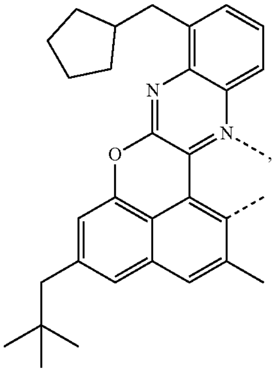
L$_{a738}$
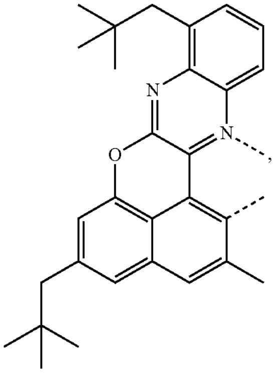
L$_{a739}$
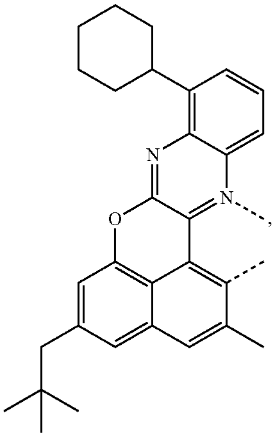
L$_{a740}$
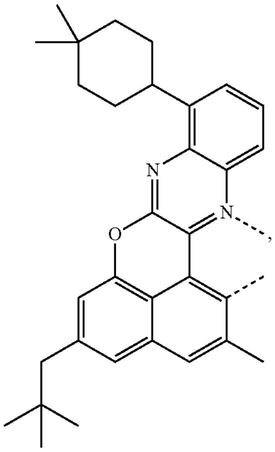

-continued
$L_{a741}$
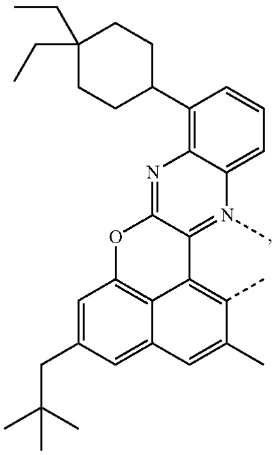
$L_{a742}$
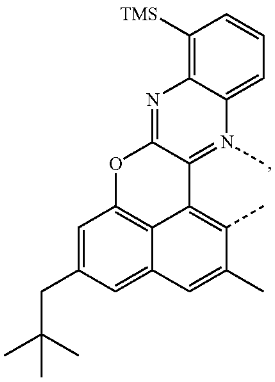
$L_{a743}$
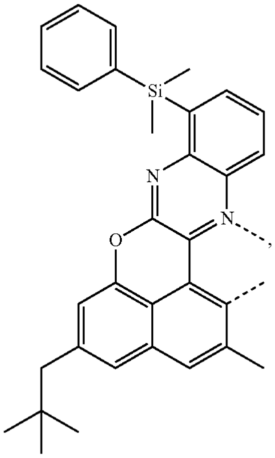
-continued
$L_{a744}$
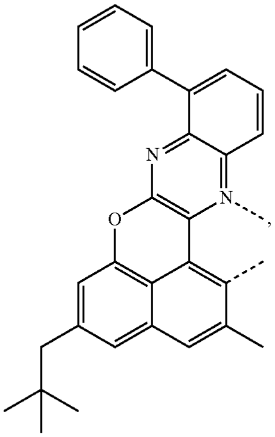
$L_{a745}$
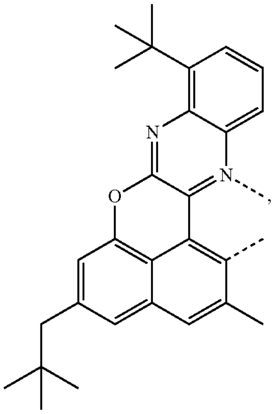
$L_{a746}$
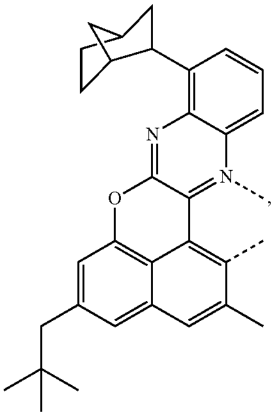

-continued
L$_{a747}$
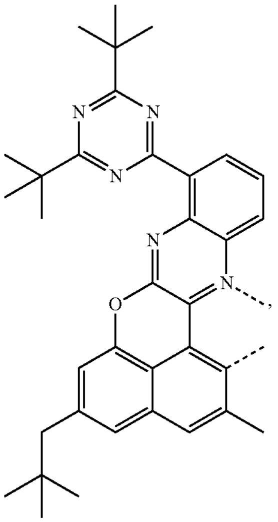
L$_{a748}$
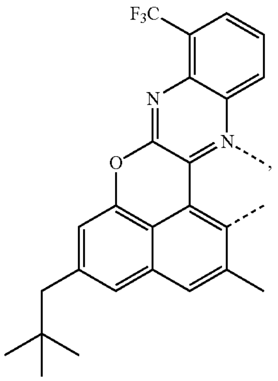
L$_{a749}$
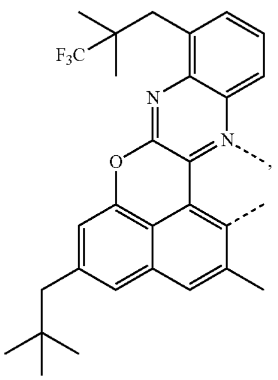
-continued
L$_{a750}$
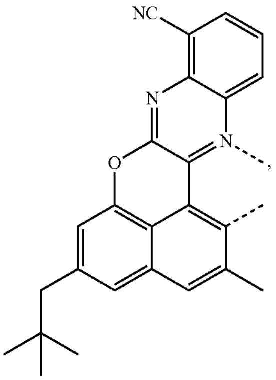
L$_{a751}$
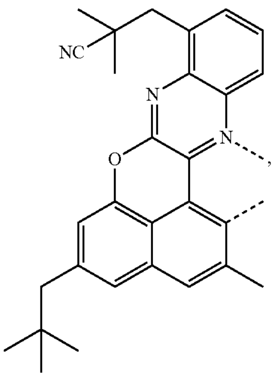
L$_{a752}$
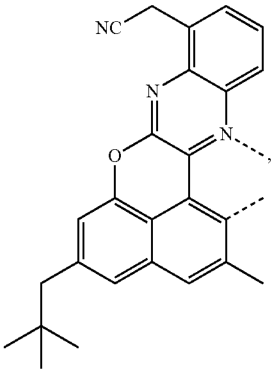
L$_{a753}$
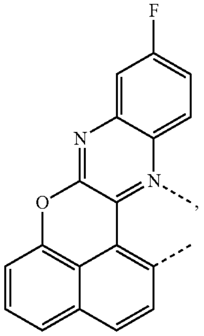

-continued
$L_{a754}$
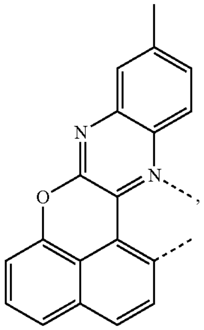
$L_{a755}$
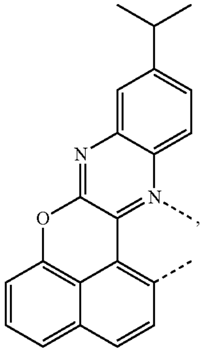
$L_{a756}$
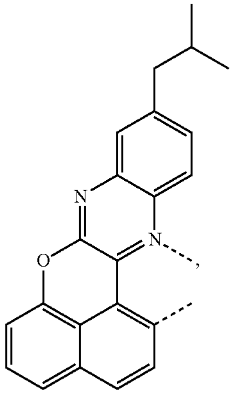
$L_{a757}$
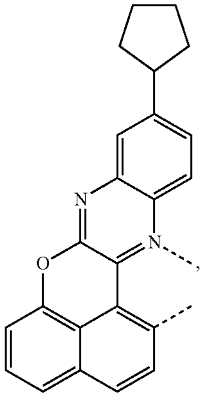
-continued
$L_{a758}$
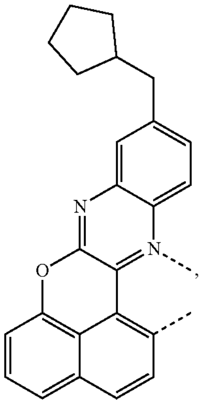
$L_{a759}$
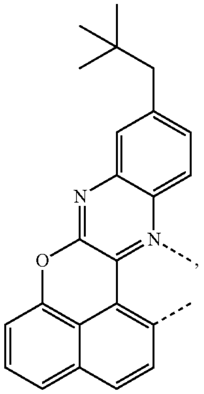
$L_{a760}$
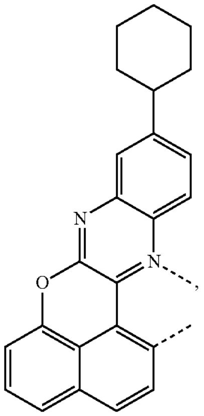
$L_{a761}$
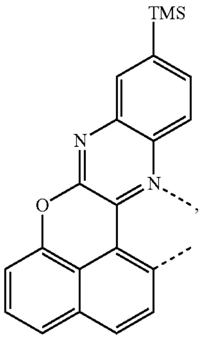

L$_{a762}$
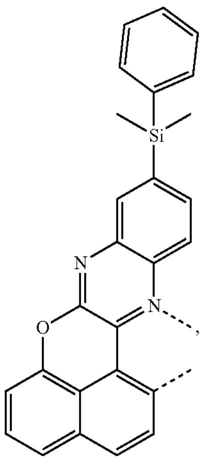
L$_{a763}$
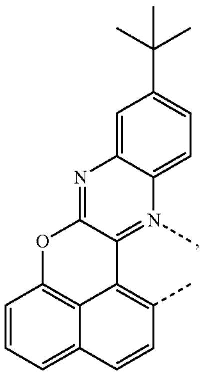
L$_{a764}$
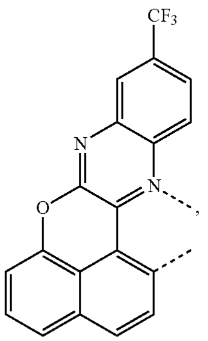
L$_{a765}$
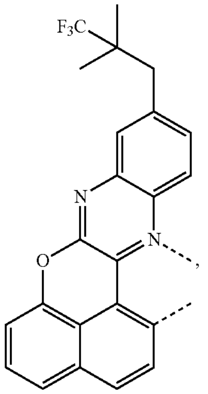
L$_{a766}$
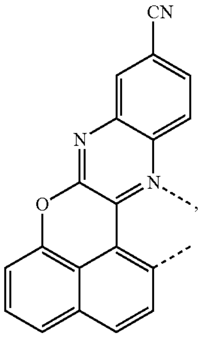
L$_{a767}$
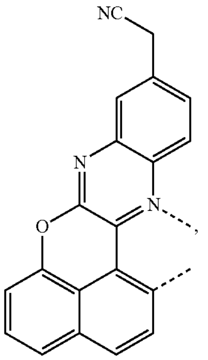
L$_{a768}$
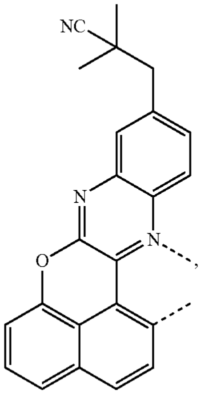
L$_{a769}$
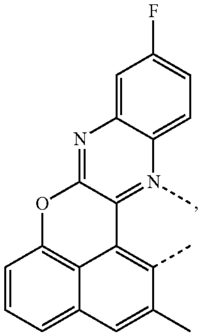

-continued
$L_{a770}$
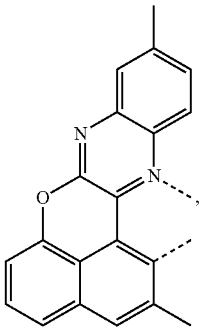
$L_{a771}$
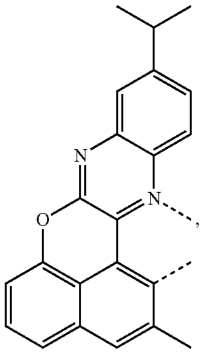
$L_{a772}$
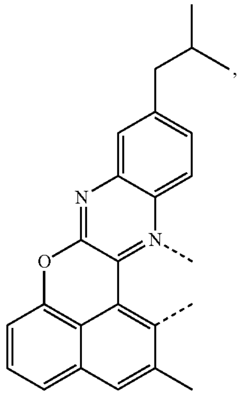
$L_{a773}$
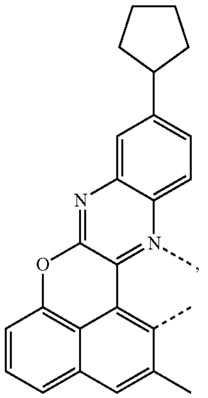
-continued
$L_{a774}$
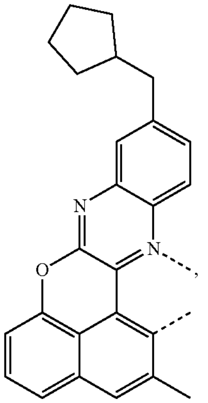
$L_{a775}$
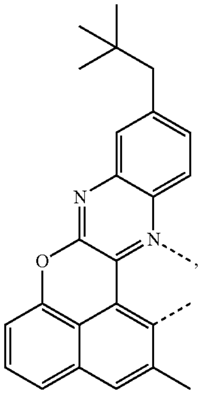
$L_{a776}$
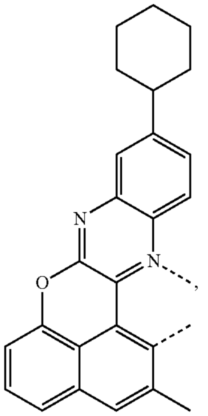
$L_{a777}$
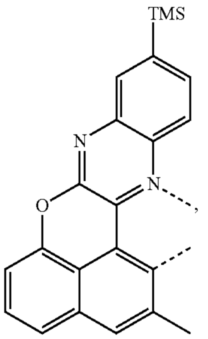

-continued
$L_{a778}$
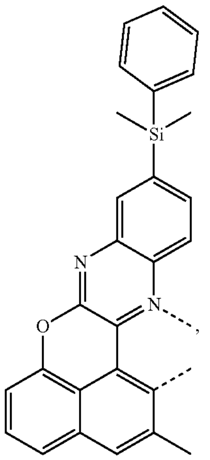
$L_{a779}$
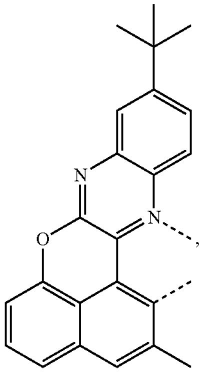
$L_{a780}$
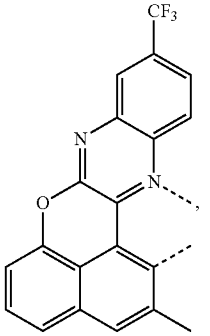
$L_{a781}$
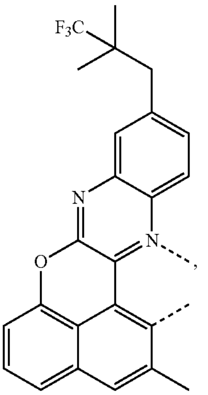
-continued
$L_{a782}$
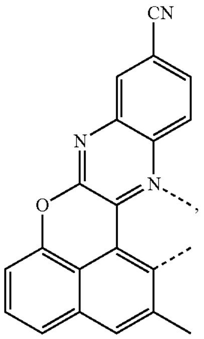
$L_{a783}$
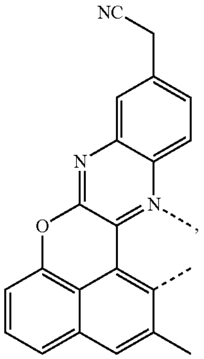
$L_{a784}$
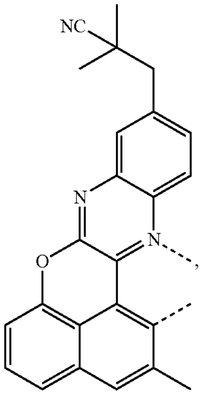
$L_{a785}$
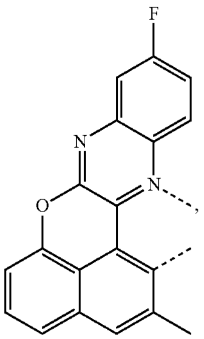

-continued
$L_{a786}$
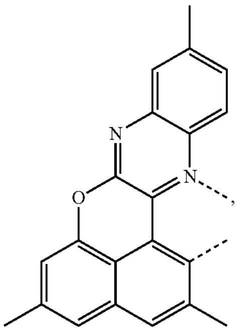
$L_{a786}$
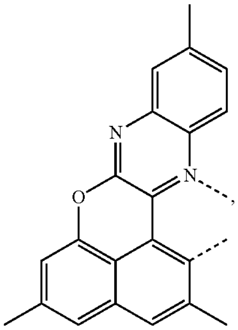
$L_{a787}$
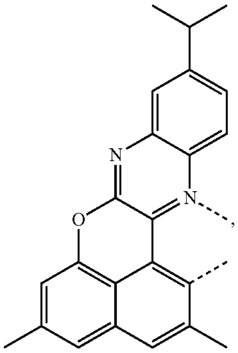
$L_{a788}$
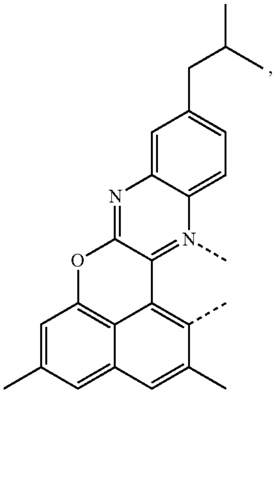
-continued
$L_{a789}$
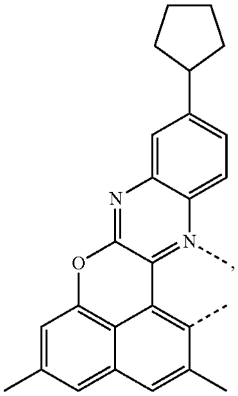
$L_{a790}$
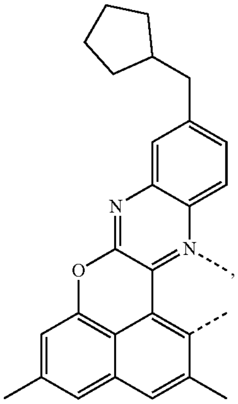
$L_{a791}$
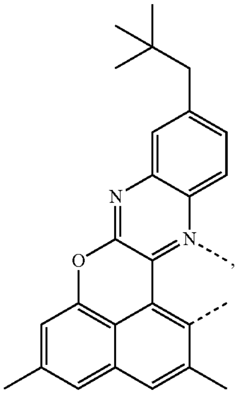
$L_{a792}$
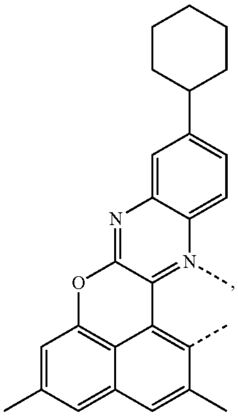

-continued
$L_{a793}$
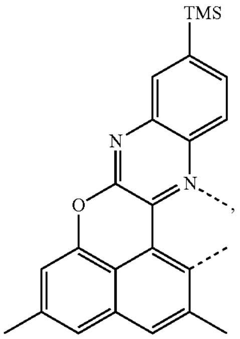
$L_{a794}$
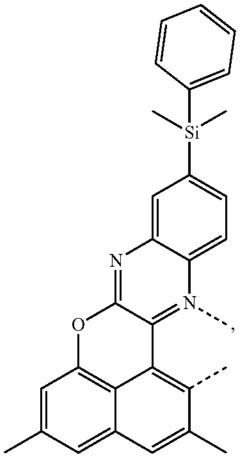
$L_{a795}$
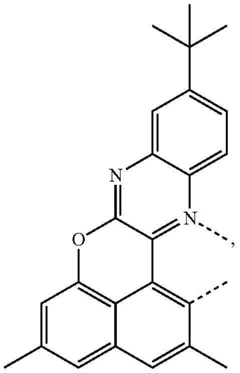
$L_{a796}$
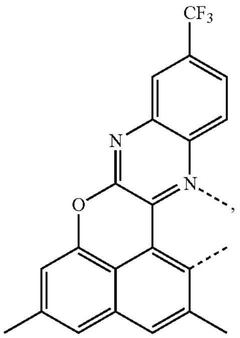
-continued
$L_{a797}$
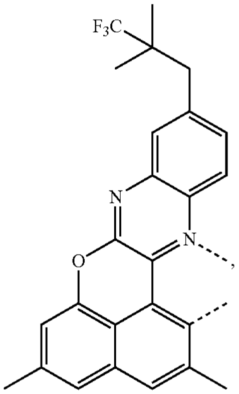
$L_{a798}$
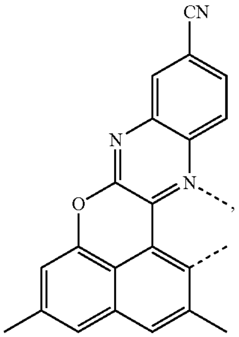
$L_{a799}$
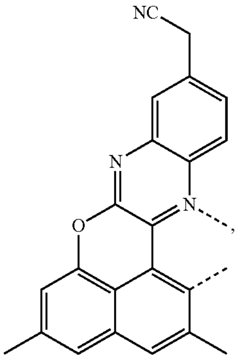
$L_{a800}$
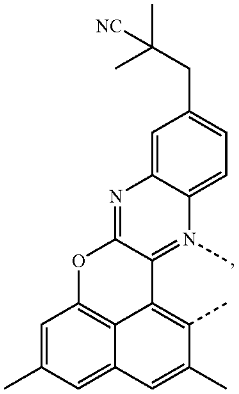

-continued
$L_{a801}$
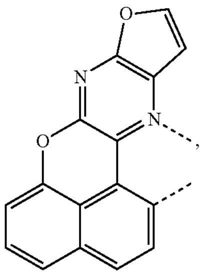
$L_{a802}$
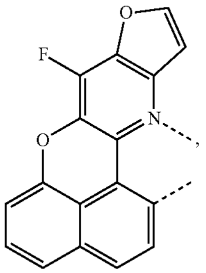
$L_{a803}$
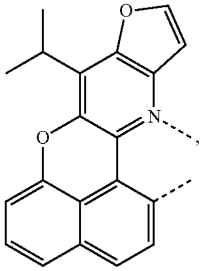
$L_{a804}$
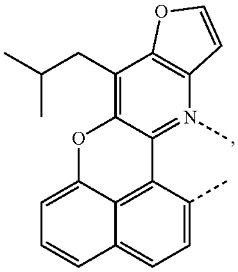
$L_{a805}$
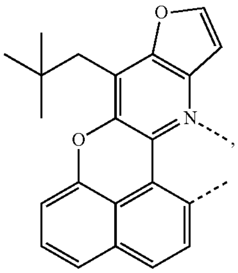
-continued
$L_{a806}$
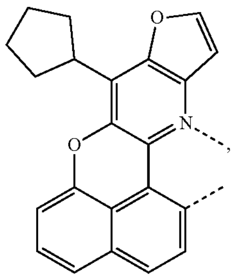
$L_{a807}$
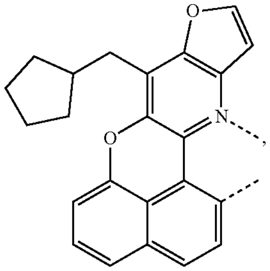
$L_{a808}$
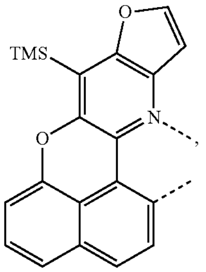
$L_{a809}$
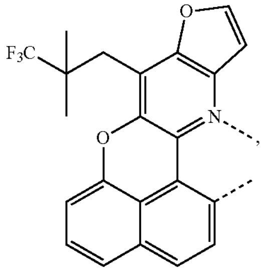
$L_{a810}$
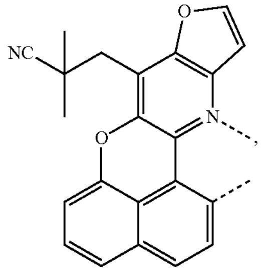

-continued
$L_{a811}$
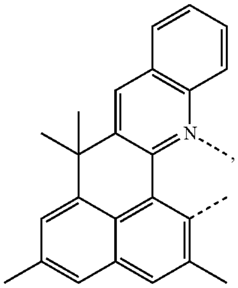
$L_{a812}$
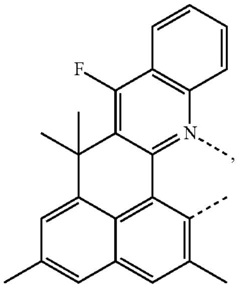
$L_{a813}$
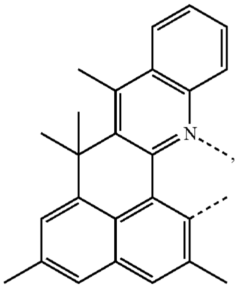
$L_{a814}$
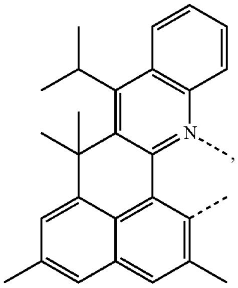
$L_{a815}$
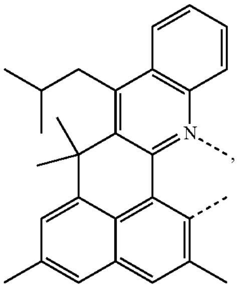
-continued
$L_{a816}$
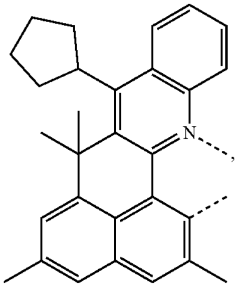
$L_{a817}$
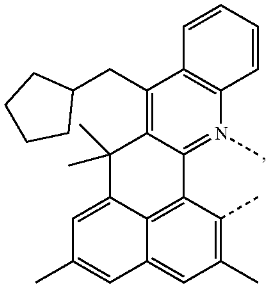
$L_{a818}$
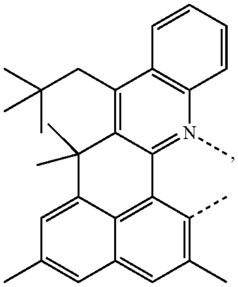
$L_{a819}$
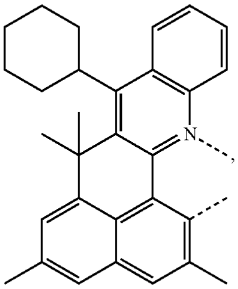
$L_{a820}$
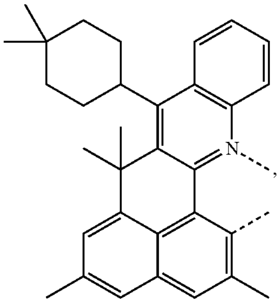

-continued
$L_{a821}$
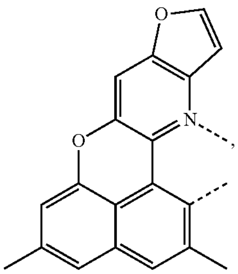
$L_{a822}$
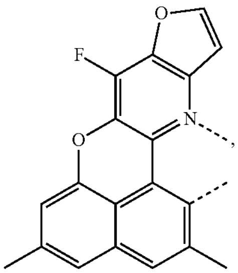
$L_{a823}$
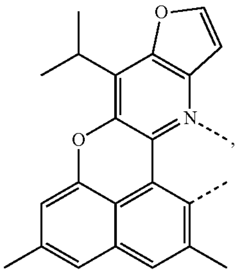
$L_{a824}$
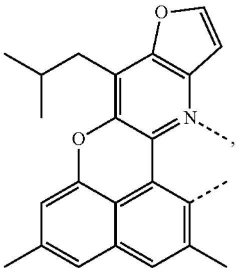
$L_{a825}$
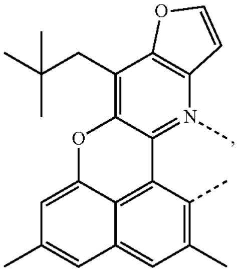
-continued
$L_{a826}$
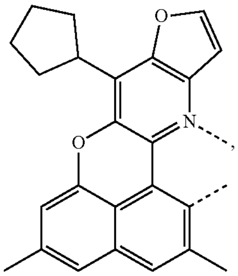
$L_{a827}$
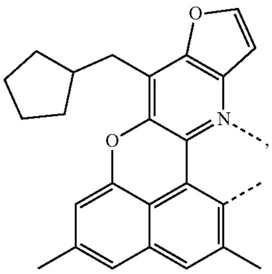
$L_{a828}$
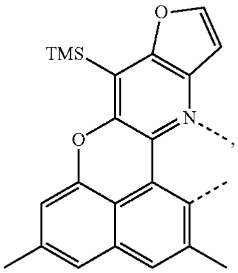
$L_{a829}$
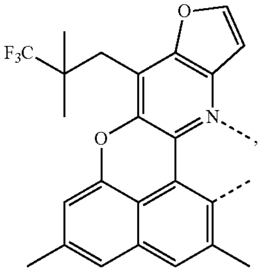
$L_{a830}$
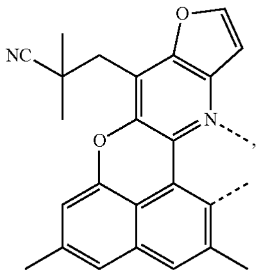

-continued
$L_{a831}$
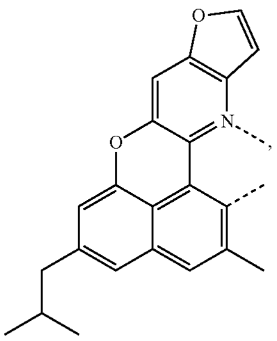
$L_{a832}$
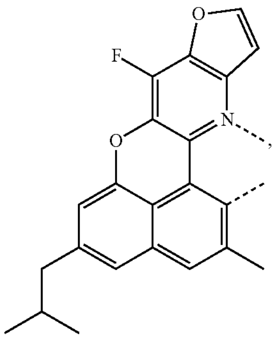
$L_{a833}$
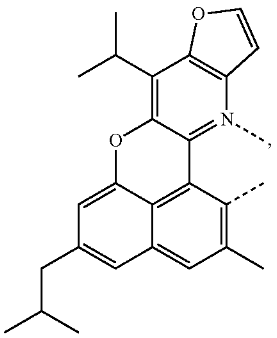
$L_{a834}$
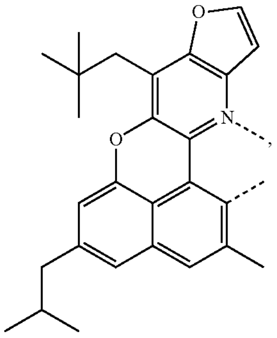
-continued
$L_{a835}$
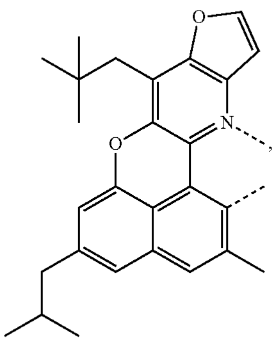
$L_{a836}$
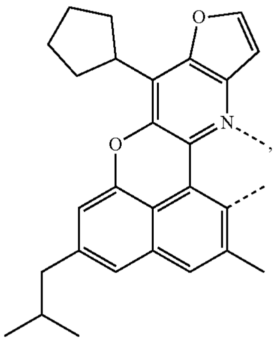
$L_{a837}$
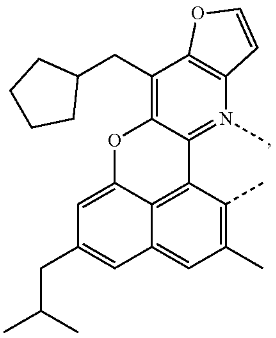
$L_{a838}$
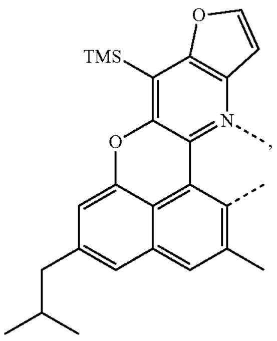

-continued
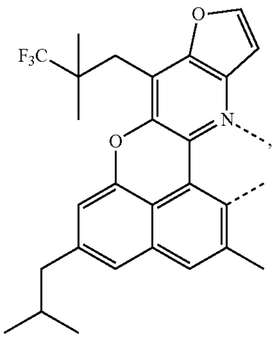
$L_{a839}$
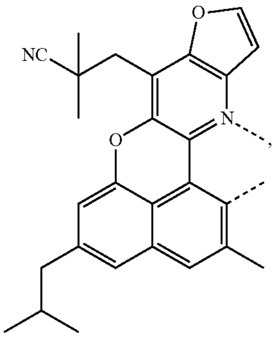
$L_{a840}$
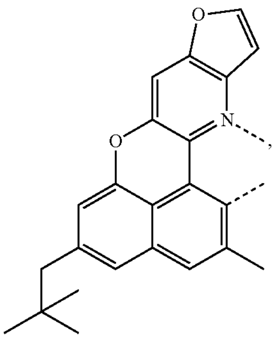
$L_{a841}$
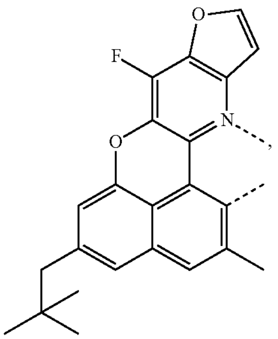
$L_{a842}$
-continued
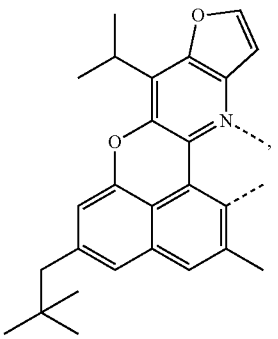
$L_{a843}$
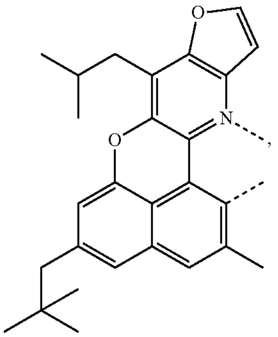
$L_{a844}$
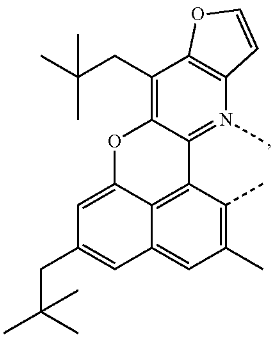
$L_{a845}$
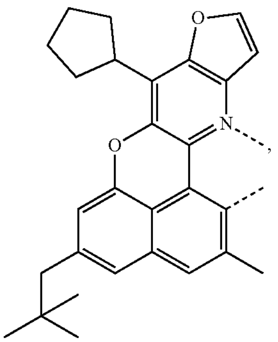
$L_{a846}$ -continued
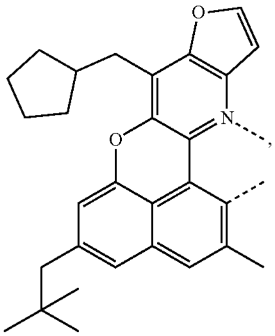
$L_{a847}$
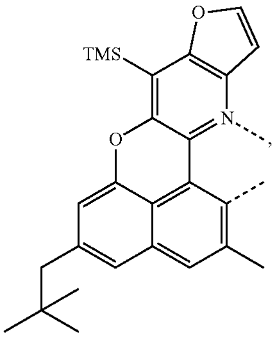
$L_{a848}$
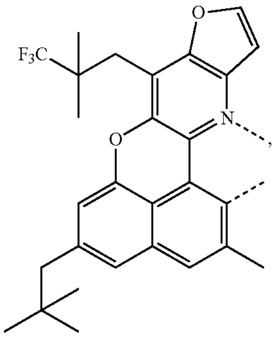
$L_{a849}$
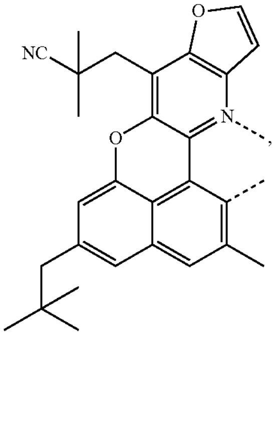
$L_{a850}$
-continued
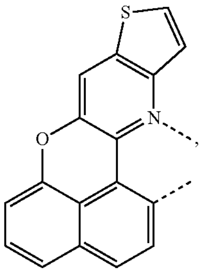
$L_{a851}$
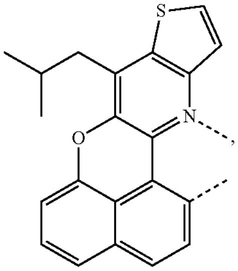
$L_{a852}$
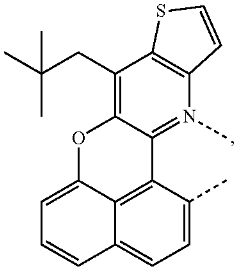
$L_{a853}$
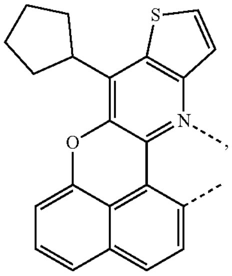
$L_{a854}$
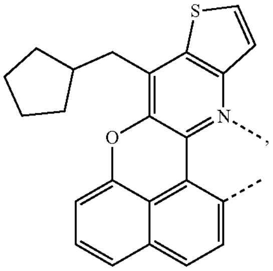
$L_{a855}$ -continued
$L_{a856}$
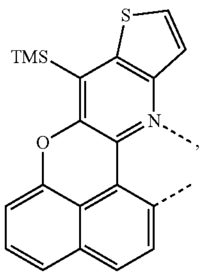
$L_{a857}$
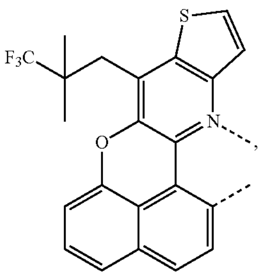
$L_{a858}$
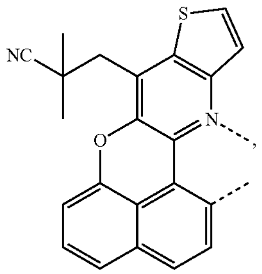
$L_{a859}$
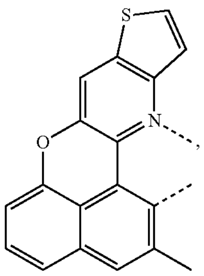
$L_{a860}$
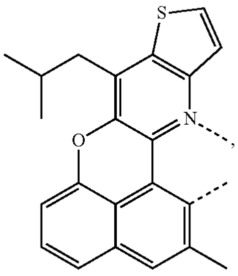
-continued
$L_{a861}$
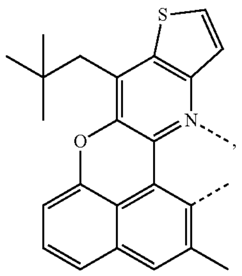
$L_{a862}$
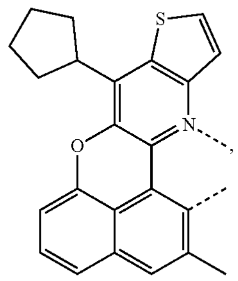
$L_{a863}$
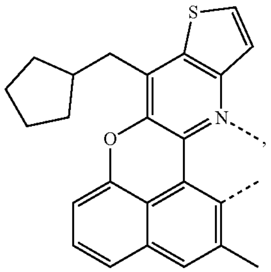
$L_{a864}$
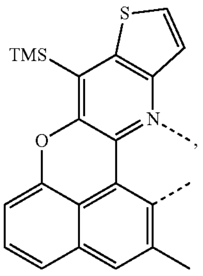
$L_{a865}$
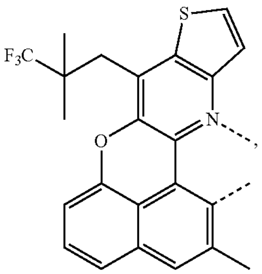

-continued
$L_{a866}$
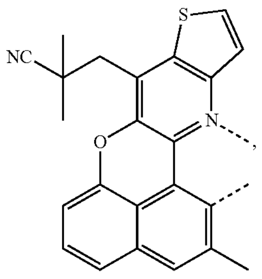
$L_{a867}$
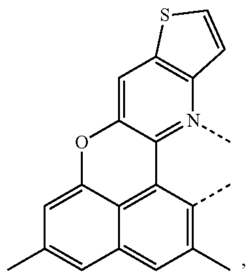
$L_{a868}$
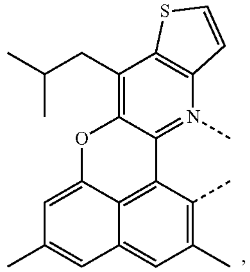
$L_{a869}$
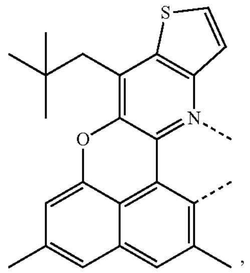
$L_{a870}$
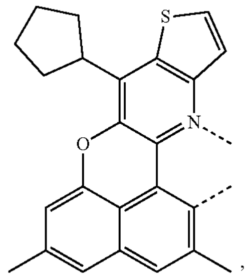
-continued
$L_{a871}$
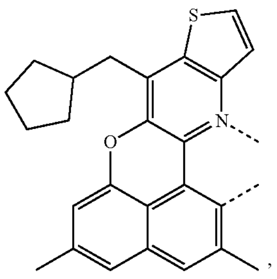
$L_{a872}$
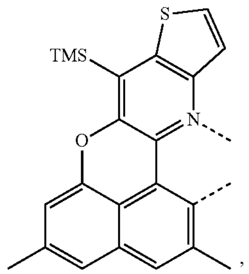
$L_{a873}$
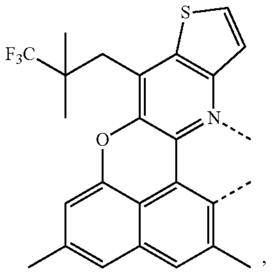
$L_{a874}$
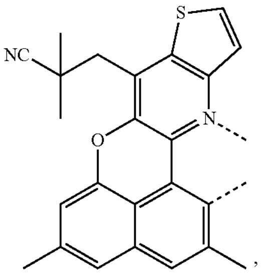
$L_{a875}$
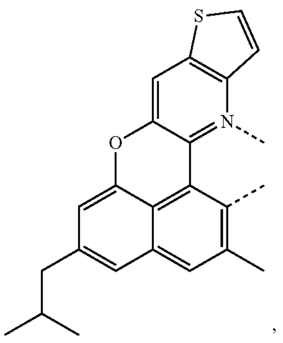

-continued
$L_{a876}$
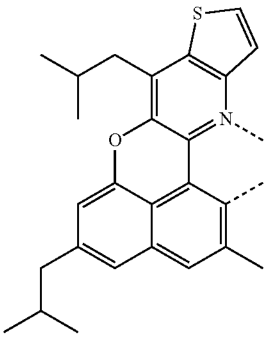
,
$L_{a877}$
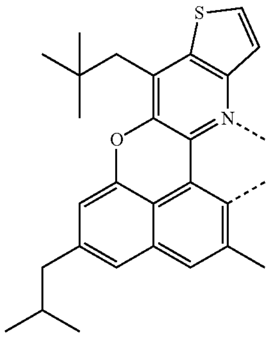
,
$L_{a878}$
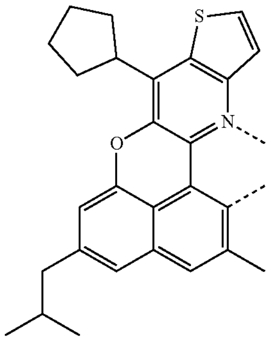
,
$L_{a879}$
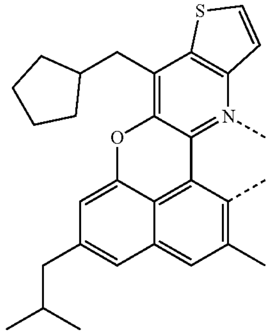
,
-continued
$L_{a880}$
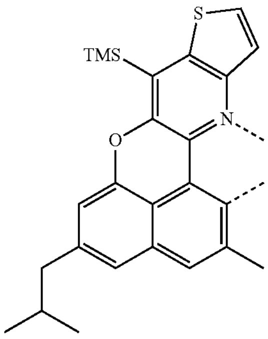
,
$L_{a881}$
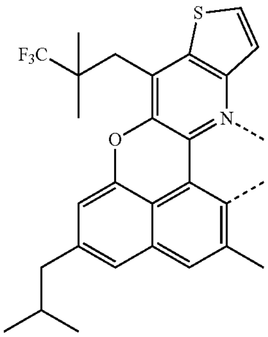
,
$L_{a882}$
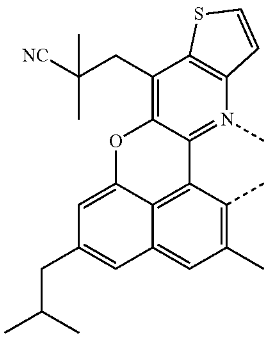
,
$L_{a883}$
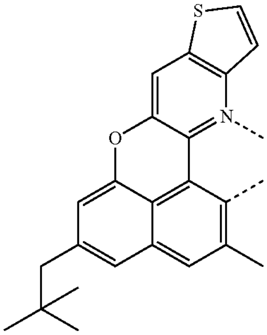
, -continued
$L_{a884}$
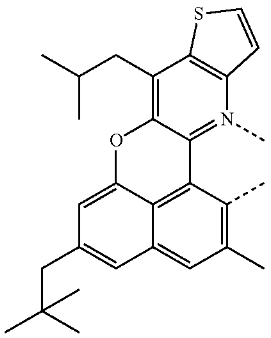
,
$L_{a885}$
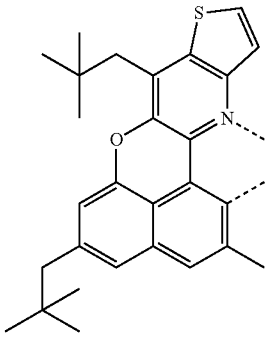
,
$L_{a886}$
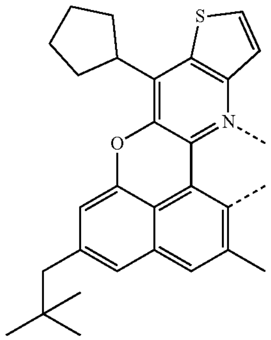
,
$L_{a887}$
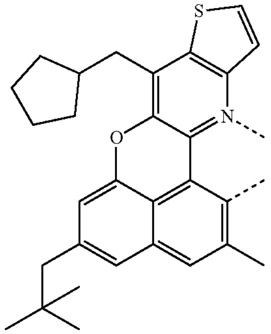
,
-continued
$L_{a888}$
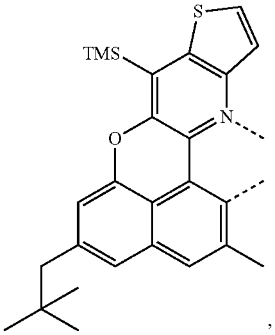
,
$L_{a889}$
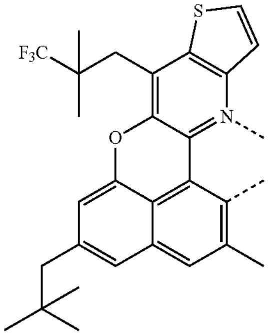
,
$L_{a890}$
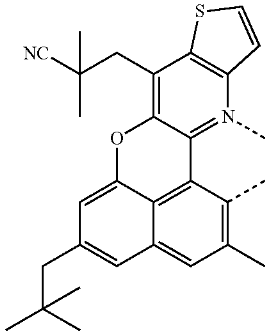
,
$L_{a891}$
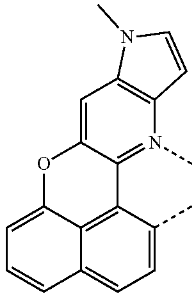
,
$L_{a892}$
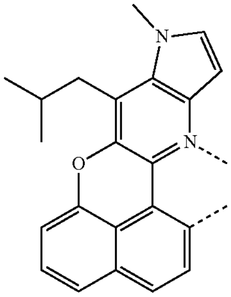
, -continued
$L_{a893}$
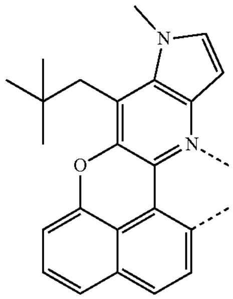
,
$L_{a894}$
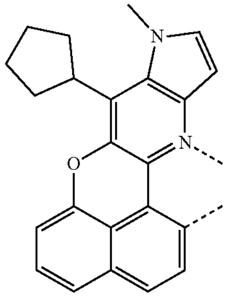
,
$L_{a895}$
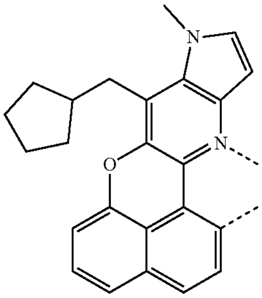
,
$L_{a896}$
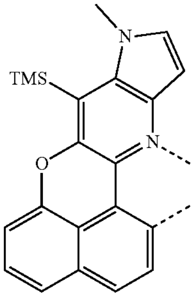
,
$L_{a897}$
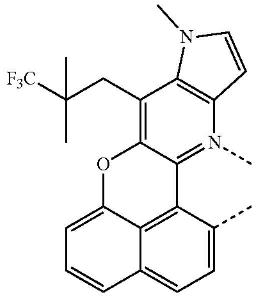
,
-continued
$L_{a898}$
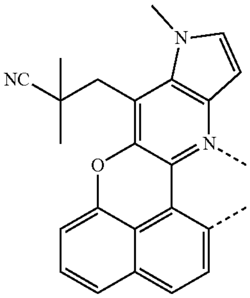
,
$L_{a899}$
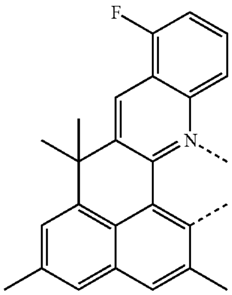
,
$L_{a900}$
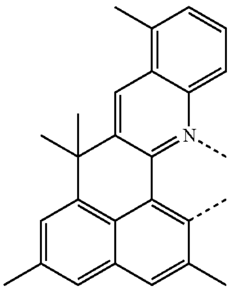
,
$L_{a901}$
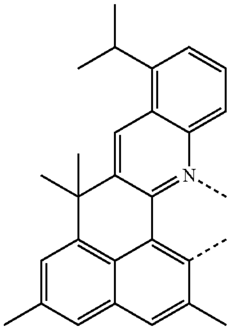
,
$L_{a902}$
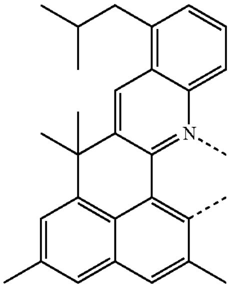
, -continued
$L_{a903}$
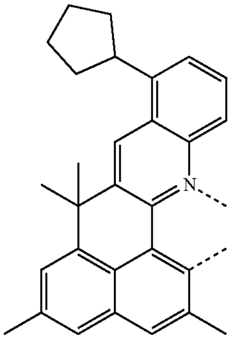
,
$L_{a904}$
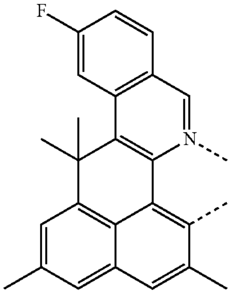
,
$L_{a905}$
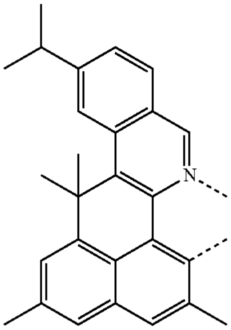
,
$L_{a906}$
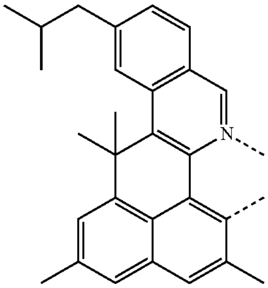
,
$L_{a907}$
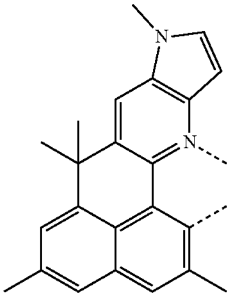
,
-continued
$L_{a908}$
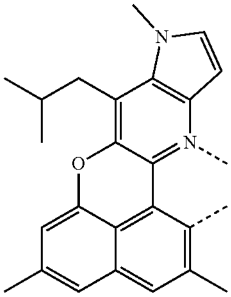
,
$L_{a909}$
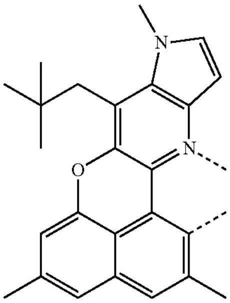
,
$L_{a910}$
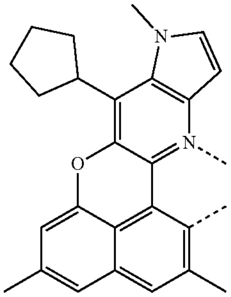
,
$L_{a911}$
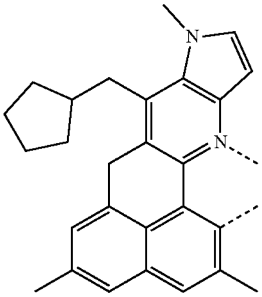
,
$L_{a912}$
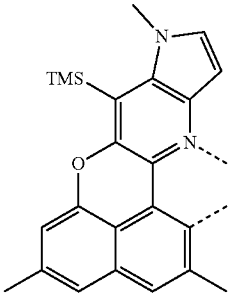
,

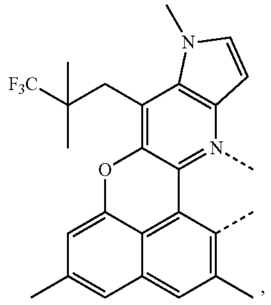
$L_{a913}$
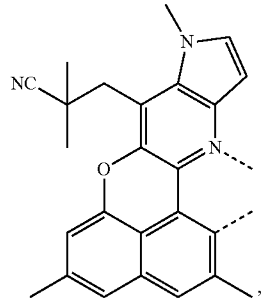
$L_{a914}$
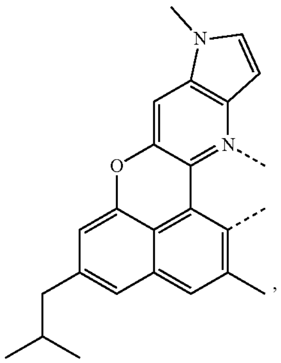
$L_{a915}$
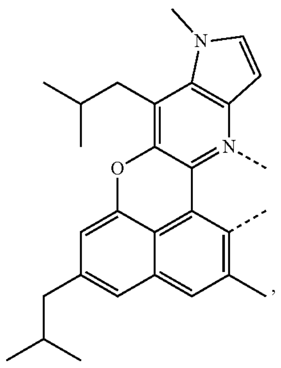
$L_{a916}$
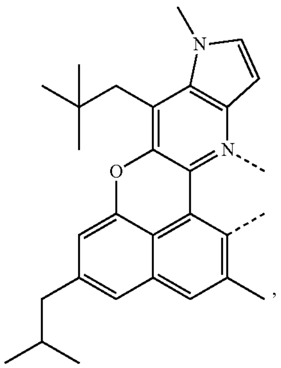
$L_{a917}$
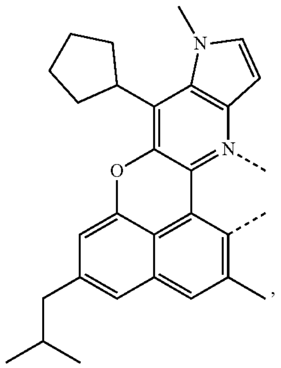
$L_{a918}$
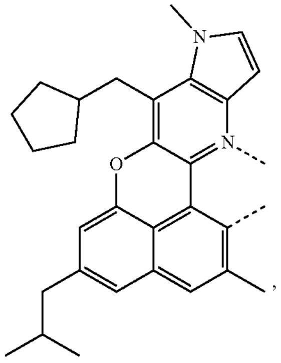
$L_{a919}$
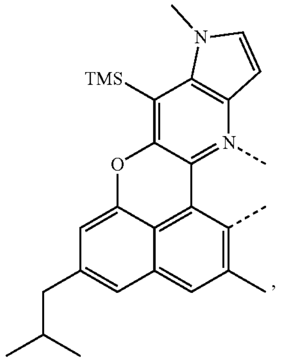
$L_{a920}$ -continued
$L_{a921}$
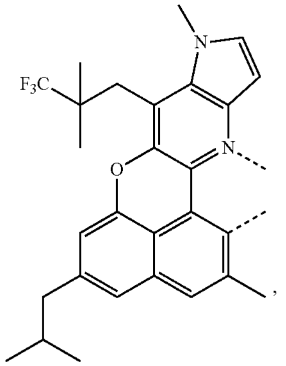
$L_{a922}$
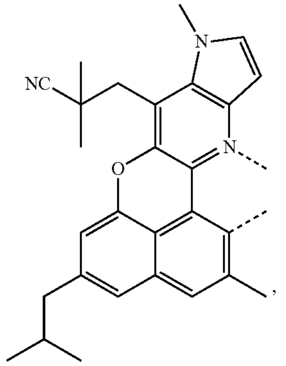
$L_{a923}$
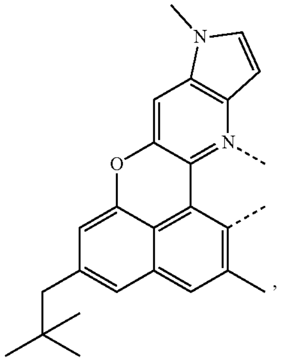
$L_{a924}$
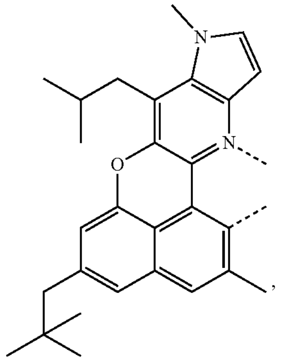
-continued
$L_{a925}$
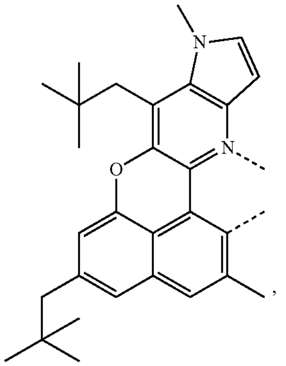
$L_{a926}$
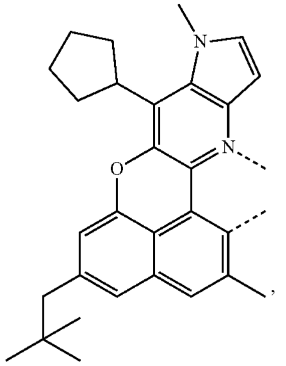
$L_{a927}$
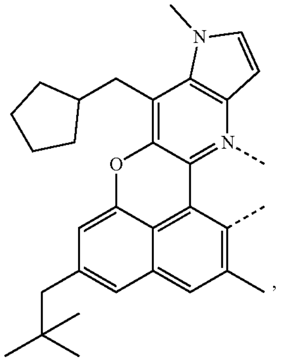
$L_{a928}$
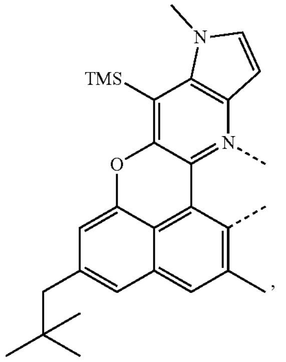

-continued
$L_{a929}$
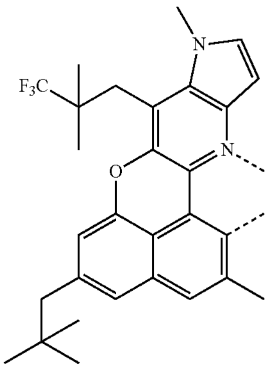
,
$L_{a930}$
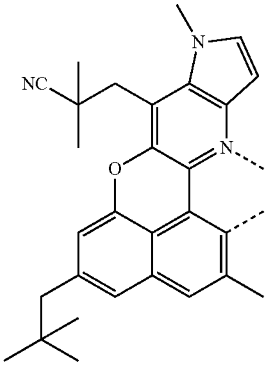
,
$L_{a931}$
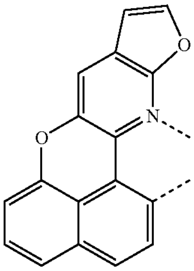
,
$L_{a932}$
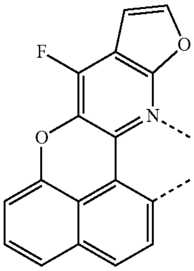
,
$L_{a933}$
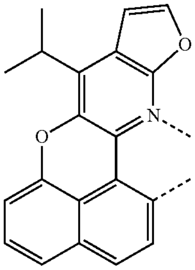
,
-continued
$L_{a934}$
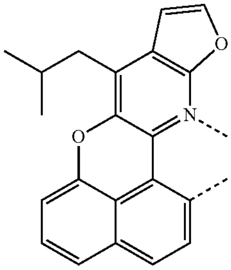
,
$L_{a935}$
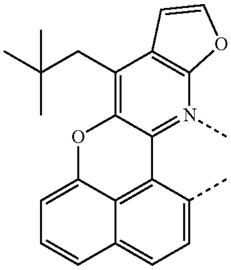
,
$L_{a936}$
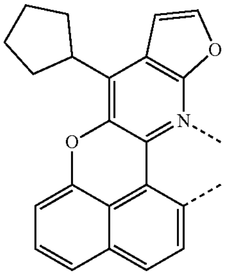
,
$L_{a937}$
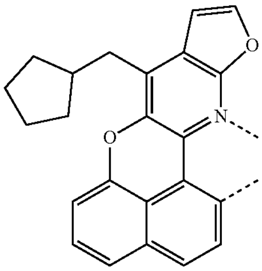
,
$L_{a938}$
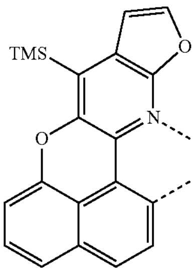
, -continued
$L_{a939}$
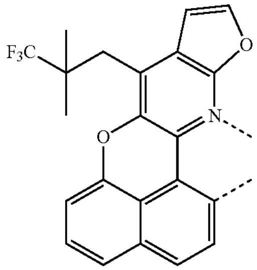
,
$L_{a940}$
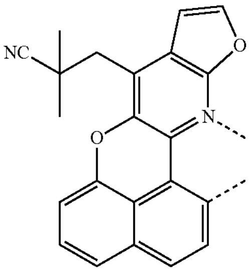
,
$L_{a941}$
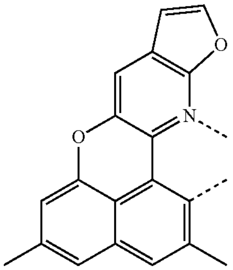
,
$L_{a942}$
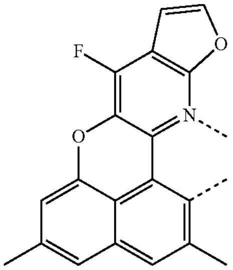
,
$L_{a943}$
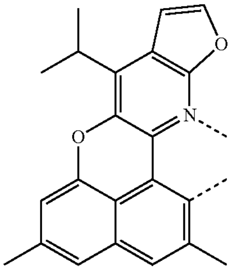
,
-continued
$L_{a944}$
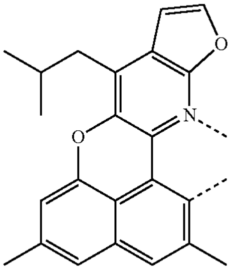
,
$L_{a945}$
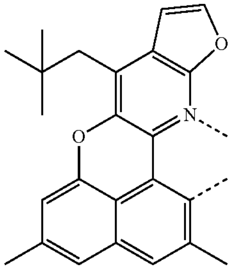
,
$L_{a946}$
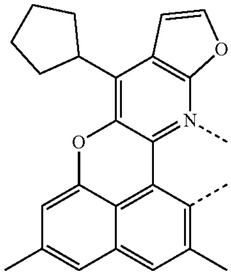
,
$L_{a947}$
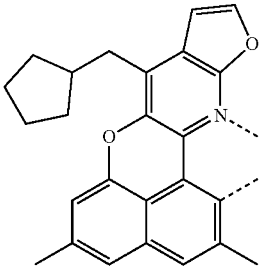
,
$L_{a948}$
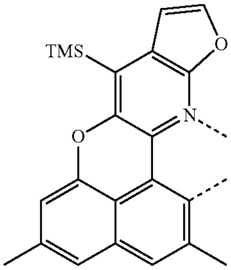
, -continued
$L_{a949}$
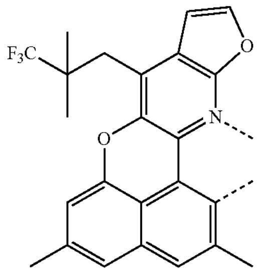
,
$L_{a950}$
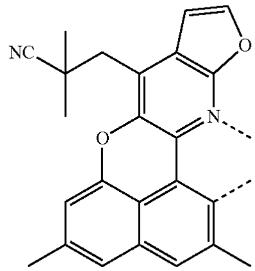
,
$L_{a951}$
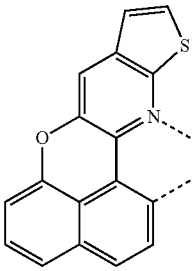
,
$L_{a952}$
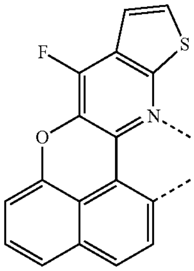
,
$L_{a953}$
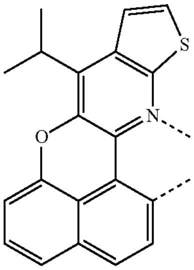
,
-continued
$L_{a954}$
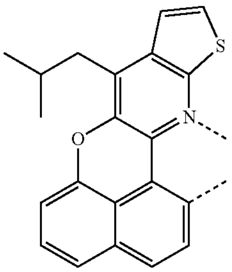
,
$L_{a955}$
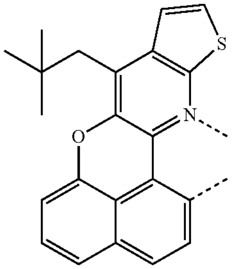
,
$L_{a956}$
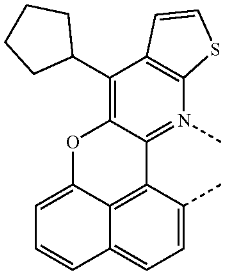
,
$L_{a957}$
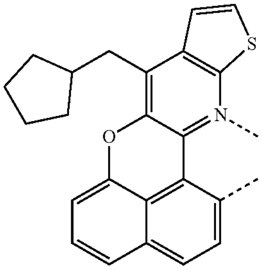
,
$L_{a958}$
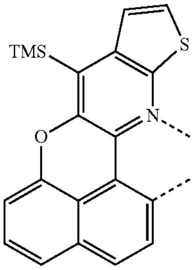
, -continued
$L_{a959}$
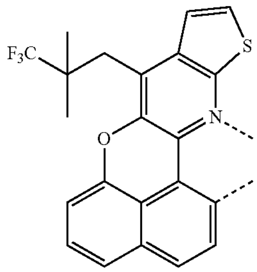
,
$L_{a960}$
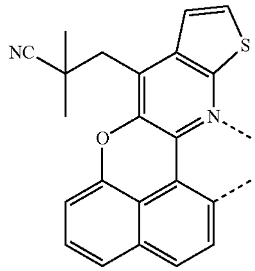
,
$L_{a961}$
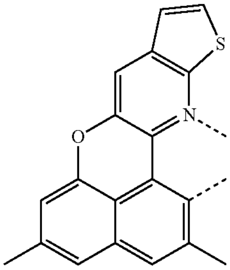
,
$L_{a962}$
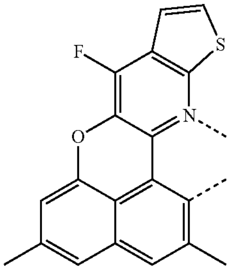
,
$L_{a963}$
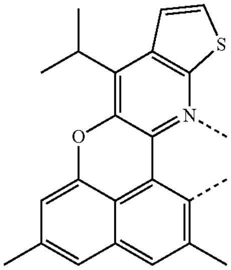
,
-continued
$L_{a964}$
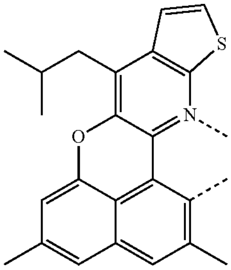
,
$L_{a965}$
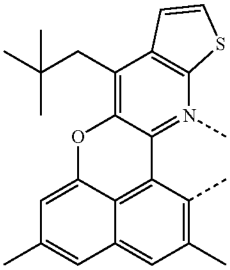
,
$L_{a966}$
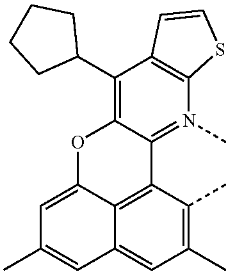
,
$L_{a967}$
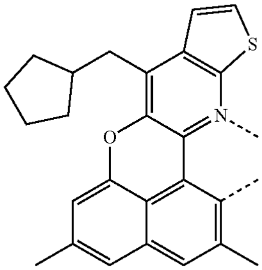
,
$L_{a968}$
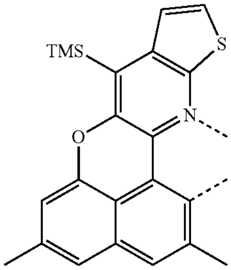
, -continued
$L_{a969}$
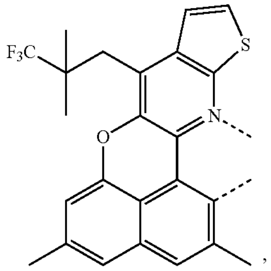
$L_{a970}$
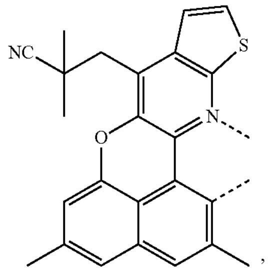
$L_{a971}$
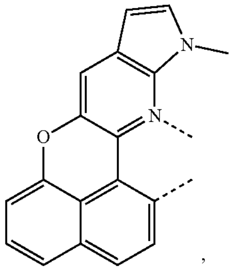
$L_{a972}$
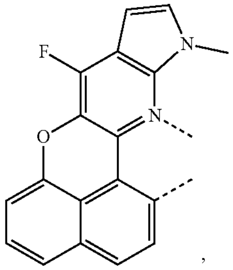
$L_{a973}$
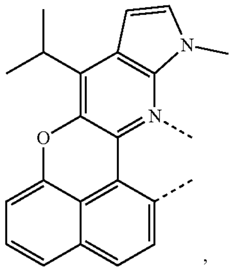
-continued
$L_{a974}$
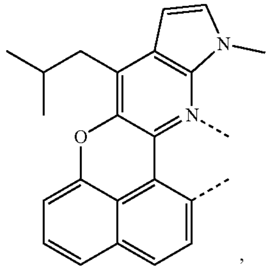
$L_{a975}$
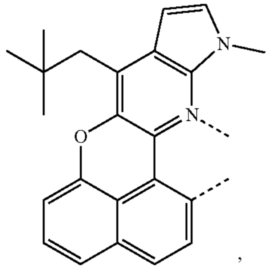
$L_{a976}$
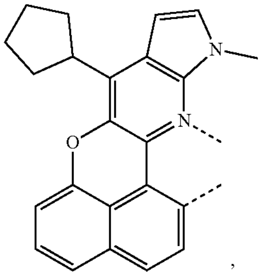
$L_{a977}$
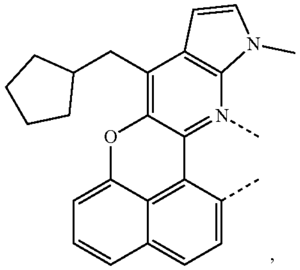
$L_{a978}$
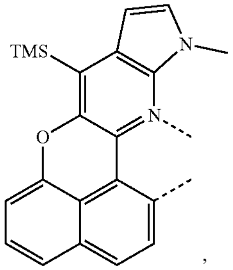

-continued
$L_{a979}$
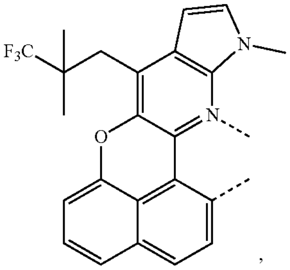
,
$L_{a980}$
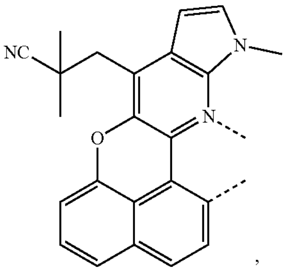
,
$L_{a981}$
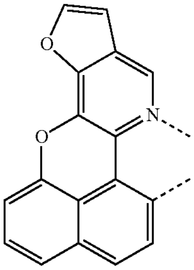
,
$L_{a982}$
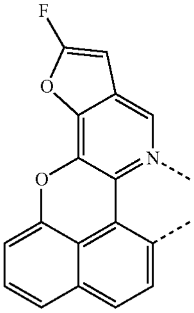
,
$L_{a983}$
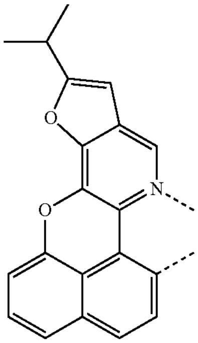
,
-continued
$L_{a984}$
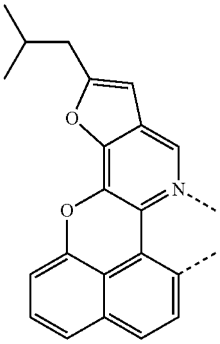
,
$L_{a985}$
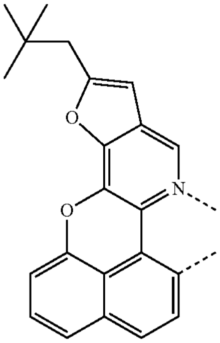
,
$L_{a986}$
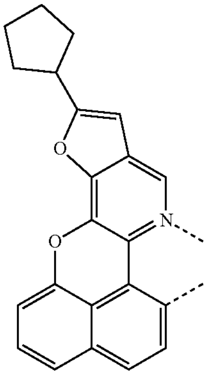
,
$L_{a987}$
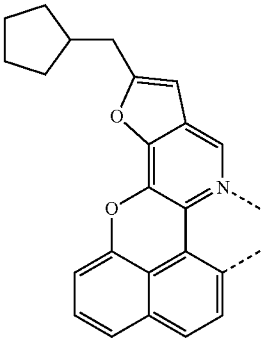
, -continued
$L_{a988}$
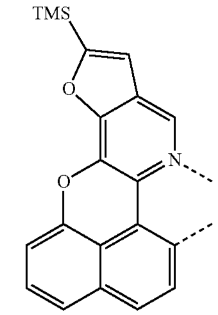
,
$L_{a989}$
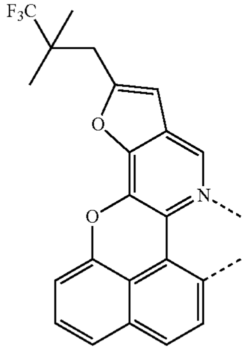
,
$L_{a990}$
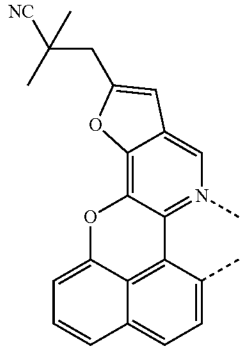
,
$L_{a991}$
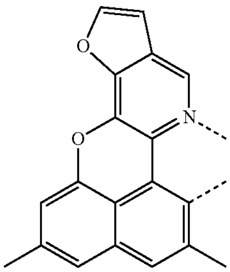
,
$L_{a992}$
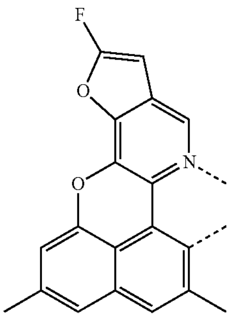
,
-continued
$L_{a993}$
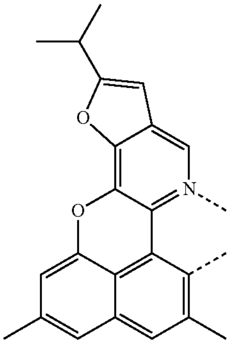
,
$L_{a994}$
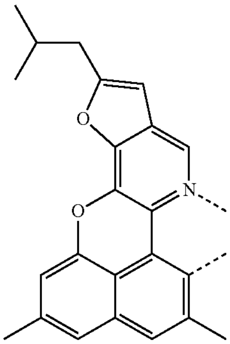
,
$L_{a995}$
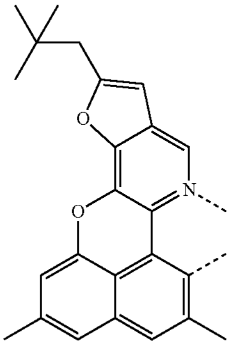
,
$L_{a996}$
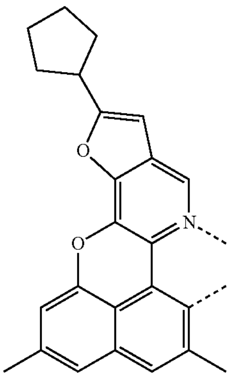
, -continued
$L_{a997}$
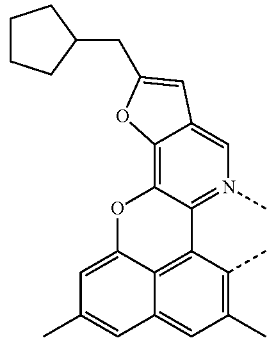
,
$L_{a998}$
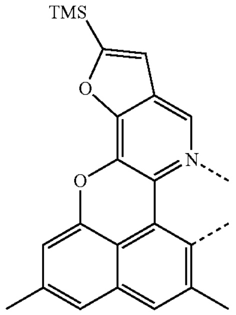
,
$L_{a999}$
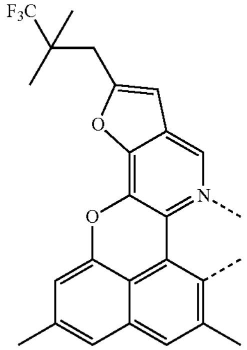
,
$L_{a1000}$
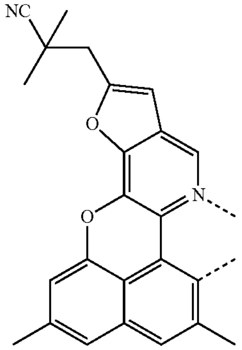
,
-continued
$L_{a1001}$
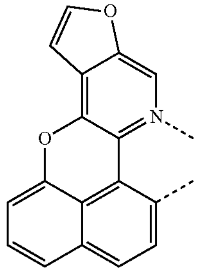
,
$L_{a1002}$
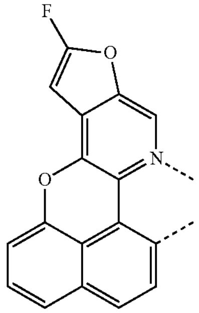
,
$L_{a1003}$
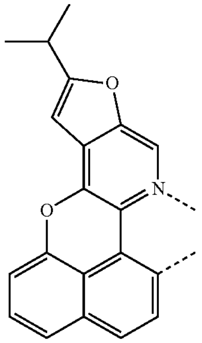
,
$L_{a1004}$
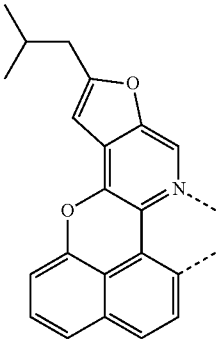
, -continued
$L_{a1005}$
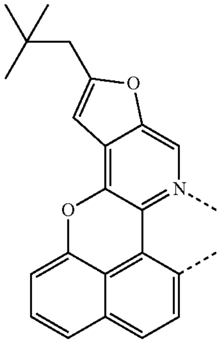
,
$L_{a1006}$
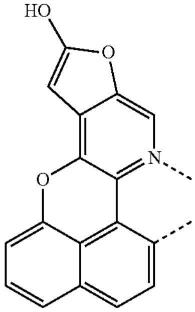
,
$L_{a1007}$
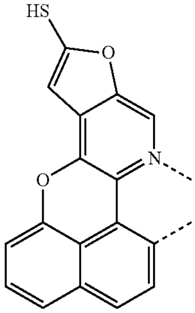
,
$L_{a1008}$
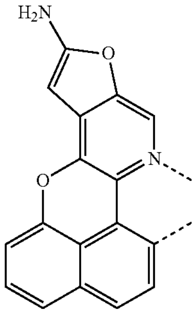
,
-continued
$L_{a1009}$
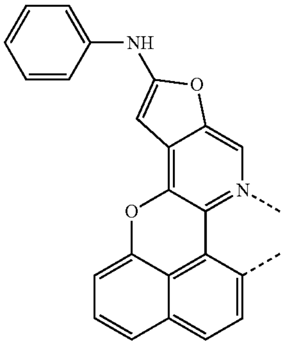
,
$L_{a1010}$
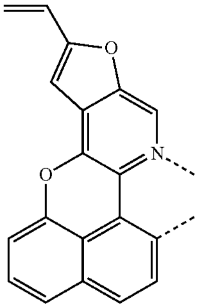
,
$L_{a1011}$
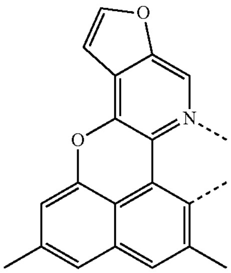
,
$L_{a1012}$
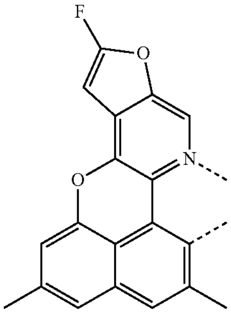
,
$L_{a1013}$
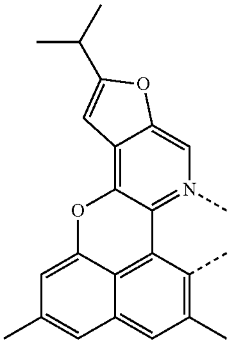
, -continued
$L_{a1014}$
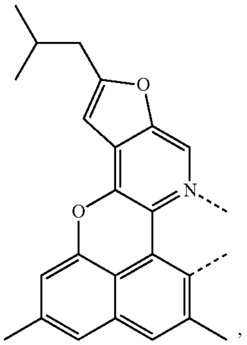
$L_{a1015}$
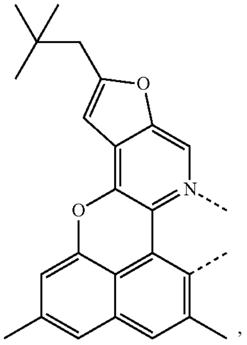
$L_{a1016}$
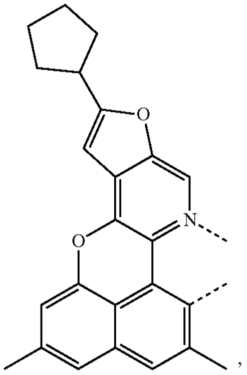
$L_{a1017}$
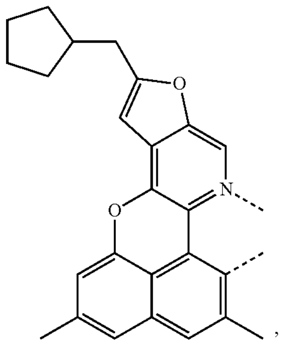
-continued
$L_{a1018}$
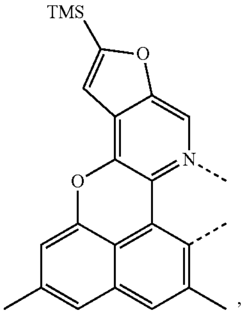
$L_{a1019}$
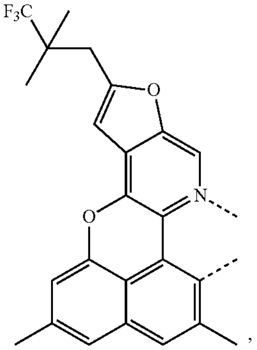
$L_{a1020}$
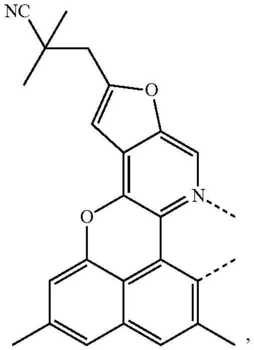
$L_{a1021}$
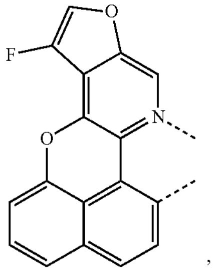
$L_{a1022}$
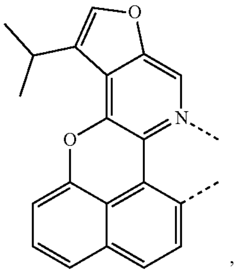

-continued
$L_{a1023}$
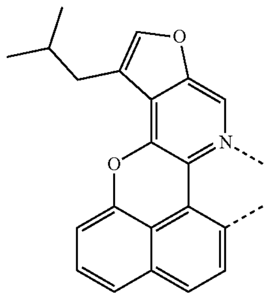
,
$L_{a1024}$
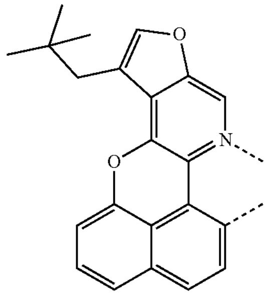
,
$L_{a1025}$
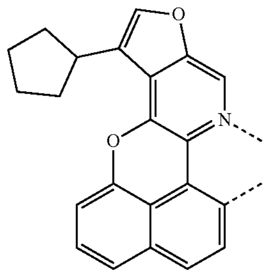
,
$L_{a1026}$
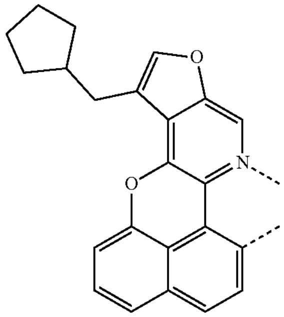
,
$L_{a1027}$
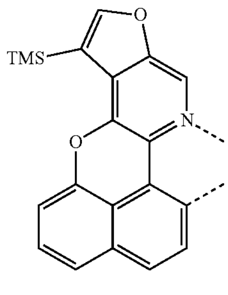
,
-continued
$L_{a1028}$
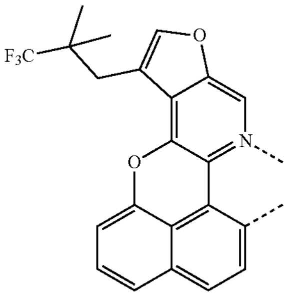
,
$L_{a1029}$
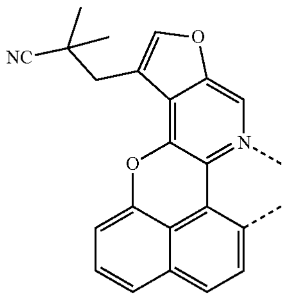
,
$L_{a1030}$
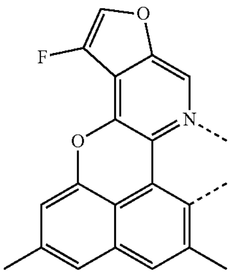
,
$L_{a1031}$
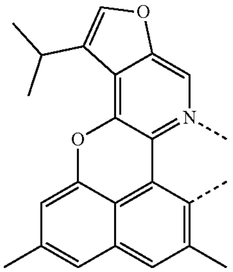
,
$L_{a1032}$
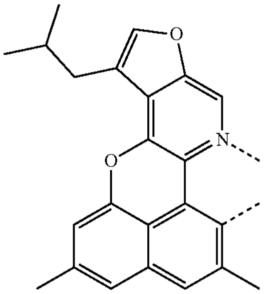
, -continued
$L_{a1033}$
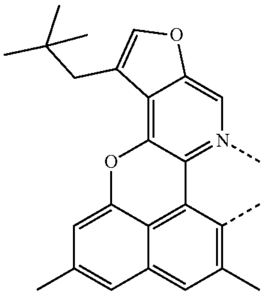
,
$L_{a1034}$
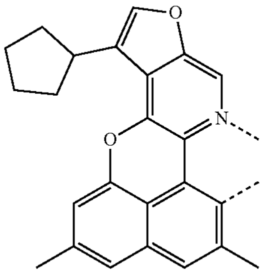
,
$L_{a1035}$
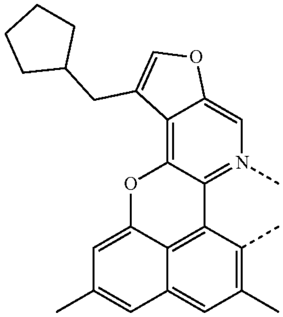
,
$L_{a1036}$
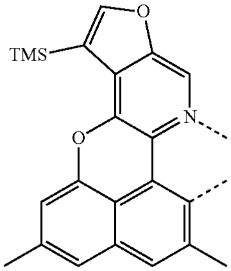
,
$L_{a1037}$
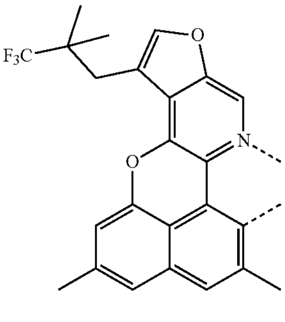
,
-continued
$L_{a1038}$
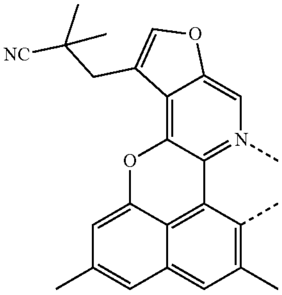
,
$L_{a1039}$
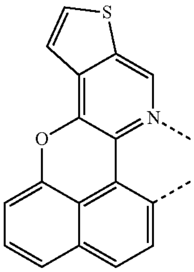
,
$L_{a1040}$
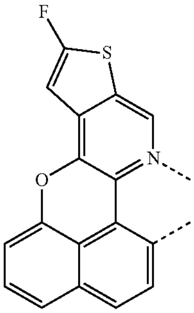
,
$L_{a1041}$
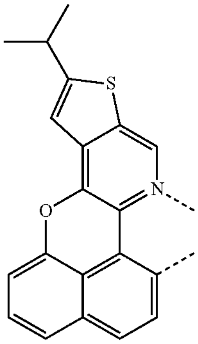
,
$L_{a1042}$
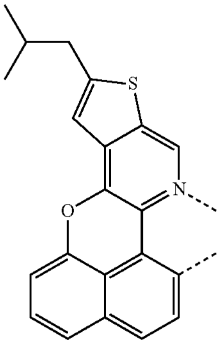
, $L_{a1043}$
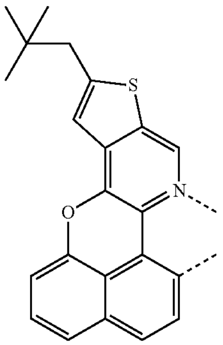
,
$L_{a1044}$
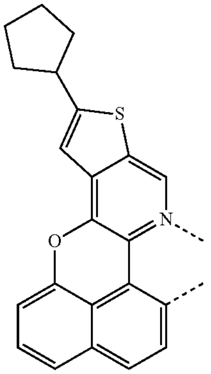
,
$L_{a1045}$
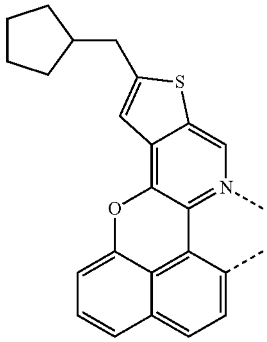
,
$L_{a1046}$
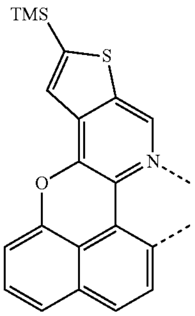
,
$L_{a1047}$
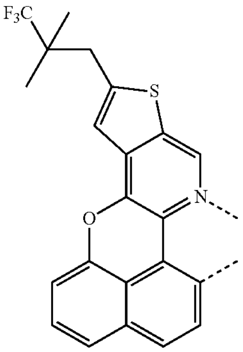
,
$L_{a1048}$
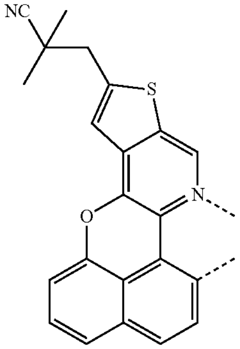
,
$L_{a1049}$
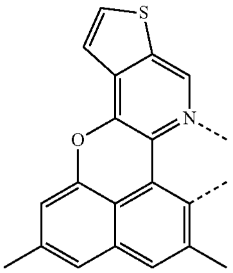
,
$L_{a1050}$
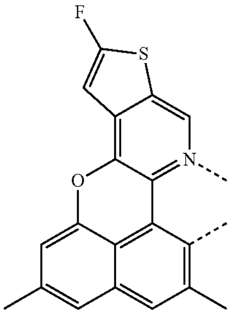
, -continued
$L_{a1051}$
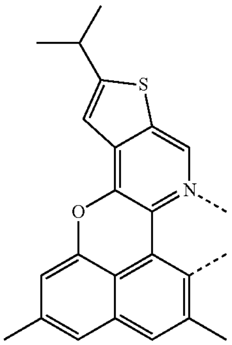
,
$L_{a1052}$
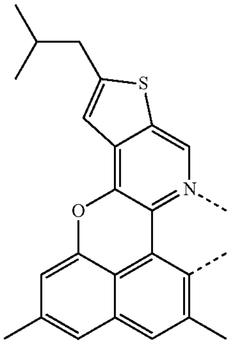
,
$L_{a1053}$
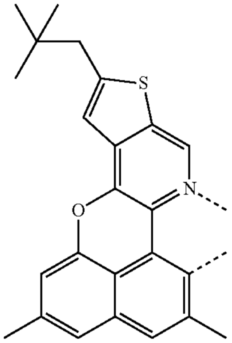
,
$L_{a1054}$
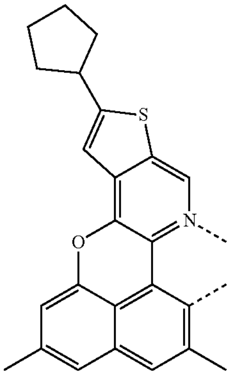
,
-continued
$L_{a1055}$
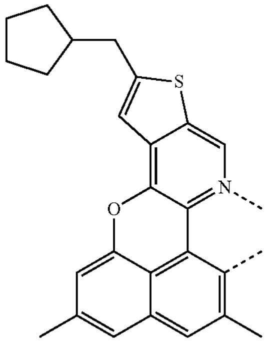
,
$L_{a1056}$
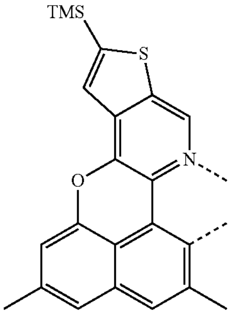
,
$L_{a1057}$
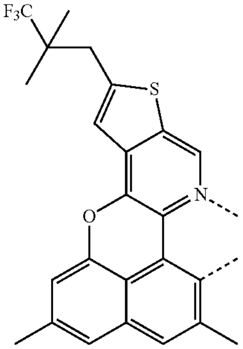
,
$L_{a1058}$
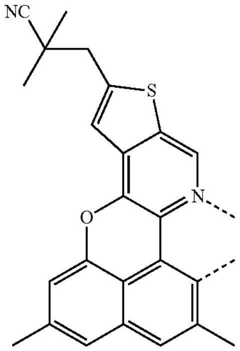
,
$L_{a1059}$
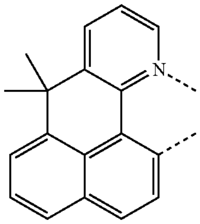
, -continued
$L_{a1060}$
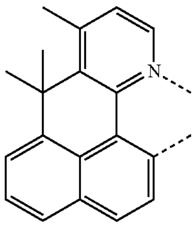
,
$L_{a1061}$
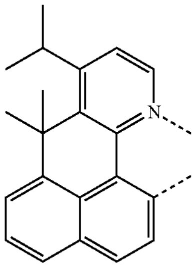
,
$L_{a1062}$
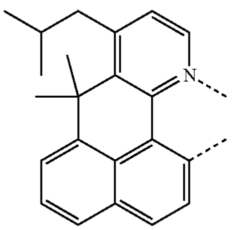
,
$L_{a1063}$
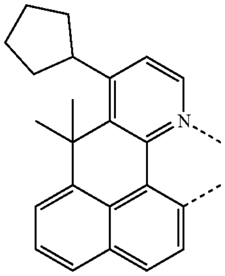
,
$L_{a1064}$
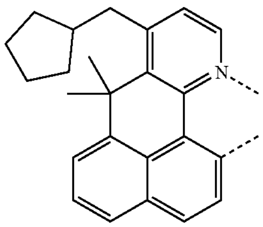
,
$L_{a1065}$
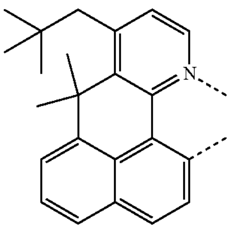
,
-continued
$L_{a1066}$
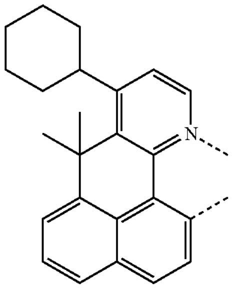
,
$L_{a1067}$
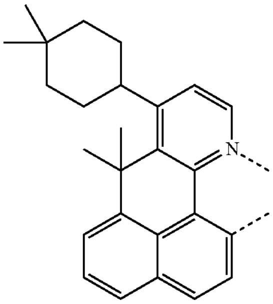
,
$L_{a1068}$
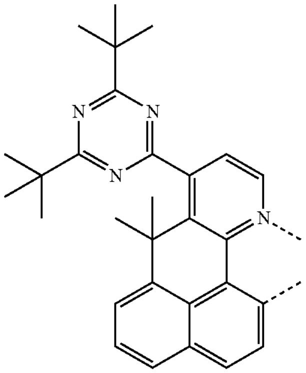
,
$L_{a1069}$
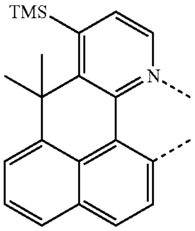
,
$L_{a1070}$
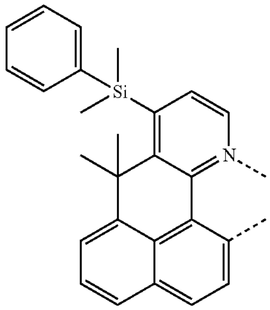
, -continued
$L_{a1071}$
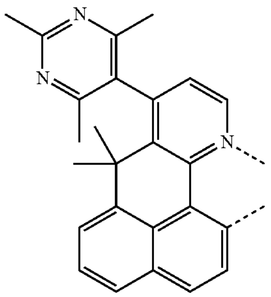
,
$L_{a1072}$
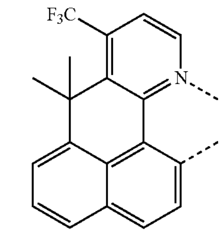
,
$L_{a1073}$
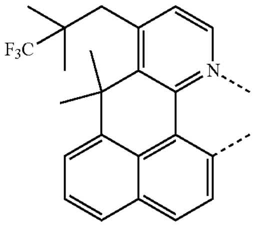
,
$L_{a1074}$
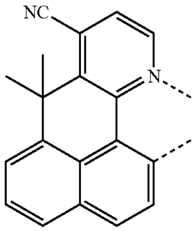
,
$L_{a1075}$
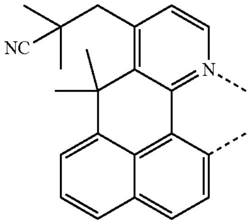
,
$L_{a1076}$
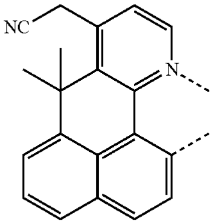
,
-continued
$L_{a1077}$
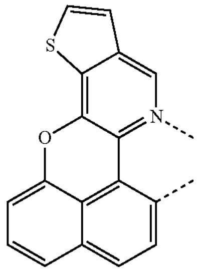
,
$L_{a1078}$
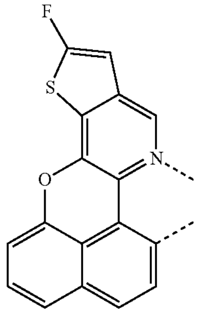
,
$L_{a1079}$
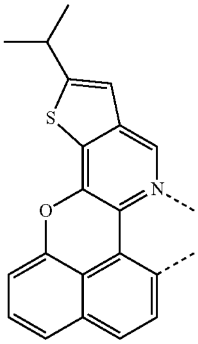
,
$L_{a1080}$
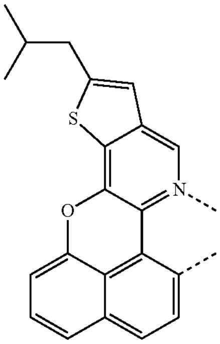
, $L_{a1081}$
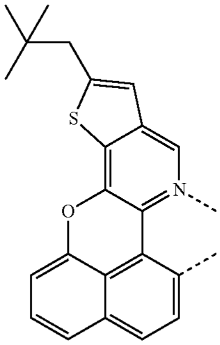
,
$L_{a1082}$
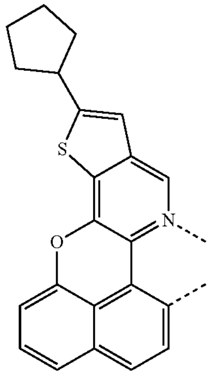
,
$L_{a1083}$
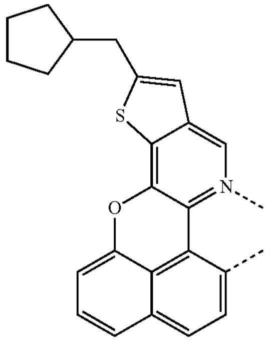
,
$L_{a1084}$
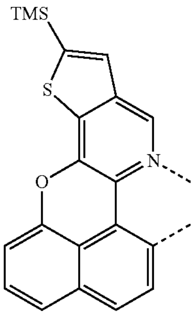
,
$L_{a1085}$
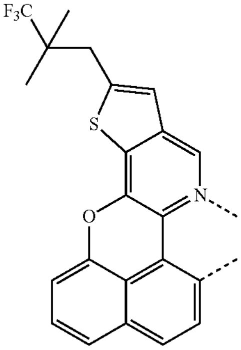
,
$L_{a1086}$
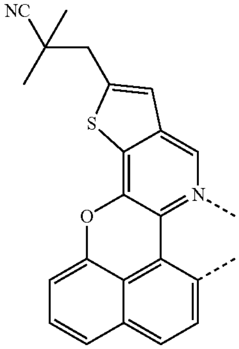
,
$L_{a1087}$
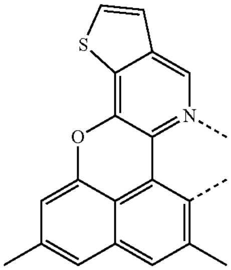
,
$L_{a1088}$
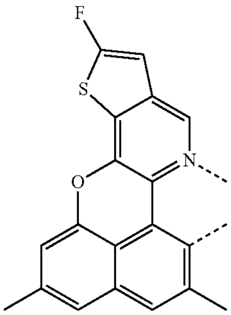
, -continued
$L_{a1089}$
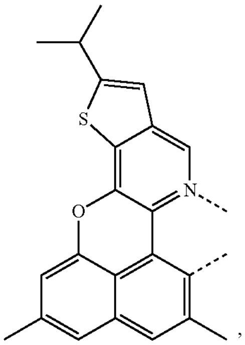
$L_{a1090}$
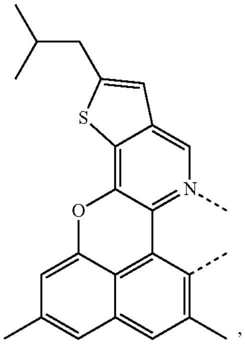
$L_{a1091}$
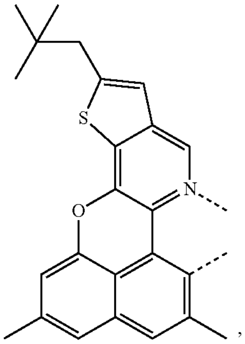
$L_{a1092}$
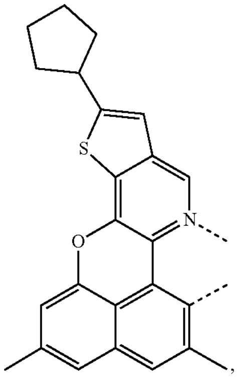
-continued
$L_{a1093}$
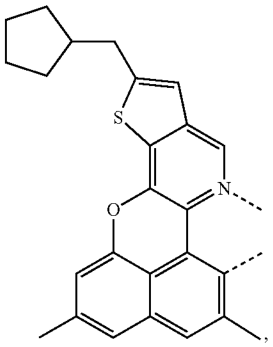
$L_{a1094}$
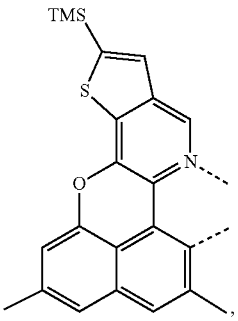
$L_{a1095}$
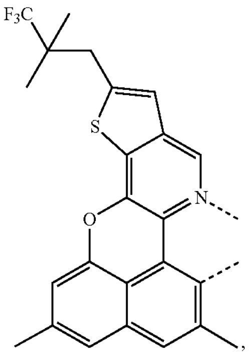
$L_{a1096}$
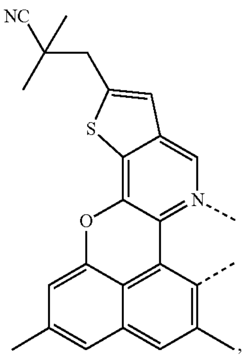

-continued
$L_{a1097}$
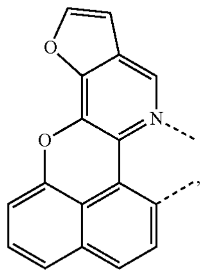
$L_{a1098}$
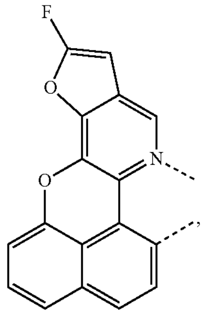
$L_{a1099}$
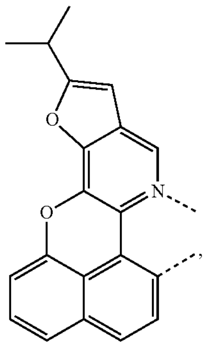
$L_{a1100}$
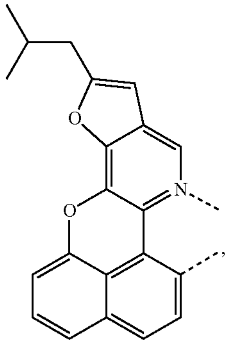
-continued
$L_{a1101}$
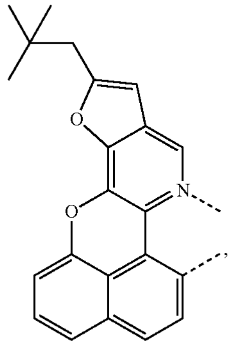
$L_{a1102}$
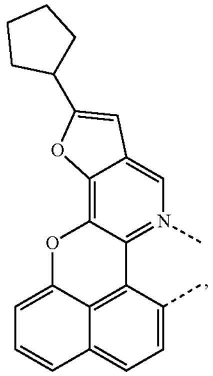
$L_{a1103}$
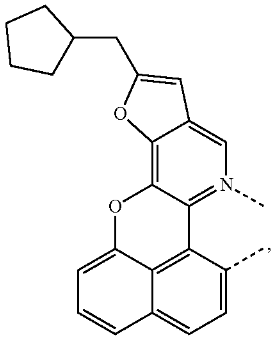
$L_{a1104}$
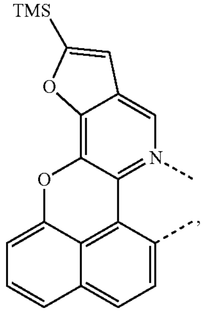

L$_{a1105}$
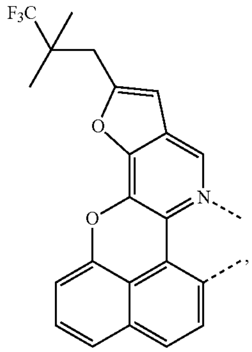
L$_{a1106}$
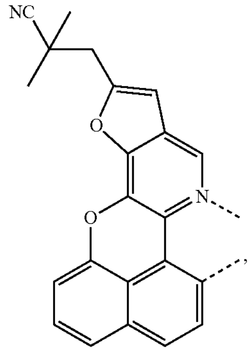
L$_{a1107}$
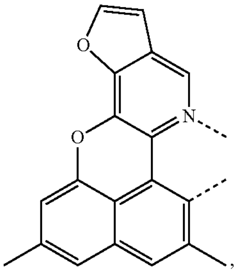
L$_{a1108}$
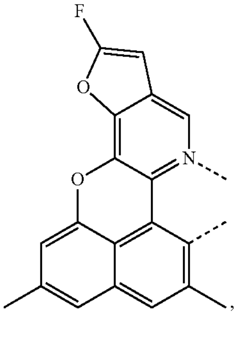
L$_{a1109}$
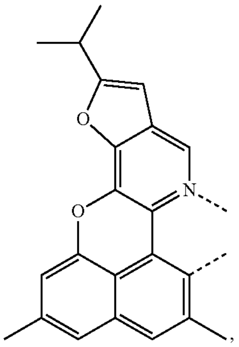
L$_{a1110}$
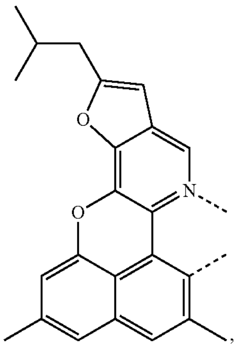
L$_{a1111}$
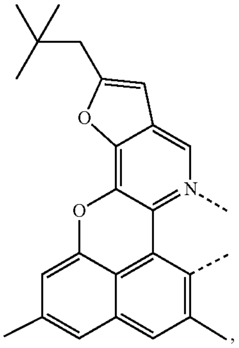
L$_{a1112}$
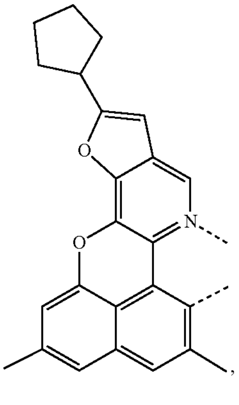

-continued
L$_{a1113}$
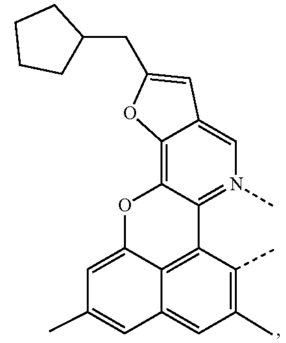
L$_{a1114}$
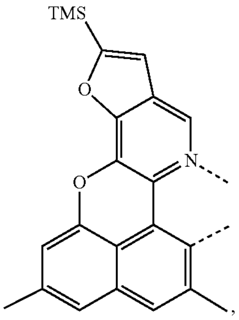
L$_{a1115}$
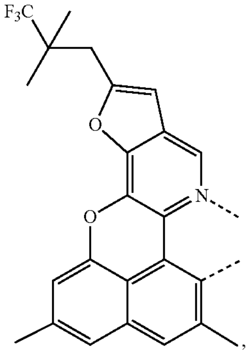
L$_{a1116}$
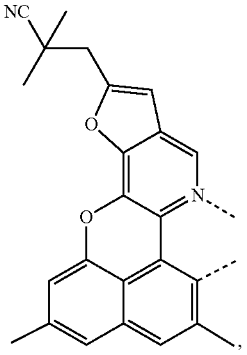
L$_{a1117}$
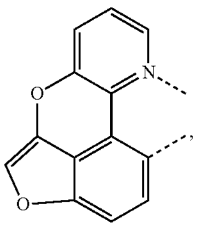
-continued
L$_{a1118}$
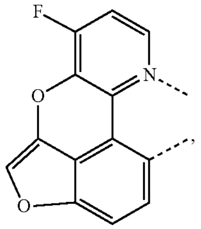
L$_{a1119}$
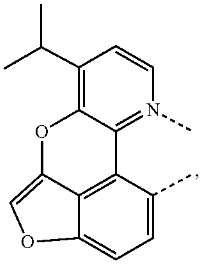
L$_{a1120}$
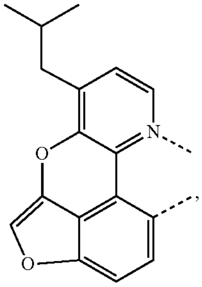
L$_{a1121}$
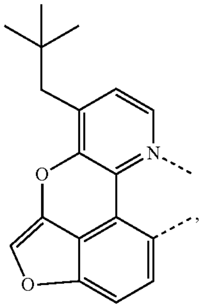
L$_{a1122}$
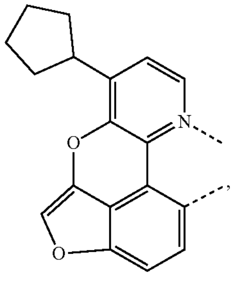

-continued
$L_{a1123}$
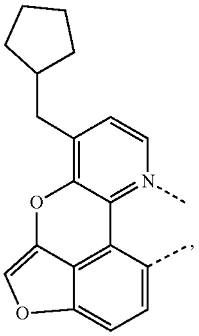
$L_{a1124}$
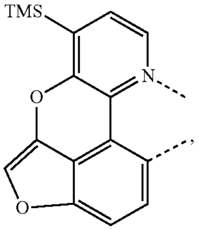
$L_{a1125}$
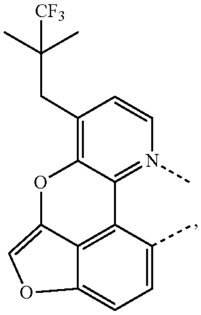
$L_{a1126}$
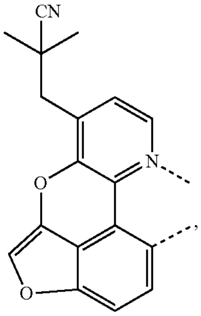
$L_{a1127}$
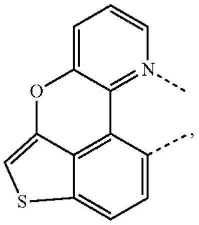
-continued
$L_{a1128}$
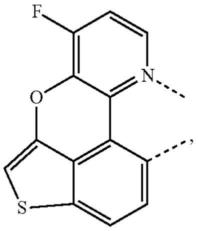
$L_{a1129}$
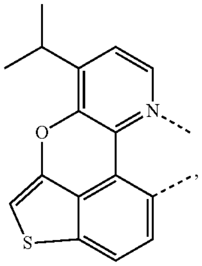
$L_{a1130}$
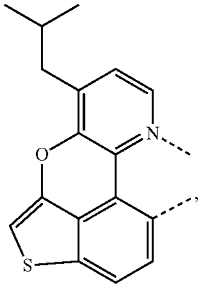
$L_{a1131}$
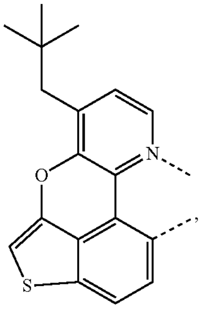
$L_{a1132}$
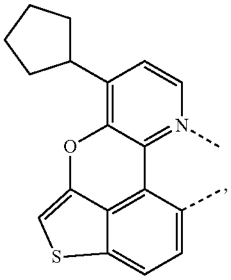

-continued
$L_{a1133}$
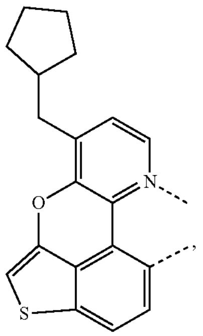
$L_{a1134}$
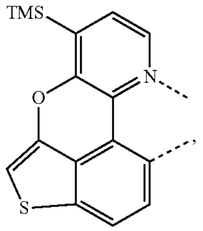
$L_{a1135}$
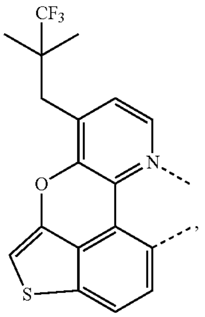
$L_{a1136}$
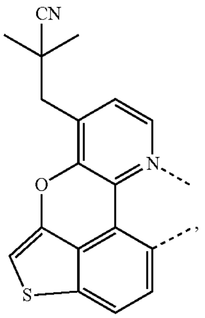
$L_{a1137}$
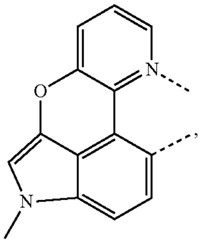
-continued
$L_{a1138}$
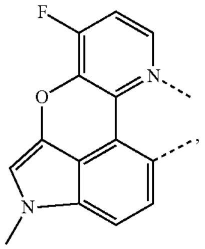
$L_{a1139}$
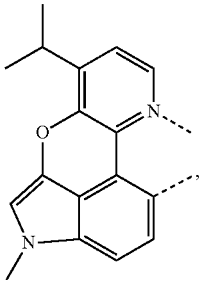
$L_{a1140}$
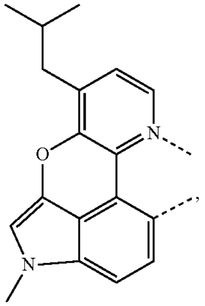
$L_{a1141}$
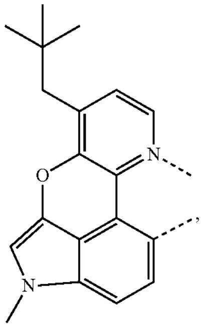
$L_{a1142}$
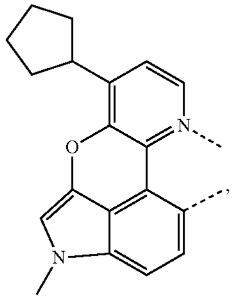

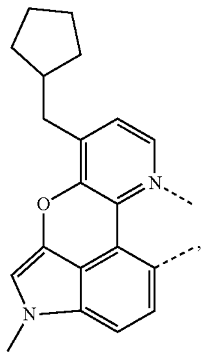
$L_{a1143}$
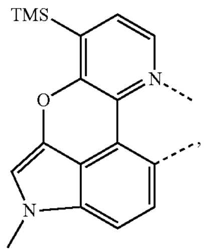
$L_{a1144}$
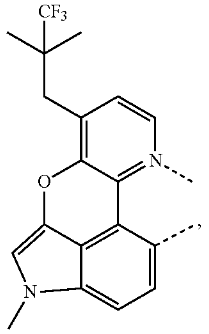
$L_{a1145}$
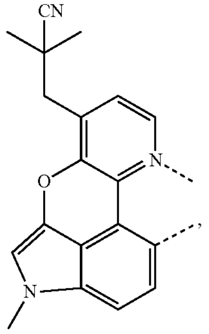
$L_{a1146}$
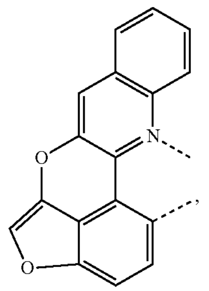
$L_{a1147}$
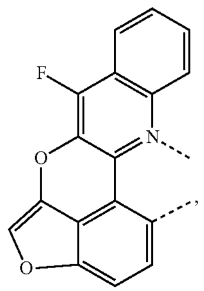
$L_{a1148}$
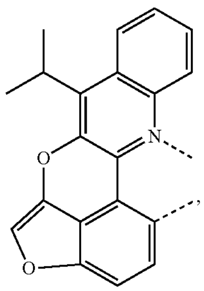
$L_{a1149}$
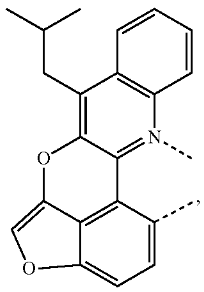
$L_{a1150}$
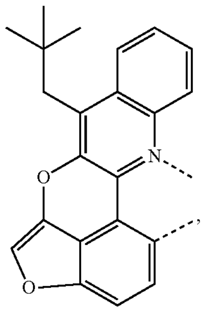
$L_{a1151}$
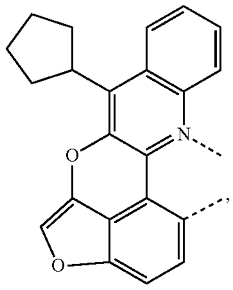
$L_{a1152}$ -continued
$L_{a1153}$
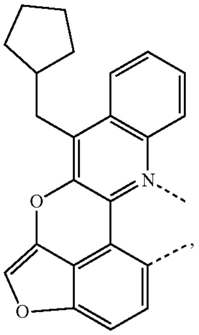
$L_{a1154}$
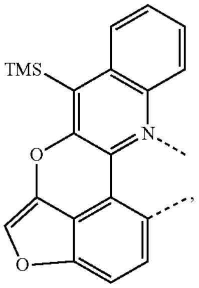
$L_{a1155}$
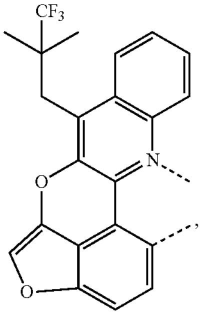
$L_{a1156}$
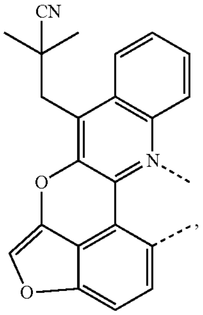
$L_{a1157}$
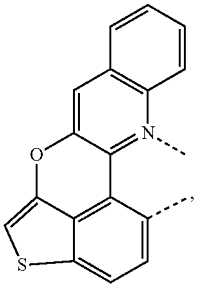
-continued
$L_{a1158}$
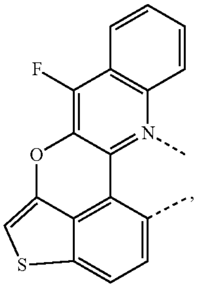
$L_{a1159}$
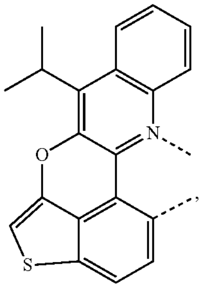
$L_{a1160}$
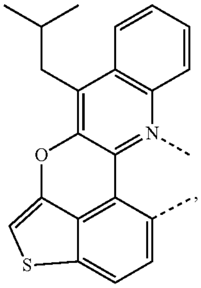
$L_{a1161}$
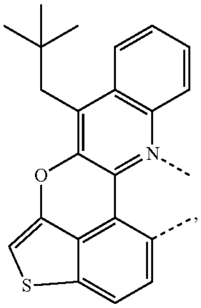
$L_{a1162}$
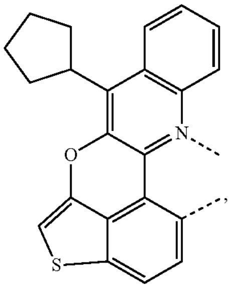

-continued
$L_{a1163}$
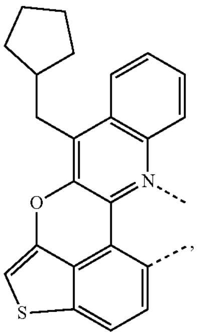
$L_{a1164}$
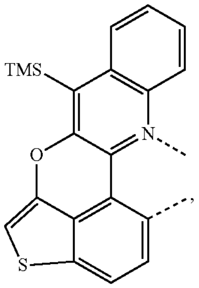
$L_{a1165}$
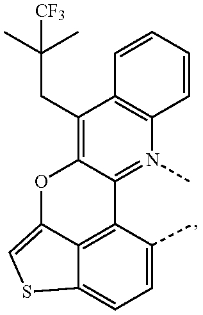
$L_{a1166}$
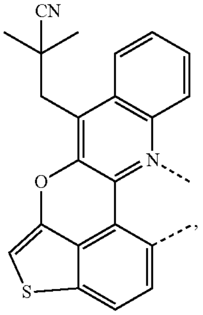
$L_{a1167}$
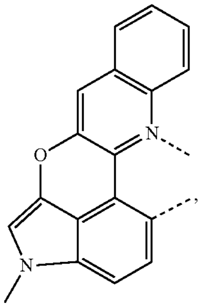
-continued
$L_{a1168}$
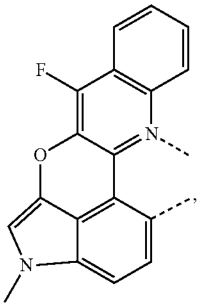
$L_{a1169}$
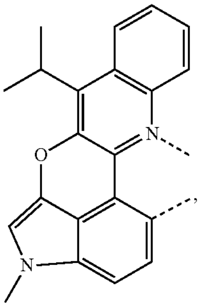
$L_{a1170}$
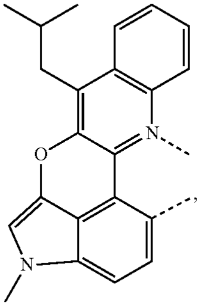
$L_{a1171}$
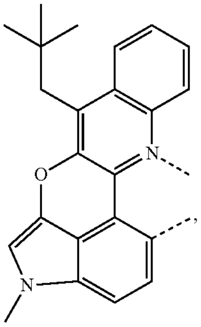
$L_{a1172}$
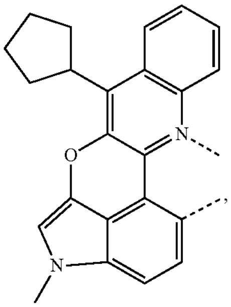

-continued
L$_{a1173}$
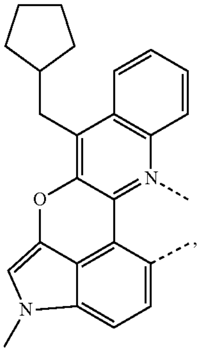
L$_{a1174}$
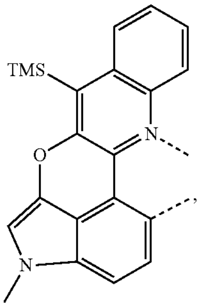
L$_{a1175}$
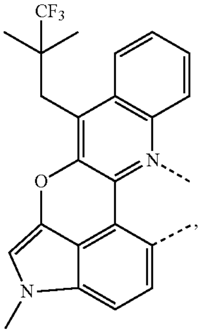
L$_{a1176}$
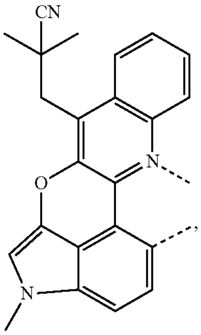
-continued
L$_{a1177}$
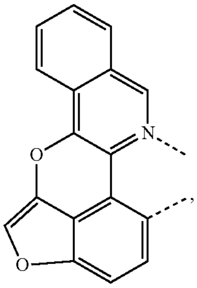
L$_{a1178}$
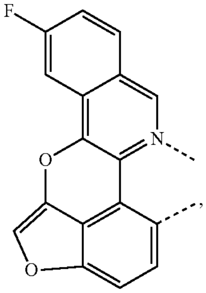
L$_{a1179}$
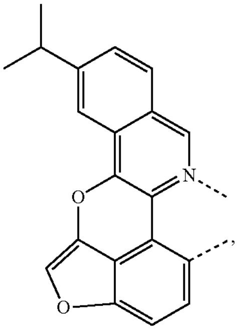
L$_{a1180}$
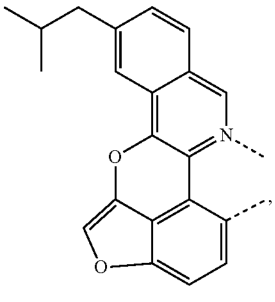
L$_{a1181}$
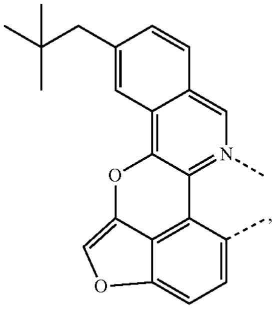

-continued
$L_{a1182}$
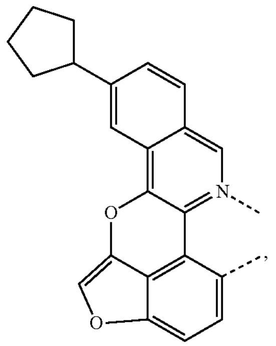
$L_{a1183}$
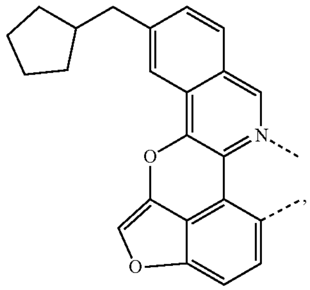
$L_{a1184}$
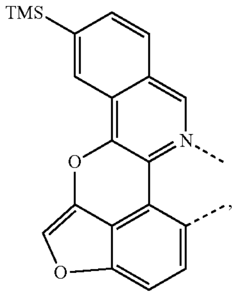
$L_{a1185}$
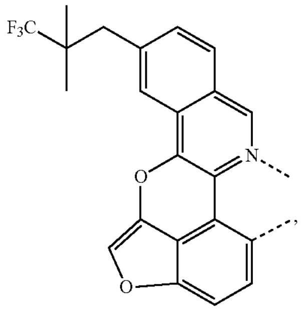
$L_{a1186}$
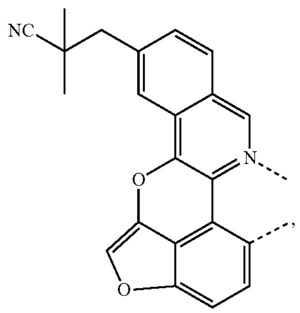
-continued
$L_{a1187}$
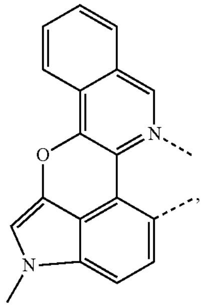
$L_{a1188}$
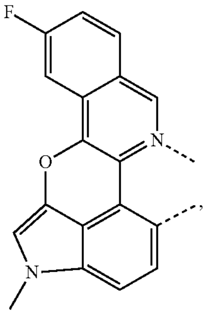
$L_{a1189}$
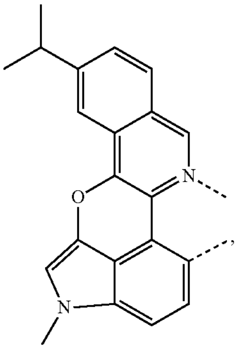
$L_{a1190}$
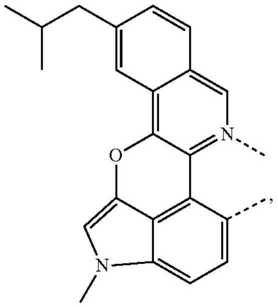
$L_{a1191}$
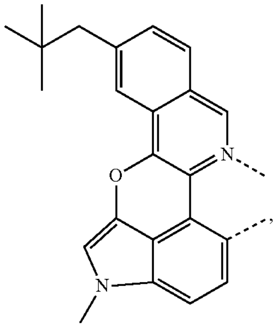

-continued
$L_{a1192}$
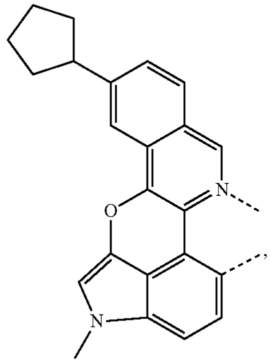
$L_{a1193}$
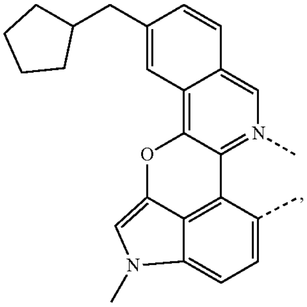
$L_{a1194}$
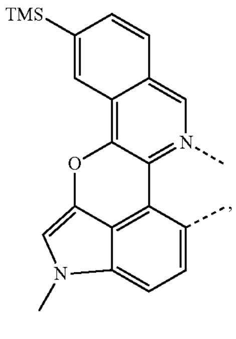
$L_{a1195}$
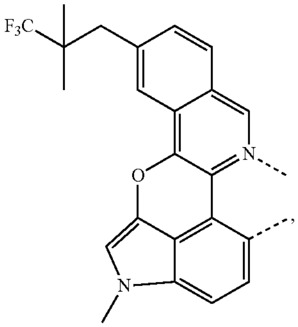
-continued
$L_{a1196}$
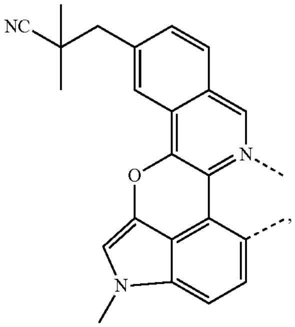
$L_{a1197}$
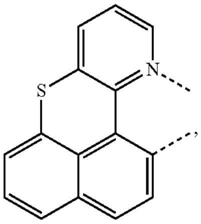
$L_{a1198}$
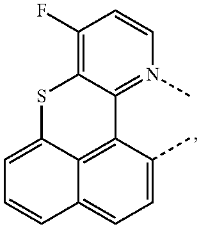
$L_{a1199}$
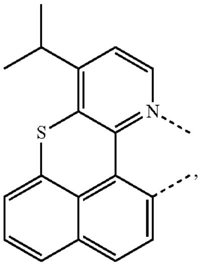
$L_{a1200}$
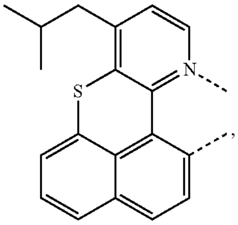
$L_{a1201}$
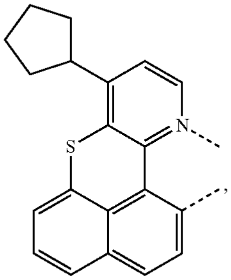

-continued
L$_{a1202}$
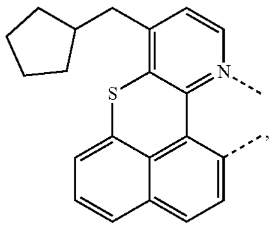
L$_{a1203}$
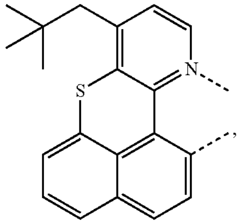
L$_{a1204}$
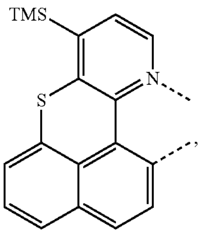
L$_{a1205}$
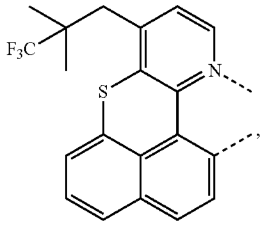
L$_{a1206}$
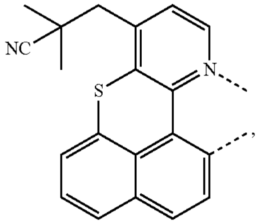
L$_{a1207}$
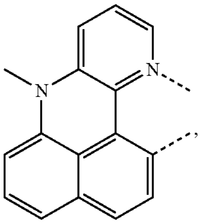
-continued
L$_{a1208}$
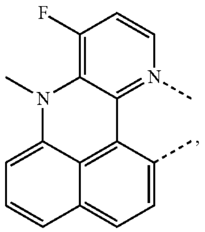
L$_{a1209}$
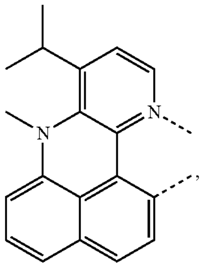
L$_{a1210}$
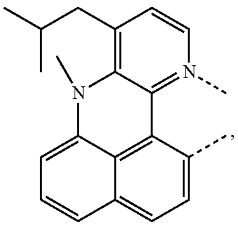
L$_{a1211}$
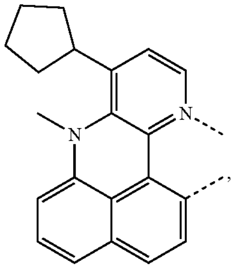
L$_{a1212}$
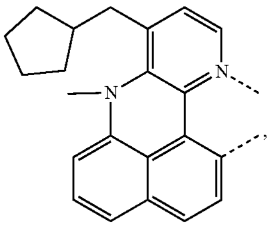
L$_{a1213}$
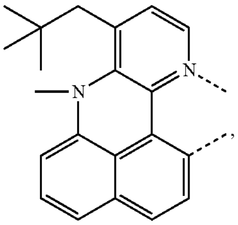

-continued
L$_{a1214}$
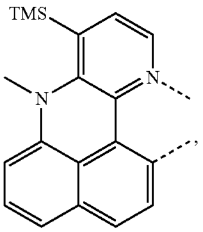
L$_{a1215}$
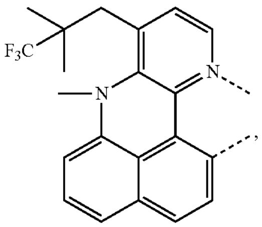
L$_{a1216}$
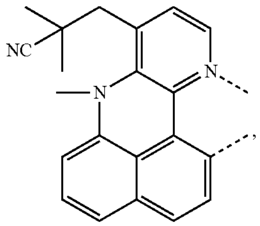
L$_{a1217}$
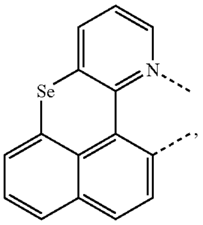
L$_{a1218}$
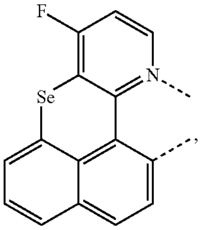
L$_{a1219}$
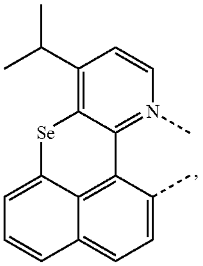
-continued
L$_{a1220}$
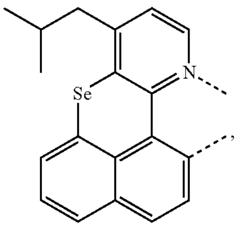
L$_{a1221}$
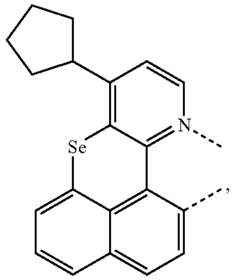
L$_{a1222}$
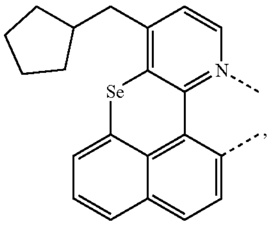
L$_{a1223}$
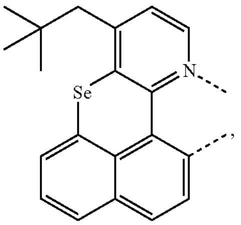
L$_{a1224}$
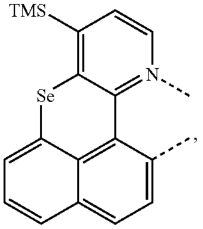
L$_{a1225}$
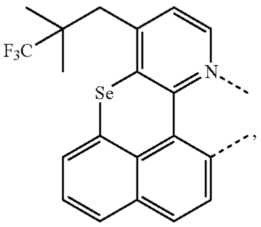

-continued
$L_{a1226}$
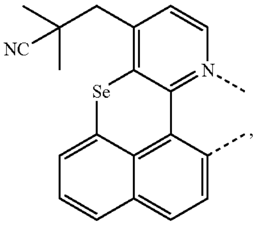
$L_{a1227}$
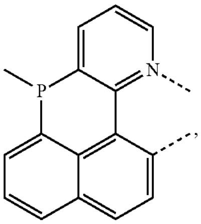
$L_{a1228}$
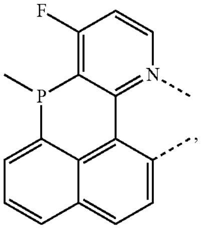
$L_{a1229}$
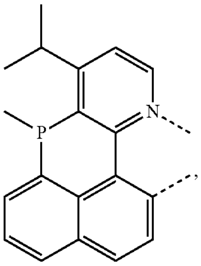
$L_{a1230}$
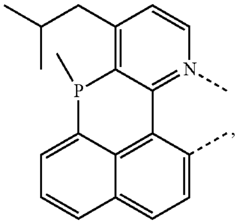
$L_{a1231}$
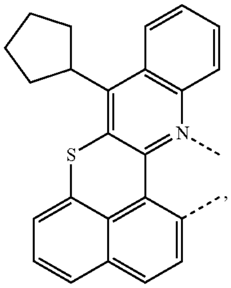
-continued
$L_{a1232}$
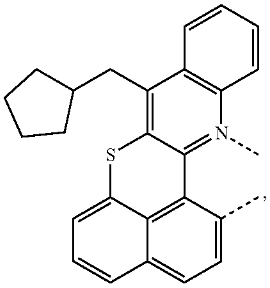
$L_{a1233}$
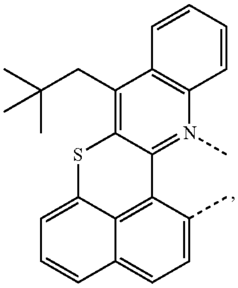
$L_{a1234}$
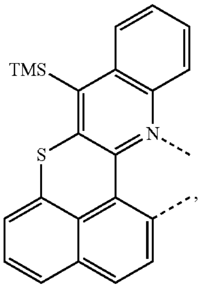
$L_{a1235}$
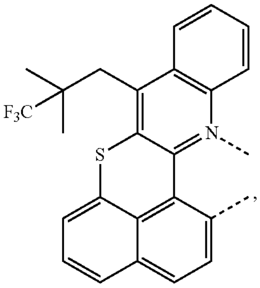
$L_{a1236}$
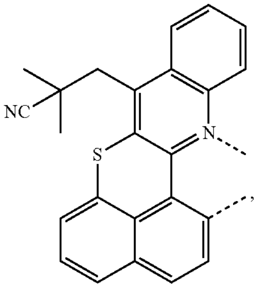

$L_{a1237}$
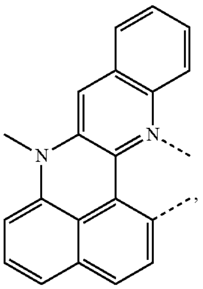
$L_{a1238}$
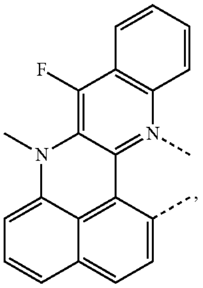
$L_{a1239}$
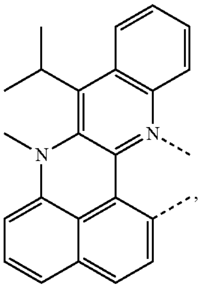
$L_{a1240}$
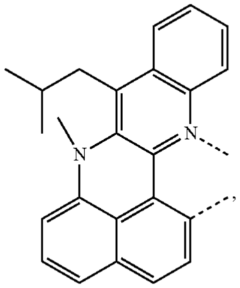
$L_{a1241}$
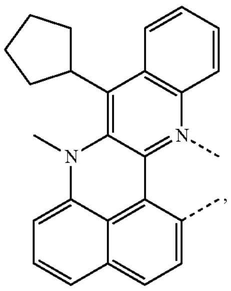
$L_{a1242}$
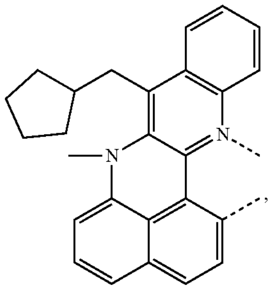
$L_{a1243}$
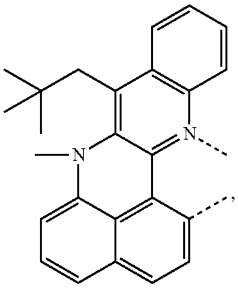
$L_{a1244}$
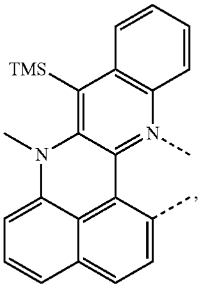
$L_{a1245}$
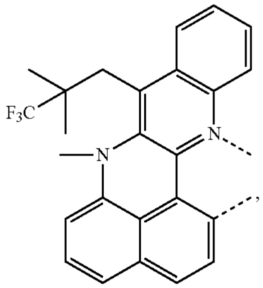
$L_{a1246}$
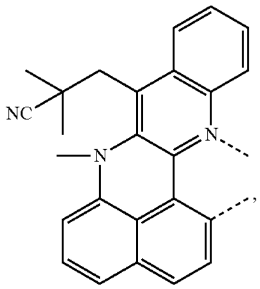

-continued
$L_{a1247}$
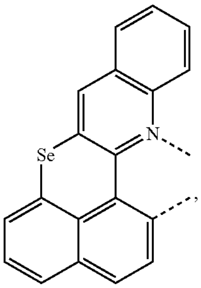
$L_{a1248}$
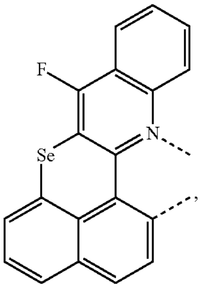
$L_{a1249}$
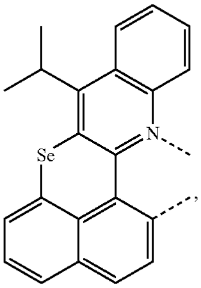
$L_{a1250}$
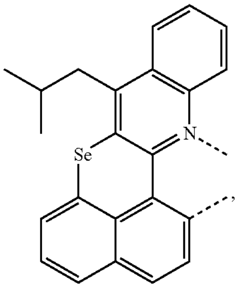
$L_{a1251}$
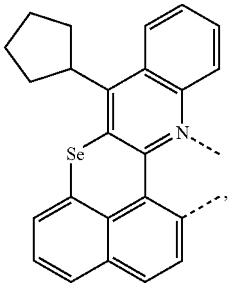
-continued
$L_{a1252}$
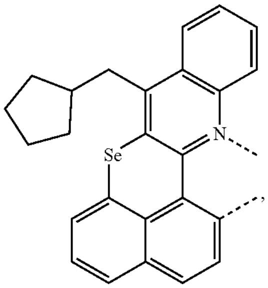
$L_{a1253}$
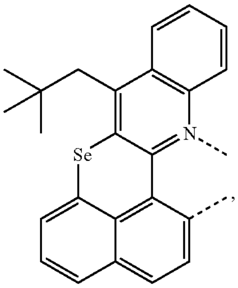
$L_{a1254}$
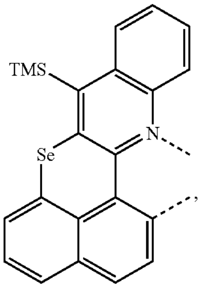
$L_{a1255}$
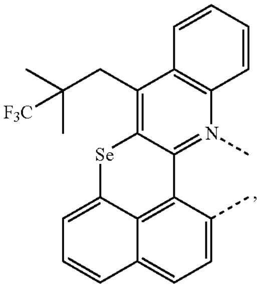
$L_{a1256}$
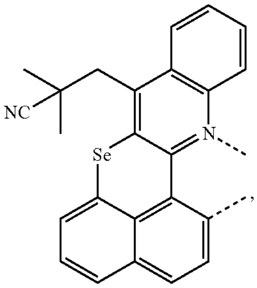

-continued
$L_{a1257}$
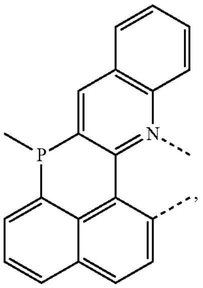
$L_{a1258}$
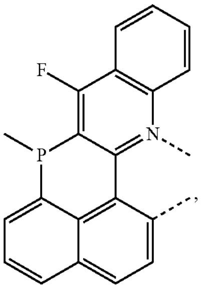
$L_{a1259}$
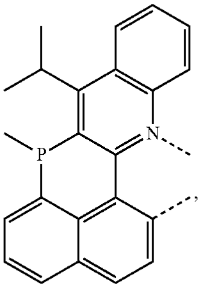
$L_{a1260}$
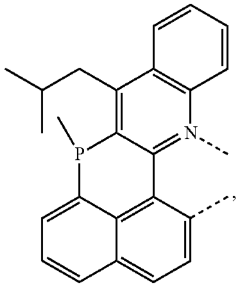
$L_{a1261}$
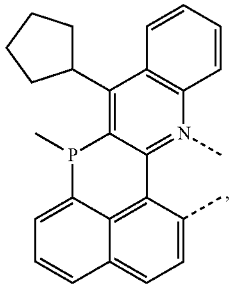
-continued
$L_{a1262}$
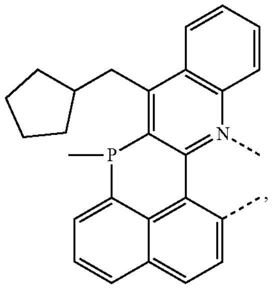
$L_{a1263}$
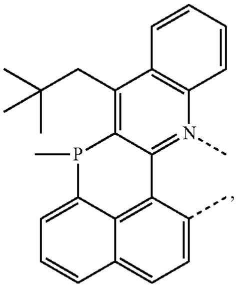
$L_{a1264}$
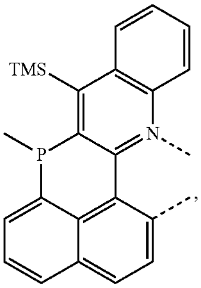
$L_{a1265}$
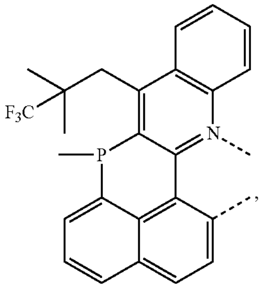
$L_{a1266}$
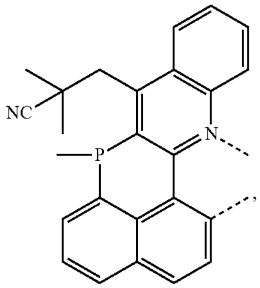

-continued
$L_{a1267}$
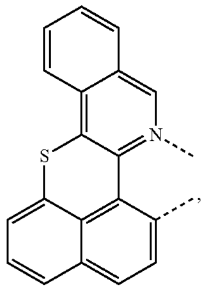
$L_{a1268}$
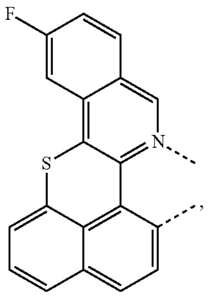
$L_{a1269}$
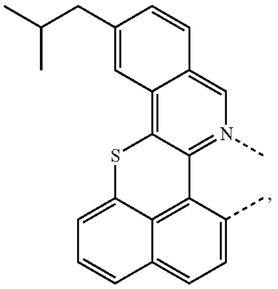
$L_{a1270}$
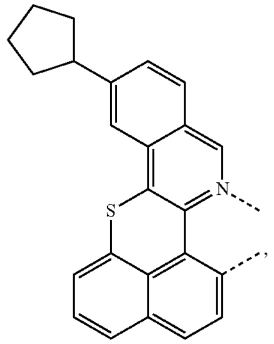
$L_{a1271}$
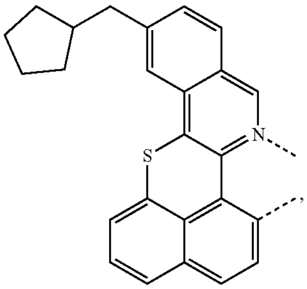
-continued
$L_{a1272}$
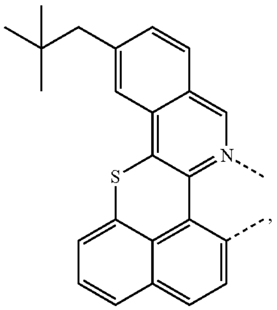
$L_{a1273}$
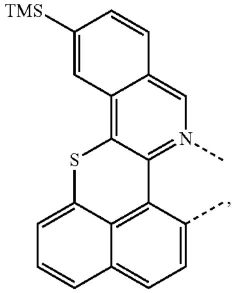
$L_{a1274}$
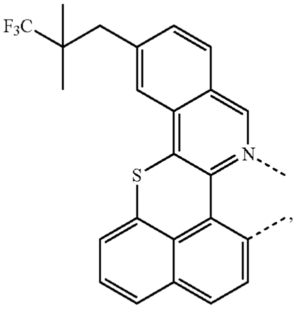
$L_{a1275}$
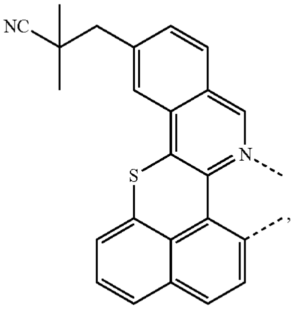
$L_{a1276}$
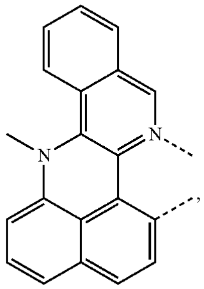

-continued
$L_{a1277}$
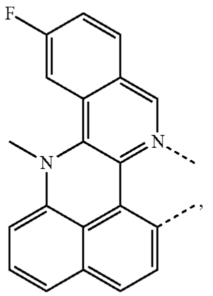
$L_{a1278}$
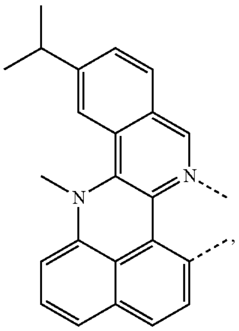
$L_{a1279}$
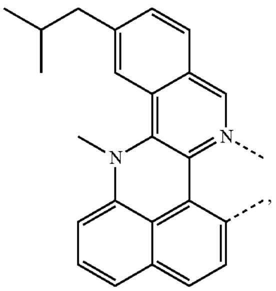
$L_{a1280}$
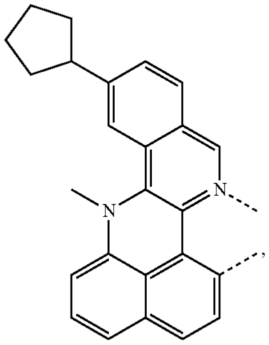
$L_{a1281}$
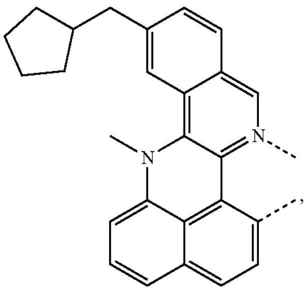
-continued
$L_{a1282}$
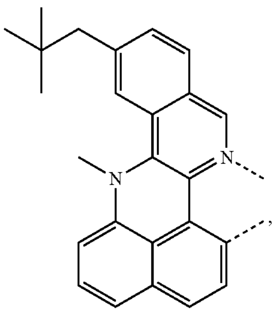
$L_{a1283}$
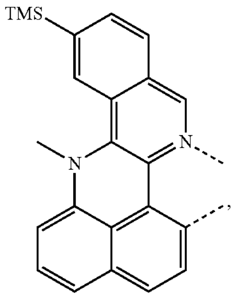
$L_{a1284}$
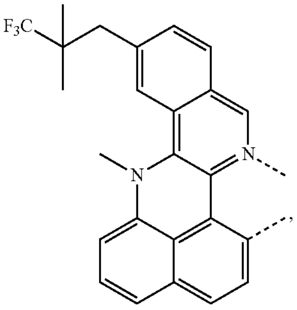
$L_{a1285}$
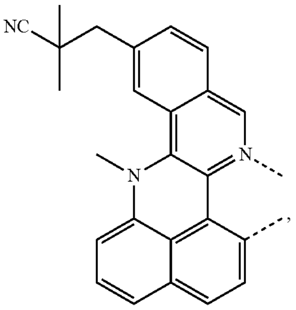
$L_{a1286}$
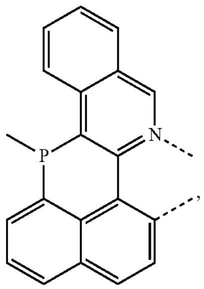

-continued
$L_{a1287}$
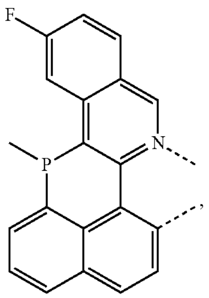
$L_{a1288}$
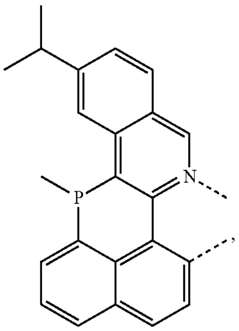
$L_{a1289}$
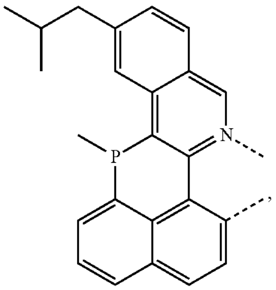
$L_{a1290}$
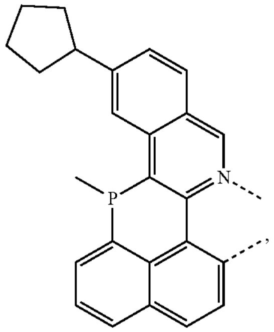
$L_{a1291}$
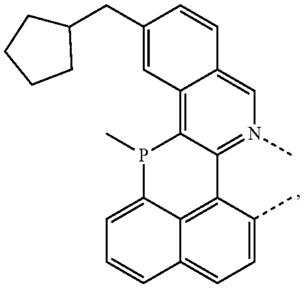
-continued
$L_{a1292}$
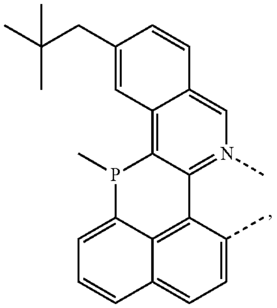
$L_{a1293}$
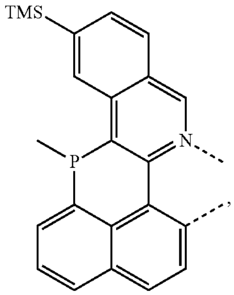
$L_{a1294}$
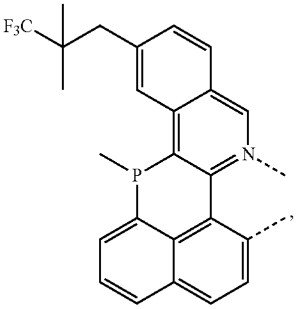
$L_{a1295}$
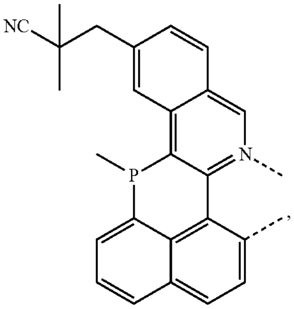
$L_{a1296}$
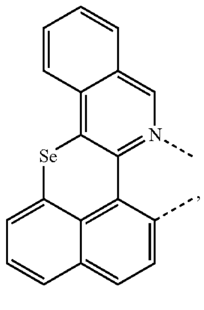

-continued
$L_{a1297}$
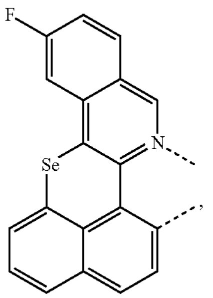
$L_{a1298}$
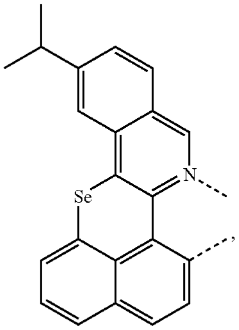
$L_{a1299}$
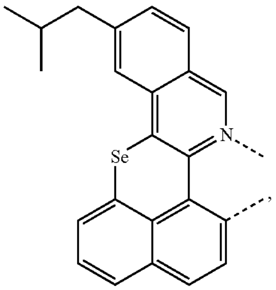
$L_{a1300}$
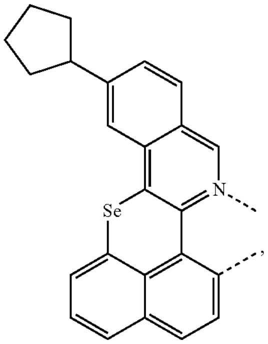
$L_{a1301}$
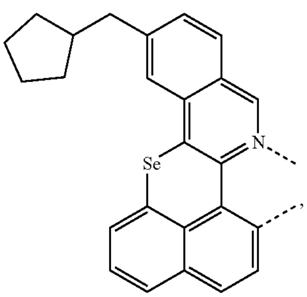
-continued
$L_{a1302}$
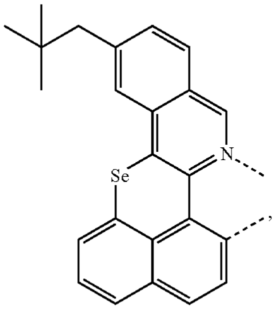
$L_{a1303}$
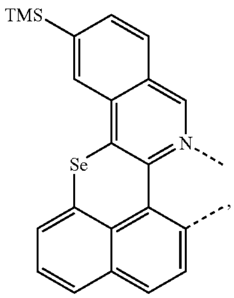
$L_{a1304}$
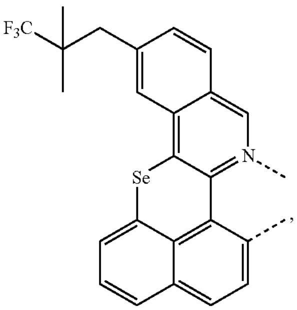
$L_{a1305}$
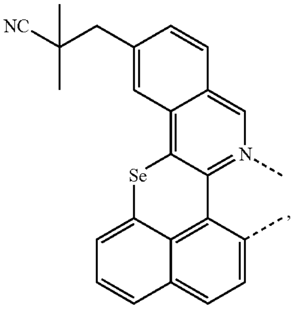
$L_{a1306}$
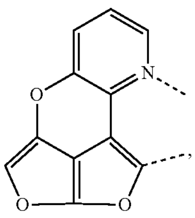

$L_{a1307}$
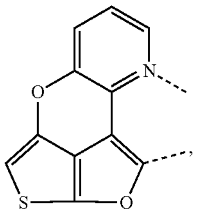
$L_{a1308}$
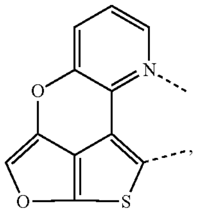
$L_{a1309}$
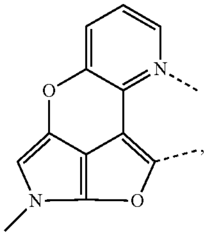
$L_{a1310}$
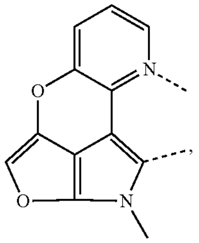
$L_{a1311}$
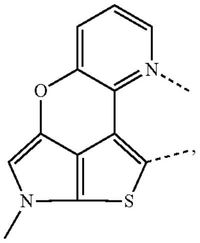
$L_{a1312}$
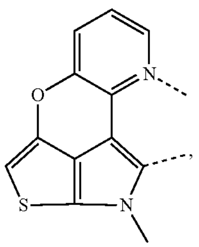
$L_{a1313}$
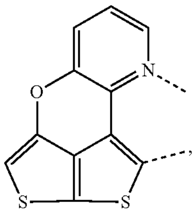
$L_{a1314}$
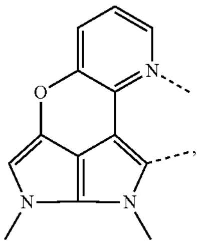
$L_{a1315}$
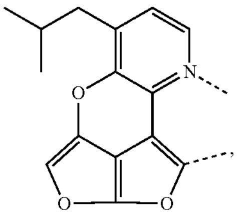
$L_{a1316}$
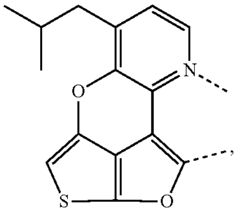
$L_{a1317}$
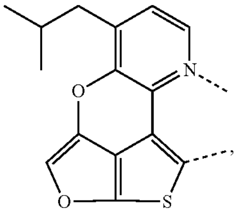
$L_{a1318}$
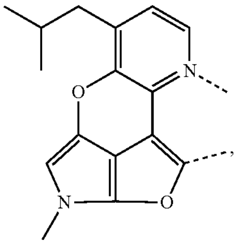

-continued
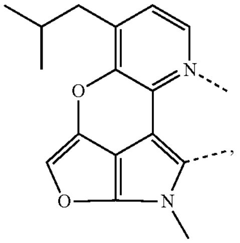
$L_{a1319}$
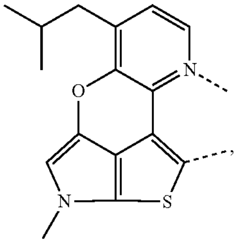
$L_{a1320}$
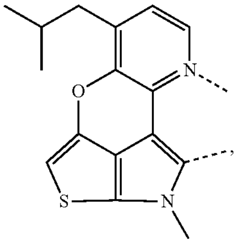
$L_{a1321}$
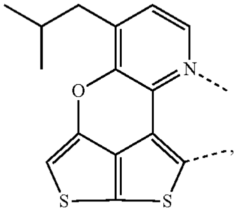
$L_{a1322}$
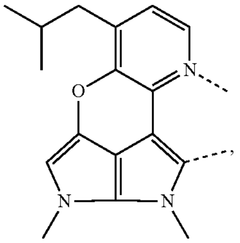
$L_{a1323}$
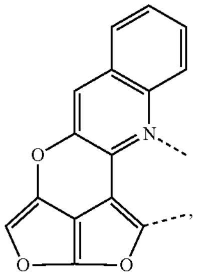
$L_{a1324}$
-continued
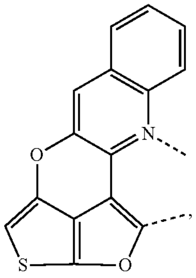
$L_{a1325}$
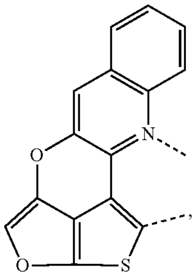
$L_{a1326}$
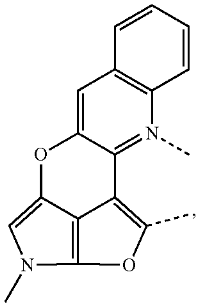
$L_{a1327}$
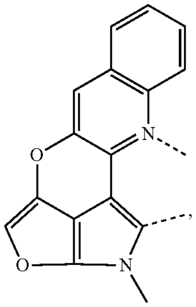
$L_{a1328}$
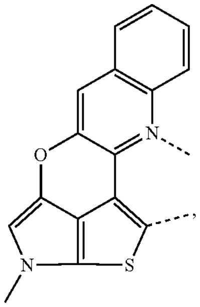
$L_{a1329}$ $L_{a1330}$
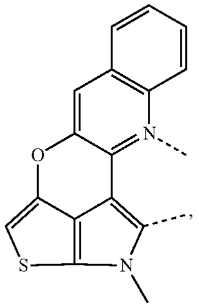
$L_{a1331}$
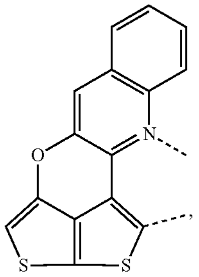
$L_{a1332}$
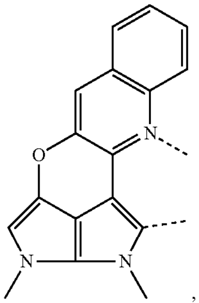
,
$L_{a1333}$
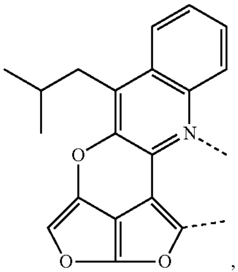
,
$L_{a1334}$
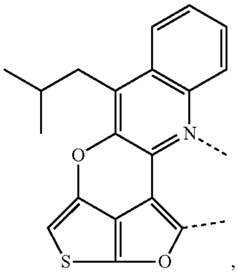
,
$L_{a1335}$
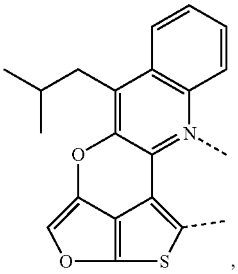
,
$L_{a1336}$
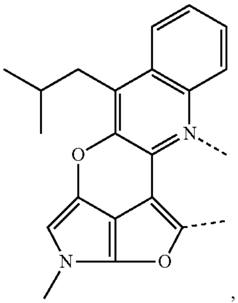
,
$L_{a1337}$
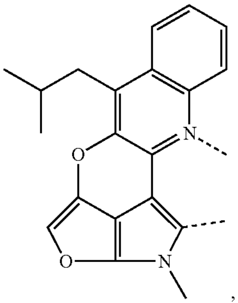
,
$L_{a1338}$
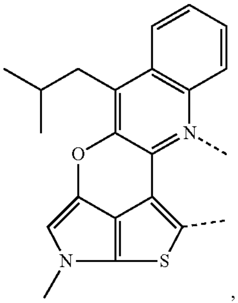
,
$L_{a1339}$
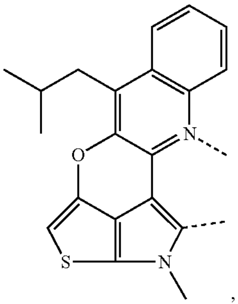
, -continued
$L_{a1340}$
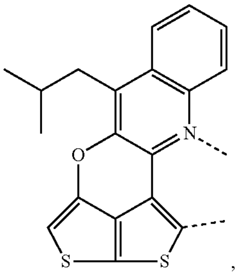
,
$L_{a1341}$
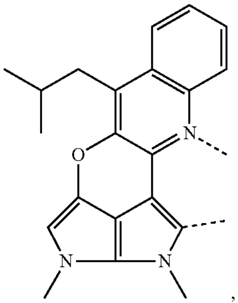
,
$L_{a1342}$
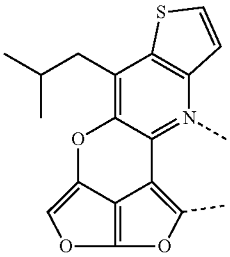
,
$L_{a1343}$
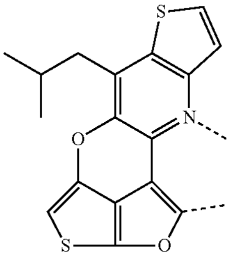
,
$L_{a1344}$
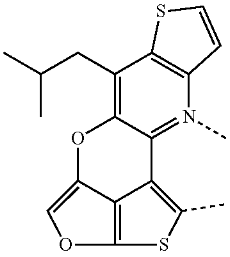
,
-continued
$L_{a1345}$
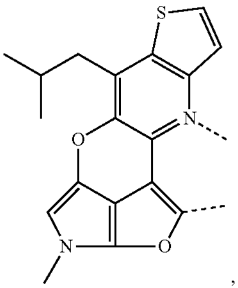
,
$L_{a1346}$
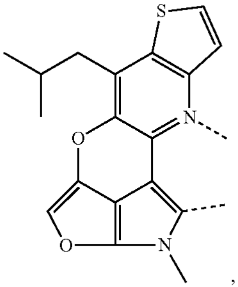
,
$L_{a1347}$
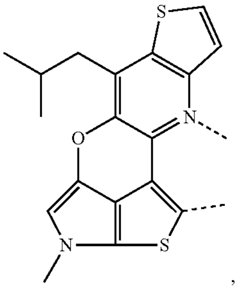
,
$L_{a1348}$
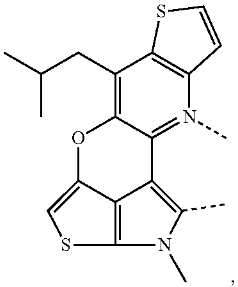
,
$L_{a1349}$
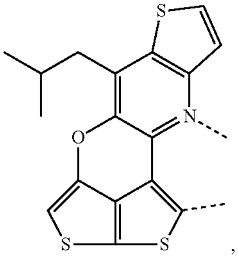
, -continued
$L_{a1350}$
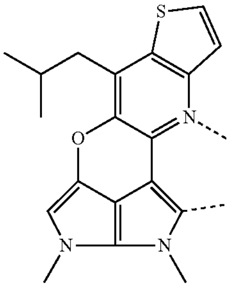
,
$L_{a1351}$
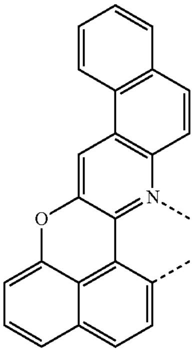
,
$L_{a1352}$
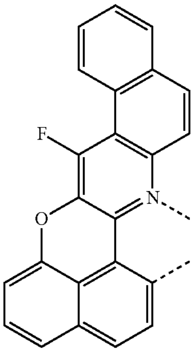
,
$L_{a1353}$
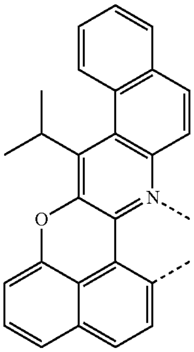
,
-continued
$L_{a1354}$
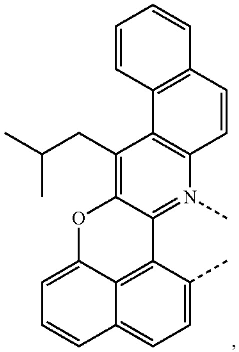
,
$L_{a1355}$
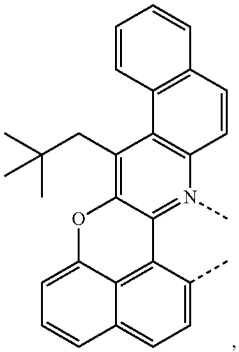
,
$L_{a1356}$
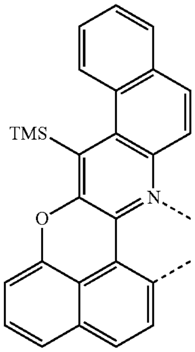
,
$L_{a1357}$
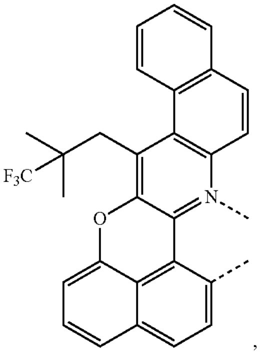
, -continued
$L_{a1358}$
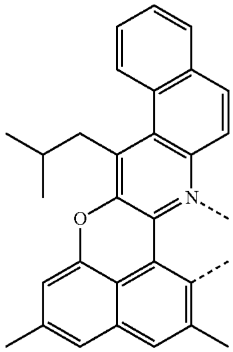
,
$L_{a1359}$
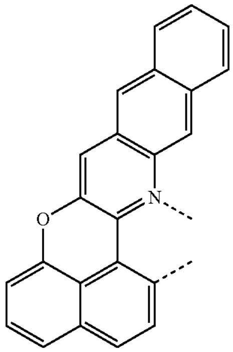
,
$L_{a1360}$
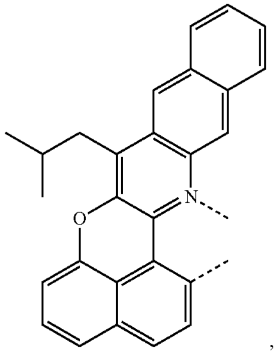
,
$L_{a1361}$
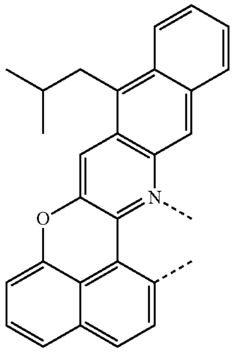
,
-continued
$L_{a1362}$
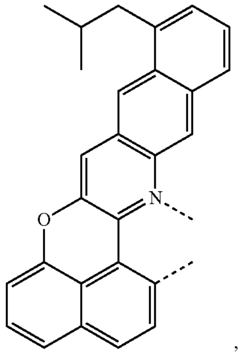
,
$L_{a1363}$
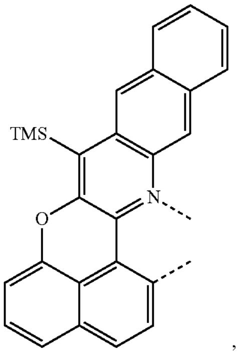
,
$L_{a1364}$
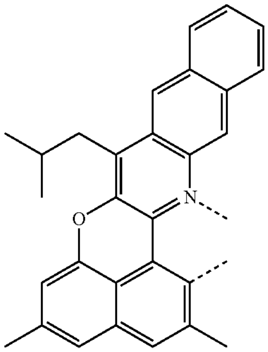
,
$L_{a1365}$
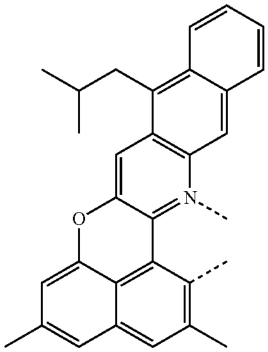
, -continued
$L_{a1366}$
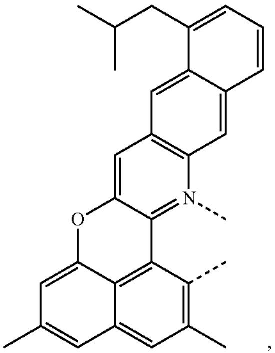
,
$L_{a1367}$
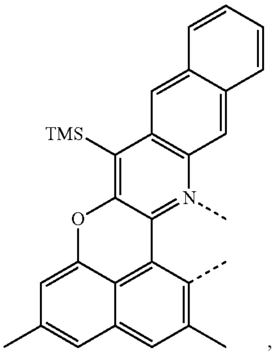
,
$L_{a1368}$
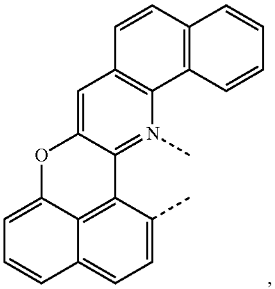
,
$L_{a1369}$
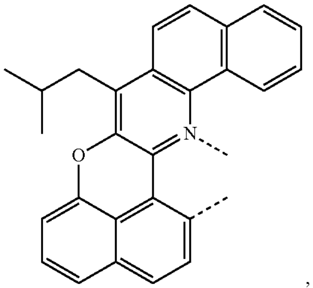
,
$L_{a1370}$
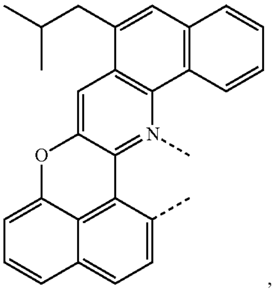
,
-continued
$L_{a1371}$
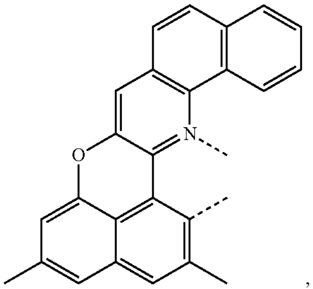
,
$L_{a1372}$
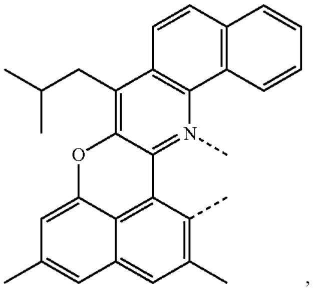
,
$L_{a1373}$
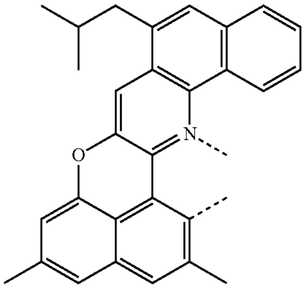
,
$L_{a1374}$
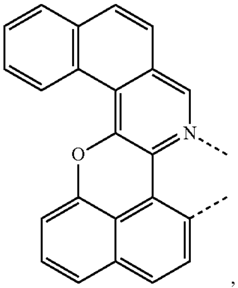
,
$L_{a1375}$
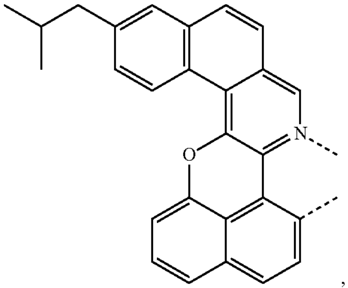
, $L_{a1376}$
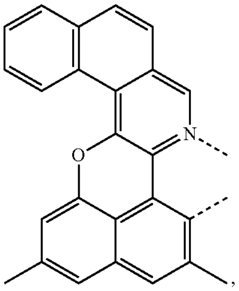
$L_{a1377}$
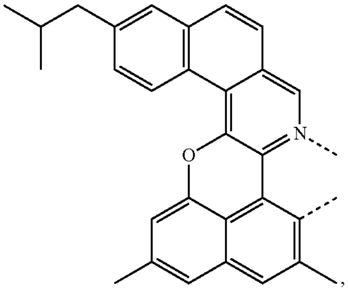
$L_{a1378}$
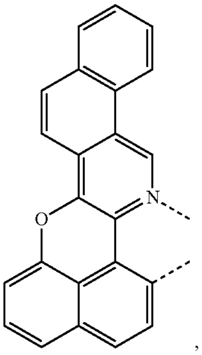
$L_{a1379}$
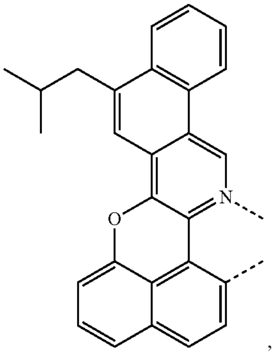
$L_{a1380}$
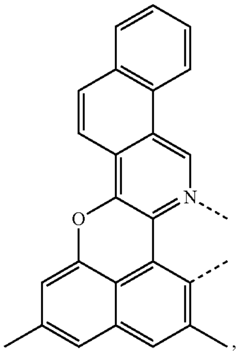
$L_{a1381}$
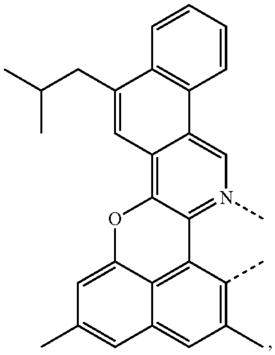
$L_{a1382}$
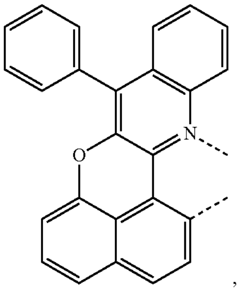
$L_{a1383}$
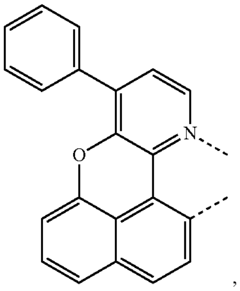

-continued
$L_{a1384}$
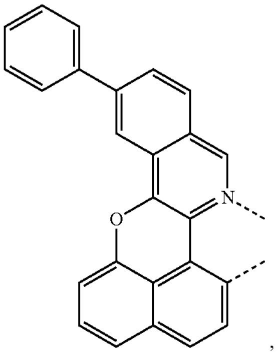
,
$L_{a1385}$
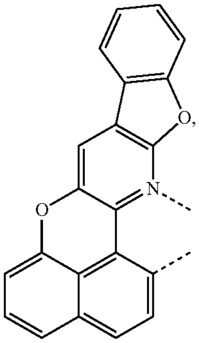
$L_{a1386}$
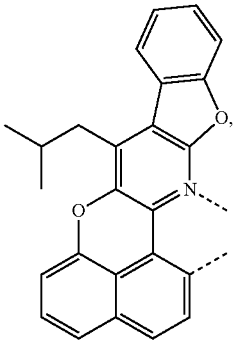
$L_{a1387}$
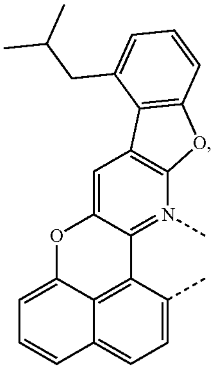
-continued
$L_{a1388}$
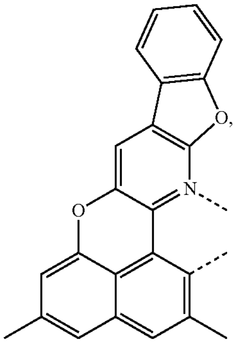
$L_{a1389}$
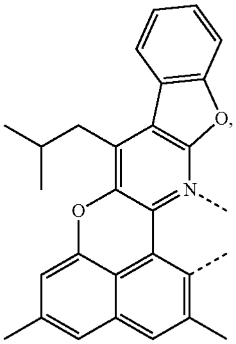
$L_{a1390}$
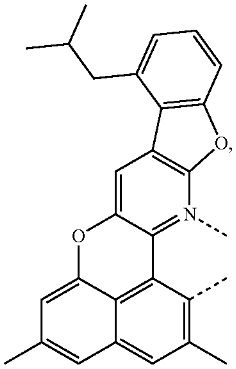
$L_{a1391}$
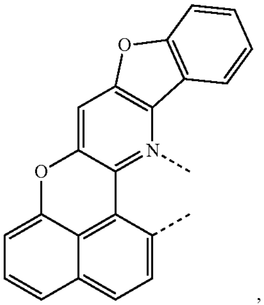
, $L_{a1392}$
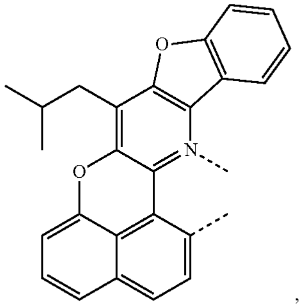
,
$L_{a1393}$
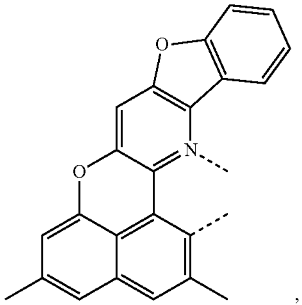
,
$L_{a1394}$
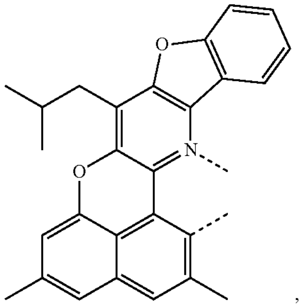
,
$L_{a1395}$
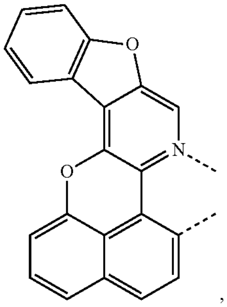
,
$L_{a1396}$
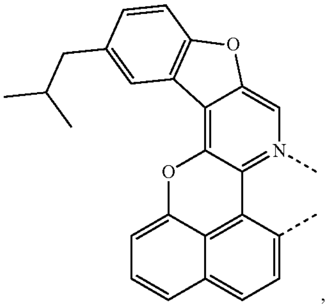
,
$L_{a1397}$
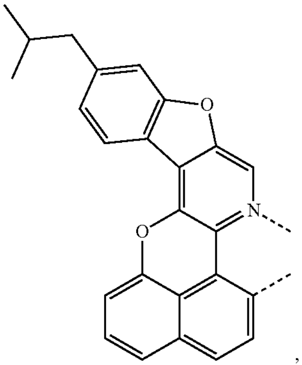
,
$L_{a1398}$
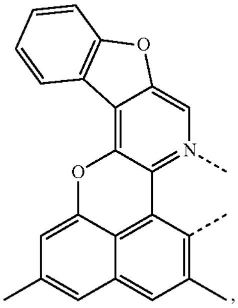
,
$L_{a1399}$
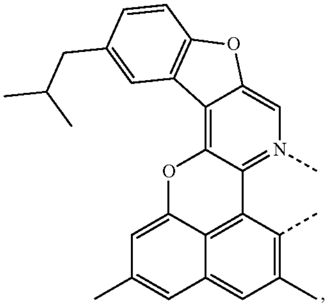
,
$L_{a1400}$
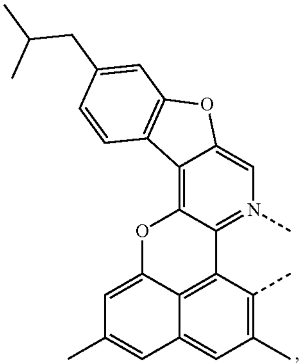
, -continued
$L_{a1401}$
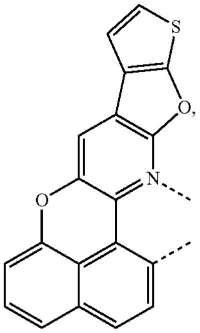
$L_{a1402}$
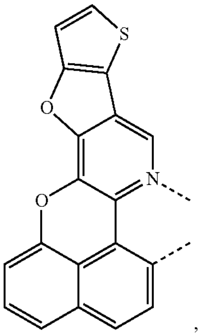
,
$L_{a1403}$
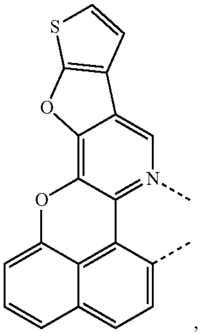
,
$L_{a1404}$
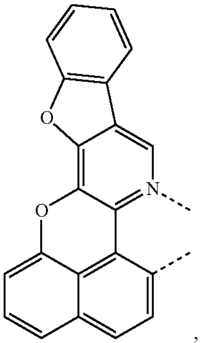
,
-continued
$L_{a1405}$
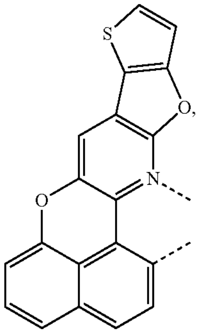
$L_{a1406}$
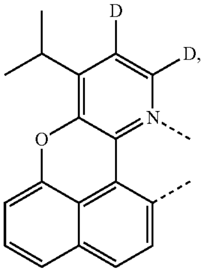
$L_{a1407}$
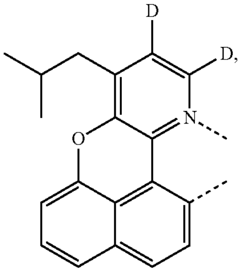
$L_{a1408}$
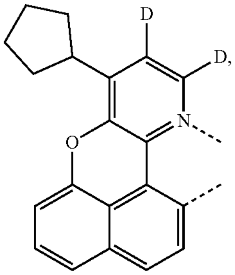
$L_{a1409}$
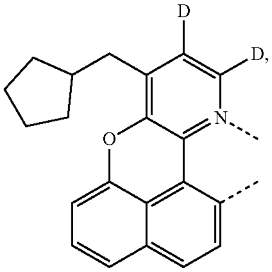

-continued
$L_{a1410}$
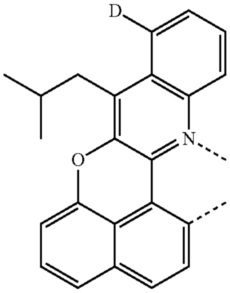
,
$L_{a1411}$
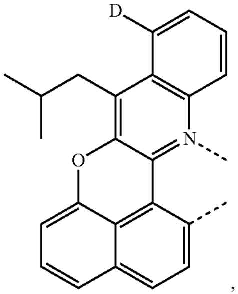
,
$L_{a1412}$
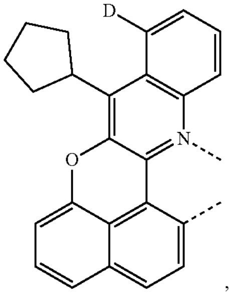
,
$L_{a1413}$
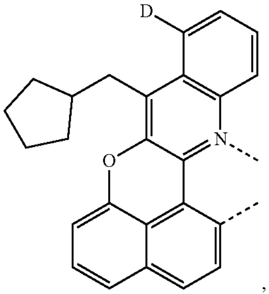
,
$L_{a1414}$
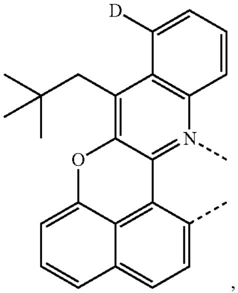
,
-continued
$L_{a1415}$
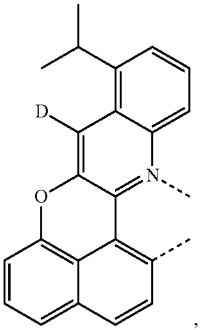
,
$L_{a1416}$
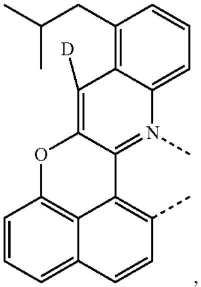
,
$L_{a1417}$
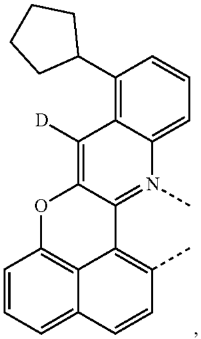
,
$L_{a1418}$
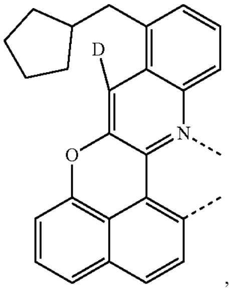
,
$L_{a1419}$
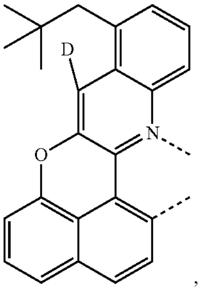
, -continued
$L_{a1420}$
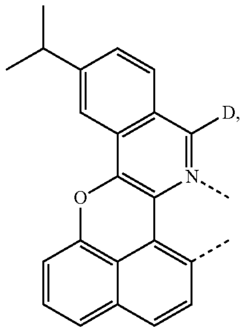
$L_{a1421}$
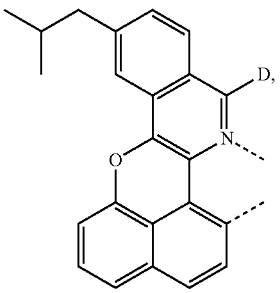
$L_{a1422}$
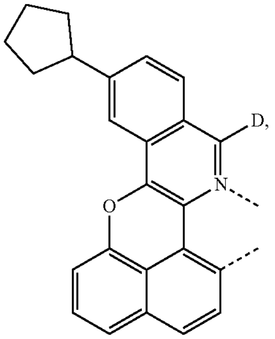
$L_{a1423}$
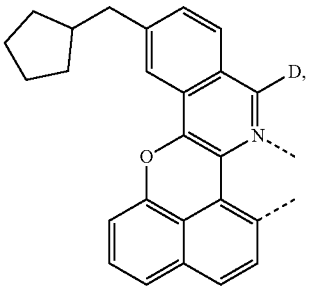
$L_{a1424}$
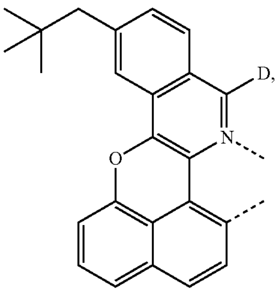
-continued
$L_{a1425}$
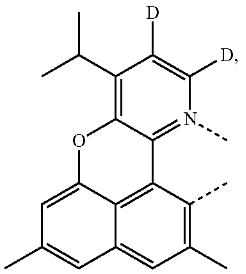
$L_{a1426}$
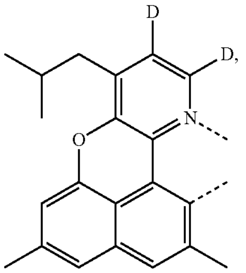
$L_{a1427}$
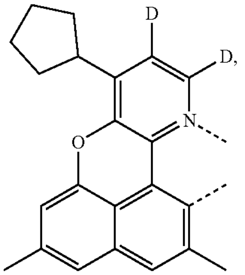
$L_{a1428}$
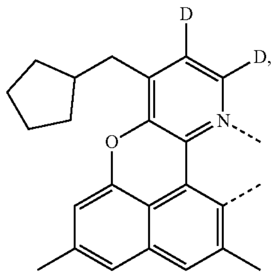
$L_{a1429}$
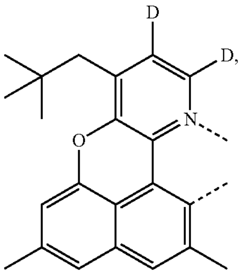

-continued
$L_{a1430}$
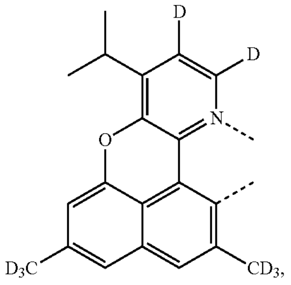
$L_{a1431}$
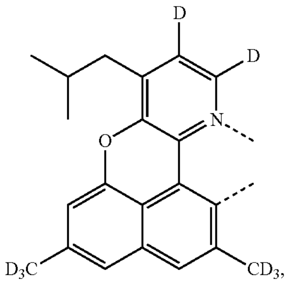
$L_{a1432}$
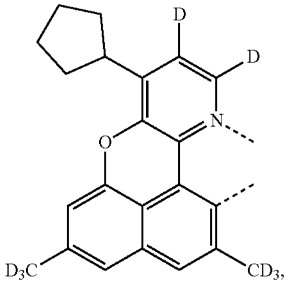
$L_{a1433}$
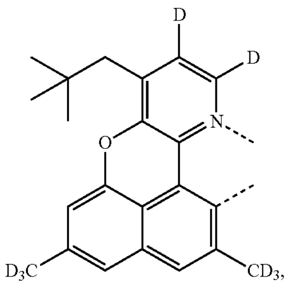
$L_{a1434}$
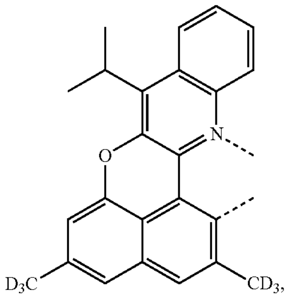
-continued
$L_{a1435}$
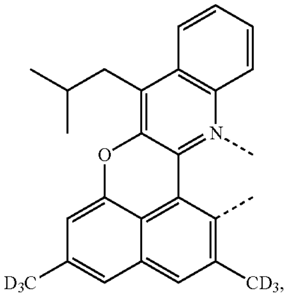
$L_{a1436}$
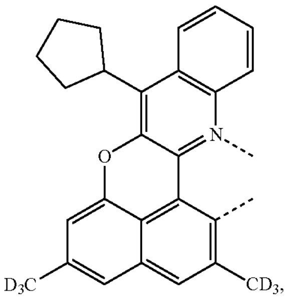
$L_{a1437}$
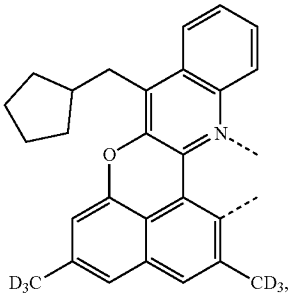
$L_{a1438}$
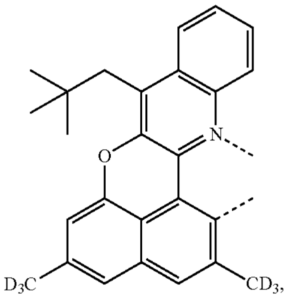
$L_{a1439}$
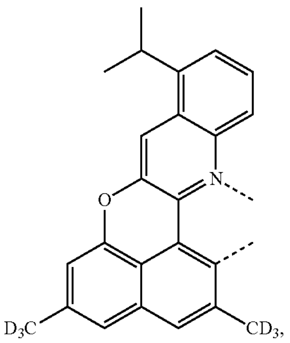

-continued
$L_{a1440}$
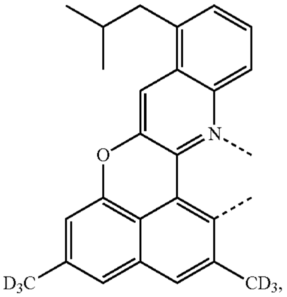
$L_{a1441}$
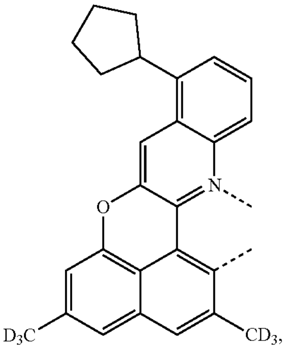
$L_{a1442}$
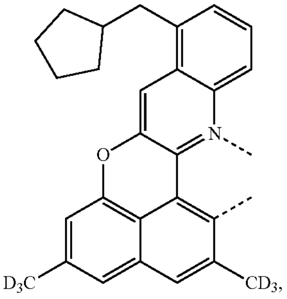
$L_{a1443}$
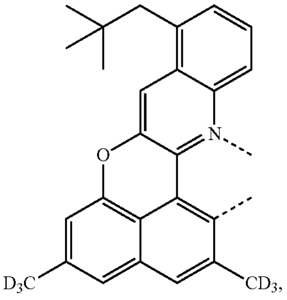
$L_{a1444}$
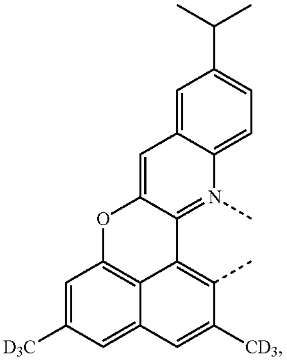
-continued
$L_{a1445}$
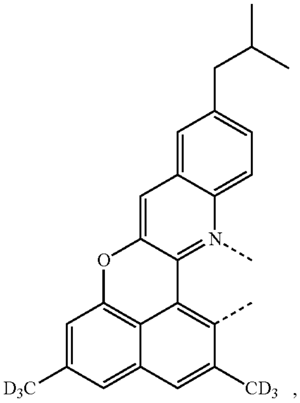
$L_{a1446}$
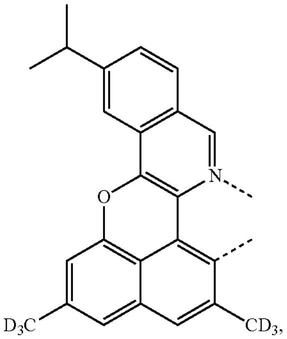
$L_{a1447}$
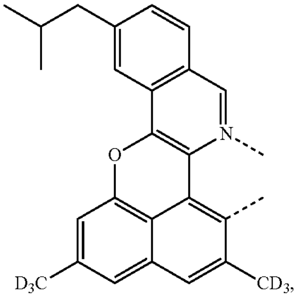
$L_{a1448}$
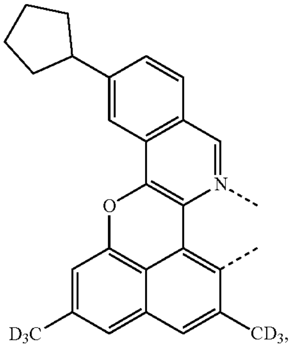

-continued
$L_{a1449}$
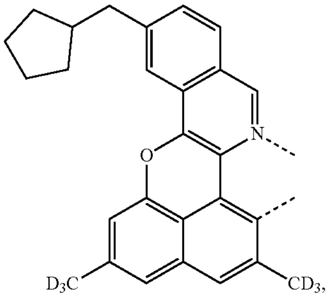
$L_{a1450}$
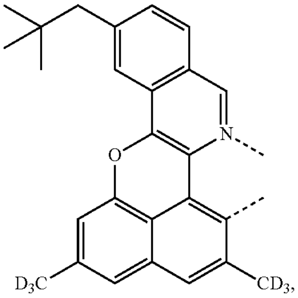
$L_{a1451}$
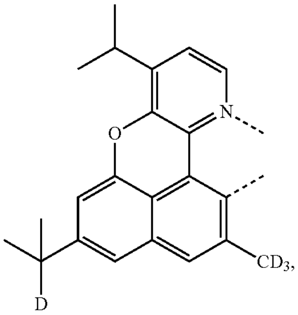
$L_{a1452}$
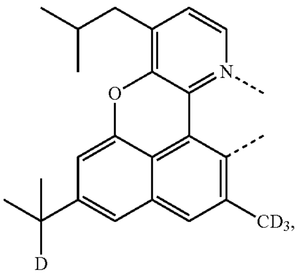
$L_{a1453}$
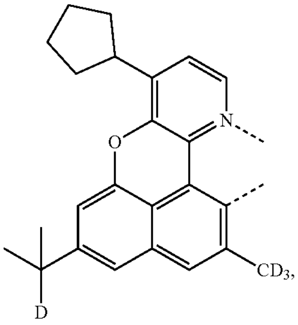
-continued
$L_{a1454}$
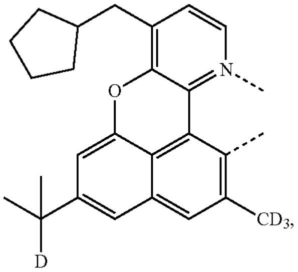
$L_{a1455}$
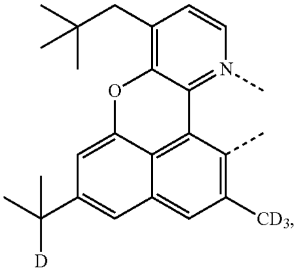
$L_{a1456}$
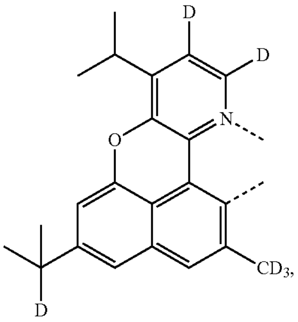
$L_{a1457}$
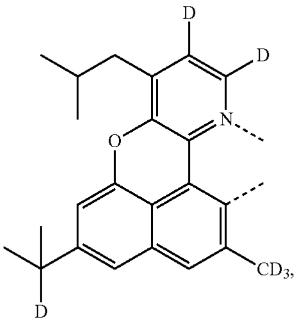
$L_{a1458}$
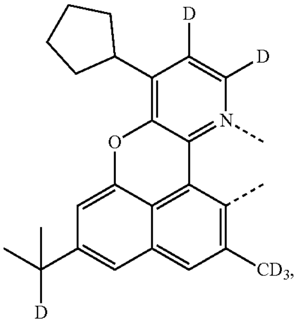

-continued
$L_{a1459}$
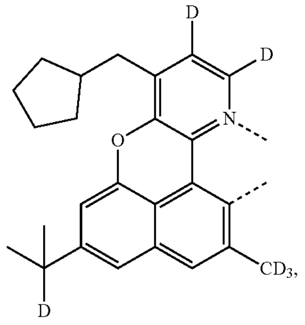
$L_{a1460}$
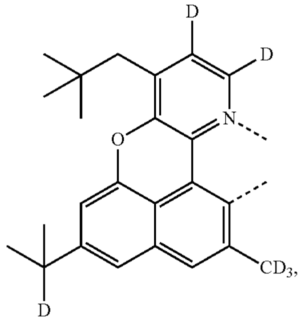
$L_{a1461}$
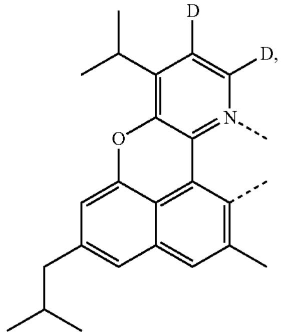
$L_{a1462}$
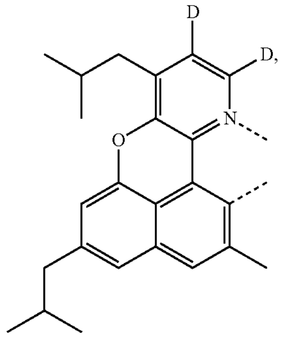
-continued
$L_{a1463}$
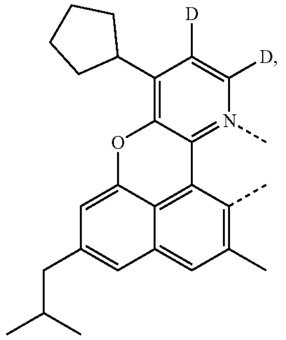
$L_{a1464}$
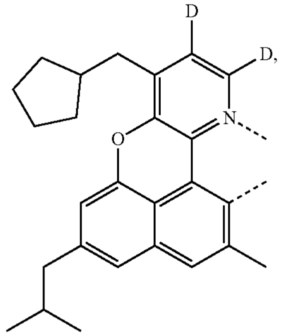
$L_{a1465}$
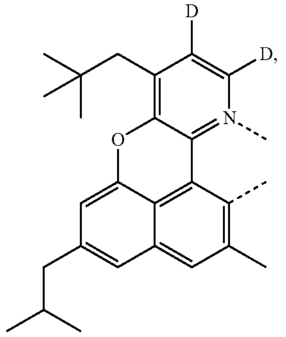
$L_{a1466}$
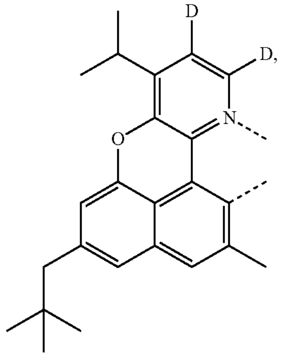

-continued
$L_{a1467}$
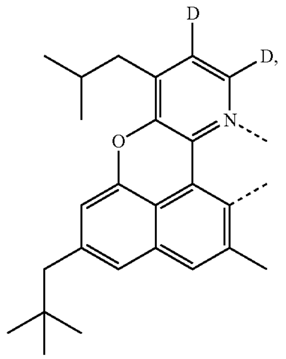
$L_{a1468}$
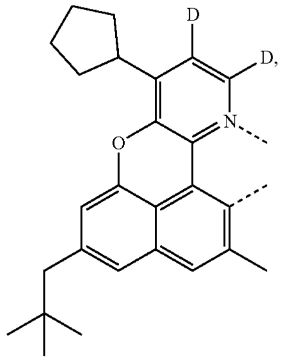
$L_{a1469}$
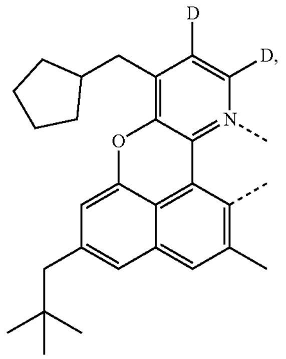
$L_{a1470}$
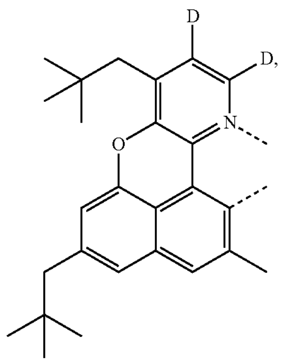
-continued
$L_{a1471}$
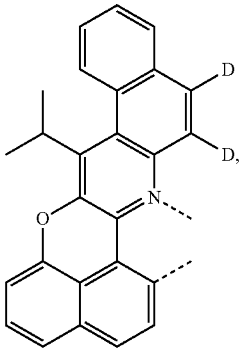
$L_{a1472}$
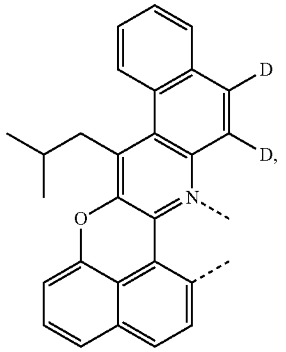
$L_{a1473}$
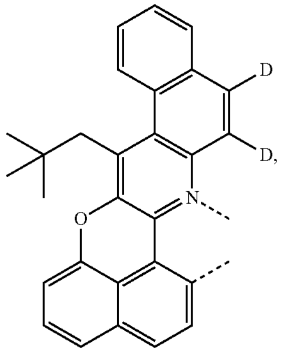
$L_{a1474}$
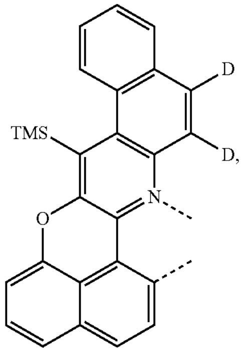

-continued
$L_{a1475}$
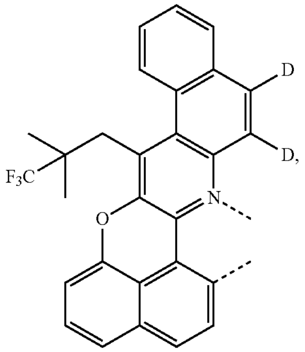
$L_{a1476}$
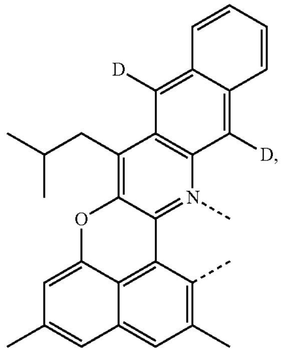
$L_{a1477}$
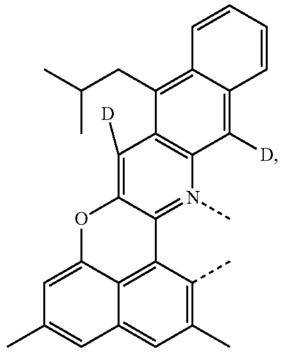
$L_{a1478}$
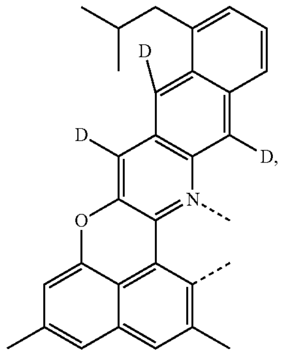
-continued
$L_{a1479}$
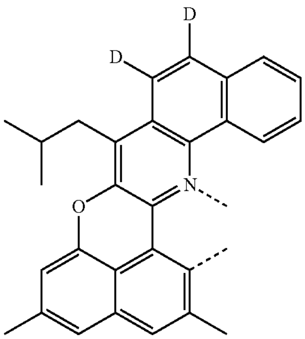
,
$L_{a1480}$
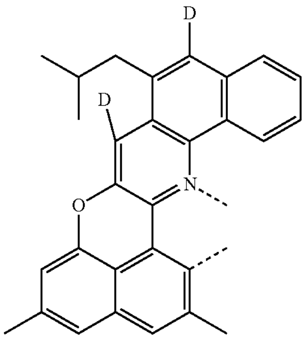
,
$L_{a1481}$
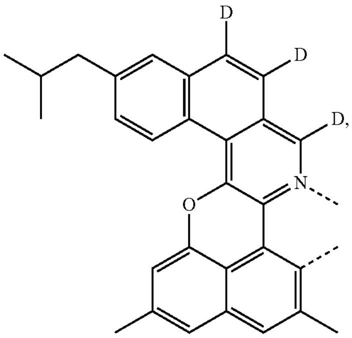
$L_{a1482}$
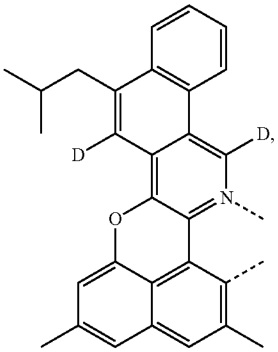

-continued
$L_{a1483}$
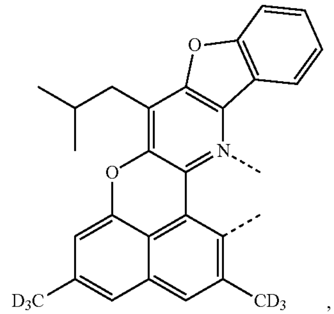
,
$L_{a1484}$
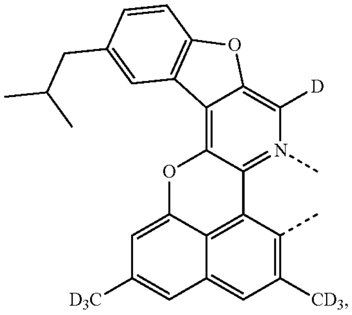
$L_{a1485}$
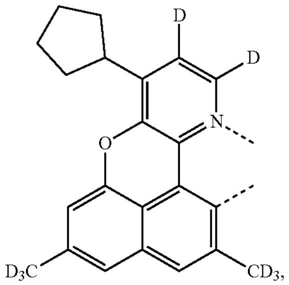
$L_{a1486}$
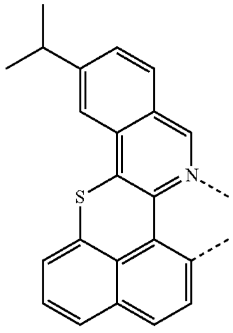
,
$L_{a1487}$
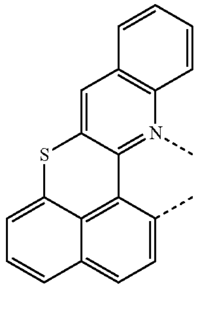
,
-continued
$L_{a1488}$
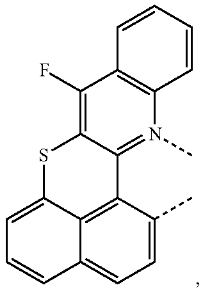
,
$L_{a1489}$
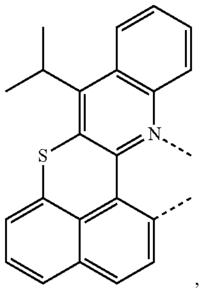
,
$L_{a1490}$
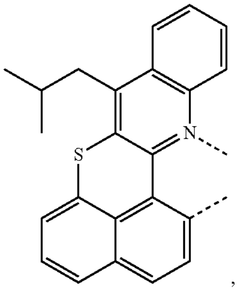
,
$L_{a1491}$
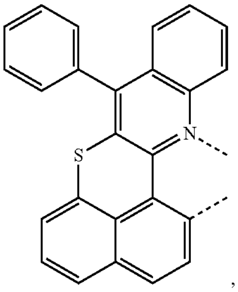
,
$L_{a1492}$
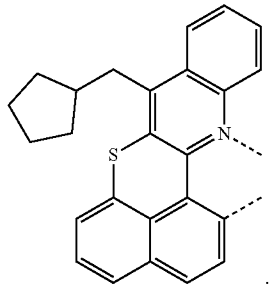
.
According to an embodiment of the present disclosure, wherein, the metal complex has a structure of $M(L_a)_m(L_b)_n(L_c)_q$;
the metal M is selected from a metal with a relative atomic mass greater than 40;

$L_a$, $L_b$ and $L_c$ are a first ligand, a second ligand and a third ligand of the metal complex, respectively; $L_a$, $L_b$ and $L_c$ can be optionally joined to form a multidentate ligand;

m is 1, 2 or 3, n is 0, 1 or 2, q is 0, 1 or 2, and m+n+q equals an oxidation state of the metal M;

when m is greater than 1, multiple $L_a$ may be the same or different; when n is 2, two $L_b$ may be the same or different; when q is 2, two $L_c$ may be the same or different;

$L_b$ and $L_c$ are, at each occurrence identically or differently, selected from the group consisting of the following structures:

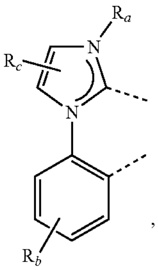 , 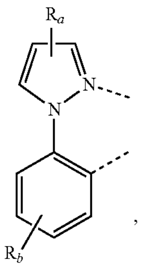 , 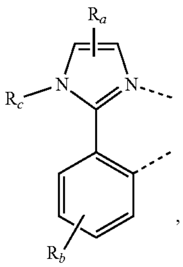 ,

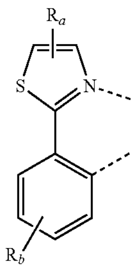 , 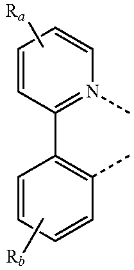 , 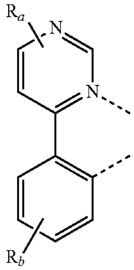 ,

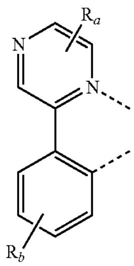 , 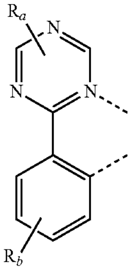 , 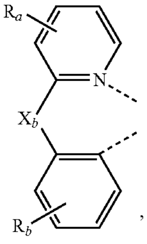 ,

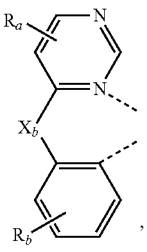 , 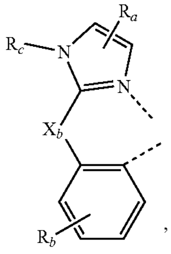 , and 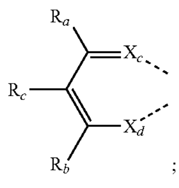 ;

$R_a$, $R_b$ and $R_c$ represent mono-substitution, multiple substitutions or non-substitution;

$X_b$ is, at each occurrence identically or differently, selected from the group consisting of: O, S, Se, $NR_{N1}$ and $CR_{C1}R_{C2}$;

$X_c$ and $X_d$ are, at each occurrence identically or differently, selected from the group consisting of: O, S, Se and $NR_{N2}$;

$R_a$, $R_b$, $R_c$, $R_{N1}$, $R_{N2}$, $R_{C1}$ and $R_{C2}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof; and adjacent substituents $R_a$, $R_b$, $R_c$, $R_{N1}$, $R_{N2}$, $R_{C1}$ and $R_{C2}$ can be optionally joined to form a ring.

In this embodiment, the expression that "adjacent substituents $R_a$, $R_b$, $R_c$, $R_{N1}$, $R_{N2}$, $R_{C1}$ and $R_{C2}$ can be optionally joined to form a ring" is intended to mean that any one or more of groups of adjacent substituents, such as two substituents $R_a$, two substituents $R_b$, two substituents $R_c$, substituents $R_a$ and $R_b$, substituents $R_a$ and $R_c$, substituents $R_b$ and $R_c$, substituents $R_a$ and $R_{N1}$, substituents $R_b$ and $R_{N1}$, substituents $R_a$ and $R_{C1}$, substituents $R_a$ and $R_{C2}$, substituents $R_b$ and $R_{C1}$, substituents $R_b$ and $R_{C2}$, substituents $R_a$ and $R_{N2}$, substituents $R_b$ and $R_{N2}$, and substituents $R_{C1}$ and $R_{C2}$, may be joined to form a ring. Obviously, it is possible that none of these substituents are joined to form a ring.

In this embodiment, the expression that $L_a$, $L_b$ and $L_c$ can be optionally joined to form a multidentate ligand is intended to mean that any two or three of $L_a$, $L_b$ and $L_c$ can be joined to form a tetradentate ligand or a hexadentate ligand. Obviously, it is possible that none of $L_a$, $L_b$ and $L_c$ are joined to form a multidentate ligand.

According to an embodiment of the present disclosure, wherein, the metal complex has a structure of $M(L_a)_m(L_b)_n$;

the metal M is selected from a metal with a relative atomic mass greater than 40; $L_a$ and $L_b$ are a first ligand and a second ligand of the metal complex, respectively; $L_a$ and $L_b$ can be optionally joined to form a multidentate ligand;

m is 1, 2 or 3, n is 0, 1 or 2, and m+n equals an oxidation state of the metal M;

when m is greater than 1, multiple $L_a$ may be the same or different; when n is 2, two $L_b$ may be the same or different; and $L_b$ is, at each occurrence identically or differently, selected from the following structure:

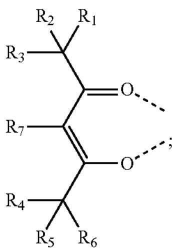

$R_1$ to $R_7$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a sulfanyl group, a sulfinyl group, a sulfonyl group, a phosphino group and combinations thereof.

In this embodiment, the expression that $L_a$ and $L_b$ can be optionally joined to form a multidentate ligand is intended to mean that any two or all of the ligands $L_a$ and $L_b$, such as two $L_a$, two $L_b$, one $L_a$ and one $L_b$, or all of $L_a$ and $L_b$, can be joined to form a tetradentate ligand or a hexadentate ligand. Obviously, it is possible that none of $L_a$ and $L_b$ are joined to form a multidentate ligand.

According to an embodiment of the present disclosure, wherein, $L_b$ is, at each occurrence identically or differently, selected from the following structure:

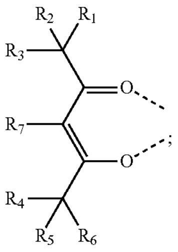

wherein at least one of $R_1$ to $R_3$ is selected from substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms or a combination thereof; and/or at least one of $R_4$ to $R_6$ is substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms or a combination thereof.

According to an embodiment of the present disclosure, wherein, $L_b$ is, at each occurrence identically or differently, selected from the following structure:

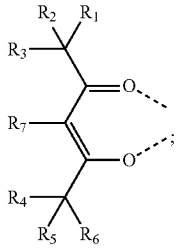

wherein at least two of $R_1$ to $R_3$ are selected from substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms or a combination thereof; and/or at least two of $R_4$ to $R_6$ are substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms or a combination thereof.

According to an embodiment of the present disclosure, wherein, $L_b$ is, at each occurrence identically or differently, selected from the following structure:

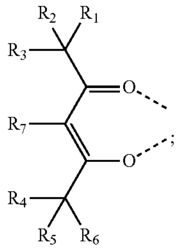

wherein at least two of $R_1$ to $R_3$ are selected from substituted or unsubstituted alkyl having 2 to 20 carbon atoms, substituted or unsubstituted cycloalkyl having 3 to 20 ring carbon atoms, substituted or unsubstituted heteroalkyl having 2 to 20 carbon atoms or a combination thereof; and/or at least two of $R_4$ to $R_6$ are selected from substituted or unsubstituted alkyl having 2 to 20 carbon atoms, substituted or unsubstituted cycloalkyl having 3 to 20 ring carbon atoms, substituted or unsubstituted heteroalkyl having 2 to 20 carbon atoms or a combination thereof.

According to an embodiment of the present disclosure, wherein, the metal M is selected from Ir, Rh, Re, Os, Pt, Au or Cu.

According to an embodiment of the present disclosure, wherein, the metal M is selected from Ir, Pt or Os.

According to an embodiment of the present disclosure, wherein, the metal M is Ir.

According to an embodiment of the present disclosure, wherein, $L_b$ is, at each occurrence identically or differently, selected from the group consisting of $L_{b1}$ to $L_{b322}$, and $L_c$ is, at each occurrence identically or differently, selected from the group consisting of $L_{c1}$ to $L_{c231}$. The specific structures of $L_{b1}$ to $L_{b322}$ are as follows:

-continued
$L_{b1}$
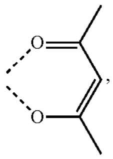
,
$L_{b2}$
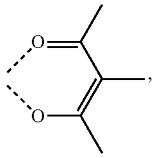
,
$L_{b3}$
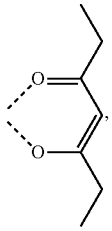
,
$L_{b4}$
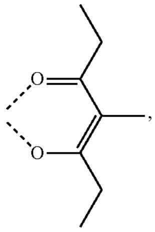
,
$L_{b5}$
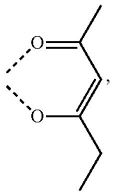
,
$L_{b6}$
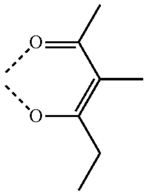
,
$L_{b7}$
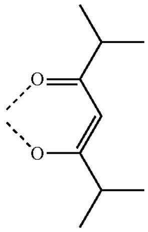
,
$L_{b8}$
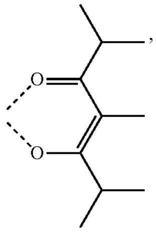
,
$L_{b9}$
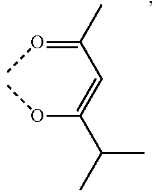
,
$L_{b10}$
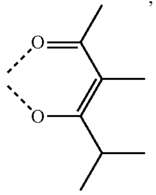
,
$L_{b11}$
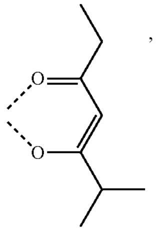
,
$L_{b12}$
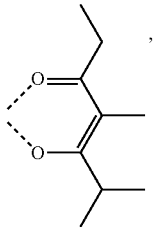
,
$L_{b13}$
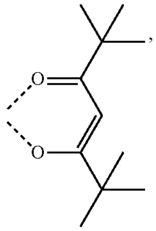
, -continued
$L_{b14}$
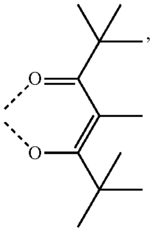
$L_{b15}$
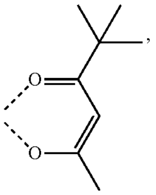
$L_{b16}$
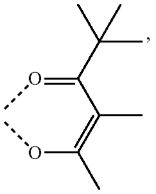
$L_{b17}$
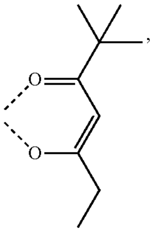
$L_{b18}$
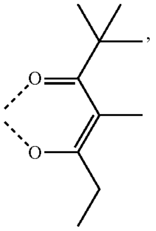
$L_{b19}$
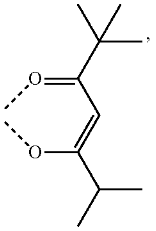
$L_{b20}$
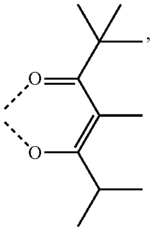
-continued
$L_{b21}$
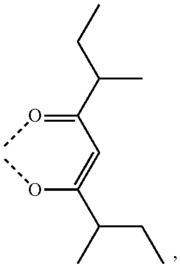
$L_{b22}$
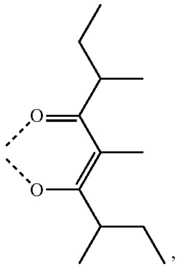
$L_{b23}$
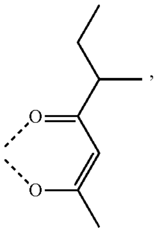
$L_{b24}$
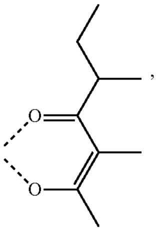
$L_{b25}$
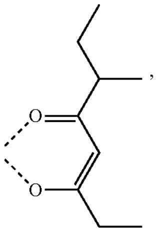
$L_{b26}$
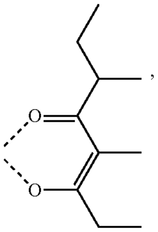

-continued
$L_{b27}$
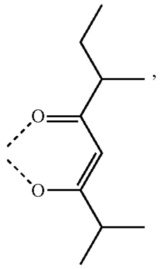
$L_{b28}$
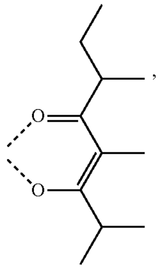
$L_{b29}$
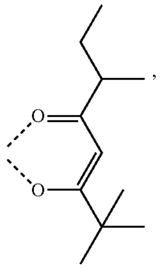
$L_{b30}$
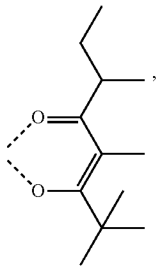
$L_{b31}$
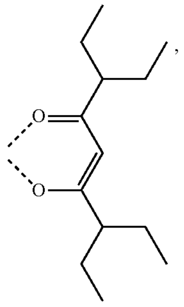
-continued
$L_{b32}$
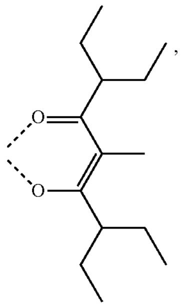
$L_{b33}$
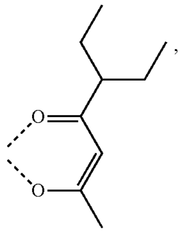
$L_{b34}$
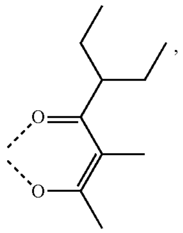
$L_{b35}$
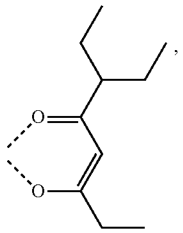
$L_{b36}$
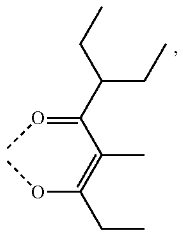
$L_{b37}$
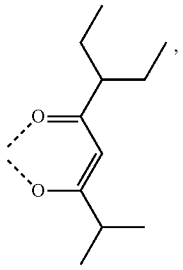

-continued
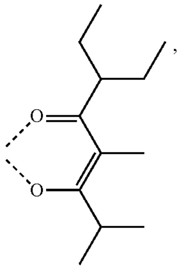
$L_{b38}$
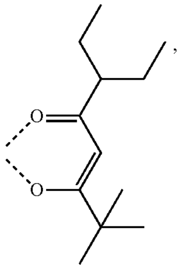
$L_{b39}$
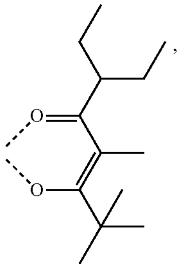
$L_{b40}$
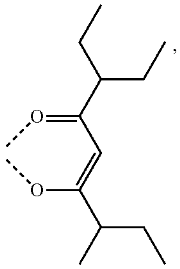
$L_{b41}$
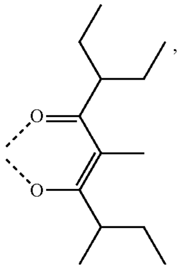
$L_{b42}$
-continued
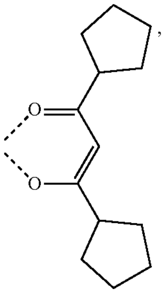
$L_{b43}$
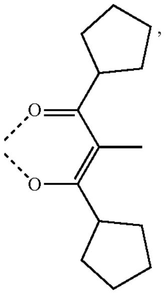
$L_{b44}$
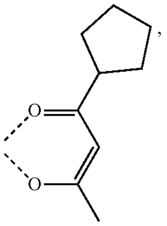
$L_{b45}$
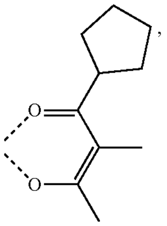
$L_{b46}$
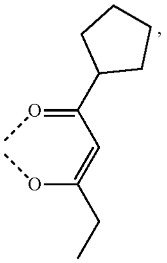
$L_{b47}$
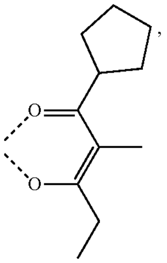
$L_{b48}$ -continued
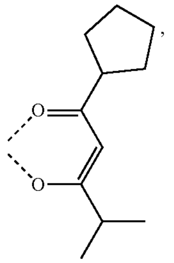
$L_{b49}$
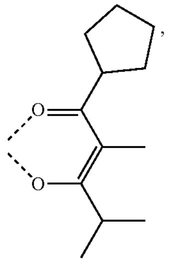
$L_{b50}$
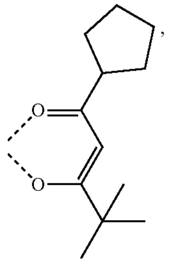
$L_{b51}$
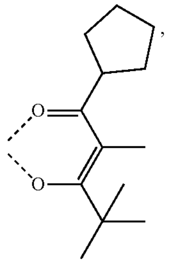
$L_{b52}$
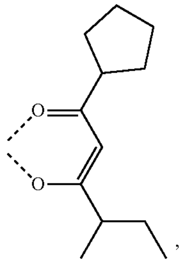
$L_{b53}$
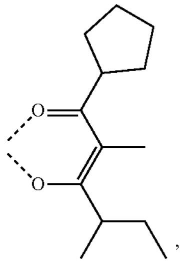
$L_{b54}$
-continued
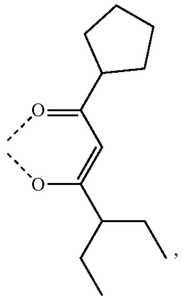
$L_{b55}$
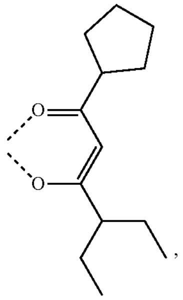
$L_{b56}$
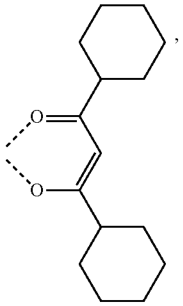
$L_{b57}$
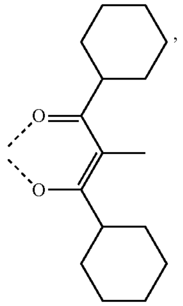
$L_{b58}$
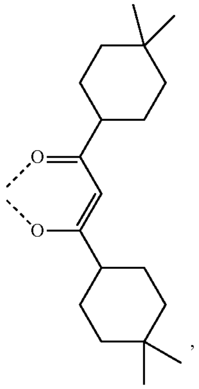
$L_{b59}$ -continued
Lb60
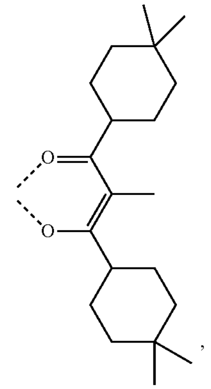
Lb61
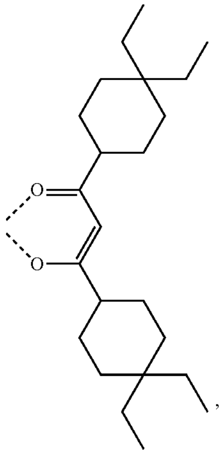
Lb62
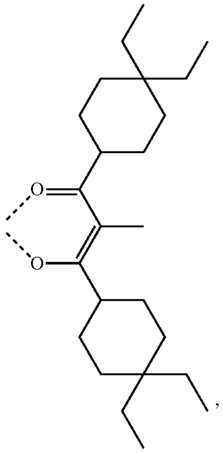
Lb63
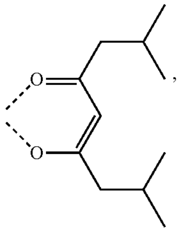
-continued
Lb64
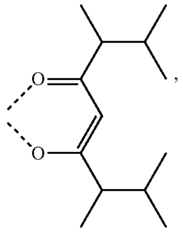
Lb65
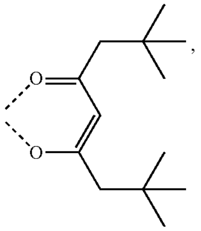
Lb66
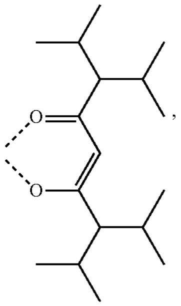
Lb67
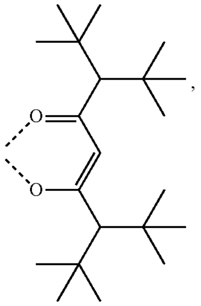
Lb68
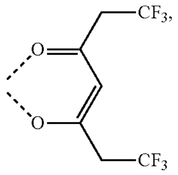
Lb69
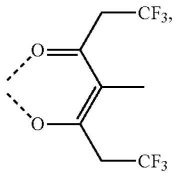

-continued
L$_{b70}$
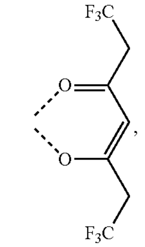
L$_{b71}$
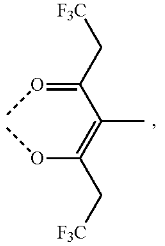
L$_{b72}$
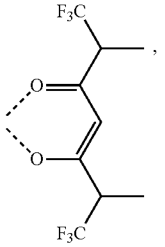
L$_{b73}$
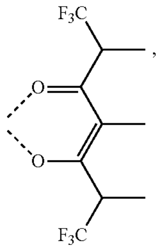
L$_{b74}$
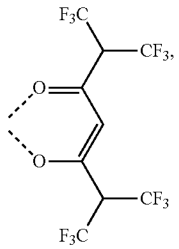
L$_{b75}$
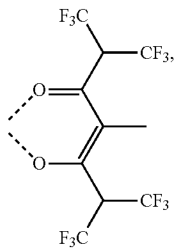
-continued
L$_{b76}$
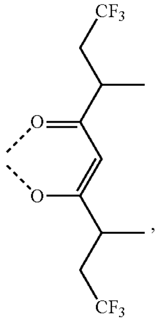
L$_{b77}$
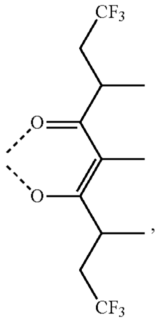
L$_{b78}$
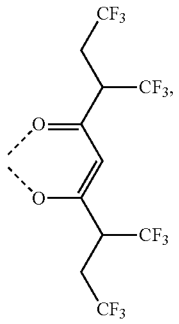
L$_{b79}$
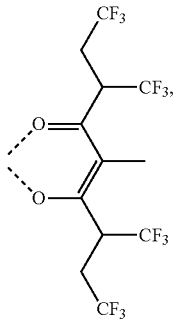

-continued
$L_{b80}$
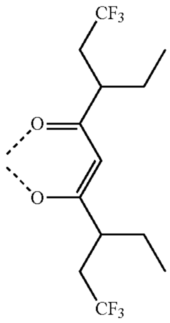
,
$L_{b81}$
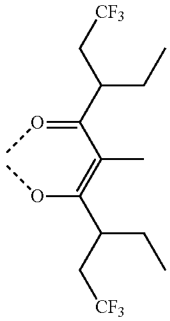
,
$L_{b82}$
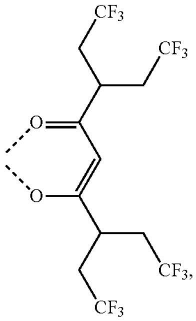
,
$L_{b83}$
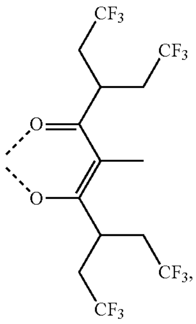
,
$L_{b84}$
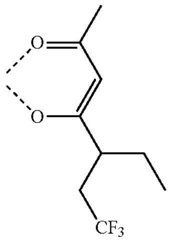
,
-continued
$L_{b85}$
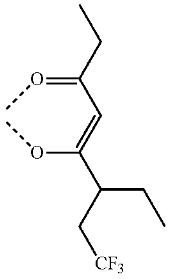
,
$L_{b86}$
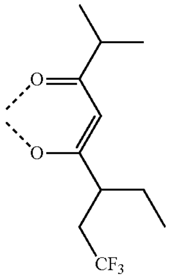
,
$L_{b87}$
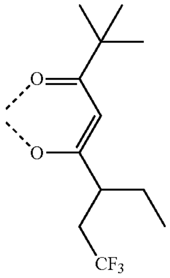
,
$L_{b88}$
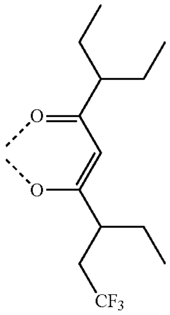
,
$L_{b89}$
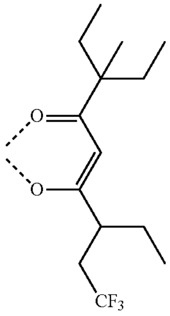
, -continued
$L_{b90}$
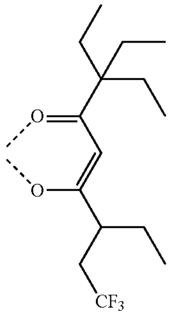
$L_{b91}$
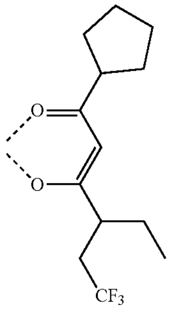
,
$L_{b92}$
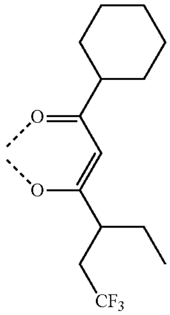
,
$L_{b93}$
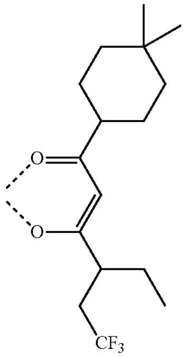
,
-continued
$L_{b94}$
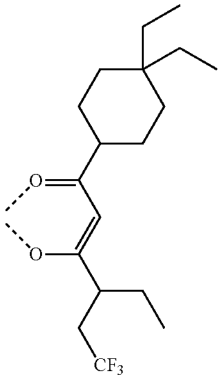
,
$L_{b95}$
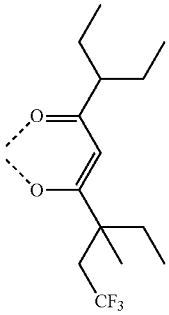
,
$L_{b96}$
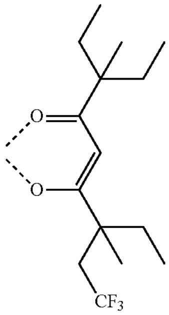
,
$L_{b97}$
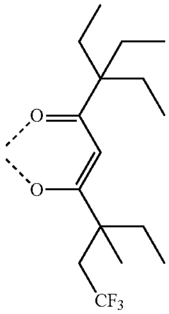
, -continued
$L_{b98}$
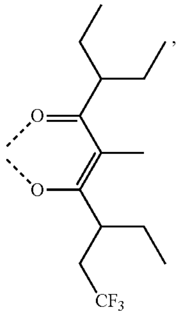
$L_{b99}$
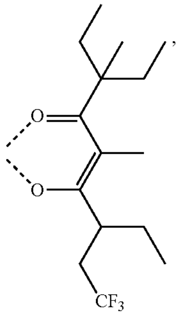
$L_{b100}$
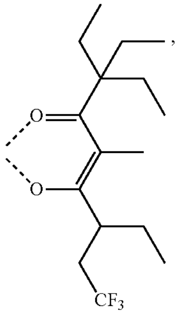
$L_{b101}$
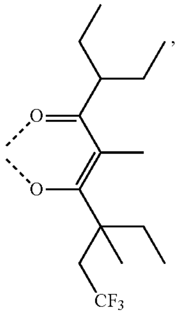
$L_{b102}$
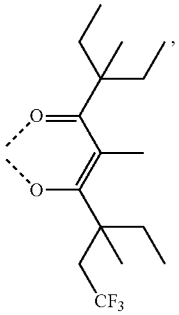
-continued
$L_{b103}$
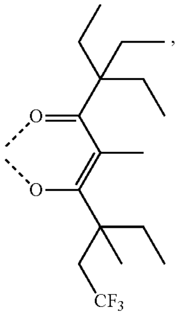
$L_{b104}$
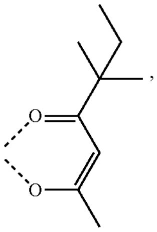
$L_{b105}$
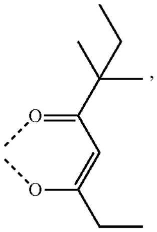
$L_{b106}$
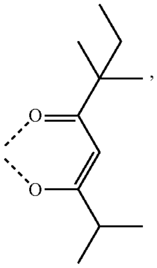
$L_{b107}$
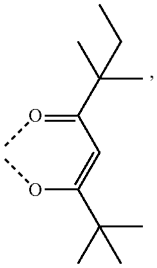

$L_{b108}$
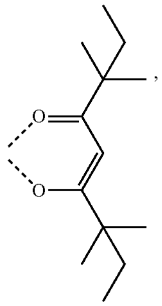
$L_{b109}$
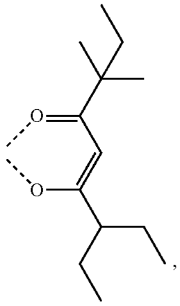
$L_{b110}$
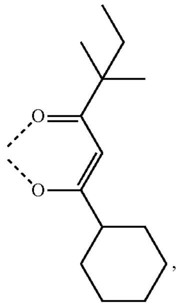
$L_{b111}$
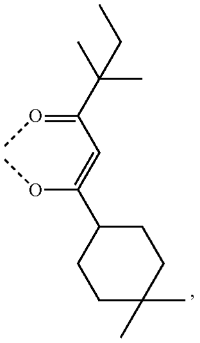
$L_{b112}$
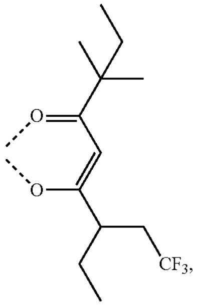
$L_{b113}$
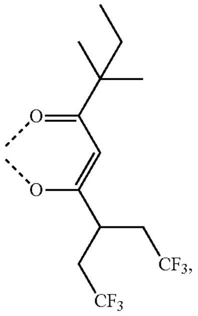
$L_{b114}$
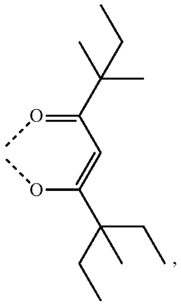
$L_{b115}$
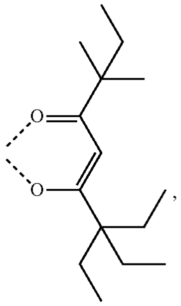
$L_{b116}$
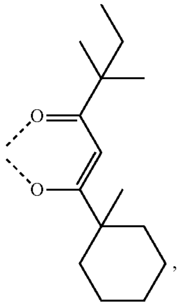
$L_{b117}$
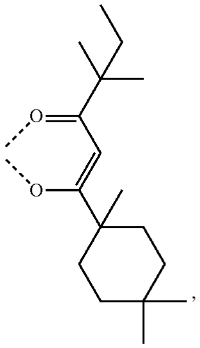

-continued
L$_{b118}$
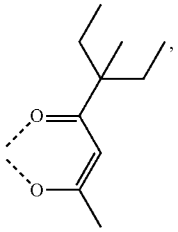
L$_{b119}$
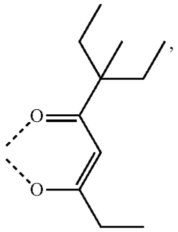
L$_{b120}$
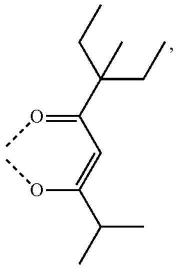
L$_{b121}$
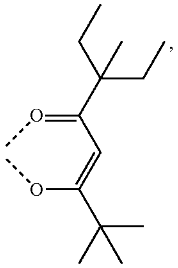
L$_{b122}$
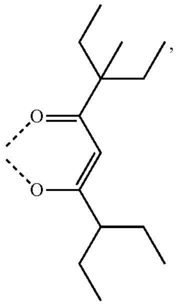
-continued
L$_{b123}$
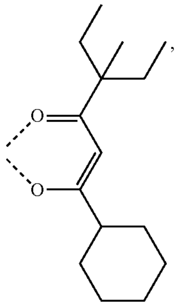
L$_{b124}$
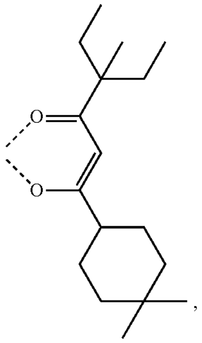
L$_{b125}$
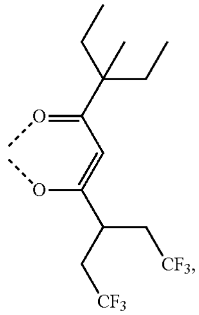
L$_{b126}$
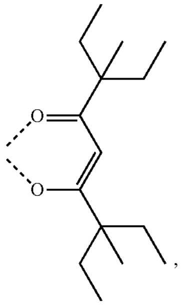
L$_{b127}$
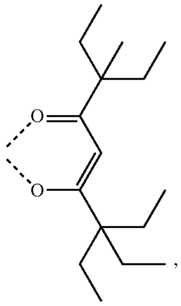

$L_{b128}$
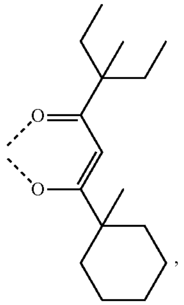
$L_{b129}$
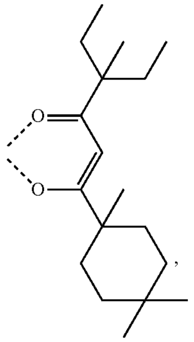
$L_{b130}$
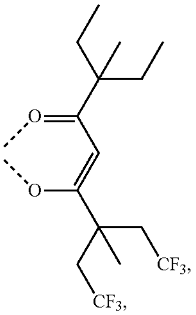
$L_{b131}$
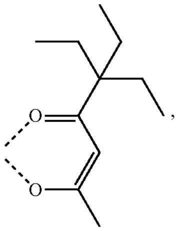
$L_{b132}$
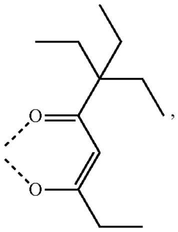
$L_{b133}$
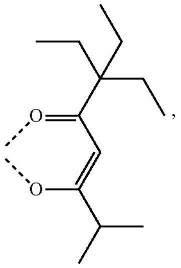
$L_{b134}$
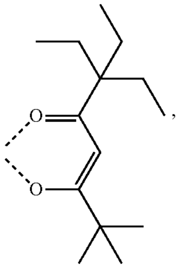
$L_{b135}$
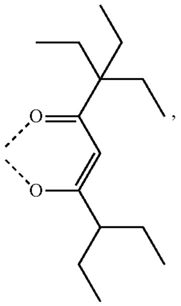
$L_{b136}$
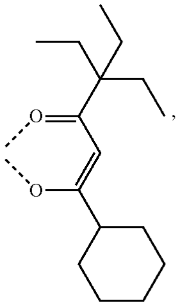
$L_{b137}$
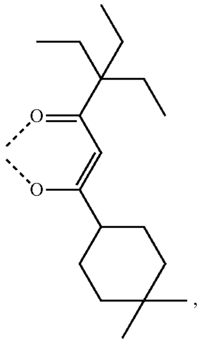

-continued
$L_{b138}$
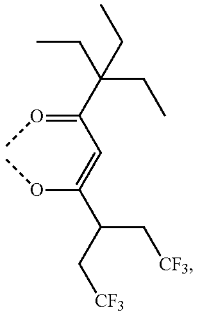
$L_{b139}$
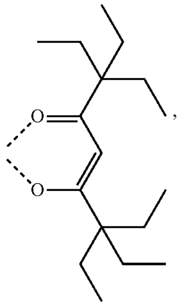
$L_{b140}$
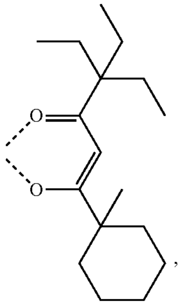
$L_{b141}$
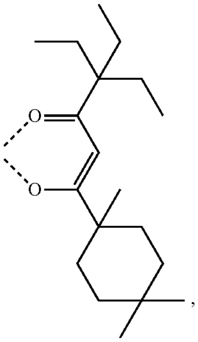
$L_{b142}$
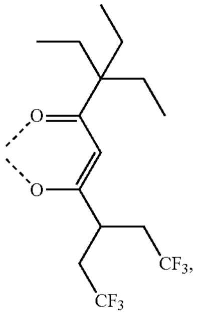
-continued
$L_{b143}$
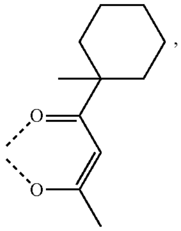
$L_{b144}$
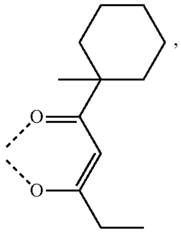
$L_{b145}$
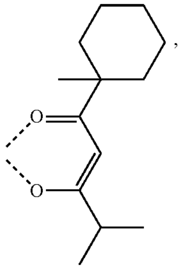
$L_{b146}$
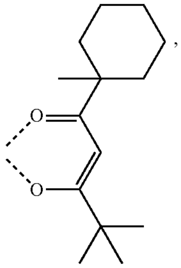
$L_{b147}$
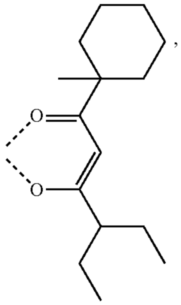

-continued
$L_{b148}$
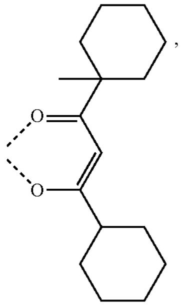
,
$L_{b149}$
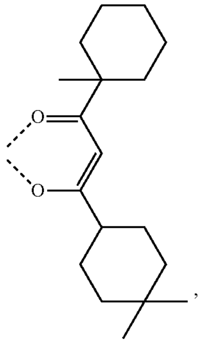
,
$L_{b150}$
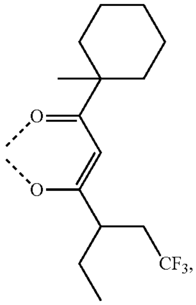
,
$L_{b151}$
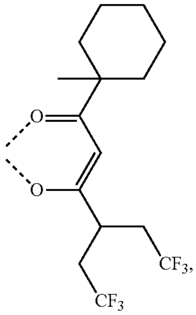
,
$L_{b152}$
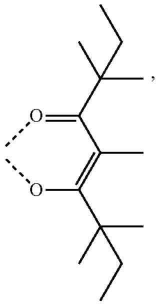
,
-continued
$L_{b153}$
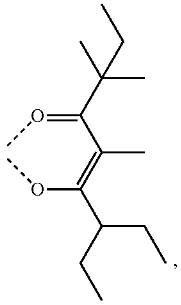
,
$L_{b154}$
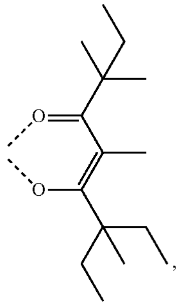
,
$L_{b155}$
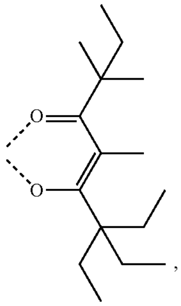
,
$L_{b156}$
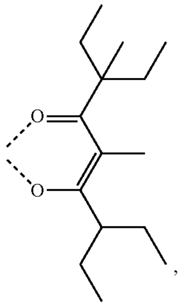
,
$L_{b157}$
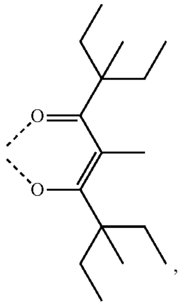
, -continued
$L_{b158}$
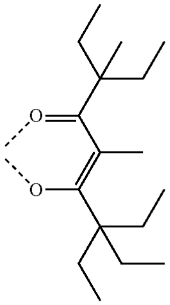
,
$L_{b159}$
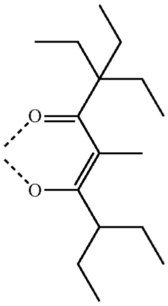
,
$L_{b160}$
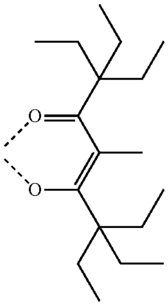
,
$L_{b161}$
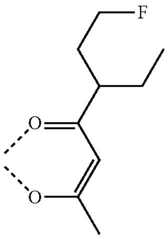
,
$L_{b162}$
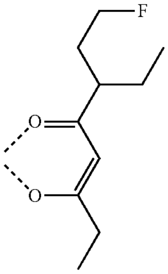
,
-continued
$L_{b163}$
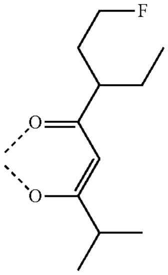
,
$L_{b164}$
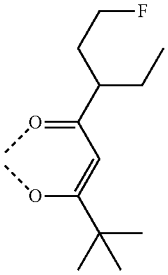
,
$L_{b165}$
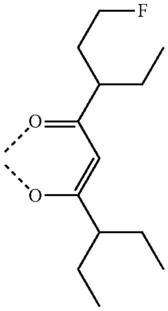
,
$L_{b166}$
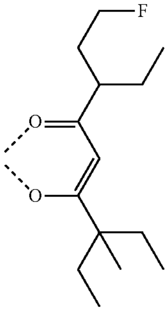
,
$L_{b167}$
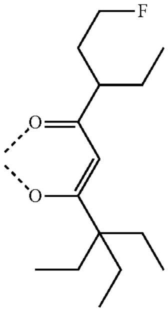
, -continued
$L_{b168}$
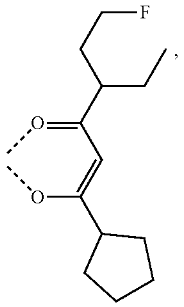
$L_{b169}$
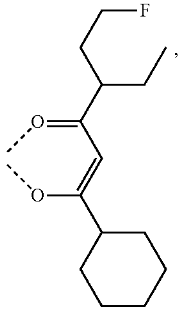
$L_{b170}$
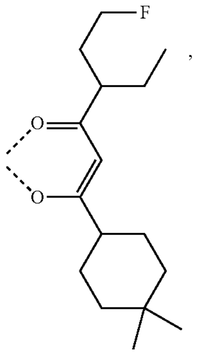
$L_{b171}$
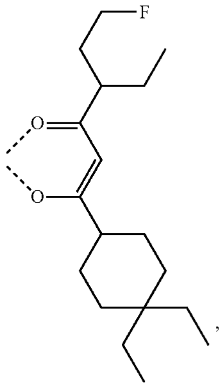
-continued
$L_{b172}$
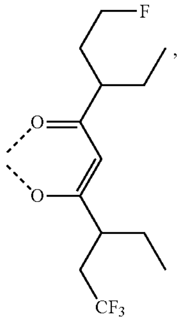
$L_{b173}$
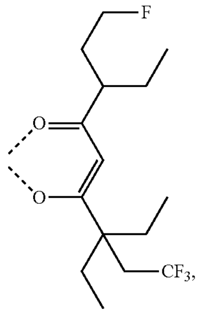
$L_{b174}$
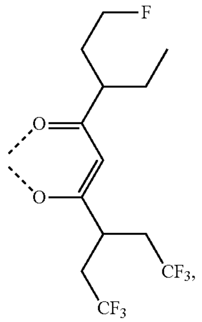
$L_{b175}$
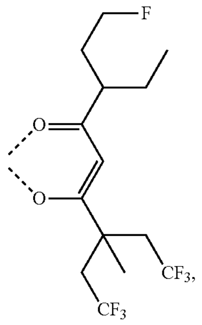
$L_{b176}$
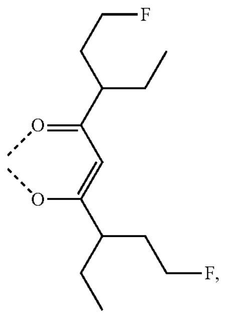

-continued
$L_{b177}$
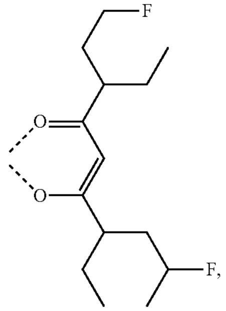
$L_{b178}$
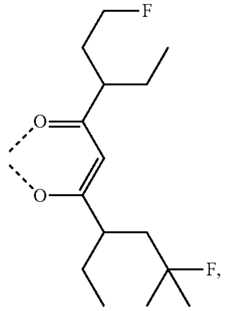
$L_{b179}$
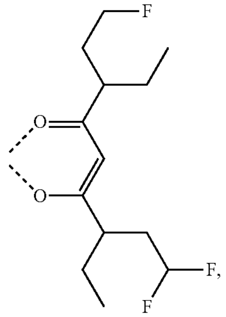
$L_{b180}$
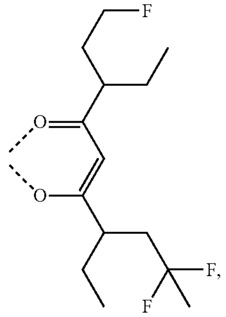
$L_{b181}$
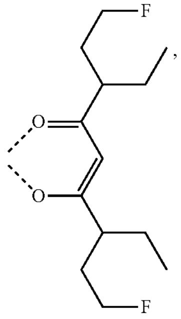
$L_{b182}$
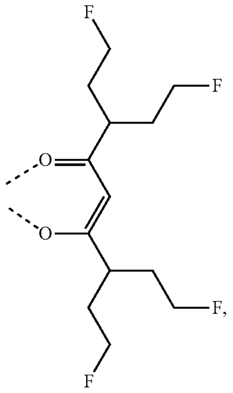
$L_{b183}$
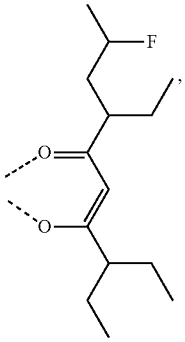
$L_{b184}$
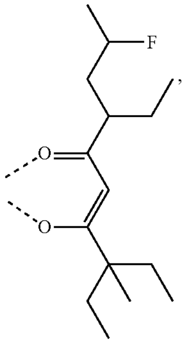
$L_{b185}$
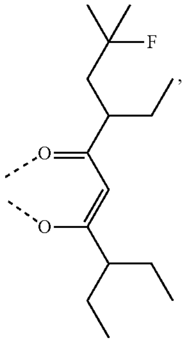

-continued
L$_{b186}$
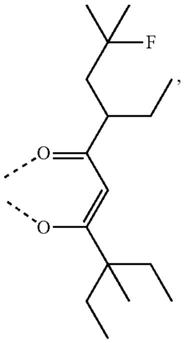
L$_{b187}$
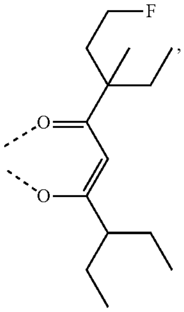
L$_{b188}$
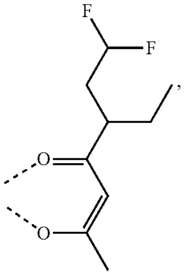
L$_{b189}$
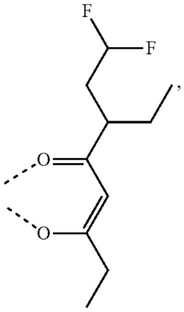
L$_{b190}$
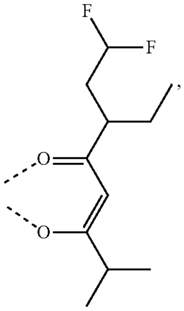
-continued
L$_{b191}$
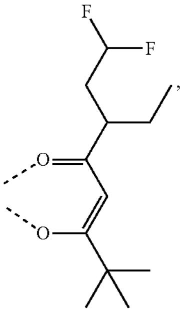
L$_{b192}$
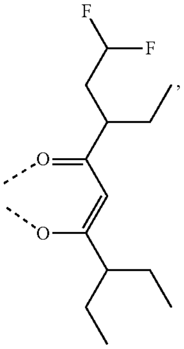
L$_{b193}$
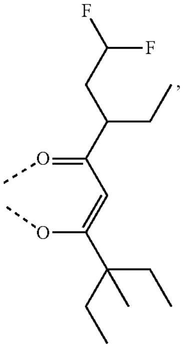
L$_{b194}$
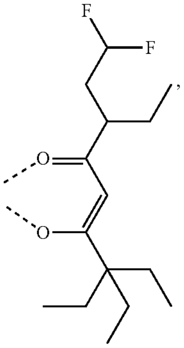

-continued
$L_{b195}$
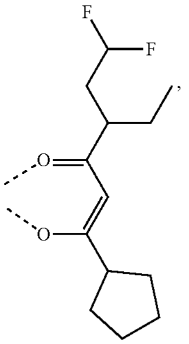
$L_{b196}$
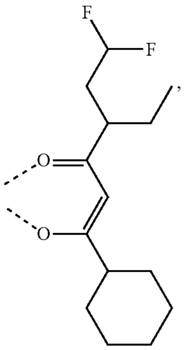
$L_{b197}$
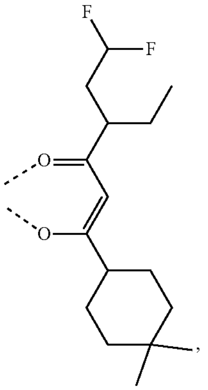
$L_{b198}$
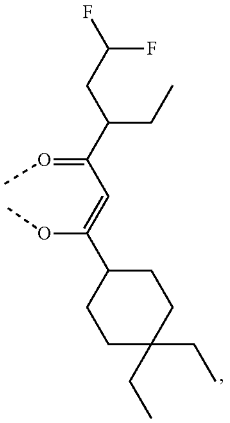
-continued
$L_{b199}$
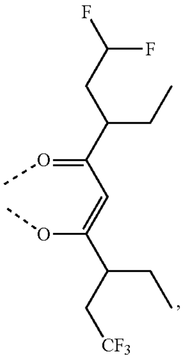
$L_{b200}$
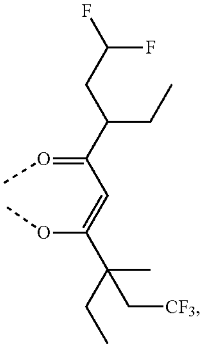
$L_{b201}$
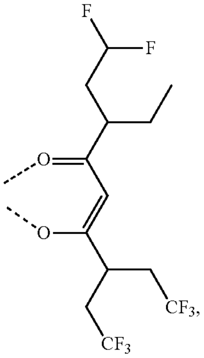
$L_{b202}$
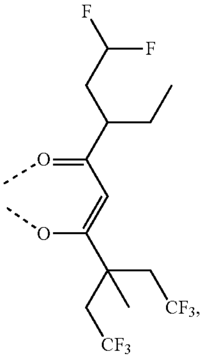

-continued
$L_{b203}$
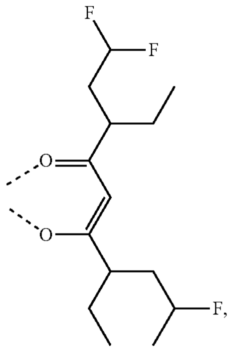
$L_{b204}$
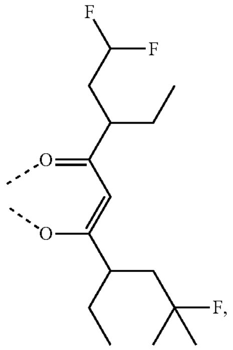
$L_{b205}$
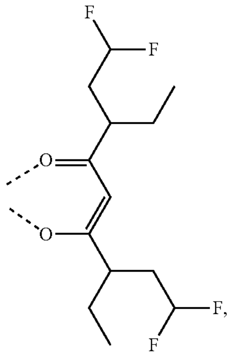
$L_{b206}$
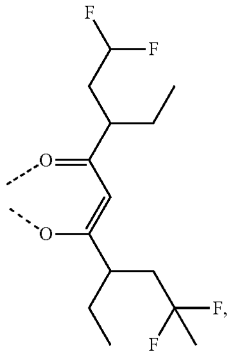
-continued
$L_{b207}$
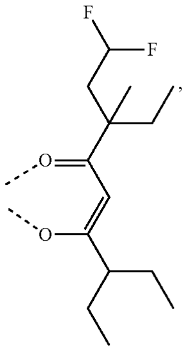
$L_{b208}$
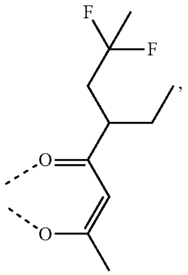
$L_{b209}$
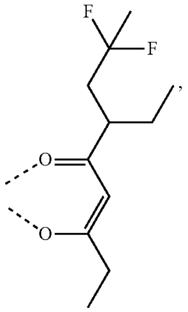
$L_{b210}$
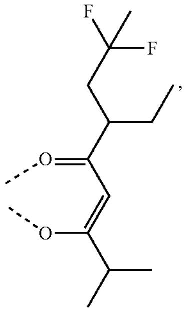
$L_{b211}$
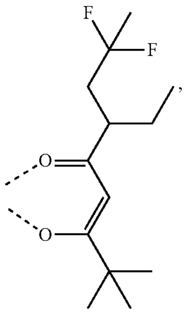

-continued
$L_{b212}$
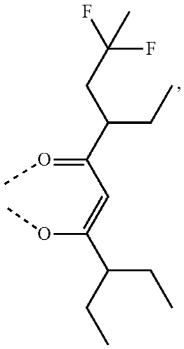
$L_{b213}$
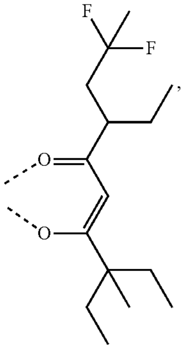
$L_{b214}$
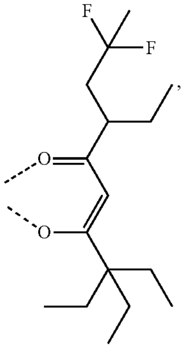
$L_{b215}$
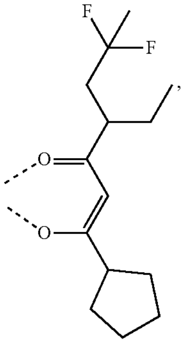
-continued
$L_{b216}$
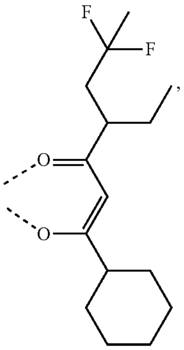
$L_{b217}$
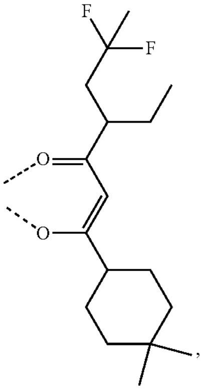
$L_{b218}$
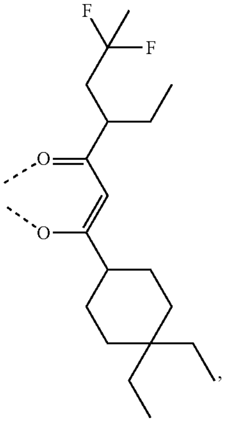
$L_{b219}$
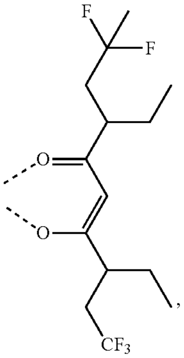

-continued
$L_{b220}$
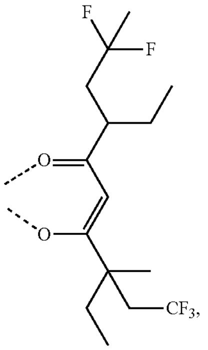
$L_{b221}$
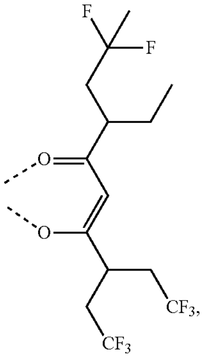
$L_{b222}$
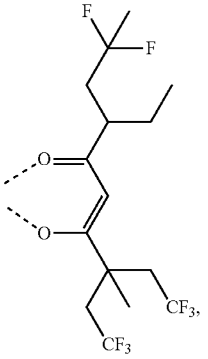
$L_{b223}$
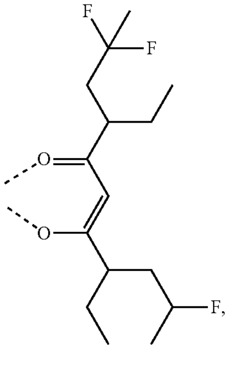
-continued
$L_{b224}$
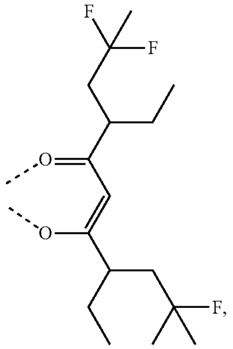
$L_{b225}$
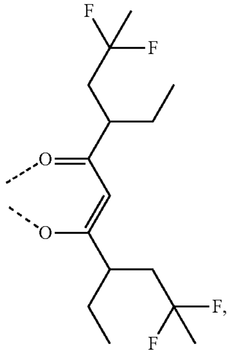
$L_{b226}$
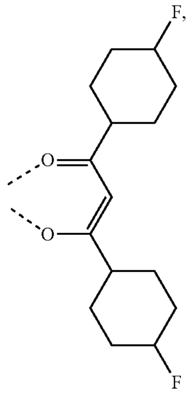
$L_{b227}$
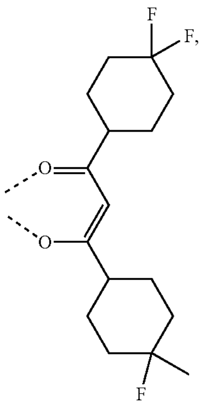

L$_{b228}$
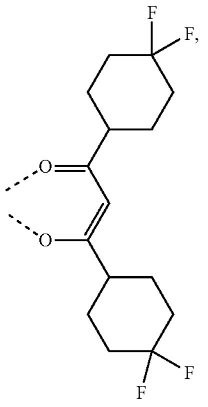
L$_{b229}$
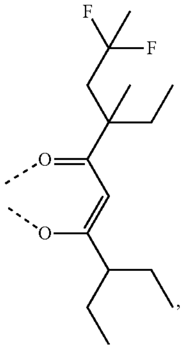
L$_{b230}$
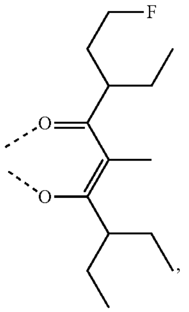
L$_{b231}$
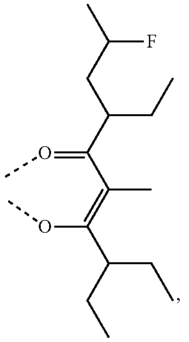
L$_{b232}$
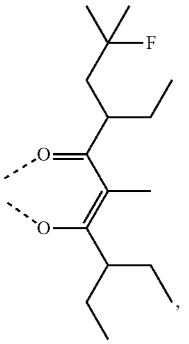
L$_{b233}$
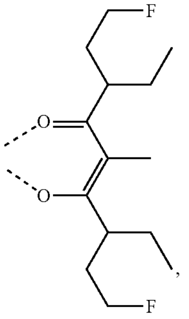
L$_{b234}$
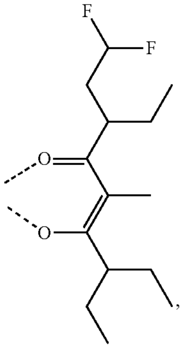
L$_{b235}$
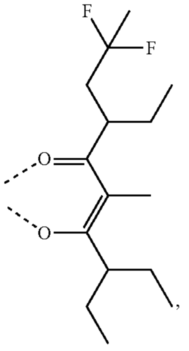
L$_{b236}$
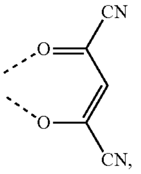

-continued
L$_{b237}$
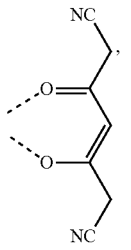
L$_{b238}$
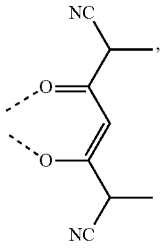
L$_{b239}$
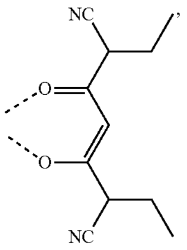
L$_{b240}$
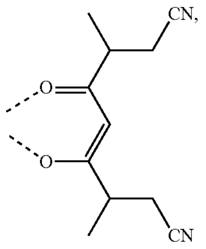
L$_{b241}$
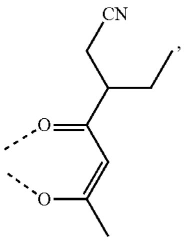
L$_{b242}$
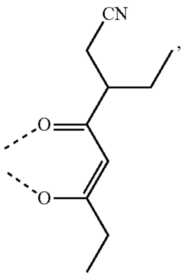
-continued
L$_{b243}$
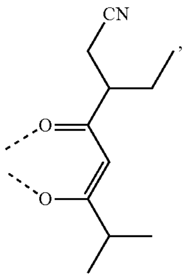
L$_{b244}$
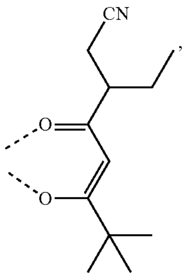
L$_{b245}$
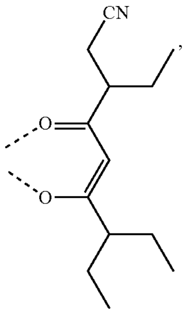
L$_{b246}$
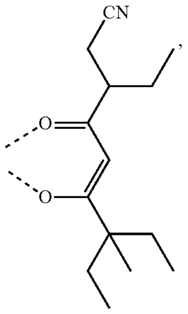
L$_{b247}$
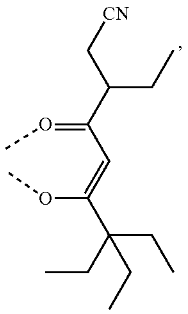

-continued
$L_{b248}$
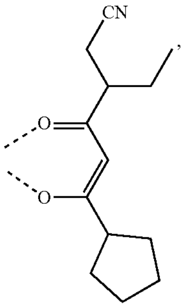
$L_{b249}$
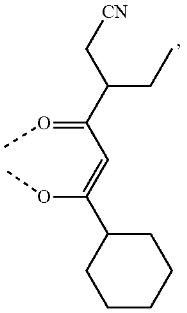
$L_{b250}$
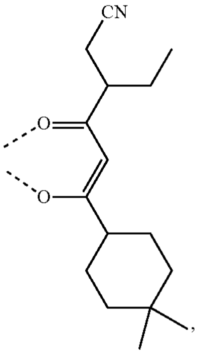
$L_{b251}$
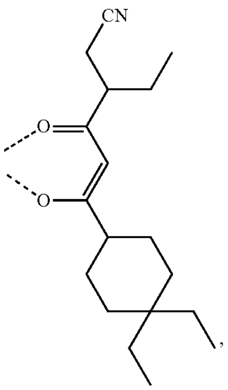
-continued
$L_{b252}$
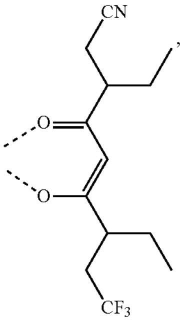
$L_{b253}$
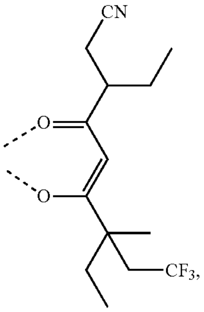
$L_{b254}$
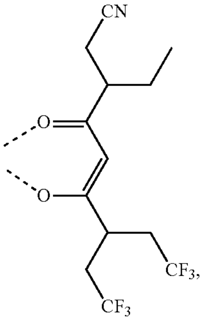
$L_{b255}$
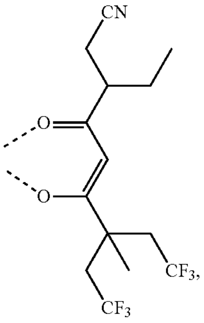
$L_{b256}$
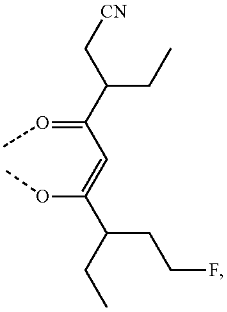

-continued
$L_{b257}$
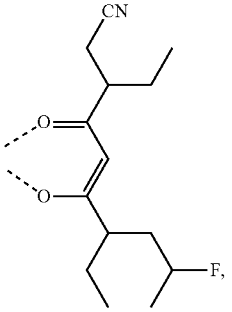
$L_{b258}$
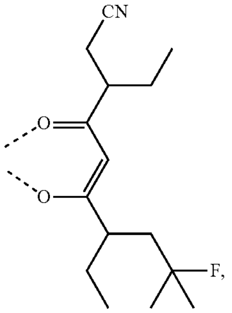
$L_{b259}$
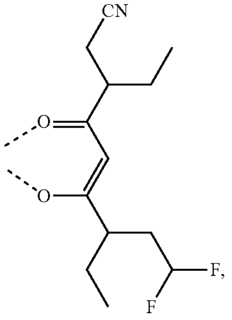
$L_{b260}$
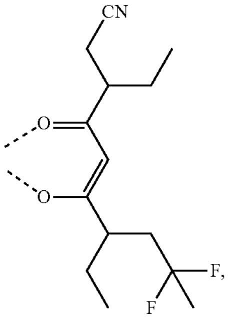
$L_{b261}$
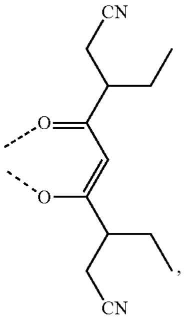
-continued
$L_{b262}$
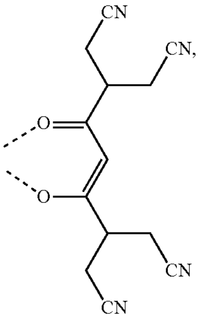
$L_{b263}$
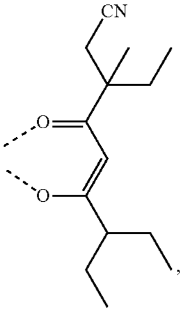
$L_{b264}$
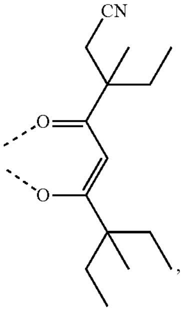
$L_{b265}$
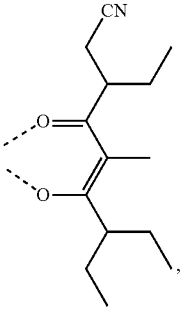
$L_{b266}$
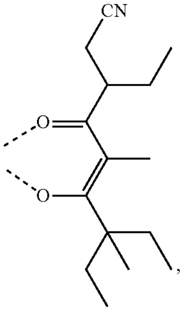

$L_{b267}$
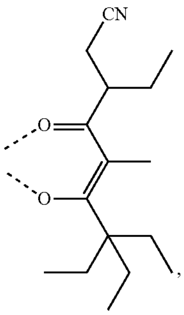
$L_{b268}$
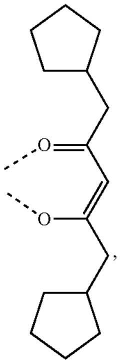
$L_{b269}$
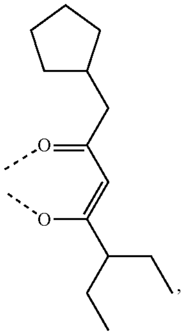
$L_{b270}$
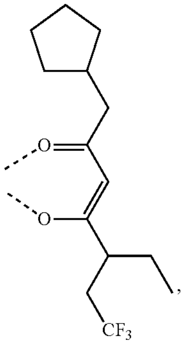
$L_{b271}$
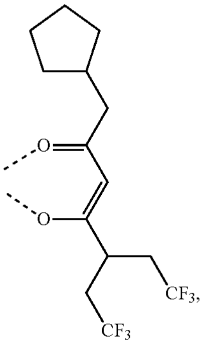
$L_{b272}$
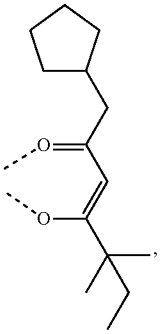
$L_{b273}$
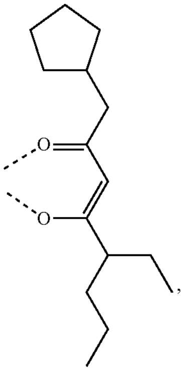
$L_{b274}$
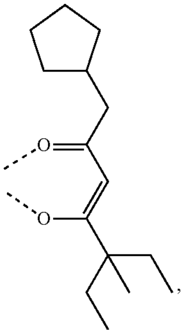

L$_{b275}$
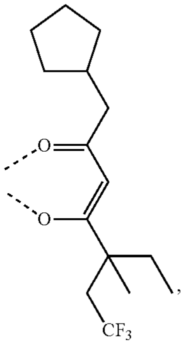
L$_{b276}$
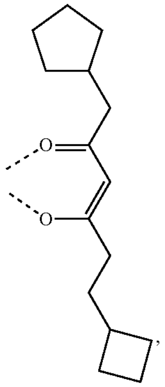
L$_{b277}$
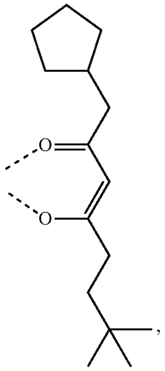
L$_{b278}$
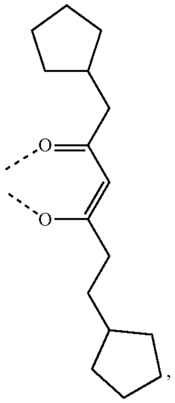
L$_{b279}$
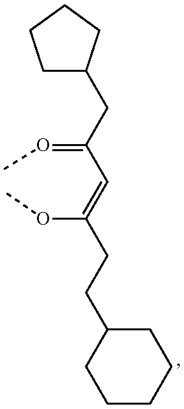
L$_{b280}$
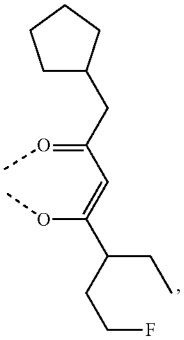
L$_{b281}$
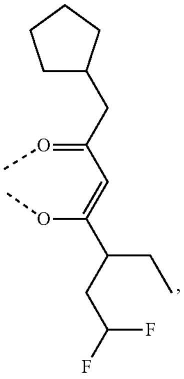
L$_{b282}$
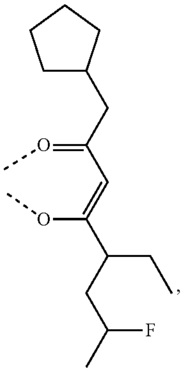

-continued
$L_{b283}$
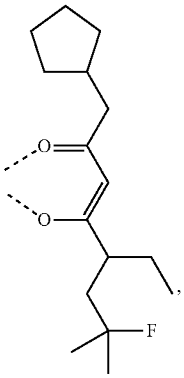
$L_{b284}$
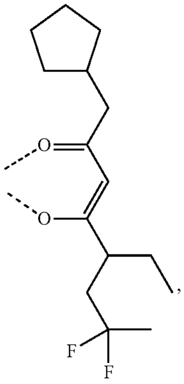
$L_{b285}$
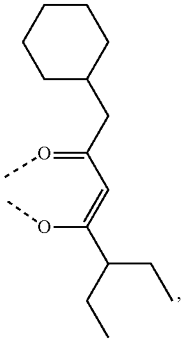
$L_{b286}$
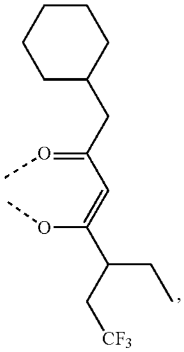
-continued
$L_{b287}$
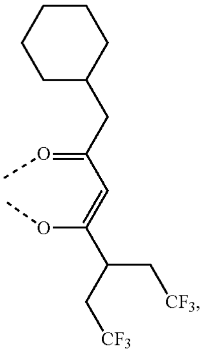
$L_{b288}$
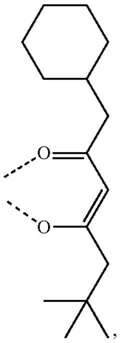
$L_{b289}$
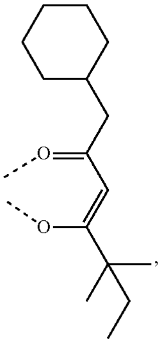
$L_{b290}$
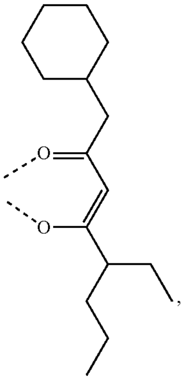

-continued
$L_{b291}$
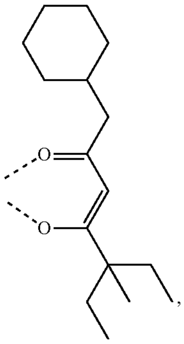
$L_{b292}$
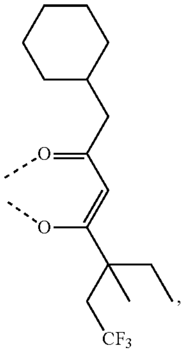
$L_{b293}$
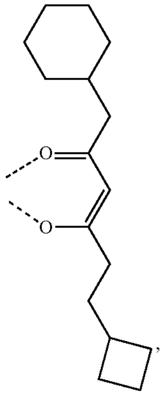
$L_{b294}$
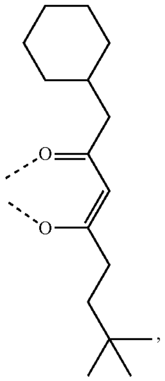
-continued
$L_{b295}$
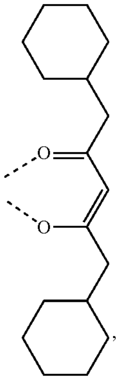
$L_{b296}$
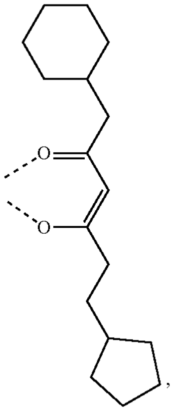
$L_{b297}$
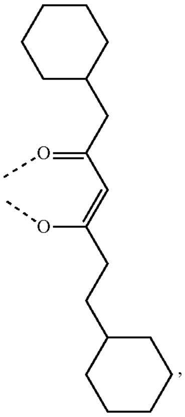
$L_{b298}$
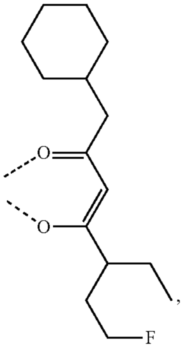

$L_{b299}$
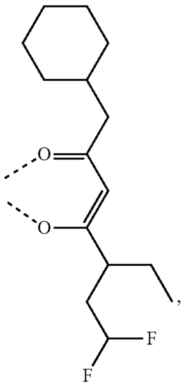
$L_{b300}$
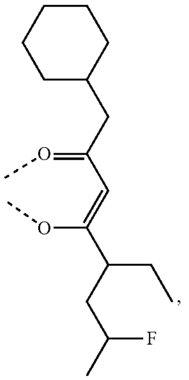
$L_{b301}$
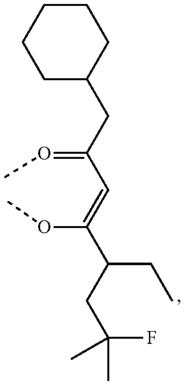
$L_{b302}$
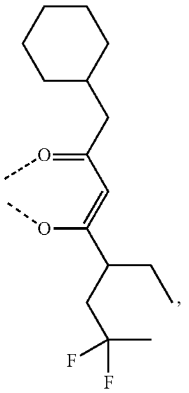
$L_{b303}$
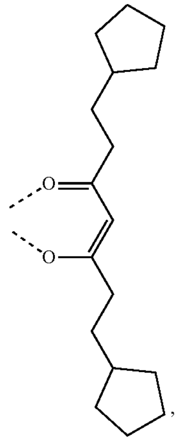
$L_{b304}$
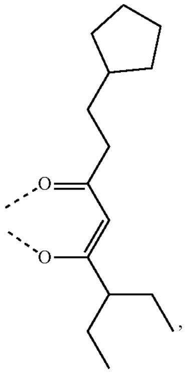
$L_{b305}$
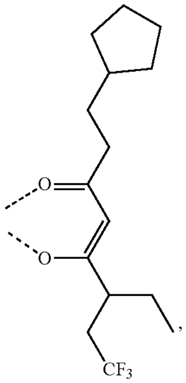

-continued
$L_{b306}$
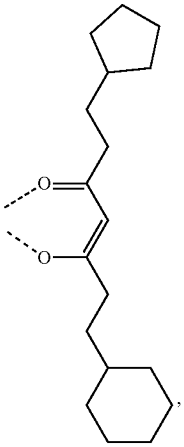
$L_{b307}$
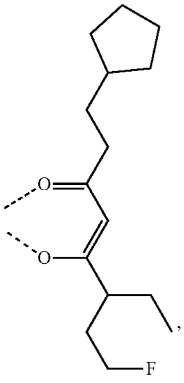
$L_{b308}$
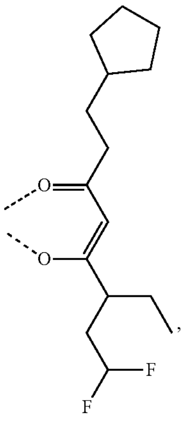
-continued
$L_{b309}$
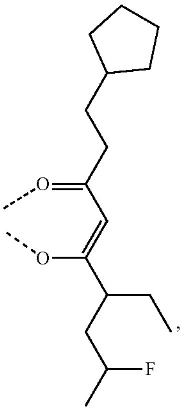
$L_{b310}$
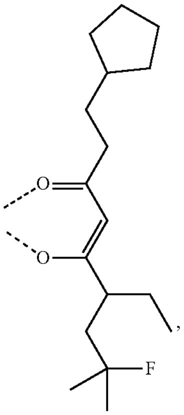
$L_{b311}$
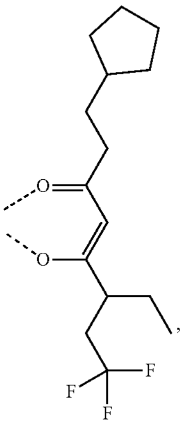

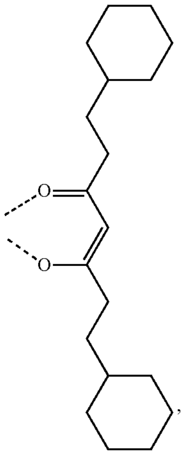
$L_{b312}$
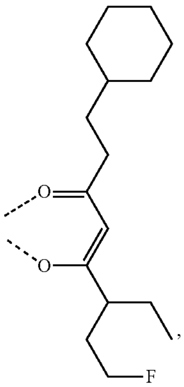
$L_{b313}$
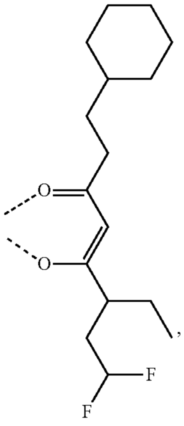
$L_{b314}$
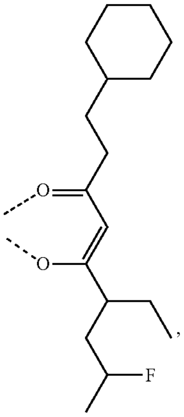
$L_{b315}$
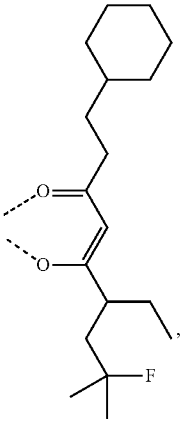
$L_{b316}$
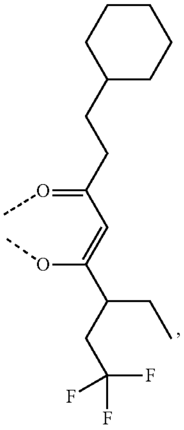
$L_{b317}$ -continued
$L_{b318}$
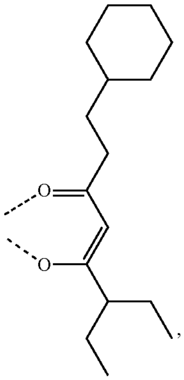
,
$L_{b319}$
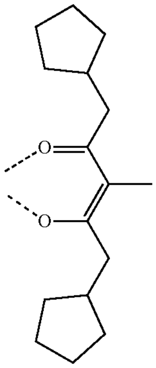
,
$L_{b320}$
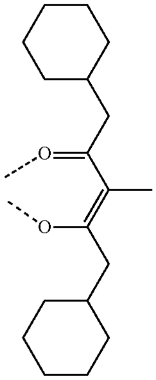
,
$L_{b321}$
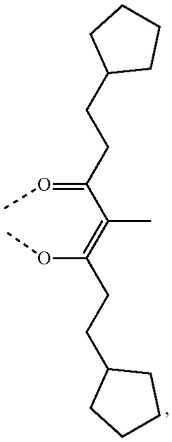
, and
-continued
$L_{b322}$
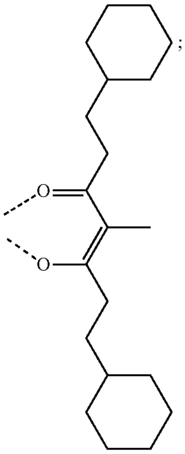
;
the specific structures of $L_{c1}$ to $L_{c231}$ are as follows
$L_{c1}$
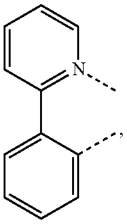
,
$L_{c2}$
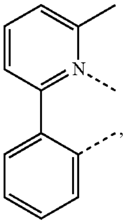
,
$L_{c3}$
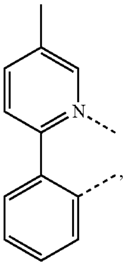
,
$L_{c4}$
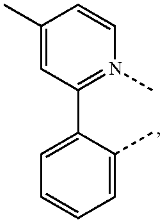
, -continued
Lc5
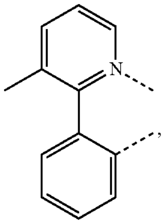
Lc6
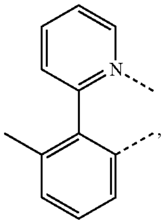
Lc7
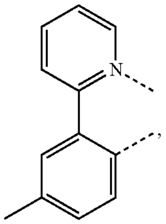
Lc8
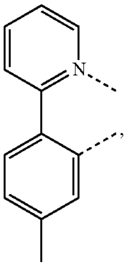
Lc9
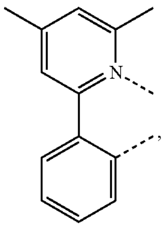
Lc10
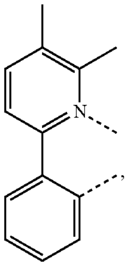
-continued
Lc11
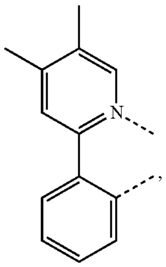
Lc12
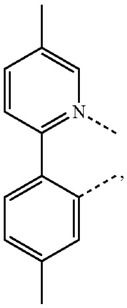
Lc13
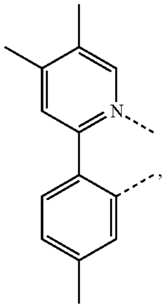
Lc14
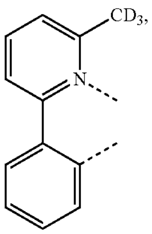
Lc15
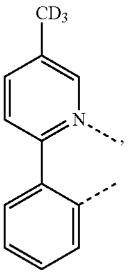

-continued
Lc16
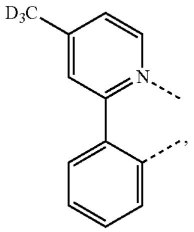
Lc17
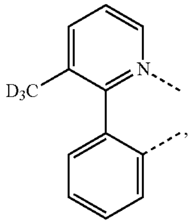
Lc18
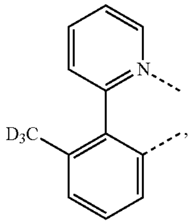
Lc19
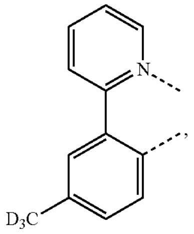
Lc20
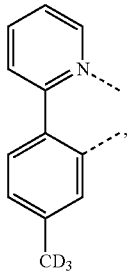
Lc21
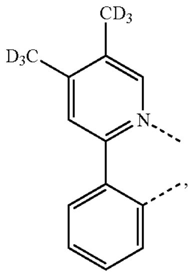
-continued
Lc22
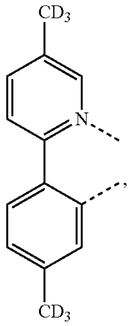
Lc23
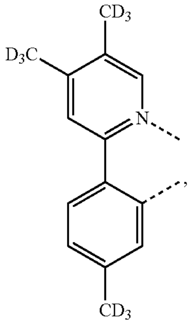
Lc24
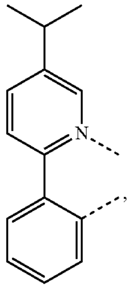
Lc25
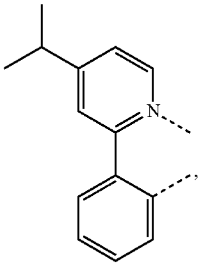
Lc26
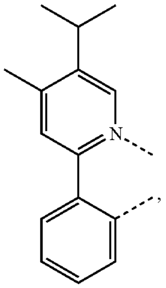

-continued
L$_{c27}$
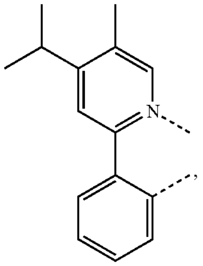
L$_{c28}$
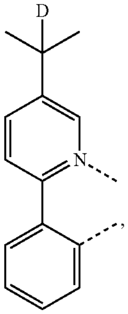
L$_{c29}$
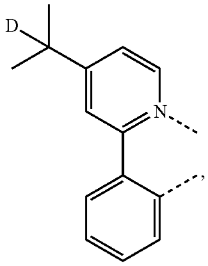
L$_{c30}$
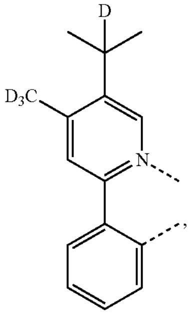
L$_{c31}$
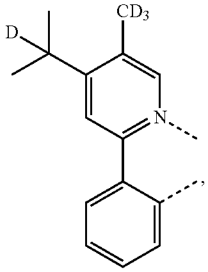
-continued
L$_{c32}$
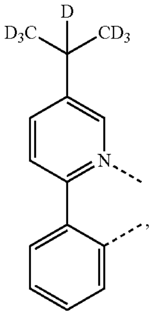
L$_{c33}$
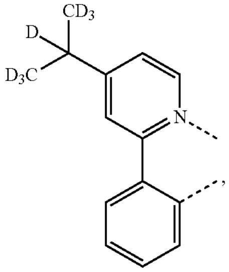
L$_{c34}$
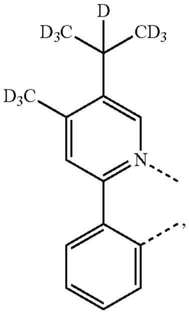
L$_{c35}$
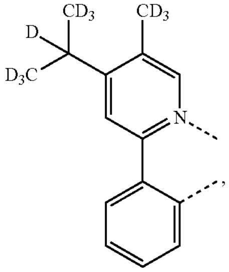
L$_{c36}$
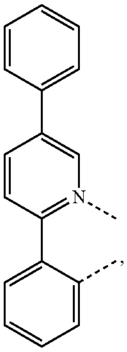

-continued
$L_{c37}$
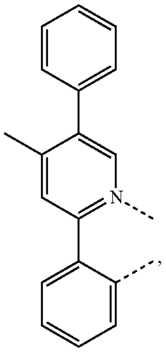
$L_{c38}$
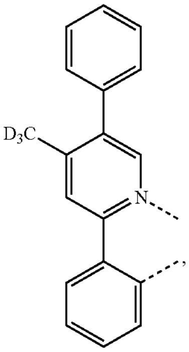
$L_{c39}$
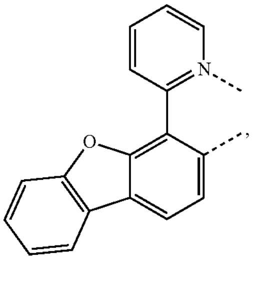
$L_{c40}$
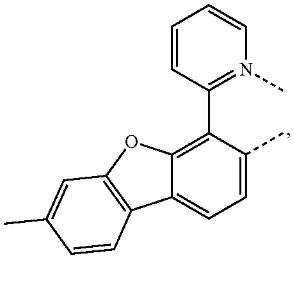
$L_{c41}$
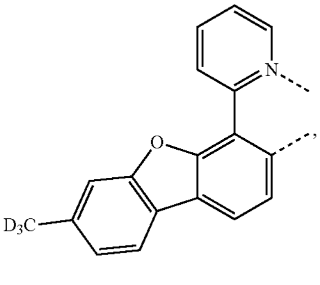
-continued
$L_{c42}$
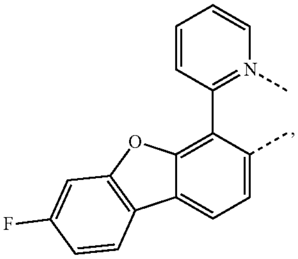
$L_{c43}$
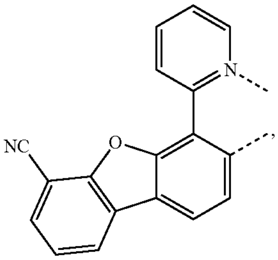
$L_{c44}$
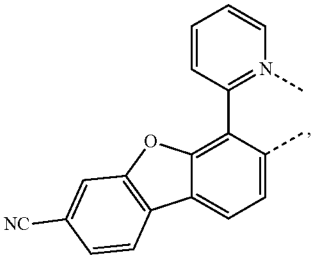
$L_{c45}$
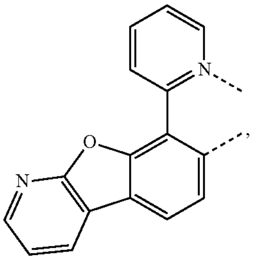
$L_{c46}$
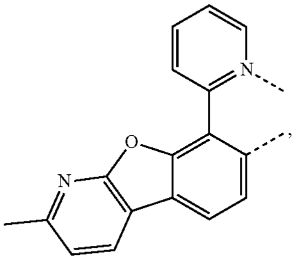
$L_{c47}$
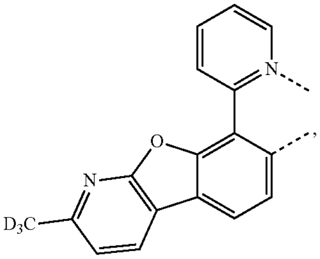

-continued
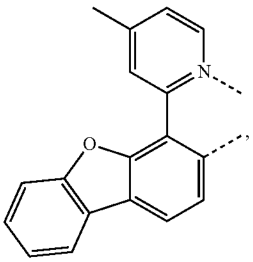
$L_{c48}$
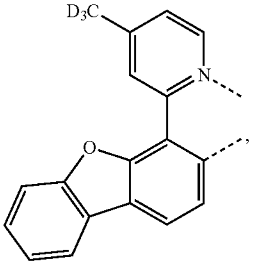
$L_{c49}$
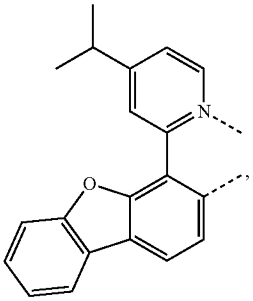
$L_{c50}$
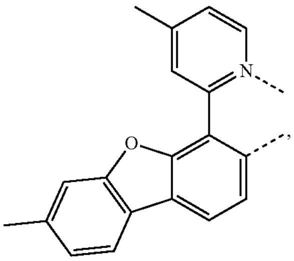
$L_{c51}$
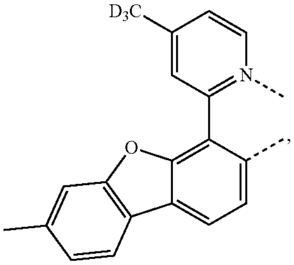
$L_{c52}$
-continued
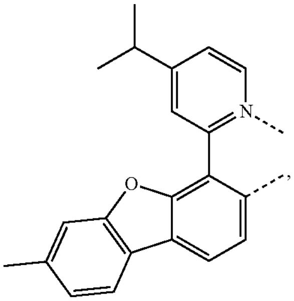
$L_{c53}$
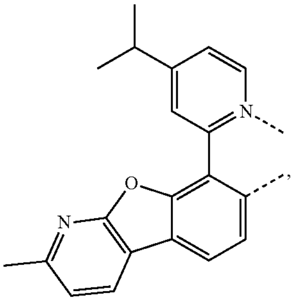
$L_{c54}$
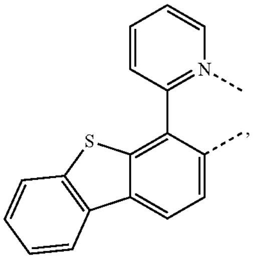
$L_{c55}$
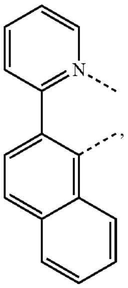
$L_{c56}$
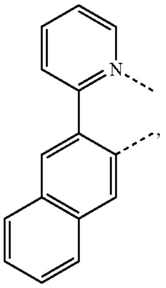
$L_{c57}$ -continued
$L_{c58}$
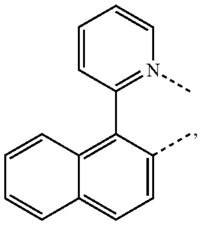
$L_{c59}$
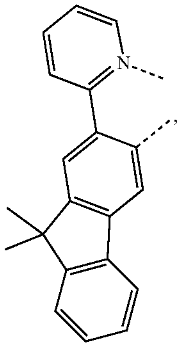
$L_{c60}$
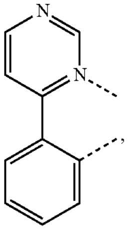
$L_{c61}$
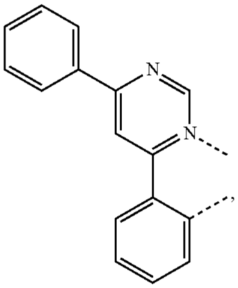
$L_{c62}$
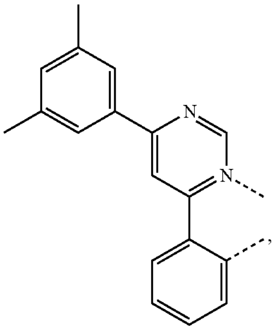
-continued
$L_{c63}$
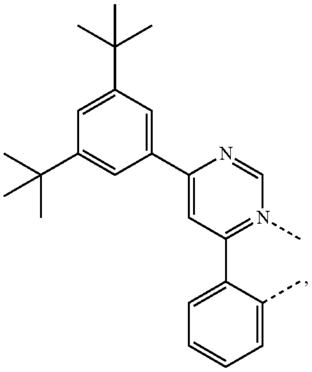
$L_{c64}$
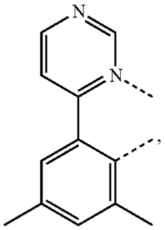
$L_{c65}$
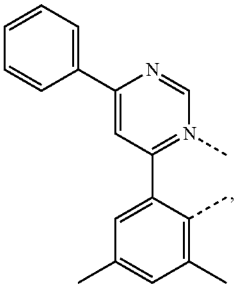
$L_{c66}$
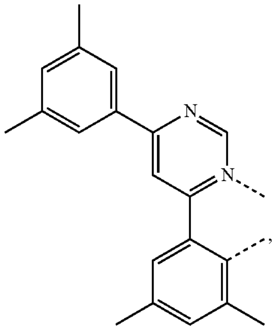
$L_{c67}$
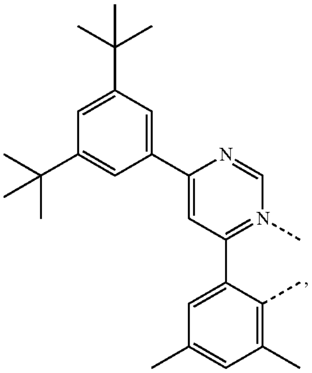

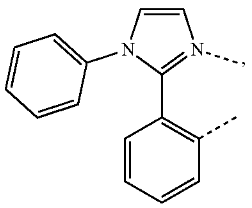
$L_{c68}$
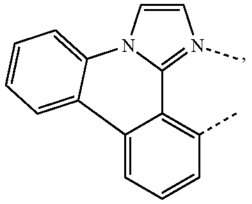
$L_{c69}$
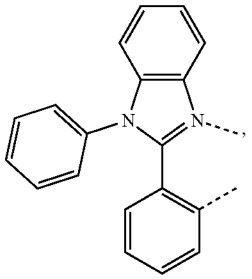
$L_{c70}$
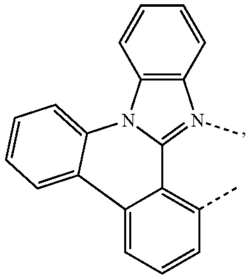
$L_{c71}$
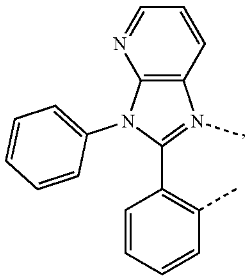
$L_{c72}$
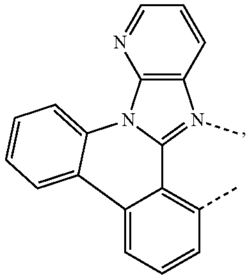
$L_{c73}$
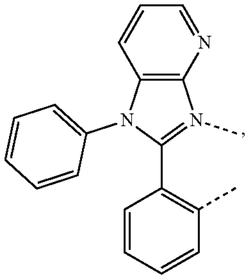
$L_{c74}$
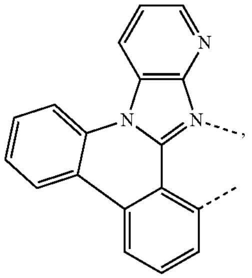
$L_{c75}$
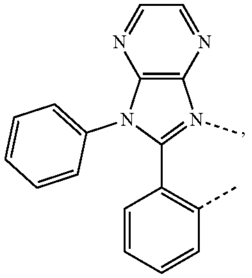
$L_{c76}$
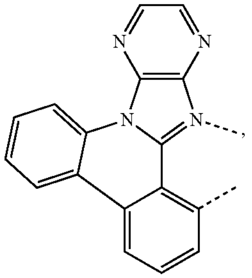
$L_{c77}$
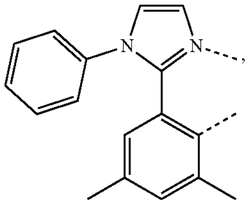
$L_{c78}$
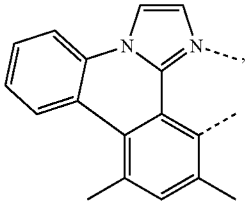
$L_{c79}$ -continued
Lc80
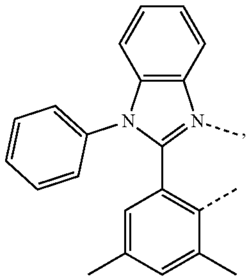
Lc81
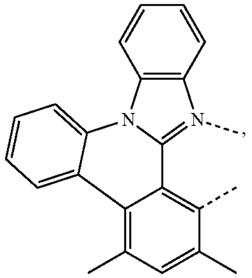
Lc82
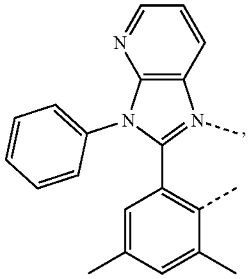
Lc83
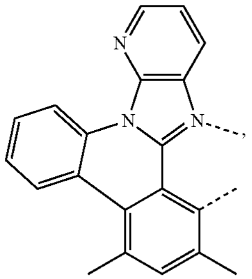
Lc84
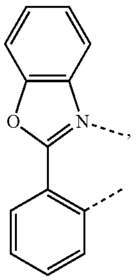
-continued
Lc85
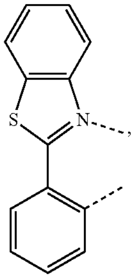
Lc86
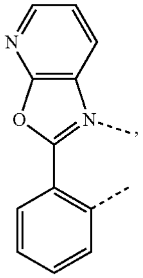
Lc87
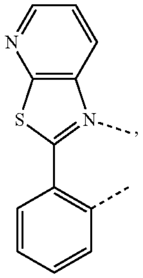
Lc88
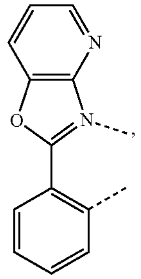
Lc89
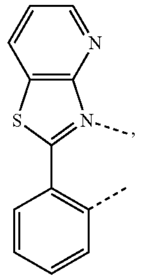

-continued
L$_{c90}$
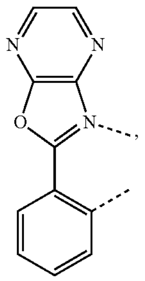
L$_{c91}$
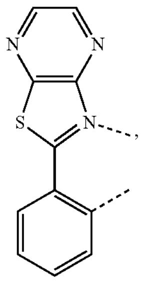
L$_{c92}$
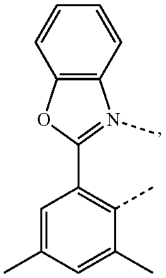
L$_{c93}$
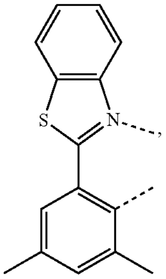
L$_{c94}$
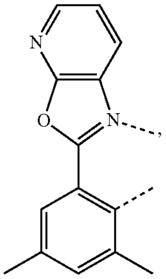
-continued
L$_{c95}$
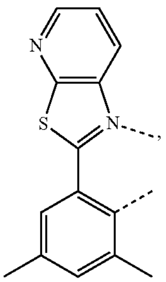
L$_{c96}$
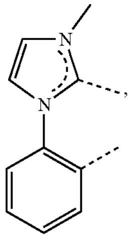
L$_{c97}$
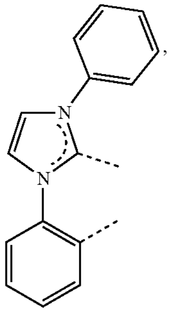
L$_{c98}$
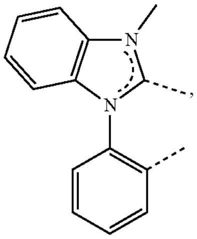
L$_{c99}$
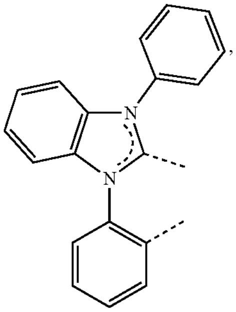

-continued
$L_{c100}$
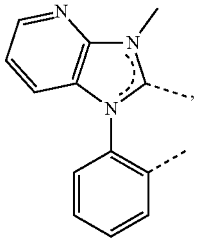
$L_{c101}$
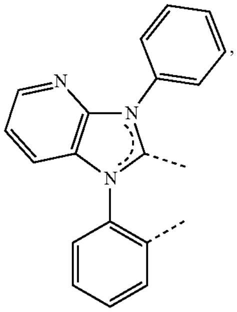
$L_{c102}$
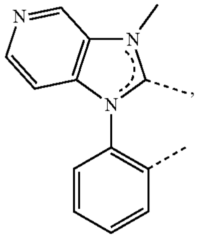
$L_{c103}$
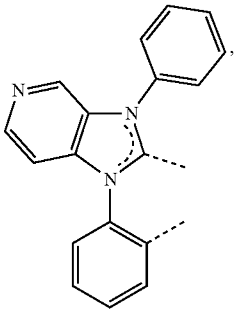
$L_{c104}$
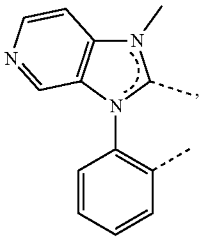
-continued
$L_{c105}$
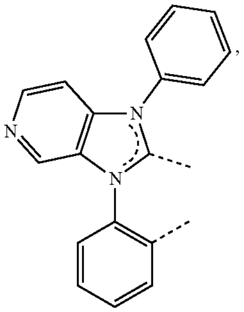
$L_{c106}$
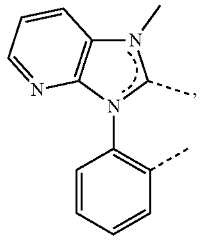
$L_{c107}$
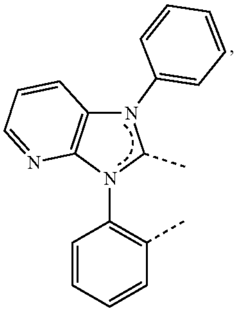
$L_{c108}$
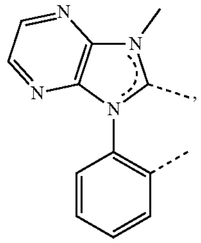
$L_{c109}$
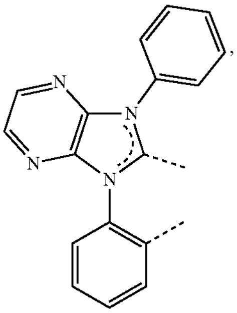

-continued
$L_{c110}$
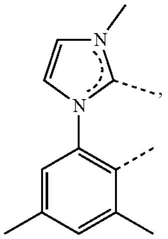
$L_{c111}$
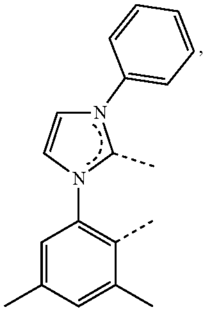
$L_{c112}$
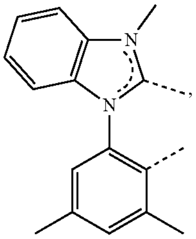
$L_{c113}$
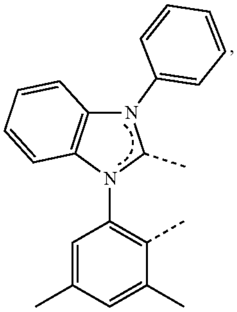
$L_{c114}$
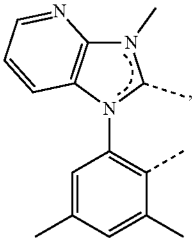
-continued
$L_{c115}$
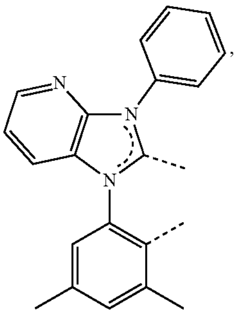
$L_{c116}$
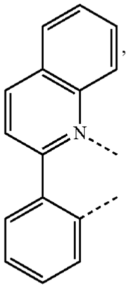
$L_{c117}$
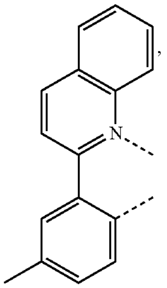
$L_{c118}$
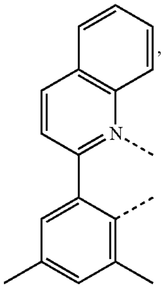
$L_{c119}$
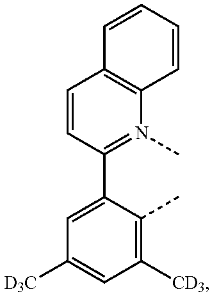

-continued
Lc120
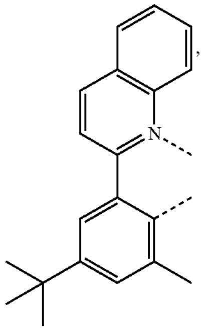
,
Lc121
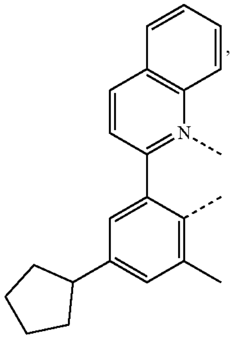
,
Lc122
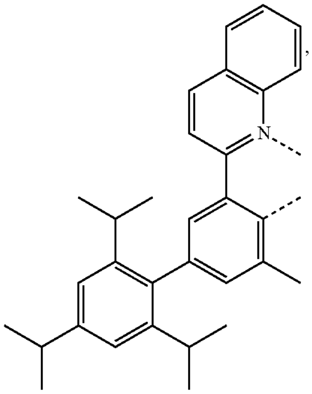
,
Lc123
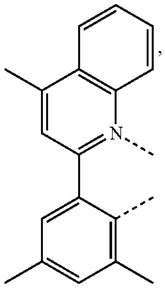
,
-continued
Lc124
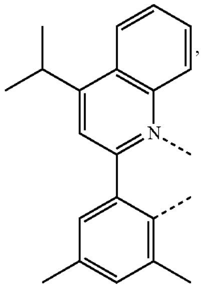
,
Lc125
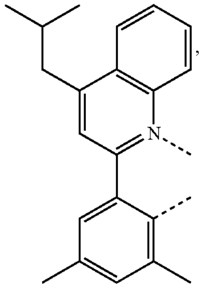
,
Lc126
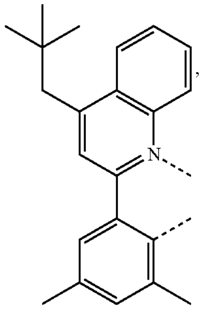
,
Lc127
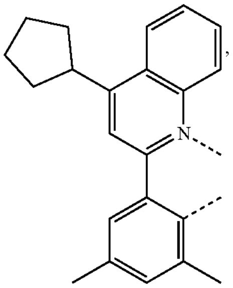
,
Lc128
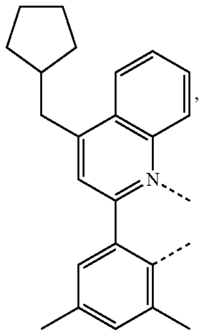
, -continued
$L_{c129}$
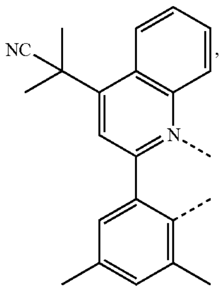
$L_{c130}$
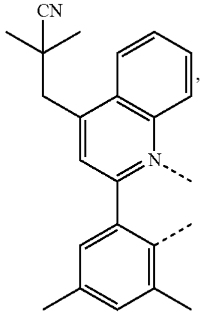
$L_{c131}$
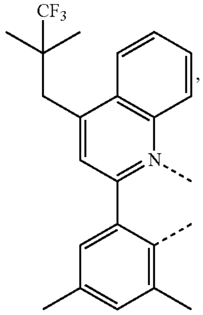
$L_{c132}$
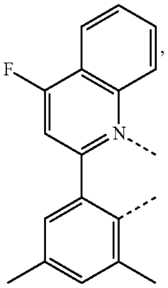
$L_{c133}$
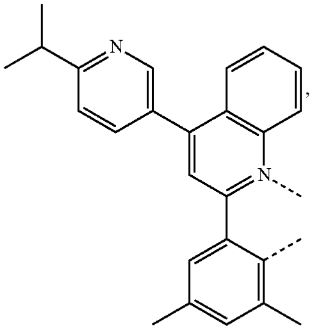
-continued
$L_{c134}$
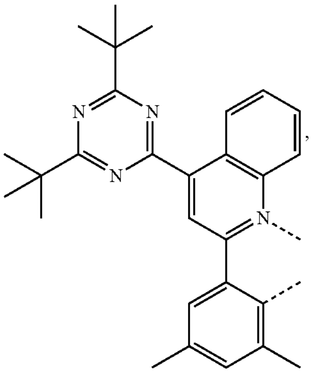
$L_{c135}$
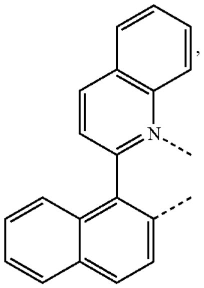
$L_{c136}$
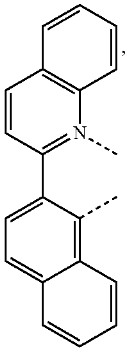
$L_{c137}$
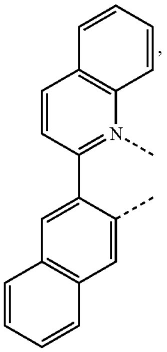

-continued
Lc138
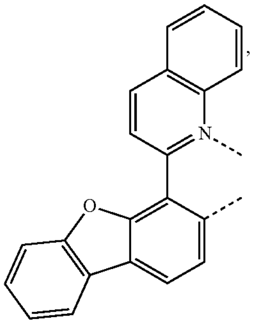
Lc139
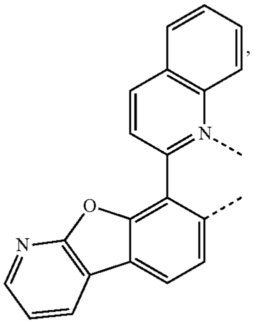
Lc140
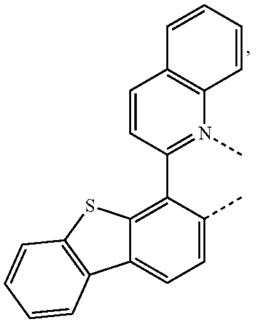
Lc141
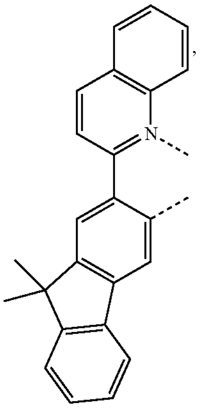
Lc142
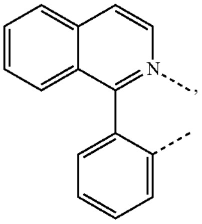
-continued
Lc143
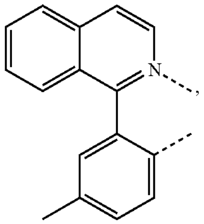
Lc144
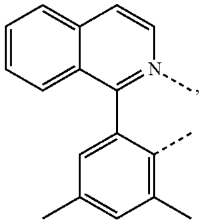
Lc145
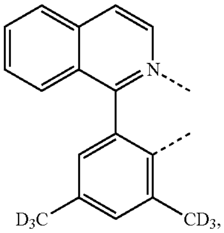
Lc146
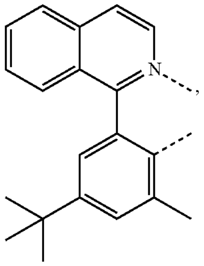
Lc147
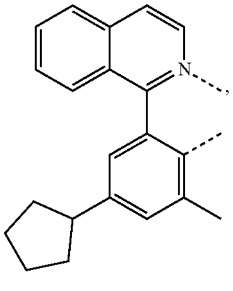
Lc148
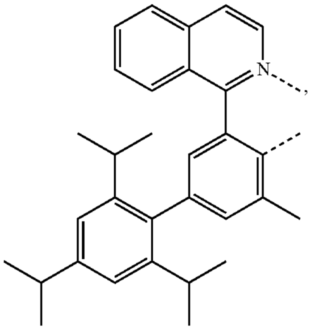

-continued
$L_{c149}$
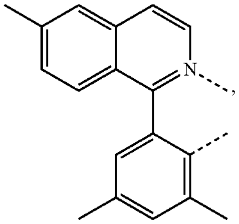
$L_{c150}$
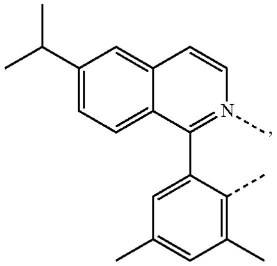
$L_{c151}$
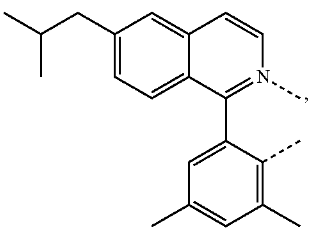
$L_{c152}$
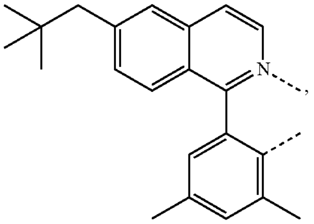
$L_{c153}$
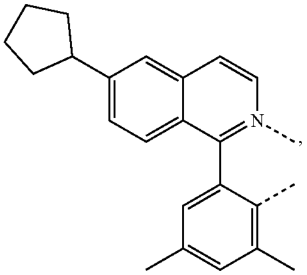
$L_{c154}$
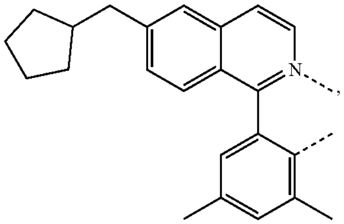
-continued
$L_{c155}$
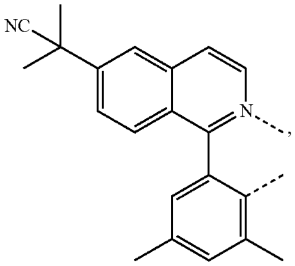
$L_{c156}$
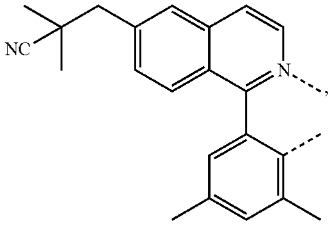
$L_{c157}$
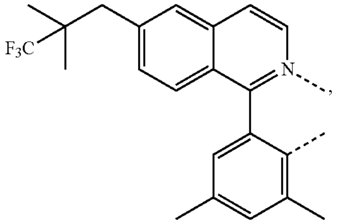
$L_{c158}$
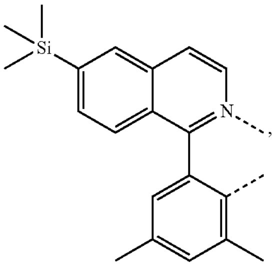
$L_{c159}$
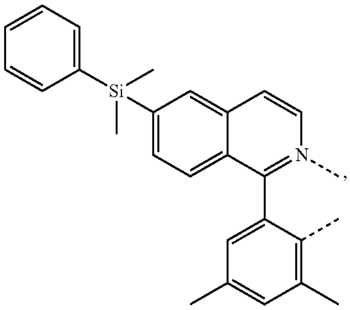
$L_{c160}$
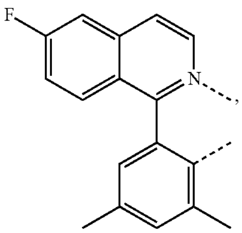

-continued
$L_{c161}$
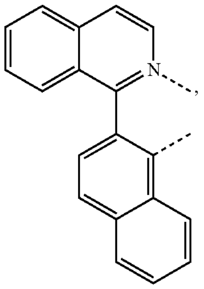
$L_{c162}$
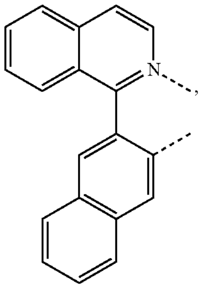
$L_{c163}$
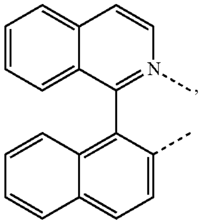
$L_{c164}$
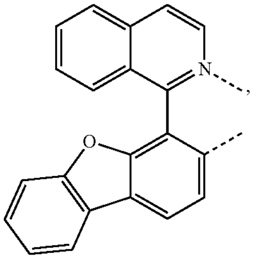
$L_{c165}$
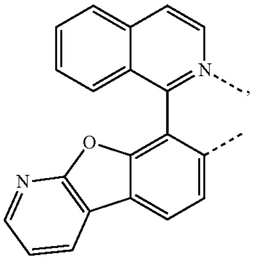
$L_{c166}$
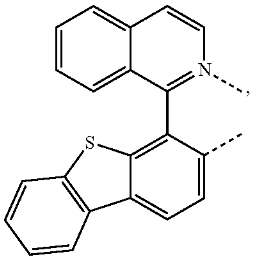
-continued
$L_{c167}$
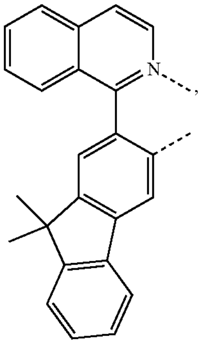
$L_{c168}$
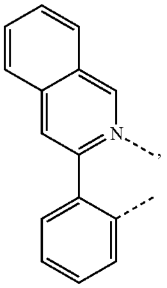
$L_{c169}$
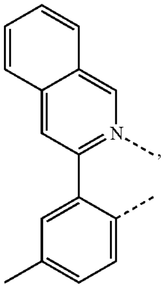
$L_{c170}$
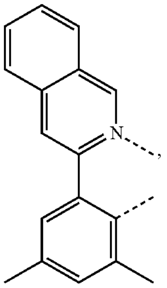
$L_{c171}$
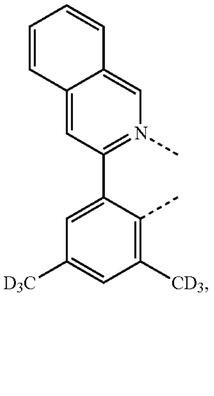

-continued
$L_{c172}$
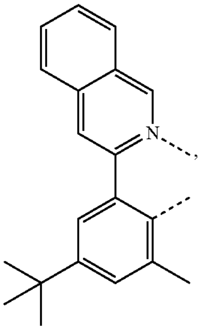
$L_{c173}$
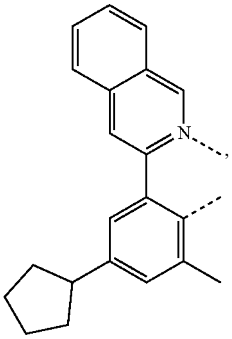
$L_{c174}$
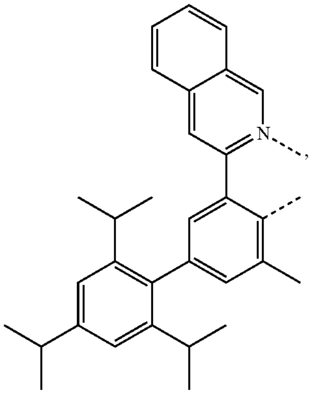
$L_{c175}$
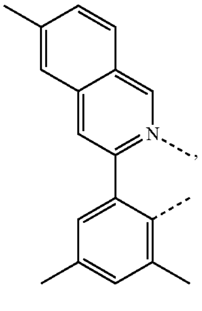
-continued
$L_{c176}$
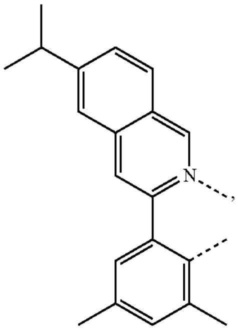
$L_{c177}$
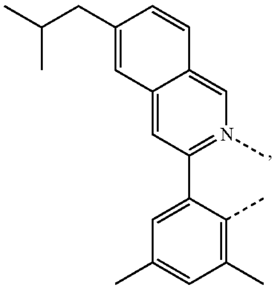
$L_{c178}$
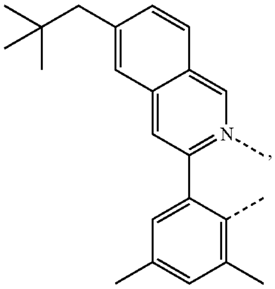
$L_{c179}$
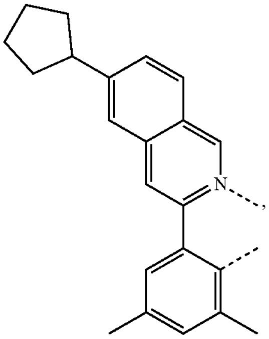
$L_{c180}$
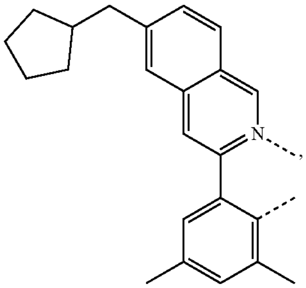

-continued
$L_{c181}$
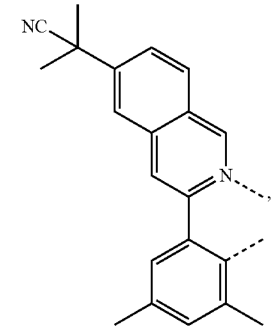
$L_{c182}$
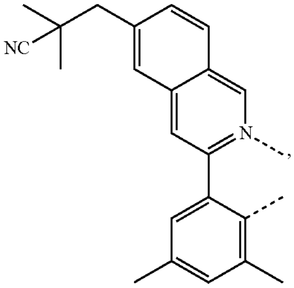
$L_{c183}$
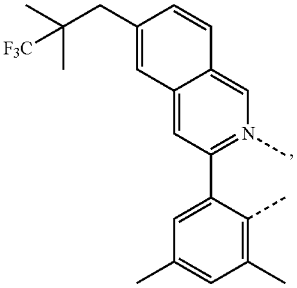
$L_{c184}$
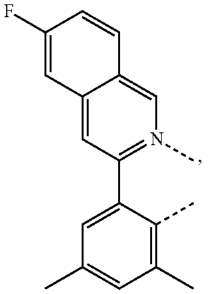
$L_{c185}$
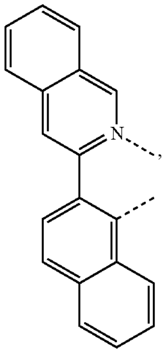
-continued
$L_{c186}$
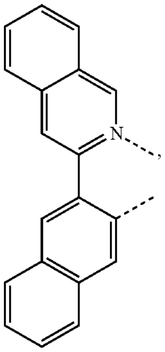
$L_{c187}$
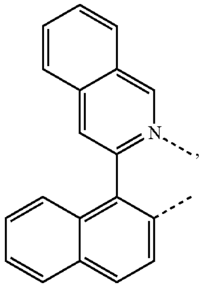
$L_{c188}$
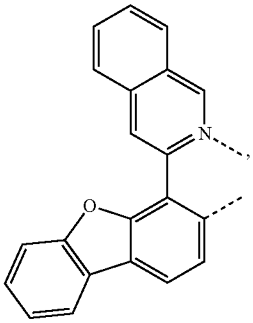
$L_{c189}$
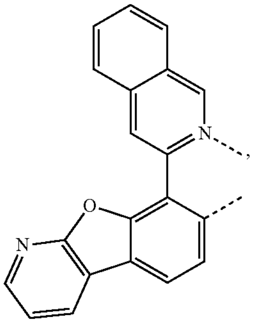
$L_{c190}$
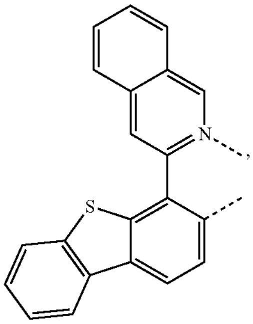

-continued
$L_{c191}$
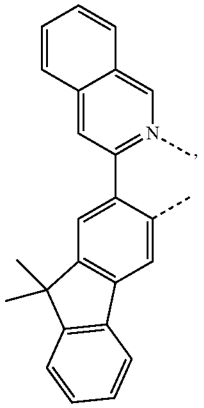
$L_{c192}$
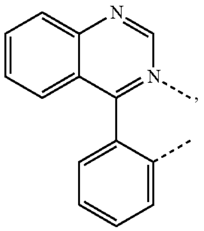
$L_{c193}$
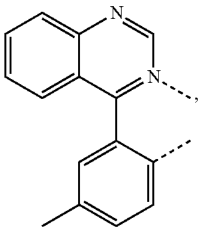
$L_{c194}$
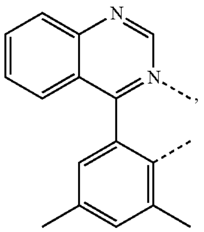
$L_{c195}$
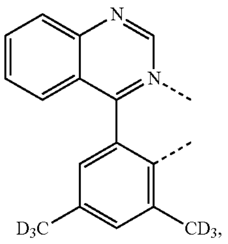
-continued
$L_{c196}$
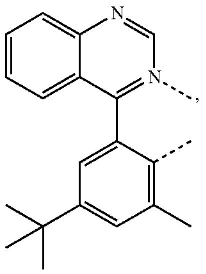
$L_{c197}$
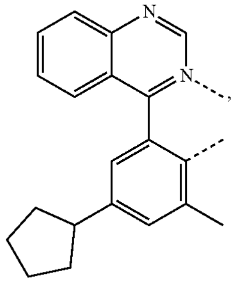
$L_{c198}$
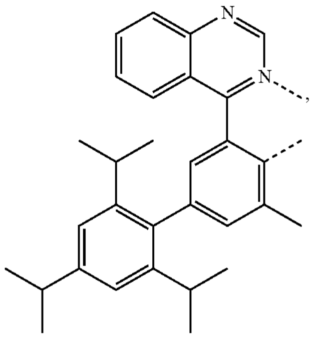
$L_{c199}$
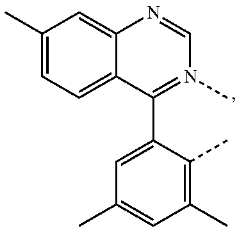
$L_{c200}$
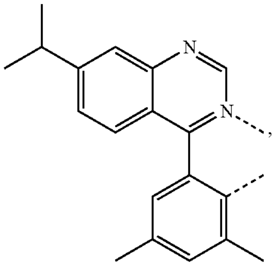

-continued
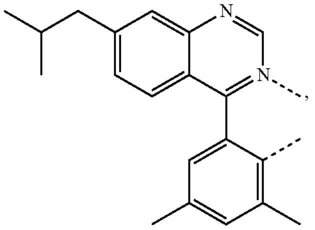
$L_{c201}$
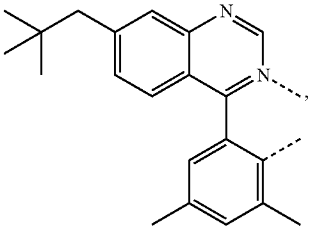
$L_{c202}$
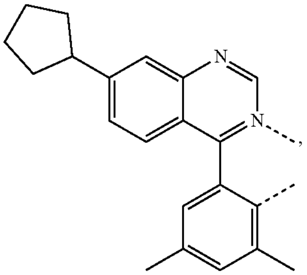
$L_{c203}$
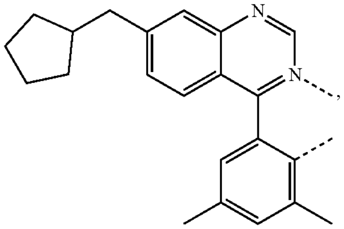
$L_{c204}$
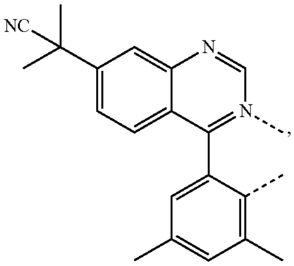
$L_{c205}$
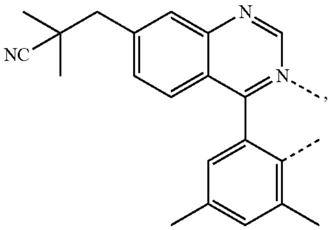
$L_{c206}$
-continued
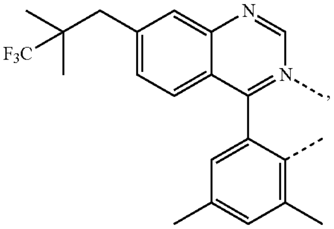
$L_{c207}$
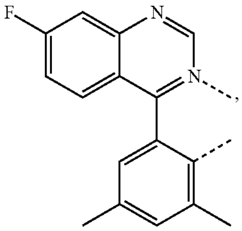
$L_{c208}$
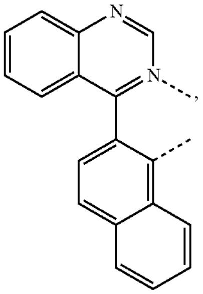
$L_{c209}$
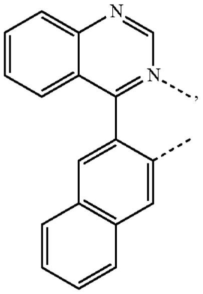
$L_{c210}$
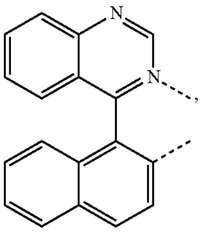
$L_{c211}$
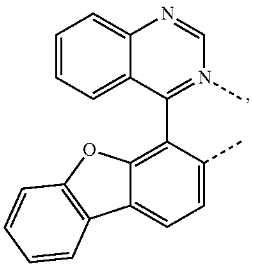
$L_{c212}$ -continued
$L_{c213}$
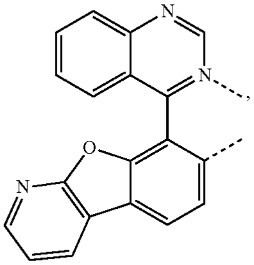
$L_{c214}$
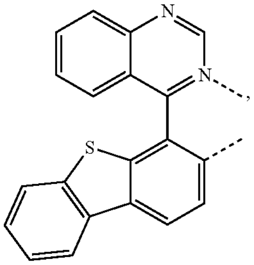
$L_{c215}$
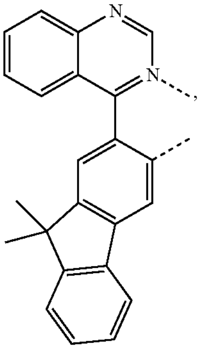
$L_{c216}$
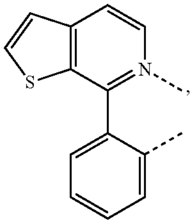
$L_{c217}$
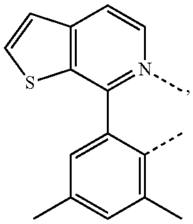
$L_{c218}$
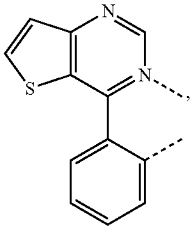
-continued
$L_{c219}$
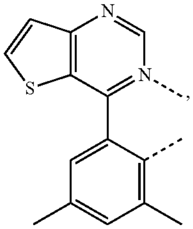
$L_{c220}$
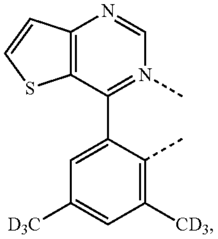
$L_{c221}$
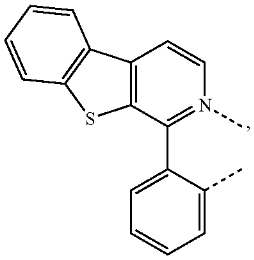
$L_{c222}$
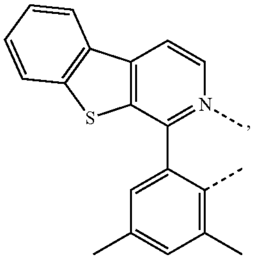
$L_{c223}$
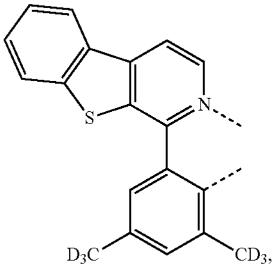
$L_{c224}$
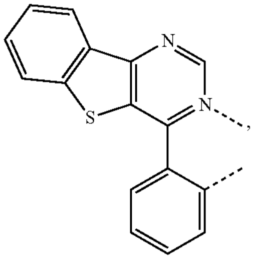

-continued $L_{c225}$

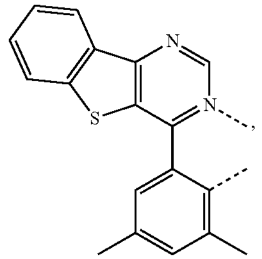

$L_{c226}$

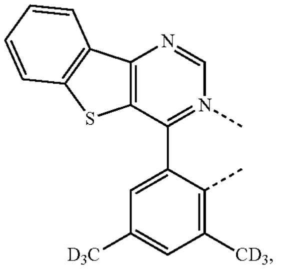

$L_{c227}$

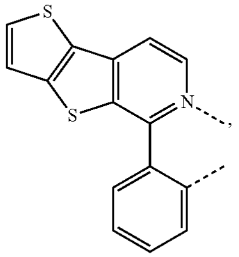

$L_{c228}$

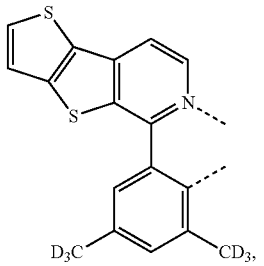

$L_{c229}$

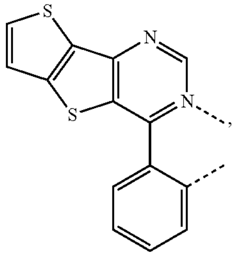

$L_{c230}$

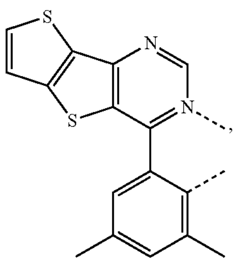

and

-continued $L_{c231}$

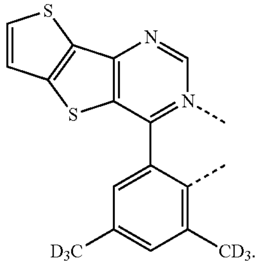

According to an embodiment of the present disclosure, wherein, the metal complex has a structure of $Ir(L_a)_2(L_b)$ or $Ir(L_a)_2(L_c)$ or $Ir(L_a)(L_c)_2$; when the metal complex has the structure of $Ir(L_a)_2(L_b)$, $L_a$ is, at each occurrence identically or differently, selected from any one or any two of the group consisting of $L_{a1}$ to $L_{a1492}$ and $L_b$ is selected from any one of the group consisting of $L_{b1}$ to $L_{b322}$; when the metal complex has the structure of $Ir(L_a)_2(L_c)$, $L_a$ is, at each occurrence identically or differently, selected from any one or any two of the group consisting of $L_{a1}$ to $L_{a1492}$ and $L_c$ is selected from any one of the group consisting of $L_{c1}$ to $L_{c231}$; when the metal complex has the structure of $Ir(L_a)(L_c)$ 2, $L_a$ is selected from any one of the group consisting of $L_{a1}$ to $L_{a1492}$ and $L_c$ is, at each occurrence identically or differently, selected from any one or any two of the group consisting of $L_{c1}$ to $L_{c231}$.

According to an embodiment of the present disclosure, wherein, the metal complex is selected from the group consisting of Compound 1 to Compound 200, wherein Compound 1 to Compound 150 have a structure of $Ir(L_a)_2(L_b)$, wherein the two $L_a$ are the same, and $L_a$ and $L_b$ are respectively selected from the structures listed in the following table:

| Compound No. | $L_a$ | $L_b$ | Compound No. | $L_a$ | $L_b$ |
|---|---|---|---|---|---|
| 1 | $L_{a1}$ | $L_{b1}$ | 2 | $L_{a3}$ | $L_{b1}$ |
| 3 | $L_{a4}$ | $L_{b1}$ | 4 | $L_{a5}$ | $L_{b1}$ |
| 5 | $L_{a6}$ | $L_{b1}$ | 6 | $L_{a7}$ | $L_{b1}$ |
| 7 | $L_{a11}$ | $L_{b1}$ | 8 | $L_{a15}$ | $L_{b1}$ |
| 9 | $L_{a21}$ | $L_{b1}$ | 10 | $L_{a23}$ | $L_{b1}$ |
| 11 | $L_{a24}$ | $L_{b1}$ | 12 | $L_{a25}$ | $L_{b1}$ |
| 13 | $L_{a26}$ | $L_{b1}$ | 14 | $L_{a27}$ | $L_{b1}$ |
| 15 | $L_{a31}$ | $L_{b1}$ | 16 | $L_{a37}$ | $L_{b1}$ |
| 17 | $L_{a44}$ | $L_{b1}$ | 18 | $L_{a51}$ | $L_{b1}$ |
| 19 | $L_{a57}$ | $L_{b1}$ | 20 | $L_{a149}$ | $L_{b1}$ |
| 21 | $L_{a190}$ | $L_{b1}$ | 22 | $L_{a278}$ | $L_{b1}$ |
| 23 | $L_{a299}$ | $L_{b1}$ | 24 | $L_{a319}$ | $L_{b1}$ |
| 25 | $L_{a344}$ | $L_{b1}$ | 26 | $L_{a416}$ | $L_{b1}$ |
| 27 | $L_{a474}$ | $L_{b1}$ | 28 | $L_{a515}$ | $L_{b1}$ |
| 29 | $L_{a573}$ | $L_{b1}$ | 30 | $L_{a614}$ | $L_{b1}$ |
| 31 | $L_{a1039}$ | $L_{b1}$ | 32 | $L_{a1077}$ | $L_{b1}$ |
| 33 | $L_{a1027}$ | $L_{b1}$ | 34 | $L_{a1157}$ | $L_{b1}$ |
| 35 | $L_{a1127}$ | $L_{b1}$ | 36 | $L_{a1197}$ | $L_{b1}$ |
| 37 | $L_{a1351}$ | $L_{b1}$ | 38 | $L_{a1374}$ | $L_{b1}$ |
| 39 | $L_{a1}$ | $L_{b1}$ | 40 | $L_{a1}$ | $L_{b1}$ |
| 41 | $L_{a1395}$ | $L_{b1}$ | 42 | $L_{a1406}$ | $L_{b1}$ |
| 43 | $L_{a1432}$ | $L_{b1}$ | 44 | $L_{a1440}$ | $L_{b1}$ |
| 45 | $L_{a1481}$ | $L_{b1}$ | 46 | $L_{a1}$ | $L_{b31}$ |
| 47 | $L_{a3}$ | $L_{b31}$ | 47 | $L_{a4}$ | $L_{b31}$ |
| 49 | $L_{a5}$ | $L_{b31}$ | 50 | $L_{a6}$ | $L_{b31}$ |
| 51 | $L_{a7}$ | $L_{b31}$ | 52 | $L_{a11}$ | $L_{b31}$ |
| 53 | $L_{a15}$ | $L_{b31}$ | 54 | $L_{a21}$ | $L_{b31}$ |
| 55 | $L_{a23}$ | $L_{b31}$ | 56 | $L_{a24}$ | $L_{b31}$ |
| 57 | $L_{a25}$ | $L_{b31}$ | 58 | $L_{a26}$ | $L_{b31}$ |
| 59 | $L_{a27}$ | $L_{b31}$ | 60 | $L_{a31}$ | $L_{b31}$ |
| 61 | $L_{a37}$ | $L_{b31}$ | 62 | $L_{a44}$ | $L_{b31}$ |

-continued

| Compound No. | $L_a$ | $L_b$ | Compound No. | $L_a$ | $L_b$ |
|---|---|---|---|---|---|
| 63 | $L_{a51}$ | $L_{b31}$ | 64 | $L_{a57}$ | $L_{b31}$ |
| 65 | $L_{a149}$ | $L_{b31}$ | 66 | $L_{a190}$ | $L_{b31}$ |
| 67 | $L_{a278}$ | $L_{b31}$ | 68 | $L_{a299}$ | $L_{b31}$ |
| 69 | $L_{a319}$ | $L_{b31}$ | 70 | $L_{a344}$ | $L_{b31}$ |
| 71 | $L_{a416}$ | $L_{b31}$ | 72 | $L_{a474}$ | $L_{b31}$ |
| 73 | $L_{a515}$ | $L_{b31}$ | 74 | $L_{a573}$ | $L_{b31}$ |
| 75 | $L_{a614}$ | $L_{b31}$ | 76 | $L_{a1039}$ | $L_{b31}$ |
| 77 | $L_{a1077}$ | $L_{b31}$ | 78 | $L_{a1027}$ | $L_{b31}$ |
| 79 | $L_{a1157}$ | $L_{b31}$ | 80 | $L_{a1127}$ | $L_{b31}$ |
| 81 | $L_{a1197}$ | $L_{b31}$ | 82 | $L_{a1351}$ | $L_{b31}$ |
| 83 | $L_{a1374}$ | $L_{b31}$ | 84 | $L_{a1}$ | $L_{b31}$ |
| 85 | $L_{a1}$ | $L_{b31}$ | 86 | $L_{a1395}$ | $L_{b31}$ |
| 87 | $L_{a1406}$ | $L_{b31}$ | 88 | $L_{a1432}$ | $L_{b31}$ |
| 89 | $L_{a1440}$ | $L_{b31}$ | 90 | $L_{a1481}$ | $L_{b31}$ |
| 91 | $L_{a1}$ | $L_{b122}$ | 92 | $L_{a3}$ | $L_{b122}$ |
| 93 | $L_{a4}$ | $L_{b122}$ | 94 | $L_{a5}$ | $L_{b122}$ |
| 95 | $L_{a6}$ | $L_{b122}$ | 96 | $L_{a7}$ | $L_{b122}$ |
| 97 | $L_{a11}$ | $L_{b122}$ | 98 | $L_{a15}$ | $L_{b122}$ |
| 99 | $L_{a21}$ | $L_{b122}$ | 100 | $L_{a23}$ | $L_{b122}$ |
| 101 | $L_{a24}$ | $L_{b122}$ | 102 | $L_{a25}$ | $L_{b122}$ |
| 103 | $L_{a26}$ | $L_{b122}$ | 104 | $L_{a27}$ | $L_{b122}$ |
| 105 | $L_{a31}$ | $L_{b122}$ | 106 | $L_{a37}$ | $L_{b122}$ |
| 107 | $L_{a44}$ | $L_{b122}$ | 108 | $L_{a51}$ | $L_{b122}$ |
| 109 | $L_{a57}$ | $L_{b122}$ | 110 | $L_{a149}$ | $L_{b122}$ |
| 111 | $L_{a190}$ | $L_{b122}$ | 112 | $L_{a278}$ | $L_{b122}$ |
| 113 | $L_{a299}$ | $L_{b122}$ | 114 | $L_{a319}$ | $L_{b122}$ |
| 115 | $L_{a344}$ | $L_{b122}$ | 116 | $L_{a416}$ | $L_{b122}$ |
| 117 | $L_{a474}$ | $L_{b122}$ | 118 | $L_{a515}$ | $L_{b122}$ |
| 119 | $L_{a573}$ | $L_{b122}$ | 120 | $L_{a614}$ | $L_{b122}$ |
| 121 | $L_{a1039}$ | $L_{b122}$ | 122 | $L_{a1077}$ | $L_{b122}$ |
| 123 | $L_{a1027}$ | $L_{b122}$ | 124 | $L_{a1157}$ | $L_{b122}$ |
| 125 | $L_{a1127}$ | $L_{b122}$ | 126 | $L_{a1197}$ | $L_{b122}$ |
| 127 | $L_{a1351}$ | $L_{b122}$ | 128 | $L_{a1374}$ | $L_{b122}$ |
| 129 | $L_{a1}$ | $L_{b122}$ | 130 | $L_{a1}$ | $L_{b122}$ |
| 131 | $L_{a1395}$ | $L_{b122}$ | 132 | $L_{a1406}$ | $L_{b122}$ |
| 133 | $L_{a1432}$ | $L_{b122}$ | 134 | $L_{a1440}$ | $L_{b122}$ |
| 135 | $L_{a1481}$ | $L_{b122}$ | 136 | $L_{a1}$ | $L_{b88}$ |
| 137 | $L_{a21}$ | $L_{b88}$ | 138 | $L_{a149}$ | $L_{b88}$ |
| 139 | $L_{a190}$ | $L_{b88}$ | 140 | $L_{a1}$ | $L_{b165}$ |
| 141 | $L_{a21}$ | $L_{b165}$ | 142 | $L_{a149}$ | $L_{b165}$ |
| 143 | $L_{a190}$ | $L_{b165}$ | 144 | $L_{a1}$ | $L_{b192}$ |
| 145 | $L_{a21}$ | $L_{b192}$ | 146 | $L_{a149}$ | $L_{b192}$ |
| 147 | $L_{a190}$ | $L_{b192}$ | 148 | $L_{a1}$ | $L_{b245}$ |
| 149 | $L_{a21}$ | $L_{b245}$ | 150 | $L_{a149}$ | $L_{b245}$ |

wherein Compound 151 to Compound 200 have a structure of $Ir(L_a)_2(L_b)$, wherein the two $L_a$ are different, and $L_a$ and $L_b$ are respectively selected from the structures listed in the following table:

| Compound No. | $L_a$ | $L_a$ | $L_b$ |
|---|---|---|---|
| 151 | $L_{a4}$ | $L_{a1407}$ | $L_{b1}$ |
| 152 | $L_{a44}$ | $L_{a1416}$ | $L_{b1}$ |
| 153 | $L_{a277}$ | $L_{a1430}$ | $L_{b1}$ |
| 154 | $L_{a1425}$ | $L_{a1430}$ | $L_{b1}$ |
| 155 | $L_{a1428}$ | $L_{a1432}$ | $L_{b1}$ |
| 156 | $L_{a1375}$ | $L_{a1481}$ | $L_{b1}$ |
| 157 | $L_{a1421}$ | $L_{a152}$ | $L_{b1}$ |
| 158 | $L_{a1425}$ | $L_{a277}$ | $L_{b1}$ |
| 159 | $L_{a1472}$ | $L_{a1354}$ | $L_{b1}$ |
| 160 | $L_{a1440}$ | $L_{a319}$ | $L_{b1}$ |
| 161 | $L_{a1462}$ | $L_{a474}$ | $L_{b1}$ |
| 162 | $L_{a1435}$ | $L_{a299}$ | $L_{b1}$ |
| 163 | $L_{a4}$ | $L_{a1407}$ | $L_{b31}$ |
| 164 | $L_{a44}$ | $L_{a1416}$ | $L_{b31}$ |
| 165 | $L_{a277}$ | $L_{a1430}$ | $L_{b31}$ |
| 166 | $L_{a1425}$ | $L_{a1430}$ | $L_{b31}$ |
| 167 | $L_{a1428}$ | $L_{a1432}$ | $L_{b31}$ |
| 168 | $L_{a1375}$ | $L_{a1481}$ | $L_{b31}$ |
| 169 | $L_{a1421}$ | $L_{a152}$ | $L_{b31}$ |
| 170 | $L_{a1425}$ | $L_{a277}$ | $L_{b31}$ |
| 171 | $L_{a1472}$ | $L_{a1354}$ | $L_{b31}$ |
| 172 | $L_{a1440}$ | $L_{a319}$ | $L_{b31}$ |
| 173 | $L_{a1462}$ | $L_{a474}$ | $L_{b31}$ |
| 174 | $L_{a1435}$ | $L_{a299}$ | $L_{b31}$ |
| 175 | $L_{a4}$ | $L_{a1407}$ | $L_{b88}$ |
| 176 | $L_{a44}$ | $L_{a1416}$ | $L_{b88}$ |
| 177 | $L_{a277}$ | $L_{a1430}$ | $L_{b88}$ |
| 178 | $L_{a1425}$ | $L_{a1430}$ | $L_{b88}$ |
| 179 | $L_{a1428}$ | $L_{a1432}$ | $L_{b88}$ |
| 180 | $L_{a1375}$ | $L_{a1481}$ | $L_{b88}$ |
| 181 | $L_{a1421}$ | $L_{a152}$ | $L_{b88}$ |
| 182 | $L_{a1425}$ | $L_{a277}$ | $L_{b88}$ |
| 183 | $L_{a1472}$ | $L_{a1354}$ | $L_{b88}$ |
| 184 | $L_{a1440}$ | $L_{a319}$ | $L_{b88}$ |
| 185 | $L_{a1462}$ | $L_{a474}$ | $L_{b88}$ |
| 186 | $L_{a1435}$ | $L_{a299}$ | $L_{b88}$ |
| 187 | $L_{a4}$ | $L_{a1407}$ | $L_{b122}$ |
| 188 | $L_{a44}$ | $L_{a1416}$ | $L_{b122}$ |
| 189 | $L_{a277}$ | $L_{a1430}$ | $L_{b122}$ |
| 190 | $L_{a1425}$ | $L_{a1430}$ | $L_{b122}$ |
| 191 | $L_{a1428}$ | $L_{a1432}$ | $L_{b122}$ |
| 192 | $L_{a1375}$ | $L_{a1481}$ | $L_{b122}$ |
| 193 | $L_{a1421}$ | $L_{a152}$ | $L_{b122}$ |
| 194 | $L_{a1425}$ | $L_{a277}$ | $L_{b122}$ |
| 195 | $L_{a1472}$ | $L_{a1354}$ | $L_{b122}$ |
| 196 | $L_{a1440}$ | $L_{a319}$ | $L_{b122}$ |
| 197 | $L_{a1462}$ | $L_{a474}$ | $L_{b122}$ |
| 198 | $L_{a1435}$ | $L_{a299}$ | $L_{b122}$ |
| 199 | $L_{a4}$ | $L_{a1407}$ | $L_{b212}$ |
| 200 | $L_{a44}$ | $L_{a1416}$ | $L_{b212}$. |

According to an embodiment of the present disclosure, further disclosed is an electroluminescent device, which comprises:

an anode, a cathode, and an organic layer disposed between the anode and the cathode, wherein the organic layer comprises a metal complex whose specific structure is shown in any one of the preceding embodiments.

According to an embodiment of the present disclosure, in the device, the organic layer is a light-emitting layer, and the compound is a light-emitting material.

According to an embodiment of the present disclosure, the device emits red light or white light.

According to an embodiment of the present disclosure, in the device, the light-emitting layer further comprises at least one host material.

According to an embodiment of the present disclosure, in the device, the at least one host material comprises at least one chemical group selected from the group consisting of: benzene, pyridine, pyrimidine, triazine, carbazole, azacarbazole, indolocarbazole, dibenzothiophene, aza-dibenzothiophene, dibenzofuran, azadibenzofuran, dibenzoselenophene, triphenylene, azatriphenylene, fluorene, silafluorene, naphthalene, quinoline, isoquinoline, quinazoline, quinoxaline, phenanthrene, azaphenanthrene and combinations thereof.

According to an embodiment of the present disclosure, in the device, the host material may be a conventional host material in the related art. For example, the host material may typically include the following host materials without limitations:

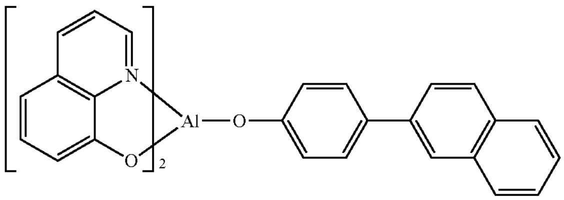
,
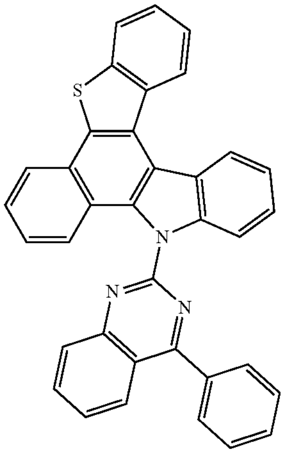
,
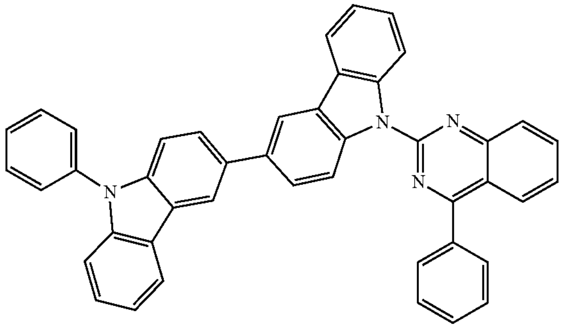
,
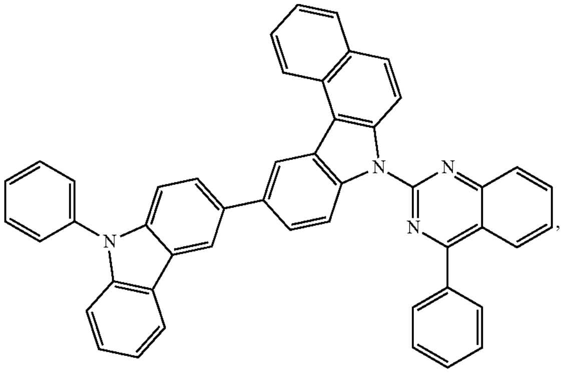
,
-continued
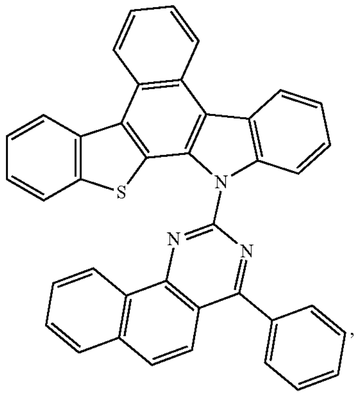
,
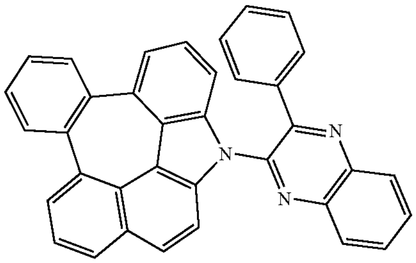
,
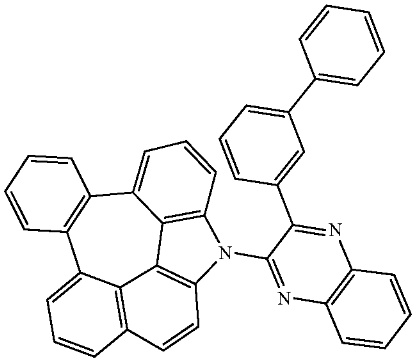
,
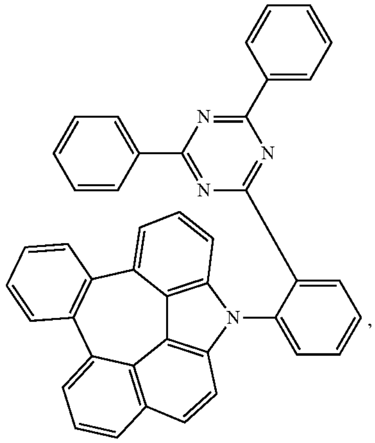
, -continued

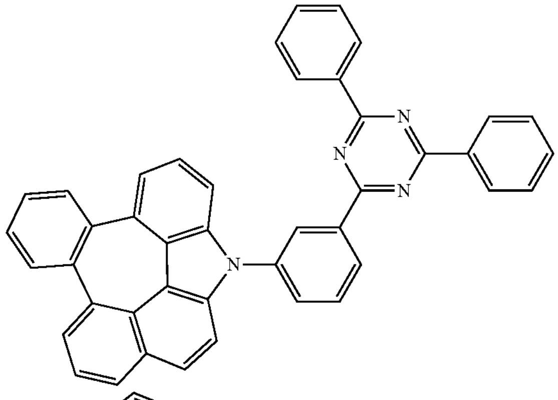

,

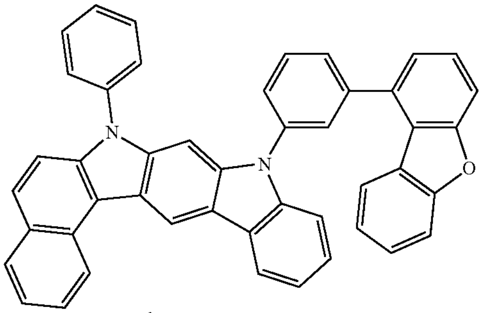

,

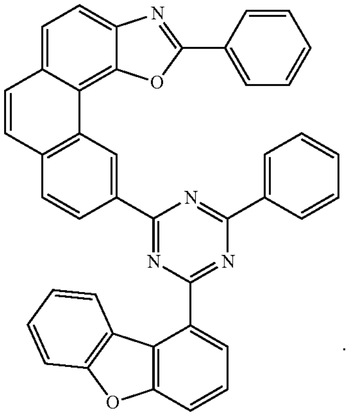

.

According to another embodiment of the present disclosure, further disclosed is a compound combination comprising a metal complex whose specific structure is shown in any one of the preceding embodiments.

Combination with Other Materials

The materials described in the present disclosure for a particular layer in an organic light emitting device can be used in combination with various other materials present in the device. The combinations of these materials are described in more detail in U.S. patent application No. 20160359122 at paragraphs 0132-0161, which is incorporated by reference herein in its entirety. The materials described or referred to the disclosure are non-limiting examples of materials that may be useful in combination with the compounds disclosed herein, and one of skill in the art can readily consult the literature to identify other materials that may be useful in combination.

The materials described herein as useful for a particular layer in an organic light emitting device may be used in combination with a variety of other materials present in the device. For example, emissive dopants disclosed herein may be used in combination with a wide variety of hosts, transport layers, blocking layers, injection layers, electrodes and other layers that may be present. The combination of these materials is described in detail in paragraphs 0080-0101 of U.S. patent application No. 20150349273, which is incorporated by reference herein in its entirety. The materials described or referred to the disclosure are non-limiting examples of materials that may be useful in combination with the compounds disclosed herein, and one of skill in the art can readily consult the literature to identify other materials that may be useful in combination.

In the embodiments of material synthesis, all reactions were performed under nitrogen protection unless otherwise stated. All reaction solvents were anhydrous and used as received from commercial sources. Synthetic products were structurally confirmed and tested for properties using one or more conventional equipment in the art (including, but not limited to, nuclear magnetic resonance instrument produced by BRUKER, liquid chromatograph produced by SHIMADZU, liquid chromatograph-mass spectrometry produced by SHIMADZU, gas chromatograph-mass spectrometry produced by SHIMADZU, differential Scanning calorimeters produced by SHIMADZU, fluorescence spectrophotometer produced by SHANGHAI LENGGUANG TECH., electrochemical workstation produced by WUHAN CORRTEST, and sublimation apparatus produced by ANHUI BEQ, etc.) by methods well known to the persons skilled in the art. In the embodiments of the device, the characteristics of the device were also tested using conventional equipment in the art (including, but not limited to, evaporator produced by ANGSTROM ENGINEERING, optical testing system produced by SUZHOU FATAR, life testing system produced by SUZHOU FATAR, and ellipsometer produced by BEIJING ELLITOP, etc.) by methods well known to the persons skilled in the art. As the persons skilled in the art are aware of the above-mentioned equipment use, test methods and other related contents, the inherent data of the sample can be obtained with certainty and without influence, so the above related contents are not further described in this present disclosure.

MATERIAL SYNTHESIS EXAMPLE

The method for preparing a compound in the present disclosure is not limited herein. Typically, the following compounds are used as examples without limitations, and synthesis routes and preparation methods thereof are described below.

Synthesis Example 1: Synthesis of Compound 99

Step 1: Synthesis of Intermediate 3

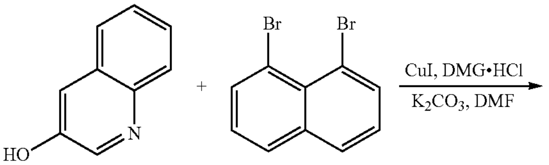

1 2

-continued

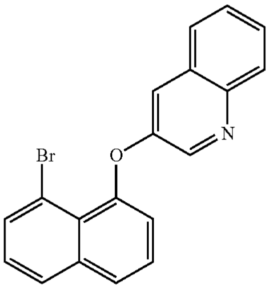

3

Intermediate 1 (9.10 g, 62.69 mmol), Intermediate 2 (23.30 g, 81.50 mmol), copper (I) iodide (0.60 g, 3.13 mmol), N,N-dimethylglycine hydrochloride (DMG-HCl) (0.44 g, 3.13 mmol) and potassium carbonate (21.66 g, 156.73 mmol) were dissolved in N,N-dimethylformamide (100 mL). Then, under nitrogen protection, the reaction was heated to 100° C., stirred for 20 h, and cooled to room temperature. Ethyl acetate was added to the reaction system, layers were separated, and the aqueous phase was extracted with ethyl acetate. The organic phases were combined and dried, and the solvents were removed in vacuo to obtain the crude product. The crude product was isolated through silica gel column chromatography (using the eluents of ethyl acetate:petroleum ether=1:10, v/v) to obtain Intermediate 3 (16.00 g, with a yield of 73%).

Step 2: Synthesis of Intermediate 4

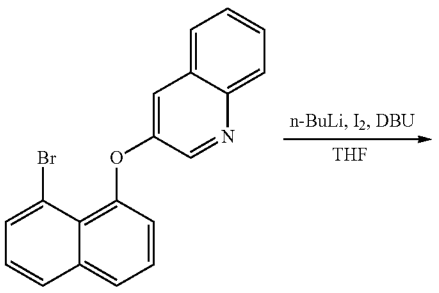

3

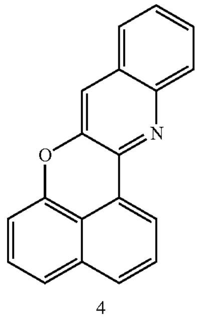

4

Intermediate 3 (4.00 g, 11.42 mmol) was dissolved in 40 mL of ultra-dry tetrahydrofuran, and in a nitrogen atmosphere, a solution of n-butyl lithium (12.56 mmol, 2 M, 6.3 mL) was slowly added dropwise at −76° C. and stirred for 2.5 h. After the raw materials were reacted completely, the reaction was quenched with water and warmed to 0° C. The reaction system was added with elemental iodine (3.50 g, 13.7 mmol) and 1,8-diazabicyclo[5.4.0] undec-7-ene (DBU) (4.35 g, 28.55 mmol), stirred at room temperature for 3 h, and filtered to obtain the crude product. The crude product was isolated through column chromatography (PE:EA=50:1) to obtain Intermediate 4 as a yellow liquid (2.77 g, with a yield of 90%).

Step 3: Synthesis of an Iridium Dimer

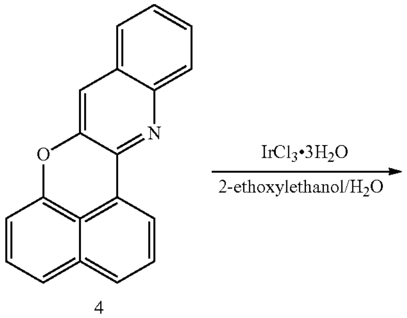

4

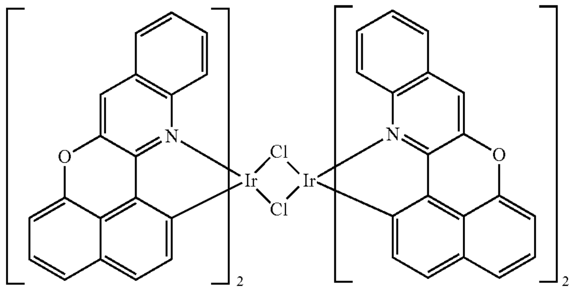

A mixture of Intermediate 4 (3.97 g, 14.75 mmol), iridium trichloride trihydrate (1.30 g, 3.69 mmol), 2-ethoxyethanol (48 mL) and water (16 mL) was refluxed in a nitrogen atmosphere for 40 h. The solution was cooled to room temperature and filtered to obtain an iridium dimer (3.10 g) which was directly used in the next step without further purification.

Step 4: Synthesis of Compound 99

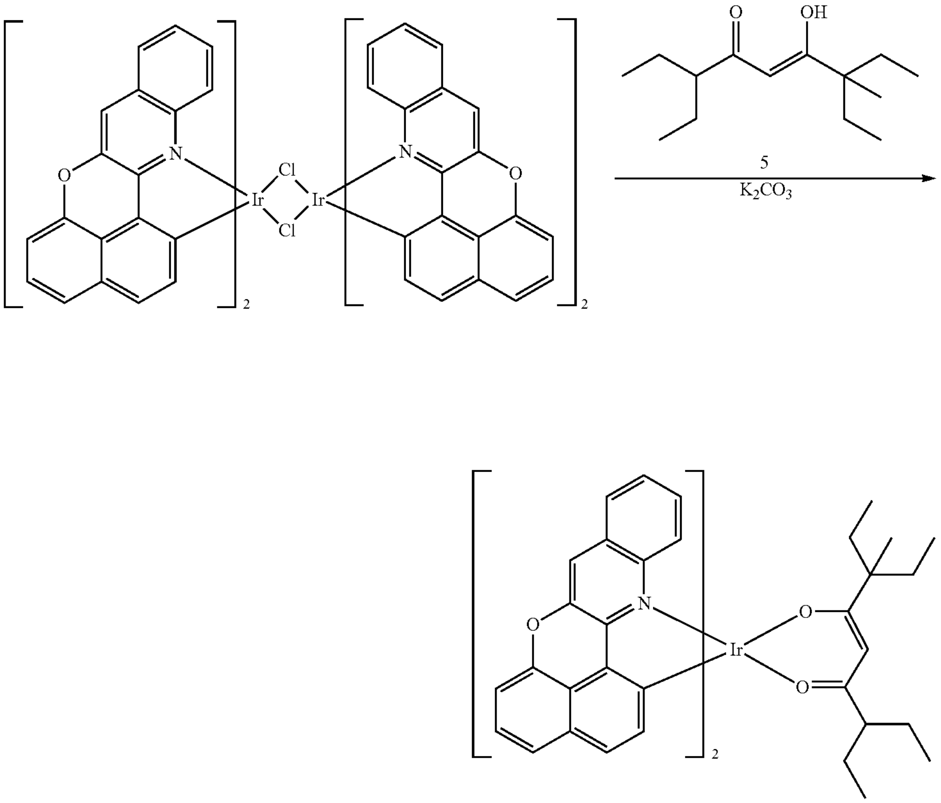

The iridium dimer obtained in step 3, Intermediate 5 (2.09 g, 9.23 mmol) and potassium carbonate (2.55 g, 18.45 mmol) were added to a reaction tube containing 20 mL of dichloromethane and heated to 60° C. and reacted for 24 h under nitrogen protection. Then, the system was poured into a funnel filled with Celite to be filtered, and the filter cake was washed with ethanol. The filter cake was added with dichloromethane and the filtrate was collected. Ethanol was added and the resulting solution was concentrated but not to dryness, and filtered to obtain Compound 99 (1.35 g) with a two-step yield of 38.3%. The structure of the product was confirmed through $L_C$-MS as the target product with a molecular weight of 954.3.

Synthesis Example 2: Synthesis of Compound 91

Step 1: Synthesis of an Iridium Dimer

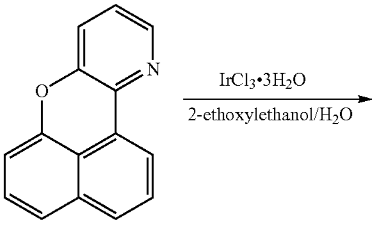

6

-continued

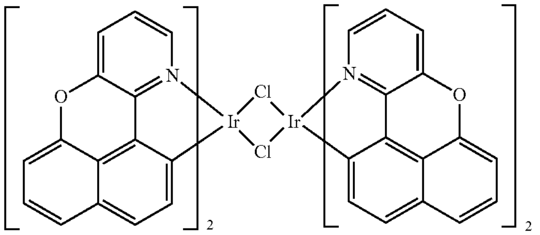

A mixture of Intermediate 6 (1.5 g, 6.80 mmol), iridium trichloride trihydrate (0.60 g, 1.70 mmol), 2-ethoxyethanol (18 mL) and water (6 mL) was refluxed in a nitrogen atmosphere for 40 h. The solution was cooled to room temperature and filtered to obtain an iridium dimer (0.80 g) which was directly used in the next step without further purification.

Step 2: Synthesis of Compound 91

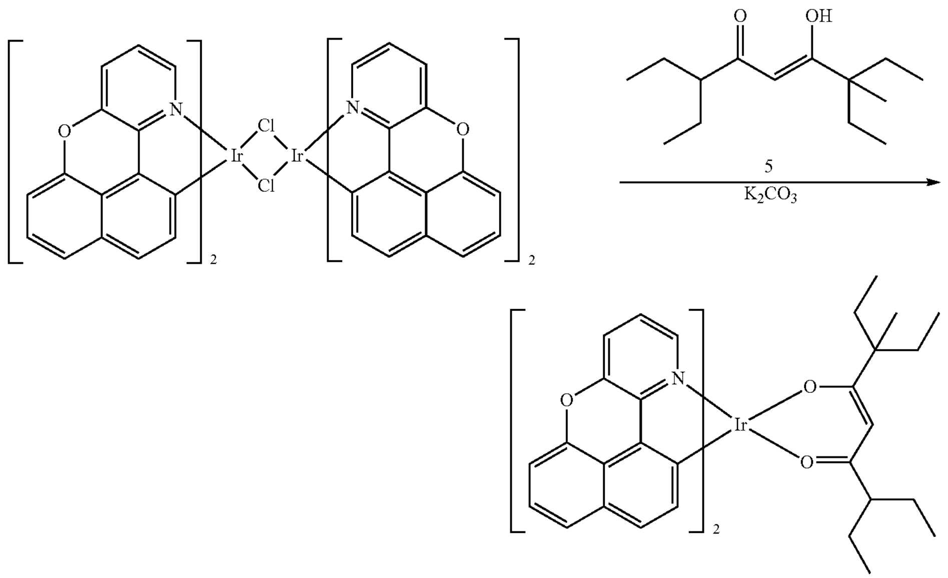

The iridium dimer obtained in step 1, Intermediate 5 (0.36 g, 1.50 mmol) and potassium carbonate (0.83 g, 6.00 mmol) were added to a reaction tube containing 20 mL of dichloromethane and heated to 60° C. and reacted for 40 h under nitrogen protection. Then, the system was poured into a funnel filled with Celite to be filtered and washed with ethanol. The filter cake was added with dichloromethane and the filtrate was collected. Ethanol was added and the resulting solution was concentrated but not to dryness, and filtered to obtain Compound 91 (0.36 g) with a two-step yield of 25.0%. The structure of the product was confirmed through LC-MS as the target product with a molecular weight of 854.3.

Those skilled in the art will appreciate that the above preparation methods are merely exemplary. Those skilled in the art can obtain other compound structures of the present disclosure through the modifications of the preparation methods.

DEVICE EXAMPLE

Device Example 1

First, a glass substrate having an indium tin oxide (ITO) anode with a thickness of 120 nm was cleaned and then treated with oxygen plasma and UV ozone. After the treatment, the substrate was dried in a glovebox to remove moisture. Then, the substrate was mounted on a substrate holder and placed in a vacuum chamber. Organic layers specified below were sequentially deposited through vacuum thermal evaporation on the ITO anode at a rate of 0.2 to 2 Angstroms per second and a vacuum degree of about 10-8 torr. Compound HI was used as a hole injection layer (HIL). Compound HT was used as a hole transporting layer (HTL). Compound EB was used as an electron blocking layer (EBL). Compound 99 of the present disclosure was doped in a host compound RH2 for use as an emissive layer (EML). Compound HB was used as a hole blocking layer (HBL). On the HBL, Compound ET and 8-hydroxyquinolinolato-lithium (Liq) were co-deposited for use as an electron transporting layer (ETL). Finally, Liq was deposited as an electron injection layer with a thickness of 1 nm, and Al was deposited for use as a cathode with a thickness of 120 nm. The device was transferred back to the glovebox and encapsulated with a glass lid and a moisture getter to complete the device.

Device Example 2

Device Example 2 was prepared in the same manner as Device Example 1, except that in the EML, Compound 99 of the present disclosure was replaced with Compound 91 of the present disclosure and Compound RH2 was replaced with Compound RH1 as a host material.

Device Comparative Example 1

Device Comparative Example 1 was prepared in the same manner as Device Example 1, except that in the EML, Compound 99 of the present disclosure was replaced with Compound RD-1.

Device Comparative Example 2

Device Comparative Example 2 was prepared in the same manner as Device Example 2, except that in the EML, Compound 91 of the present disclosure was replaced with Compound RD-2.

The structures and thicknesses of layers of the devices are shown in the following table. A layer using more than one material is obtained by doping different compounds at their weight ratio as recorded.

TABE 1

| Device structures of device examples and comparative examples | | | | | | |
|---|---|---|---|---|---|---|
| Device ID | HI | HT | EB | EM | HB | ET |
| Comparative Example 1 | Compound HI (100 Å) | Compound HT (400 Å) | Compound EB (50 Å) | Compound RH2:Compound RD-1(97:3) (400 Å) | Compound HB (50 Å) | Compound ET:iq (40:60) (350 Å) |
| Comparative Example 2 | Compound HI (100 Å) | Compound HT (400 Å) | Compound EB (50 Å) | Compound RHl:Compound RD-2 (97:3) (400 Å) | Compound HB (50 Å) | Compound ET:iq (40:60) (350 Å) |
| Example 1 | Compound HI (100 Å) | Compound HT (400 Å) | Compound EB (50 Å) | Compound RH2:Compound 99(97:3) (400 Å) | Compound HB (50 Å) | Compound ET:iq (40:60) (350 Å) |
| Example 2 | Compound HI (100 Å) | Compound HT (400 Å) | Compound EB (50 Å) | Compound RHHCompound 91(97:3) (400 Å) | Compound HB (50 Å) | Compound ET:iq (40:60) (350 Å) |

The structures of the materials used in the devices are shown as follows:

Compound HI

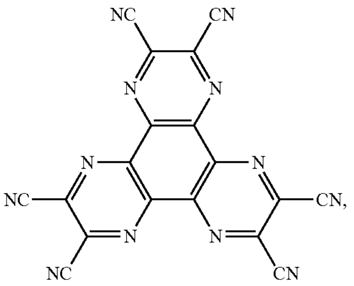

Compound HT

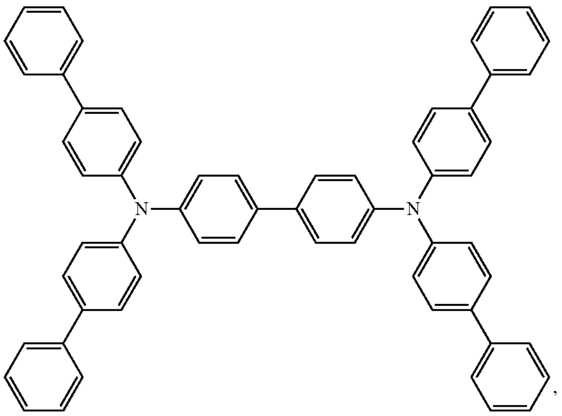

-continued

Compound RH1

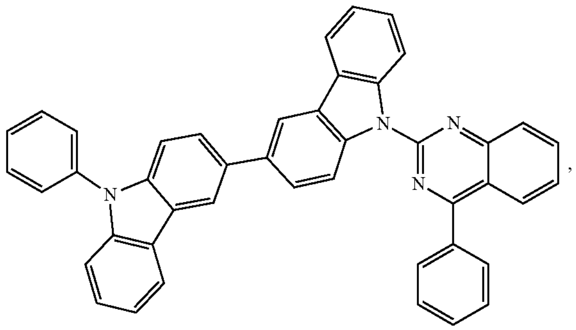

Compound RH2

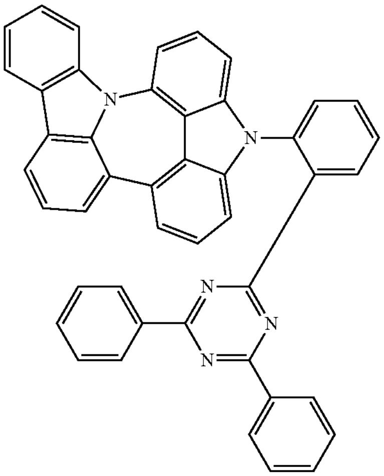

-continued
Compound EB
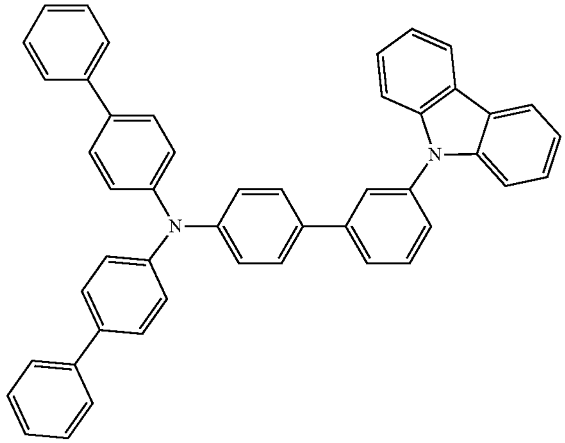
,
Compound HB
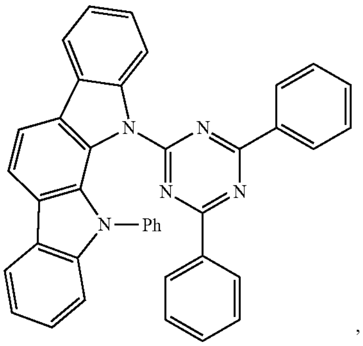
,
Compound ET
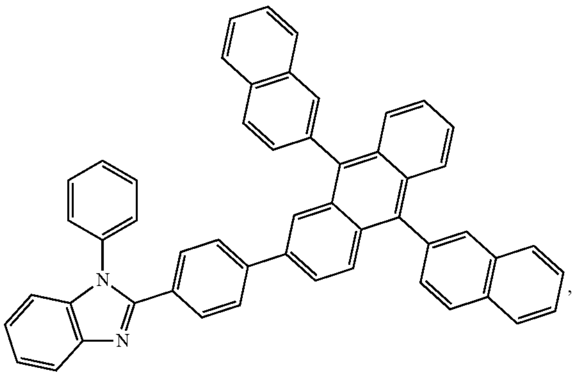
,
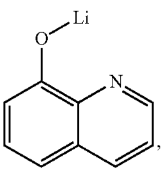
,
Liq
-continued
Compound RD-1
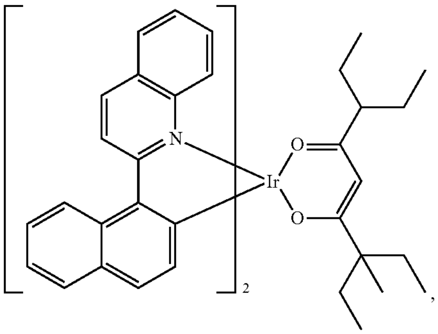
,
Compound RD-2
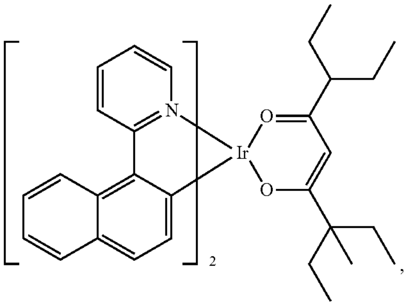
,
Compound 91
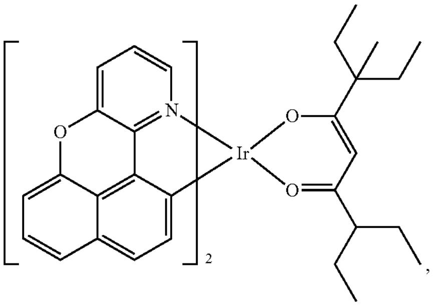
,
Compound 99
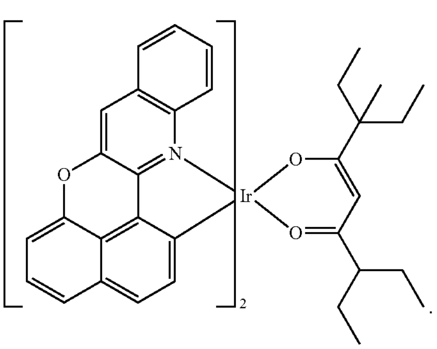
.
Current-voltage-luminance (IVL) characteristics of the devices were measured. Table 2 shows the data on maximum emission wavelengths ($\lambda_{max}$) and full width at half maximum (FWHM) measured at a current density of 15 mA/$cm^2$.

TABLE 2

| Device data | | |
|---|---|---|
| Device No. | $\lambda_{max}$ (nm) | FWHM (nm) |
| Comparative Example 1 | 637 | 44.3 |
| Example 1 | 690 | 36.4 |
| Comparative Example 2 | 595 | 79.6 |
| Example 2 | 643 | 28.3 |

DISCUSSION

Through the comparison of data of Example 1 and Comparative Example 1, it can be found that the maximum emission wavelength of Example 1 reaches 690 nm, which is greatly red-shifted by as much as 53 nm compared with that of Comparative Example 1 and the amplitude is unexpectedly large; and the FWHM of Example 1 is 36.4 nm, which is significantly narrowed by nearly 8 nm compared with the very narrow FWHM (44.3 nm) of Comparative Example 1. It is proved that the compound of the present disclosure can greatly red-shift the emission spectrum of the device, can significantly adjust the emitting color of the device and achieve deep red emission, and can greatly narrow the FWHM and achieve very saturated emission.

Through the comparison of data of Example 2 and Comparative Example 2, it can be found that the maximum emission wavelength of Example 2 reaches 643 nm, which is greatly red-shifted by as much as 48 nm compared with that of Comparative Example 2; and the FWHM of Example 2 reaches 28.3 nm, which is very rare and greatly narrowed by 51.3 nm compared with that of Comparative Example 2, and the amplitude is unexpectedly large, achieving very saturated emission. It is proved again that the compound of the present disclosure can greatly red-shift the emission spectrum of the device, can significantly adjust the emitting color of the device and achieve deep red emission, and can greatly narrow the FWHM and achieve very saturated emission.

To sum up, the compound of the present disclosure can significantly adjust the emitting color of the device, has a very narrow FWHM and can greatly improve the luminescence saturation of the device, and has a good application prospect.

It is to be understood that various embodiments described herein are merely illustrative and not intended to limit the scope of the present disclosure. Therefore, it is apparent to the persons skilled in the art that the present disclosure as claimed may include variations of specific embodiments and preferred embodiments described herein. Many of the materials and structures described herein may be replaced with other materials and structures without departing from the spirit of the present disclosure. It is to be understood that various theories as to why the present disclosure works are not intended to be limiting.

What is claimed is:

1. A metal complex, comprising a ligand $L_a$ and a metal M, wherein the metal complex has a structure of $M(L_a)_m(L_b)_n$;

the metal M is Ir, $L_a$ and $L_b$ are a first ligand and a second ligand of the metal complex, respectively; $L_a$ and $L_b$ can be optionally joined to form a multidentate ligand;

m is 1 or 2, n is 1 or 2, and m+n equals an oxidation state of the metal M;

when m is 2, two $L_a$ may be the same or different; when n is 2, two $L_b$ may be the same or different;

and the ligand $L_a$ has a structure represented by any one of the group consisting of Formula 2 to Formula 4, Formula 6, Formula 9, Formula 11, Formula 13, and Formula 15:

Formula 2

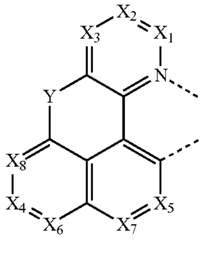

,

Formula 3

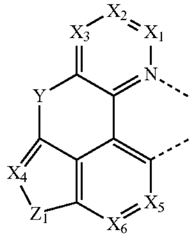

,

Formula 4

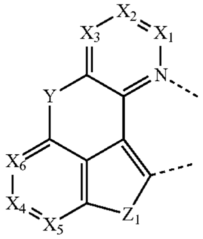

,

Formula 6

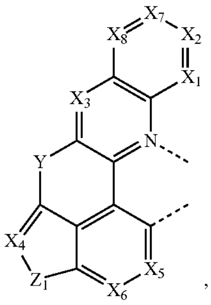

,

Formula 9

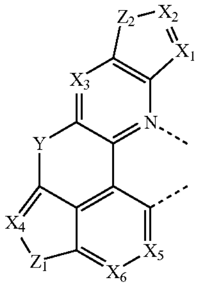

,

-continued

Formula 11

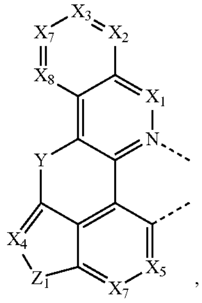

,

Formula 13

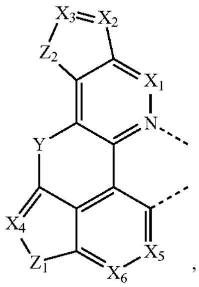

, and

Formula 15

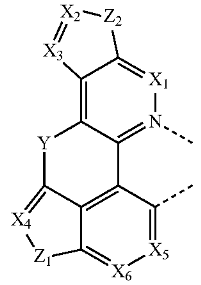

;

$X_1$ to $X_8$ are, at each occurrence identically or differently, selected from $CR_x$ or N;

$Z_1$ and $Z_2$ are, at each occurrence identically or differently, selected from O, S or $NR_z$;

Y is selected from $CR_yR_y$, $SiR_yR_y$, $GeR_yR_y$, $NR_y$, $PR_y$, O, S or Se;

$R_x$, $R_y$ and $R_z$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof; and adjacent substituents $R_z$ and $R_y$ can be optionally joined to form a ring;

$L_b$ is, at each occurrence identically or differently, selected from the following structure:

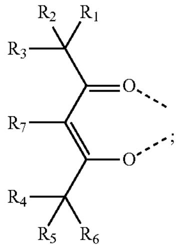

;

$R_1$ to $R_7$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a sulfanyl group, a sulfinyl group, a sulfonyl group, a phosphino group and combinations thereof.

2. The metal complex of claim 1, wherein the $L_a$ has a structure represented by Formula 2:

Formula 2

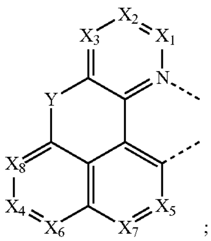

;

$X_1$ to $X_8$ are, at each occurrence identically or differently, selected from $CR_x$ or N;

Y is selected from $CR_yR_y$, $SiR_yR_y$, $GeR_yR_y$, $NR_y$, $PR_y$, O, S or Se; when two $R_y$ are present at the same time, the two $R_y$ are the same or different;

$R_x$ and $R_y$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof; and adjacent substituents $R_y$ can be optionally joined to form a ring.

3. The metal complex of claim 1, wherein in Formula 2 to Formula 4, Formula 6, Formula 9, Formula 11, Formula 13, and Formula 15, at least one of $X_1$ to $X_n$ is selected from N, and $X_n$ corresponds to one of $X_1$ to $X_8$ that has the largest number in any one of Formula 2 to Formula 4, Formula 6, Formula 9, Formula 11, Formula 13, and Formula 15.

4. The metal complex of claim 1, wherein in Formula 2 to Formula 4, Formula 6, Formula 9, Formula 11, Formula 13, and Formula 15, $X_1$ to $X_8$ are, at each occurrence identically or differently, selected from $CR_x$.

5. The metal complex of claim 1, wherein in Formula 2 to Formula 4, Formula 6, Formula 9, Formula 11, Formula 13, and Formula 15, $R_x$, $R_z$ and $R_y$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, a cyano group, an isocyano group, a hydroxyl group, a sulfanyl group and combinations thereof.

6. The metal complex of claim 1, wherein in Formula 2 to Formula 4, Formula 6, Formula 9, Formula 11, Formula 13, and Formula 15, at least one, two or three of $X_1$ to $X_n$ are, at each occurrence identically or differently, selected from $CR_x$, and $X_n$ corresponds to one of $X_1$ to $X_8$ that has the largest number in any one of Formula 2 to Formula 4, Formula 6, Formula 9, Formula 11, Formula 13, and Formula 15; and the $R_x$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, cyano and combinations thereof.

7. The metal complex of claim 6, wherein in Formula 2 to Formula 4, Formula 6, Formula 9, Formula 11, Formula 13, and Formula 15, $X_3$ to $X_5$ are, at each occurrence identically or differently, selected from $CR_x$.

8. The metal complex of claim 1, wherein in Formula 2 to Formula 4, Formula 6, Formula 9, Formula 11, Formula 13, and Formula 15, $X_1$ to $X_8$ are, at each occurrence identically or differently, selected from $CR_x$ or N; at least one of $X_1$ to $X_n$ is selected from $CR_x$, and $X_n$ corresponds to one of $X_1$ to $X_8$ that has the largest number in any one of Formula 2 to Formula 4, Formula 6, Formula 9, Formula 11, Formula 13, and Formula 15; and the $R_x$ is, at each occurrence identically or differently, selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof.

9. The metal complex of claim 8, wherein in Formula 2 to Formula 4, Formula 9, Formula 13 and Formula 15, at least one of $X_1$ to $X_3$ is selected from $CR_x$; in Formula 6 and Formula 11, at least one of $X_1$ to $X_3$, $X_7$ and $X_8$ is selected from $CR_x$; and the $R_x$ is, at each occurrence identically or differently, selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof.

10. The metal complex of claim 8, wherein in Formula 2, at least one or at least two of $X_4$ to $X_8$ are, at each occurrence identically or differently, selected from $CR_x$; in Formula 3, Formula 4, Formula 6, Formula 9, Formula 11, Formula 13 and Formula 15, at least one or at least two of $X_4$ to $X_6$ are, at each occurrence identically or differently, selected from $CR_x$; and the $R_x$ is, at each occurrence identically or differently, selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof.

11. The metal complex of claim 8, wherein in Formula 2 to Formula 4, Formula 6, Formula 9, Formula 11, Formula 13, and Formula 15, $X_1$ to $X_8$ are, at each occurrence identically or differently, selected from $CR_x$ or N; at least one of $X_1$ to $X_n$ is selected from $CR_x$, and $X_n$ corresponds to one of $X_1$ to $X_8$ that has the largest number in any one of Formula 2 to Formula 4, Formula 6, Formula 9, Formula 11, Formula 13, and Formula 15; and the $R_x$ is, at each occurrence identically or differently, selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, cyano and combinations thereof.

12. The metal complex of claim 8, wherein in Formula 2 to Formula 4, Formula 6, Formula 9, Formula 11, Formula 13, and Formula 15, at least one of $X_1$ to $X_3$ is, at each occurrence identically or differently, selected from $CR_x$.

13. The metal complex of claim 8, wherein in Formula 2 to Formula 4, Formula 6, Formula 9, Formula 11, Formula 13, and Formula 15, at least one or at least two of $X_4$ to $X_6$ are, at each occurrence identically or differently, selected from $CR_x$.

14. The metal complex of claim 1, wherein Y is selected from O, S or Se.

15. The metal complex of claim 1, wherein the $L_a$ is, at each occurrence identically or differently, selected from the group consisting of the following structures:

$L_{a1}$

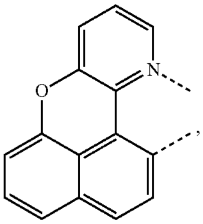

-continued $L_{a2}$

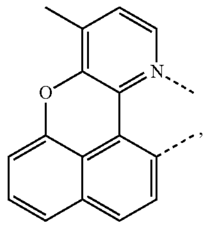

$L_{a3}$

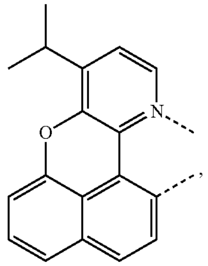

$L_{a4}$

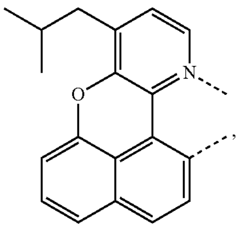

$L_{a5}$

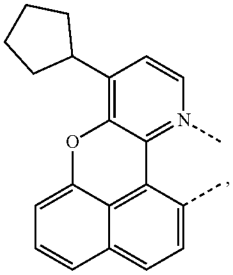

$L_{a6}$

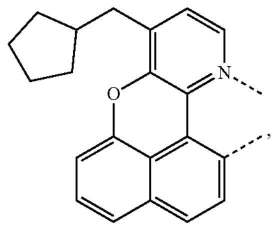

$L_{a7}$

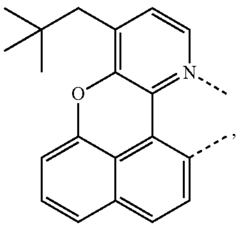

-continued
$L_{a8}$
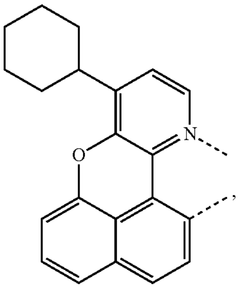
$L_{a9}$
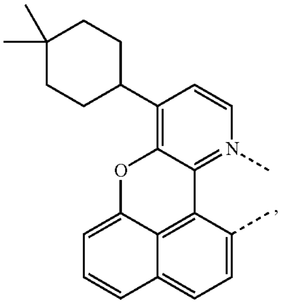
$L_{a10}$
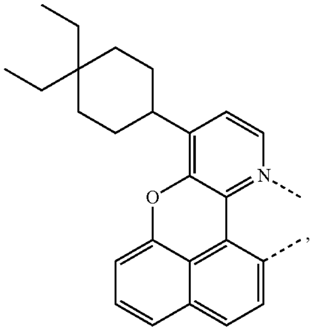
$L_{a11}$
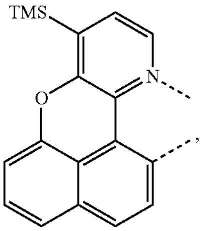
$L_{a12}$
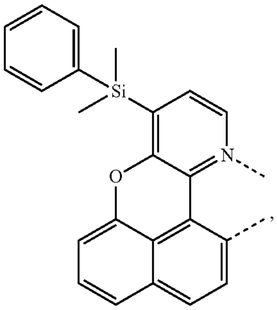
-continued
$L_{a13}$
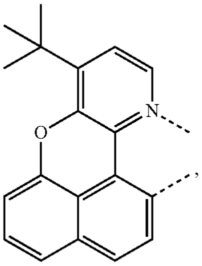
$L_{a14}$
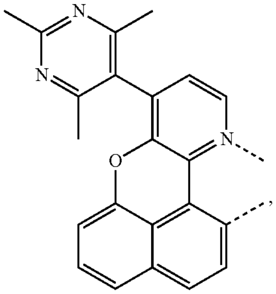
$L_{a15}$
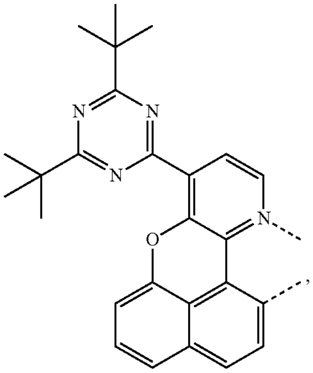
$L_{a16}$
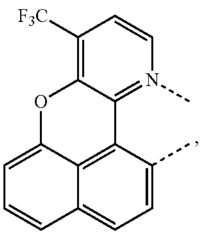
$L_{a17}$
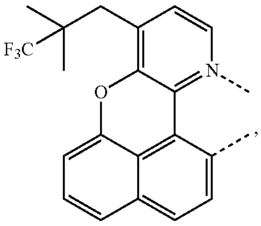

-continued
$L_{a18}$
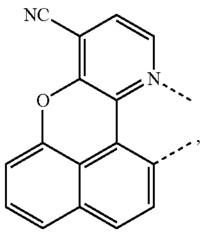
$L_{a19}$
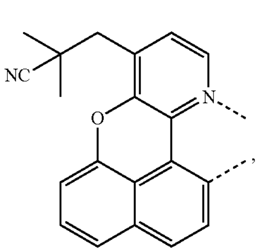
$L_{a20}$
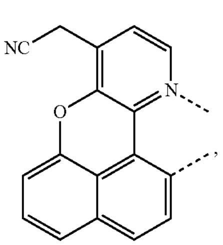
$L_{a61}$
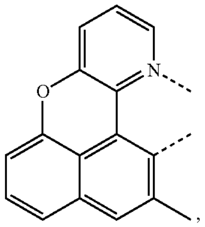
$L_{a62}$
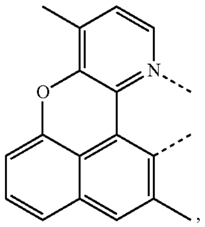
$L_{a63}$
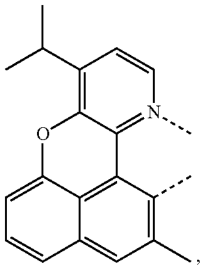
-continued
$L_{a64}$
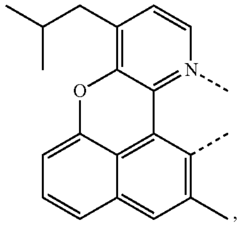
$L_{a65}$
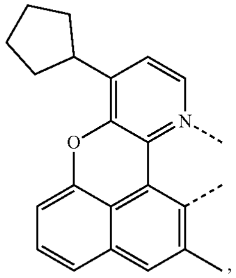
$L_{a66}$
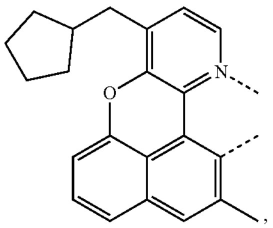
$L_{a67}$
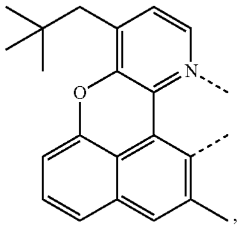
$L_{a68}$
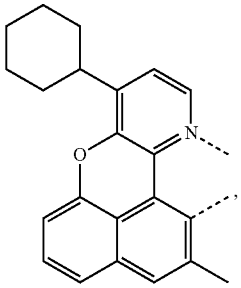
$L_{a69}$
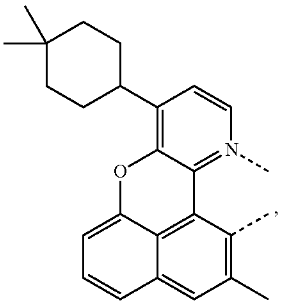

-continued
La70
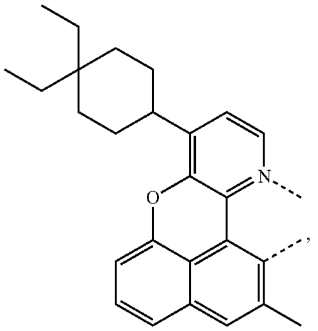
La71
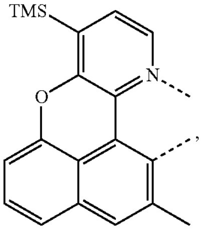
La72
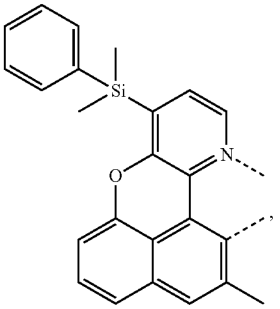
La73
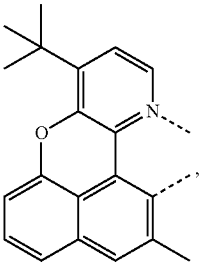
La74
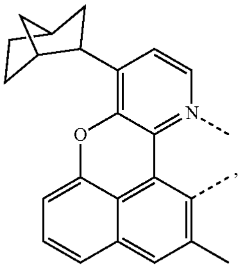
-continued
La75
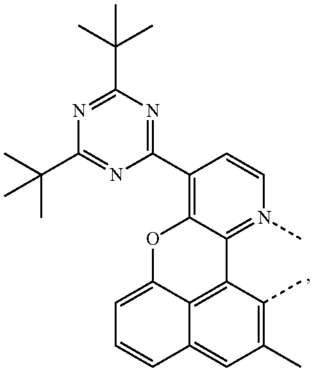
La76
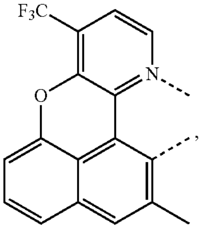
La77
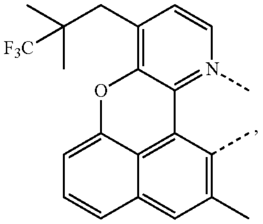
La78
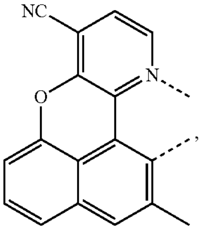
La79
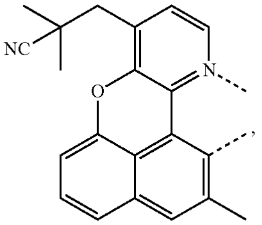
La80
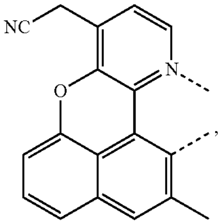

-continued
L$_{a274}$
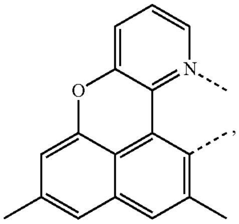
L$_{a275}$
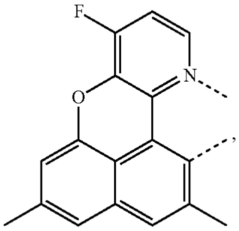
L$_{a276}$
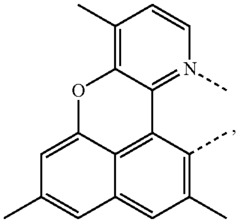
L$_{a277}$
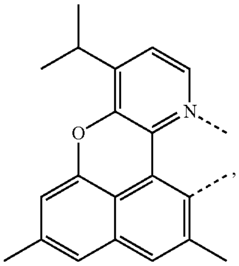
L$_{a278}$
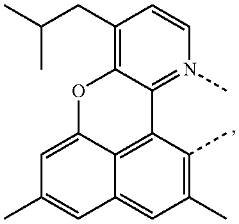
L$_{a279}$
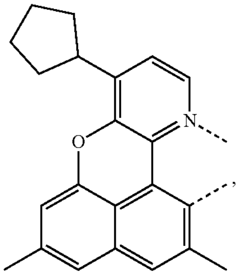
-continued
L$_{a280}$
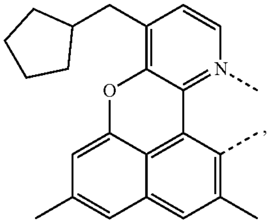
L$_{a281}$
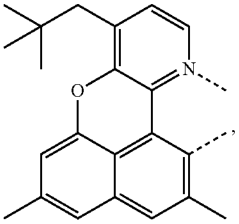
L$_{a282}$
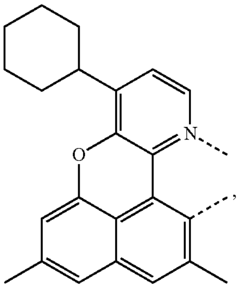
L$_{a283}$
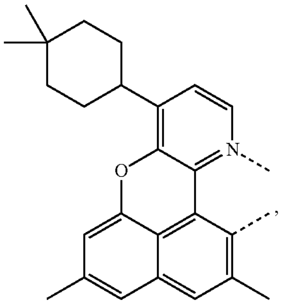
L$_{a284}$
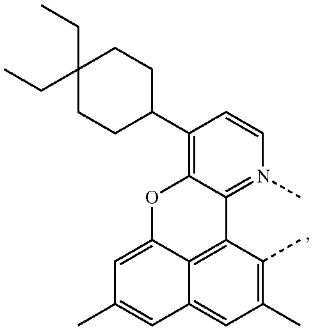

-continued
$L_{a285}$
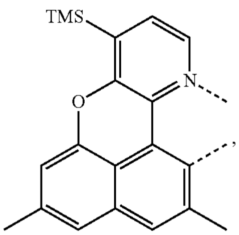
$L_{a286}$
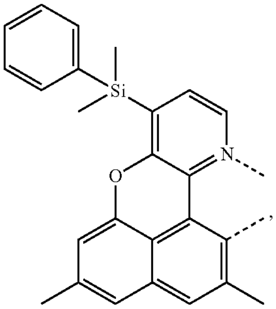
$L_{a287}$
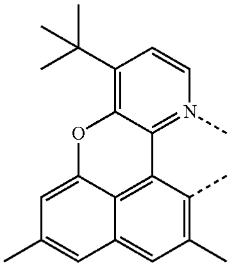
$L_{a288}$
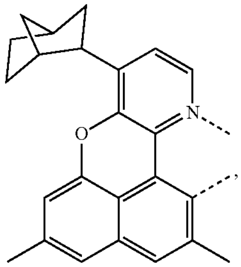
$L_{a289}$
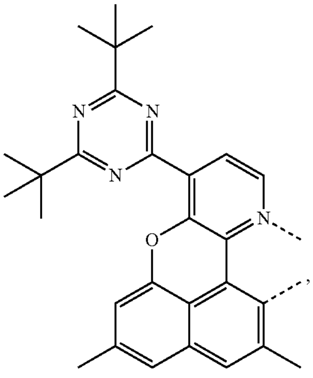
-continued
$L_{a290}$
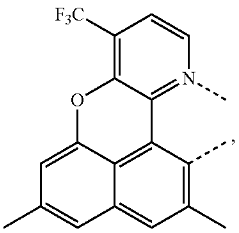
$L_{a291}$
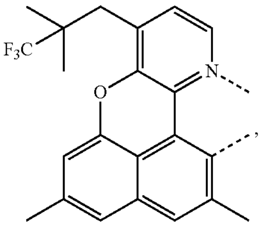
$L_{a292}$
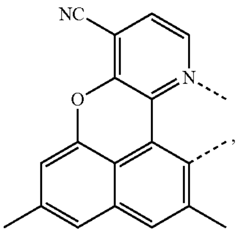
$L_{a293}$
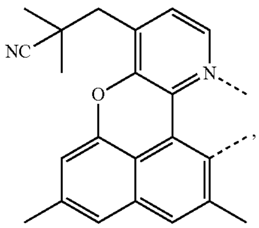
$L_{a294}$
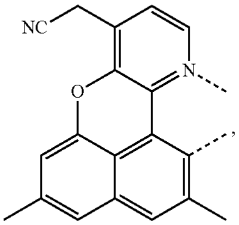
$L_{a373}$
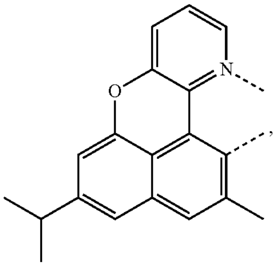

-continued
$L_{a374}$
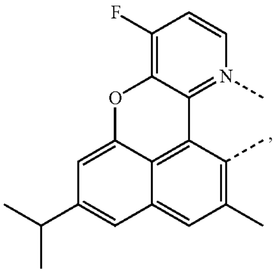
$L_{a375}$
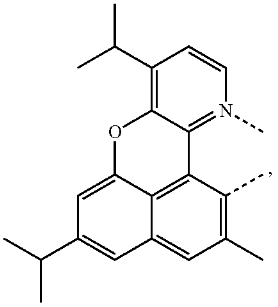
$L_{a376}$
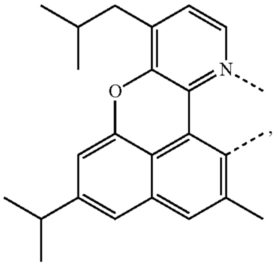
$L_{a377}$
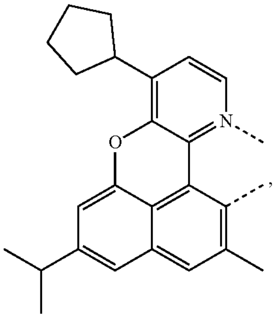
$L_{a378}$
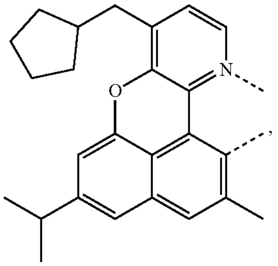
-continued
$L_{a379}$
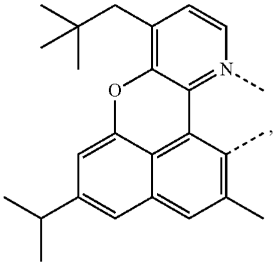
$L_{a380}$
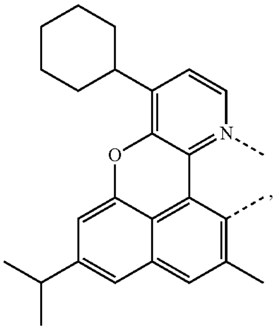
$L_{a381}$
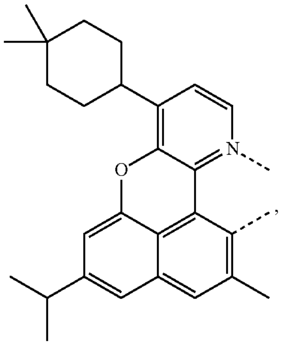
$L_{a382}$
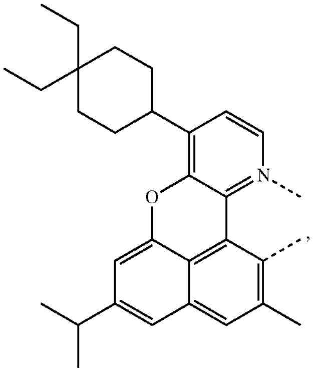
$L_{a383}$
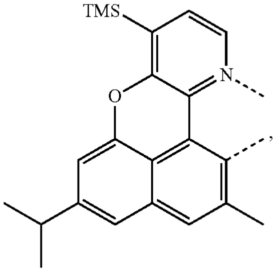

-continued
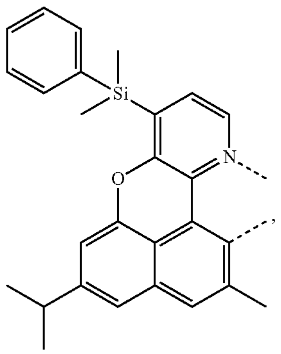
$L_{a384}$
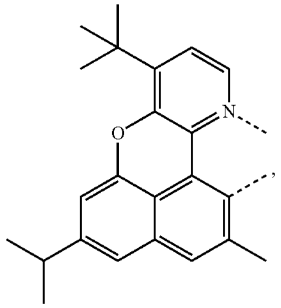
$L_{a385}$
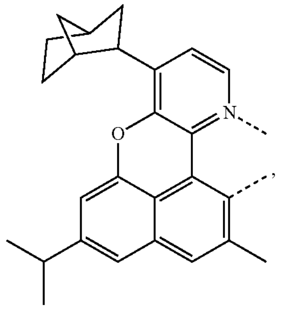
$L_{a386}$
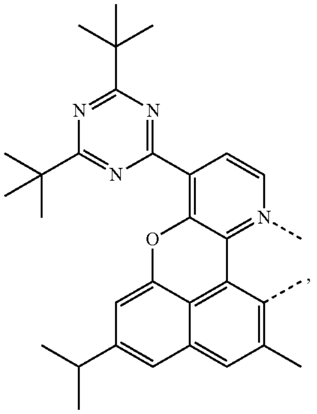
$L_{a387}$
-continued
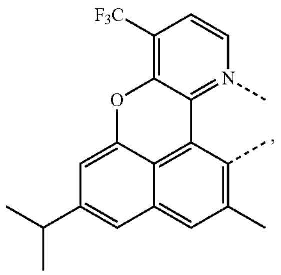
$L_{a388}$
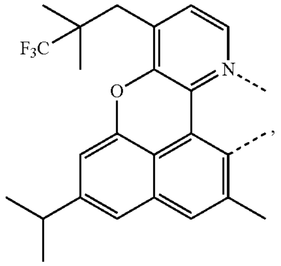
$L_{a389}$
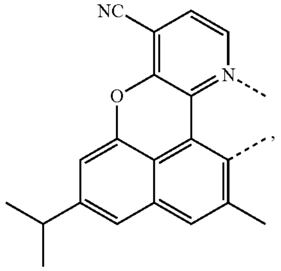
$L_{a390}$
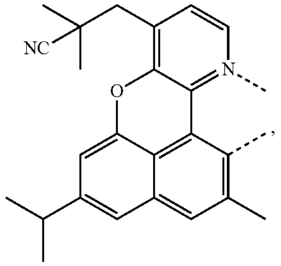
$L_{a391}$
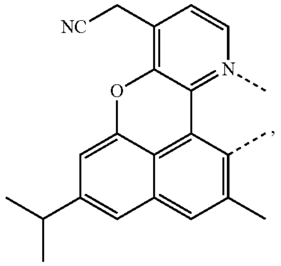
$L_{a392}$ -continued
$L_{a470}$
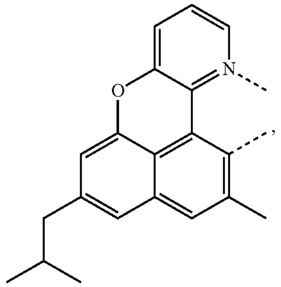
$L_{a471}$
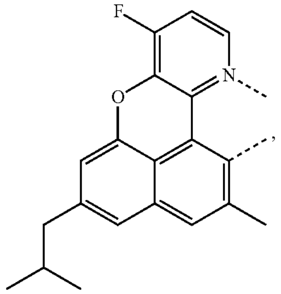
$L_{a472}$
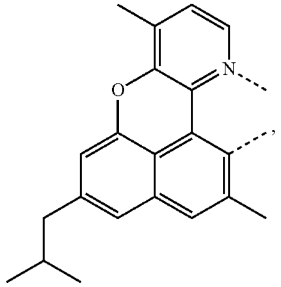
$L_{a473}$
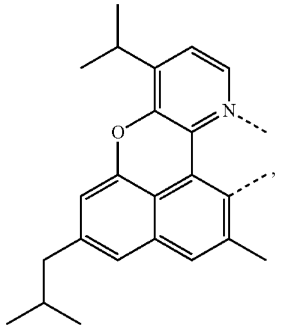
$L_{a474}$
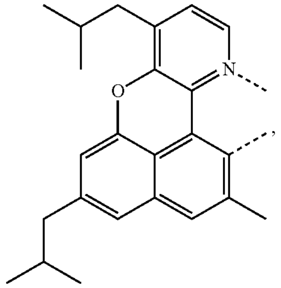
-continued
$L_{a475}$
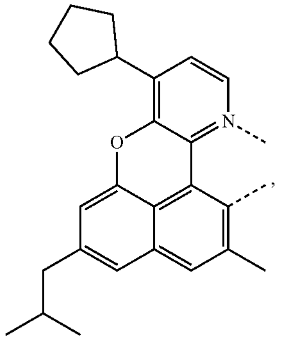
$L_{a476}$
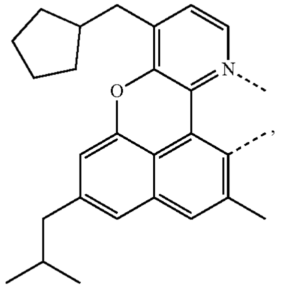
$L_{a477}$
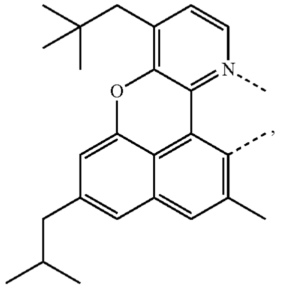
$L_{a478}$
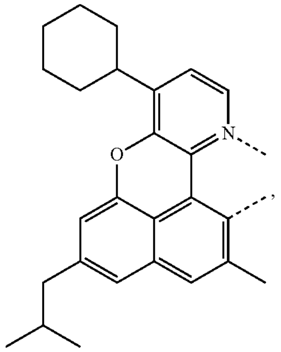

-continued
L$_{a479}$
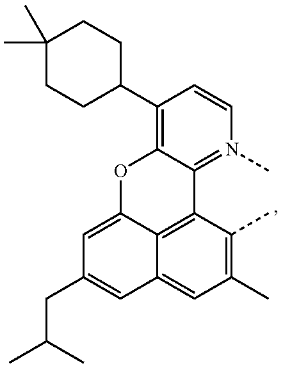
L$_{a480}$
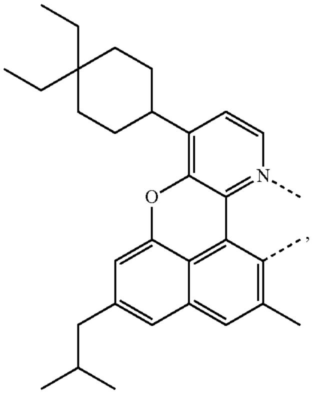
L$_{a481}$
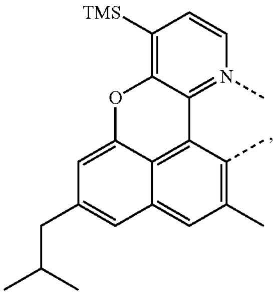
L$_{a482}$
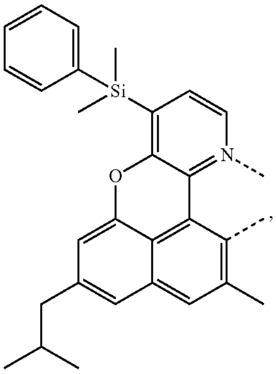
-continued
L$_{a483}$
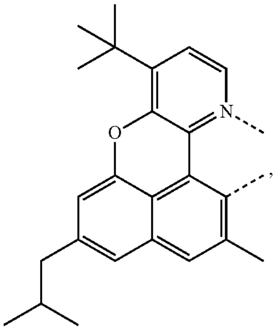
L$_{a484}$
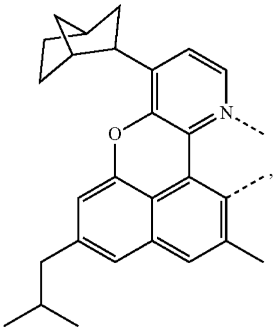
L$_{a485}$
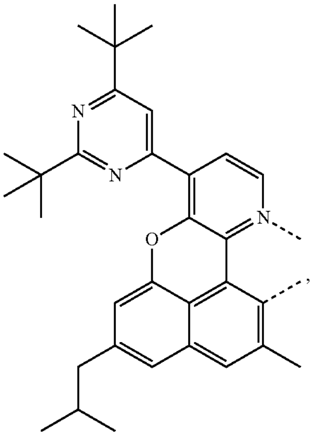
L$_{a486}$
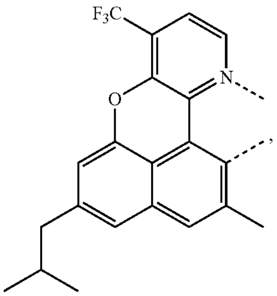

-continued
$L_{a487}$
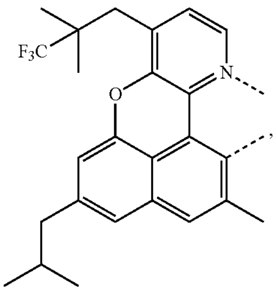
$L_{a488}$
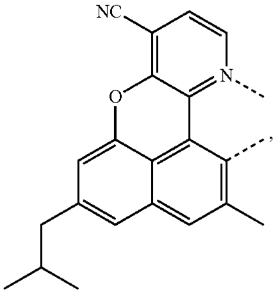
$L_{a489}$
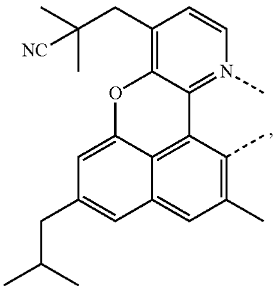
$L_{a490}$
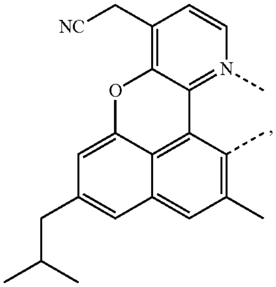
$L_{a569}$
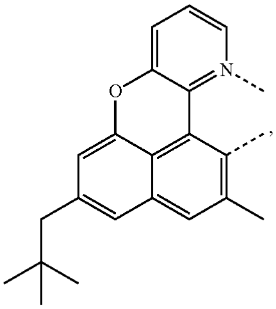
-continued
$L_{a570}$
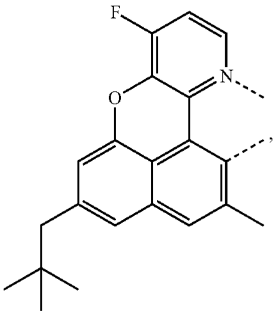
$L_{a571}$
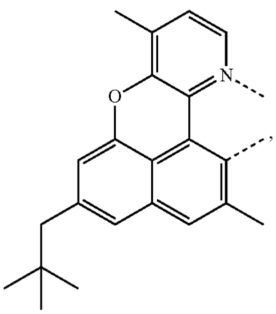
$L_{a572}$
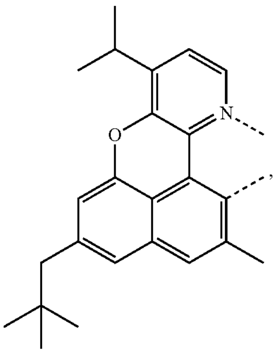
$L_{a573}$
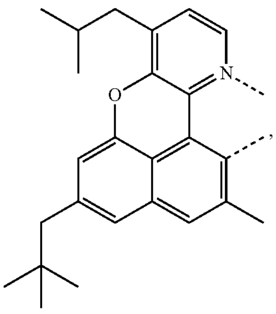

-continued
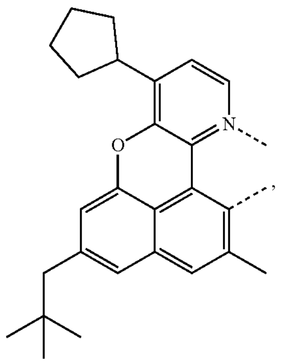
$L_{a574}$
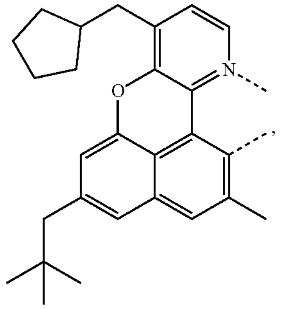
$L_{a575}$
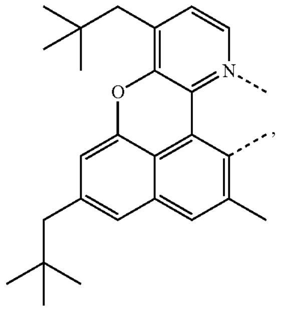
$L_{a576}$
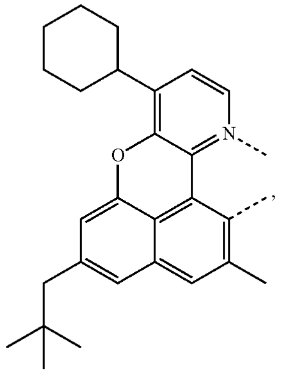
$L_{a577}$
-continued
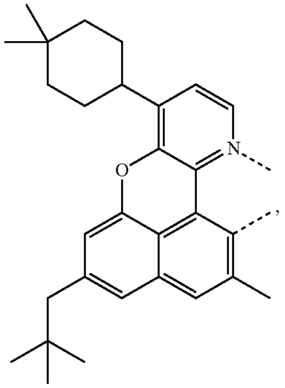
$L_{a578}$
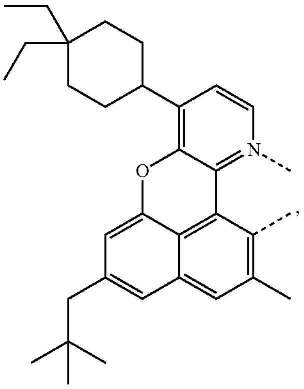
$L_{a579}$
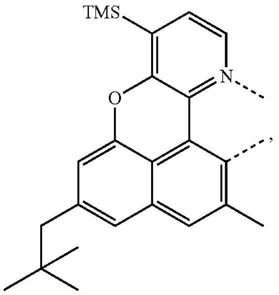
$L_{a580}$
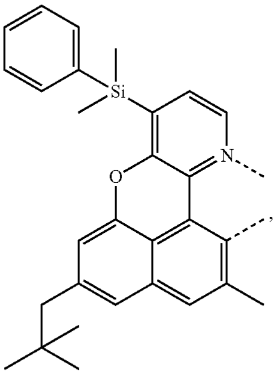
$L_{a581}$ -continued
$L_{a582}$
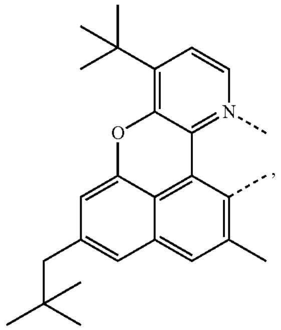
$L_{a583}$
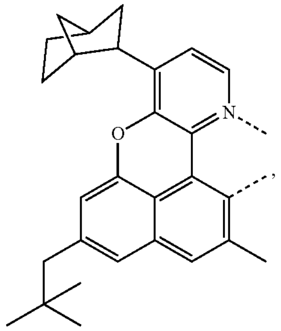
$L_{a584}$
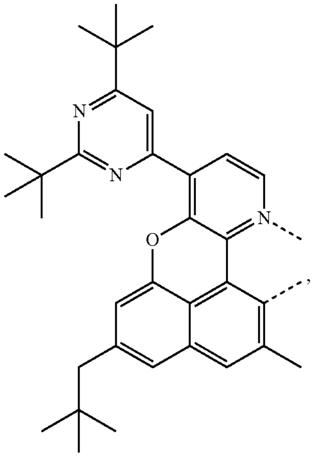
$L_{a585}$
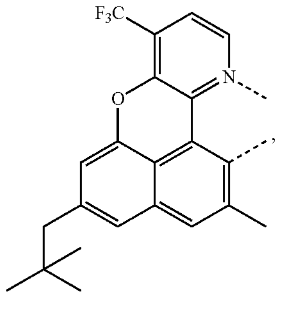
-continued
$L_{a586}$
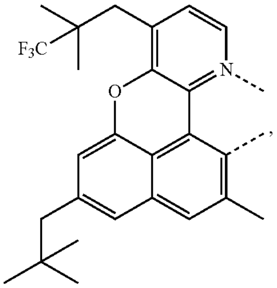
$L_{a587}$
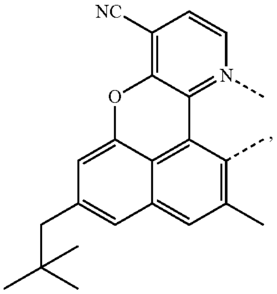
$L_{a588}$
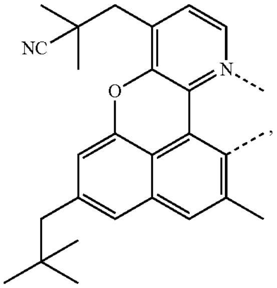
$L_{a589}$
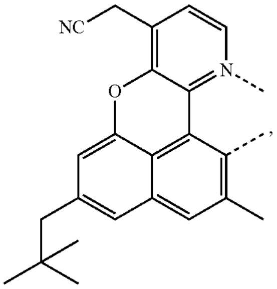
$L_{a1059}$
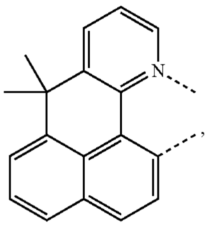

-continued
$L_{a1060}$
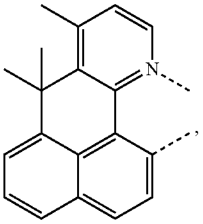
$L_{a1061}$
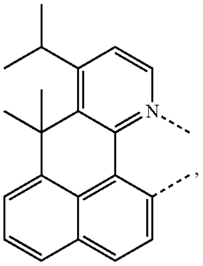
$L_{a1062}$
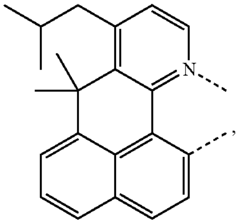
$L_{a1063}$
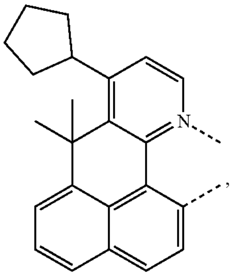
$L_{a1064}$
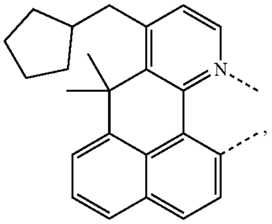
$L_{a1065}$
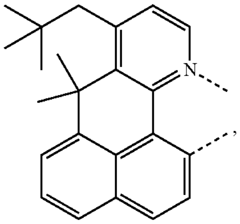
-continued
$L_{a1066}$
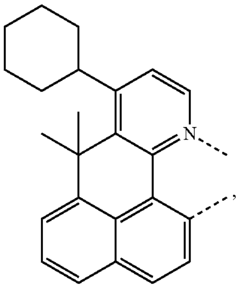
$L_{a1067}$
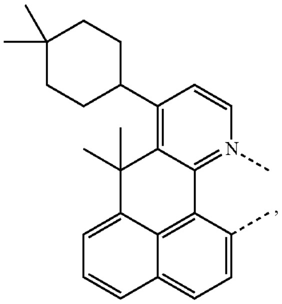
$L_{a1068}$
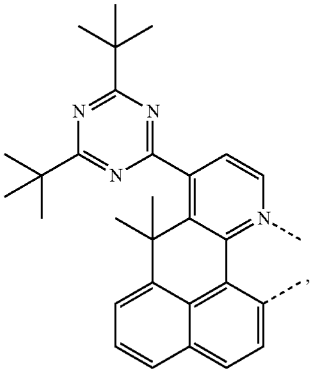
$L_{a1069}$
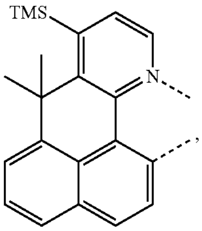
$L_{a1070}$
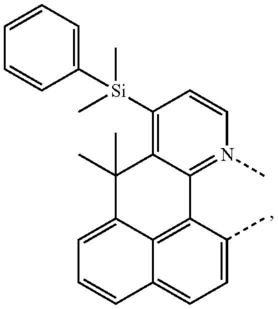

-continued
L$_{a1071}$
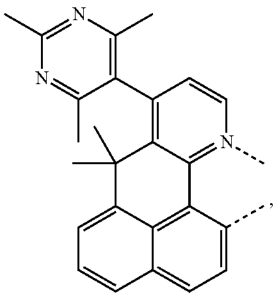
L$_{a1072}$
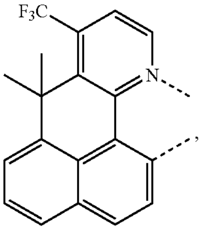
L$_{a1073}$
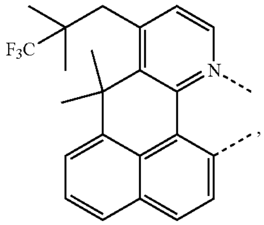
L$_{a1074}$
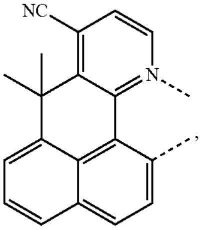
L$_{a1075}$
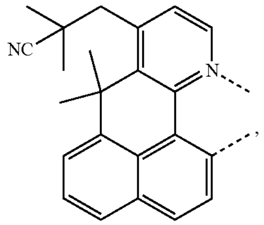
L$_{a1076}$
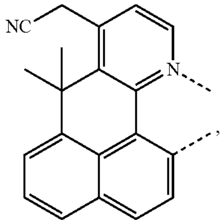
-continued
L$_{a1117}$
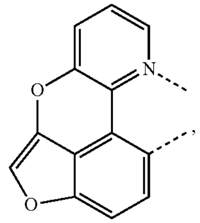
L$_{a1118}$
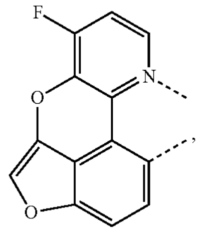
L$_{a1119}$
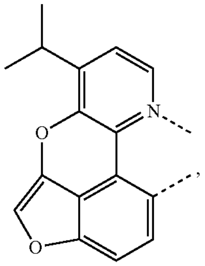
L$_{a1120}$
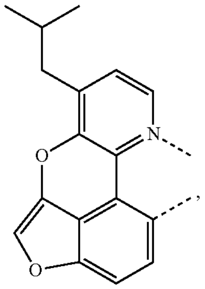
L$_{a1121}$
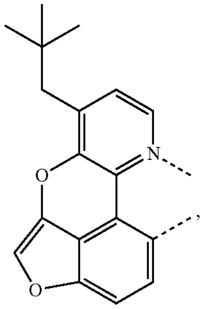

$L_{a1122}$
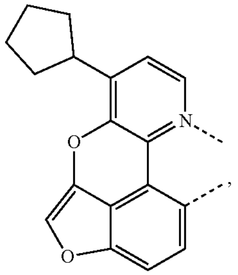
$L_{a1123}$
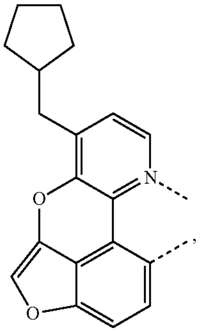
$L_{a1124}$
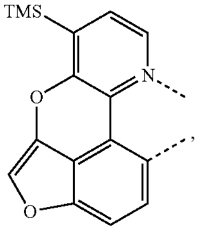
$L_{a1125}$
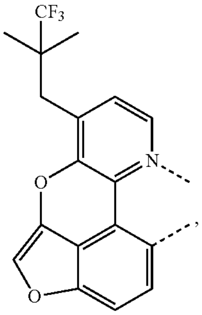
$L_{a1126}$
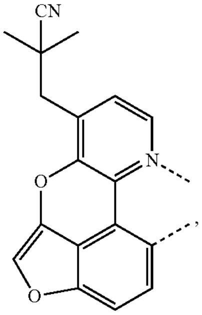
$L_{a1127}$
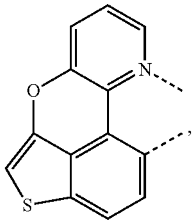
$L_{a1128}$
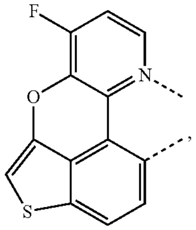
$L_{a1129}$
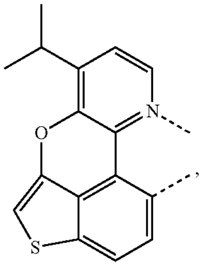
$L_{a1130}$
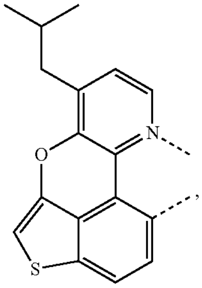
$L_{a1131}$
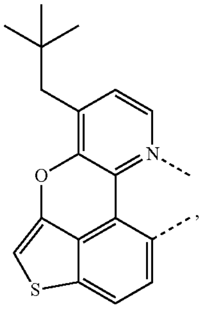

-continued
$L_{a1132}$
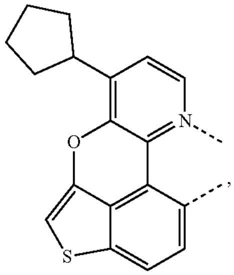
$L_{a1133}$
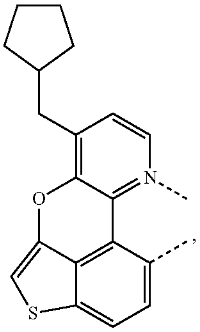
$L_{a1134}$
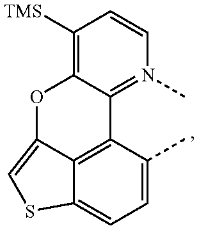
$L_{a1135}$
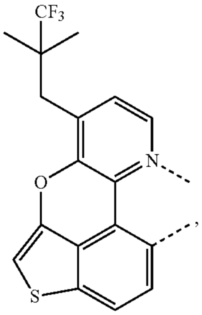
$L_{a1136}$
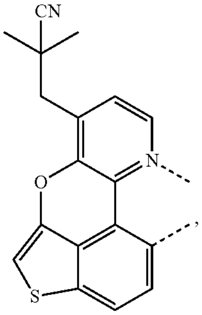
-continued
$L_{a1137}$
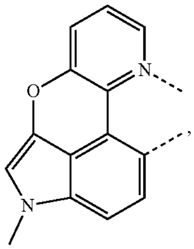
$L_{a1138}$
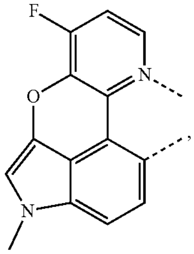
$L_{a1139}$
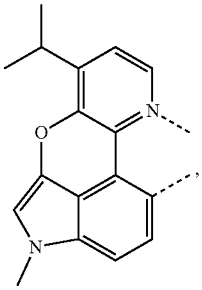
$L_{a1140}$
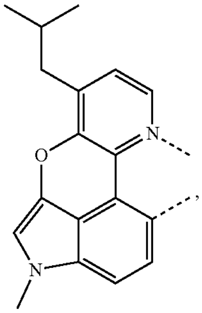
$L_{a1141}$
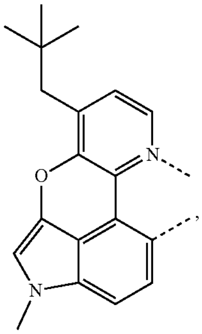

-continued
$L_{a1142}$
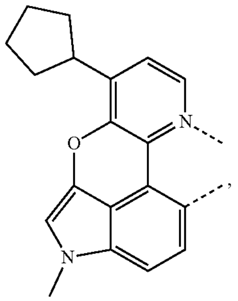
$L_{a1143}$
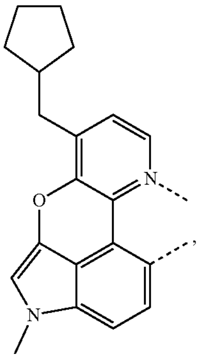
$L_{a1144}$
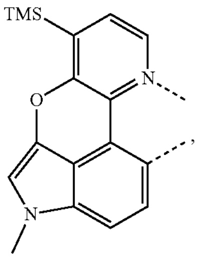
$L_{a1145}$
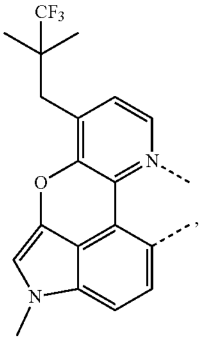
$L_{a1146}$
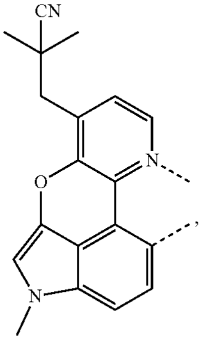
-continued
$L_{a1147}$
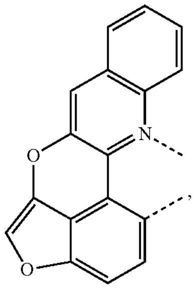
$L_{a1148}$
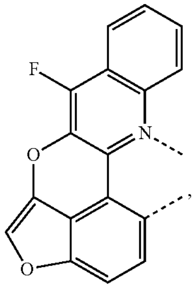
$L_{a1149}$
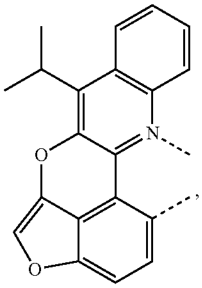
$L_{a1150}$
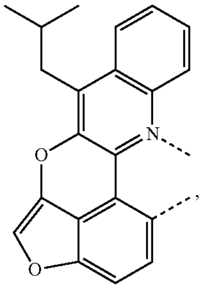
$L_{a1151}$
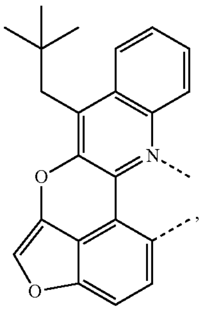

$L_{a1152}$
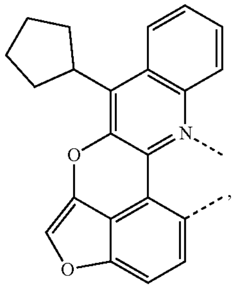
$L_{a1153}$
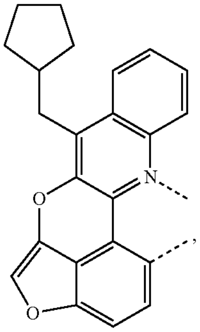
$L_{a1154}$
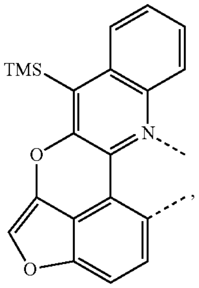
$L_{a1155}$
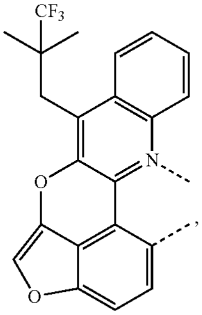
$L_{a1156}$
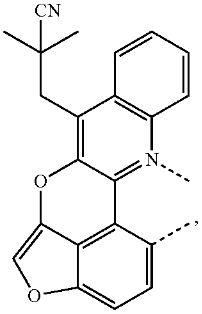
$L_{a1157}$
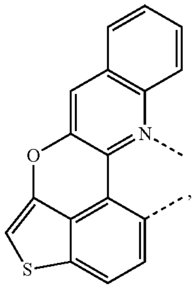
$L_{a1158}$
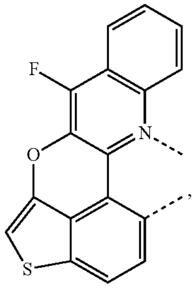
$L_{a1159}$
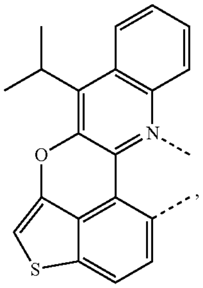
$L_{a1160}$
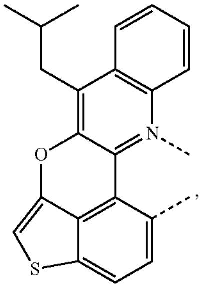
$L_{a1161}$
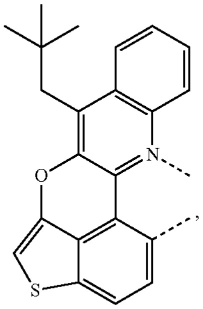

-continued
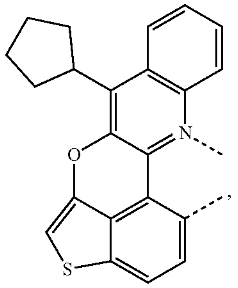
$L_{a1162}$
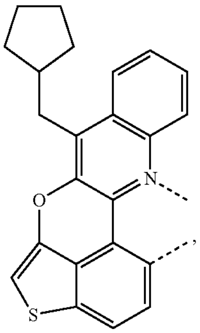
$L_{a1163}$
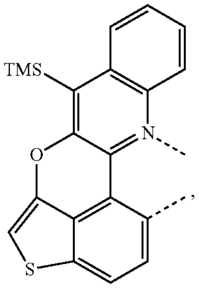
$L_{a1164}$
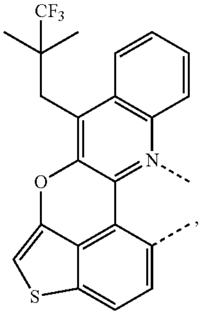
$L_{a1165}$
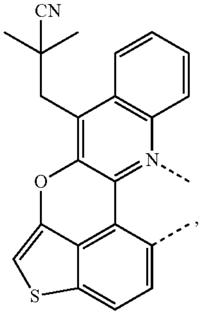
$L_{a1166}$
-continued
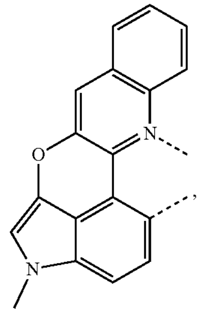
$L_{a1167}$
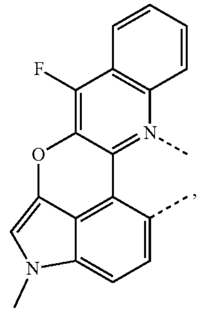
$L_{a1168}$
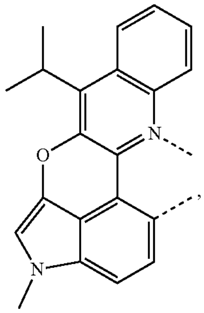
$L_{a1169}$
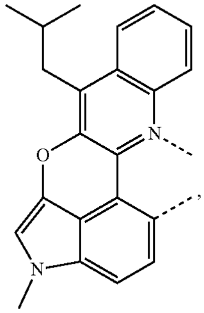
$L_{a1170}$
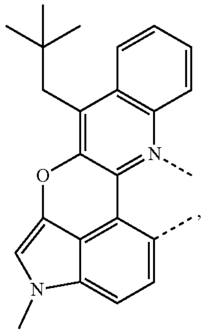
$L_{a1171}$ -continued
$L_{a1172}$
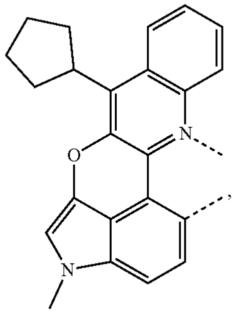
$L_{a1173}$
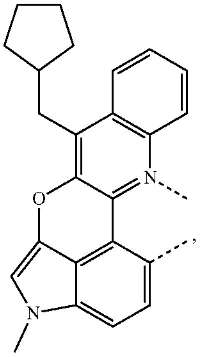
$L_{a1174}$
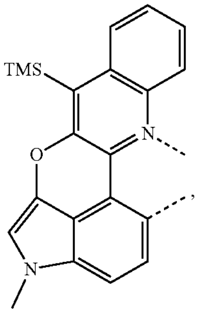
$L_{a1175}$
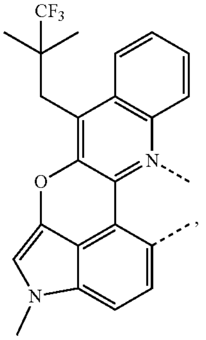
-continued
$L_{a1176}$
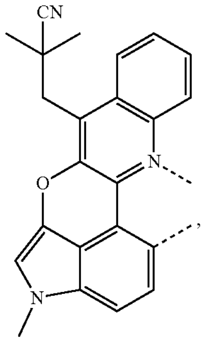
$L_{a1177}$
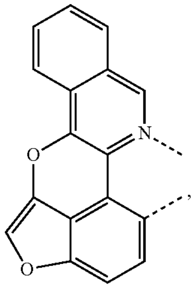
$L_{a1178}$
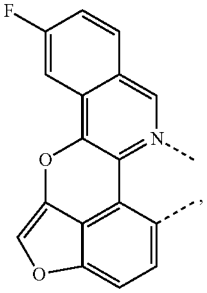
$L_{a1179}$
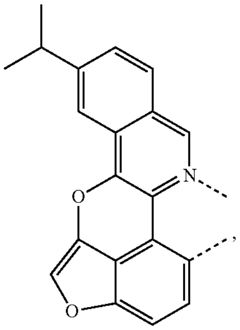
$L_{a1180}$
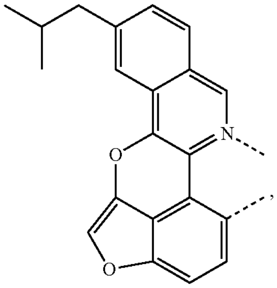

-continued
$L_{a1181}$
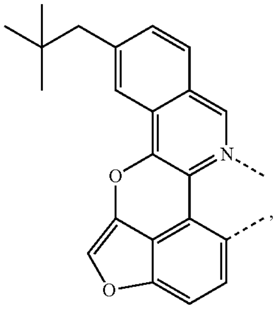
$L_{a1182}$
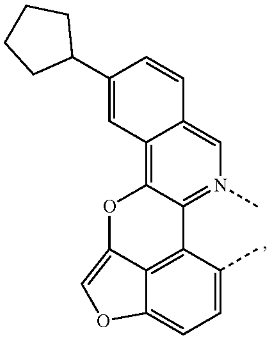
$L_{a1183}$
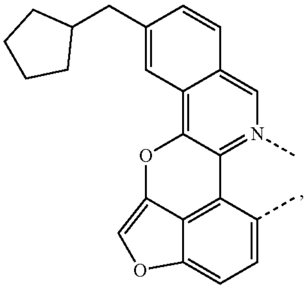
$L_{a1184}$
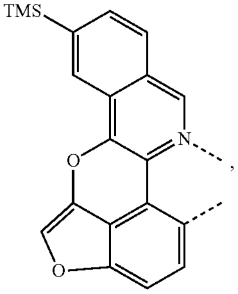
-continued
$L_{a1185}$
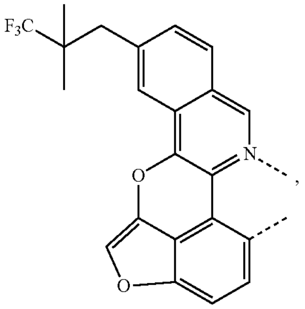
$L_{a1186}$
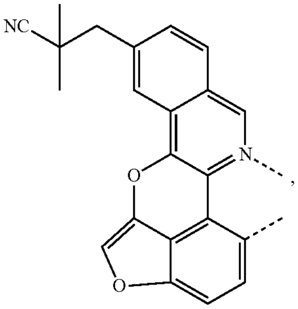
$L_{a1187}$
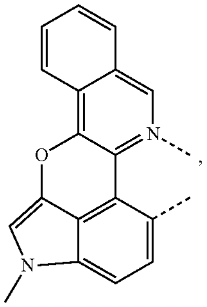
$L_{a1188}$
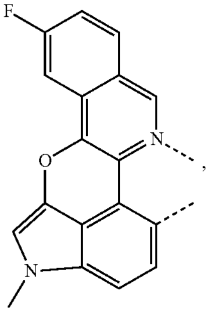
$L_{a1189}$
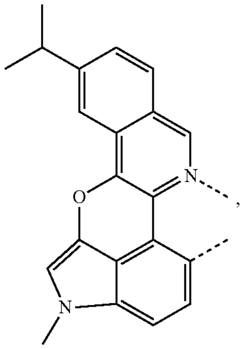

-continued
$L_{a1190}$
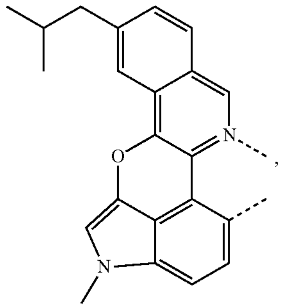
$L_{a1191}$
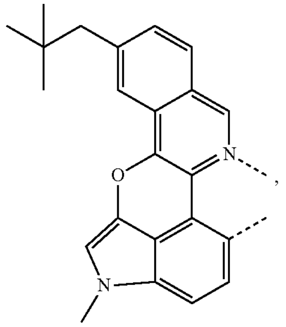
$L_{a1192}$
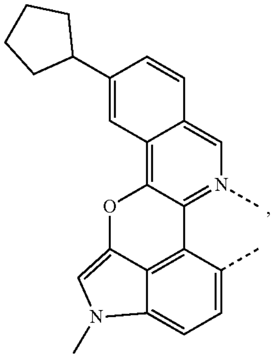
$L_{a1193}$
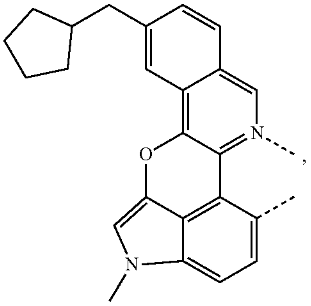
$L_{a1194}$
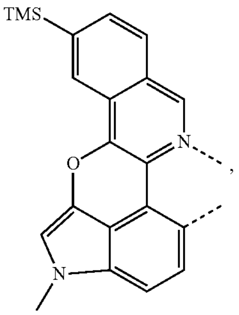
-continued
$L_{a1195}$
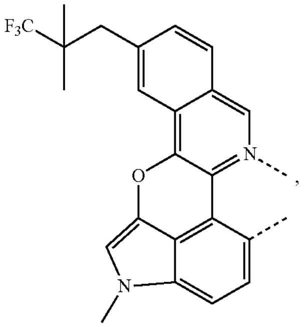
$L_{a1196}$
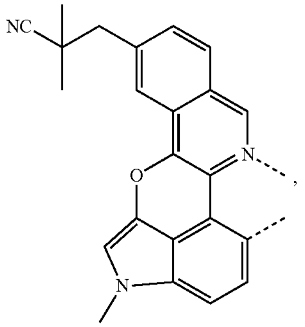
$L_{a1197}$
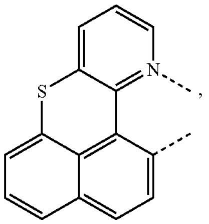
$L_{a1198}$
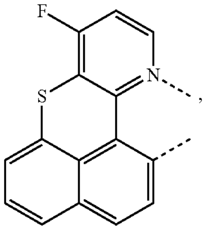
$L_{a1199}$
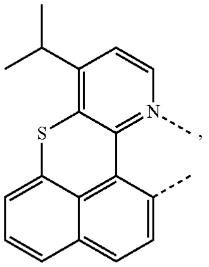

-continued
$L_{a1200}$
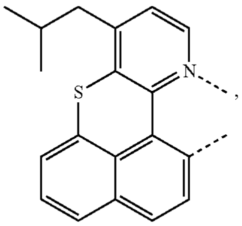
$L_{a1201}$
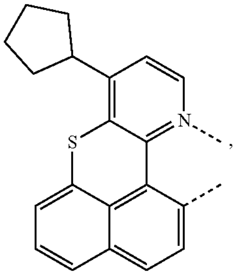
$L_{a1202}$
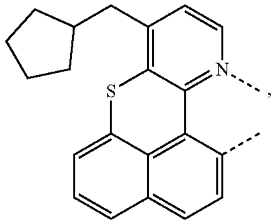
$L_{a1203}$
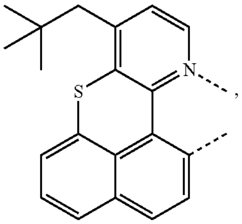
$L_{a1204}$
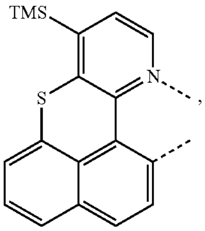
$L_{a1205}$
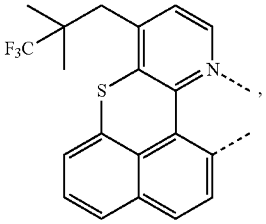
-continued
$L_{a1206}$
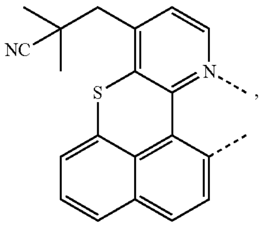
$L_{a1207}$
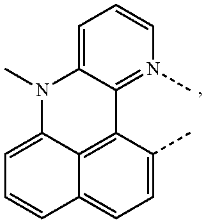
$L_{a1208}$
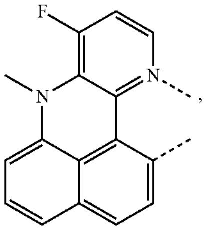
$L_{a1209}$
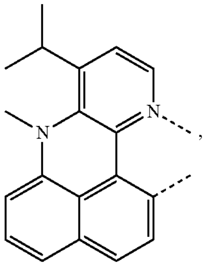
$L_{a1210}$
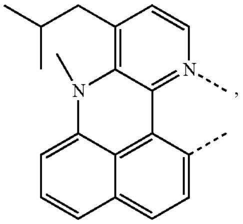
$L_{a1211}$
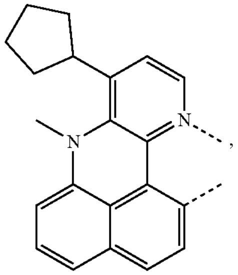

-continued
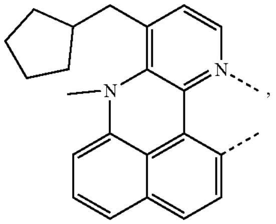
$L_{a1212}$
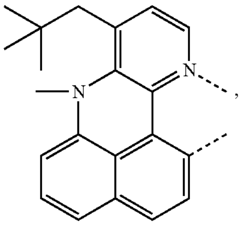
$L_{a1213}$
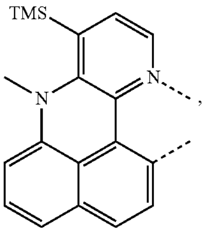
$L_{a1214}$
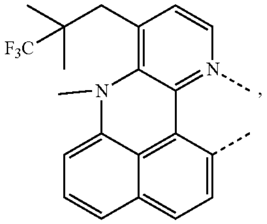
$L_{a1215}$
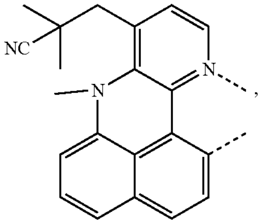
$L_{a1216}$
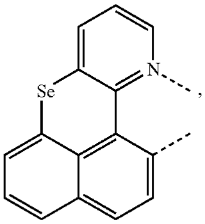
$L_{a1217}$
-continued
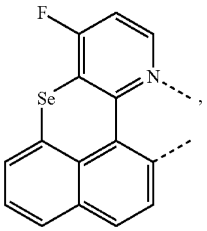
$L_{a1218}$
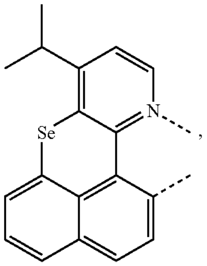
$L_{a1219}$
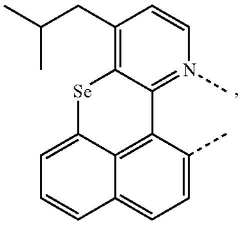
$L_{a1220}$
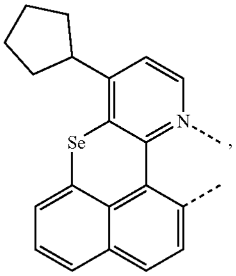
$L_{a1221}$
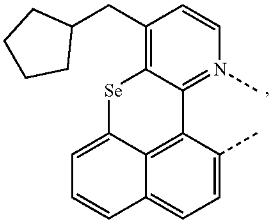
$L_{a1222}$
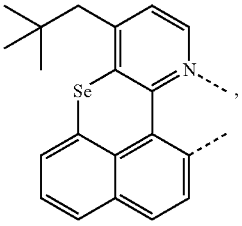
$L_{a1223}$ -continued
L$_{a1224}$
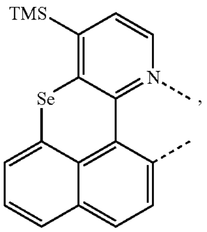
L$_{a1225}$
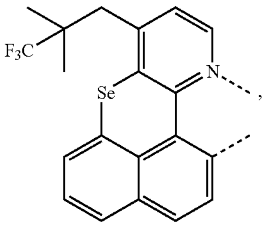
L$_{a1226}$
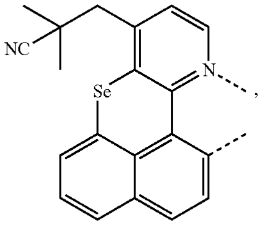
L$_{a1227}$
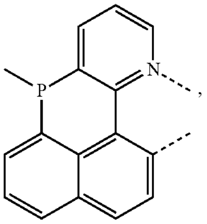
L$_{a1228}$
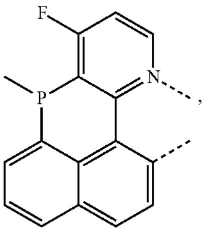
L$_{a1229}$
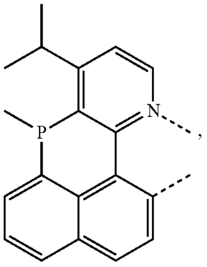
-continued
L$_{a1230}$
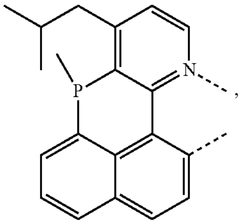
L$_{a1406}$
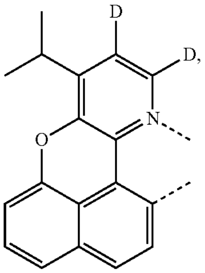
L$_{a1407}$
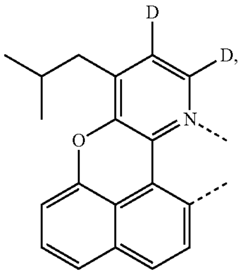
L$_{a1408}$
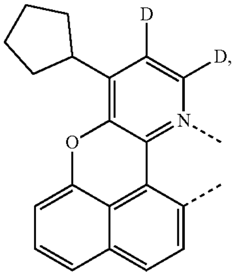
L$_{a1409}$
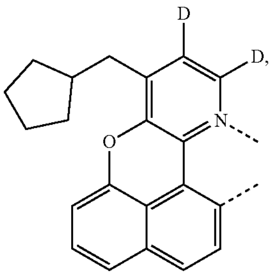
L$_{a1425}$
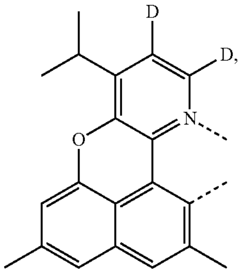

-continued
$L_{a1426}$
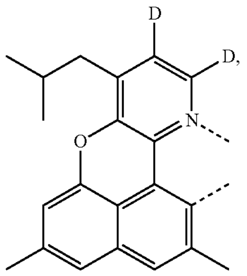
$L_{a1427}$
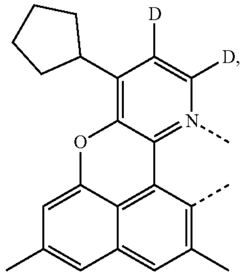
$L_{a1428}$
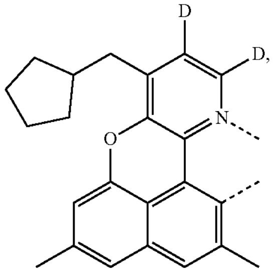
$L_{a1429}$
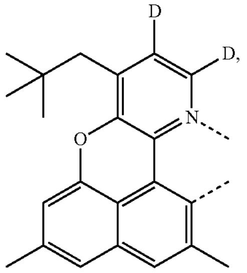
$L_{a1430}$
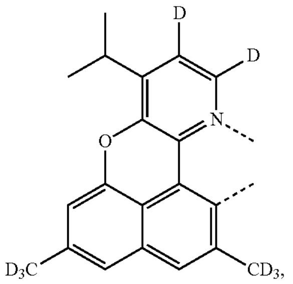
-continued
$L_{a1431}$
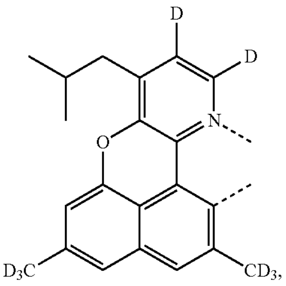
$L_{a1432}$
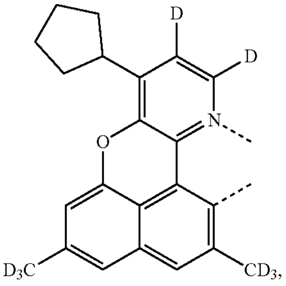
$L_{a1433}$
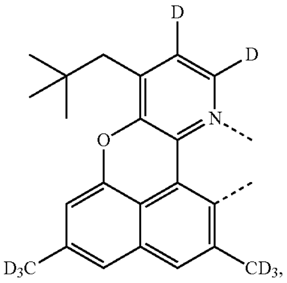
$L_{a1451}$
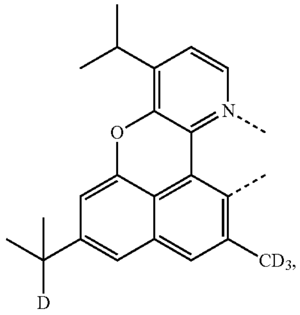
$L_{a1452}$
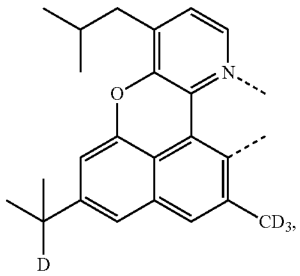

-continued
$L_{a1453}$
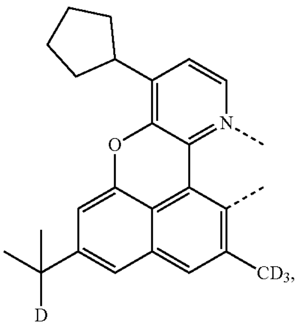
$L_{a1454}$
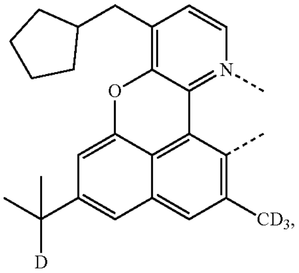
$L_{a1455}$
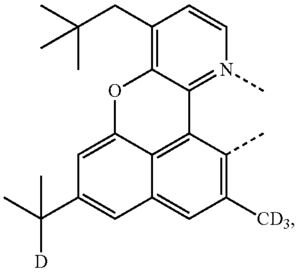
$L_{a1456}$
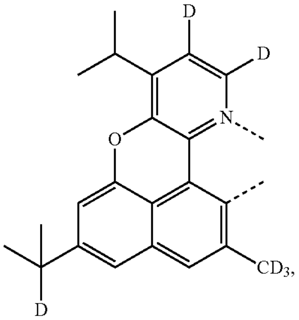
$L_{a1457}$
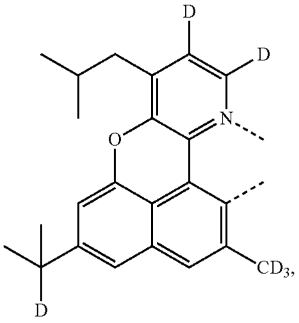
-continued
$L_{a1458}$
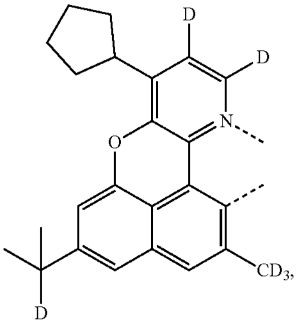
$L_{a1459}$
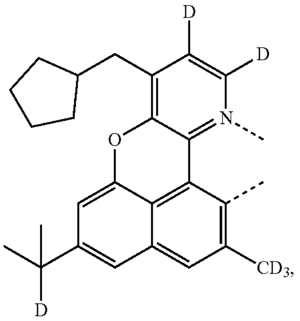
$L_{a1460}$
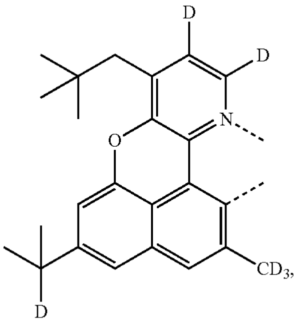
$L_{a1461}$
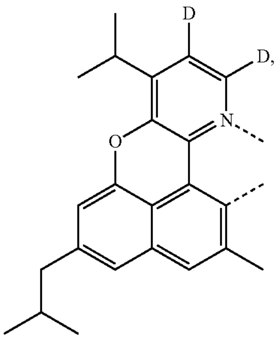

-continued
$L_{a1462}$
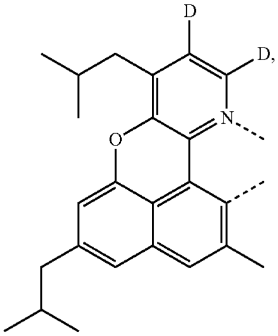
$L_{a1463}$
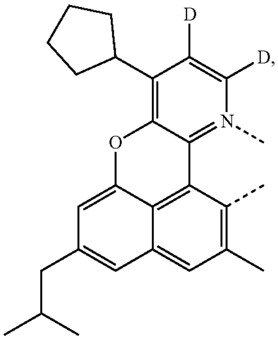
$L_{a1464}$
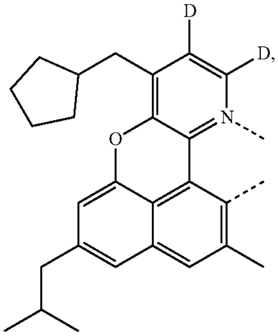
$L_{a1465}$
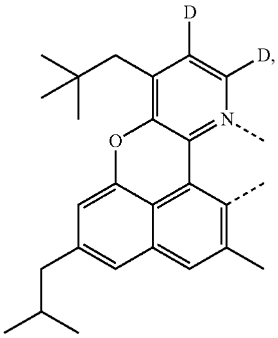
-continued
$L_{a1466}$
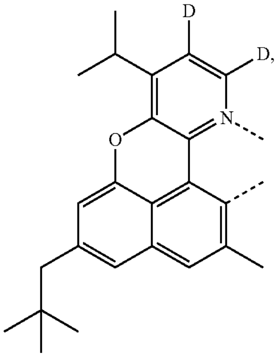
$L_{a1467}$
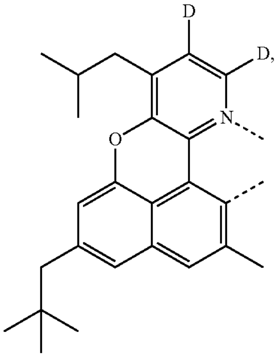
$L_{a1468}$
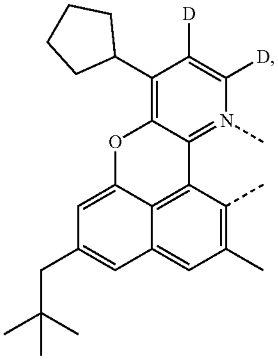
$L_{a1469}$
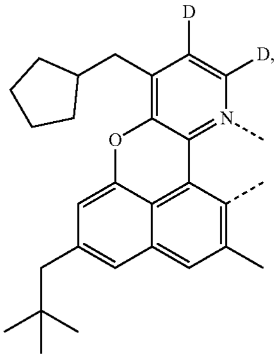

-continued $L_{a1470}$

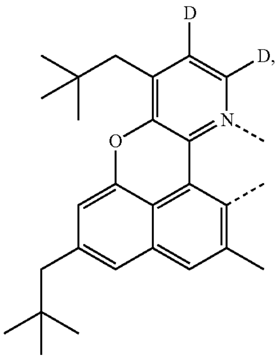

$L_{a1485}$

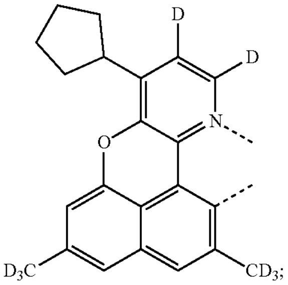

wherein in the above structures, TMS represents trimethylsilyl.

16. The metal complex of claim 15, wherein the metal complex has a structure of $M(L_a)_m(L_b)_n$;

the metal M is Ir;

$L_a$ and $L_b$ are a first ligand and a second ligand of the metal complex, respectively; $L_a$ and $L_b$ can be optionally joined to form a multidentate ligand;

m is 1 or 2, n is 1 or 2, and m+n equals an oxidation state of the metal M;

when m is 2, two $L_a$ may be the same or different; when n is 2, two $L_b$ may be the same or different;

$L_b$ is, at each occurrence identically or differently, selected from the group consisting of the following structures:

$L_{b1}$

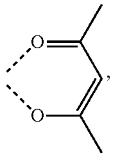

, $L_{b2}$

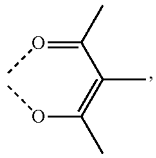

,

-continued $L_{b3}$

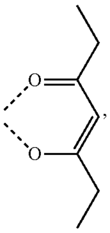

, $L_{b4}$

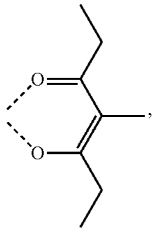

, $L_{b5}$

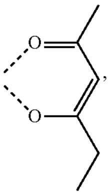

, $L_{b6}$

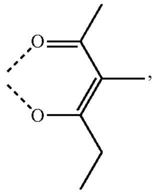

, $L_{b7}$

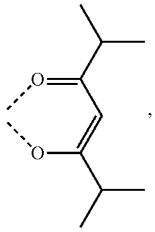

, $L_{b8}$

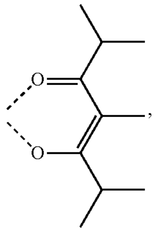

, $L_{b9}$

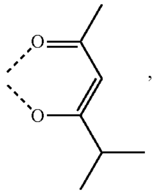

,

-continued
$L_{b10}$
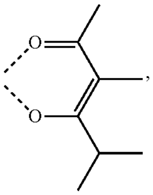,
$L_{b11}$
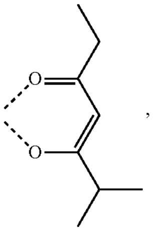,
$L_{b12}$
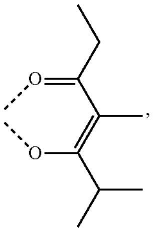,
$L_{b13}$
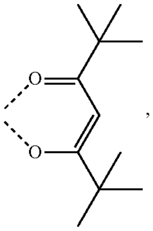,
$L_{b14}$
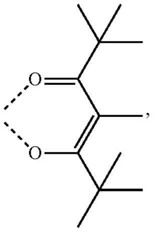,
$L_{b15}$
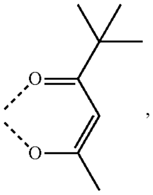,
$L_{b16}$
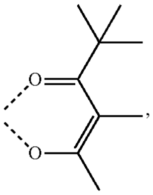,
-continued
$L_{b17}$
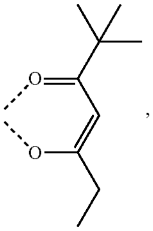,
$L_{b18}$
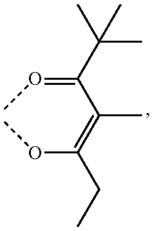,
$L_{b19}$
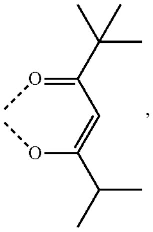,
$L_{b20}$
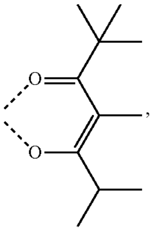,
$L_{b21}$
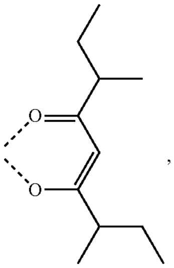,
$L_{b22}$
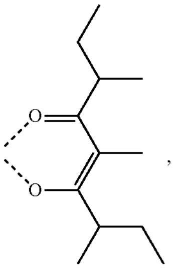, -continued
Lb23
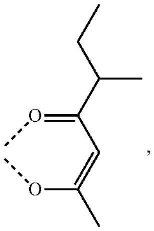
,
Lb24
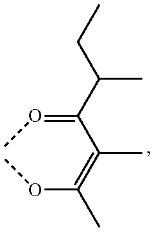
,
Lb25
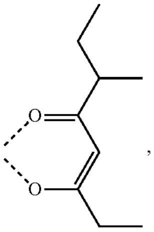
,
Lb26
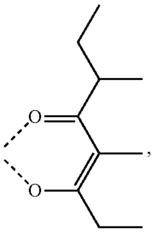
,
Lb27
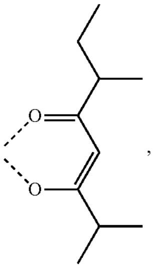
,
Lb28
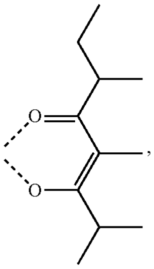
,
-continued
Lb29
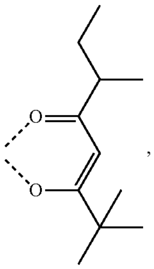
,
Lb30
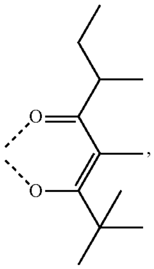
,
Lb31
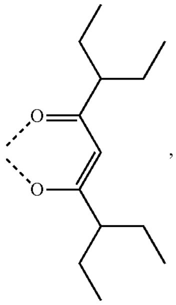
,
Lb32
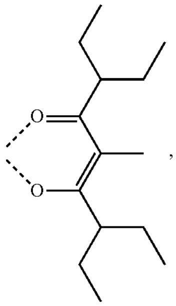
,
Lb33
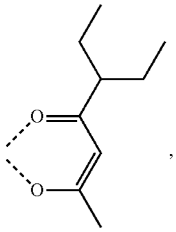
, $L_{b34}$
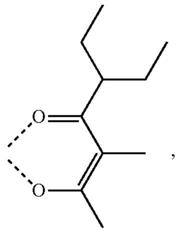
,
$L_{b35}$
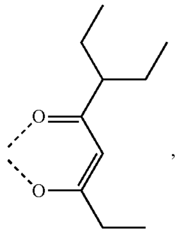
,
$L_{b36}$
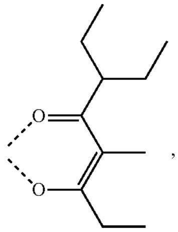
,
$L_{b37}$
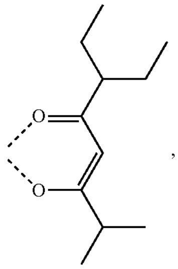
,
$L_{b38}$
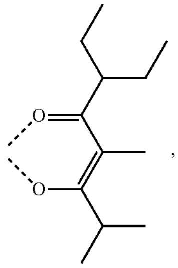
,
$L_{b39}$
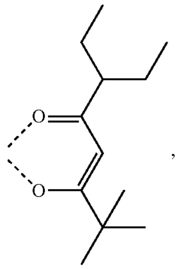
,
$L_{b40}$
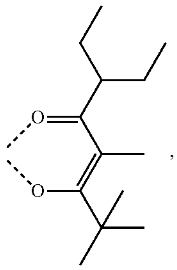
,
$L_{b41}$
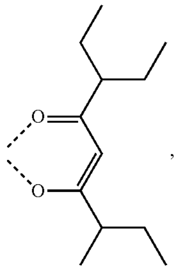
,
$L_{b42}$
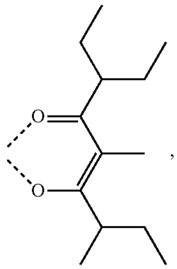
,
$L_{b63}$
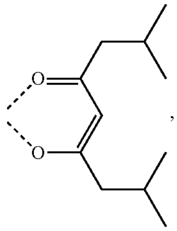
,
$L_{b64}$
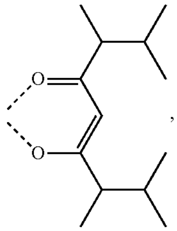
,
$L_{b65}$
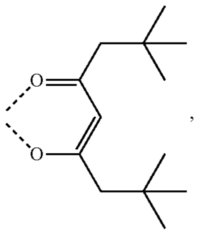
, -continued
$L_{b66}$
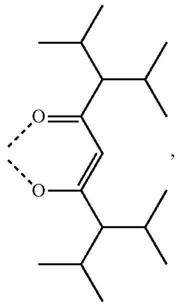
$L_{b67}$
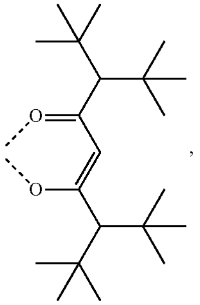
$L_{b68}$
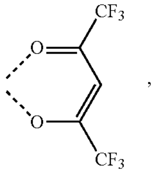
$L_{b69}$
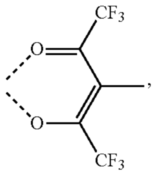
$L_{b70}$
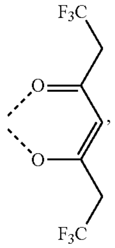
$L_{b71}$
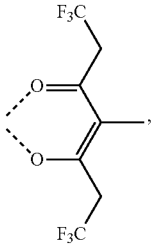
-continued
$L_{b72}$
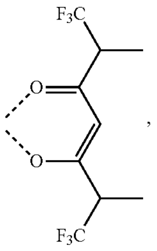
$L_{b73}$
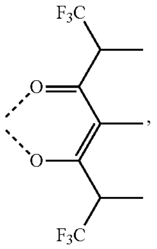
$L_{b74}$
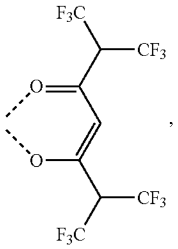
$L_{b75}$
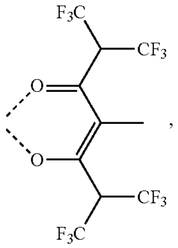
$L_{b76}$
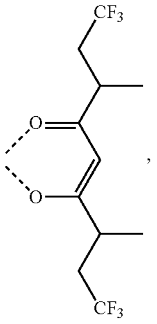

-continued
$L_{b77}$
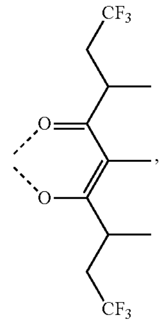,
$L_{b78}$
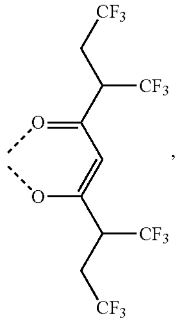,
$L_{b79}$
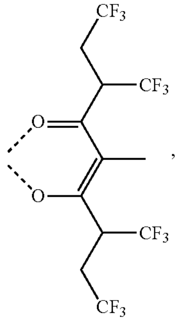,
$L_{b80}$
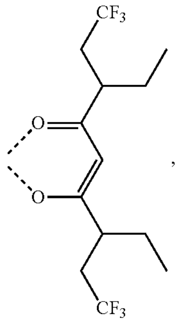,
$L_{b81}$
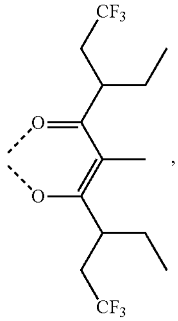,
-continued
$L_{b82}$
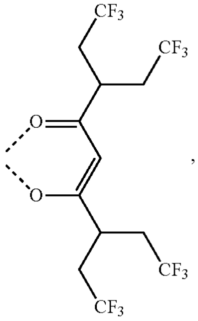,
$L_{b83}$
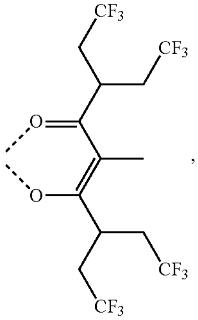,
$L_{b84}$
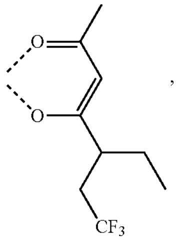,
$L_{b85}$
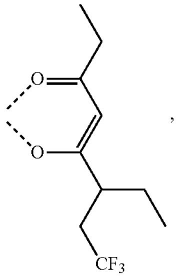,
$L_{b86}$
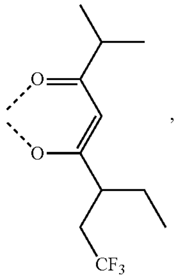, -continued
$L_{b87}$
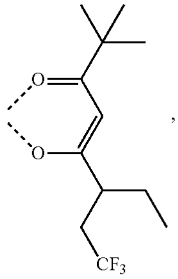
,
$L_{b88}$
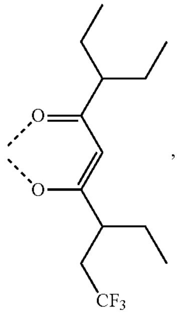
,
$L_{b89}$
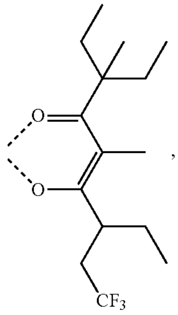
,
$L_{b90}$
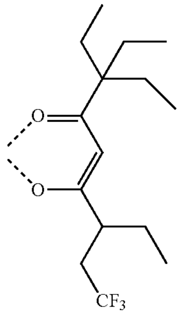
,
$L_{b95}$
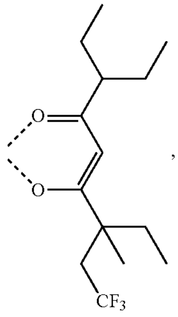
,
-continued
$L_{b96}$
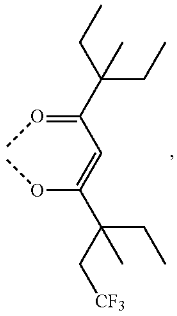
,
$L_{b97}$
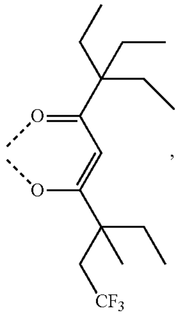
,
$L_{b98}$
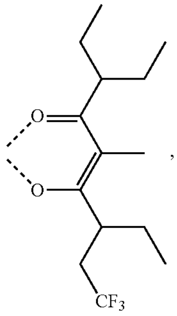
,
$L_{b99}$
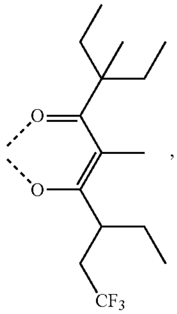
,
$L_{b100}$
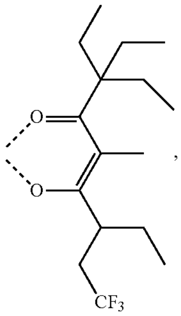
, $L_{b101}$
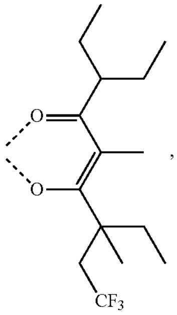
,
$L_{b102}$
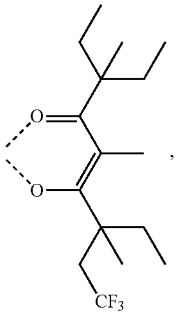
,
$L_{b103}$
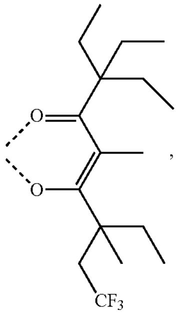
,
$L_{b104}$
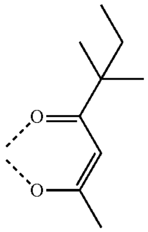
,
$L_{b105}$
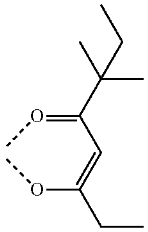
,
$L_{b106}$
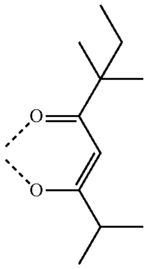
,
$L_{b107}$
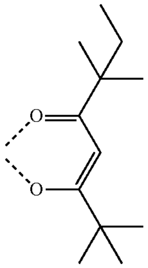
,
$L_{b108}$
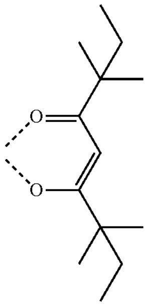
,
$L_{b109}$
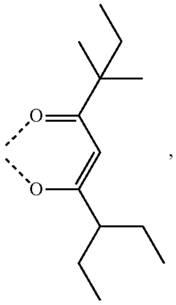
,
$L_{b112}$
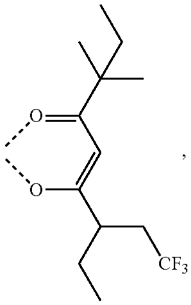
, -continued
Lb113
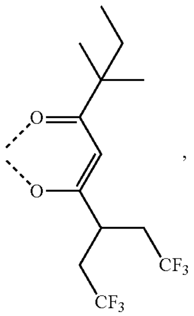
,
Lb114
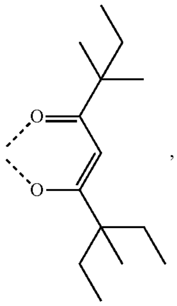
,
Lb115
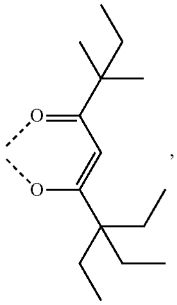
,
Lb118
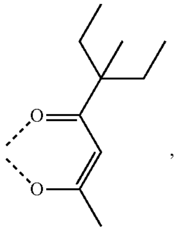
,
Lb119
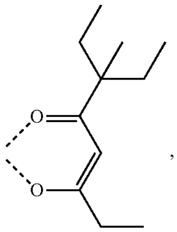
,
-continued
Lb120
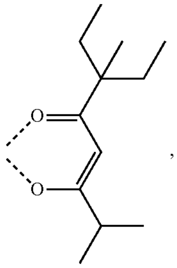
,
Lb121
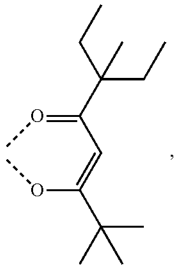
,
Lb122
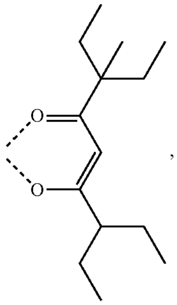
,
Lb125
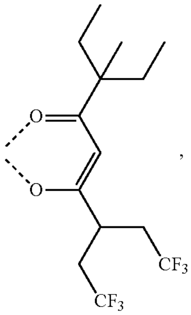
,
Lb126
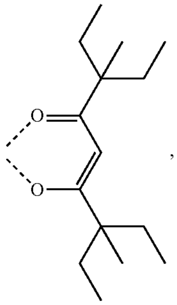
, -continued
$L_{b127}$
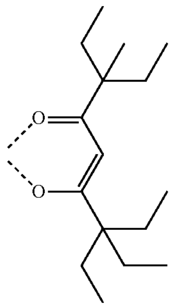
,
$L_{b130}$
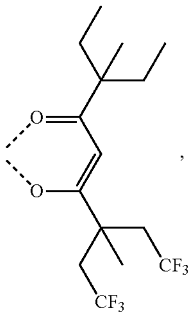
,
$L_{b131}$
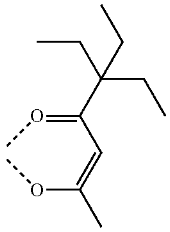
,
$L_{b132}$
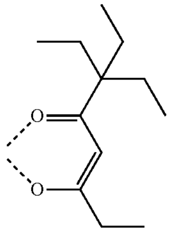
,
$L_{b133}$
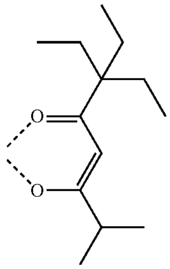
,
-continued
$L_{b134}$
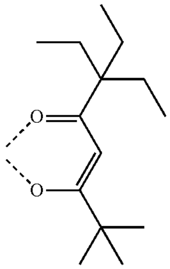
,
$L_{b135}$
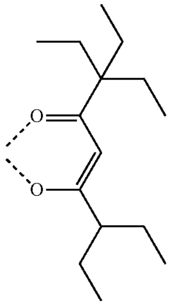
,
$L_{b138}$
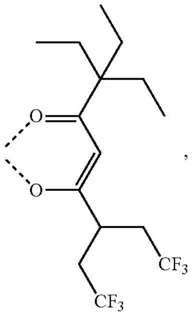
,
$L_{b139}$
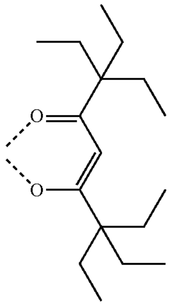
,
$L_{b142}$
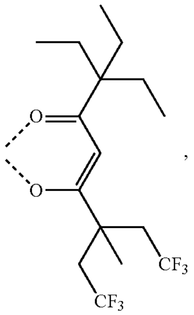
, -continued
L$_{b152}$
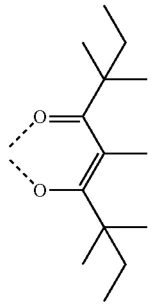
,
L$_{b153}$
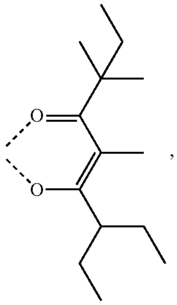
,
L$_{b154}$
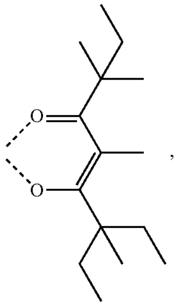
,
L$_{b155}$
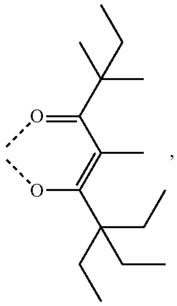
,
L$_{b156}$
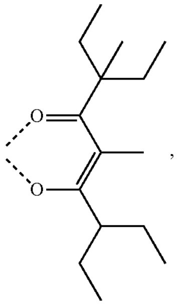
,
-continued
L$_{b157}$
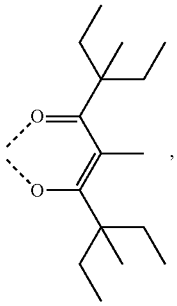
,
L$_{b158}$
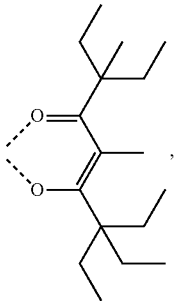
,
L$_{b159}$
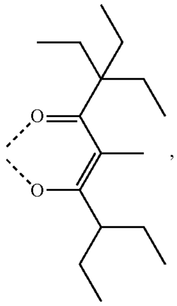
,
L$_{b160}$
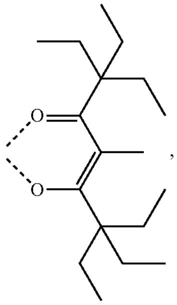
,
L$_{b161}$
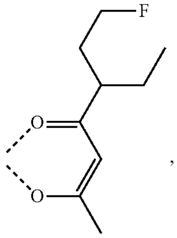
, -continued
$L_{b162}$
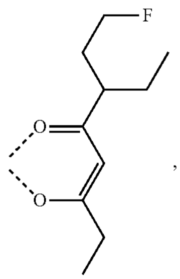
,
$L_{b163}$
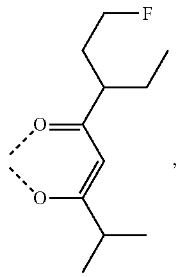
,
$L_{b164}$
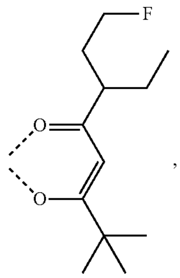
,
$L_{b165}$
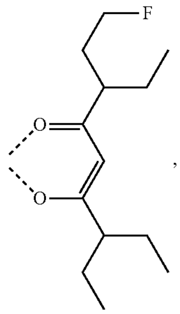
,
$L_{b166}$
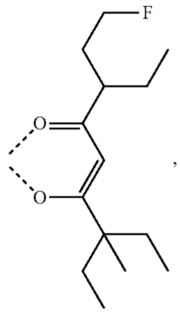
,
-continued
$L_{b167}$
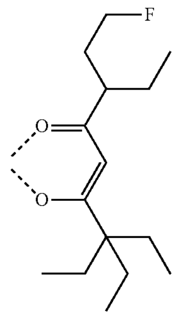
,
$L_{b172}$
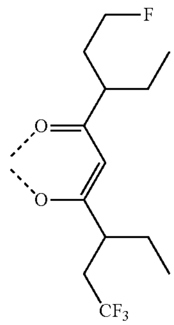
,
$L_{b173}$
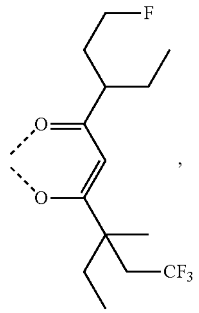
,
$L_{b174}$
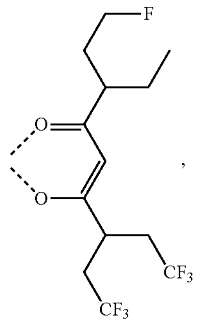
,
$L_{b175}$
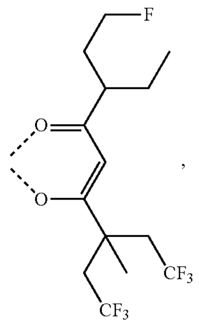
, -continued
$L_{b176}$
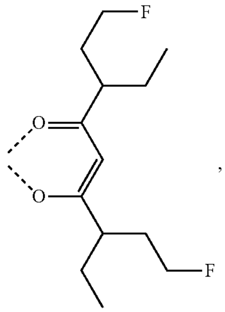
,
$L_{b177}$
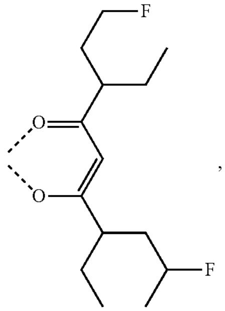
,
$L_{b178}$
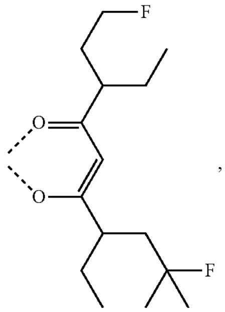
,
$L_{b179}$
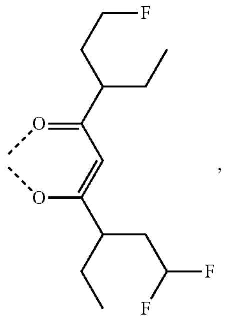
,
$L_{b180}$
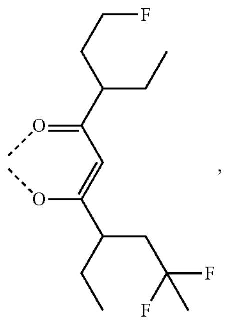
,
-continued
$L_{b181}$
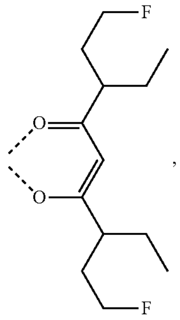
,
$L_{b182}$
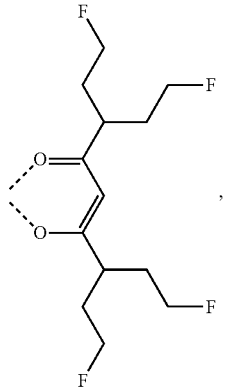
,
$L_{b183}$
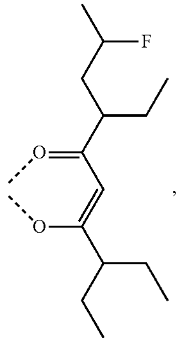
,
$L_{b184}$
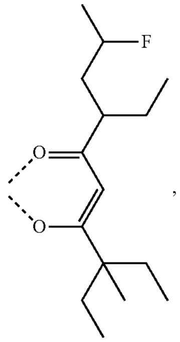
, -continued
$L_{b185}$
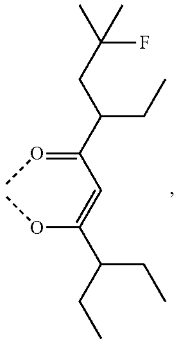
,
$L_{b186}$
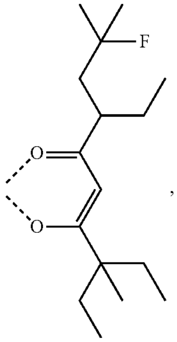
,
$L_{b187}$
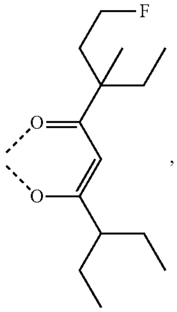
,
$L_{b188}$
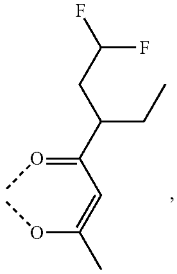
,
$L_{b189}$
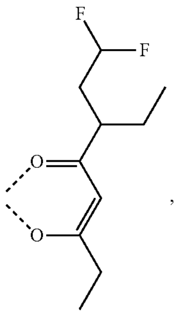
,
-continued
$L_{b190}$
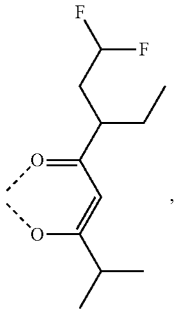
,
$L_{b191}$
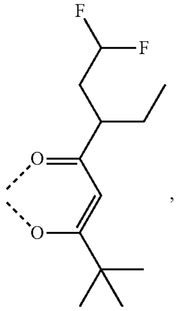
,
$L_{b192}$
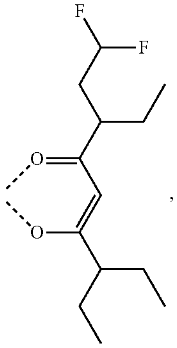
,
$L_{b193}$
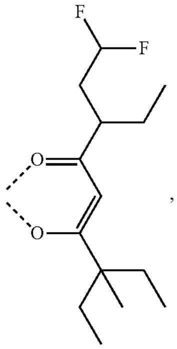
, -continued
$L_{b194}$
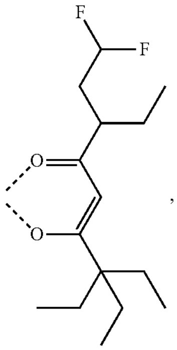
,
$L_{b199}$
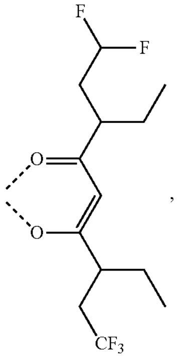
,
$L_{b200}$
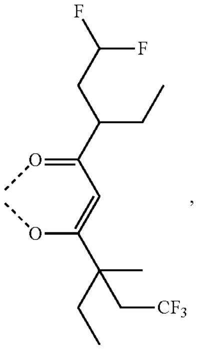
,
$L_{b201}$
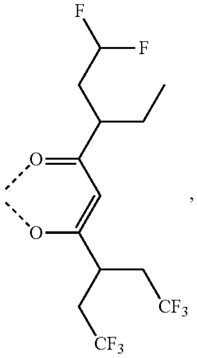
,
-continued
$L_{b202}$
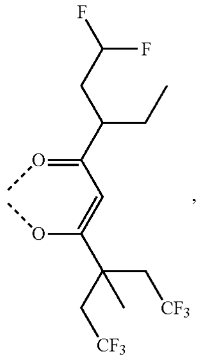
,
$L_{b203}$
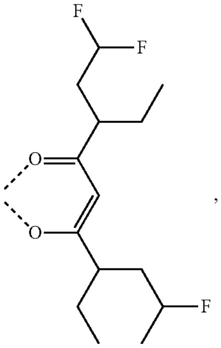
,
$L_{b204}$
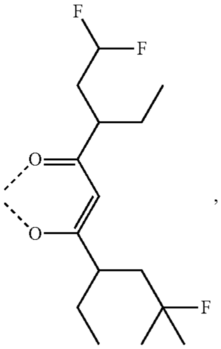
,
$L_{b205}$
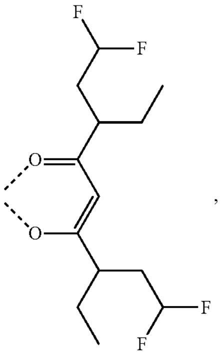
, -continued
Lb206
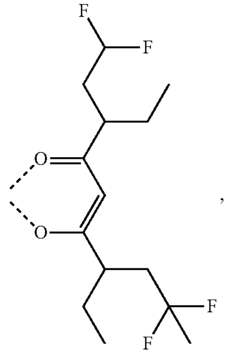
,
Lb207
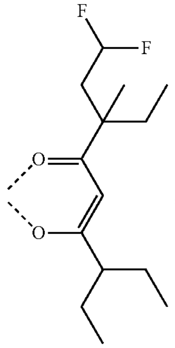
,
Lb208
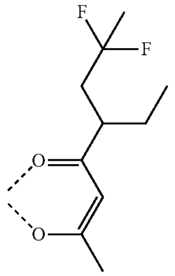
,
Lb209
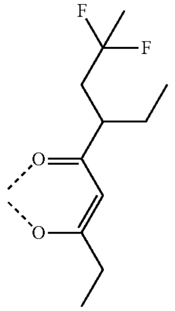
,
Lb210
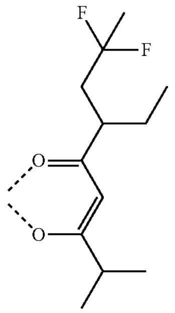
,
-continued
Lb211
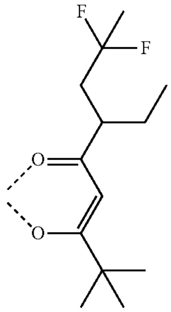
,
Lb212
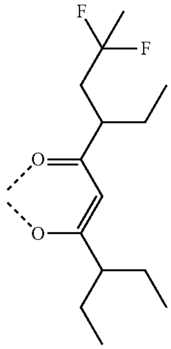
,
Lb213
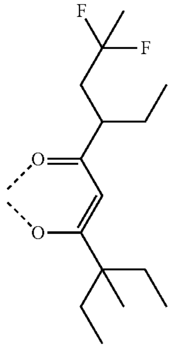
,
Lb214
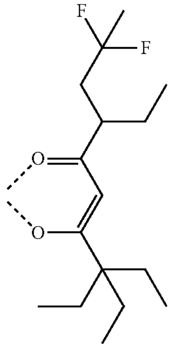
, -continued
$L_{b219}$
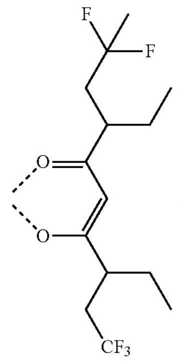
,
$L_{b220}$
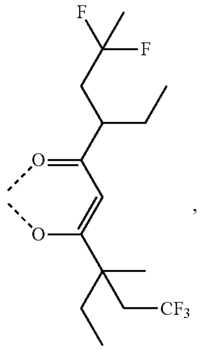
,
$L_{b221}$
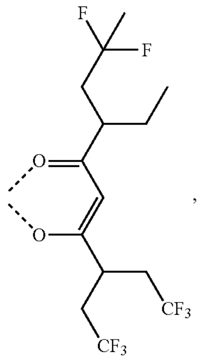
,
$L_{b222}$
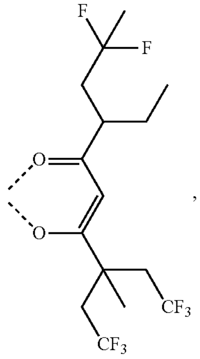
,
-continued
$L_{b223}$
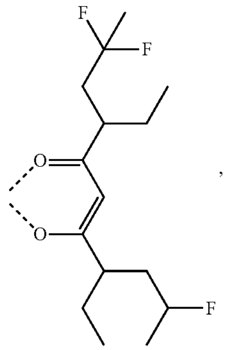
,
$L_{b224}$
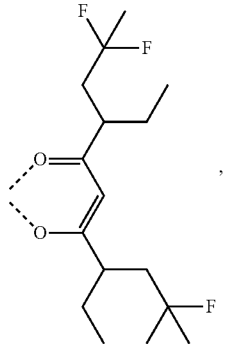
,
$L_{b225}$
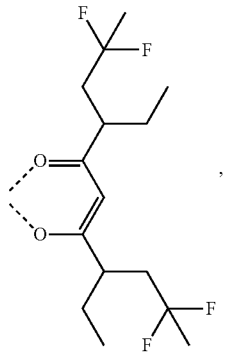
,
$L_{b229}$
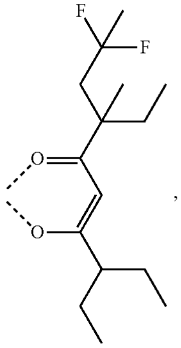
, -continued
$L_{b230}$
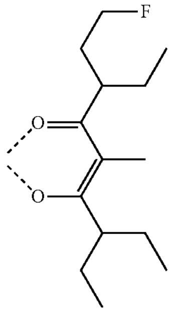
,
$L_{b231}$
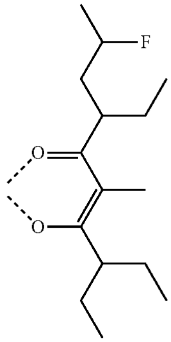
,
$L_{b232}$
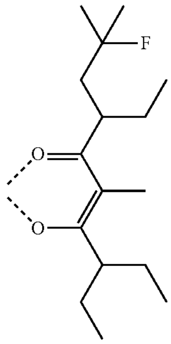
,
$L_{b233}$
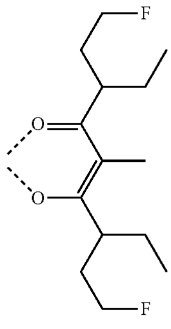
,
-continued
$L_{b234}$
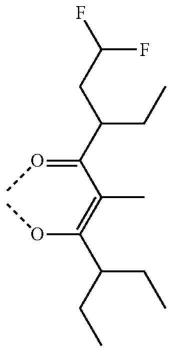
,
$L_{b235}$
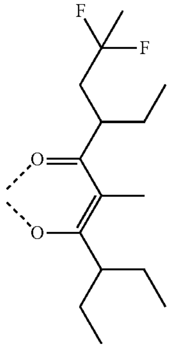
,
$L_{b236}$
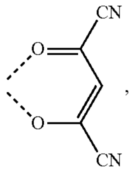
,
$L_{b237}$
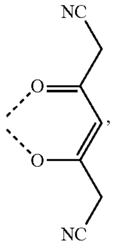
,
$L_{b238}$
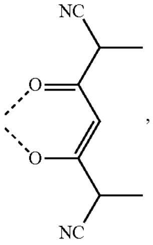
, -continued
$L_{b239}$
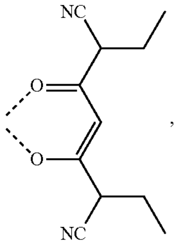
,
$L_{b240}$
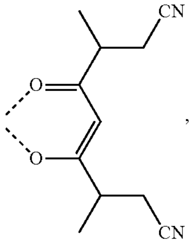
,
$L_{b241}$
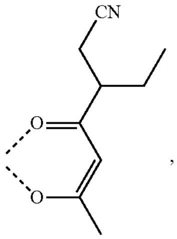
,
$L_{b242}$
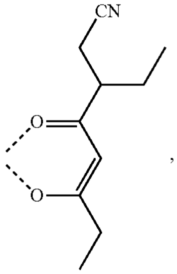
,
$L_{b243}$
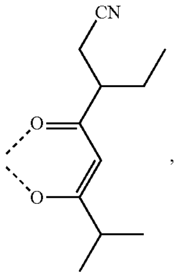
,
$L_{b244}$
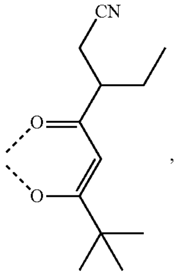
,
-continued
$L_{b245}$
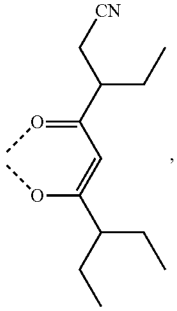
,
$L_{b246}$
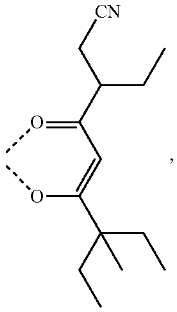
,
$L_{b247}$
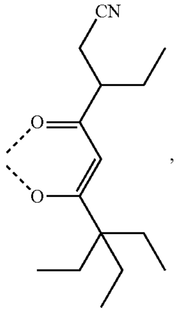
,
$L_{b252}$
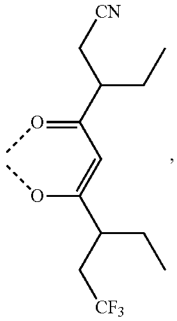
,
$L_{b253}$
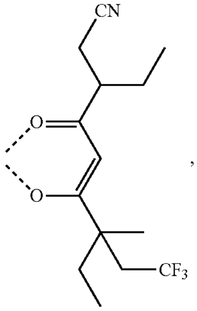
, -continued
$L_{b254}$
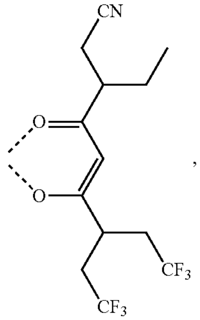
,
$L_{b255}$
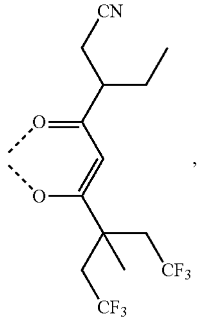
,
$L_{b256}$
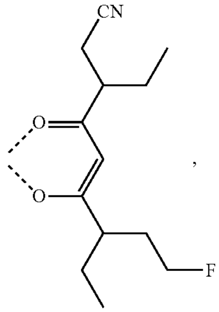
,
$L_{b257}$
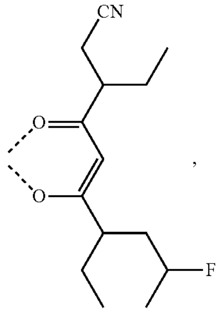
,
$L_{b258}$
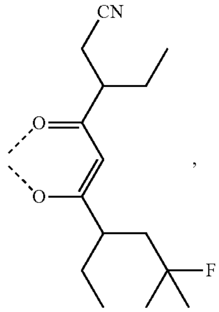
,
-continued
$L_{b259}$
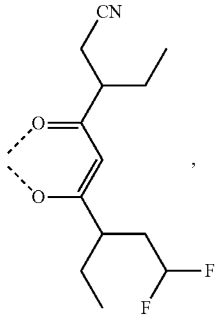
,
$L_{b260}$
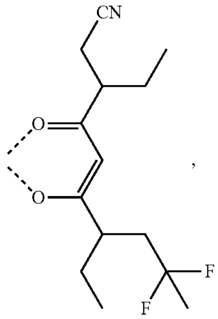
,
$L_{b261}$
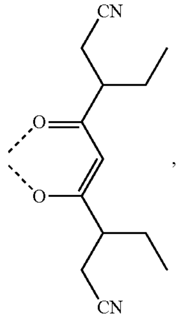
,
$L_{b262}$
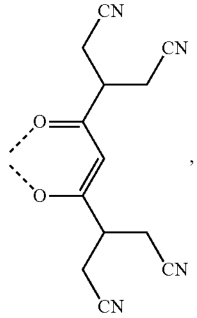
,
$L_{b263}$
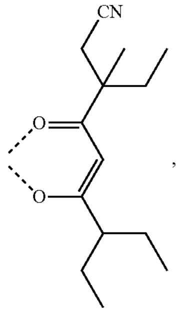
, -continued
$L_{b264}$
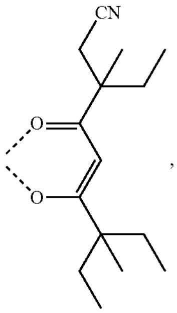
,
$L_{b265}$
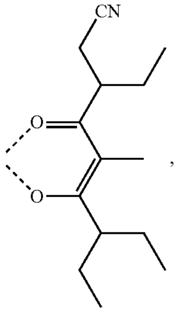
,
$L_{b266}$
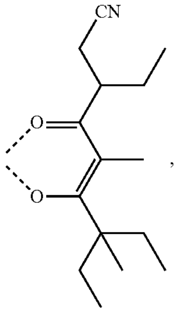
,
$L_{b267}$
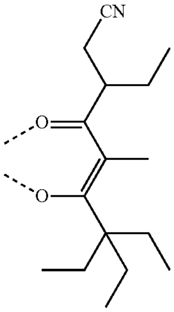
,
-continued
$L_{b268}$
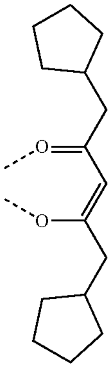
,
$L_{b269}$
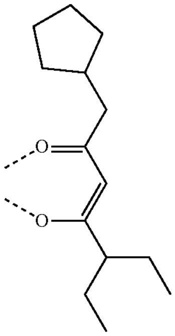
,
$L_{b270}$
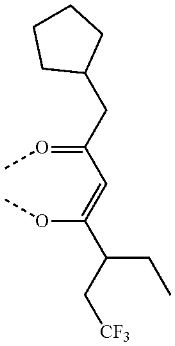
,
$L_{b271}$
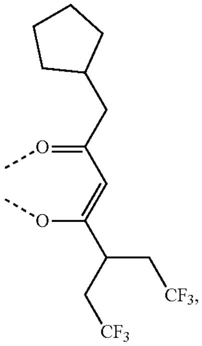

-continued
$L_{b272}$
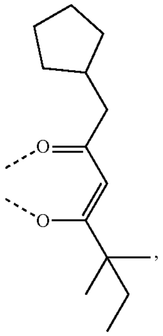
$L_{b273}$
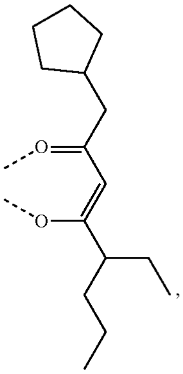
$L_{b274}$
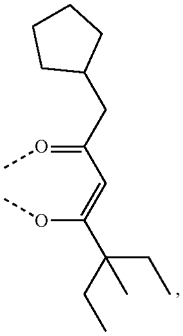
$L_{b275}$
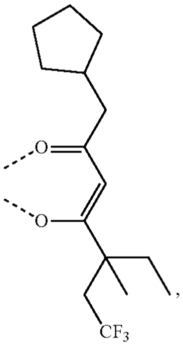
-continued
$L_{b276}$
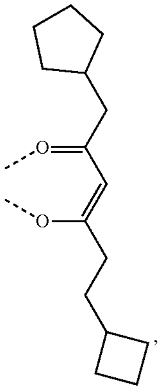
$L_{b277}$
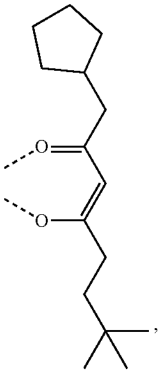
$L_{b278}$
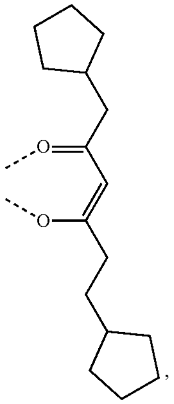
$L_{b279}$
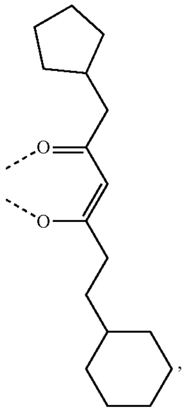

-continued
$L_{b280}$
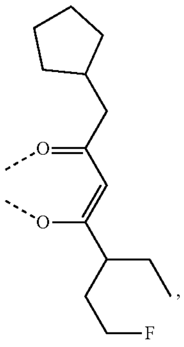
$L_{b281}$
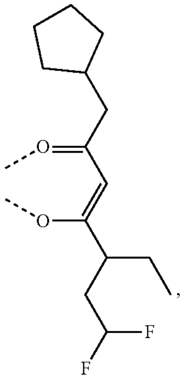
$L_{b282}$
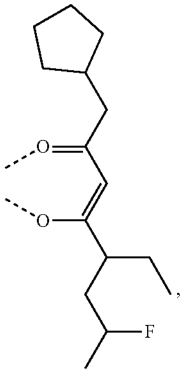
$L_{b283}$
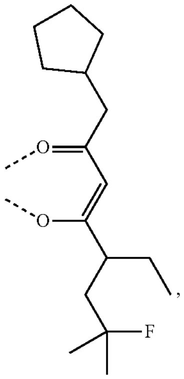
-continued
$L_{b284}$
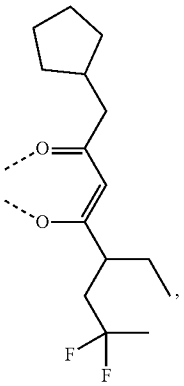
$L_{b285}$
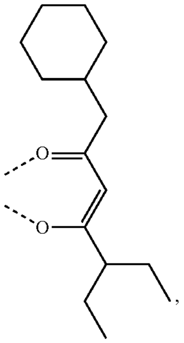
$L_{b286}$
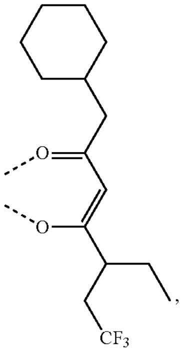
$L_{b287}$
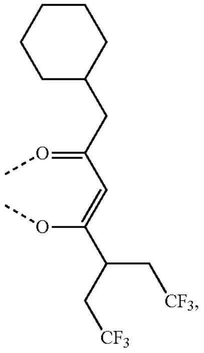

$L_{b288}$
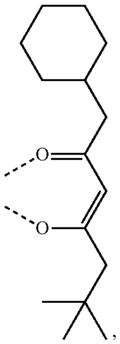
$L_{b289}$
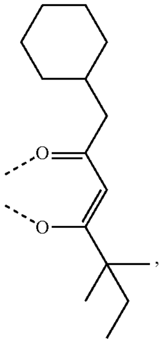
$L_{b290}$
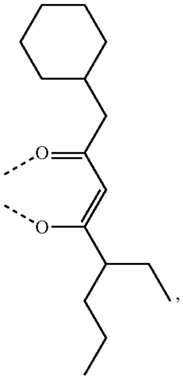
$L_{b291}$
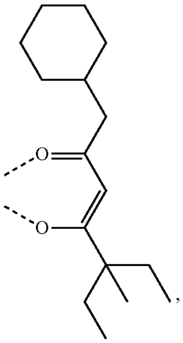
$L_{b292}$
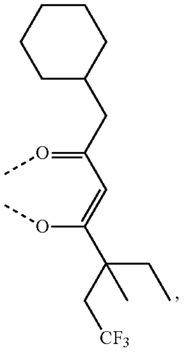
$L_{b293}$
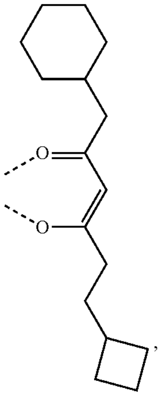
$L_{b294}$
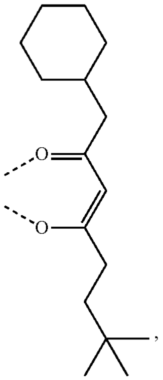
$L_{b295}$
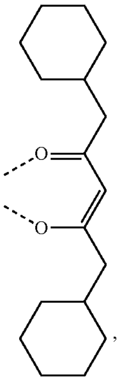

-continued
$L_{b296}$
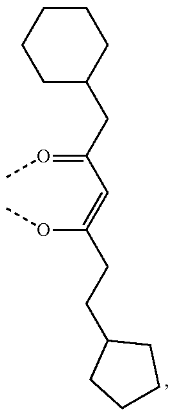
$L_{b297}$
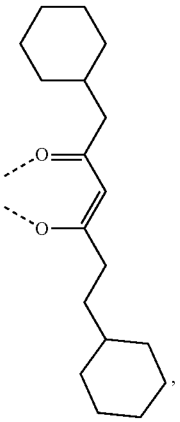
$L_{b298}$
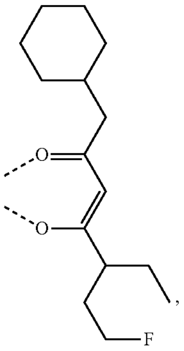
$L_{b299}$
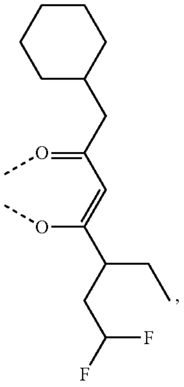
-continued
$L_{b300}$
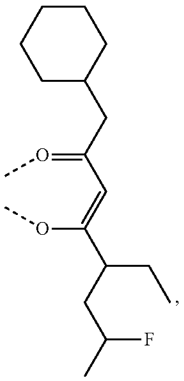
$L_{b301}$
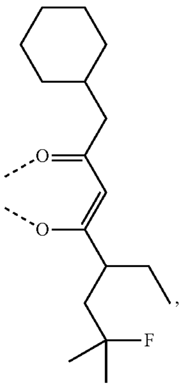
$L_{b302}$
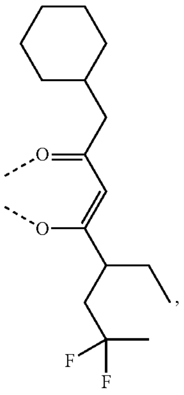
$L_{b303}$
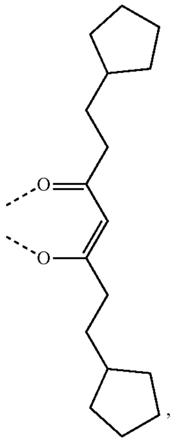

-continued
$L_{b304}$
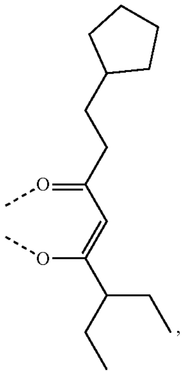
$L_{b305}$
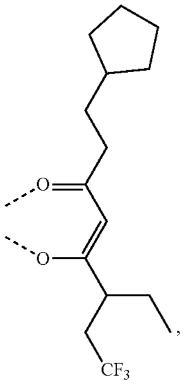
$L_{b306}$
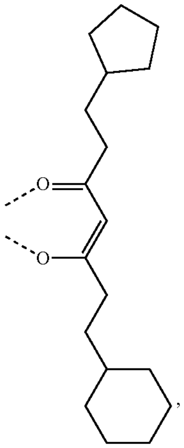
$L_{b307}$
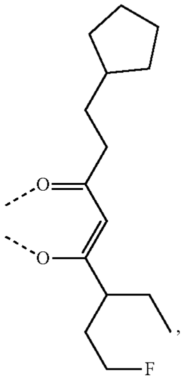
-continued
$L_{b308}$
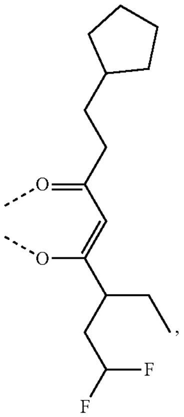
$L_{b309}$
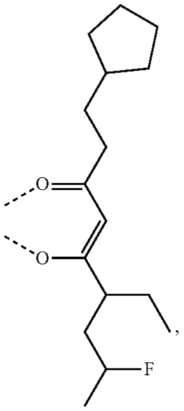
$L_{b310}$
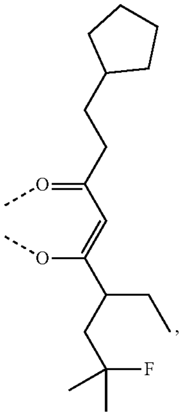

-continued
L$_{b311}$
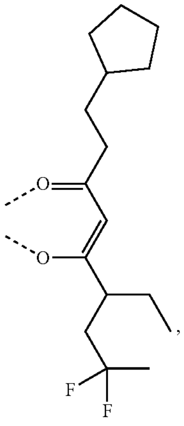
L$_{b312}$
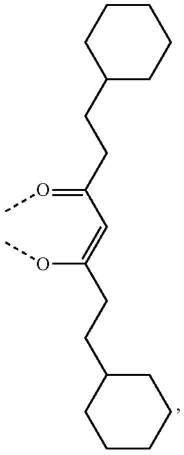
L$_{b313}$
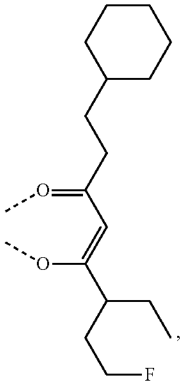
-continued
L$_{b314}$
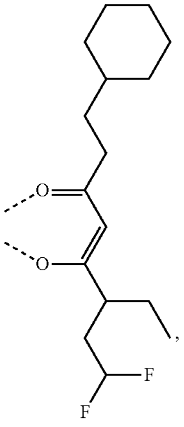
L$_{b315}$
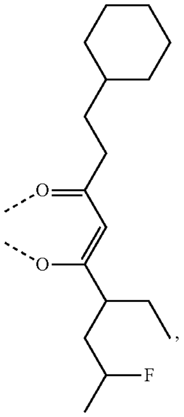
L$_{b316}$
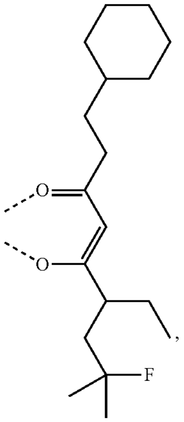

-continued $L_{b317}$

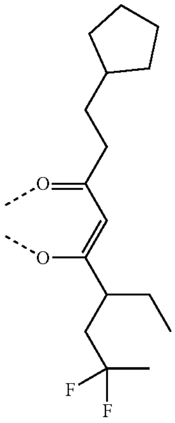

, $L_{b318}$

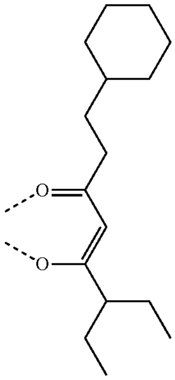

, $L_{b319}$

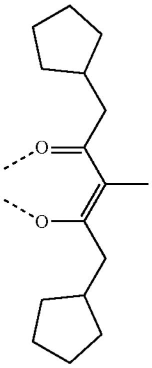

, $L_{b320}$

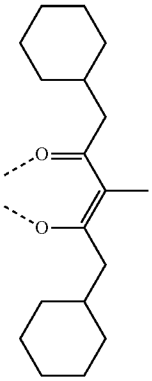

,

-continued $L_{b321}$

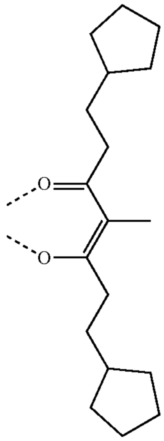

, and $L_{b322}$

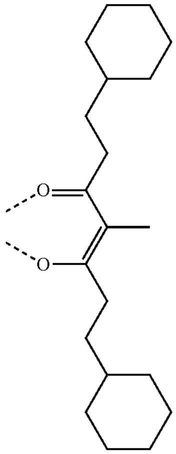

;

17. The metal complex of claim 1, wherein the metal complex has a structure of $Ir(L_a)_2(L_b)$.

18. An electroluminescent device, comprising:

an anode, a cathode, and an organic layer disposed between the anode and the cathode, wherein the organic layer comprises the metal complex of claim 1.

19. The electroluminescent device of claim 18, wherein the organic layer is a light-emitting layer and the metal complex is a light-emitting material.

20. The electroluminescent device of claim 19, wherein the light-emitting layer further comprises at least one host material.

21. The electroluminescent device of claim 18, wherein the electroluminescent device emits red light or white light.

22. A compound combination, comprising the metal complex of claim 1.

23. The metal complex of claim 1, wherein at least one or at least two of $R_1$ to $R_3$ are selected from substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms or a combination thereof; and/or at least one of $R_4$ to $R_6$ is substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms or a combination thereof.

24. A metal complex, wherein the metal complex has a structure of $Ir(L_a)_2(L_b)$ or $Ir(L_a)_2(L_c)$ or $Ir(L_a)(L_c)_2$; when the metal complex has the structure of $Ir(L_a)_2(L_b)$, $L_a$ is, at each occurrence identically or differently, selected from any one or any two of the group consisting of $L_{a1}$ to $L_{a20}$, $L_{a61}$ to $L_{a80}$, $L_{a274}$ to $L_{a294}$, $L_{a373}$ to $L_{a392}$, $L_{a470}$ to $L_{a490}$, $L_{a569}$ to $L_{a589}$, $L_{a1059}$ to $L_{a1076}$, $L_{a1117}$ to $L_{a1230}$, $L_{a1406}$ to $L_{a1409}$, $L_{a1425}$ to $L_{a1433}$, $L_{a1451}$ to $L_{a1470}$, and $L_{a1485}$ and $L_b$ is selected from any one of the group consisting of $L_{b1}$ to $L_{b322}$; when the metal complex has the structure of $Ir(L_a)_2(L_c)$, $L_a$ is, at each occurrence identically or differently, selected from any one or any two of the group consisting of $L_{a1}$ to $L_{a20}$, $L_{a61}$ to $L_{a80}$, $L_{a274}$ to $L_{a294}$, $L_{a373}$ to $L_{a392}$, $L_{a470}$ to $L_{a490}$, $L_{a569}$ to $L_{a589}$, $L_{a1059}$ to $L_{a1076}$, $L_{a1117}$ to $L_{a1230}$, $L_{a1406}$ to $L_{a1409}$, $L_{a1425}$ to $L_{a1433}$, $L_{a1451}$ to $L_{a1470}$, and $L_{a1485}$ and $L_c$ is selected from any one of the group consisting of $L_{c1}$ to $L_{c68}$, $L_{c70}$, $L_{c72}$, $L_{c74}$, $L_{c76}$, $L_{c78}$, $L_{c80}$, $L_{c82}$, $L_{c84}$ to $L_{c231}$; when the metal complex has the structure of $Ir(L_a)(L_c)_2$, $L_a$ is selected from any one of the group consisting of $L_{a1}$ to $L_{a20}$, $L_{a61}$ to $L_{a80}$, $L_{a274}$ to $L_{a294}$, $L_{a373}$ to $L_{a392}$, $L_{a470}$ to $L_{a490}$, $L_{a569}$ to $L_{a589}$, $L_{a1059}$ to $L_{a1076}$, $L_{a1117}$ to $L_{a1230}$, $L_{a1406}$ to $L_{a1409}$, $L_{a1425}$ to $L_{a1433}$, $L_{a1451}$ to $L_{a1470}$, and $L_{a1485}$ and Le is, at each occurrence identically or differently, selected from any one or any two of the group consisting of $L_{c1}$ to $L_{c68}$, $L_{c70}$, $L_{c72}$, $L_{c74}$, $L_{c76}$, $L_{c78}$, $L_{c80}$, $L_{c82}$, $L_{c84}$ to $L_{c231}$;

$L_{a1}$ to $L_{a20}$, $L_{a61}$ to $L_{a80}$, $L_{a274}$ to $L_{a294}$, $L_{a373}$ to $L_{a392}$, $L_{a470}$ to $L_{a490}$, $L_{a569}$ to $L_{a589}$, $L_{a1059}$ to $L_{a1076}$, $L_{a1117}$ to $L_{a1230}$, $L_{a1406}$ to $L_{a1409}$, $L_{a1425}$ to $L_{a1433}$, $L_{a1451}$ to $L_{a1470}$, and $L_{a1485}$ are as follows:

$L_{a1}$

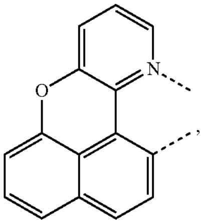

$L_{a2}$

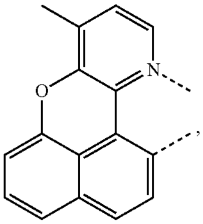

$L_{a3}$

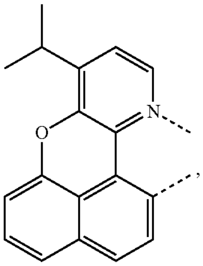

-continued $L_{a4}$

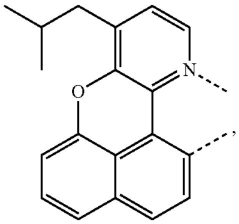

$L_{a5}$

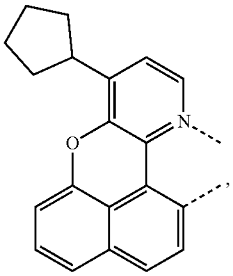

$L_{a6}$

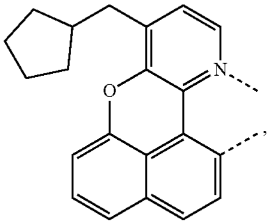

$L_{a7}$

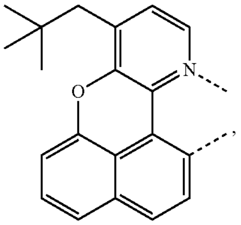

$L_{a8}$

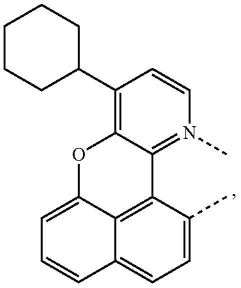

$L_{a9}$

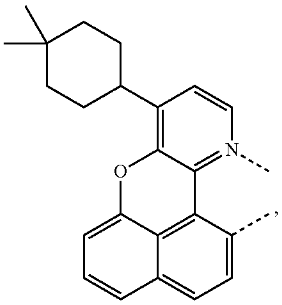

-continued
$L_{a10}$
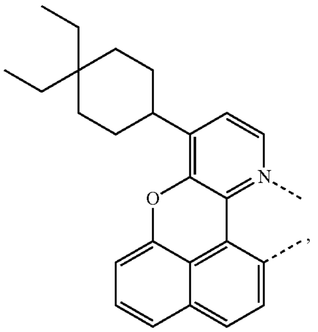
$L_{a11}$
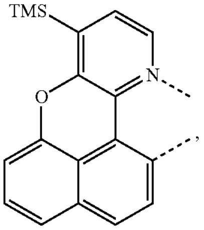
$L_{a12}$
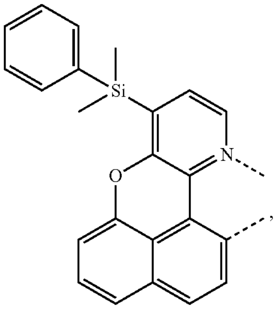
$L_{a13}$
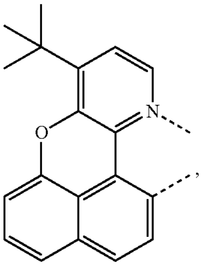
$L_{a14}$
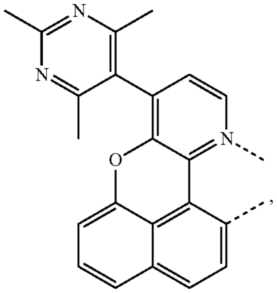
-continued
$L_{a15}$
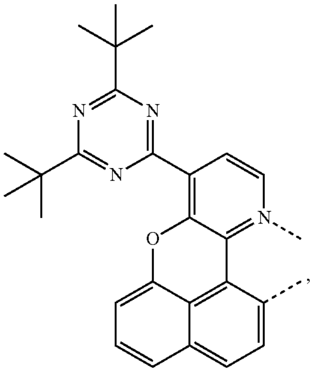
$L_{a16}$
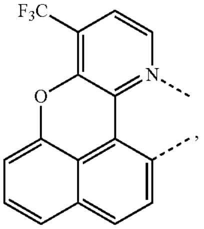
$L_{a17}$
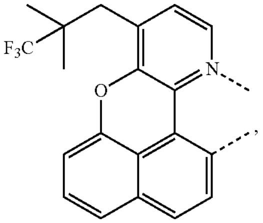
$L_{a18}$
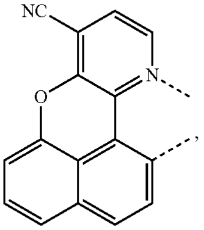
$L_{a19}$
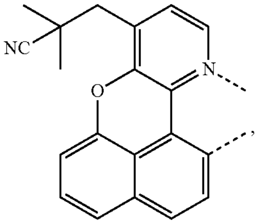
$L_{a20}$
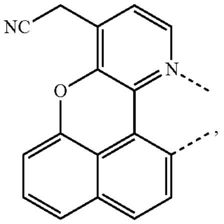

-continued
$L_{a61}$
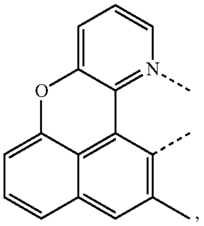
$L_{a62}$
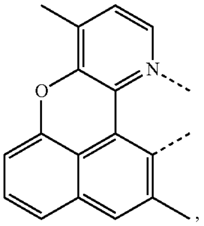
$L_{a63}$
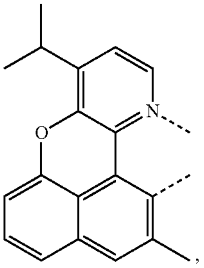
$L_{a64}$
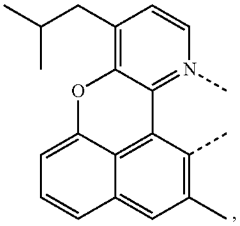
$L_{a65}$
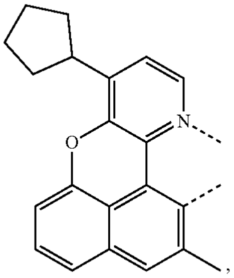
$L_{a66}$
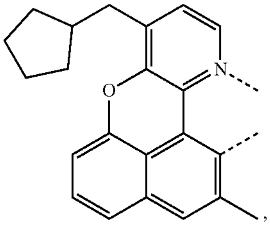
-continued
$L_{a67}$
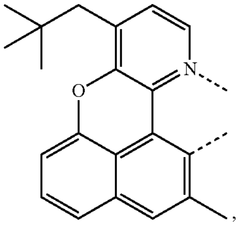
$L_{a68}$
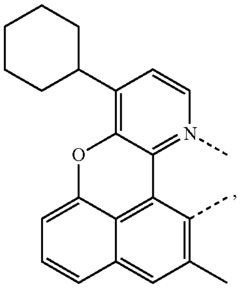
$L_{a69}$
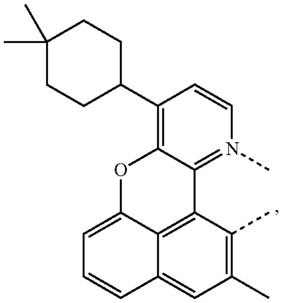
$L_{a70}$
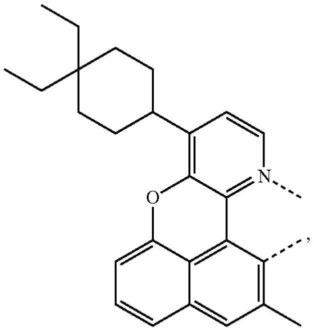
$L_{a71}$
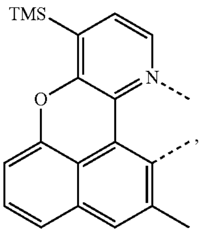

-continued
$L_{a72}$
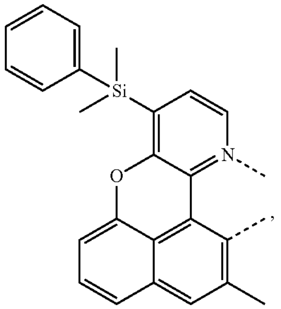
$L_{a73}$
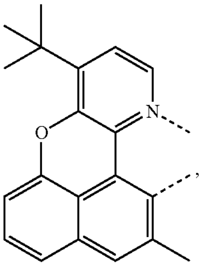
$L_{a74}$
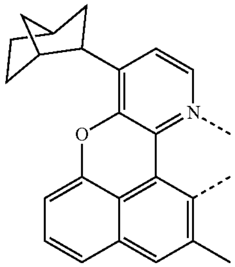
$L_{a75}$
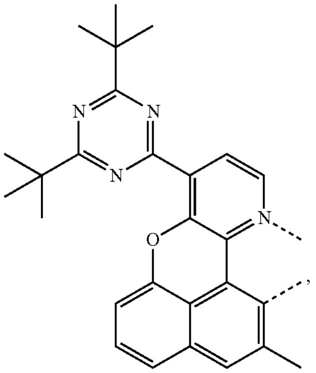
$L_{a76}$
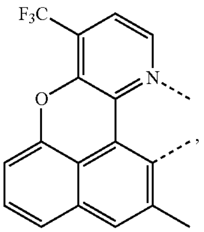
-continued
$L_{a77}$
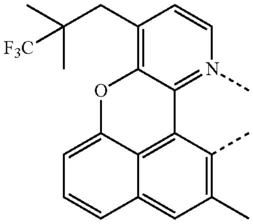
$L_{a78}$
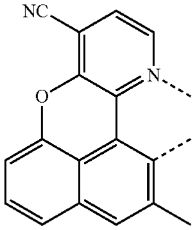
$L_{a79}$
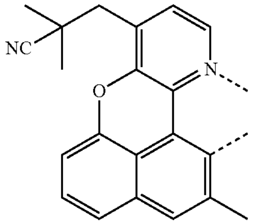
$L_{a80}$
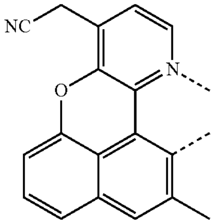
$L_{a274}$
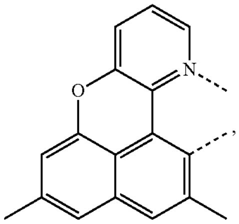
$L_{a275}$
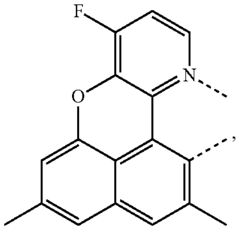

-continued
L$_{a276}$
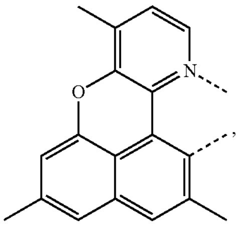
L$_{a277}$
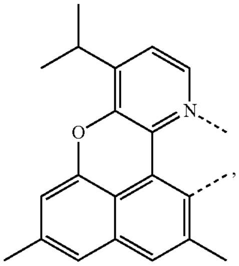
L$_{a278}$
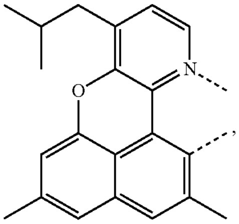
L$_{a279}$
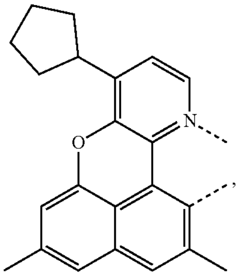
L$_{a280}$
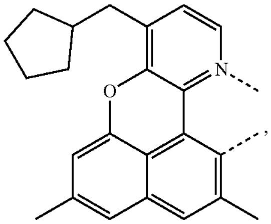
L$_{a281}$
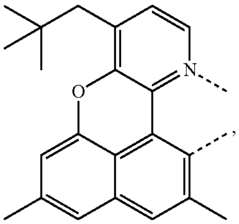
-continued
L$_{a282}$
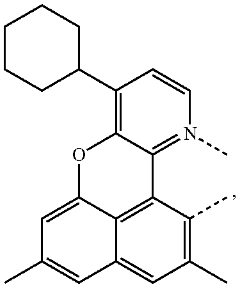
L$_{a283}$
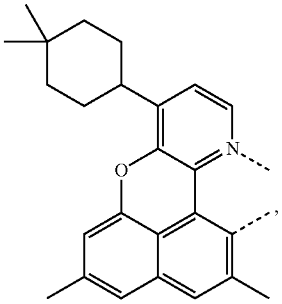
L$_{a284}$
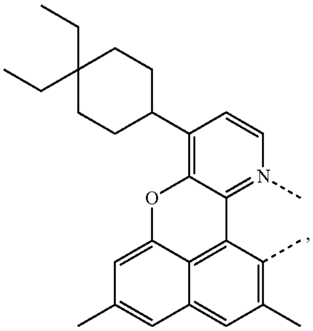
L$_{a285}$
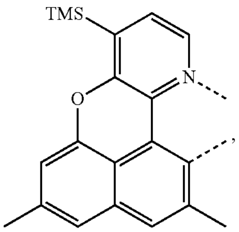
L$_{a286}$
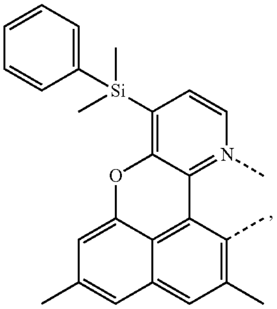

-continued
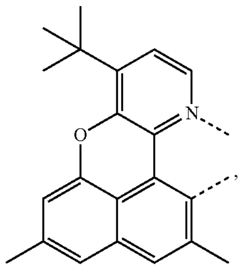
$L_{a287}$
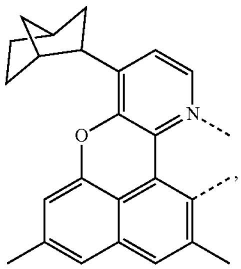
$L_{a288}$
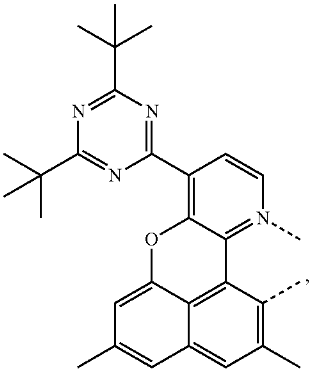
$L_{a289}$
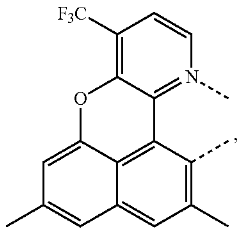
$L_{a290}$
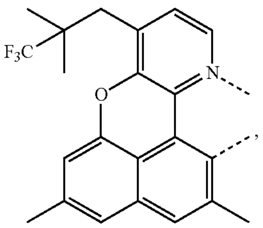
$L_{a291}$
-continued
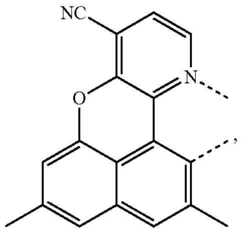
$L_{a292}$
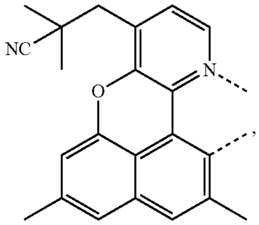
$L_{a293}$
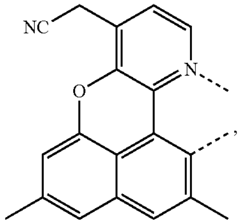
$L_{a294}$
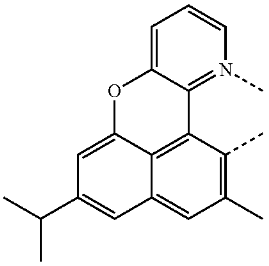
$L_{a373}$
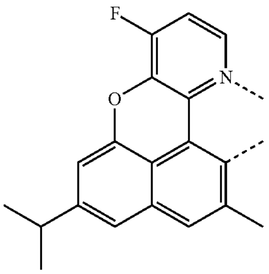
$L_{a374}$
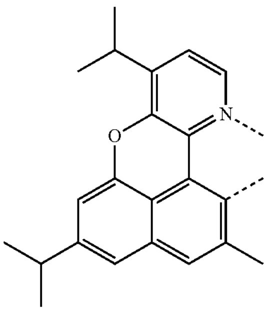
$L_{a375}$ $L_{a376}$
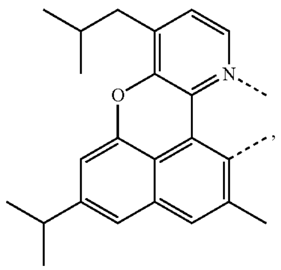
$L_{a377}$
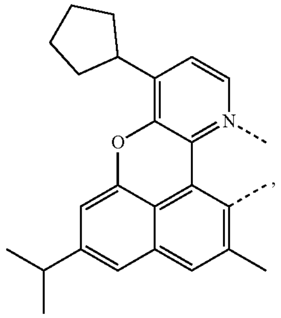
$L_{a378}$
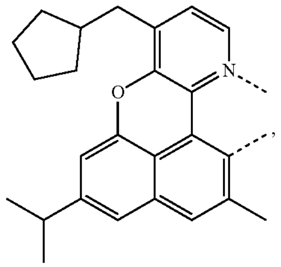
$L_{a379}$
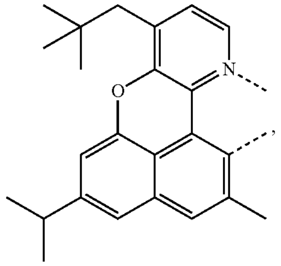
$L_{a380}$
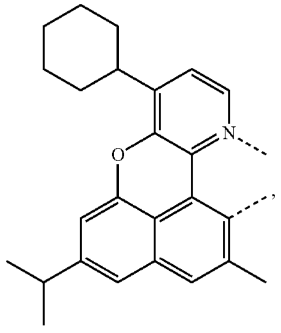
$L_{a381}$
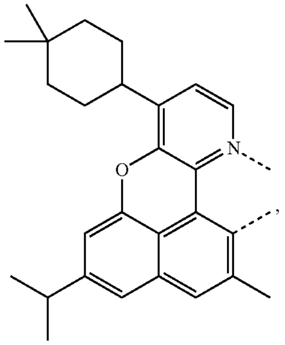
$L_{a382}$
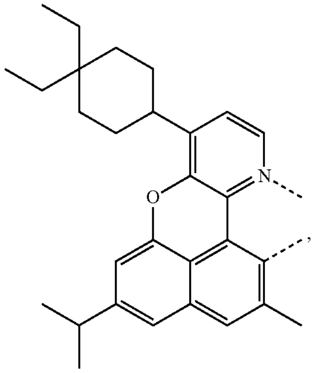
$L_{a383}$
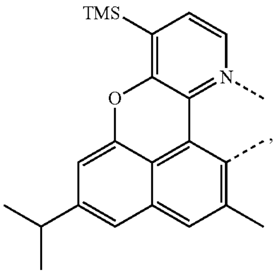
$L_{a384}$
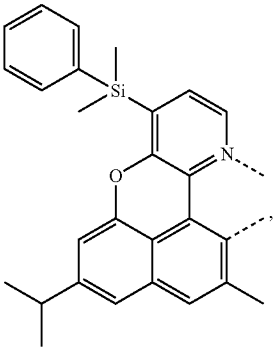

-continued
La385
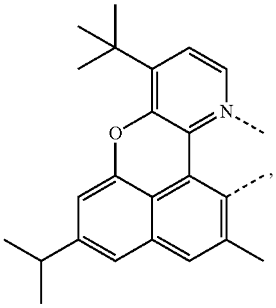
La386
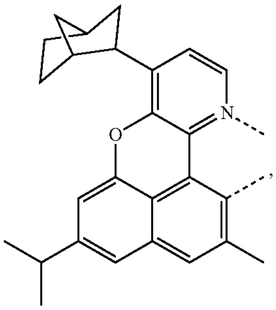
La387
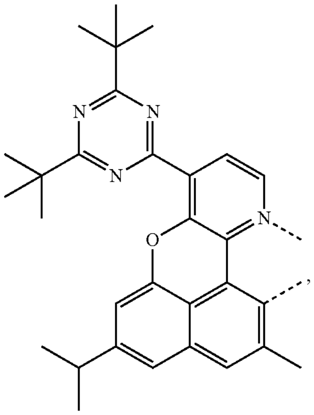
La388
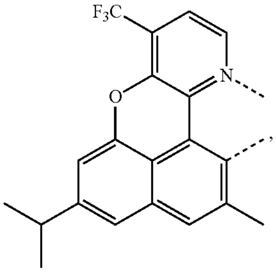
La389
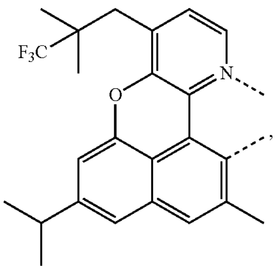
-continued
La390
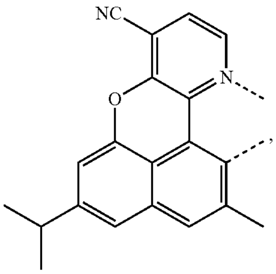
La391
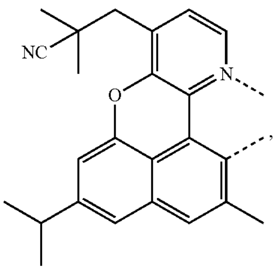
La392
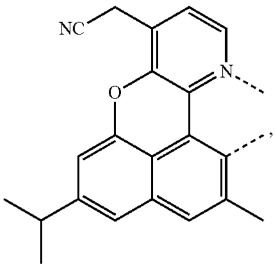
La470
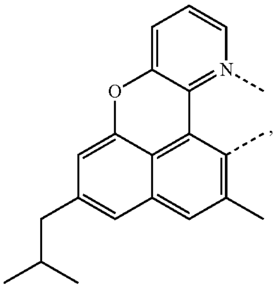
La471
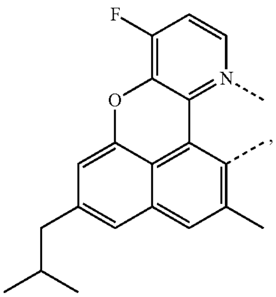

-continued
L$_{a472}$
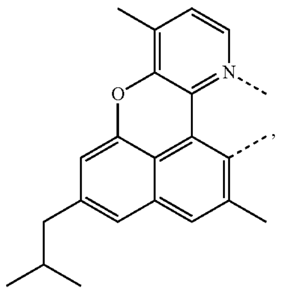
L$_{a473}$
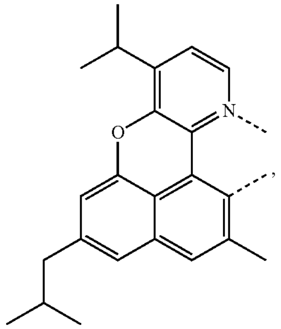
L$_{a474}$
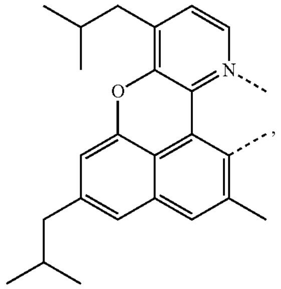
L$_{a475}$
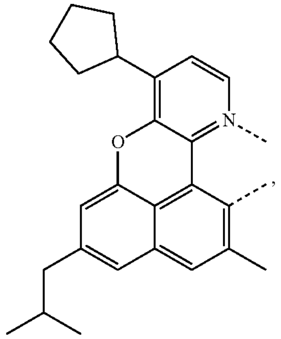
L$_{a476}$
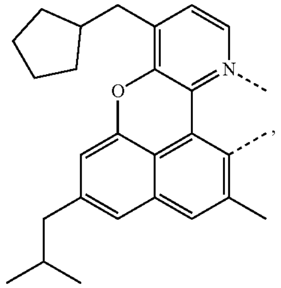
-continued
L$_{a477}$
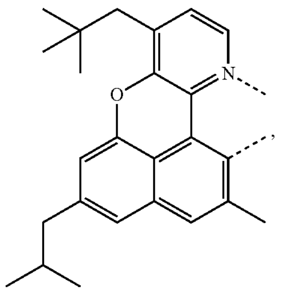
L$_{a478}$
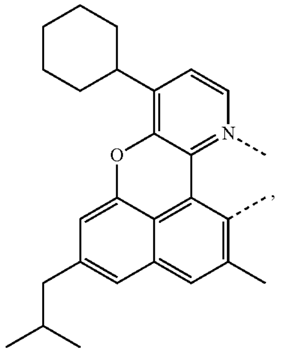
L$_{a479}$
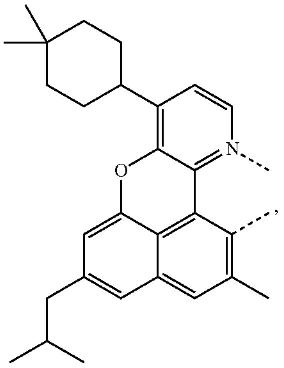
L$_{a480}$
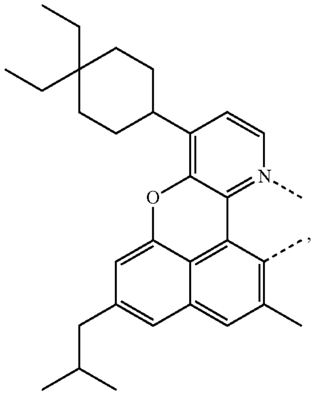

-continued
$L_{a481}$
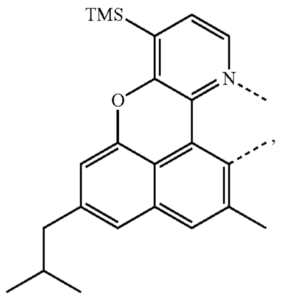
$L_{a482}$
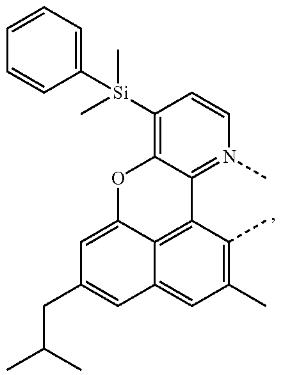
$L_{a483}$
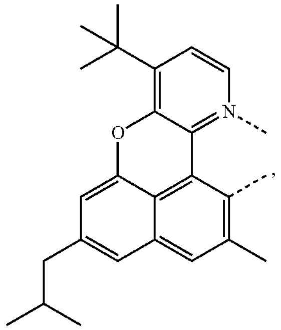
$L_{a484}$
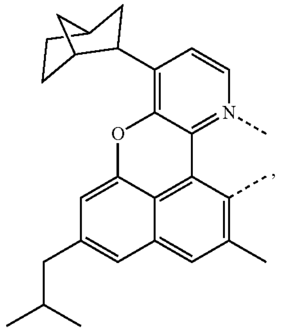
-continued
$L_{a485}$
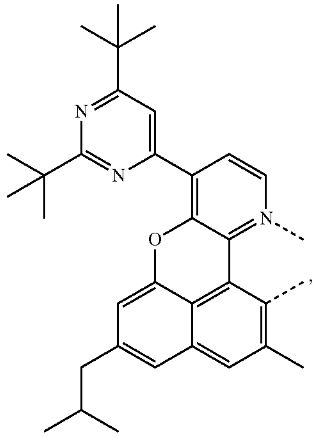
$L_{a486}$
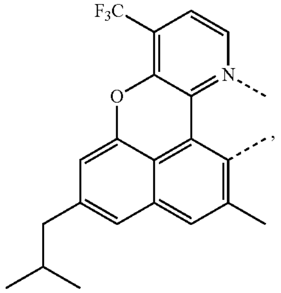
$L_{a487}$
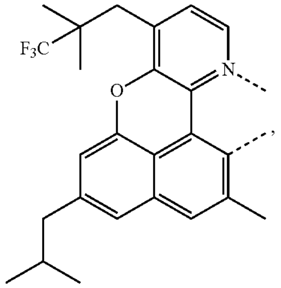
$L_{a488}$
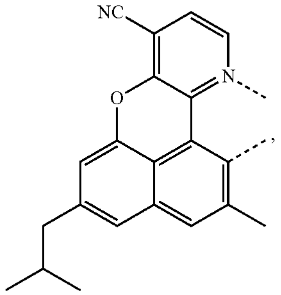
$L_{a489}$
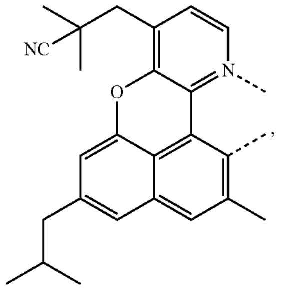

-continued
$L_{a490}$
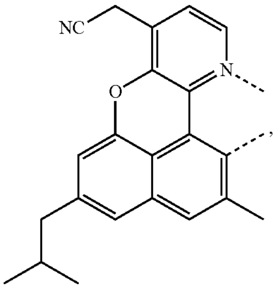
$L_{a569}$
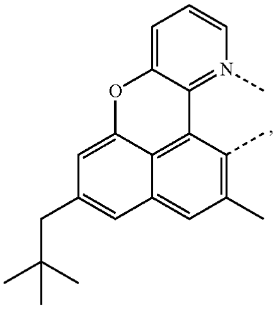
$L_{a570}$
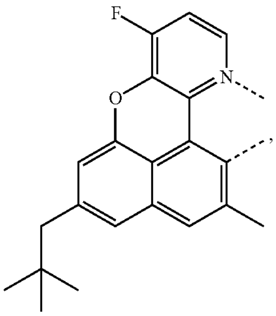
$L_{a571}$
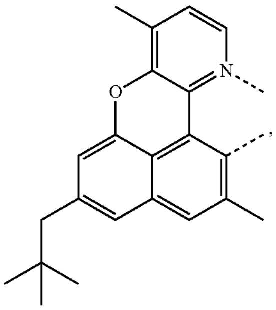
$L_{a572}$
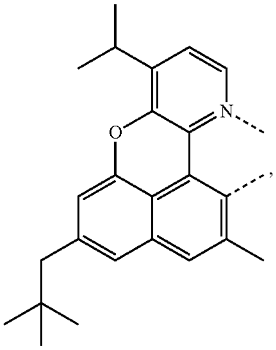
-continued
$L_{a573}$
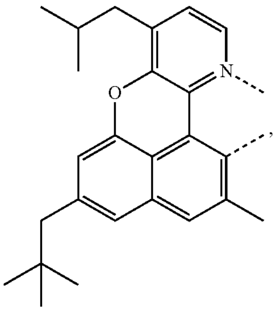
$L_{a574}$
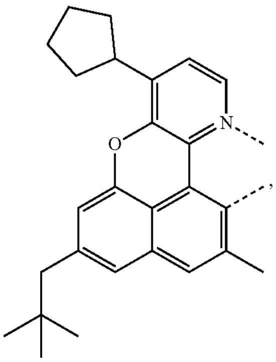
$L_{a575}$
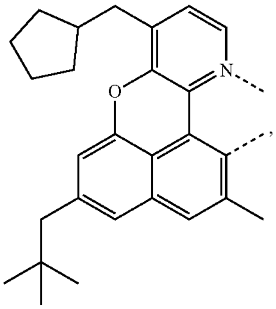
$L_{a576}$
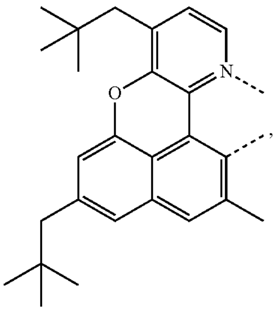

-continued
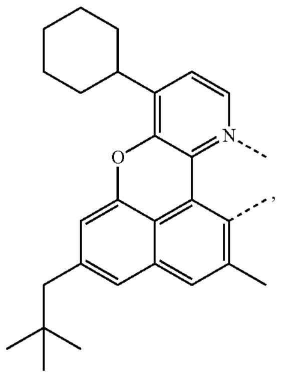
$L_{a577}$
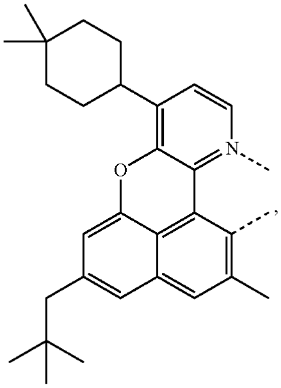
$L_{a578}$
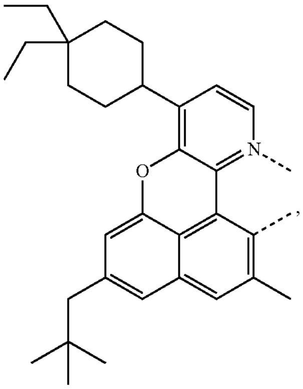
$L_{a579}$
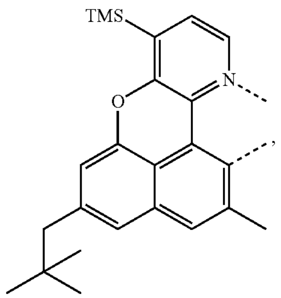
$L_{a580}$
-continued
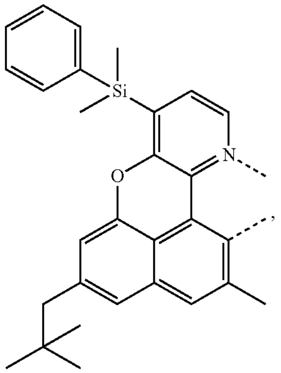
$L_{a581}$
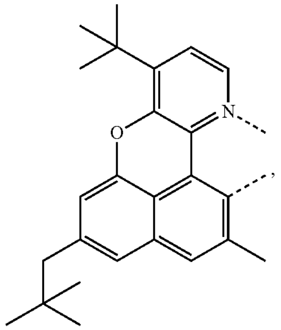
$L_{a582}$
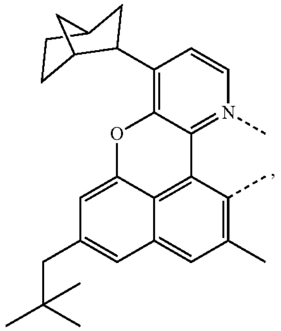
$L_{a583}$
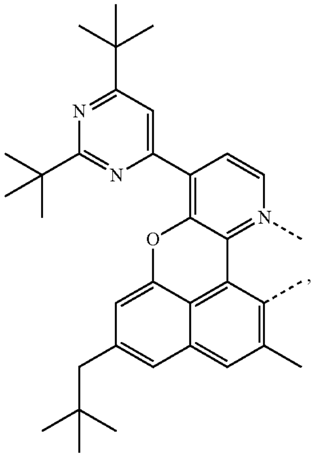
$L_{a584}$ -continued
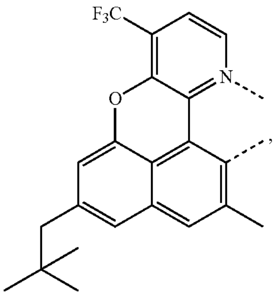
$L_{a585}$
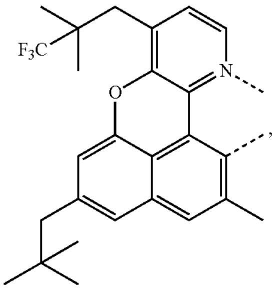
$L_{a586}$
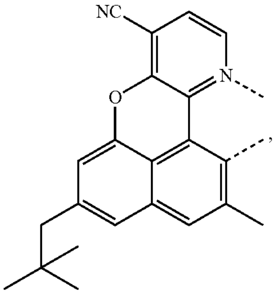
$L_{a587}$
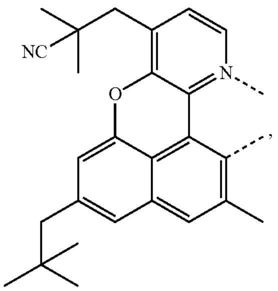
$L_{a588}$
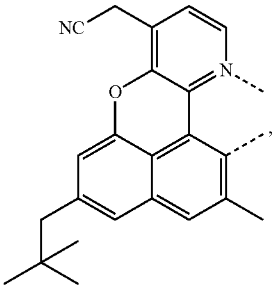
$L_{a589}$
-continued
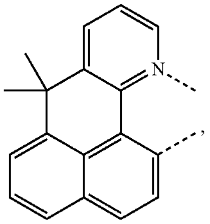
$L_{a1059}$
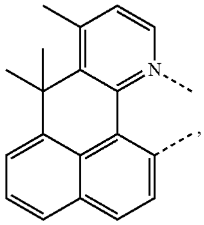
$L_{a1060}$
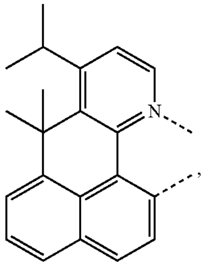
$L_{a1061}$
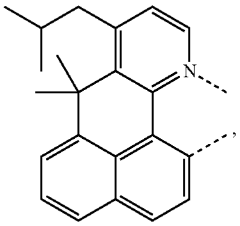
$L_{a1062}$
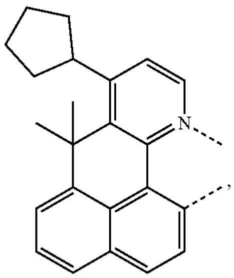
$L_{a1063}$
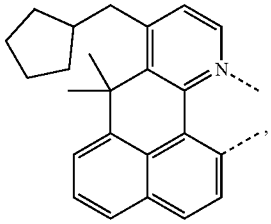
$L_{a1064}$ -continued
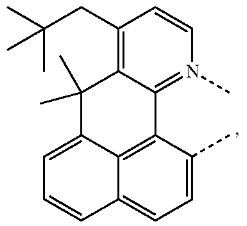
$L_{a1065}$
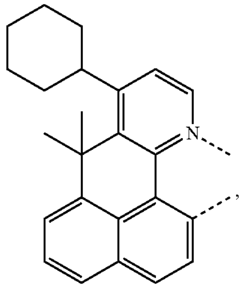
$L_{a1066}$
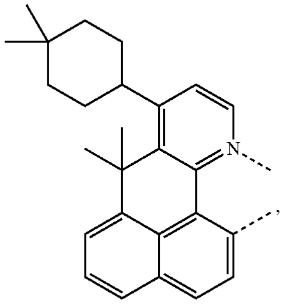
$L_{a1067}$
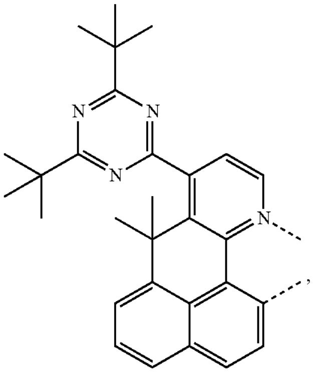
$L_{a1068}$
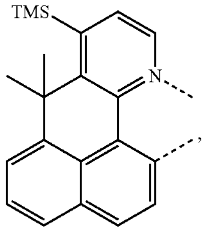
$L_{a1069}$
-continued
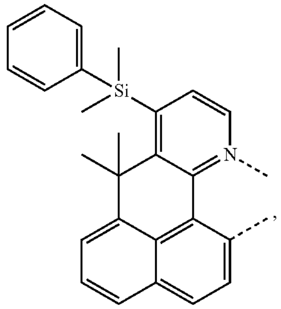
$L_{a1070}$
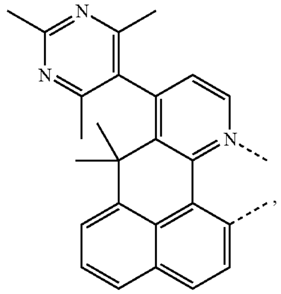
$L_{a1071}$
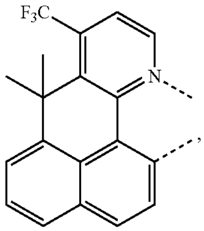
$L_{a1072}$
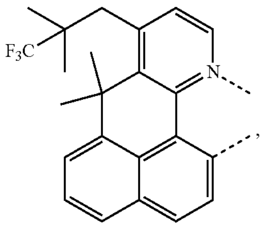
$L_{a1073}$
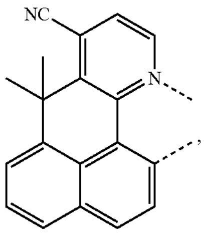
$L_{a1074}$
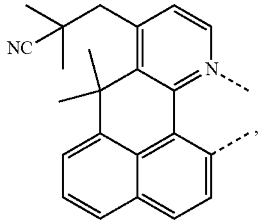
$L_{a1075}$ -continued
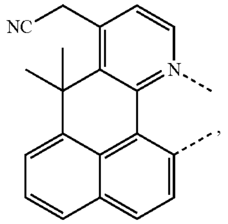
$L_{a1076}$
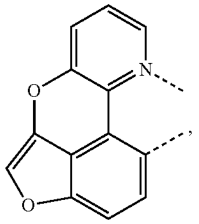
$L_{a1117}$
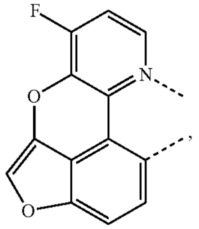
$L_{a1118}$
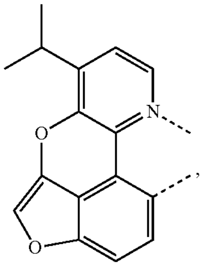
$L_{a1119}$
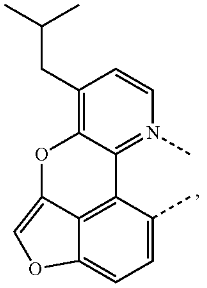
$L_{a1120}$
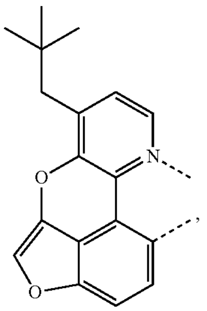
$L_{a1121}$
-continued
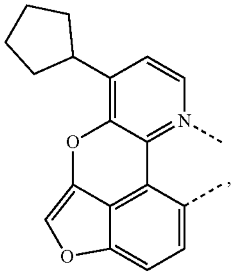
$L_{a1122}$
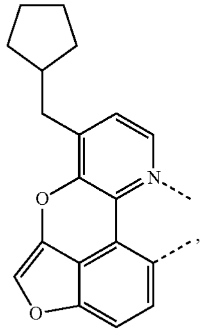
$L_{a1123}$
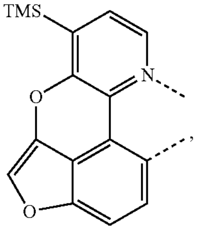
$L_{a1124}$
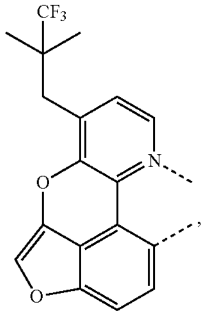
$L_{a1125}$
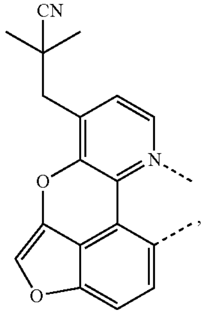
$L_{a1126}$ -continued
$L_{a1127}$
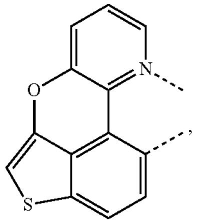
$L_{a1128}$
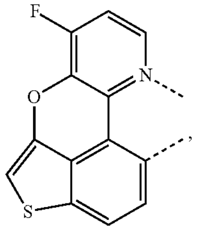
$L_{a1129}$
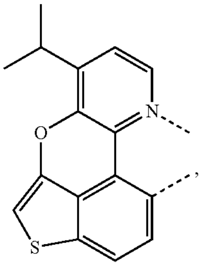
$L_{a1130}$
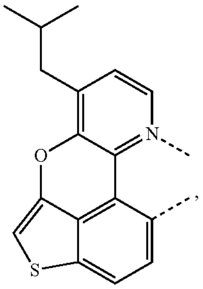
$L_{a1131}$
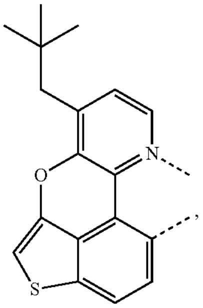
-continued
$L_{a1132}$
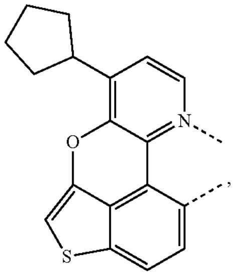
$L_{a1133}$
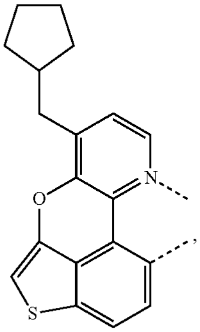
$L_{a1134}$
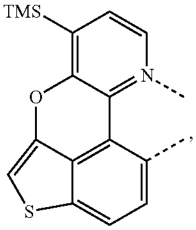
$L_{a1135}$
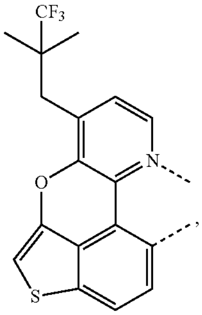
$L_{a1136}$
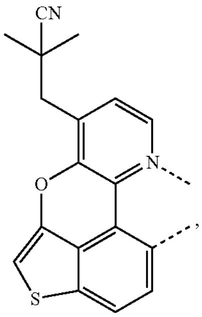

-continued
$L_{a1137}$
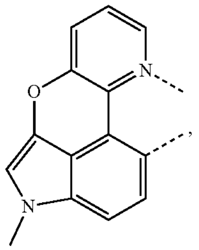
$L_{a1138}$
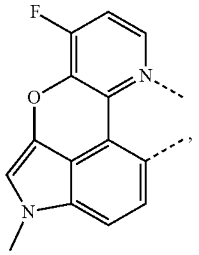
$L_{a1139}$
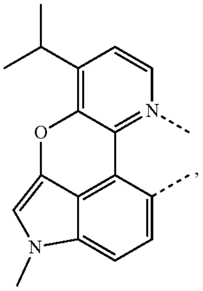
$L_{a1140}$
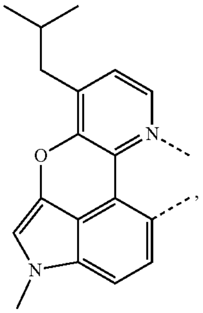
$L_{a1141}$
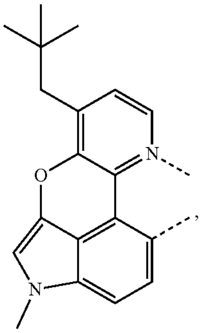
-continued
$L_{a1142}$
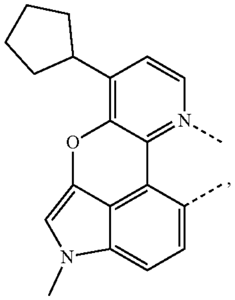
$L_{a1143}$
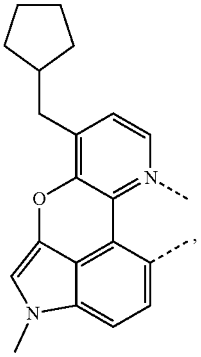
$L_{a1144}$
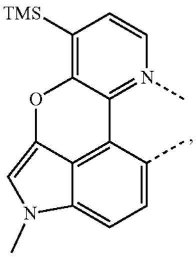
$L_{a1145}$
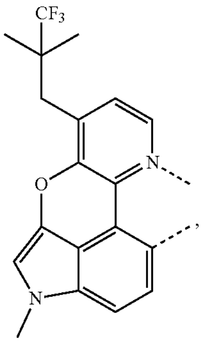
$L_{a1146}$
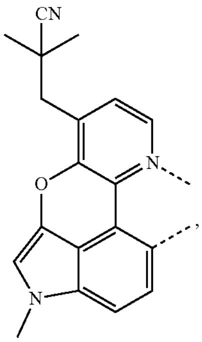

-continued
$L_{a1147}$
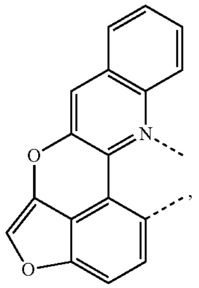
$L_{a1148}$
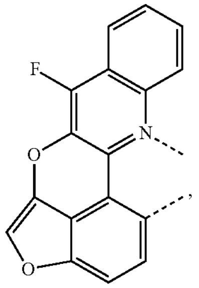
$L_{a1149}$
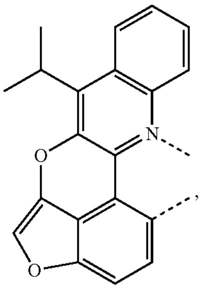
$L_{a1150}$
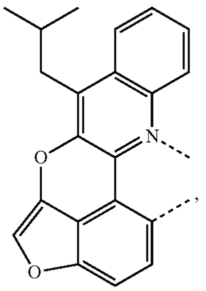
$L_{a1151}$
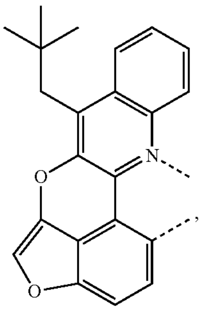
-continued
$L_{a1152}$
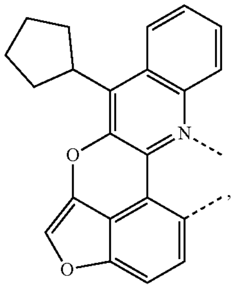
$L_{a1153}$
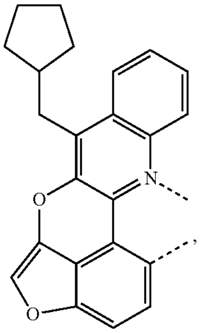
$L_{a1154}$
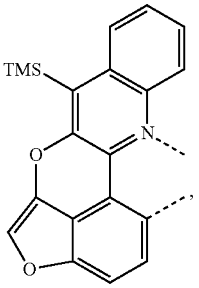
$L_{a1155}$
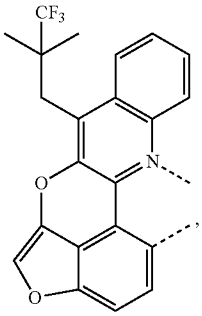
$L_{a1156}$
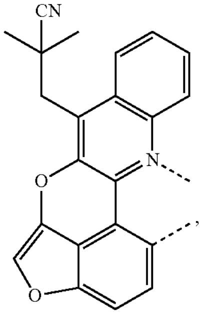

-continued
$L_{a1157}$
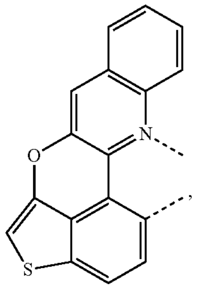
$L_{a1158}$
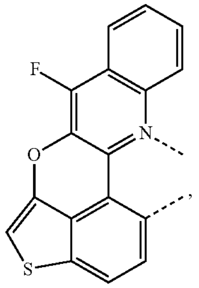
$L_{a1159}$
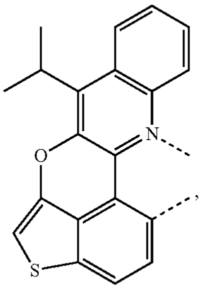
$L_{a1160}$
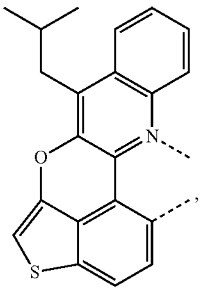
$L_{a1161}$
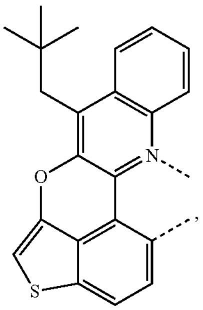
-continued
$L_{a1162}$
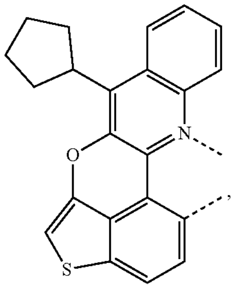
$L_{a1163}$
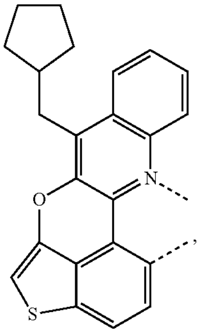
$L_{a1164}$
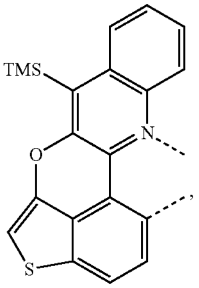
$L_{a1165}$
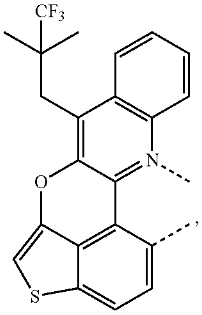
$L_{a1166}$
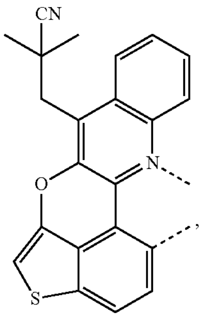

-continued
$L_{a1167}$
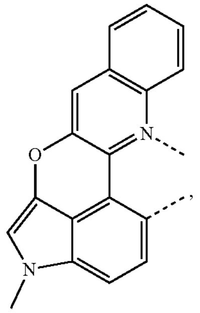
$L_{a1168}$
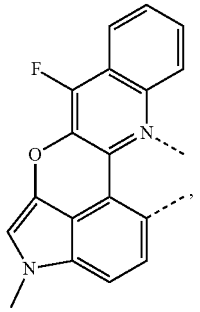
$L_{a1169}$
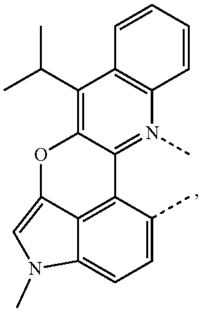
$L_{a1170}$
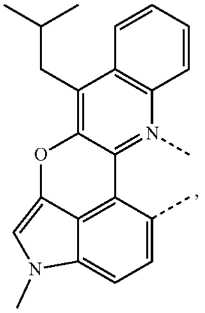
$L_{a1171}$
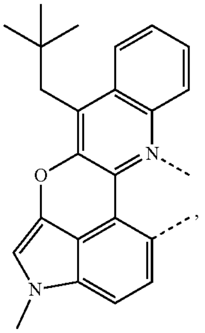
-continued
$L_{a1172}$
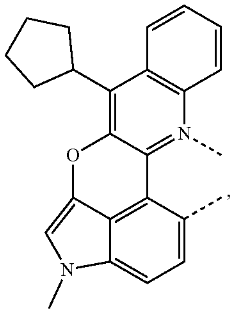
$L_{a1173}$
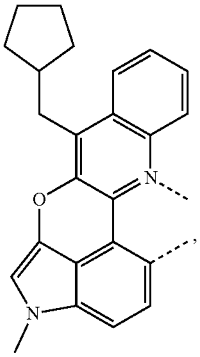
$L_{a1174}$
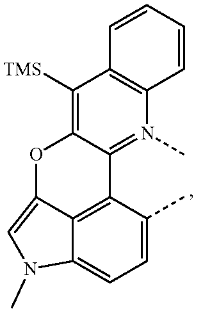
$L_{a1175}$
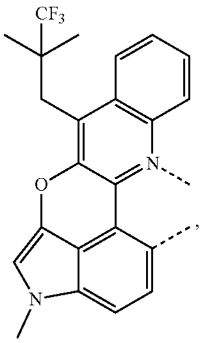

-continued
$L_{a1176}$
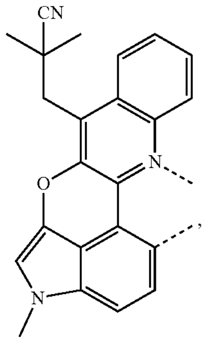
$L_{a1177}$
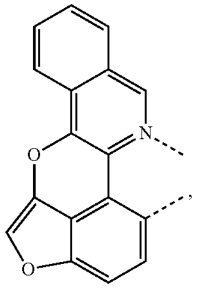
$L_{a1178}$
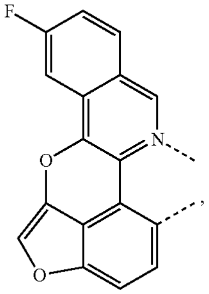
$L_{a1179}$
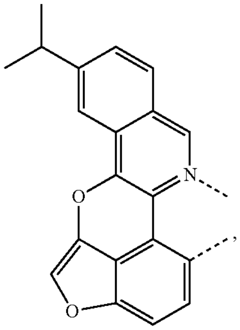
$L_{a1180}$
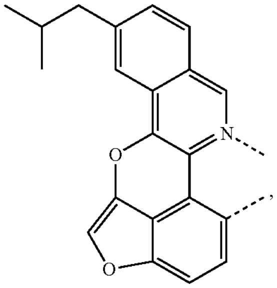
-continued
$L_{a1181}$
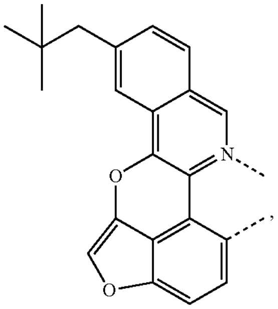
$L_{a1182}$
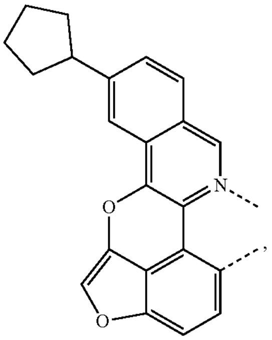
$L_{a1183}$
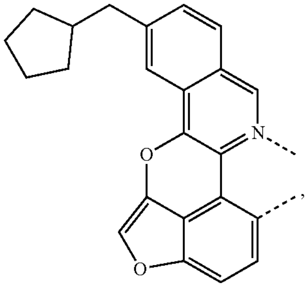
$L_{a1184}$
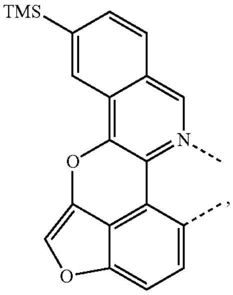
$L_{a1185}$
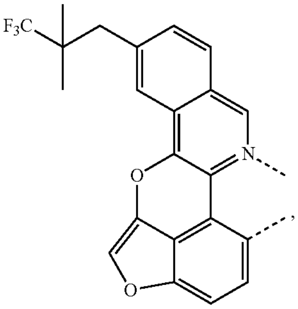

-continued
$L_{a1186}$
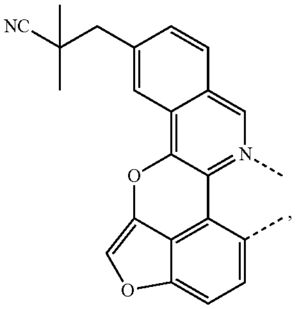
$L_{a1187}$
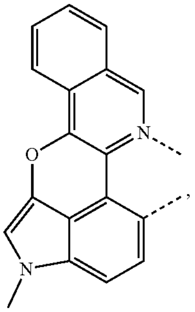
$L_{a1188}$
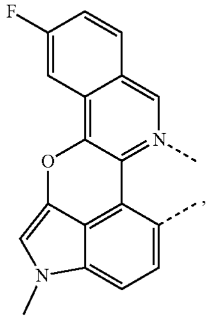
$L_{a1189}$
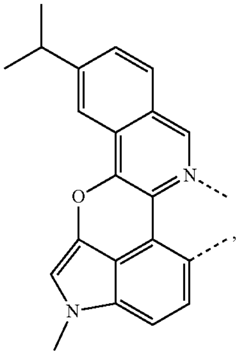
$L_{a1190}$
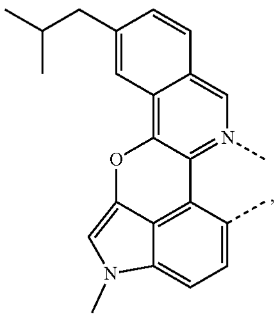
-continued
$L_{a1191}$
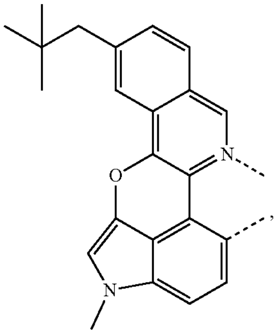
$L_{a1192}$
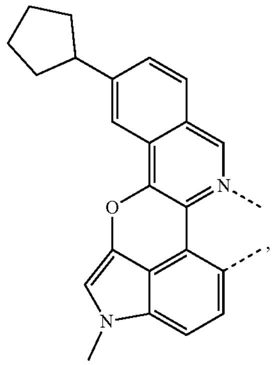
$L_{a1193}$
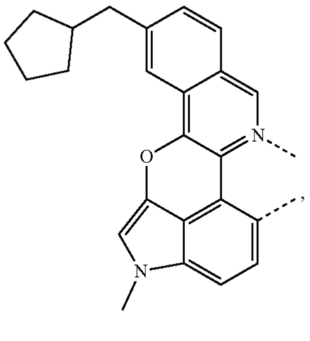
$L_{a1194}$
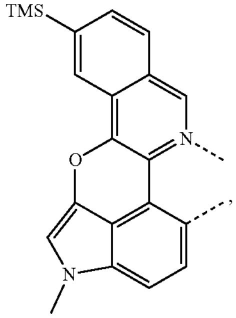

-continued
$L_{a1195}$
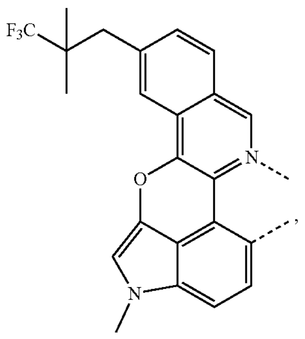
$L_{a1196}$
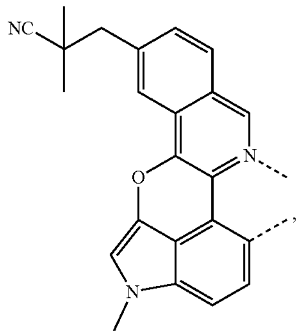
$L_{a1197}$
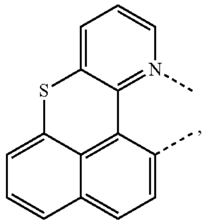
$L_{a1198}$
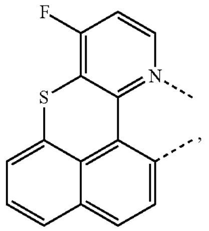
$L_{a1199}$
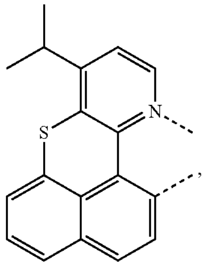
-continued
$L_{a1200}$
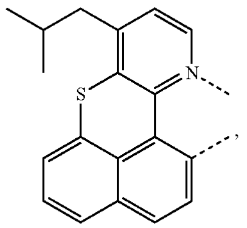
$L_{a1201}$
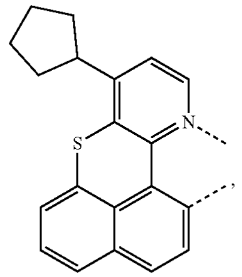
$L_{a1202}$
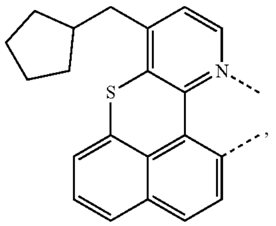
$L_{a1203}$
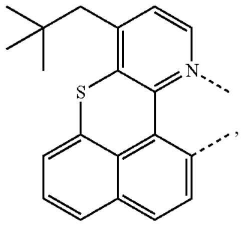
$L_{a1204}$
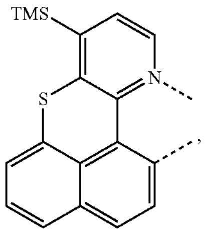
$L_{a1205}$
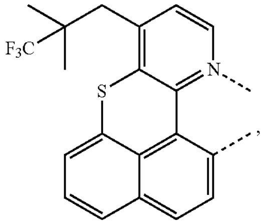

-continued
$L_{a1206}$
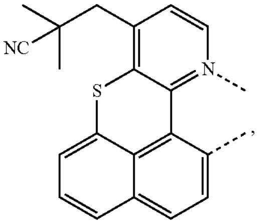
$L_{a1207}$
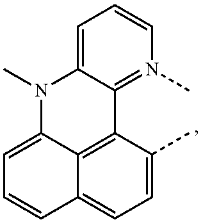
$L_{a1208}$
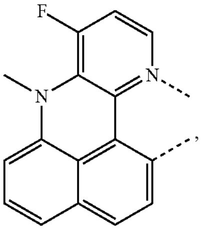
$L_{a1209}$
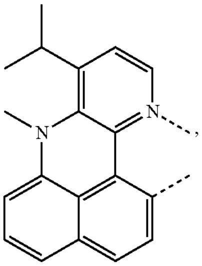
$L_{a1210}$
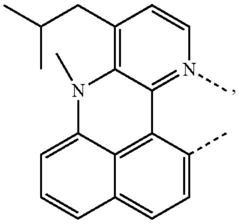
$L_{a1211}$
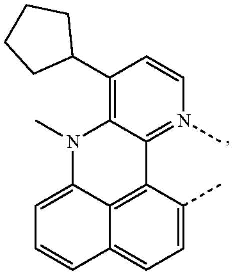
-continued
$L_{a1212}$
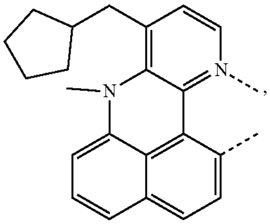
$L_{a1213}$
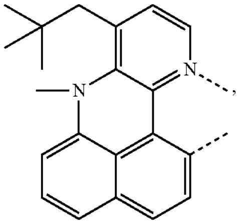
$L_{a1214}$
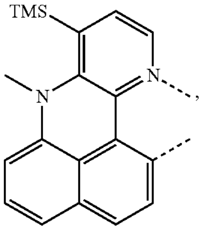
$L_{a1215}$
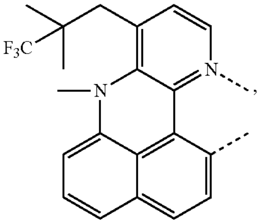
$L_{a1216}$
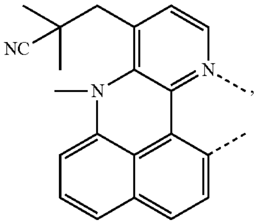
$L_{a1217}$
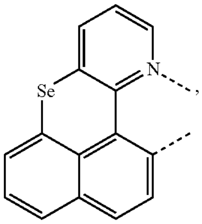

-continued
L$_{a1218}$
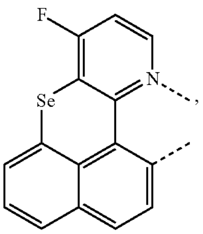
L$_{a1219}$
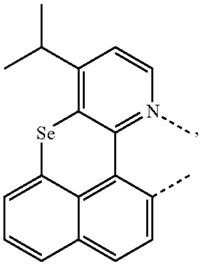
L$_{a1220}$
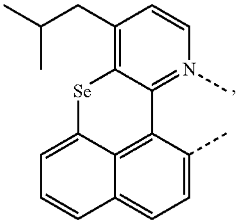
L$_{a1221}$
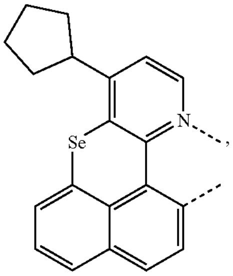
L$_{a1222}$
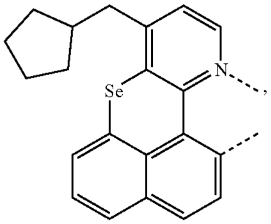
L$_{a1223}$
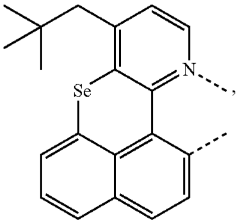
-continued
L$_{a1224}$
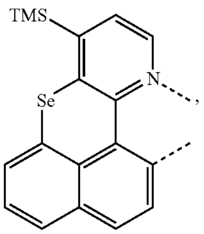
L$_{a1225}$
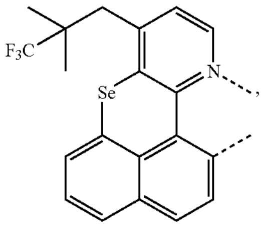
L$_{a1226}$
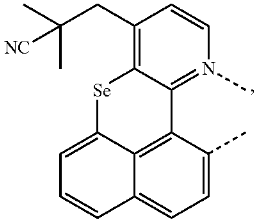
L$_{a1227}$
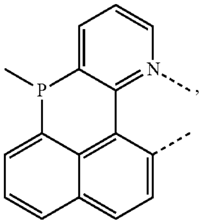
L$_{a1228}$
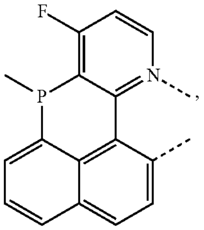
L$_{a1229}$
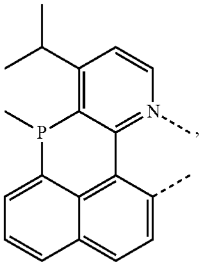

-continued
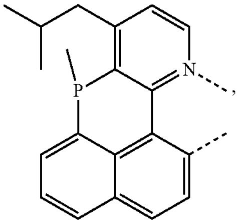
$L_{a1230}$
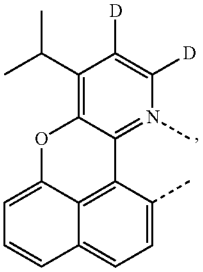
$L_{a1406}$
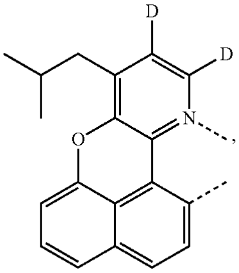
$L_{a1407}$
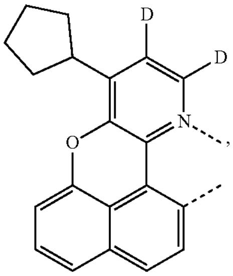
$L_{a1408}$
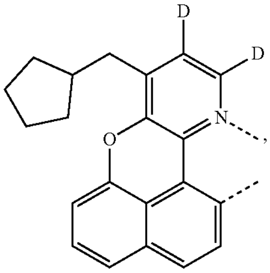
$L_{a1409}$
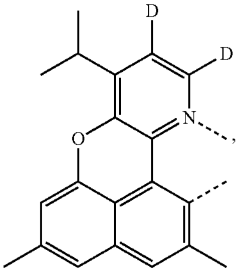
$L_{a1425}$
-continued
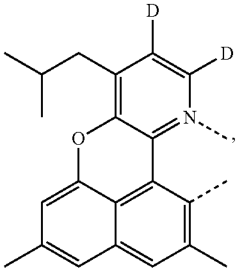
$L_{a1426}$
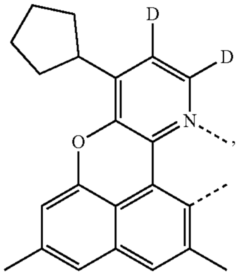
$L_{a1427}$
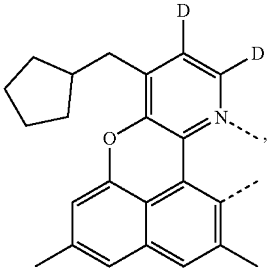
$L_{a1428}$
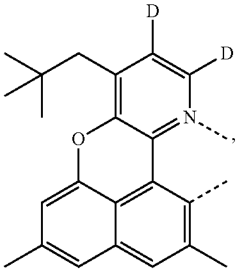
$L_{a1429}$
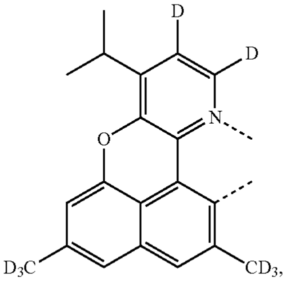
$L_{a1430}$ -continued
$L_{a1431}$
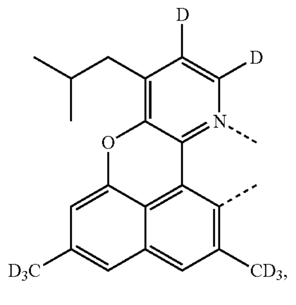
$L_{a1432}$
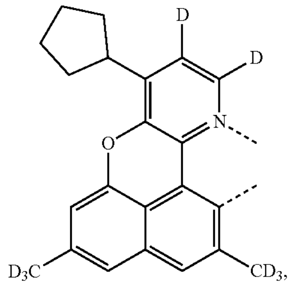
$L_{a1433}$
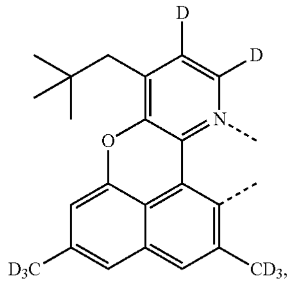
$L_{a1451}$
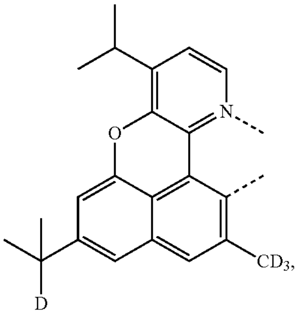
$L_{a1452}$
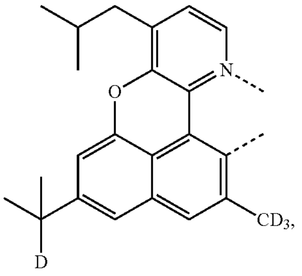
-continued
$L_{a1453}$
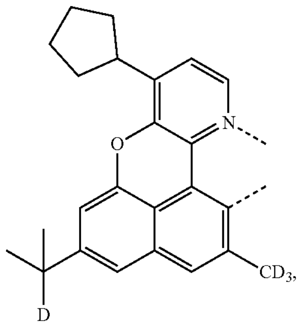
$L_{a1454}$
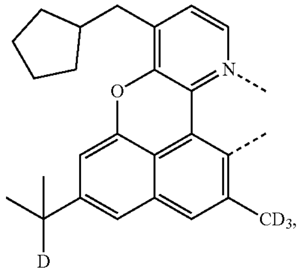
$L_{a1455}$
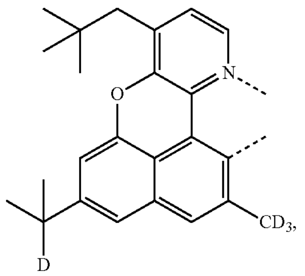
$L_{a1456}$
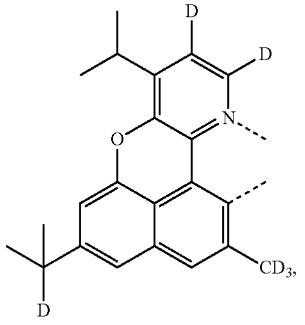
$L_{a1457}$
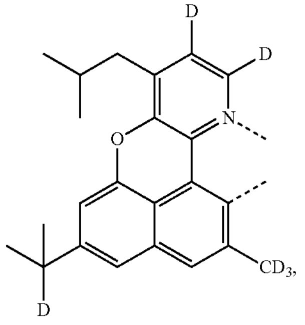

-continued
$L_{a1458}$
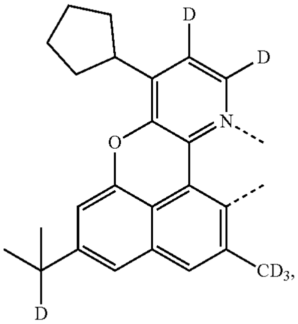
$L_{a1459}$
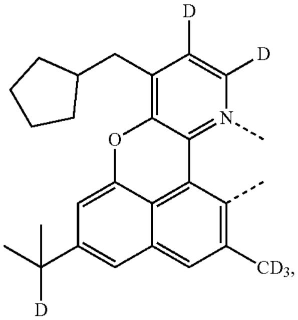
$L_{a1455}$
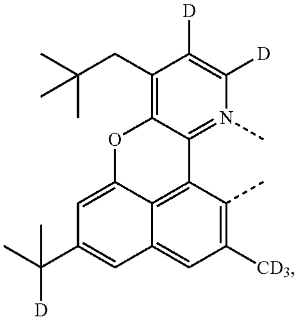
$L_{a1456}$
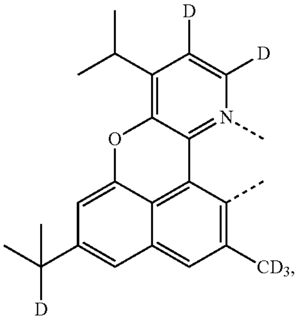
$L_{a1457}$
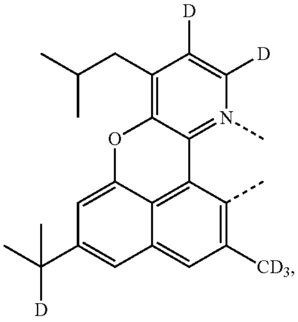
-continued
$L_{a1458}$
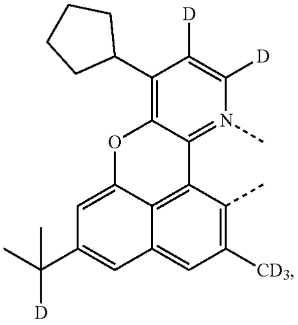
$L_{a1459}$
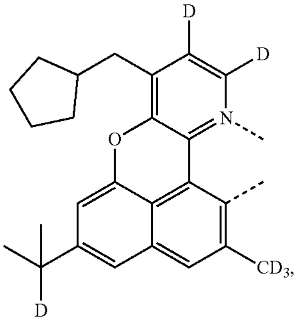
$L_{a1460}$
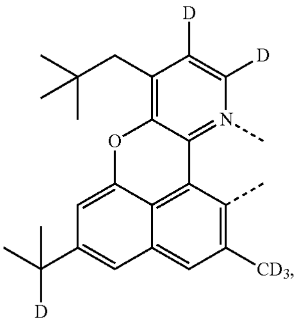
$L_{a1461}$
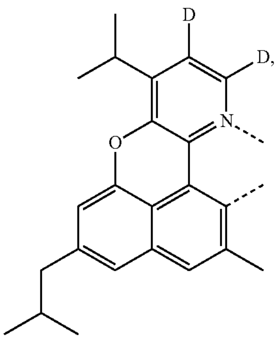

$L_{a1462}$
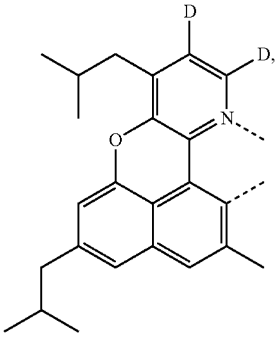
$L_{a1463}$
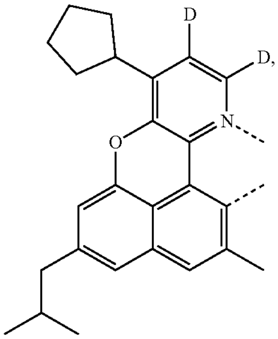
$L_{a1464}$
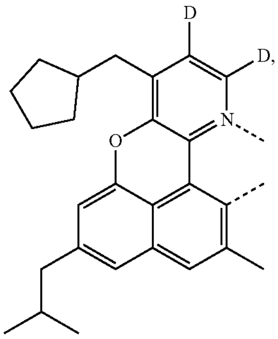
$L_{a1465}$
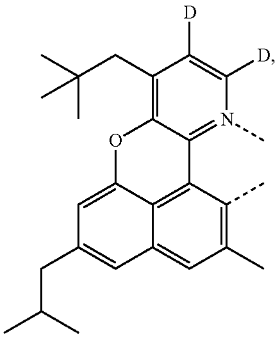
$L_{a1466}$
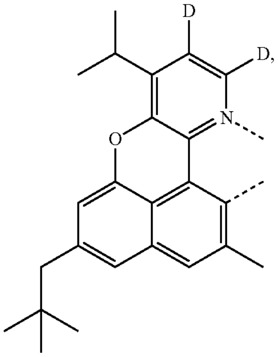
$L_{a1467}$
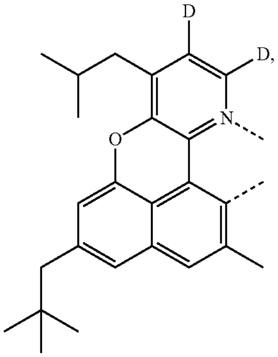
$L_{a1468}$
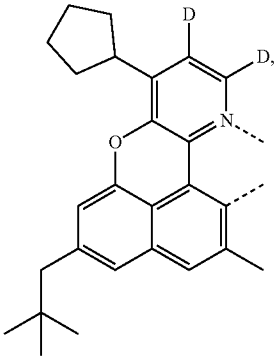
$L_{a1469}$
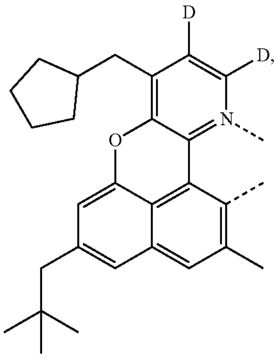

-continued
$L_{a1470}$
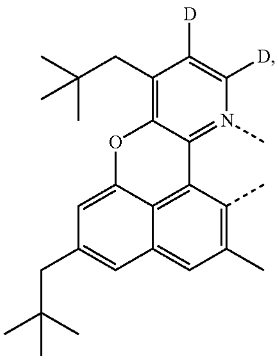
$L_{a1485}$
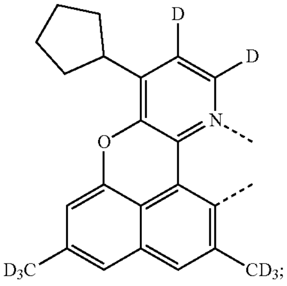
wherein in the above structures, TMS represents trimethylsilyl;
$L_{b1}$ to $L_{b322}$ are as follows:
$L_{b1}$
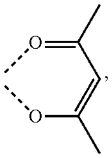
,
$L_{b2}$
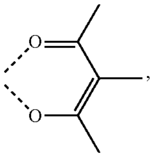
,
$L_{b3}$
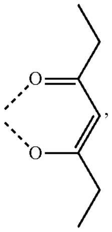
,
-continued
$L_{b4}$
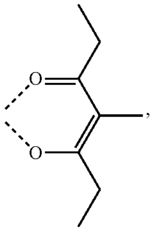
,
$L_{b5}$
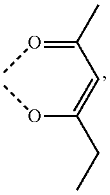
,
$L_{b6}$
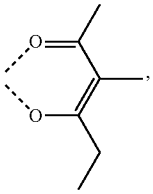
,
$L_{b7}$
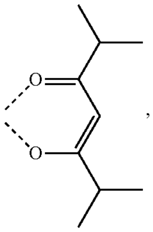
,
$L_{b8}$
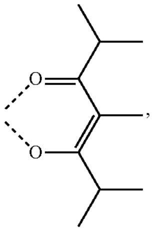
,
$L_{b9}$
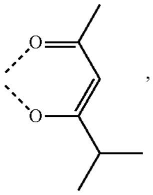
,
$L_{b10}$
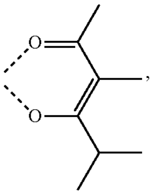
, $L_{b11}$
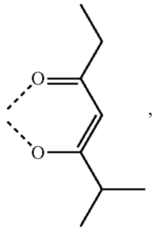
$L_{b12}$
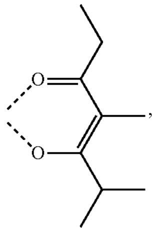
$L_{b13}$
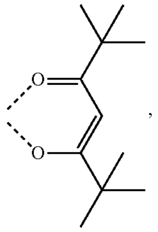
$L_{b14}$
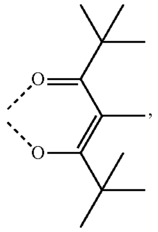
$L_{b15}$
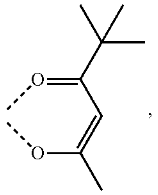
$L_{b16}$
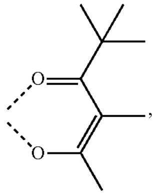
$L_{b17}$
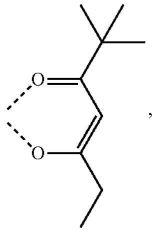
$L_{b18}$
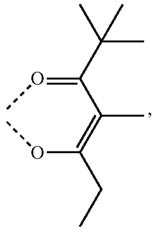
$L_{b19}$
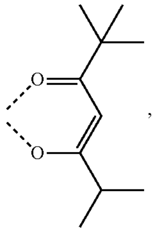
$L_{b20}$
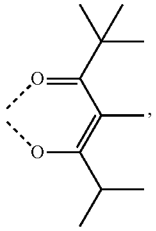
$L_{b21}$
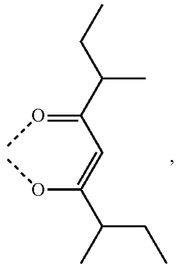
$L_{b22}$
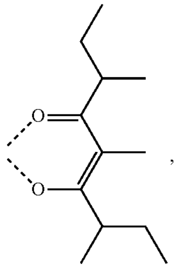
$L_{b23}$
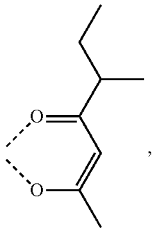

-continued
$L_{b24}$
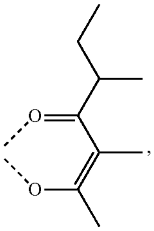,
$L_{b25}$
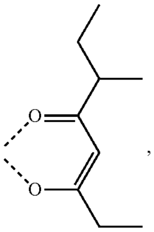,
$L_{b26}$
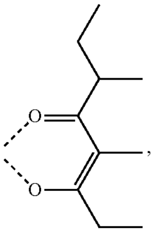,
$L_{b27}$
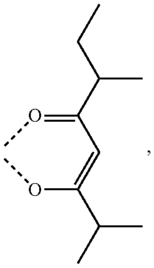,
$L_{b28}$
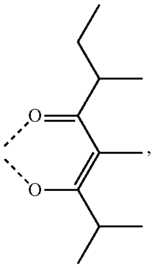,
$L_{b29}$
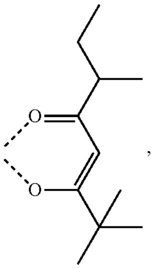,
-continued
$L_{b30}$
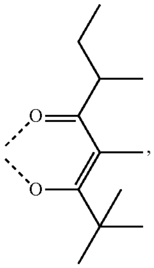,
$L_{b31}$
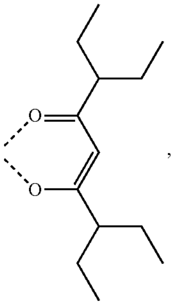,
$L_{b32}$
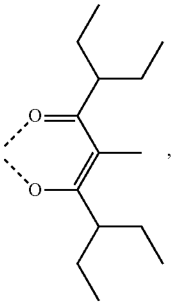,
$L_{b33}$
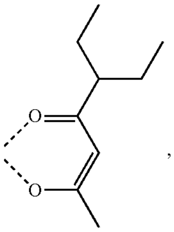,
$L_{b34}$
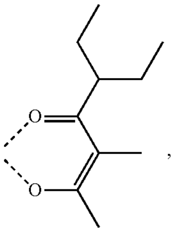,
$L_{b35}$
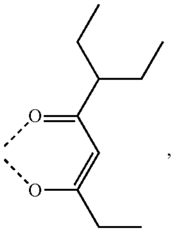, -continued
$L_{b36}$
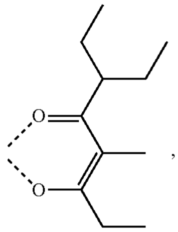
,
$L_{b37}$
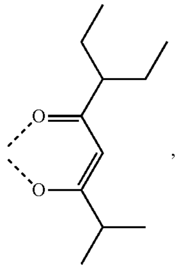
,
$L_{b38}$
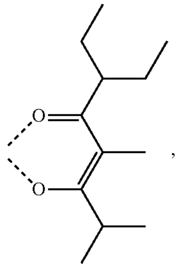
,
$L_{b39}$
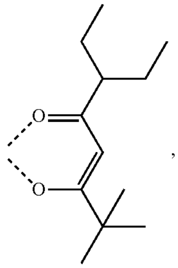
,
$L_{b40}$
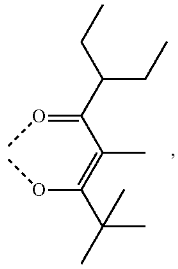
,
$L_{b41}$
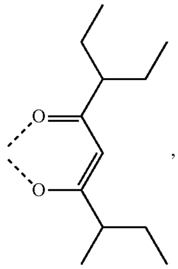
,
-continued
$L_{b42}$
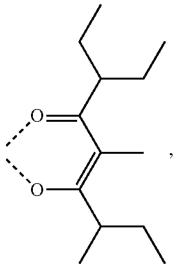
,
$L_{b43}$
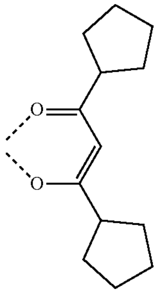
,
$L_{b44}$
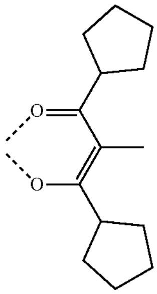
,
$L_{b45}$
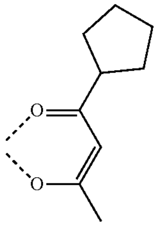
,
$L_{b46}$
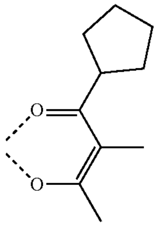
,
$L_{b47}$
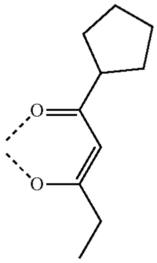
, -continued
L$_{b48}$
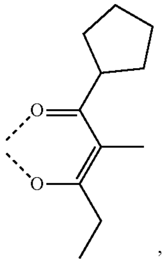
,
L$_{b49}$
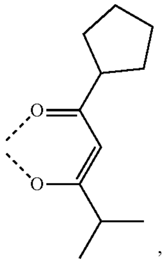
,
L$_{b50}$
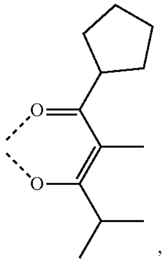
,
L$_{b51}$
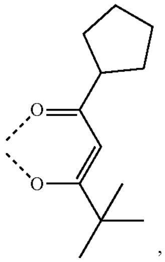
,
L$_{b52}$
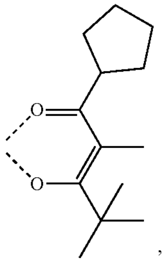
,
L$_{b53}$
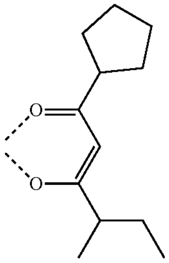
,
-continued
L$_{b54}$
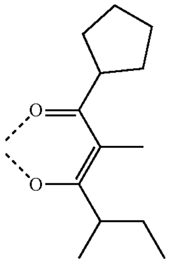
,
L$_{b55}$
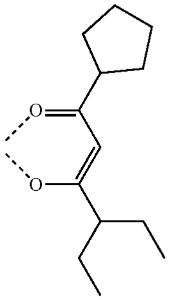
,
L$_{b56}$
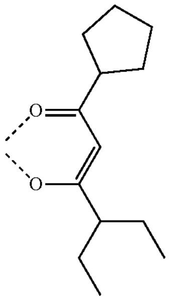
,
L$_{b57}$
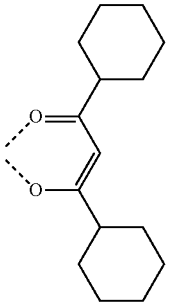
,
L$_{b58}$
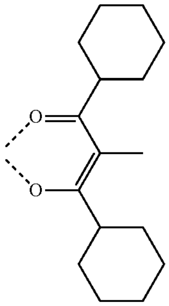
, -continued
$L_{b59}$
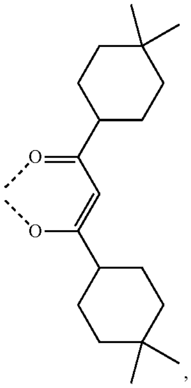
,
$L_{b60}$
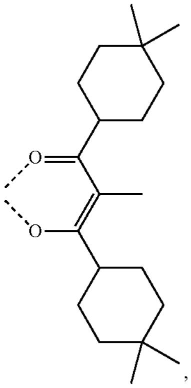
,
$L_{b61}$
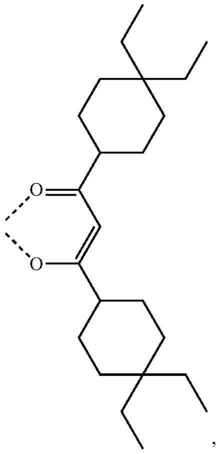
,
-continued
$L_{b62}$
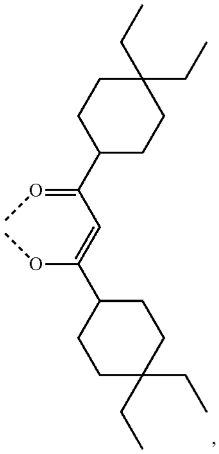
,
$L_{b63}$
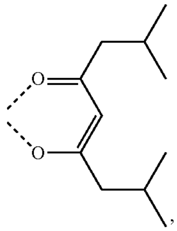
,
$L_{b64}$
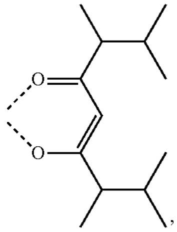
,
$L_{b65}$
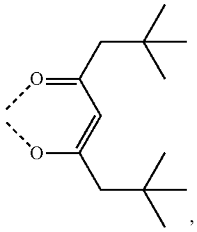
,
$L_{b66}$
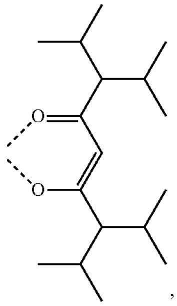
, -continued
$L_{b67}$
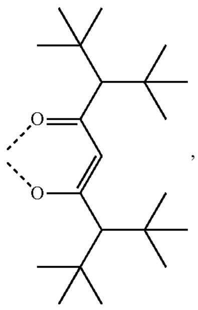
,
$L_{b68}$
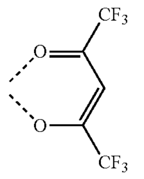
,
$L_{b69}$
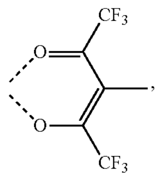
,
$L_{b70}$
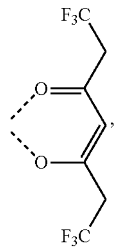
,
$L_{b71}$
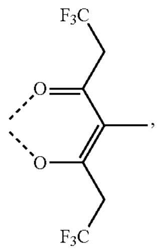
,
$L_{b72}$
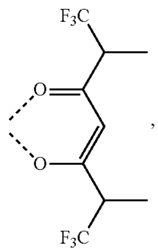
,
-continued
$L_{b73}$
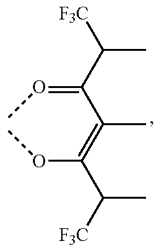
,
$L_{b74}$
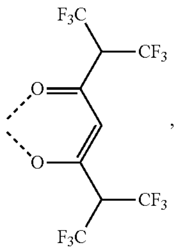
,
$L_{b75}$
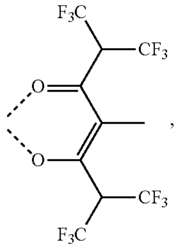
,
$L_{b76}$
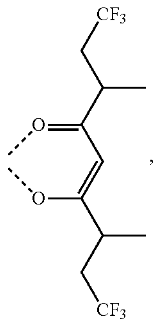
,
$L_{b77}$
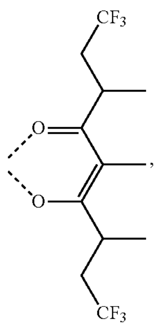
, -continued
$L_{b78}$
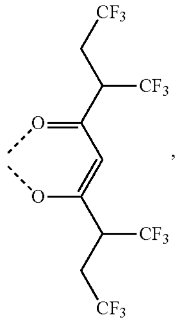
,
$L_{b79}$
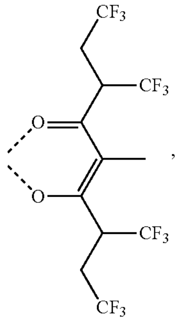
,
$L_{b80}$
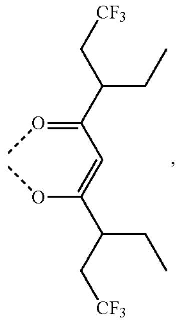
,
$L_{b81}$
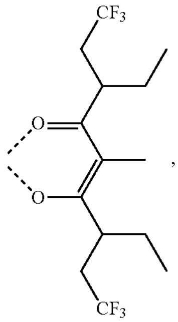
,
$L_{b82}$
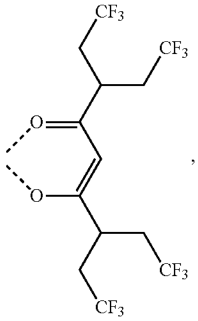
,
-continued
$L_{b83}$
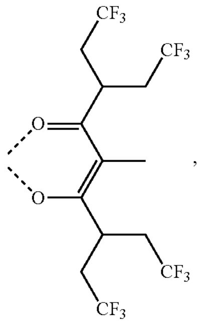
,
$L_{b84}$
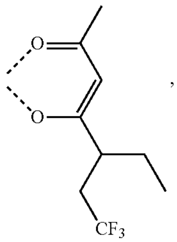
,
$L_{b85}$
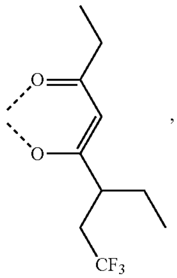
,
$L_{b86}$
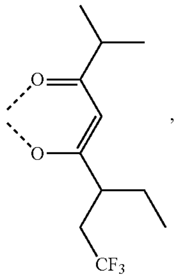
,
$L_{b87}$
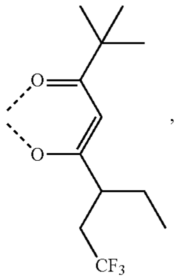
, -continued
$L_{b88}$
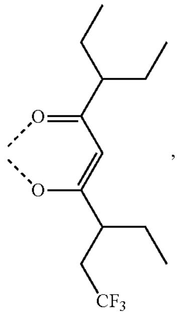
,
$L_{b89}$
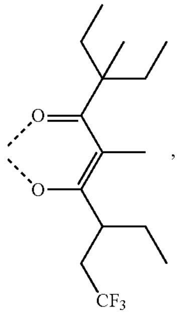
,
$L_{b90}$
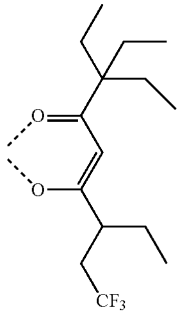
,
$L_{b91}$
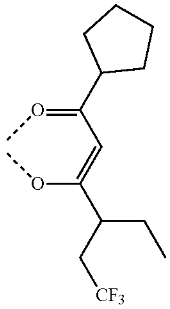
,
$L_{b92}$
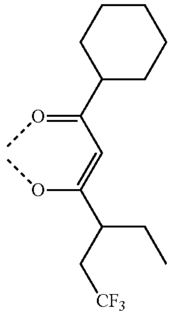
,
-continued
$L_{b93}$
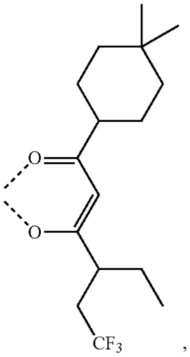
,
$L_{b94}$
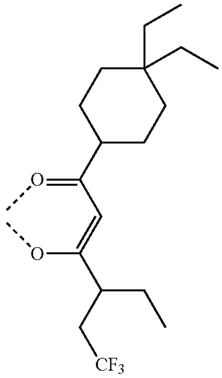
,
$L_{b95}$
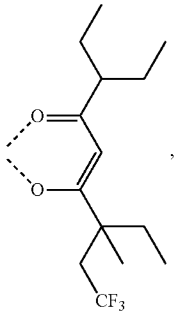
,
$L_{b96}$
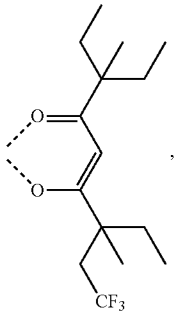
, -continued
$L_{b97}$
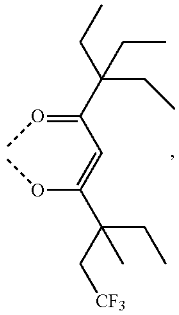
,
$L_{b98}$
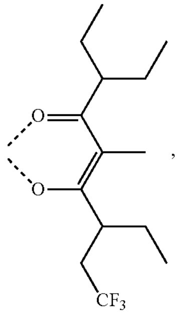
,
$L_{b99}$
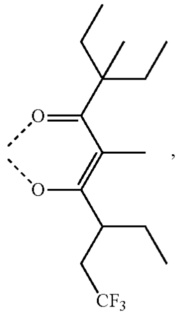
,
$L_{b100}$
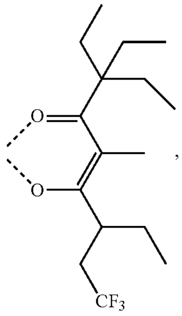
,
$L_{b101}$
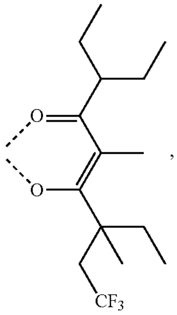
,
-continued
$L_{b102}$
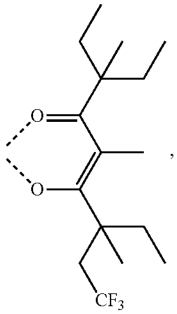
,
$L_{b103}$
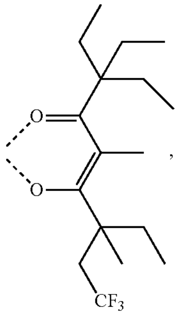
,
$L_{b104}$
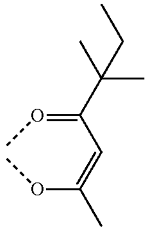
,
$L_{b105}$
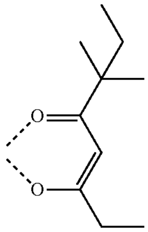
,
$L_{b106}$
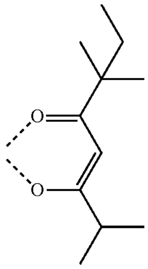
, -continued
Lb107
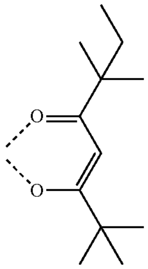
,
Lb108
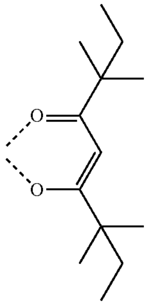
,
Lb109
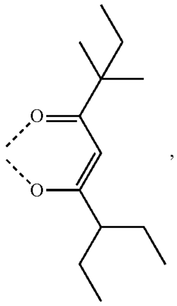
,
Lb112
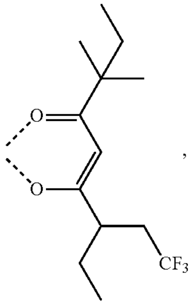
,
Lb113
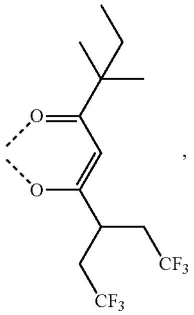
,
-continued
Lb114
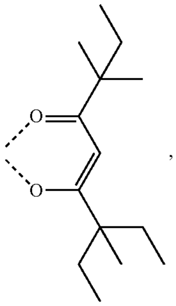
,
Lb115
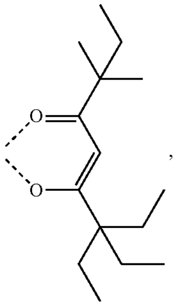
,
Lb116
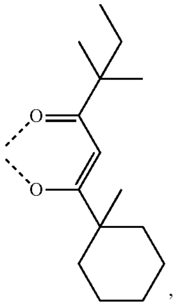
,
Lb117
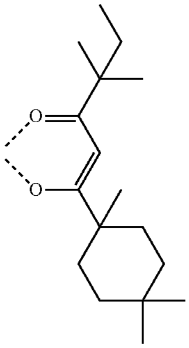
,
Lb118
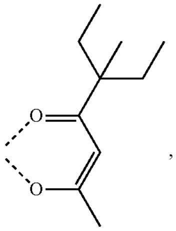
, $L_{b119}$
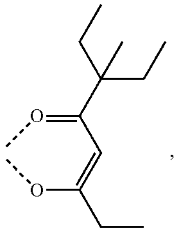
,
$L_{b120}$
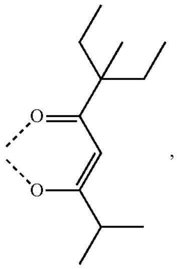
,
$L_{b121}$
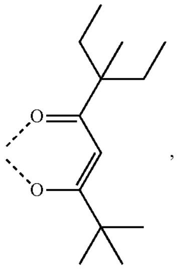
,
$L_{b122}$
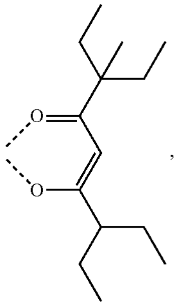
,
$L_{b123}$
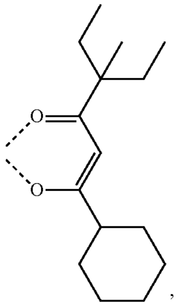
,
$L_{b124}$
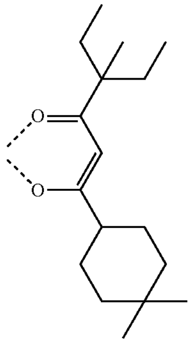
,
$L_{b125}$
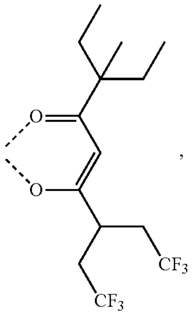
,
$L_{b126}$
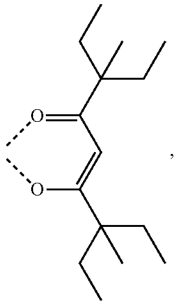
,
$L_{b127}$
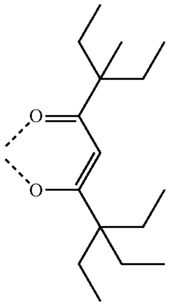
,
$L_{b128}$
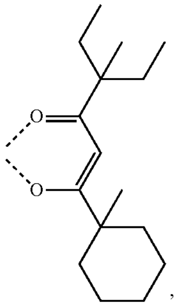
, -continued
L$_{b129}$
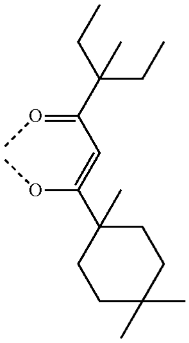
,
L$_{b130}$
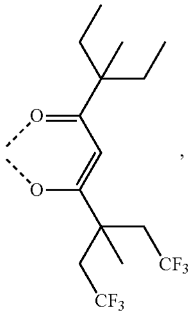
,
L$_{b131}$
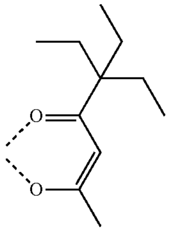
,
L$_{b132}$
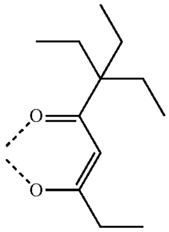
,
L$_{b133}$
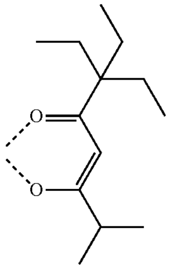
,
-continued
L$_{b134}$
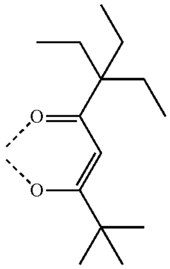
,
L$_{b135}$
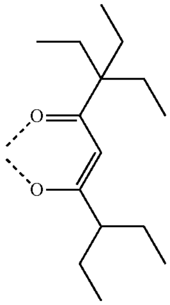
,
L$_{b136}$
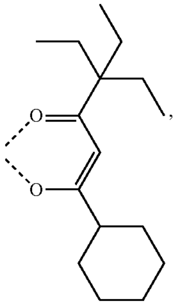
,
L$_{b137}$
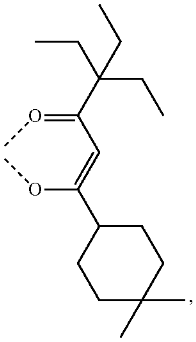
,
L$_{b138}$
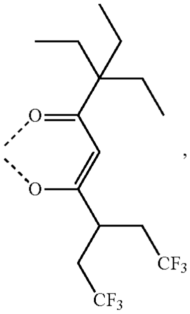
, -continued
L$_{b139}$
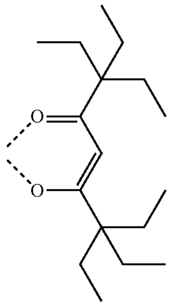
,
L$_{b142}$
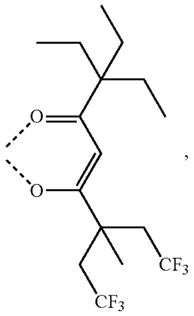
,
L$_{b143}$
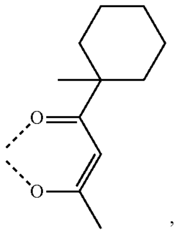
,
L$_{b144}$
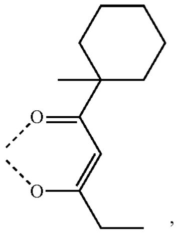
,
L$_{b145}$
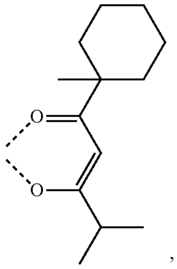
,
-continued
L$_{b146}$
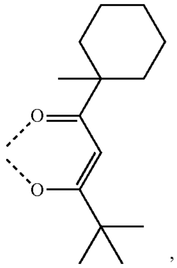
,
L$_{b147}$
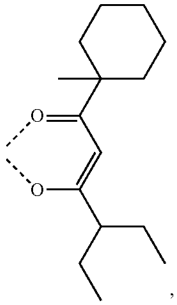
,
L$_{b148}$
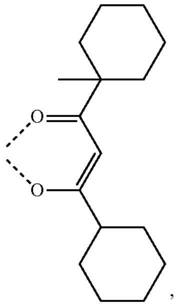
,
L$_{b149}$
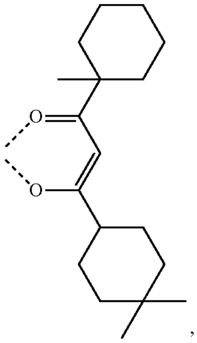
,
L$_{b150}$
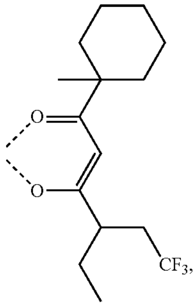
, -continued
$L_{b151}$
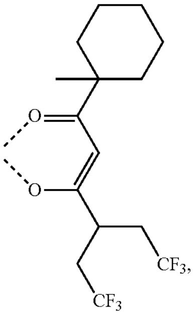
$L_{b152}$
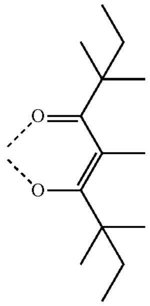
,
$L_{b153}$
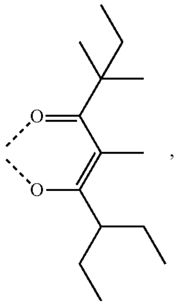
,
$L_{b154}$
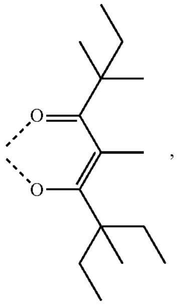
,
$L_{b155}$
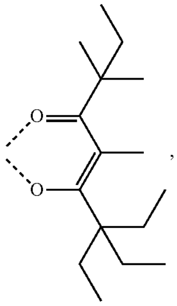
,
-continued
$L_{b156}$
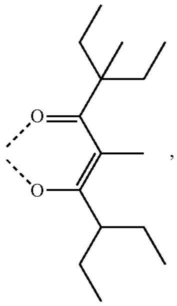
,
$L_{b157}$
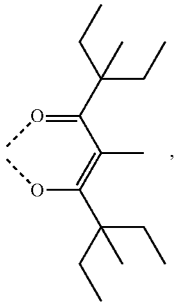
,
$L_{b158}$
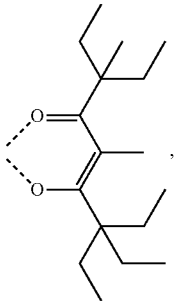
,
$L_{b159}$
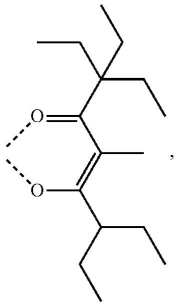
,
$L_{b160}$
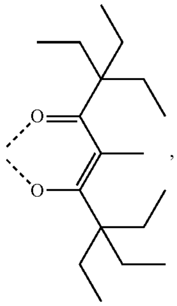
, -continued
$L_{b161}$
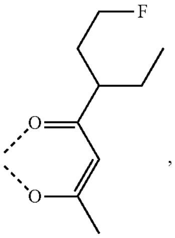
,
$L_{b162}$
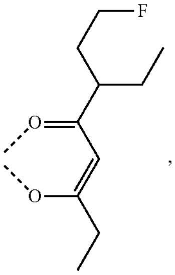
,
$L_{b163}$
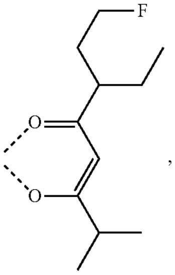
,
$L_{b164}$
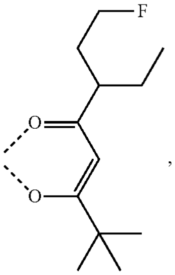
,
$L_{b165}$
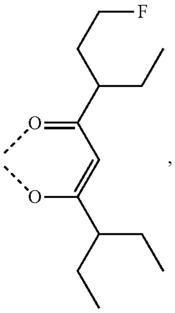
,
-continued
$L_{b166}$
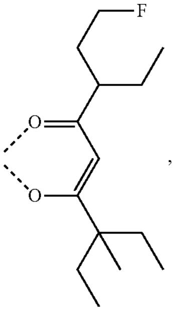
,
$L_{b167}$
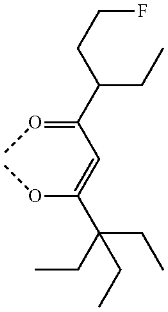
,
$L_{b168}$
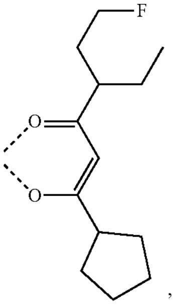
,
$L_{b169}$
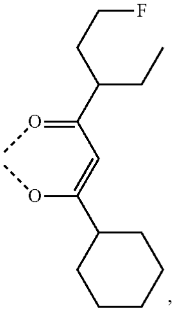
,
$L_{b170}$
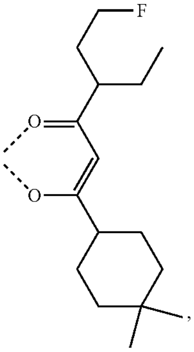
, $L_{b171}$
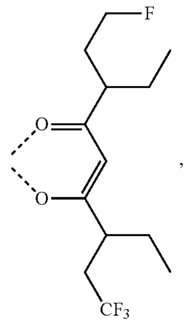
,
$L_{b172}$
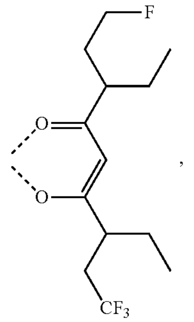
,
$L_{b173}$
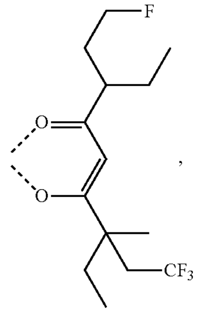
,
$L_{b174}$
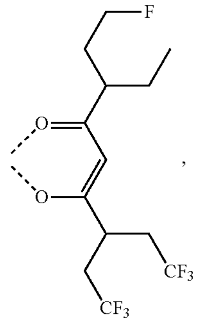
,
$L_{b175}$
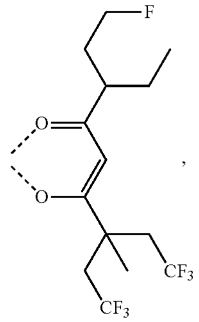
,
$L_{b176}$
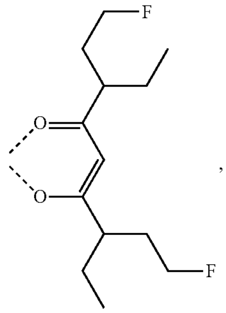
,
$L_{b177}$
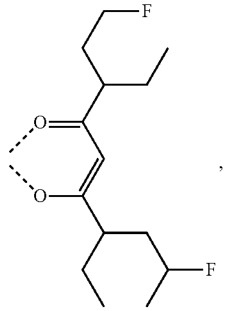
,
$L_{b178}$
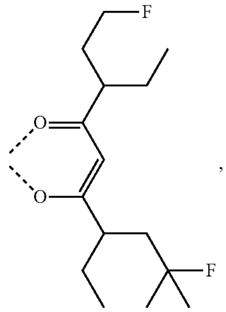
,
$L_{b179}$
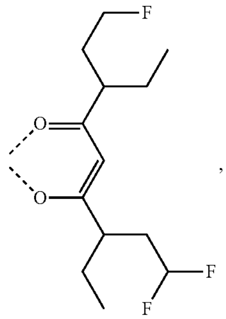
,
$L_{b180}$
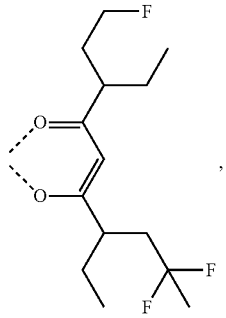
, -continued
$L_{b181}$
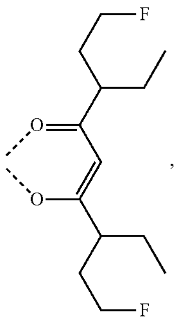
,
$L_{b182}$
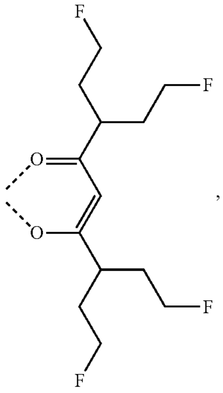
,
$L_{b183}$
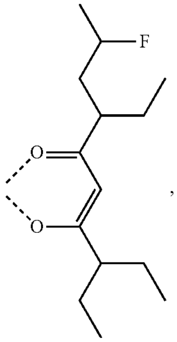
,
$L_{b184}$
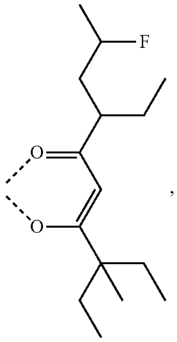
,
-continued
$L_{b185}$
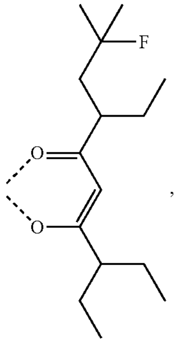
,
$L_{b186}$
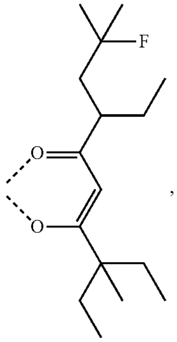
,
$L_{b187}$
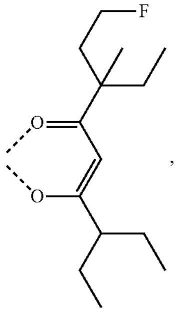
,
$L_{b188}$
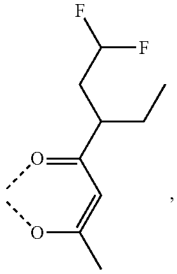
,
$L_{b189}$
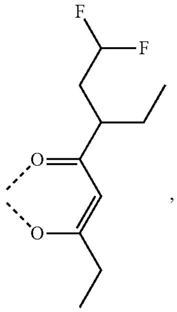
, -continued
$L_{b190}$
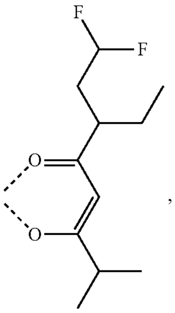
,
$L_{b191}$
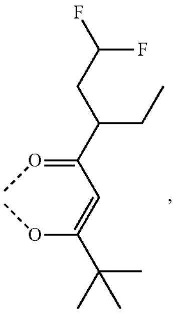
,
$L_{b192}$
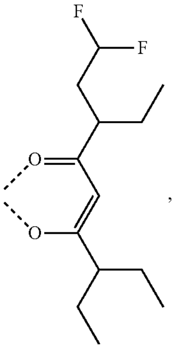
,
$L_{b193}$
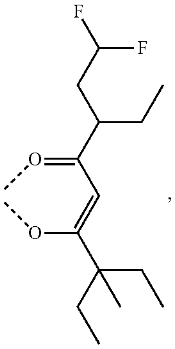
,
-continued
$L_{b194}$
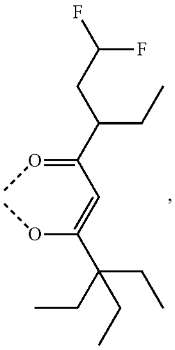
,
$L_{b195}$
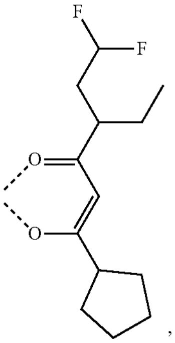
,
$L_{b196}$
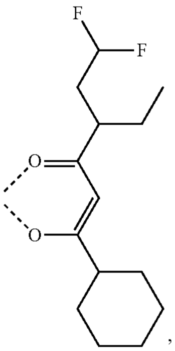
,
$L_{b197}$
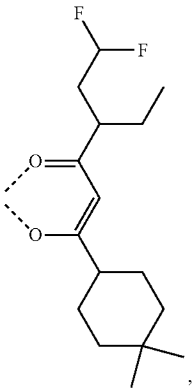
, -continued
$L_{b198}$
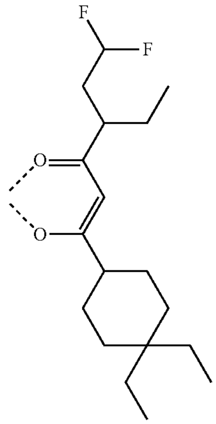
,
$L_{b199}$
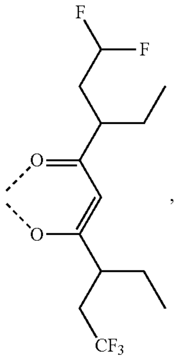
,
$L_{b200}$
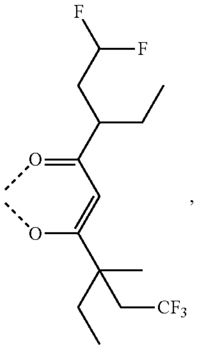
,
$L_{b201}$
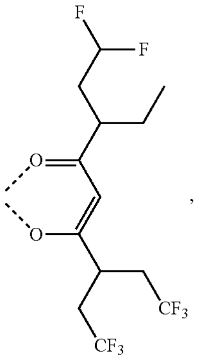
,
-continued
$L_{b202}$
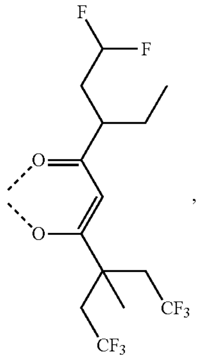
,
$L_{b203}$
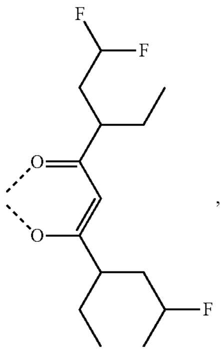
,
$L_{b204}$
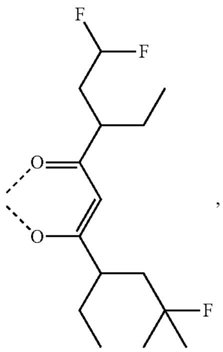
,
$L_{b205}$
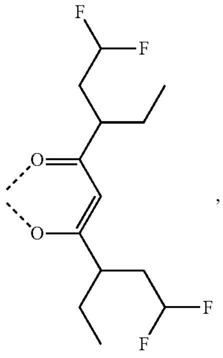
, -continued
$L_{b206}$
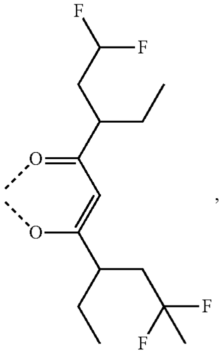
,
$L_{b207}$
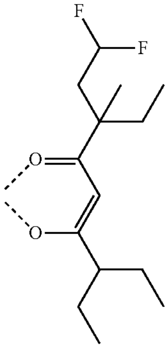
,
$L_{b208}$
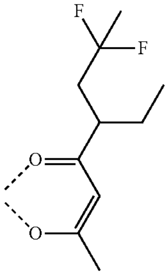
,
$L_{b209}$
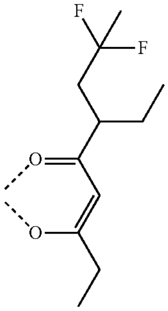
,
$L_{b210}$
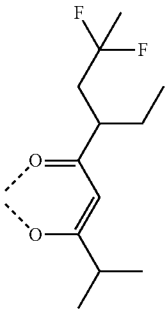
,
-continued
$L_{b211}$
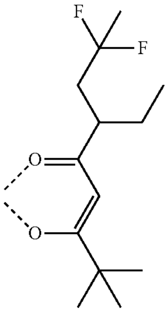
,
$L_{b212}$
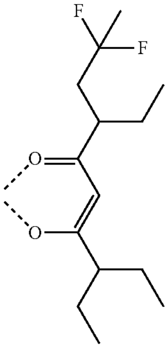
,
$L_{b213}$
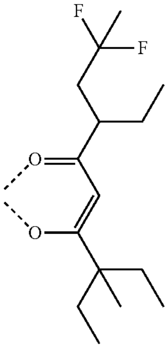
,
$L_{b214}$
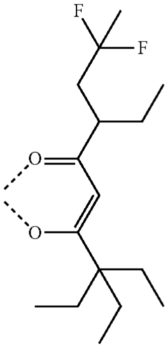
, -continued
$L_{b215}$
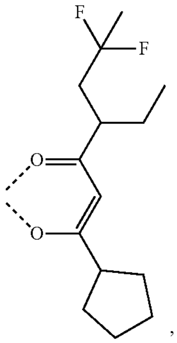
,
$L_{b216}$
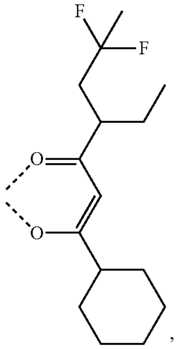
,
$L_{b217}$
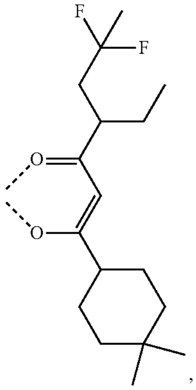
,
$L_{b218}$
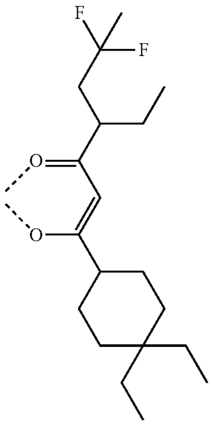
,
-continued
$L_{b219}$
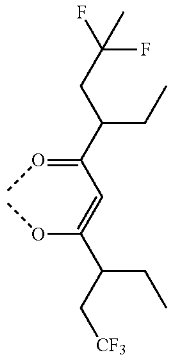
,
$L_{b220}$
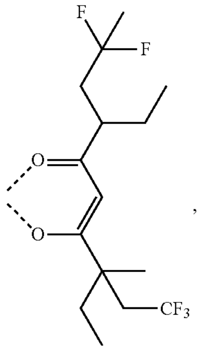
,
$L_{b221}$
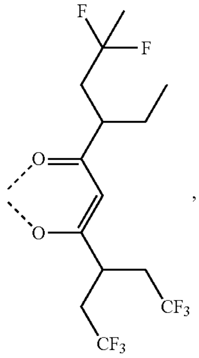
,
$L_{b222}$
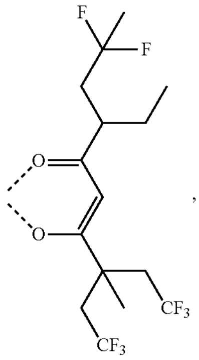
, -continued
L$_{b223}$
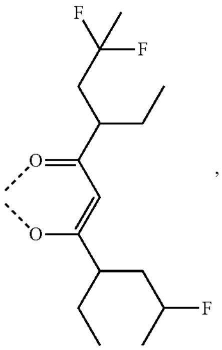
,
L$_{b224}$
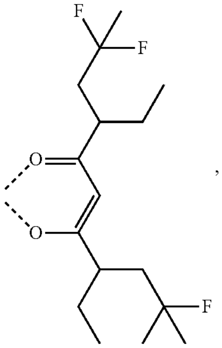
,
L$_{b225}$
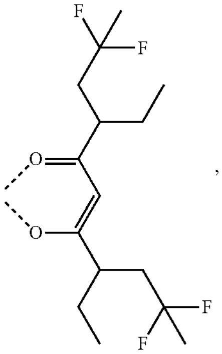
,
L$_{b226}$
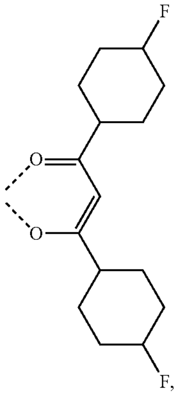
-continued
L$_{b227}$
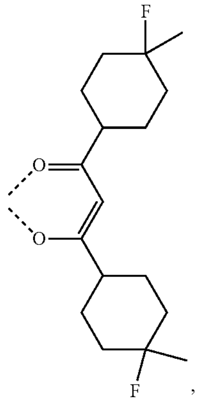
,
L$_{b228}$
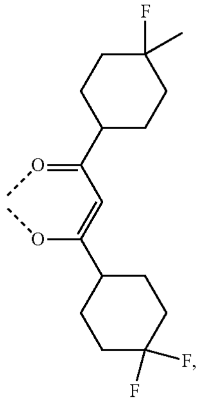
L$_{b229}$
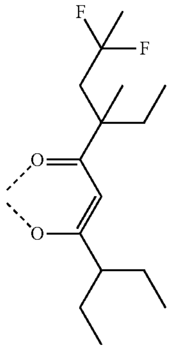
,
L$_{b230}$
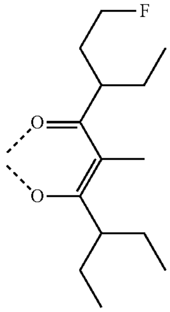
, -continued
$L_{b231}$
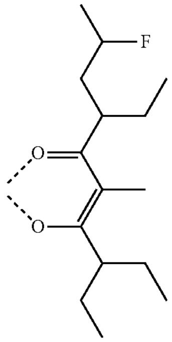
,
$L_{b232}$
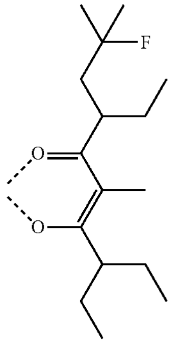
,
$L_{b233}$
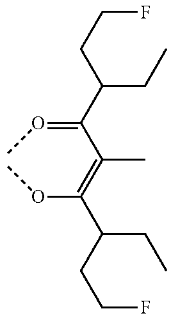
,
$L_{b234}$
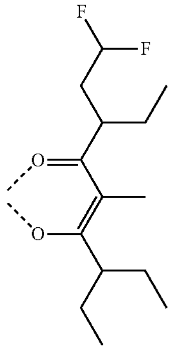
,
-continued
$L_{b235}$
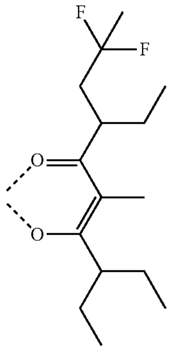
,
$L_{b236}$
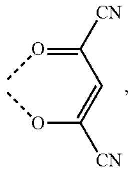
,
$L_{b237}$
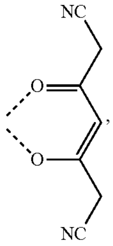
,
$L_{b238}$
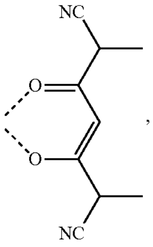
,
$L_{b239}$
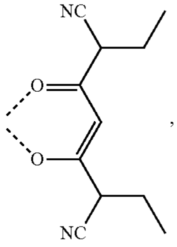
,
$L_{b240}$
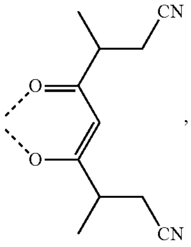
, -continued
$L_{b241}$
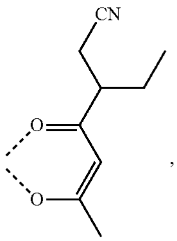
,
$L_{b242}$
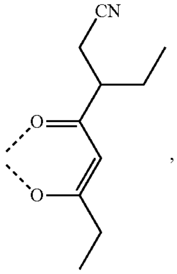
,
$L_{b243}$
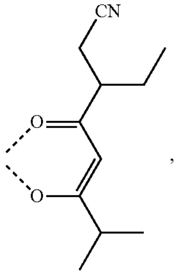
,
$L_{b244}$
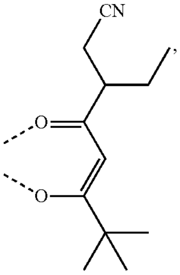
$L_{b245}$
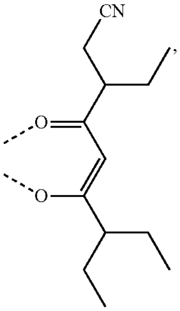
-continued
$L_{b246}$
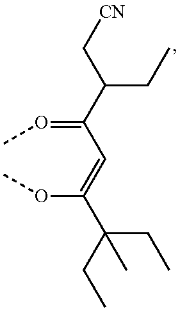
$L_{b247}$
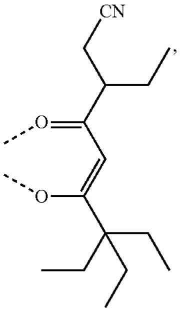
$L_{b248}$
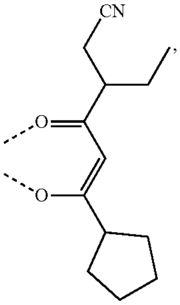
$L_{b249}$
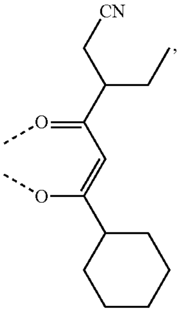
$L_{b250}$
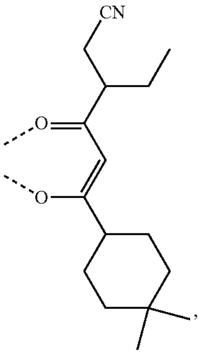

-continued
$L_{b251}$
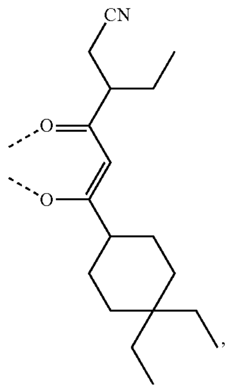
$L_{b252}$
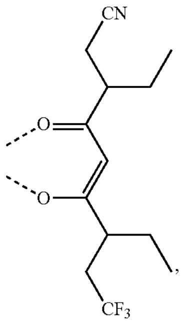
$L_{b253}$
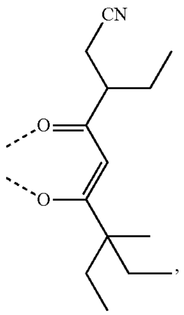
$L_{b254}$
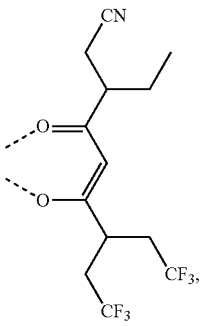
-continued
$L_{b255}$
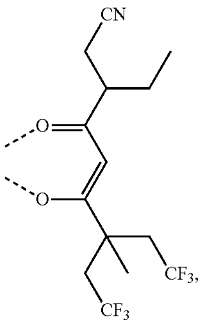
$L_{b256}$
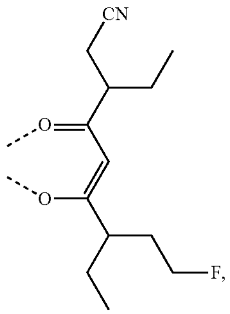
$L_{b257}$
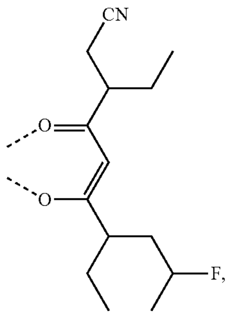
$L_{b258}$
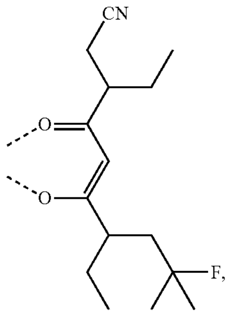
$L_{b259}$
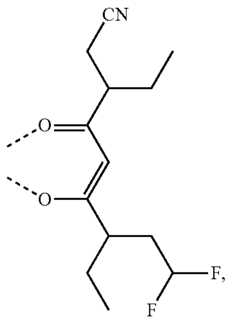

$L_{b260}$
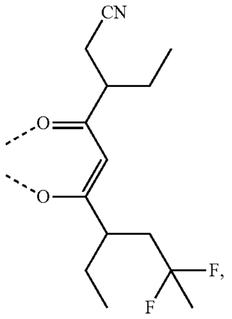
$L_{b261}$
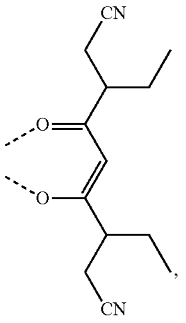
$L_{b262}$
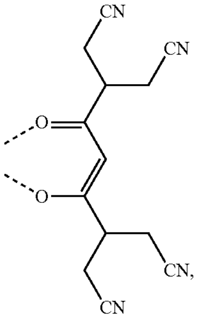
$L_{b263}$
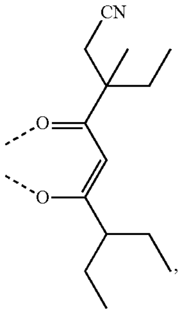
$L_{b264}$
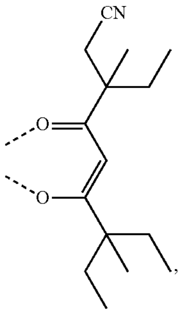
$L_{b265}$
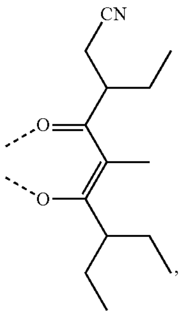
$L_{b266}$
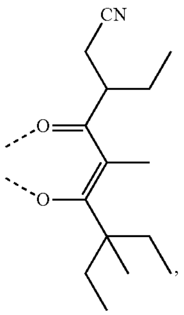
$L_{b267}$
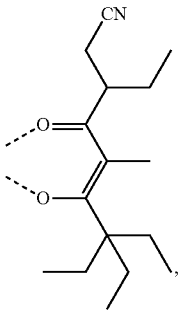
$L_{b268}$
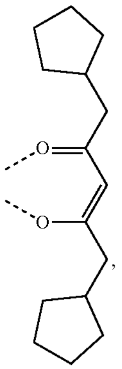

-continued
$L_{b269}$
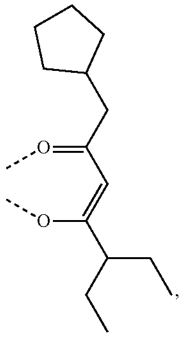
$L_{b270}$
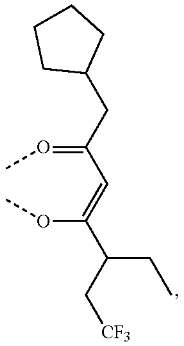
$L_{b271}$
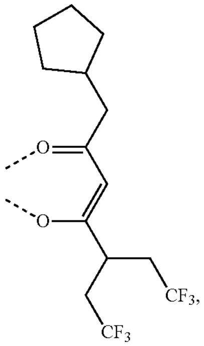
$L_{b272}$
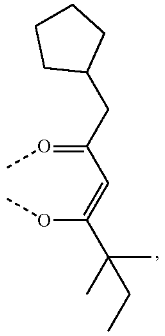
-continued
$L_{b273}$
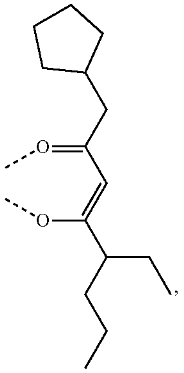
$L_{b274}$
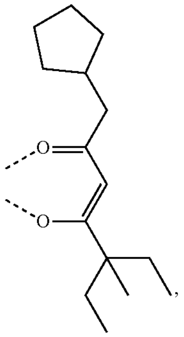
$L_{b275}$
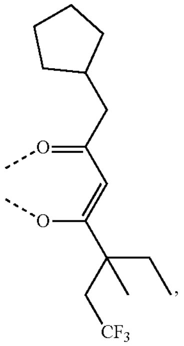
$L_{b276}$
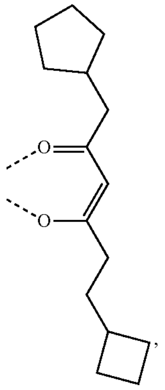

L$_{b277}$
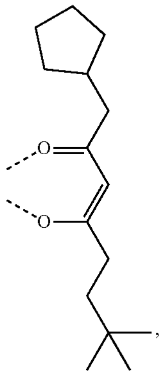
L$_{b278}$
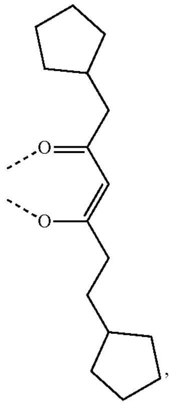
L$_{b279}$
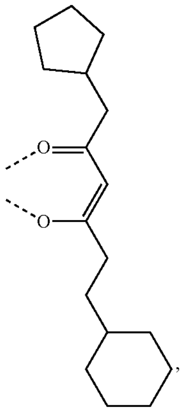
L$_{b280}$
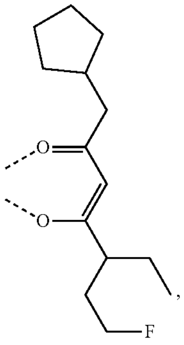
L$_{b281}$
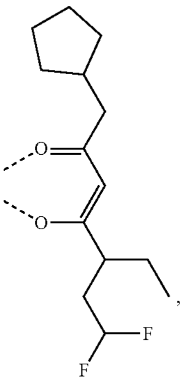
L$_{b282}$
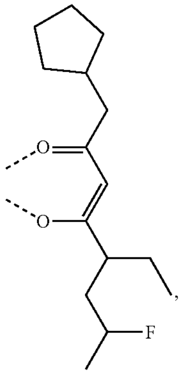
L$_{b283}$
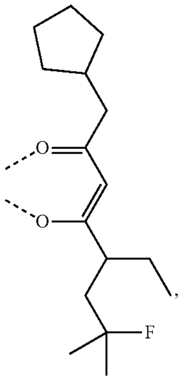
L$_{b284}$
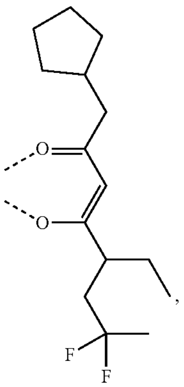

-continued
$L_{b285}$
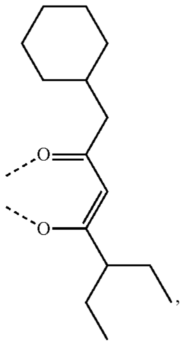
$L_{b286}$
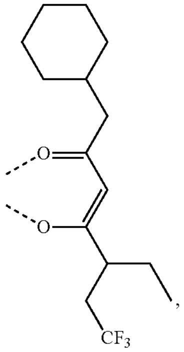
$L_{b287}$
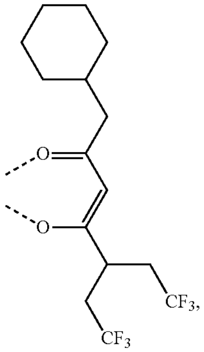
$L_{b288}$
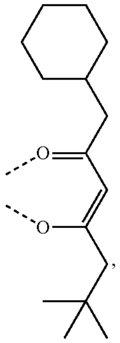
-continued
$L_{b289}$
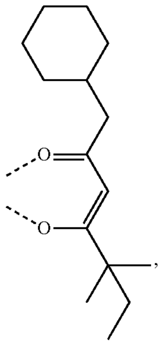
$L_{b290}$
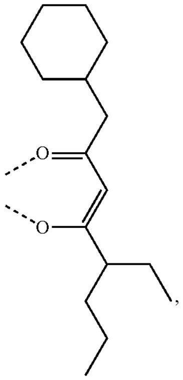
$L_{b291}$
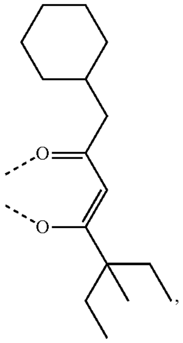
$L_{b292}$
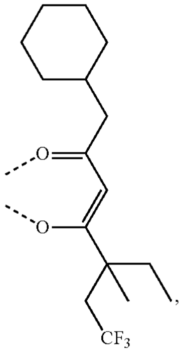

-continued
L$_{b293}$
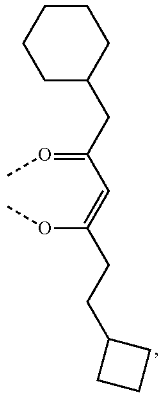
L$_{b294}$
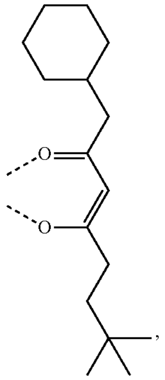
L$_{b295}$
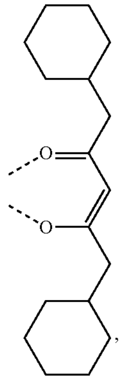
L$_{b296}$
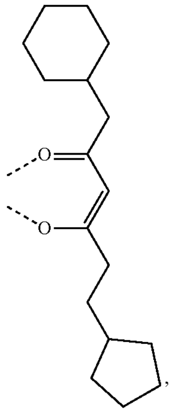
-continued
L$_{b297}$
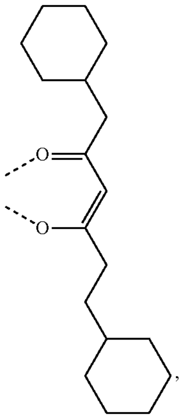
L$_{b298}$
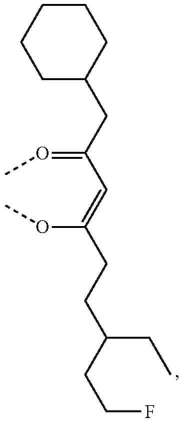
L$_{b299}$
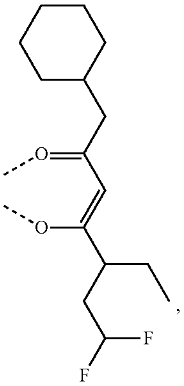
L$_{b300}$
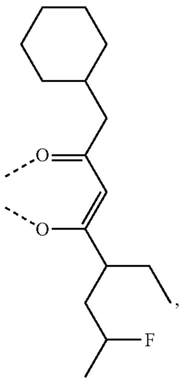

-continued
$L_{b301}$
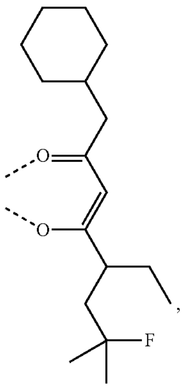
$L_{b302}$
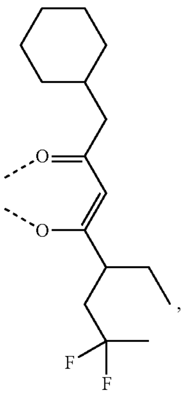
$L_{b303}$
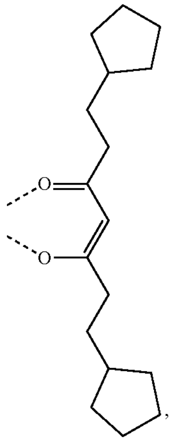
$L_{b304}$
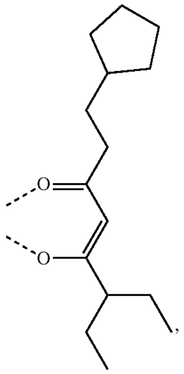
-continued
$L_{b305}$
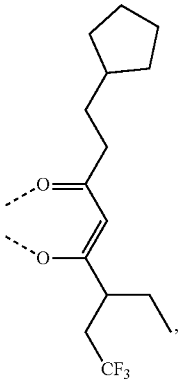
$L_{b306}$
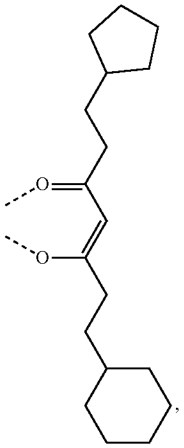
$L_{b307}$
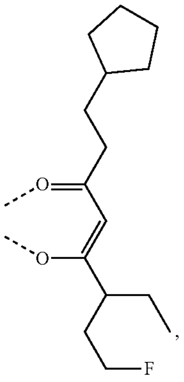
$L_{b308}$
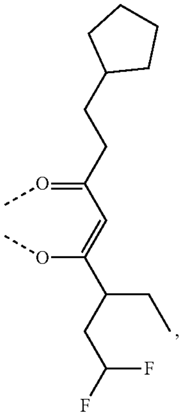

-continued
L$_{b309}$
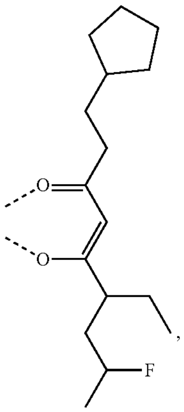
L$_{b310}$
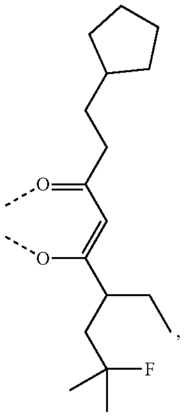
L$_{b311}$
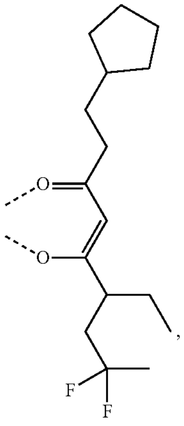
-continued
L$_{b312}$
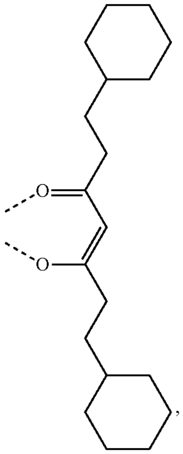
L$_{b313}$
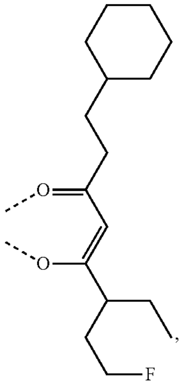
L$_{b314}$
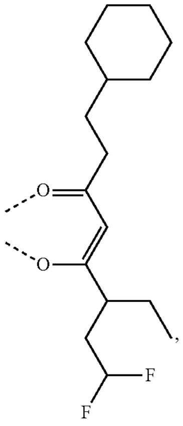

$L_{b315}$
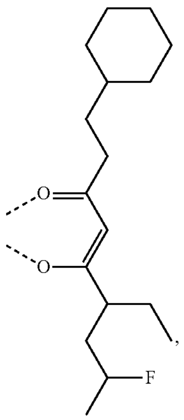
$L_{b316}$
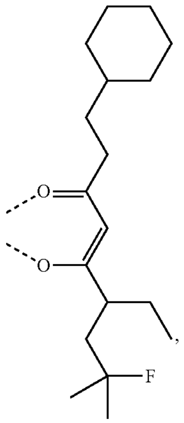
$L_{b317}$
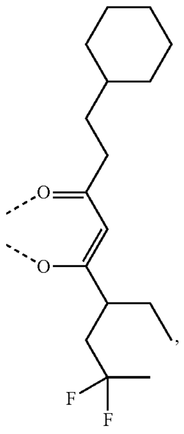
$L_{b318}$
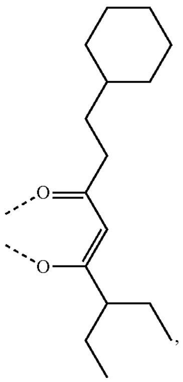
$L_{b319}$
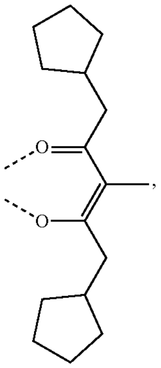
$L_{b320}$
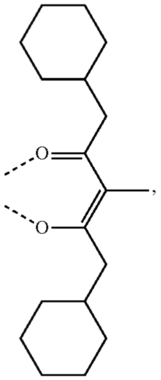
$L_{b321}$
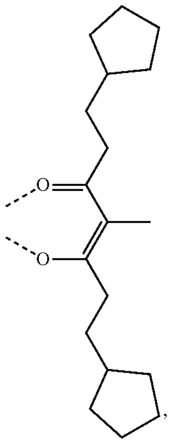
and -continued
$L_{b322}$
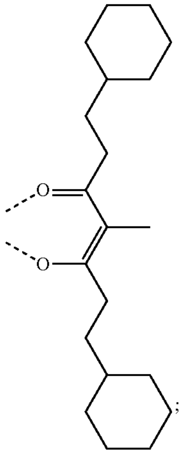
;
$L_{c1}$ to $L_{c68}$, $L_{c70}$, $L_{c72}$, $L_{c74}$, $L_{c76}$, $L_{c78}$, $L_{c80}$, $L_{c82}$, $L_{c84}$ to $L_{c231}$ are as follows:
$L_{c1}$
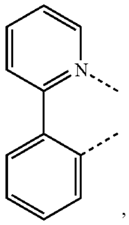
,
$L_{c2}$
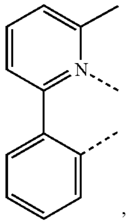
,
$L_{c3}$
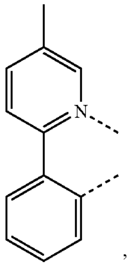
,
$L_{c4}$
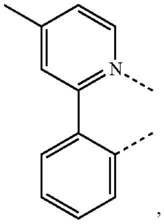
,
-continued
$L_{c5}$
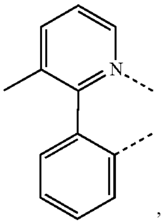
,
$L_{c6}$
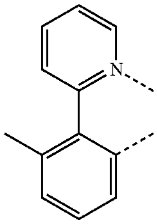
,
$L_{c7}$
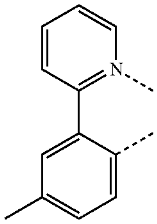
,
$L_{c8}$
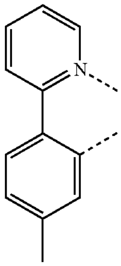
,
$L_{c9}$
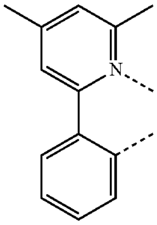
,
$L_{c10}$
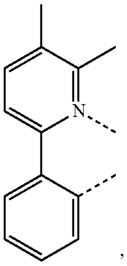
, -continued
$L_{c11}$
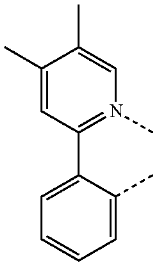
,
$L_{c12}$
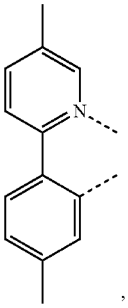
,
$L_{c13}$
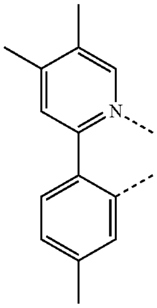
,
$L_{c14}$
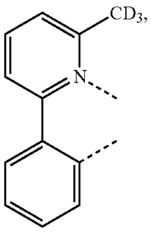
$L_{c15}$
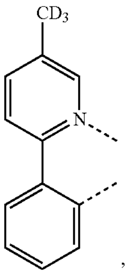
,
-continued
$L_{c16}$
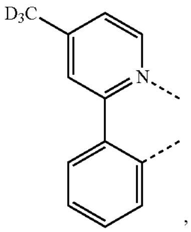
,
$L_{c17}$
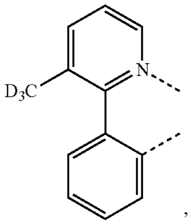
,
$L_{c18}$
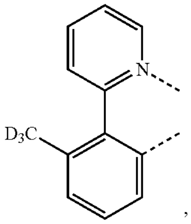
,
$L_{c19}$
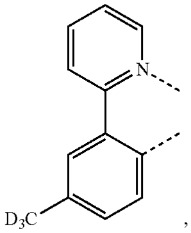
,
$L_{c20}$
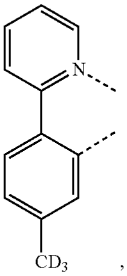
,
$L_{c21}$
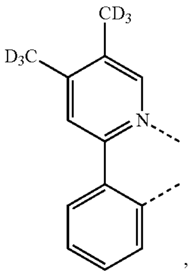
, -continued
$L_{c22}$
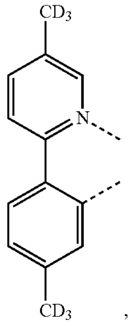
,
$L_{c23}$
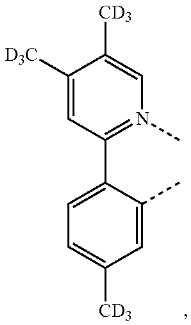
,
$L_{c24}$
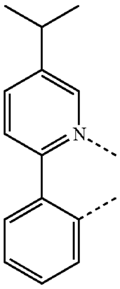
,
$L_{c25}$
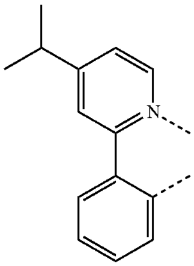
,
$L_{c26}$
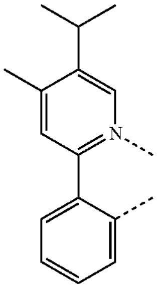
,
-continued
$L_{c27}$
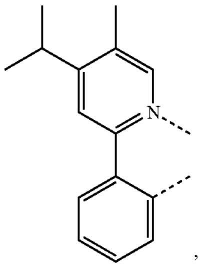
,
$L_{c28}$
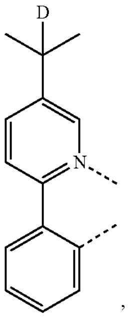
,
$L_{c29}$
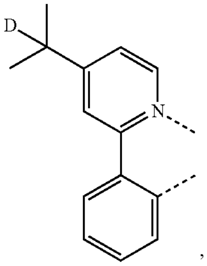
,
$L_{c30}$
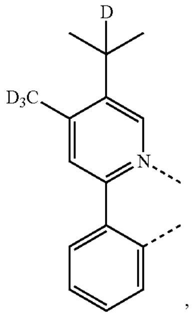
,
$L_{c31}$
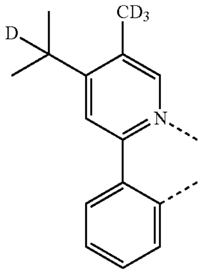
, -continued
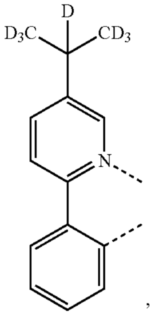
, $L_{c32}$
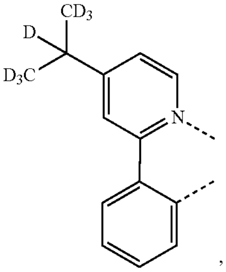
, $L_{c33}$
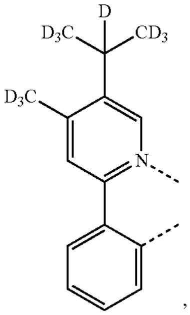
, $L_{c34}$
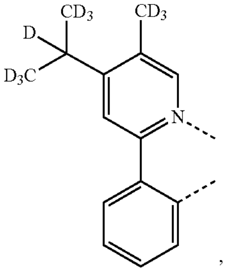
, $L_{c35}$
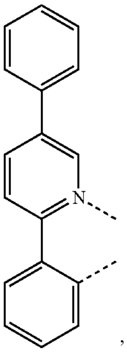
, $L_{c36}$
-continued
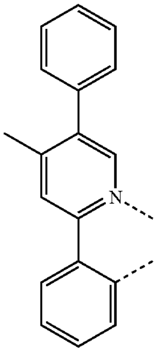
, $L_{c37}$
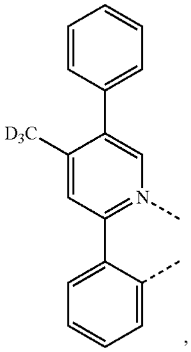
, $L_{c38}$
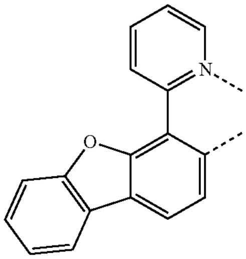
, $L_{c39}$
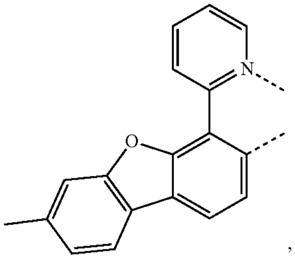
, $L_{c40}$
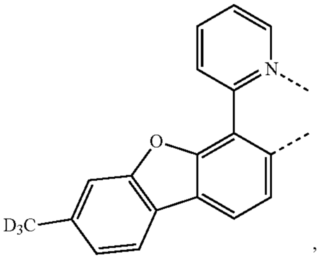
, $L_{c41}$ -continued
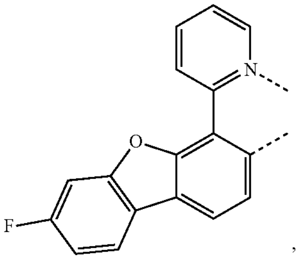
$L_{c42}$
,
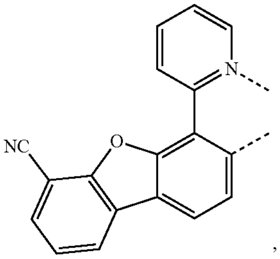
$L_{c43}$
,
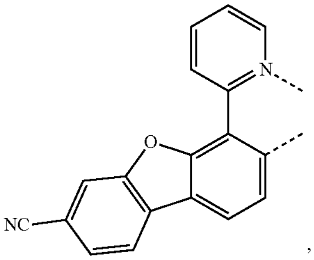
$L_{c44}$
,
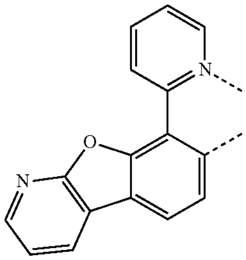
$L_{c45}$
,
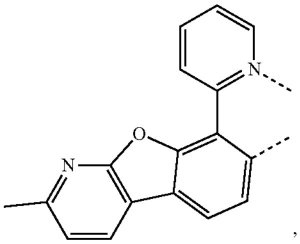
$L_{c46}$
,
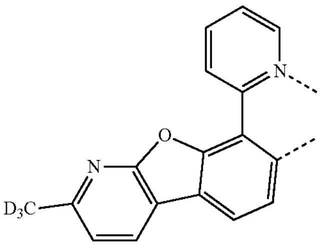
$L_{c47}$
,
-continued
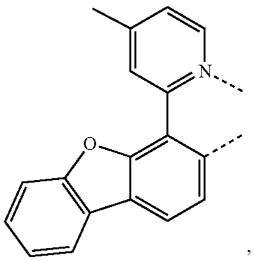
$L_{c48}$
,
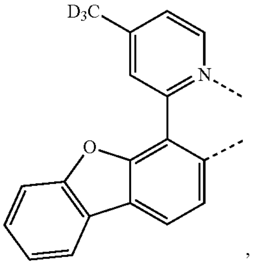
$L_{c49}$
,
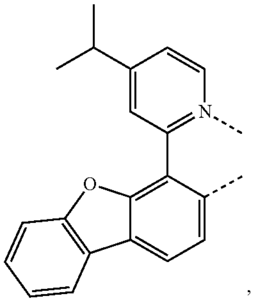
$L_{c50}$
,
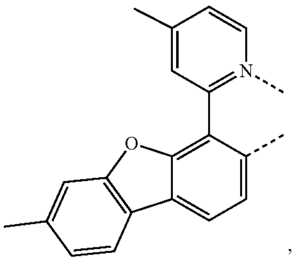
$L_{c51}$
,
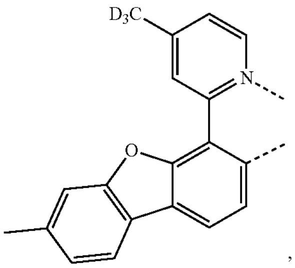
$L_{c52}$
, -continued
$L_{c53}$
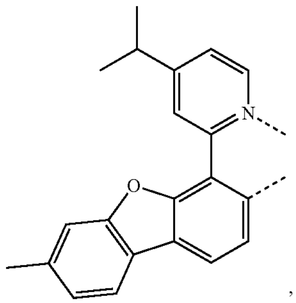
,
$L_{c54}$
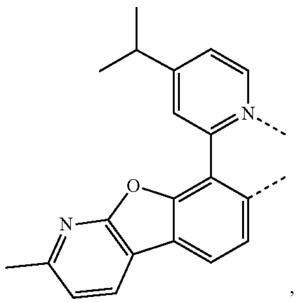
,
$L_{c55}$
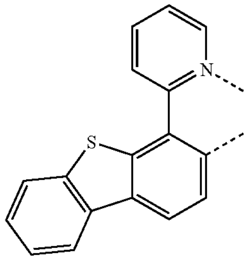
,
$L_{c56}$
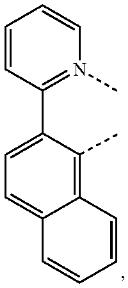
,
$L_{c57}$
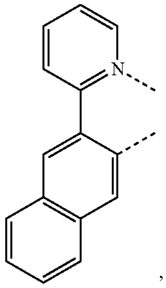
,
-continued
$L_{c58}$
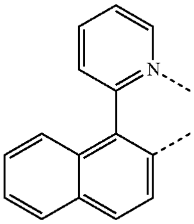
,
$L_{c59}$
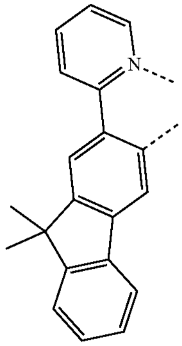
,
$L_{c60}$
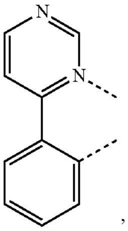
,
$L_{c61}$
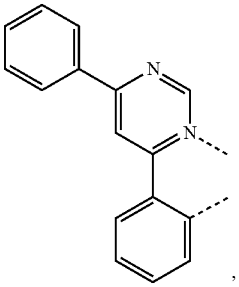
,
$L_{c62}$
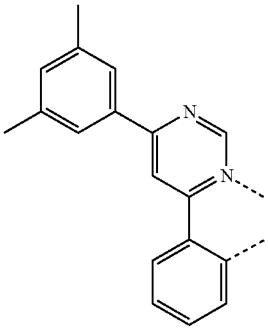
, -continued
$L_{c63}$
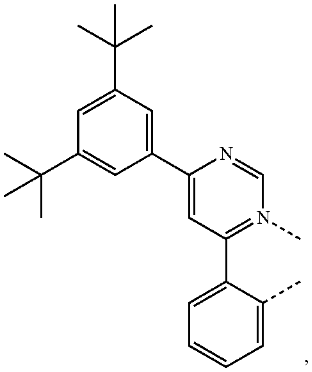
,
$L_{c64}$
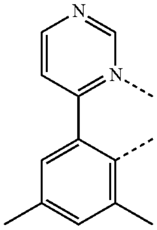
,
$L_{c65}$
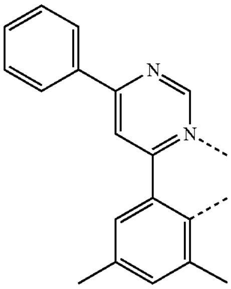
,
$L_{c66}$
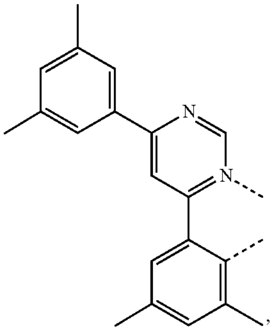
,
$L_{c67}$
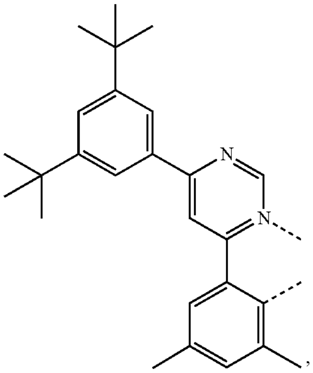
,
-continued
$L_{c68}$
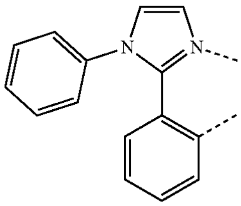
,
$L_{c70}$
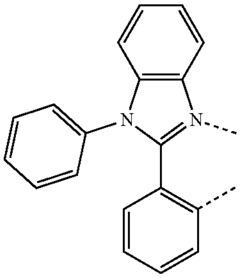
,
$L_{c72}$
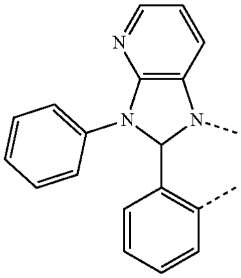
,
$L_{c74}$
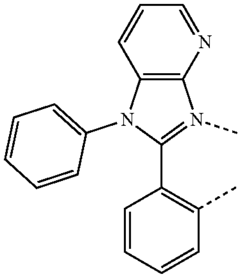
,
$L_{c76}$
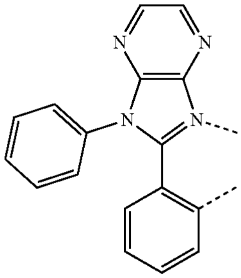
, -continued
$L_{c78}$
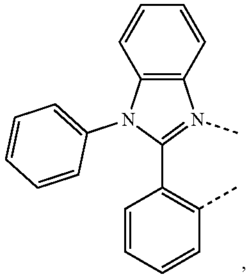
,
$L_{c80}$
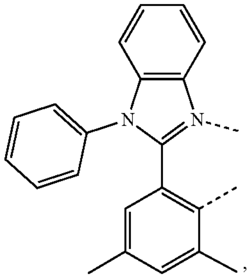
,
$L_{c82}$
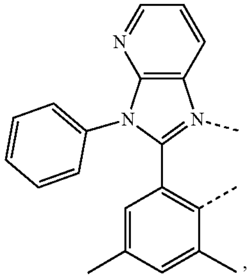
,
$L_{c84}$
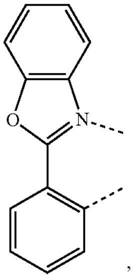
,
$L_{c85}$
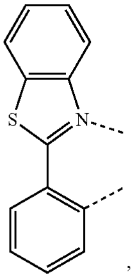
,
-continued
$L_{c86}$
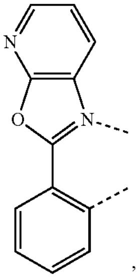
,
$L_{c87}$
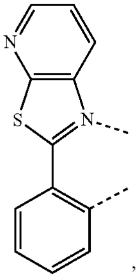
,
$L_{c88}$
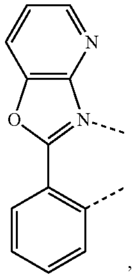
,
$L_{c89}$
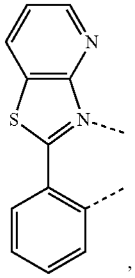
,
$L_{c90}$
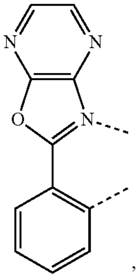
, -continued
Lc91
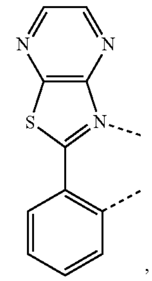
,
Lc92
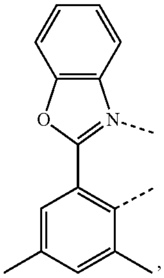
,
Lc93
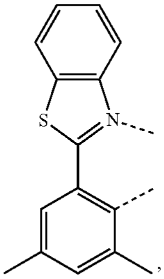
,
Lc94
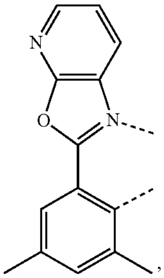
,
Lc95
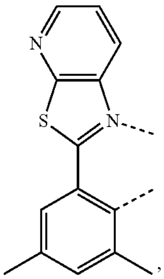
,
-continued
Lc96
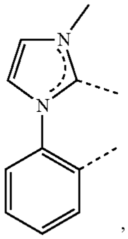
,
Lc97
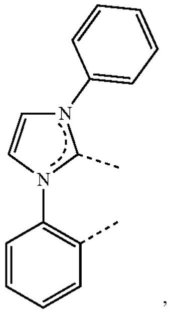
,
Lc98
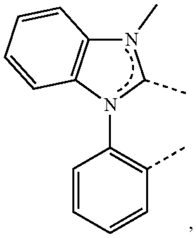
,
Lc99
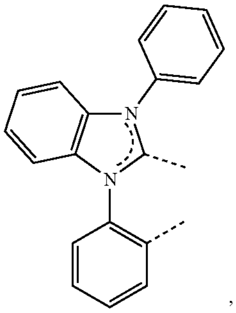
,
Lc100
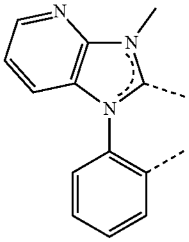
, -continued
$L_{c101}$
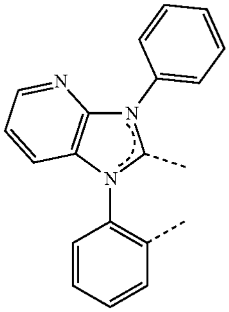
,
$L_{c102}$
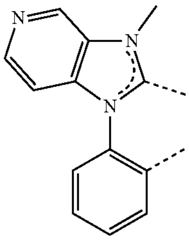
,
$L_{c103}$
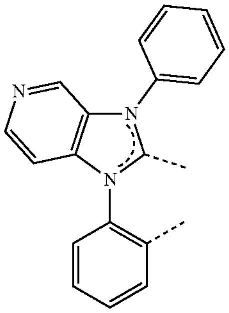
,
$L_{c104}$
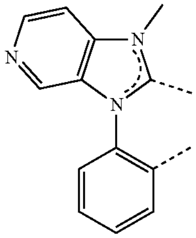
,
$L_{c105}$
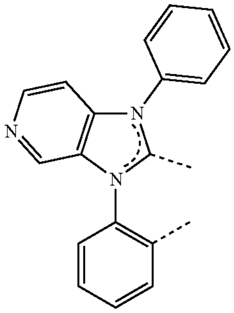
,
-continued
$L_{c106}$
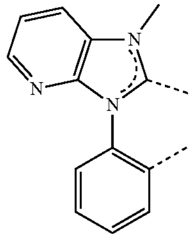
,
$L_{c107}$
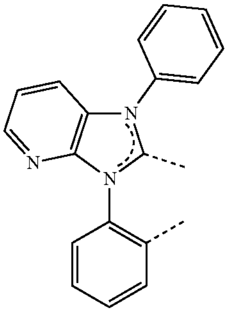
,
$L_{c108}$
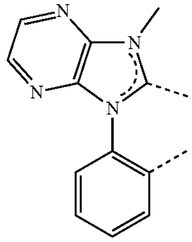
,
$L_{c109}$
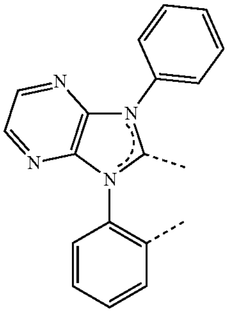
,
$L_{c110}$
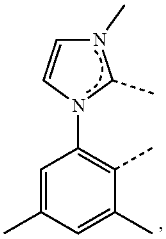
, -continued
$L_{c111}$
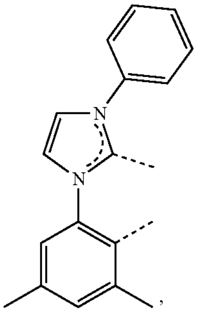
,
$L_{c112}$
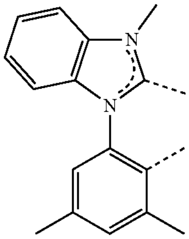
,
$L_{c113}$
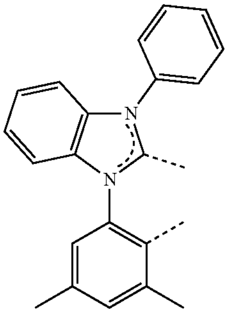
,
$L_{c114}$
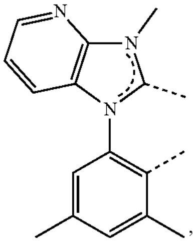
,
$L_{c115}$
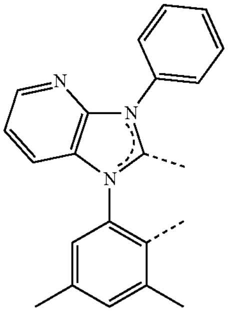
,
-continued
$L_{c116}$
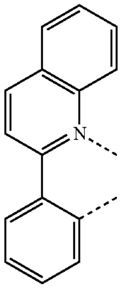
,
$L_{c117}$
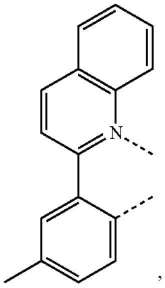
,
$L_{c118}$
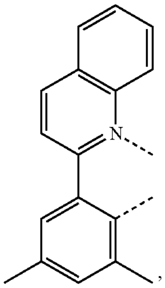
,
$L_{c119}$
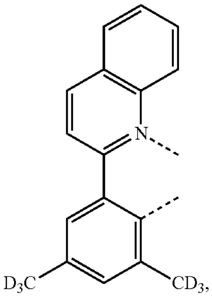
,
$L_{c120}$
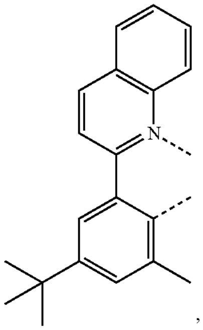
, -continued
$L_{c121}$
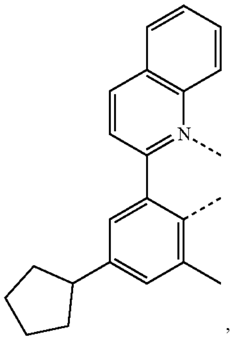
,
$L_{c122}$
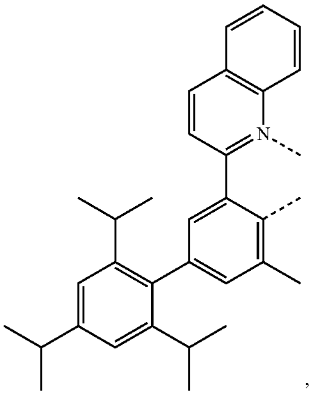
,
$L_{c123}$
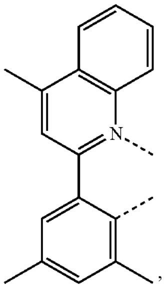
,
$L_{c124}$
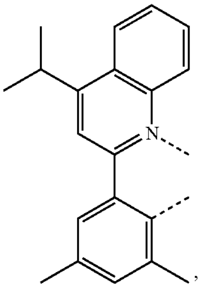
,
$L_{c125}$
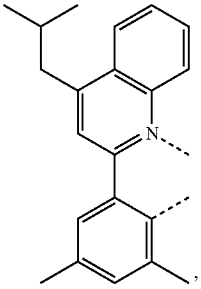
,
-continued
$L_{c126}$
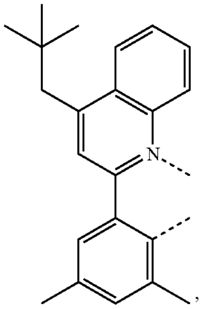
,
$L_{c127}$
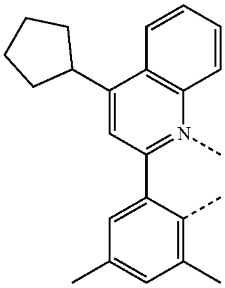
,
$L_{c128}$
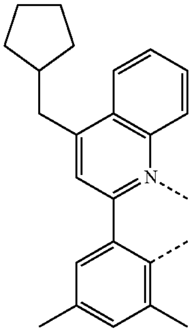
,
$L_{c129}$
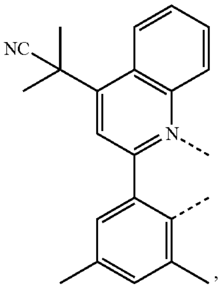
,
$L_{c130}$
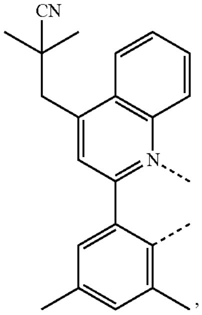
, -continued
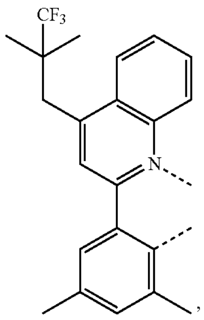
$L_{c131}$
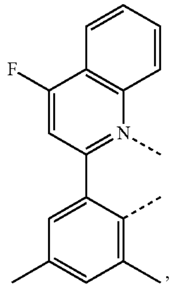
$L_{c132}$
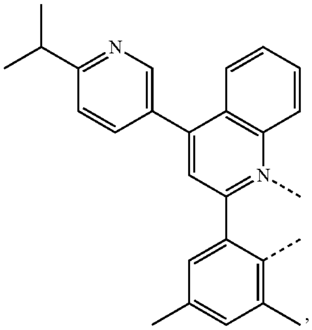
$L_{c133}$
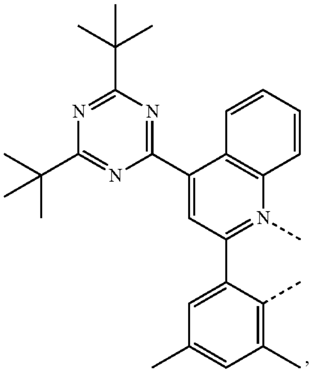
$L_{c134}$
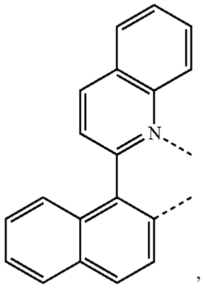
$L_{c135}$
-continued
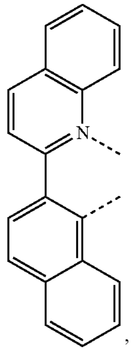
$L_{c136}$
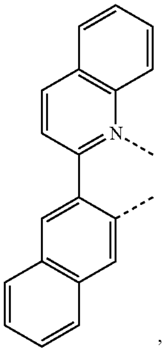
$L_{c137}$
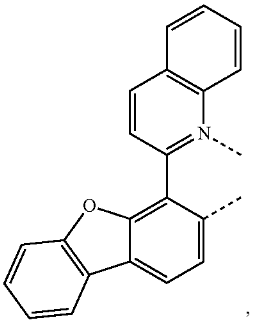
$L_{c138}$
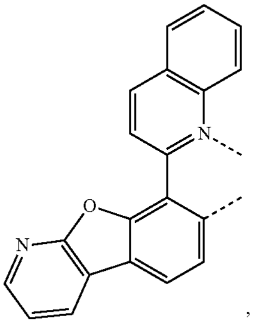
$L_{c139}$ -continued
$L_{c140}$
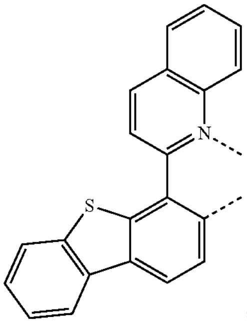
,
$L_{c141}$
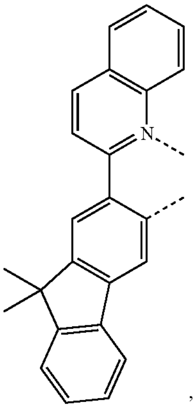
,
$L_{c142}$
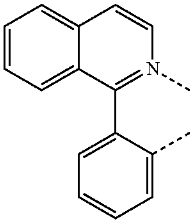
,
$L_{c143}$
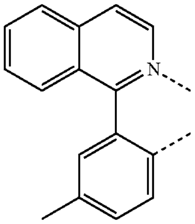
,
$L_{c144}$
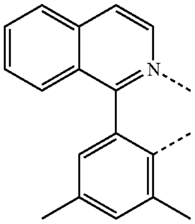
,
-continued
$L_{c145}$
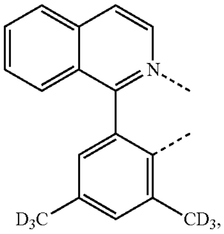
$L_{c146}$
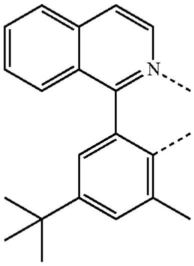
,
$L_{c147}$
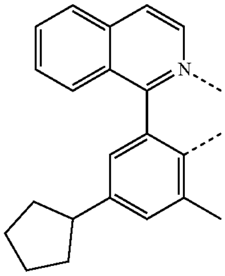
,
$L_{c148}$
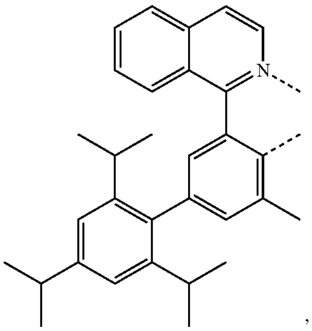
,
$L_{c149}$
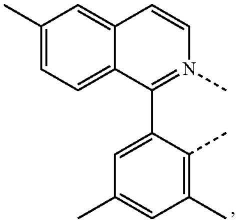
, -continued
$L_{c150}$
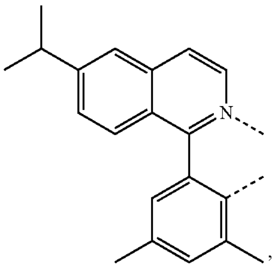
$L_{c151}$
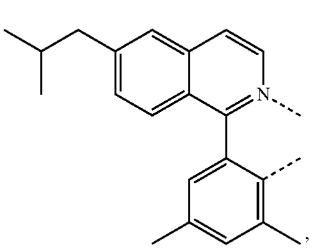
$L_{c152}$
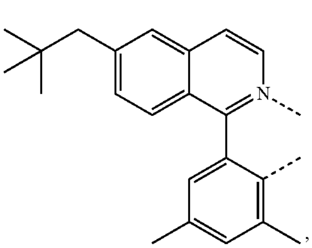
$L_{c153}$
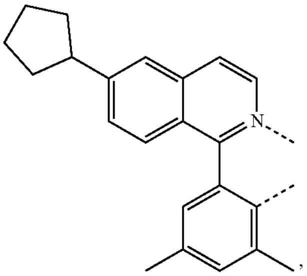
$L_{c154}$
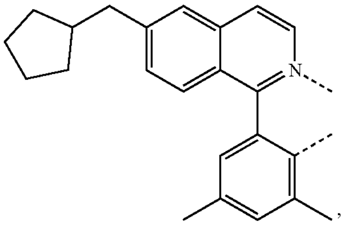
Lc155
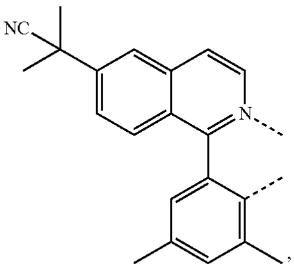
-continued
Lc156
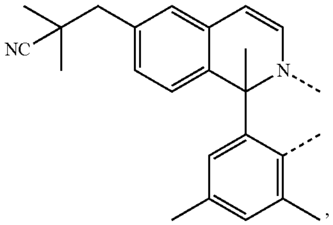
Lc157
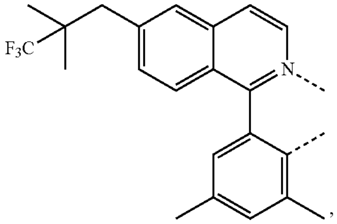
Lc158
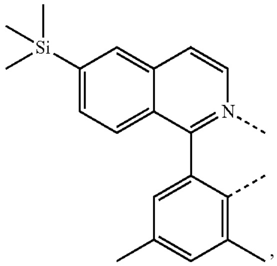
Lc159
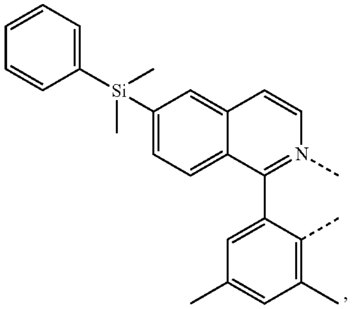
Lc160
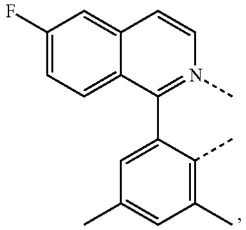
Lc161
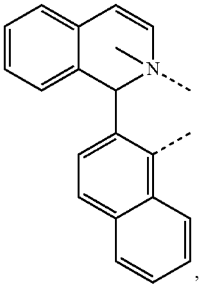

-continued
Lc162
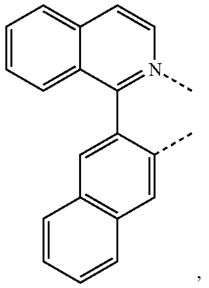
Lc163
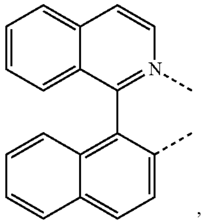
Lc164
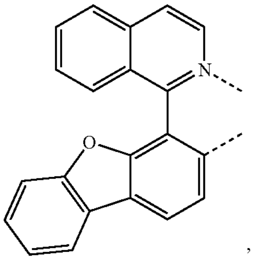
$L_{c165}$
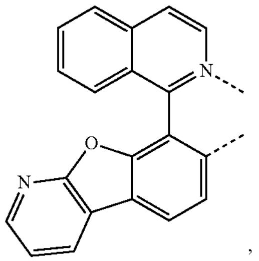
$L_{c166}$
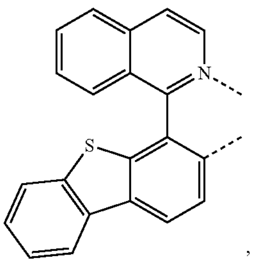
-continued
$L_{c167}$
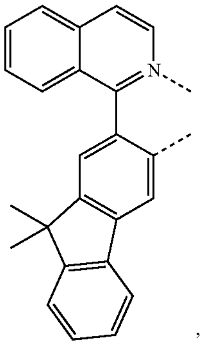
$L_{c168}$
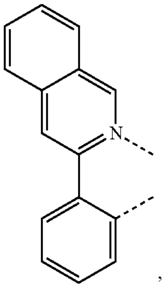
$L_{c169}$
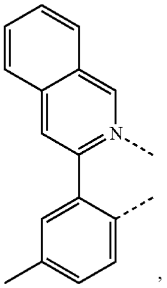
$L_{c170}$
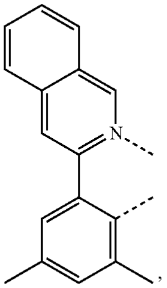
$L_{c171}$
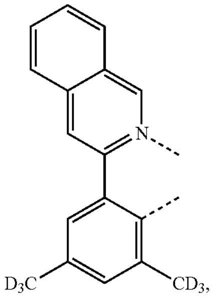

$L_{c172}$
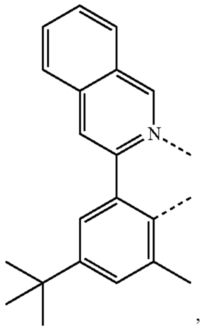
,
$L_{c173}$
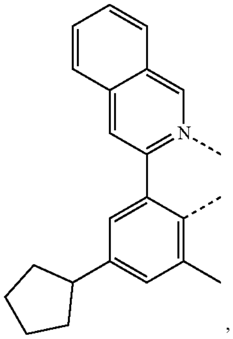
,
$L_{c174}$
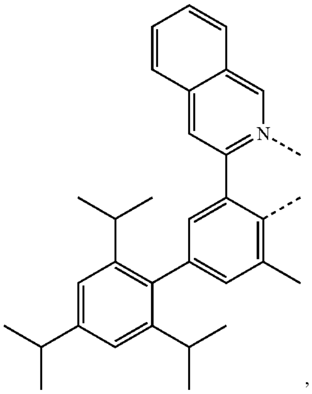
,
$L_{c175}$
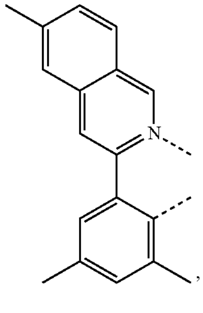
,
$L_{c176}$
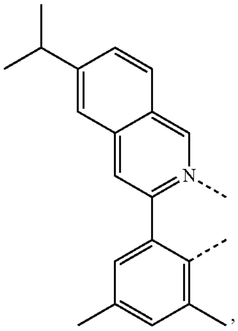
,
$L_{c177}$
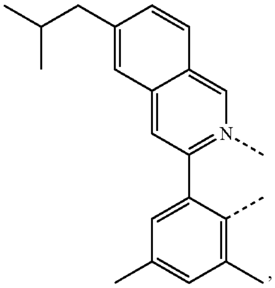
,
$L_{c178}$
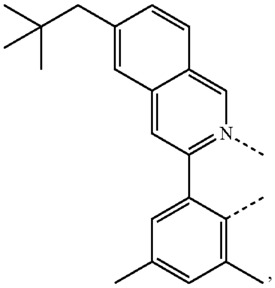
,
$L_{c179}$
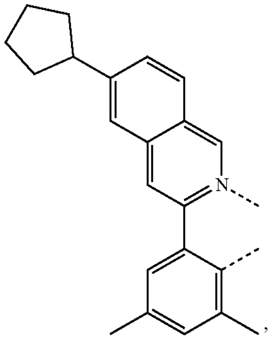
,
$L_{c180}$
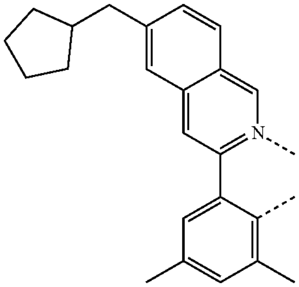
, -continued
$L_{c181}$
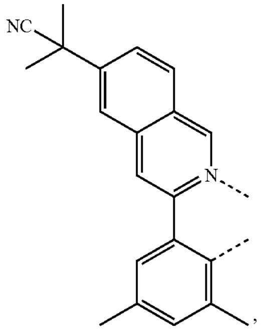
Lc182
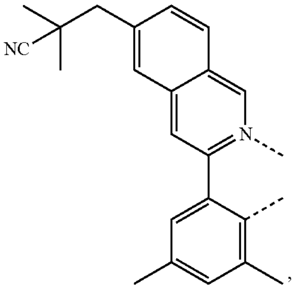
Lc183
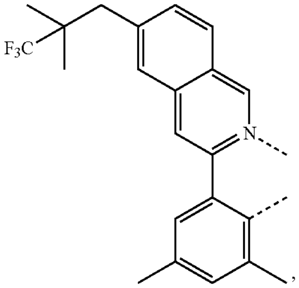
Lc184
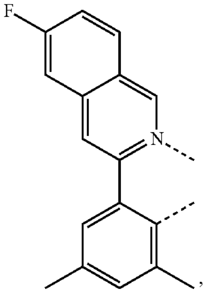
Lc185
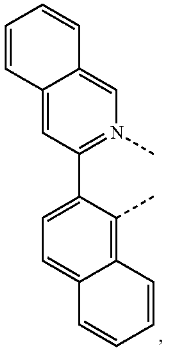
-continued
Lc186
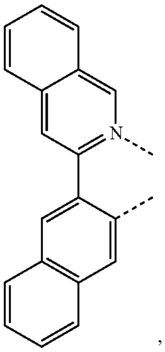
Lc187
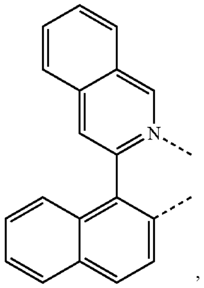
Lc188
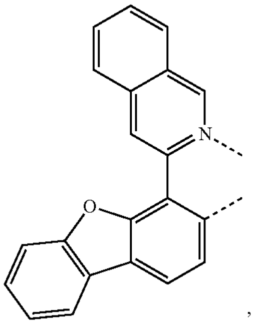
Lc189
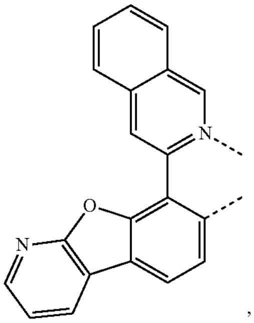
$L_{c190}$
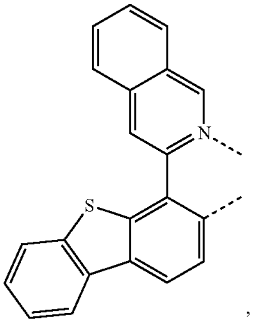

-continued
$L_{c191}$
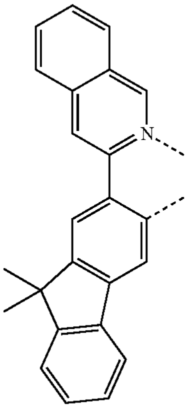
,
$L_{c192}$
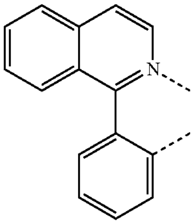
,
$L_{c193}$
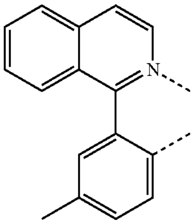
,
$L_{c194}$
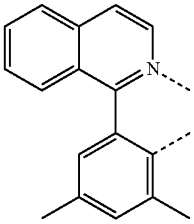
,
$L_{c195}$
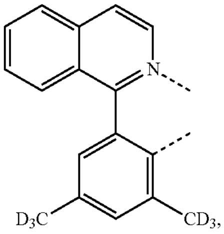
,
$L_{c196}$
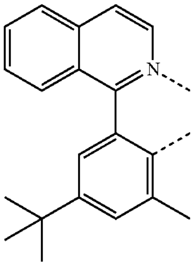
,
-continued
$L_{c197}$
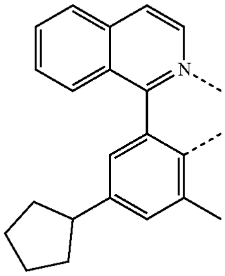
,
$L_{c198}$
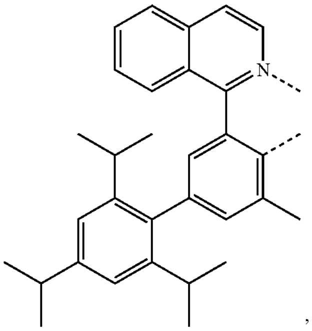
,
$L_{c199}$
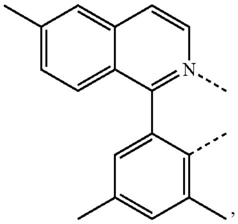
,
$L_{c200}$
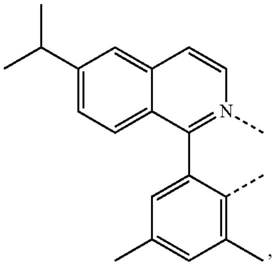
,
$L_{c201}$
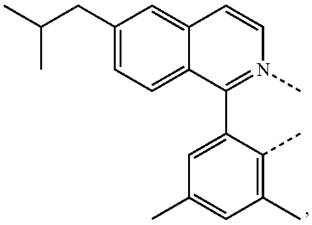
,
$L_{c202}$
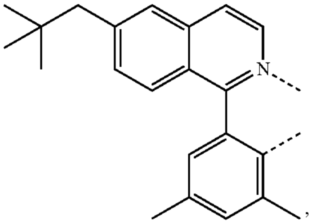
, -continued
$L_{c203}$
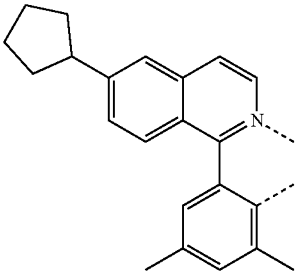
,
$L_{c204}$
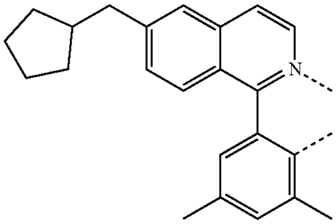
,
$L_{c205}$
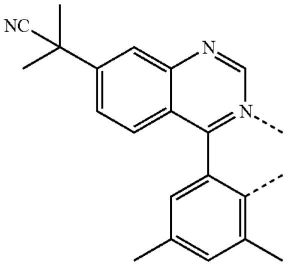
,
$L_{c206}$
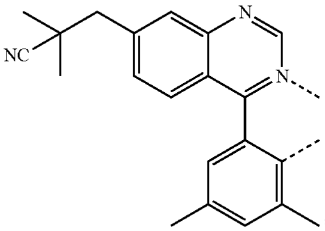
,
$L_{c207}$
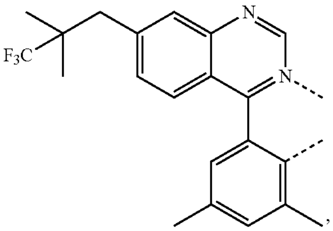
,
$L_{c208}$
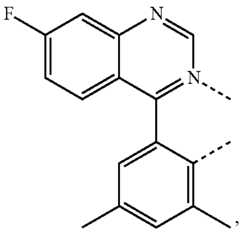
,
-continued
$L_{c209}$
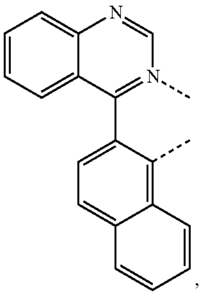
,
$L_{c210}$
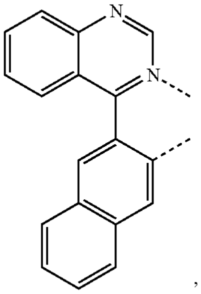
,
$L_{c211}$
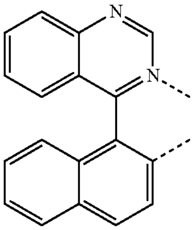
,
$L_{c212}$
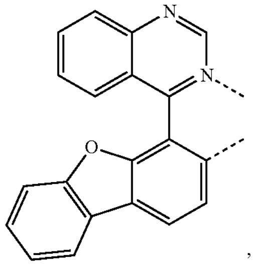
,
$L_{c213}$
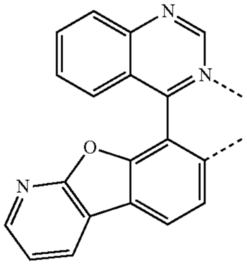
, -continued
$L_{c214}$
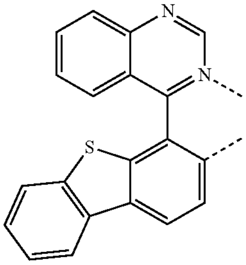
,
$L_{c215}$
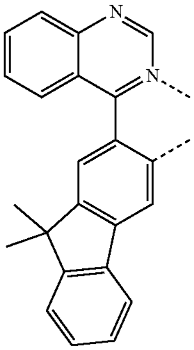
,
$L_{c216}$
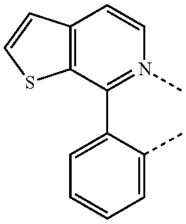
,
$L_{c217}$
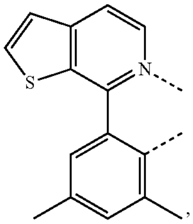
,
$L_{c218}$
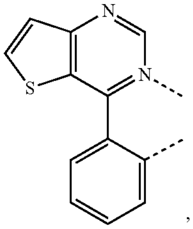
,
$L_{c219}$
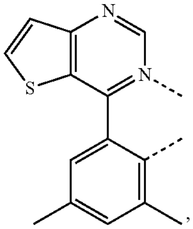
,
-continued
$L_{c220}$
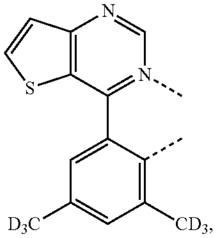
,
$L_{c221}$
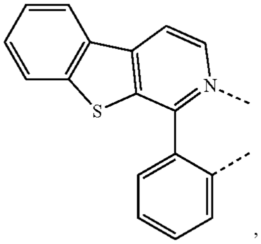
,
$L_{c222}$
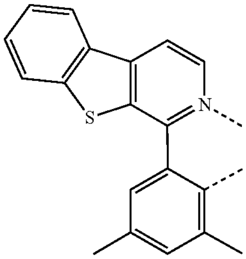
,
$L_{c223}$
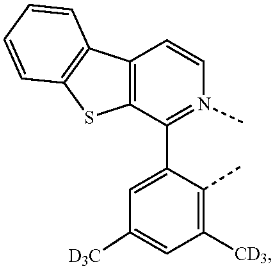
,
$L_{c224}$
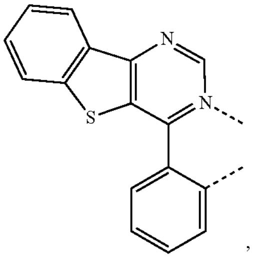
,
$L_{c225}$
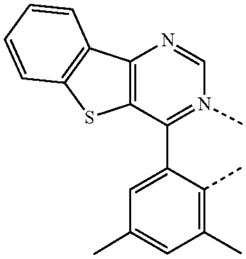
, -continued $L_{c226}$

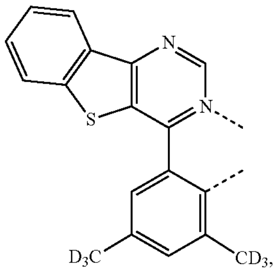

$L_{c227}$

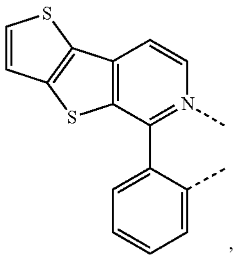

, $L_{c228}$

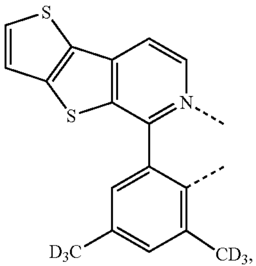

$L_{c229}$

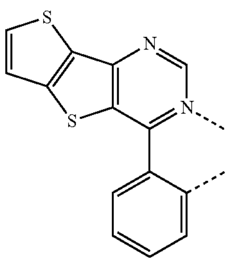

, $L_{c230}$

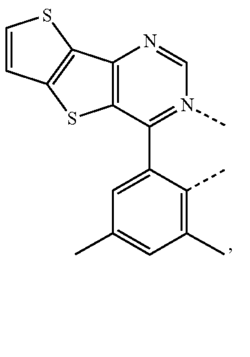

and

-continued $L_{c231}$

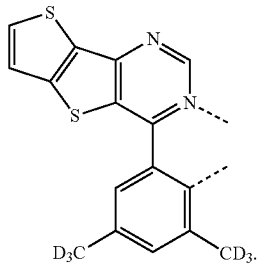

25. The metal complex of claim 24, wherein the metal complex is selected from the group consisting of Compound 1 to Compound 8, Compound 22, Compound 27, Compound 29, Compound 34 to Compound 36, Compound 39, Compound 40, Compound 42, Compound 43, Compound 46 to Compound 53, Compound 67, Compound 72, Compound 74, Compound 79 to Compound 81, Compound 84, Compound 85, Compound 87, Compound 88, Compound 91 to Compound 98, Compound 112, Compound 117, Compound 119, Compound 124 to Compound 126, Compound 129, Compound 130, Compound 132, Compound 133, Compound 136, Compound 140, Compound 144, and Compound 148, Compound 151, Compound 153 to Compound 155, Compound 158, Compound 161, Compound 163, Compound 165 to Compound 167, Compound 170, Compound 173, Compound 175, Compound 177 to Compound 179, Compound 182, Compound 185, Compound 187, Compound 189 to Compound 191, Compound 194, and Compound 199;

wherein Compound 1 to Compound 8, Compound 22, Compound 27, Compound 29,Compound 34 to Compound 36, Compound 39, Compound 40, Compound 42, Compound 43, Compound 46 to Compound 53, Compound 67, Compound 72, Compound 74, Compound 79 to Compound 81, Compound 84, Compound 85, Compound 87, Compound 88, Compound 91 to Compound 98, Compound 112, Compound 117, Compound 119, Compound 124 to Compound 126, Compound 129, Compound 130, Compound 132, Compound 133, Compound 136, Compound 140, Compound 144, and Compound 148 have a structure of $Ir(L_a)_2(L_b)$, wherein the two $L_a$ are the same, and $L_a$ and $L_b$ are respectively selected from the structures listed in the following table:

| Compound No. | $L_a$ | $L_b$ | Compound No. | $L_a$ | $L_b$ |
|---|---|---|---|---|---|
| 1 | $L_{a1}$ | $L_{b1}$ | 2 | $L_{a3}$ | $L_{b1}$ |
| 3 | $L_{a4}$ | $L_{b1}$ | 4 | $L_{a5}$ | $L_{b1}$ |
| 5 | $L_{a6}$ | $L_{b1}$ | 6 | $L_{a7}$ | $L_{b1}$ |
| 7 | $L_{a11}$ | $L_{b1}$ | 8 | $L_{a15}$ | $L_{b1}$ |
| | | | 22 | $L_{a278}$ | $L_{b1}$ |
| 27 | $L_{a474}$ | $L_{b1}$ | | | |
| 29 | $L_{a573}$ | $L_{b1}$ | | | |
| | | | 34 | $L_{a1157}$ | $L_{b1}$ |
| 35 | $L_{a1127}$ | $L_{b1}$ | 36 | $L_{a1197}$ | $L_{b1}$ |
| 39 | $L_{a1}$ | $L_{b1}$ | 40 | $L_{a1}$ | $L_{b1}$ |
| | | | 42 | $L_{a1406}$ | $L_{b1}$ |
| 43 | $L_{a1432}$ | $L_{b1}$ | | | |
| | | | 46 | $L_{a1}$ | $L_{b31}$ |
| 47 | $L_{a3}$ | $L_{b31}$ | 47 | $L_{a4}$ | $L_{b31}$ |
| 49 | $L_{a5}$ | $L_{b31}$ | 50 | $L_{a6}$ | $L_{b31}$ |
| 51 | $L_{a7}$ | $L_{b31}$ | 52 | $L_{a11}$ | $L_{b31}$ |
| 53 | $L_{a15}$ | $L_{b31}$ | | | |

-continued

| Compound No. | $L_a$ | $L_b$ | Compound No. | $L_a$ | $L_b$ |
|---|---|---|---|---|---|
| 67 | $L_{a278}$ | $L_{b31}$ | | | |
| | | | 72 | $L_{a474}$ | $L_{b31}$ |
| | | | 74 | $L_{a573}$ | $L_{b31}$ |
| 79 | $L_{a1157}$ | $L_{b31}$ | 80 | $L_{a1127}$ | $L_{b31}$ |
| 81 | $L_{a1197}$ | $L_{b31}$ | | | |
| | | | 84 | $L_{a1}$ | $L_{b31}$ |
| 85 | $L_{a1}$ | $L_{b31}$ | | | |
| 87 | $L_{a1406}$ | $L_{b31}$ | 88 | $L_{a1432}$ | $L_{b31}$ |
| 91 | $L_{a1}$ | $L_{b122}$ | 92 | $L_{a3}$ | $L_{b122}$ |
| 93 | $L_{a4}$ | $L_{b122}$ | 94 | $L_{a5}$ | $L_{b122}$ |
| 95 | $L_{a6}$ | $L_{b122}$ | 96 | $L_{a7}$ | $L_{b122}$ |
| 97 | $L_{a11}$ | $L_{b122}$ | 98 | $L_{a15}$ | $L_{b122}$ |
| | | | 112 | $L_{a278}$ | $L_{b122}$ |
| 117 | $L_{a474}$ | $L_{b122}$ | | | |
| 119 | $L_{a573}$ | $L_{b122}$ | | | |
| | | | 124 | $L_{a1157}$ | $L_{b122}$ |
| 125 | $L_{a1127}$ | $L_{b122}$ | 126 | $L_{a1197}$ | $L_{b122}$ |
| 129 | $L_{a1}$ | $L_{b122}$ | 130 | $L_{a1}$ | $L_{b122}$ |
| | | | 132 | $L_{a1406}$ | $L_{b122}$ |
| 133 | $L_{a1432}$ | $L_{b122}$ | | | |
| | | | 136 | $L_{a1}$ | $L_{b88}$ |
| | | | 140 | $L_{a1}$ | $L_{b165}$ |
| | | | 144 | $L_{a1}$ | $L_{b192}$ |
| | | | 148 | $L_{a1}$ | $L_{b245}$ |

wherein Compound 151, Compound 153 to Compound 155, Compound 158, Compound 161, Compound 163, Compound 165 to Compound 167, Compound 170, Compound 173, Compound 175, Compound 177 to Compound 179, Compound 182, Compound 185, Compound 187, Compound 189 to Compound 191, Compound 194, and Compound 199 have a structure of $Ir(L_a)_2(L_b)$, wherein the two $L_a$ are different, and $L_a$ and $L_b$ are respectively selected from the structures listed in the following table:

| Compound No. | $L_a$ | $L_a$ | $L_b$ | Compound No. | $L_a$ | $L_a$ | $L_b$ |
|---|---|---|---|---|---|---|---|
| 151 | $L_{a4}$ | $L_{a1407}$ | $L_{b1}$ | | | | |
| 153 | $L_{a277}$ | $L_{a1430}$ | $L_{b1}$ | 154 | $L_{a1425}$ | $L_{a1430}$ | $L_{b1}$ |
| 155 | $L_{a1428}$ | $L_{a1432}$ | $L_{b1}$ | | | | |
| | | | | 158 | $L_{a1425}$ | $L_{a277}$ | $L_{b1}$ |
| 161 | $L_{a1462}$ | $L_{a474}$ | $L_{b1}$ | | | | |
| 163 | $L_{a4}$ | $L_{a1407}$ | $L_{b31}$ | | | | |
| 165 | $L_{a277}$ | $L_{a1430}$ | $L_{b31}$ | 166 | $L_{a1425}$ | $L_{a1430}$ | $L_{b31}$ |
| 167 | $L_{a1428}$ | $L_{a1432}$ | $L_{b31}$ | | | | |
| | | | | 170 | $L_{a1425}$ | $L_{a277}$ | $L_{b31}$ |
| 173 | $L_{a1462}$ | $L_{a474}$ | $L_{b31}$ | | | | |
| 175 | $L_{a4}$ | $L_{a1407}$ | $L_{b88}$ | | | | |
| 177 | $L_{a277}$ | $L_{a1430}$ | $L_{b88}$ | 178 | $L_{a1425}$ | $L_{a1430}$ | $L_{b88}$ |
| 179 | $L_{a1428}$ | $L_{a1432}$ | $L_{b88}$ | | | | |
| | | | | 182 | $L_{a1425}$ | $L_{a277}$ | $L_{b88}$ |
| 185 | $L_{a1462}$ | $L_{a474}$ | $L_{b88}$ | | | | |
| 187 | $L_{a4}$ | $L_{a1407}$ | $L_{b122}$ | | | | |
| 189 | $L_{a277}$ | $L_{a1430}$ | $L_{b122}$ | 190 | $L_{a1425}$ | $L_{a1430}$ | $L_{b122}$ |
| 191 | $L_{a1428}$ | $L_{a1432}$ | $L_{b122}$ | | | | |
| | | | | 194 | $L_{a1425}$ | $L_{a277}$ | $L_{b122}$ |
| 199 | $L_{a4}$ | $L_{a1407}$ | $L_{b212}$ | | | | |

26. An electroluminescent device, comprising:

an anode, a cathode, and an organic layer disposed between the anode and the cathode, wherein the organic layer comprises the metal complex of claim 24.

* * * * *